US011679678B2

(12) United States Patent
Seger, Jr. et al.

(10) Patent No.: US 11,679,678 B2
(45) Date of Patent: Jun. 20, 2023

(54) VEHICLE SYSTEM FOR DETECTING AND VISUALLY CONVEYING VEHICLE BUTTON INTERACTION

(71) Applicant: SigmaSense, LLC., Wilmington, DE (US)

(72) Inventors: Richard Stuart Seger, Jr., Belton, TX (US); Michael Shawn Gray, Dripping Springs, TX (US); Patrick Troy Gray, Cedar Park, TX (US); Daniel Keith Van Ostrand, Leander, TX (US); Kevin Joseph Derichs, Buda, TX (US)

(73) Assignee: SigmaSense, LLC., Wilmington, DE (US)

( * ) Notice: Subject to any disclaimer, the term of this patent is extended or adjusted under 35 U.S.C. 154(b) by 0 days.

(21) Appl. No.: 17/448,643

(22) Filed: Sep. 23, 2021

(65) Prior Publication Data

US 2022/0410705 A1 Dec. 29, 2022

Related U.S. Application Data

(60) Provisional application No. 63/260,742, filed on Aug. 31, 2021, provisional application No. 63/236,521,
(Continued)

(51) Int. Cl.
*B60K 35/00* (2006.01)
*G06F 3/044* (2006.01)
(Continued)

(52) U.S. Cl.
CPC ............ *B60K 35/00* (2013.01); *G06F 3/0412* (2013.01); *G06F 3/0446* (2019.05);
(Continued)

(58) Field of Classification Search
CPC ............................................ G06F 2203/04108
See application file for complete search history.

(56) References Cited

U.S. PATENT DOCUMENTS 5,914,701 A * 6/1999 Gersheneld ............ G06F 3/017 340/13.31
6,218,972 B1 4/2001 Groshong
(Continued)

FOREIGN PATENT DOCUMENTS

CN 103995626 A 8/2014
CN 104182105 A 12/2014

OTHER PUBLICATIONS

Baker; How delta-sigma ADCs work, Part 1; Analog Applications Journal; Oct. 1, 2011; 6 pgs.
(Continued)

*Primary Examiner* — Robin J Mishler
(74) *Attorney, Agent, or Firm* — Garlick & Markison; Katherine C. Stuckman; Bruce E. Stuckman

(57) ABSTRACT

A method includes receiving sensed signal data from at least one circuit based on a user in proximity to at least one electrode corresponding to the at least one circuit. Hover detection data indicating a detected hover in proximity to an interactable element of a vehicle is generated. Button feedback display data indicating the interactable element is generated based on the hover detection data. Display of the button feedback display data via a display device is facilitated.

19 Claims, 160 Drawing Sheets
(39 of 160 Drawing Sheet(s) Filed in Color)

Related U.S. Application Data filed on Aug. 24, 2021, provisional application No. 63/202,864, filed on Jun. 28, 2021.

(51) Int. Cl.

*G06F 3/0488* (2022.01)
*G06F 3/041* (2006.01)

(52) U.S. Cl.

CPC ........ *G06F 3/0488* (2013.01); *B60K 2370/11* (2019.05); *B60K 2370/1438* (2019.05); *B60K 2370/152* (2019.05); *G06F 2203/04108* (2013.01)

(56) References Cited

U.S. PATENT DOCUMENTS

| | | | | |
|---|---|---|---|---|
| 6,665,013 | B1 | 12/2003 | Fossum et al. | |
| 7,528,755 | B2 | 5/2009 | Hammerschmidt | |
| 8,031,094 | B2 | 10/2011 | Hotelling | |
| 8,089,289 | B1 | 1/2012 | Kremin et al. | |
| 8,279,180 | B2 | 10/2012 | Hotelling et al. | |
| 8,547,114 | B2 | 10/2013 | Kremin | |
| 8,587,535 | B2 | 11/2013 | Oda et al. | |
| 8,625,726 | B2 | 1/2014 | Kuan | |
| 8,982,097 | B1 | 3/2015 | Kuzo et al. | |
| 9,201,547 | B2 | 12/2015 | Elias | |
| 2011/0063154 | A1 | 3/2011 | Hotelling et al. | |
| 2011/0298745 | A1 | 12/2011 | Souchkov | |
| 2012/0278031 | A1 | 11/2012 | Oda | |
| 2013/0278447 | A1 | 10/2013 | Kremin | |
| 2014/0327644 | A1 | 11/2014 | Mohindra | |
| 2015/0091847 | A1 | 4/2015 | Chang | |
| 2015/0346889 | A1 | 12/2015 | Chen | |
| 2015/0370405 | A1* | 12/2015 | Oda | B60K 37/06 345/174 |
| 2016/0188049 | A1 | 6/2016 | Yang et al. | |
| 2019/0265828 | A1* | 8/2019 | Hauenstein | G06F 3/04842 |
| 2020/0050341 | A1* | 2/2020 | Tabata | G06F 3/041661 |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

* cited by examiner vehicle sensor system 100 computing entity 16 computing entity 16 computing entity 16 computing entity 16 computing entity 16 computing device 40 computing device 40 computing device 40 computing device 40 sensor circuit 116

ID circuit 114 and/or 118 button circuit 112 ref signal @ fDD button 115 button(s) 115 button(s) 115 keypad 4415

Button(s) 115 keypad 4415 keypad 4415 touchpad 4615 touchpad 4615 hierarchical
option tree 1505 top view top view top view linear spacing squared spacing discrete directional zones temporal period i

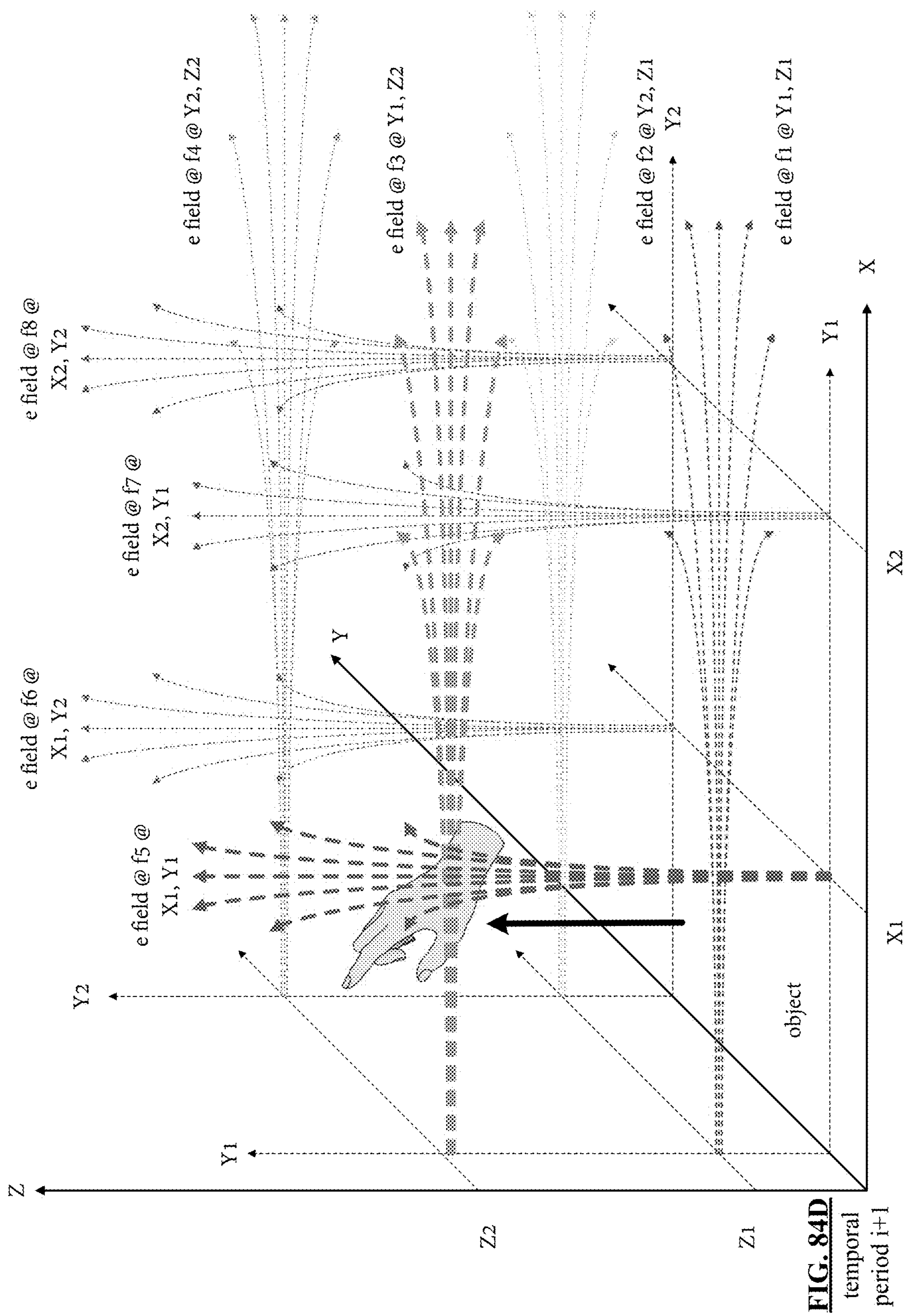
FIG. 84D temporal period i+1 steering wheel 136 steering wheel 136 steering wheel 136 steering wheel 136 steering wheel 136 steering wheel 136 steering wheel 136 interaction detection region 9620 anatomical feature mapping data 730 anatomical feature mapping data 730 steering wheel 136 steering wheel 136

VEHICLE SYSTEM FOR DETECTING AND VISUALLY CONVEYING VEHICLE BUTTON INTERACTION

CROSS-REFERENCE TO RELATED APPLICATIONS

The present U.S. Utility Patent application claims priority pursuant to 35 U.S.C. § 119(e) to U.S. Provisional Application No. 63/202,864, entitled "VEHICLE SENSOR SYSTEM", filed Jun. 28, 2021, U.S. Provisional Application No. 63/236,521, entitled "VEHICLE SENSOR SYSTEM", filed Aug. 24, 2021, and U.S. Provisional Application No. 63/260,742, entitled "VEHICLE SYSTEM FOR DETECTING AND VISUALLY CONVEYING VEHICLE BUTTON INTERACTION", filed Aug. 31, 2021, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This disclosure relates generally to electric systems and more particularly to vehicle sensing systems.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touchscreens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen in a vehicle. As yet another example, the computing device processes the sensor signals to determine activation of a vehicle function (e.g., roll up a window).

BRIEF DESCRIPTION OF THE SEVERAL VIEWS OF THE DRAWING(S)

The patent or application file contains at least one drawing executed in color. Copies of this patent or patent application publication with color drawing(s) will be provided by the Office upon request and payment of the necessary fee.

FIGS. 84C-84D illustrate detection of another example gesture in accordance with various embodiments;

DETAILED DESCRIPTION OF THE INVENTION

Figure 1:
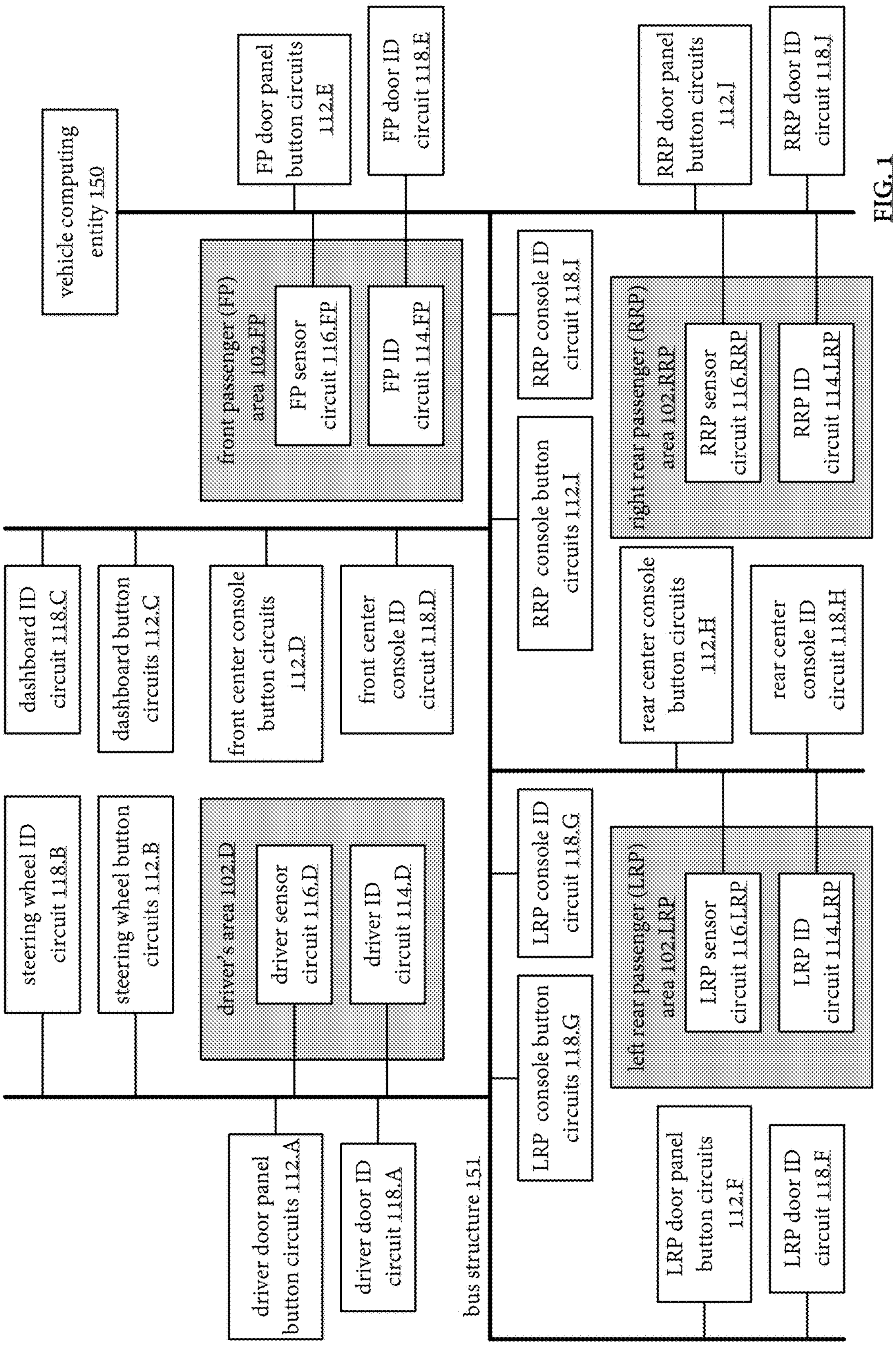
FIG. 1 is a schematic block diagram of an embodiment of a vehicle sensor system in accordance with various embodiments.

FIG. 1 is a schematic block diagram of an embodiment of a vehicle sensor system 100 that includes a plurality of occupant areas 102, a plurality of button circuits 112, a plurality of identifier (ID) circuits 114 and 118, a plurality of sensor circuits 116, a vehicle computing entity 150, and a bus structure 151. In this example, the occupant areas include a driver area 102.D, a front passenger (FP) area 102.FP, a left rear passenger (LRP) area 102.LRP, and a right rear passenger (RRP) area 102.RRP. Note that a vehicle may have or more less occupant areas. The corresponding vehicle can be implemented as a ground vehicle such as a car or truck. The corresponding vehicle can be implemented as any other vehicle operable to carry and/or have elements controlled by occupants.

Each of the occupant areas (e.g., the driver, front passenger, left rear passenger, and right rear passenger) includes one or more physical components and one or more electrical circuits. A physical component includes a seat, a head rest, an arm rest, a floor mat, floor space, head room, etc. An electrical circuit includes an identifier (ID) circuit, a sensor circuit, a pressure sensor, a temperature sensor, a motion sensor, etc. For example, the driver's area includes a seat, an arm rest, floor space, and headroom. The example driver's area further includes a driver sensor circuit and a driver ID circuit. In a specific example, the driver sensor circuit is mounted in the bottom of the seat and the driver ID circuit is mounted in the back of the seat.

A button circuit 112 is associated with a button of the vehicle. A button, which may be a switch, a digital image on a touch screen, an electrode, a variable cap, a transducer, a potentiometer, a slider switch, etc., corresponds to a vehicle function. For example, a driver door button 112 functions to raise or lower the driver's window. As another example, a steering wheel button 112 is regarding cruise control. As yet another example, a dashboard button 112 is regarding air conditioning. Other buttons can implement other functionality corresponding to, for example, heat, audio settings, configuration of seat position, configuration of side mirror positions, adaptive lane keeping, navigation, phone calls via a cellular network, or other functionality pertaining to control or configuration of features in a corresponding vehicle, such as a car.

The button circuit detects 112 activation of the corresponding button and provides activation data to the vehicle computing entity. The computing entity coordinates the action regarding the activation of the button. For example, a button functions to raise and lower the driver's window. When the button is activated (e.g., touched, hover detection, gesture motion, switch toggling, sliding of a switch, etc.), the button circuit detects the activation (e.g., window up or window down) and may further detect a corresponding level of activation (e.g., speed of window up or window down). A vehicle can include some or all of the button circuits 112.A-112.J of FIG. 1, and/or can include other types of button circuits 112.

Buttons can function to perform any type of vehicle functionality based on activation, for example, via user input by a person in the car. Some buttons can be operable to activate multiple functionality based on distinguishing between different types of user input and/or different orderings of a set of sequential set of user input.

Various types of vehicle functionality that can be activated based on detecting user input to any button circuits 112 described herein can include functionality related to cruise control configuration, such as functionality to set speed, resume speed, cancel, increase speed, decrease speed, adaptive cruise to lock in distance to car in front, set average speed, and/or other cruise control functionality.

Various types of vehicle functionality that can be activated based on detecting user input to any button circuits 112 described herein can alternatively or additionally include functionality related to safety feature configuration, such as engaging one or more safety features, disengage or set parameters of one or more safety features, pedestrian monitoring, lane departure warning, lane departure hold, blind spot detector, collision detection, speed limit monitoring and/or speed limit display parameters, parking sensors, rear-view camera settings, top-view settings, sleepy driver detection, settings for non-attentive driver alerts in self-driving mode, vehicle alarm system, call 911 mode, and/or other safety feature functionality.

Various types of vehicle functionality that can be activated based on detecting user input to any button circuits 112 described herein can alternatively or additionally include functionality related to vehicle alert configuration, such as enabling, acknowledging, and/or resetting prompts related to oil level, engine temperature, check engine, tire pressure, transmission fault, speedometer fault, catalytic converter temp, brake system fault, other vehicle system faults, and/or other vehicle alert functionality.

Various types of vehicle functionality that can be activated based on detecting user input to any button circuits 112 described herein can alternatively or additionally include functionality related to suspension and braking system configuration, such as setting vehicle height, enabling or disabling air suspension, setting vehicle terrain settings such as snow, mud, gravel, off-road, auto terrain detection, engaging, disengaging or setting parameters of anti-lock braking, vehicle yaw control or electronic stability control, regenerative braking, and/or other suspension and/or braking system functionality.

Various types of vehicle functionality that can be activated based on detecting user input to any button circuits 112 described herein can alternatively or additionally include functionality related to transmission and engine system configuration, such as setting low speed mode, sport mode, normal mode, ridiculous speed mode, electric vs. internal combustion system operation, 4-wheel drive without locking differentials, locking the front, rear and/or center differentials, adaptive mode to driving conditions or detected terrain from wheel sensors, and/or other transmission and engine system functionality.

Various types of vehicle functionality that can be activated based on detecting user input to any button circuits 112 described herein can alternatively or additionally include functionality related to vehicle interior configuration, such as adjusting of lighting level, lighting color and individual lighting, steering wheel position, dashboard configuration, heads up display configuration, seat positions, heating and cooling, heating and AC settings: such as front and rear, set temps, control fan and recirculation, window operations, door locks, child locks, rear view mirror night mode, garage door and other home automation set up and activation, unlocking the glovebox, or other vehicle interior functionality.

Various types of vehicle functionality that can be activated based on detecting user input to any button circuits 112 described herein can alternatively or additionally include functionality related to navigation system configuration, such as setting destination, setting map parameters, route selection, home location, displaying or hiding info on upcoming restaurants, gas and lodging, enable or disable audio route guidance, toll guidance, traffic alerts, time to destination, map display, and/or other navigation system configuration.

Various types of vehicle functionality that can be activated based on detecting user input to any button circuits 112 described herein can alternatively or additionally include functionality related to phone or mobile device setting configuration, such as pairing a cellular phone or mobile device, engaging, disengaging or set parameters of voice recognition, placing calls, hanging-up, selecting a phone, selectin car or phone audio for microphone or speaker, and/or other phone and/or mobile device functionality.

Various types of vehicle functionality that can be activated based on detecting user input to any button circuits 112 described herein can alternatively or additionally include functionality related to audio setting configuration such as selection of an audio source from phone, mobile device, CD, AM radio, FM radio, or satellite radio, scanning or seeking, selecting a station, volume and equalization settings, set phone to audio system alert and transition parameters in case of an incoming text or call, and/or other audio setting functionality.

Various types of vehicle functionality that can be activated based on detecting user input to any button circuits 112 described herein can alternatively or additionally include functionality related to vehicle exterior configuration, such as disengaging or setting parameters of auto park mode, power lift gate, side mirror adjust, turn signals, hazard lights, head lights, parking lights, fog lights, side mirror retract and deploy, side mirror configuration, roll down windows a selected or predetermined amount such as 2 inches, sun roof and moon roof controls, and/or other exterior functionality.

Some exterior functionality or other exterior functionality can optionally be implemented via buttons 112 on the exterior of the vehicle, where a user interacts with these buttons outside of the vehicle, such as locking or unlocking exterior doors, locking or unlocking the trunk, opening the trunk, turning off headlights, or other exterior functionality.

The button detection circuit 112 provides a signal to a vehicle computing entity 150 regarding detection of activation of its button and may further be regarding a level of activation. The vehicle computing entity 150 communicates with a motor to raise or lower the driver's window and may further indicate a speed at which the window is to be raised or lowered. Alternatively, the button circuit 112 provides the communication to the motor to raise or lower the driver's window and provides an indication of the communication to the vehicle computing entity 150. The vehicle computing entity 150 logs the communication and may override the communication based on a vehicle safety protocol. Example embodiments of computing entities implementing vehicle computing entity are illustrated in FIGS. 2A-2E.

An ID circuit 114 functions to provide an electric field at a given frequency that couples through the body of an occupant. Each occupant area 102 can have a corresponding ID circuit 114 utilized to couple through the body of the corresponding occupant. In an embodiment, an occupant sensor circuit 116 (e.g., driver sensor circuit 116.D, front passenger sensor circuit 116.FP, left rear passenger circuit 116.LRP, or right rear passenger circuit 116. RRP) senses the electric field through the body. The occupant sensor circuit 116 determines one or more electrical characteristics of the electric field and/or one or more electrical characteristics of circuitry of the occupant sensor circuit affected by the electric field. For example, impedance of a self-capacitance of the occupant sensor circuit changes at a frequency of the electric field.

When the occupant sensor circuit detects 116 an electric field through an occupant's body and the one or more electrical characteristics, it sends a message to the vehicle computing entity indicating the detection of the electric field and/or the one or more electrical characteristics. The vehicle computing entity processes the message to determine if the electric field was emitted by a corresponding ID circuit. For example, the front passenger sensor circuit sensed the electric field emitted by the front passenger ID circuit 114.FP. If so, the vehicle computing entity determines that there is an occupant in the front passenger seat.

In another embodiment, a location ID circuit 118 (e.g., driver door, steering wheel, etc.) functions to provide an electric field at a given frequency that couples through the body of an occupant. In this embodiment, an occupant sensor circuit senses the electric field through the body. The occupant sensor circuit 116 determines one or more electrical characteristics of the electric field and/or one or more electrical characteristics of circuitry of the occupant sensor circuit affected by the electric field. For example, impedance of a self-capacitance of the occupant sensor circuit changes at a frequency of the electric field. A vehicle can include some or all of the location ID circuits 118.A-118.J of FIG. 1, and/or can include other types of button circuits 118. Some or all of the location ID circuits can correspond to a location of a button circuit 112.

When the occupant sensor circuit 116 detects an electric field through an occupant's body and the one or more electrical characteristics of the location ID circuit, it sends a message to the vehicle computing entity indicating the detection of the electric field and/or the one or more electrical characteristics. The vehicle computing entity 150 processes the message to determine the location ID circuit 118 that emitted the electric field. For example, the vehicle computing entity 150 determines that the front passenger door ID circuit 118.A emitted the electric field.

The vehicle computing entity 150 uses the electric field identification of the front passenger door in combination with an activation of a front passenger door button to verify and/or authenticate activation of the front passenger door button. For example, if the corresponding front passenger door panel button circuit 112.E indicates an activation of the front passenger door button and the vehicle computing entity does not receive a front passenger door ID electric field indication, the vehicle computing entity denies the execution of the button activation. As a specific example, water lands on the front passenger door button. The corresponding front passenger door panel button circuit 112.E detects a change in the button, which it provides the vehicle computing entity 150. In this specific example, the vehicle computing entity does not receive a front passenger door ID signal.

In another embodiment, a button circuit 112 detects an occupant ID electric field and activation of a corresponding button. In this embodiment, the button circuit provides a message regarding activation of the button and regarding the detected occupant ID electric field. The vehicle computing entity processes the message. If the occupant is authorized to activate the button for a given status of the vehicle (e.g., off, idling, moving slow, moving fast, braking, accelerating, etc.), the vehicle computing entity performs and/or allows the execution of the activated button function.

Figure 2A:
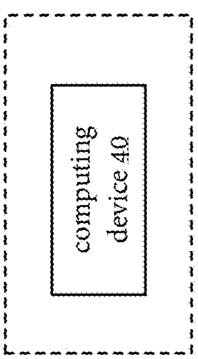
FIGS. 2A-2E are schematic block diagrams of embodiments of computing entities in accordance with various embodiments.

FIG. 2A is schematic block diagram of an embodiment of a computing entity 16 that includes a computing device 40 (e.g., one of the embodiments of FIGS. 2F-2I). A computing device may function as a user computing device, a server, a system computing device, a data storage device, a data security device, a networking device, a user access device, a cell phone, a tablet, a laptop, a printer, a game console, a satellite control box, a cable box, etc. Some or all features and/or functionality of the computing entity 16 of FIG. 2A can implement the vehicle computing entity 150 of FIG. 1.

Figure 2B:
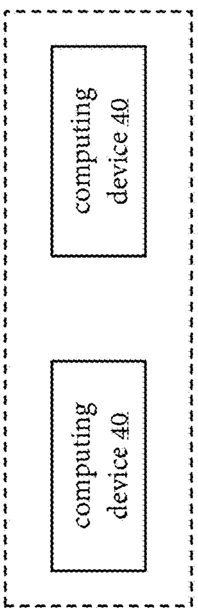

FIG. 2B is schematic block diagram of an embodiment of a computing entity 16 that includes two or more computing devices 40 (e.g., two or more from any combination of the embodiments of FIGS. 2F-2I). The computing devices 40 perform the functions of a computing entity in a peer processing manner (e.g., coordinate together to perform the functions), in a master-slave manner (e.g., one computing device coordinates and the other support it), and/or in another manner. Some or all features and/or functionality of the computing entity 16 of FIG. 2B can implement the vehicle computing entity 150 of FIG. 1.

Figure 2C:
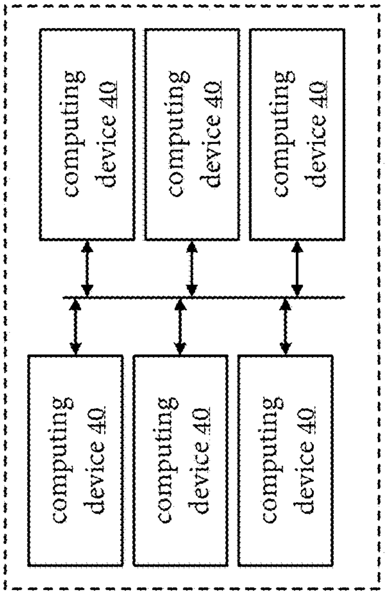

FIG. 2C is schematic block diagram of an embodiment of a computing entity 16 that includes a network of computing devices 40 (e.g., two or more from any combination of the embodiments of FIGS. 2F-2I). The computing devices are coupled together via one or more network connections (e.g., WAN, LAN, cellular data, WLAN, etc.) and preform the functions of the computing entity. Some or all features and/or functionality of the computing entity 16 of FIG. 2C can implement the vehicle computing entity 150 of FIG. 1.

Figure 2D:
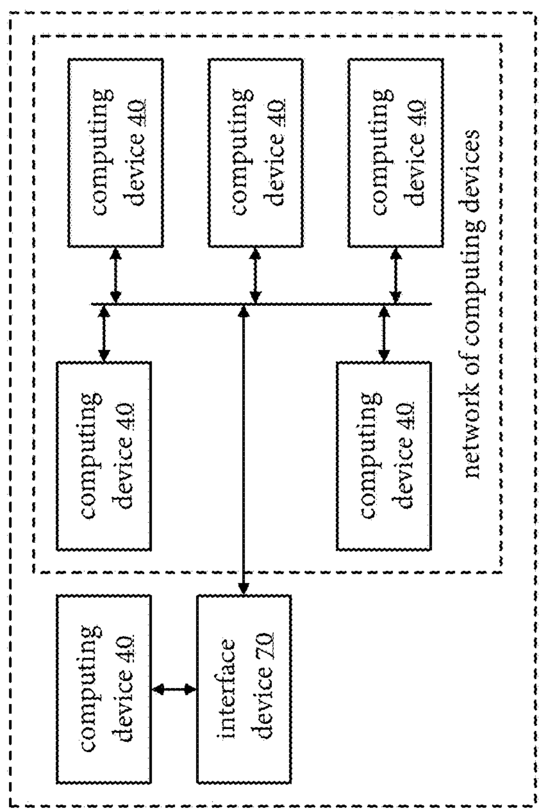

FIG. 2D is schematic block diagram of an embodiment of a computing entity 16 that includes a primary computing device (e.g., any one of the computing devices of FIGS. 2F-2I), an interface device (e.g., a network connection), and a network of computing devices 40 (e.g., one or more from any combination of the embodiments of FIGS. 2F-2I). The primary computing device utilizes the other computing devices as co-processors to execute one or more the functions of the computing entity, as storage for data, for other data processing functions, and/or storage purposes. Some or all features and/or functionality of the computing entity 16 of FIG. 2D can implement the vehicle computing entity 150 of FIG. 1.

Figure 2E:
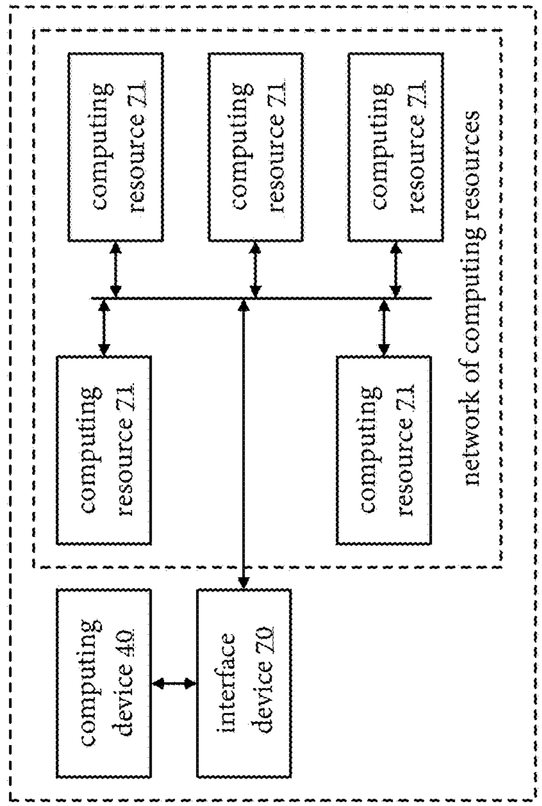

FIG. 2E is schematic block diagram of an embodiment of a computing entity 16 that includes a primary computing device (e.g., any one of the computing devices of FIGS. 2F-2I), an interface device (e.g., a network connection) 70, and a network of computing resources 71 (e.g., two or more resources from any combination of the embodiments of FIGS. 2F-2I). The primary computing device utilizes the computing resources as co-processors to execute one or more the functions of the computing entity, as storage for data, for other data processing functions, and/or storage purposes. Some or all features and/or functionality of the computing entity 16 of FIG. 2AE can implement the vehicle computing entity 150 of FIG. 1.

Figure 2F:
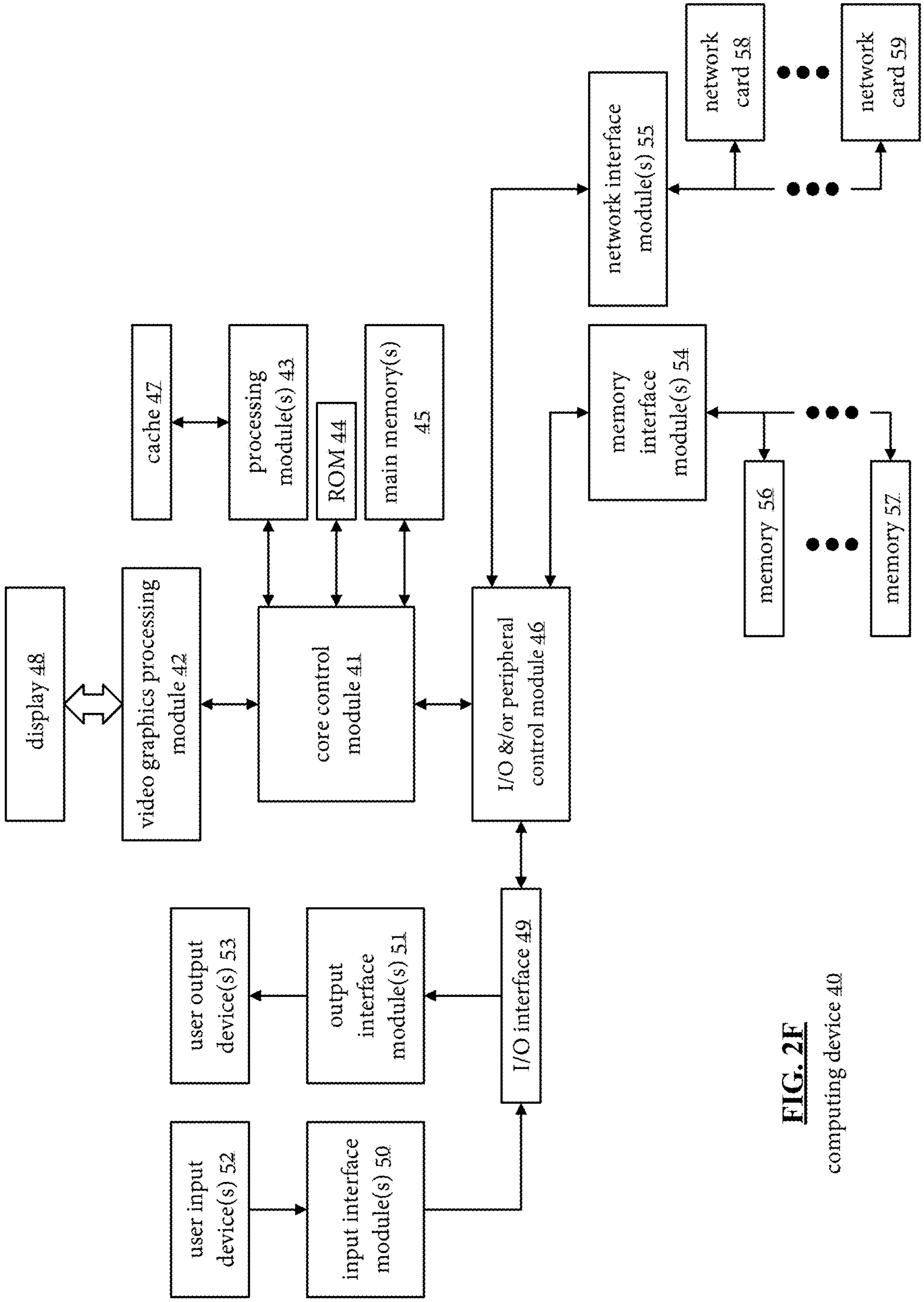
FIGS. 2F-2I are schematic block diagrams of embodiments of computing devices in accordance with various embodiments.

FIG. 2F is a schematic block diagram of an embodiment of a computing device 40 that includes a plurality of computing resources. The computing resource include a core control module 41, one or more processing modules 43, one or more main memories 45, a read only memory (ROM) 44 for a boot up sequence, cache memory 47, a video graphics processing module 42, a display 48 (optional), an Input-Output (I/O) peripheral control module 46, an I/O interface module 49 (which could be omitted), one or more input interface modules 50, one or more output interface modules 51, one or more network interface modules 55, and one or more memory interface modules 54. A processing module 43 is described in greater detail at the end of the detailed description section and, in an alternative embodiment, has a direction connection to the main memory 45. In an alternate embodiment, the core control module 41 and the I/O and/or peripheral control module 46 are one module, such as a chipset, a quick path interconnect (QPI), and/or an ultra-path interconnect (UPI). Some or all features and/or functionality of the computing device 40 of FIG. 2F can implement a computing device 40 of the vehicle computing entity 150 and/or of another computing entity 16.

Each of the main memories 45 includes one or more Random Access Memory (RAM) integrated circuits, or chips. For example, a main memory 45 includes four DDR4 ($4^{th}$ generation of double data rate) RAM chips, each running at a rate of 2,400 MHz. In general, the main memory 45 stores data and operational instructions most relevant for the processing module 43. For example, the core control module 41 coordinates the transfer of data and/or operational instructions between the main memory 45 and the memory 56-57. The data and/or operational instructions retrieve from memory 56-57 are the data and/or operational instructions requested by the processing module or will most likely be needed by the processing module. When the processing module is done with the data and/or operational instructions in main memory, the core control module 41 coordinates sending updated data to the memory 56-57 for storage.

The memory 56-57 includes one or more hard drives, one or more solid state memory chips, and/or one or more other large capacity storage devices that, in comparison to cache memory and main memory devices, is/are relatively inexpensive with respect to cost per amount of data stored. The memory 56-57 is coupled to the core control module 41 via the I/O and/or peripheral control module 46 and via one or more memory interface modules 54. In an embodiment, the I/O and/or peripheral control module 46 includes one or more Peripheral Component Interface (PCI) buses to which peripheral components connect to the core control module 41. A memory interface module 54 includes a software driver and a hardware connector for coupling a memory device to the I/O and/or peripheral control module 46. For example, a memory interface 54 is in accordance with a Serial Advanced Technology Attachment (SATA) port.

The core control module 41 coordinates data communications between the processing module(s) 43 and the network(s) 14 via the I/O and/or peripheral control module 46, the network interface module(s) 55, and a network card 58 or 59. A network card 58 or 59 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 55 includes a software driver and a hardware connector for coupling the network card to the I/O and/or peripheral control module 46. For example, the network interface module 55 is in accordance with one or more versions of IEEE 802.11, cellular telephone protocols, 10/100/1000 Gigabit LAN protocols, etc.

The core control module 41 coordinates data communications between the processing module(s) 43 and input device(s) 52 via the input interface module(s) 50, the I/O interface 49, and the I/O and/or peripheral control module 46. An input device 52 includes a keypad, a keyboard, control switches, a touchpad, a microphone, a camera, etc. An input interface module 50 includes a software driver and a hardware connector for coupling an input device to the I/O and/or peripheral control module 46. In an embodiment, an input interface module 50 is in accordance with one or more Universal Serial Bus (USB) protocols.

The core control module 41 coordinates data communications between the processing module(s) 43 and output device(s) 53 via the output interface module(s) 51 and the I/O and/or peripheral control module 46. An output device 53 includes a speaker, auxiliary memory, headphones, etc. An output interface module 51 includes a software driver and a hardware connector for coupling an output device to the I/O and/or peripheral control module 46. In an embodiment, an output interface module 46 is in accordance with one or more audio codec protocols.

The processing module 43 communicates directly with a video graphics processing module 42 to display data on the display 48. The display 48 includes an LED (light emitting diode) display, an LCD (liquid crystal display), and/or other type of display technology. The display has a resolution, an aspect ratio, and other features that affect the quality of the display. The video graphics processing module 42 receives data from the processing module 43, processes the data to produce rendered data in accordance with the characteristics of the display, and provides the rendered data to the display 48.

Figure 2G:
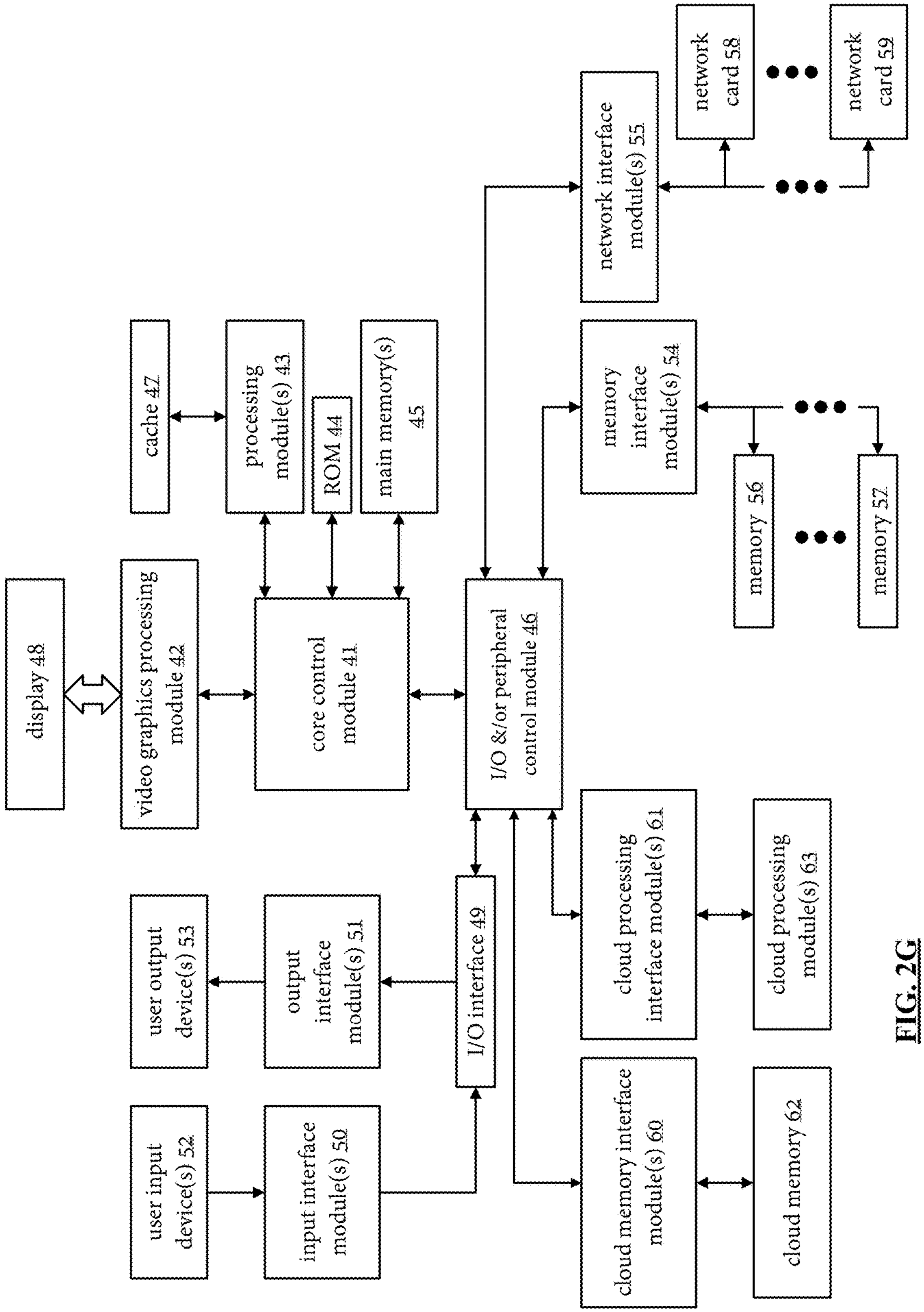

FIG. 2G is a schematic block diagram of an embodiment of a computing device 40 that includes a plurality of computing resources similar to the computing resources of FIG. 2A with the addition of one or more cloud memory interface modules 60, one or more cloud processing interface modules 61, cloud memory 62, and one or more cloud processing modules 63. The cloud memory 62 includes one or more tiers of memory (e.g., ROM, volatile (RAM, main, etc.), non-volatile (hard drive, solid-state, etc.) and/or backup (hard drive, tape, etc.)) that is remoted from the core control module and is accessed via a network (WAN and/or LAN). The cloud processing module 63 is similar to processing module 43 but is remoted from the core control module and is accessed via a network. Some or all features and/or functionality of the computing device 40 of FIG. 2G can implement a computing device 40 of the vehicle computing entity 150 and/or of another computing entity 16.

Figure 2H:
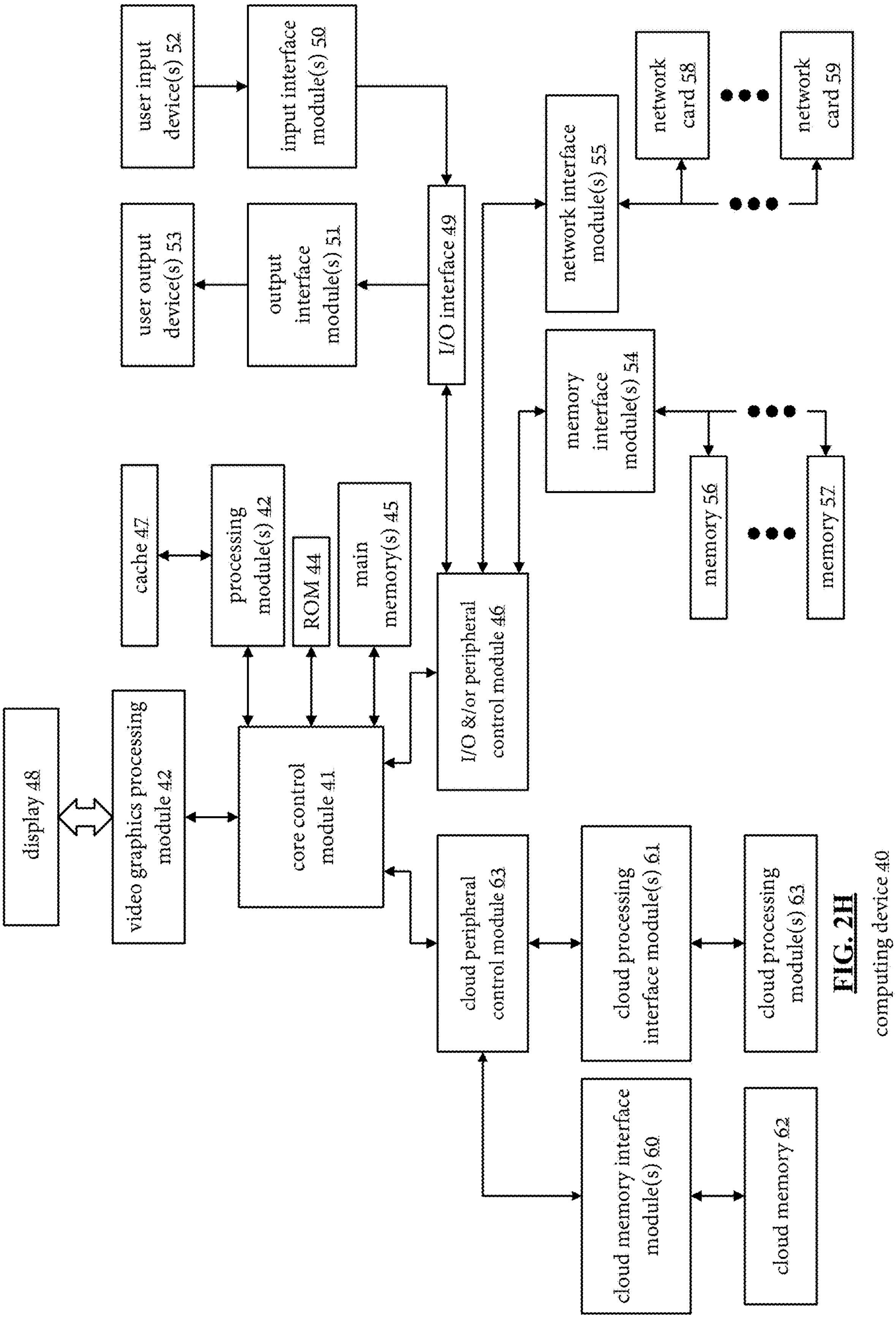

FIG. 2H is a schematic block diagram of an embodiment of a computing device 40 that includes a plurality of computing resources similar to the computing resources of FIG. 2B with a change in how the cloud memory interface module(s) 60 and the cloud processing interface module(s) 61 are coupled to the core control module 41. In this embodiment, the interface modules 60 and 61 are coupled to a cloud peripheral control module 63 that directly couples to the core control module 41. Some or all features and/or functionality of the computing device 40 of FIG. 2H can implement a computing device 40 of the vehicle computing entity 150 and/or of another computing entity 16.

Figure 2I:
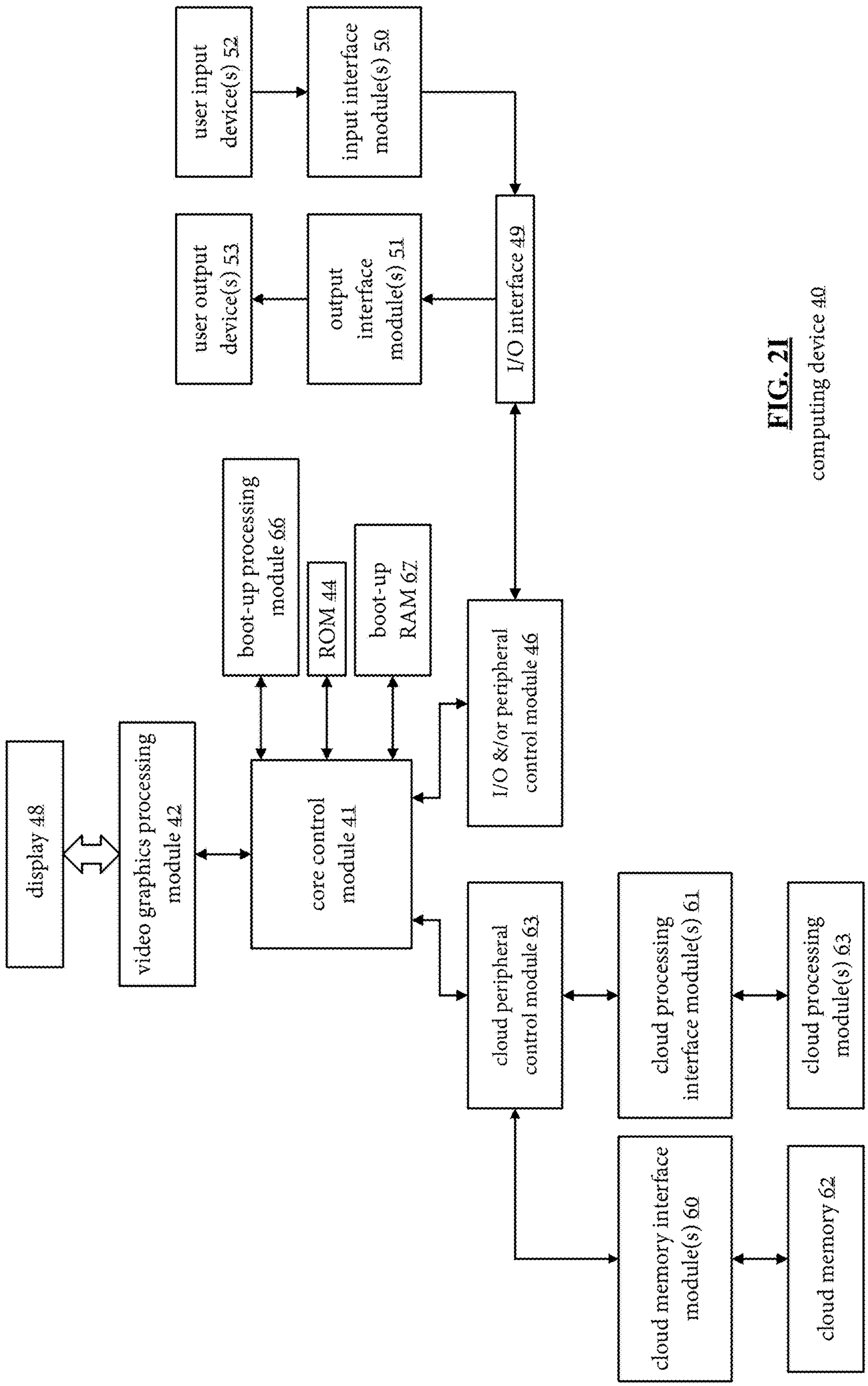

FIG. 2I is a schematic block diagram of an embodiment of a computing device 40 that includes a plurality of computing resources, which includes include a core control module 41, a boot up processing module 66, boot up RAM 67, a read only memory (ROM) 45, a video graphics processing module 42, a display 48 (optional), an Input-Output (I/O) peripheral control module 46, one or more input interface modules 50, one or more output interface modules 51, one or more cloud memory interface modules 60, one or more cloud processing interface modules 61, cloud memory 62, and cloud processing module(s) 63. Some or all features and/or functionality of the computing device 40 of FIG. 2 can implement a computing device 40 of the vehicle computing entity 150 and/or of another computing entity 16.

In this embodiment, the computing device 40 includes enough processing resources (e.g., module 66, ROM 44, and RAM 67) to boot up. Once booted up, the cloud memory 62 and the cloud processing module(s) 63 function as the computing device's memory (e.g., main and hard drive) and processing module.

Figure 3:
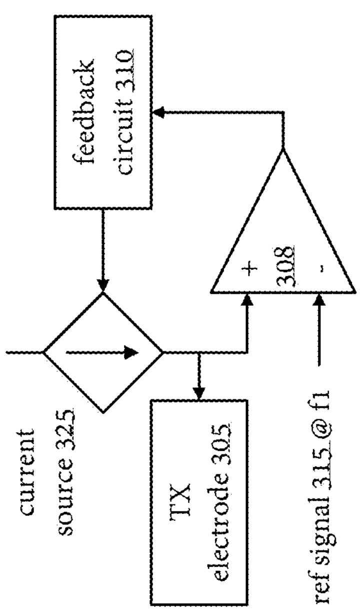
FIG. 3 is a schematic block diagram of an embodiment of sensor identification (ID) circuit in accordance with various embodiments.

FIG. 3 is a schematic block diagram of an embodiment of an identification (ID) circuit 114 and/or 118. Some or all features and/or functionality of the ID circuit 114 and/or 118 of the ID circuit of FIG. 3 can implement any ID circuit 114 and/or 118 of FIG. 1, and/or any other embodiment of an ID circuit described herein.

An ID circuit 114 and/or 118 can include an operational amplifier (op amp) and/or comparator 308. The ID circuit 114 and/or 118 can further include a current source 325, which can be implemented as an independent current source, a dependent current source, and/or a current mirror circuit, etc.

In an example of operation, a reference signal 315 can be provided to the op amp 308. The reference signal 315 can have oscillating components, for example, based on being in accordance with an identifying frequency f1. The reference signal 315 can be generated via a power source reference circuit or other signal generator that generates the reference signal 315. The oscillating component can be an AC component of reference signal 313. Reference signal 315 can further include a DC component. The op amp and/or comparator 308 can compare the reference signal 315 with a current power signal generated by the current source 325 to produce, based on the comparison, a representative signal.

The ID circuit 114 and/or 118 can further include a feedback circuit 310 (e.g., a dependent current source biasing circuit, a wire, etc.). The feedback circuit 310 can generate a regulation signal based on the representative signal received from the op amp and/or comparator 308, and can provide the regulation signal to the current source 325. The current source 325 can generate a regulated current based on the regulation signal.

The ID circuit 114 and/or 118 can deliver this regulated current to at least one transmit (TX) electrode 305, which can correspond to a drive signal transmitted upon the corresponding electrode at the given frequency f1. Electrode 305 can optionally be implemented as capacitor sensing cells, capacitor sensors, inductive sensor, and/or other sensors.

As an example, the current reference signal corresponds to a given current (I) times a given impedance (Z). The current source 325 generates the power signal to produce the given current (I). If the impedance of the electrode 305 substantially matches the given impedance (Z), then the comparator's output is reflective of the impedances substantially matching. If the impedance of the electrode 305 greater than the given impedance (Z), then the comparator's output is indicative of how much greater the impedance of the electrode 305 is than that of the given impedance (Z). If the impedance of the electrode 305 is less than the given impedance (Z), then the comparator's output is indicative of how much less the impedance of the electrode 305 is than that of the given impedance (Z). The feedback circuit 310 can function to account for the variations in the impedance of the electrode over time, and can function to ensure that the current source produces a regulated current source (e.g., it remains substantially at the given current (I)).

The frequency of reference signals 315 of different ID circuits 114 and/or 118 can be different. For example, as discussed previously, detection of a given frequency is utilized by a sensor circuit 116 and/or vehicle computing entity 150 to identify the corresponding ID circuit 114 and/or 118, for example, whose electrode 308 was touched by a given user and/or in proximity to a given user, where the identifying is detected based on sensing the an electric field at the given frequency that is sensed based on propagating through the user's body based on the user touching and/or being in proximity to this ID circuit 114 and/or 118.

Figure 4:
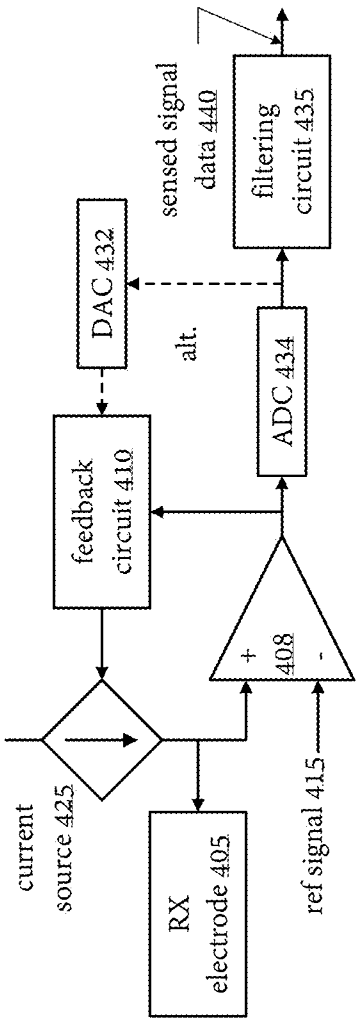
FIG. 4 is a schematic block diagram of an embodiment of a sensor circuit in accordance with various embodiments.

FIG. 4 is a schematic block diagram of an embodiment of a sensor circuit 116. Some or all features and/or functionality of the sensor circuit 116 of the sensor circuit of FIG. 4 can implement any sensor circuit 116 of FIG. 1, and/or any other embodiment of a sensor circuit 116 described herein. Some or all features and/or functionality of the ID circuit 114 and/or 118 of FIG. 3 can be utilized to implement the sensor circuit 116 of FIG. 4.

A sensor circuit 116 can include an ap amp and/or comparator 408, which can have some or all same features and/or functionality as the ap amp and/or comparator 308 of FIG. 3. The sensor circuit 116 can further include a current source 425, which can be implemented as an independent current source, a dependent current source, and/or a current mirror circuit, etc. Current source 425 can have some or all same features and/or functionality as the current source 325 of FIG. 3.

In an example of operation, a reference signal 415 can be provided to the op amp 408. The reference signal 415 can be a DC signal and/or can include an AC component. The reference signal 415 can be generated via a power source reference circuit or other signal generator that generates the reference signal 415. The reference signal 415 can have some or all same features and/or functionality as the reference signal 315 of FIG. 3. The op amp and/or comparator 408 can compare the reference signal 415 with a current power signal generated by the current source 425 to produce, based on the comparison, a representative signal.

The sensor circuit 116 can further include a feedback circuit 410 (e.g., a dependent current source biasing circuit, a wire, etc.). The feedback circuit 410 can generate a regulation signal based on the representative signal received from the op amp and/or comparator 408, and can provide the regulation signal to the current source 425. The current source 425 can generate a regulated current based on the regulation signal. The feedback circuit 410 can have some or all same features and/or functionality as the feedback circuit 310 of FIG. 3, for example, where feedback circuit 410 functions to account for the variations in the impedance of the electrode over time, and/or functions to ensure that the current source 425 produces a regulated current source.

The sensor circuit 116 can deliver this regulated current to at least one receive (RX) electrode 405, which can correspond to a drive signal transmitted upon the corresponding electrode. Electrode 405 can optionally be implemented as capacitor sensing cells, capacitor sensors, inductive sensor, and/or other sensors. The electrode 405 can have some or all same features and/or functionality as the electrode 305 of FIG. 3. Variations in impedance and/or other electrical characteristics of the electrode 405 can thus be indicated in the representative signal outputted by the op amp and/or comparator 408.

The sensor circuit 116 can further include an analog to digital converter (ADC) 434 that converts the representative signal received from the op amp into a digital signal. The digital signal can be provided to a filtering circuit 435, which can generate sensed signal data sensed signal data 440 based on the digital signal. In particular, the representative signal received from the op amp represents changes in impedance and/or other electrical affects upon electrode 405, for example, induced based on one more electric fields induced by a user touching and/or in proximity to the electrode 405. These affects can be based on one more electric fields propagating through the users' body based on the user touching another electrode, such as an electrode 305 of an ID circuit. In such embodiments, the filtering circuit 435 can operate to indicate one or more identified frequencies indicated in representative signal, for example, based on implementing a band pass filter (BPF) or other filter, where an given frequency is indicated based on an electric field at this frequency, being included in an electric field that induced a corresponding change to electrode 405, for example, when a user propagating this electric field is touching or in proximity to electrode 405, and where the user propagates this electric field based on touching or being in proximity to electrode 305 of an ID circuit having a reference signal 315 at the given frequency.

The sensor circuit 116 can optionally include a digital to analog converter (DAC) 432. The analog to digital converter (ADC) 432 may be a flash ADC, a successive approximation ADC, a ramp-compare ADC, a Wilkinson ADC, an integrating ADC, a delta encoded ADC, and/or a sigma-delta ADC. The digital to analog converter (DAC) 214 may be a sigma-delta DAC, a pulse width modulator DAC, a binary weighted DAC, a successive approximation DAC, a thermometer-coded DAC and/or other DAC. The digital to analog converter 432 can converts the digital signal outputted by the ADC 434 into analog regulation signals inputted to feedback circuit 410.

Figure 5:
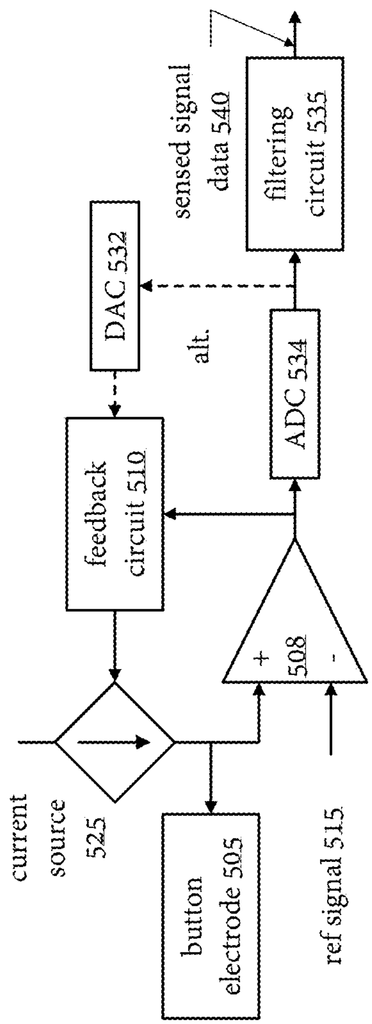
FIG. 5 is a schematic block diagram of an embodiment of button circuit in accordance with various embodiments.

FIG. 5 is a schematic block diagram of an embodiment of a button circuit 112. Some or all features and/or functionality of the button circuit 112 of the sensor circuit of FIG. 5 can implement any button circuit 112 of FIG. 1, and/or any other embodiment of a button circuit 112 described herein. Some or all features and/or functionality of the ID circuit 114 and/or 118 of FIG. 3 and/or the sensor circuit 116 of FIG. 4 can be utilized to implement the button circuit 112 of FIG. 5. Alternatively or in addition, some or all the button circuits 112 of FIG. 1 and/or other button circuits 112 described herein are implemented as traditional button circuits of a car, for example, where a physical switch and/or button actuated by a user caused respective functionality.

A button circuit 112 can include an ap amp and/or comparator 508, which can have some or all same features and/or functionality as the ap amp and/or comparator 308 of FIG. 3 and/or the ap amp and/or comparator 408 of FIG. 4. The button circuit 112 can further include a current source 525, which can be implemented as an independent current source, a dependent current source, and/or a current mirror circuit, etc. Current source 525 can have some or all same features and/or functionality as the current source 325 of FIG. 3 and/or the current source 425 of FIG. 4.

In an example of operation, a reference signal 515 can be provided to the op amp 508. The reference signal 515 can be a DC signal and/or can include an AC component. The reference signal 515 can be generated via a power source reference circuit or other signal generator that generates the reference signal 515. The reference signal 515 can have some or all same features and/or functionality as the reference signal 315 of FIG. 3 and/or reference signal 415 of FIG. 4. The op amp and/or comparator 508 can compare the reference signal 515 with a current power signal generated by the current source 525 to produce, based on the comparison, a representative signal.

The button circuit 112 can further include a feedback circuit 510 (e.g., a dependent current source biasing circuit, a wire, etc.). The feedback circuit 510 can generate a regulation signal based on the representative signal received from the op amp and/or comparator 508, and can provide the regulation signal to the current source 525. The current source 525 can generate a regulated current based on the regulation signal. The feedback circuit 510 can have some or all same features and/or functionality as the feedback circuit 310 of FIG. 3 and/or the feedback circuit 410 of FIG. 4, for example, where feedback circuit 510 functions to account for the variations in the impedance of the electrode over time, and/or functions to ensure that the current source 525 produces a regulated current source.

The button circuit 112 can deliver this regulated current to at least one button electrode 505, which can correspond to a drive signal transmitted upon the corresponding electrode. Electrode 505 can optionally be implemented as capacitor sensing cells, capacitor sensors, inductive sensor, and/or other sensors. The electrode 505 can have some or all same features and/or functionality as the electrode 305 of FIG. 3 and/or electrode 305 of FIG. 4. Variations in impedance and/or other electrical characteristics of the electrode 505 can thus be indicated in the representative signal outputted by the op amp and/or comparator 508.

The sensor circuit 116 can further include an analog to digital converter (ADC) 534 that converts the representative signal received from the op amp into a digital signal. The digital signal can be provided to a filtering circuit 535, which can generate sensed signal data sensed signal data 440 based on the digital signal. The ADC 534 can have some or all same features and/or functionality as the ADC 434 of FIG. 4. The filtering circuit 535 can have some or all same features and/or functionality as the filtering circuit 435 of FIG. 4.

In particular, the representative signal received from the op amp represents changes in impedance and/or other electrical affects upon electrode 505, for example, induced based on one more electric fields induced by a user touching and/or in proximity to the electrode 505. As a particular example, a corresponding button in the vehicle is implemented to include the electrode 505 and/or be in proximity to the electrode 505, where changes in impedance and/or other electrical affects upon electrode 505 induced by a user's body touching and/or being in proximity to the electrode 505 are indicated in the representative signal, which can render corresponding sensed signal data indicating a user touching, being in proximity to, performing a touch-based or touchless gesture, or otherwise interacting with the corresponding button. These changes can further be based on changes in impedance and/or other electrical affects upon electrode 505 induced by a user's body propagating an electric field through their body having a given frequency due to also being in proximity to and/or touching an electrode 305 of an ID circuit, which can render corresponding sensed signal data verifying that the interaction was by the user, rather than by a drop of water or other change not corresponding to user input.

The sensor circuit 116 can optionally include a digital to analog converter (DAC) 532. The digital to analog converter 532 can converts the digital signal outputted by the ADC 434 into analog regulation signals inputted to feedback circuit 510. The DAC 532 can have some or all same features and/or functionality as the DAC 432 of FIG. 4.

Figure 6:
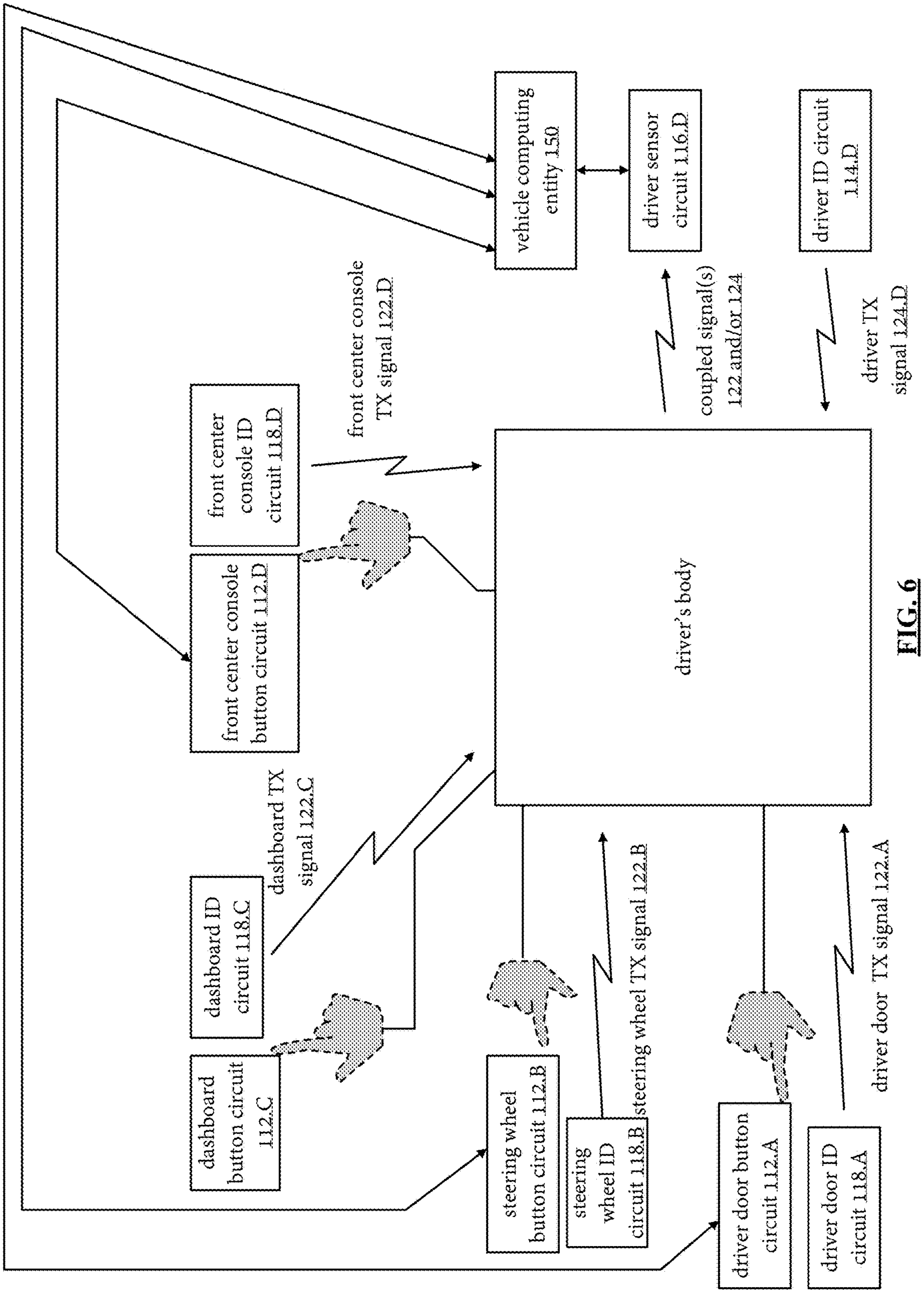
FIG. 6 is a schematic block diagram of an embodiment of a driver area portion of a vehicle sensor system in accordance with various embodiments.

FIG. 6 is a schematic block diagram of an embodiment of a driver area portion of a vehicle sensor system. Other occupancy areas 102 and/or corresponding buttons can be implemented in a same or similar fashion as that of the driver occupancy area 102 of FIG. 6.

A user of the vehicle serving as the driver of the vehicle, while in sitting in the driver's seat or otherwise within the driver occupancy area 102.D, can interact with buttons of the vehicle in their vicinity, such as one or more buttons of the driver door button circuit 112.A on the driver door of the vehicle one or more buttons of the steering wheel button circuit 112.B on the steering wheel of the vehicle; one or more buttons of the dashboard button circuit 112.C on a dashboard of the vehicle; one or more buttons of the front center console circuit 112.D on a center console in the front of the vehicle; and/or one or more buttons of respective button circuits 112 that are within physical reach of the driver, for example, where a driver in the driver's seat can touch and/or hover over such buttons with their finger and/or another part of their body to interact with these buttons. In particular, as illustrated in FIG. 6, the dashed hands illustrate possible touch areas by the driver while in their respective driver occupancy area 102.D. Some or all button circuits 112 of FIG. 6 can be implemented as conventional buttons of a vehicle, can be implemented as described in conjunction with FIG. 1, and/or can be implemented as button circuit 112 of FIG. 5.

ID circuits 118 corresponding to various buttons can each transmit a corresponding TX signal 122, for example, having a corresponding frequency that is unique from other TX signals 124 of other ID circuits of other buttons, for example, to uniquely identify the button from other buttons of the vehicle that may be touched or otherwise interacted with by users. For example, each signal 122 is transmitted at a corresponding identifying frequency that uniquely identifies the corresponding ID circuit 118 from other ID circuits 118 as discussed previously, such as the to the frequency of the corresponding reference signal 315 of the corresponding ID circuit 118 as discussed in conjunction with FIG. 3.

These signals 122 can be propagated through the driver's body when the driver is touching, hovering over, and/or otherwise interacting with the corresponding button of a corresponding button circuit 112. For example, a driver door TX signal 122.A is propagated through the driver based on the driver's body touching or being in proximity to at least one electrode 305 of the driver door ID circuit 118.A upon which a signal at the corresponding frequency is transmitted as discussed in conjunction with FIG. 3. As another example, the driver door TX signal 122.A is propagated through the driver based on the driver's body touching or being in proximity to at least one electrically conductive medium that is also connected to or in proximity the at least one electrode 305 of the driver door ID circuit 118.A, for example, while engaging with a corresponding button of driver door button circuit 112.A. Other ID circuits 118 can similarly transmit TX signals that are propagated through the user when the user touches and/or is in proximity to corresponding buttons of corresponding button circuits 112.

These signals 122 can further be detected via driver sensor circuit 116.D, for example, based on the user also touching and/or being in proximity to the driver sensor circuit while seated in the driver's seat or otherwise being in the driver occupancy area. For example, signals 122 propagated through the driver's body can be detected via driver sensor circuit 116.D based on the driver's body touching or being in proximity to at least one electrode 405 of the driver sensor circuit 116.D while seated in the driver's seat or otherwise being in the driver occupancy area. As another example, the driver TX signal 124.D is propagated through the driver based on the driver's body touching or being in proximity to at least one electrically conductive medium that is also connected to or in proximity the at least one electrode 405 of the driver sensor circuit 116.D while seated in the driver's seat or otherwise being in the driver occupancy area, where the signals 122 are propagated from the user's body to electrode 405 via the at least one conductive medium.

When the driver actuates or otherwise interacts with a given button via its respective mechanism, the respective button circuit 112 can send a signal indicating the actuation of the given button to the vehicle computing entity 150 for processing, for example, where the vehicle computing entity 150 enables the corresponding functionality accordingly. However, rather than simply enabling the corresponding functionality anytime actuation or other interaction with the button is detected, the vehicle computing entity 150 can be operable to only enable the respective functionality when the actuation of the given button is confirmed to have been performed by the driver sitting within the corresponding occupancy area 102.

To enable this confirmation, when the driver touches or is in proximity to an electrode 305 of one or more particular ID circuits 118, for example, while touching, hovering over, being close to, or otherwise interacting with the corresponding button, the driver sensor circuit 116 can detect the corresponding one or more TX signals 122 denoting that a given one or more ID circuits 118, and not other ID circuits 118, were touched or otherwise interacted with by the driver based on having been propagated through the driver's body. For example, the sensed signal data 440 generated by driver sensor circuit 116 indicates the detection of a TX signal 122 due to the user's engagement with electrode 305 integrated within and/or in proximity to a corresponding button, which can be sent to vehicle computing entity 150 for processing. In cases where multiple buttons are interacted with by the driver at a given time, two or more coupled signals 122 can be detected by driver sensor circuit 116.D and indicated in sensed signal data 440 accordingly.

The sensor circuit 116 can further detect presence of the driver themselves. The driver ID circuit 114.D can transmit a driver TX signal 124.D, for example, having a corresponding frequency that is unique from other TX signals 124 of other ID circuits of other occupancy areas 102, for example, to uniquely identify the driver from other occupants of the vehicle that may be touching buttons of button circuits. For example, each signal 124 of each ID circuit 114 is transmitted at a corresponding identifying frequency that uniquely identifies the corresponding ID circuit 114 from other ID circuits 114 as discussed previously, such as the to the frequency of the corresponding reference signal 315 of the corresponding ID circuit 114 as discussed in conjunction with FIG. 3. Alternatively or in addition, the signal 124 of ID circuit 114 simply serves to detect that an occupant is sitting in the corresponding seat.

This signal 124.D can be propagated through the driver's body when the driver is sitting in the driver's seat or is otherwise in the driver occupancy area 102.D. For example, the driver TX signal 124.D is propagated through the driver based on the driver's body touching or being in proximity to at least one electrode 305 of the driver ID circuit 114.D upon which a signal at the corresponding frequency is transmitted as discussed in conjunction with FIG. 3. As another example, the driver TX signal 124.D is propagated through the driver based on the driver's body touching or being in proximity to at least one electrically conductive medium that is also connected to or in proximity the at least one electrode 305 of the driver ID circuit 114.D, where the signal 124.D propagates to the driver's body via the at least one electrically conductive medium.

The coupled signals that are received by driver sensor circuit 116.D based on being coupled and propagated through the driver's body can thus include driver TX signal 124.D alternatively or in addition to one or more other signals 122 of one or more buttons with which the driver is interacting. For example, signal 124.D propagated through the driver's body can be detected via driver sensor circuit 116.D based on the driver's body touching or being in proximity to at least one electrode 305 of the driver ID circuit 114.D while seated in the driver's seat or otherwise being in the driver occupancy area, while also touching or being in proximity to the driver sensor circuit 116.D.

The vehicle computing entity 150 can receive and process signaling from button circuits and sensed signal data 440 from driver sensor circuit 116 over time. When the vehicle computing entity 150 receives signaling from a button circuit 112 indicating actuation and/or other interaction with the corresponding button, and when the vehicle computing entity 150 further receives sensed signal data 440 from the driver sensor circuit 116.D indicating the corresponding button's respective TX signal 122, can process the corresponding functionality accordingly. The sensed signal data 440 can thus serve as confirmation that the driver indeed intended to interact with corresponding buttons via button circuits, for example, as opposed to such button circuits being actuated by accident, by another user, and/or via other objects such as food crumbs or water droplets being inadvertently dropped upon a corresponding sensor, switch, or other mechanism of the button. When a button is actuated but the corresponding TX signal 122 is not indicated in sensed signal data 440 of driver sensor circuit 116.D, the corresponding functionality is optionally not performed, based on failing to confirm the driver interacted with the corresponding button.

For example, the vehicle computing entity 150 generates and sends control data to an actuator of a driver door window to cause the window to roll down based on receiving a corresponding signal from a corresponding button circuit 112.A, and further based on driver sensor circuit 116.D having sent sensed signal data 440 indicating the driver door TX signal 122.A was detected based on the driver interacting with a driver door button corresponding to driver window controls. As another example, the vehicle computing entity 150 generates and sends control data to an audio system to cause a currently playing song to be skipped to a next song in a given playlist based on receiving a corresponding signal from a corresponding button circuit 112.B, and based on driver sensor circuit 116 having sent sensed signal data 440 indicating the steering wheel TX signal 122.B was detected due to driver interaction with an electrode 305 of a steering wheel button corresponding to audio controls. Other sensor circuits 116 of other occupancy areas 102 can operate in a similar fashion to detect signals of buttons propagated through respective occupants, for example, while sitting in respective seats of the vehicle. The vehicle computing entity 150 can receive and process sensed signal data 440 further indicating presence of the driver based on including signal 124.

The electrode 305 of a given ID circuit 118 of a given button or part of the vehicle can optionally be the same electrode of a corresponding button circuit 112 of the given button or part of the vehicle. Alternatively, the electrode 305 of a given ID circuit 118 of a given button or part of the vehicle is different from the electrode or other sensor of the corresponding button circuit 112 of the given button or part of the vehicle, for example where both electrode 305 and the other electrode and/or sensor are integrated within the corresponding button, are in close physical proximity to the corresponding button, and/or are in close physical proximity to each other. The electrode 305 of a given ID circuit 118 can otherwise be in close proximity to the physical button that the user touches or otherwise interacts with to actuate corresponding functionality, for example to ensure that the user's body will transmit the TX signal 122 transmitted by electrode 305 when interacting with the corresponding button.

The electrode 405 of a given sensor circuit 116 of a given occupancy area 102 of the vehicle can optionally be the same electrode 305 of a corresponding ID circuit 114 of the given occupancy area 102. Alternatively, the electrode 405 of a given sensor circuit 116 of a given occupancy area 102 of the vehicle can be different from electrode 305 of the corresponding ID circuit 114 of the given occupancy area 102, for example where both electrode 305 and electrode 505 are integrated within a chair of the corresponding occupancy area, are in physical proximity to the corresponding occupancy area, and/or are in physical proximity to each other.

Figure 7:
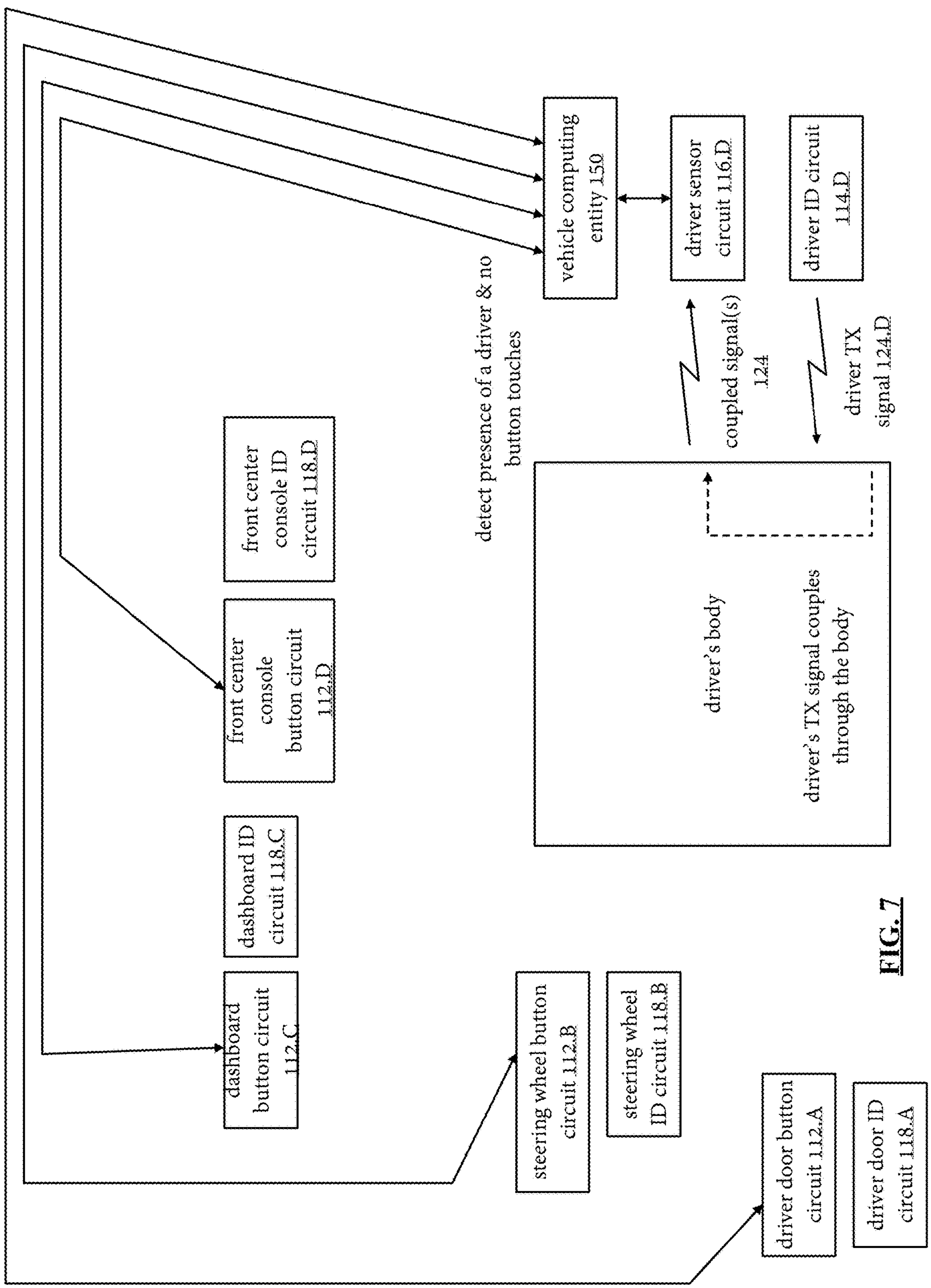
FIG. 7 is a schematic block diagram of an example of sensing a driver in accordance with various embodiments.

FIG. 7 is a schematic block diagram of an example of sensing a driver. In the example of FIG. 7, no driver interaction with buttons are detected, for example, based on the driver not touching or interacting with any buttons. However, as illustrated in FIG. 7, the driver TX signal 124.D propagates through the driver's body as coupled signals 124 for sensing by driver sensor circuit 116.D, where the driver sensor circuit 116.D generates its sensed signal data 440 for transmission to vehicle computing entity 150 for processing. For example, the vehicle computing entity 150 verifies the driver's seat is occupied based on the driver TX signal 124.D being sensed by driver sensor circuit 116.D, and performs various functionality accordingly.

Figure 8A:
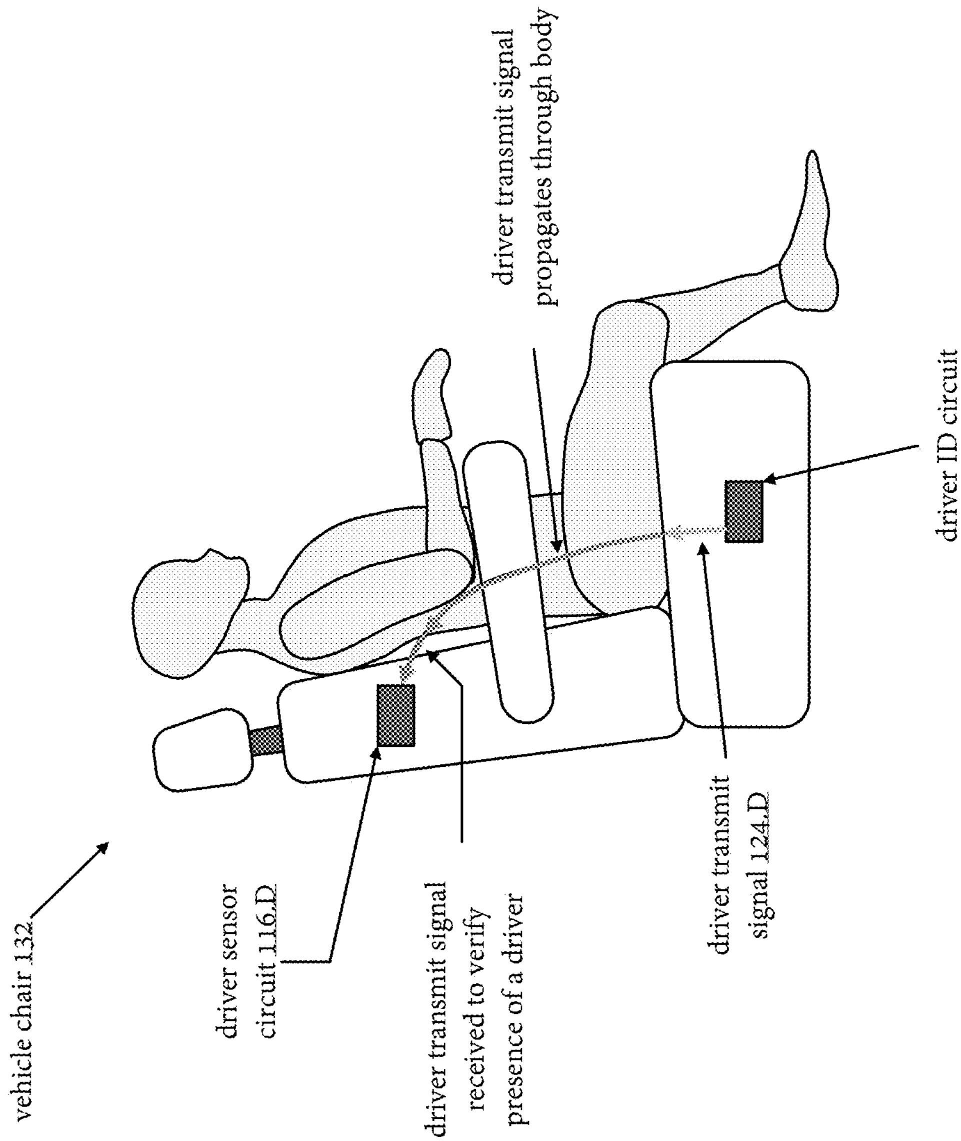
FIG. 8A is a schematic block diagram of another example of sensing a driver in accordance with various embodiments.

FIG. 8A is a schematic block diagram of a particular example of sensing a driver via integration of the driver sensor circuit 116.D and the driver ID circuit 114.D within a vehicle chair 132 of the vehicle. When a person sits in the chair, the driver TX signal 124.D transmitted via driver ID circuit 114.D is propagated through the user's body for receipt by the driver sensor circuit 116.D, verifying the presence of a driver.

Some or all other vehicle chairs 132 of other occupancy areas, such as a front passenger chair, one or more rear passenger chairs and/or one or more rear passenger benches, and/or other seats of the vehicle configured for seating by a person, can be configured in a similar fashion to include the respective sensor circuit 116 and the ID circuit 114 for the corresponding occupancy area 102.

The sensor circuit 116 and the ID circuit 114 of the driver vehicle chair 132 and/or other vehicle chairs of the vehicle can be integrated within different portions of the chair than the configuration illustrated in FIG. 8. For example, the sensor circuit 116 and/or the ID circuit 114 are integrated within the bottom of the chair, the back of the chair, the headrest of the chair, the arms of the chair, a seatbelt of the chair, and/or other portions of the chair. The sensor circuit 116 and/or the ID circuit 114 can be positioned far enough apart and/or otherwise configured such that the transmit signal 124 is not sensed by the ID circuit 114 unless a person is sitting in the chair.

Figure 8B:
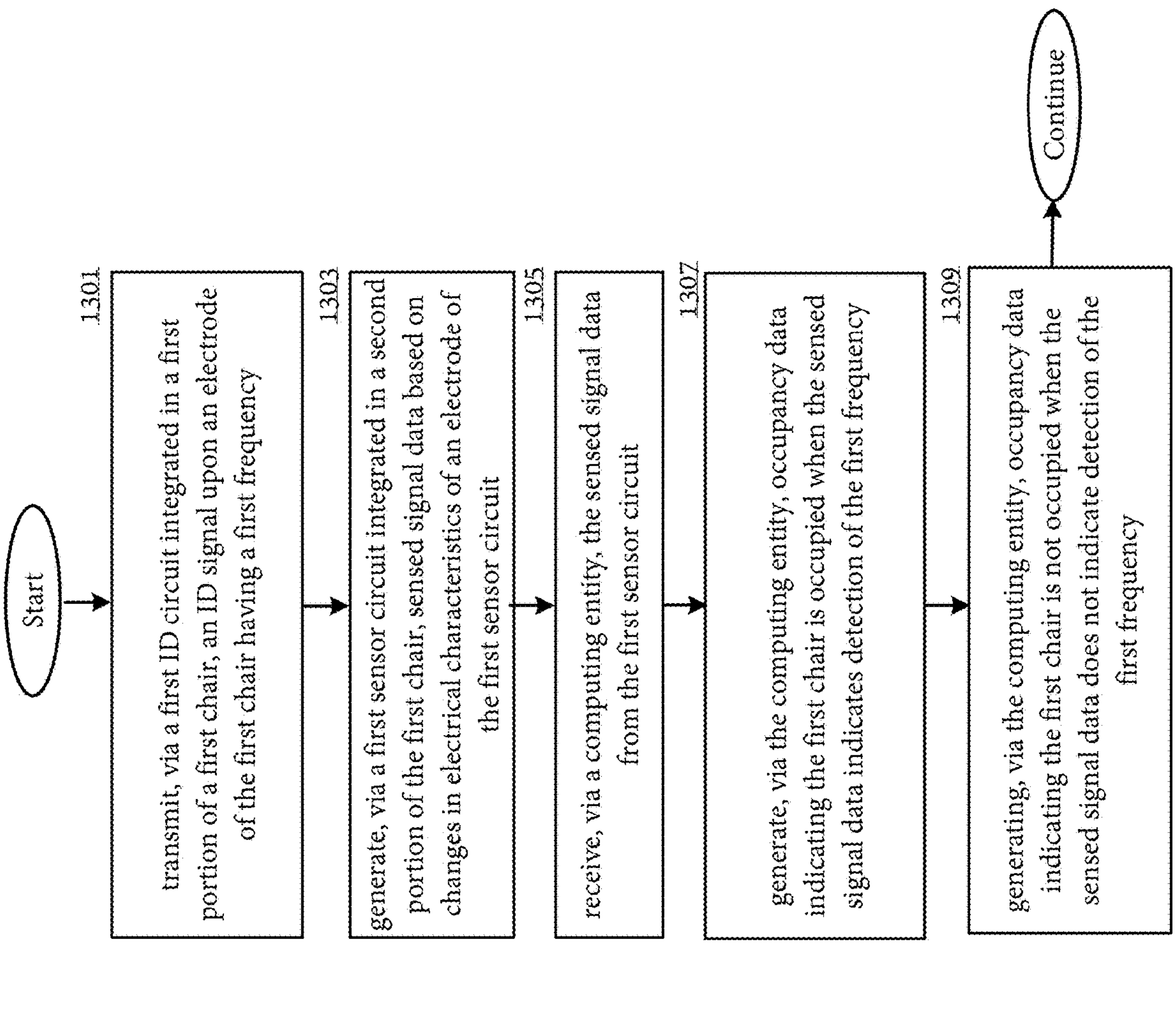
FIG. 8B is a logic diagram of an example method for execution in accordance with various embodiments.

FIG. 8B is a logic diagram illustrating a method of detecting occupancy of vehicle chairs via ID circuits and sensor circuits integrated within vehicle chairs. Some or all of the method of FIG. 8B can be performed via a vehicle sensor system or other sensor system, a vehicle chair 132, a vehicle computing entity 150, at least one sensor circuit 116, and/or at least one ID circuit 114, for example, based on some or all functionality discussed in conjunction with FIG. 8A. Some or all of the method of 8B can be performed via any computing entity of FIGS. 2A-2D and/or any processing module, which can be associated with a corresponding vehicle, or any other system, for example, that includes one or more vehicle chairs.

Step 1301 includes transmitting, via a first ID circuit integrated in a first portion of a first chair, an ID signal upon an electrode of the first chair having a first frequency. Step 1303 includes generating, via a first sensor circuit integrated in a second portion of the first chair, sensed signal data based on changes in electrical characteristics of an electrode of the first sensor circuit. For example, the chair is a vehicle chair 132, the first ID circuit is an ID circuit 114, and/or the first sensor circuit is a sensor circuit 116.

Step 1305 includes receiving, via a computing entity, the sensed signal data from the first sensor circuit. Step 1307 includes generate, via the computing entity, occupancy data indicating the first chair is occupied when the sensed signal data indicates detection of the first frequency. Step 1309 includes generating, via the computing entity, occupancy data indicating the first chair is not occupied when the sensed signal data does not indicate detection of the first frequency. The method can further include performing at least one vehicle functionality based on the occupancy data, for example, where different functionality is performed based on whether the occupancy data indicates the chair is occupied.

In various embodiments, the method further includes transmitting, via a second ID circuit integrated in a first portion of a second chair of the vehicle, an ID signal upon an electrode of the first chair having a second frequency. The second frequency can be the same as or different from the first frequency. The second chair and the first chair can both be located within a same bounded location, for example, as two vehicle chairs of a same vehicle. The method can further include generating, via a second sensor circuit integrated in a second portion of the second chair, second sensed signal data based on changes in electrical characteristics of an electrode of the second sensor circuit. The method can further include receiving, via the computing entity, the second sensed signal data from the second sensor circuit. The occupancy data can be further generated to indicate whether the chair is occupied based on whether the second sensed signal data indicates detection of the second frequency.

In various embodiments, the first portion of the chair and the second portion of the chair are included within at least two of: a seat of the chair, a back of the chair, a headrest of the chair, a right armrest of the chair, a left armrest of the chair, a seatbelt of the chair, a steering wheel in proximity to the chair, or other element of the chair and/or in proximity to the chair.

In various embodiments, a distance between the first ID circuit and the first sensor circuit is configured such that: the first sensor circuit detects the first frequency when the chair is occupied by a human body, and the first sensor circuit does not detect the first frequency when the chair is not occupied by a human body.

Figure 8C:
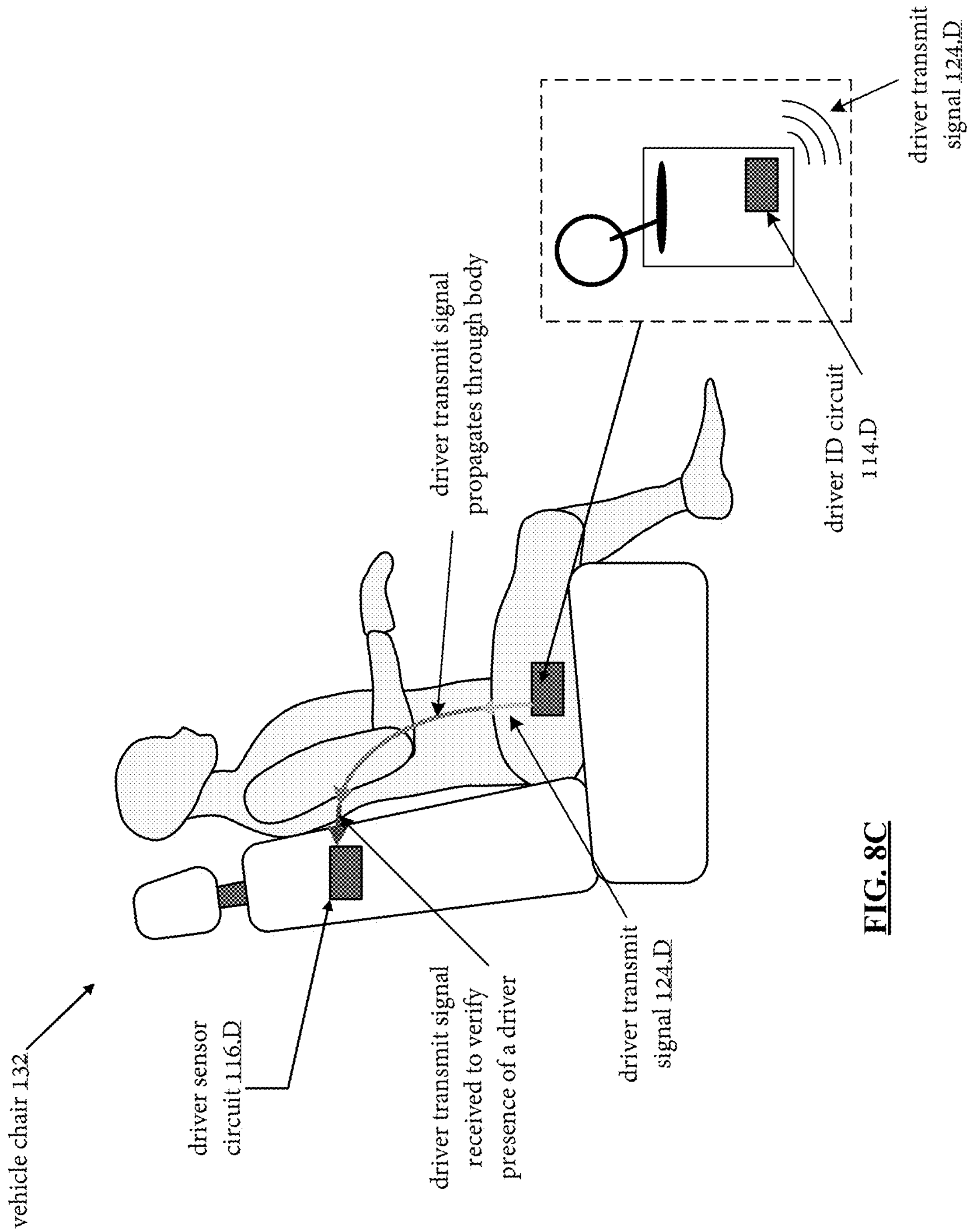
FIG. 8C is a schematic block diagram of another example of sensing a driver in accordance with various embodiments.

FIG. 8C illustrates an embodiment where a driver ID circuit 114.D is implemented via integration within portable device. The driver ID circuit 114.D can be implemented via any device that can be worn and/or carried by a user that drives the car. As depicted in FIG. 8C, the portable device is in a pants pocket of the user. As the driver ID circuit 114.D is similarly in proximity to the user, despite not being integrated within the vehicle seat directly, the driver transmit signal 124.D can similarly be propagated through the body of the driver for receipt by a driver sensor circuit 116.D.

As depicted in FIG. 8C, the portable device can be a device associated with operation of the vehicle and/or driving the vehicle a key fob and/or car key. For example, the person driving a car at a given time carries the car key to enable unlocking of the car and starting of the vehicle engine. The key fob and/or car key can transmit the driver ID signal 124.D in addition to other signaling transmitted by the key fob and/or car key, for example, such as secure signaling for unlocking of and/or operation of the vehicle. Alternatively, the key fob and/or car key can transmit the driver ID signal 124.D as some or all of its secure signaling, and/or frequency of the driver ID signal 124.D is modulated upon the other secure signaling. The portable device with the integrated driver ID circuit 114.D can be implemented as any other device that can be worn or carried by users, such as a wearable device, smart phone or cellular phone, or other device. In some embodiments, the driver ID signal 124.D is only transmitted while the key fob is detected to be in the vehicle and/or after a user has unlocked the vehicle or utilized the key fob to start the vehicle.

In some embodiments, alternatively or in addition to being detectable via a sensor circuit of a vehicle chair, the driver ID signal 124.D transmitted by such a portable device held by, worn by, and/or carried by the user can be detected by exterior sensor circuits 116, such as RX circuits 119 of corresponding button circuits 112 on the exterior of the vehicle, to confirm button touches on the exterior vehicle in a same or similar fashion as utilizing the driver ID signal 124.D. For example, a user selects a button on a door handle to unlock and/or open the door from the outside, and the detection of the driver ID signal 124.D and/or a corresponding authentication signal by the key fob or other portable device, is confirmed as a true interaction based on being transmitted through the user's body from the key fob or other portable device to the user's hand touching the door, and or is validated based on the signal being a secure signal of a key fob.

As another example, the user enters a secure passcode via a keypad on the car exterior or performs a secure gesture in proximity to one or more electrodes on the car exterior to provide an additional layer of security in addition to further confirming the interaction via detection of the ID signal through the user's body As another example, a user makes a gesture such a kick under or in proximity to a trunk or back of the car, or a hand gesture in proximity to a window, door, or other exterior vehicle component to open a car door, the trunk, to operate a power lift gate, etc. The signal can be propagated through the user's body to their foot kicking under the trunk or to their hand, where corresponding sensor circuits such as RX circuits and/or drive sensor circuits detect the signal through the hand or foot to both detect the gesture and confirm the intended gesture based on also identifying the given frequency, and can thus perform the functionality accordingly.

Figure 8D:
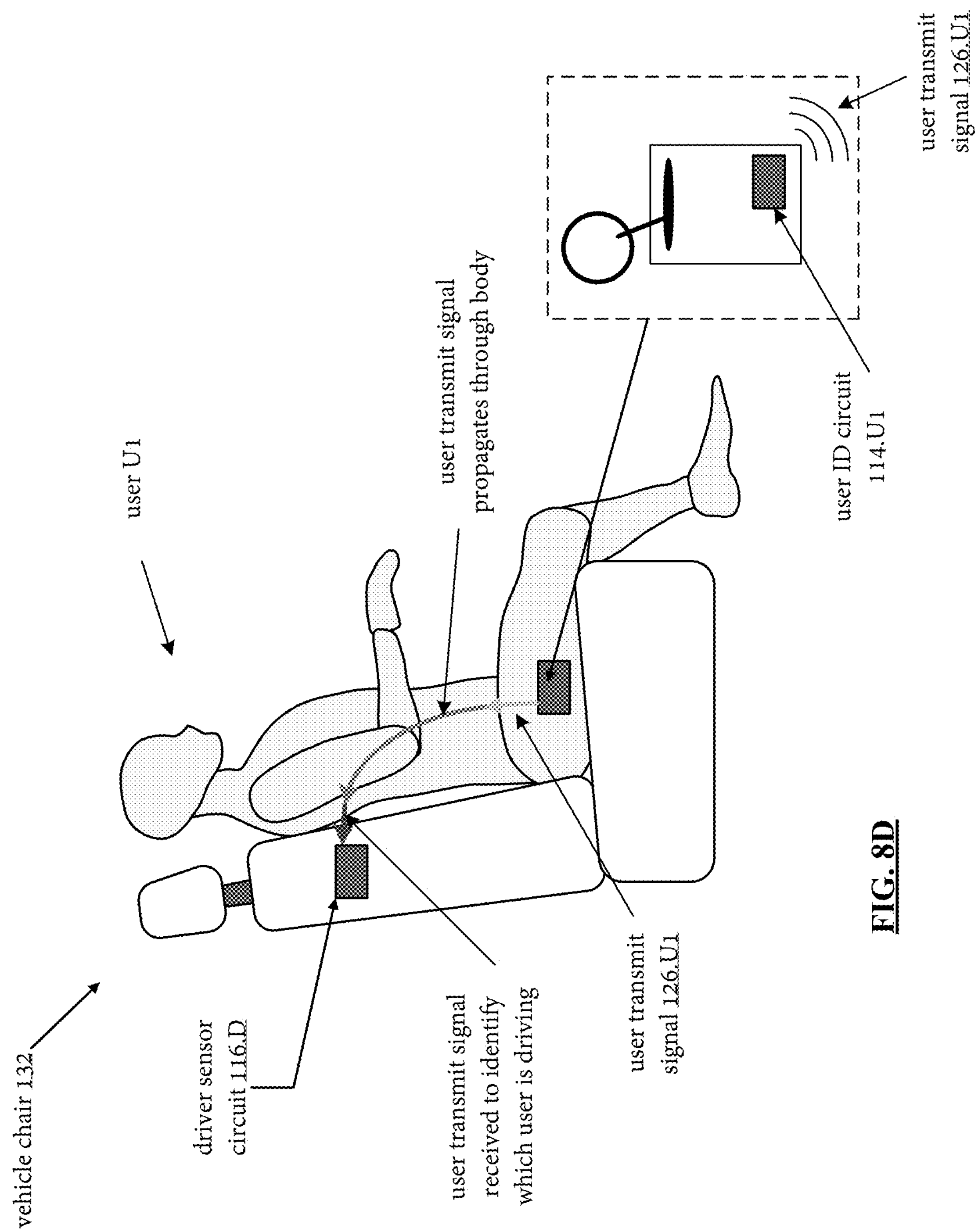
FIG. 8D is a schematic block diagram of an example of identifying a driver in accordance with various embodiments.

FIG. 8D illustrates an embodiment where one or more user ID circuits 114.U is implemented via integration within portable devices, for example, owned by different users. A user ID circuits 114.U can be implemented in a same or similar as ID circuits 114 and/or 118. However, rather than denoting a particular occupancy area or vehicle location, the ID circuits 114.U can identify a particular person, such as one of a set of different people that may drive the vehicle or be passengers of the vehicle at different times.

In the example of FIG. 8D, a particular user U1 has their own portable device transmitting a user transmit signal 126.U1 via a user ID circuit 126.U1. Other users, such as other people that drive the vehicle in other instances or that are passengers in the car in other seats while user U1 is driving, can optionally have their own portable devices with ID circuits 114.U transmitting other user transmit signal 126.U. Different user transmit signals 126.U of different users can have different respective frequencies that, when detected via sensor circuits 116, enable identification of different particular people accordingly that are in the vehicle and/or occupying particular seats of the vehicle. This can be preferred in embodiments where detection of signaling of different people can render different output in button interactions, different configuration of settings for their occupancy area, etc. via the vehicle computing entity 150.

The portable device of FIG. 8D can be implemented as a key fob, car key, wearable device, cellular phone, smart phone, or other device that is owned by and/or associated with the corresponding user. In cases where the key fob and/or car key implements the portable device, a set of multiple different key fob and/or car keys for a given vehicle can each correspond to a different user of the vehicle, such as different drivers of the vehicle that drive the vehicle at different times, and thus each transmit different transmit signals 126.U1. In such embodiments, each driver can carry and use their own respective key fob and/or car keys to operate the vehicle, where the user transmit signal 126.U1 of a given key fob and/or car key thus distinguishes the corresponding user driving the vehicle.

Figure 8E:
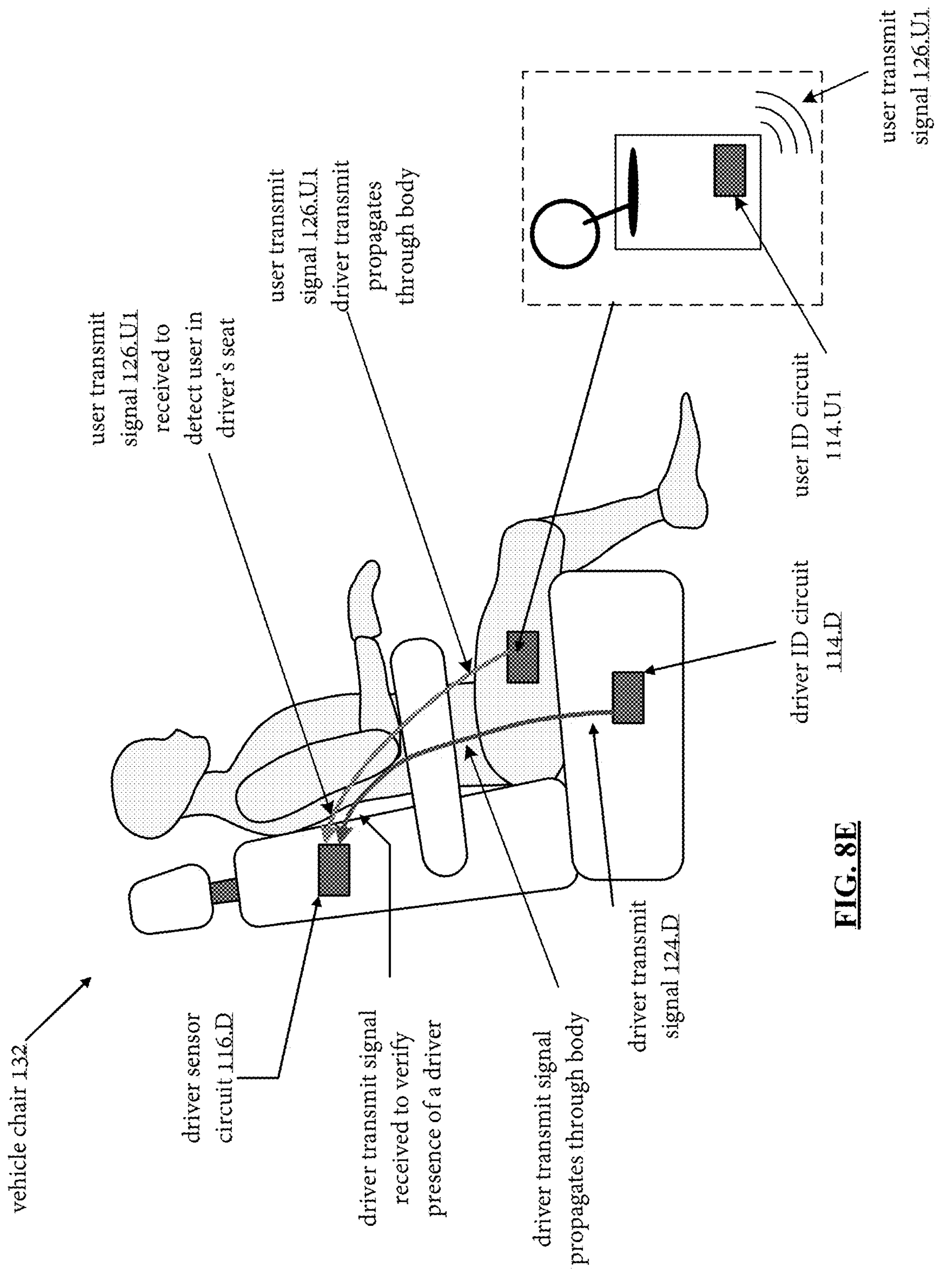
FIG. 8E is a schematic block diagram of an example of identifying a driver in accordance with various embodiments.

As illustrated in FIG. 8E, a user ID circuit 114.U can be implemented in addition to an ID circuit of a given occupancy area. This can be preferred in cases where users are not required to and/or may not always carry their respective portable device. The sensor circuit can receive coupled signaling indicating both the ID signal for the given occupancy area and the given user, which can be sent to the computing entity enabling the computing entity to determine which user is occupying which seat of the vehicle.

Alternatively to the user transmit signal being transmitted by the user ID circuit of a portable device though the body of a user, the portable device can transmit other signaling indicating the user and/or their frequency, for receipt by the driver ID circuit and/or other circuitry of the vehicle chair 132. For example, the driver ID circuit 114.D transmits user signals 126.0 at different frequencies based on detecting which user is occupying the chair, for example, based on pairing to, receiving signaling from, detecting unique impedance patterns induced by, and/or otherwise identifying the portable device and/or the person in the chair.

Figure 8F:
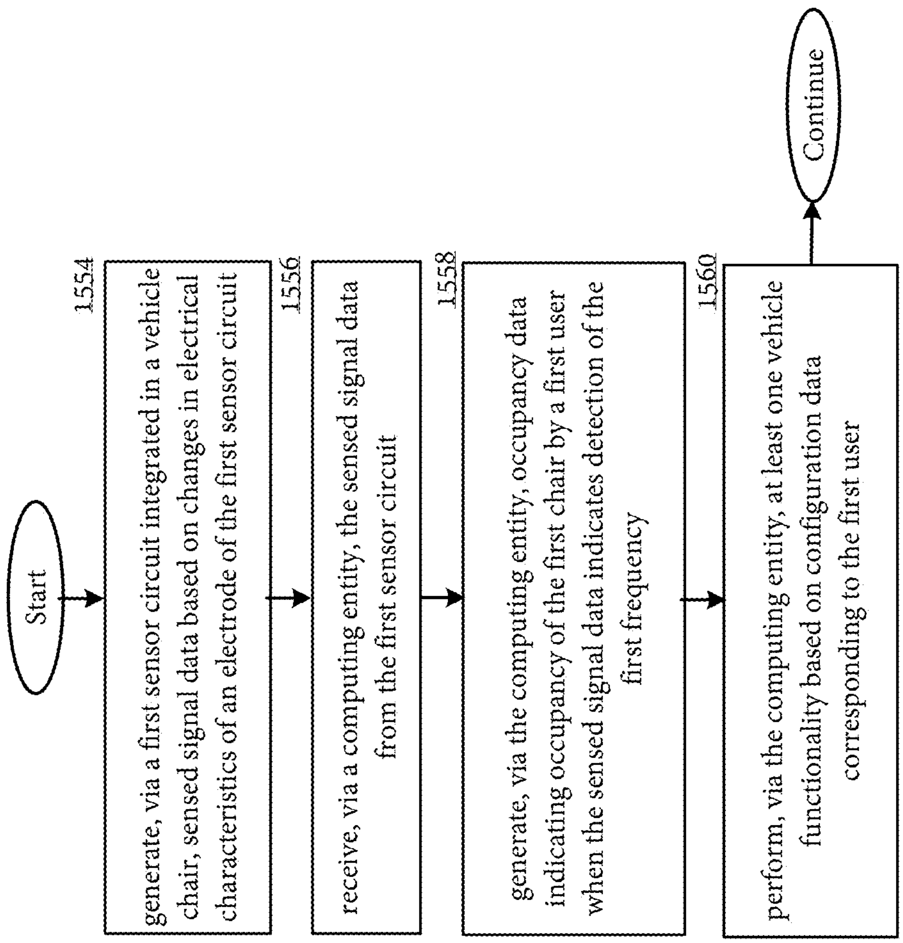
FIG. 8F is a logic diagram of an example method for execution in accordance with various embodiments.

FIG. 8F is a logic diagram illustrating a method of detecting particular users in vehicle chairs via ID circuits integrated within portable devices and sensor circuits integrated within vehicle chairs. Some or all of the method of FIG. 8F can be performed via a vehicle sensor system or other sensor system, a vehicle chair 132, a vehicle computing entity 150, at least one sensor circuit 116, and/or at least one ID circuit 114 of a portable device, for example, based on some or all functionality discussed in conjunction with FIGS. 8C-8E. Some or all of the method of 8F can be performed via any computing entity of FIGS. 2A-2D and/or any processing module, which can be associated with a corresponding vehicle, or any other system, for example, that includes one or more chairs and/or in which users carry and/or wear portable devices with ID circuits.

Step 1554 includes generating, via a first sensor circuit integrated in a vehicle chair or other portion of the vehicle, sensed signal data based on changes in electrical characteristics of an electrode of the first sensor circuit. For example, the sensed signal data is generated based on detection of a user ID signal 126 transmitted via an ID circuit integrated in a portable device worn by and/or carried by a first user, where this ID signal has a first frequency uniquely identifying the first user from other users in a set of users of the vehicle.

Step 1556 includes receiving, via a computing entity, the sensed signal data from the first sensor circuit. Step 1558 includes generating, via the computing entity, occupancy data indicating occupancy of the first chair by a first user when the sensed signal data indicates detection of the first frequency. For example, the first user is identified based on a mapping of frequencies to users accessed in memory of the computing entity, where the first user is mapped to the first frequency. Step 1560 includes performing, via the computing entity, at least one vehicle functionality based on configuration data corresponding to the first user.

In various embodiments, the at least one vehicle functionality corresponds to an occupancy area in which the user is detected, such as an occupancy area that includes the first chair. For example, the at least one vehicle functionality includes configuration of one or more vehicle elements in the corresponding occupancy area based on configuration data corresponding to the first user. The configuration data can correspond to one or more of: seat position configuration, temperature configuration, seat cooling element configuration, volume configuration, air conditioning configuration, fan speed configuration, heating configuration, such as whether heating be applied to the chest area or foot area, a window configuration such as whether windows be raised or lowered, a heads up display configuration, radio station configuration, playlist configuration, or other functionality.

The configuration data can correspond to preference data configured by the user via interaction with one or more button circuits 112, configuration history data such as a most common and/or most recent configuration by the user in the same chair or in a different chair, or other configuration data corresponding to the user. The configuration data can be stored and/or accessed in memory of the computing entity, mapped to the first user and/or the first frequency. Other configuration data for other users can be similarly stored and/or accessed in memory of the computing entity, mapped to the other respective users and/or other respective frequencies.

For example, stored configuration settings corresponding to the first user indicate their exact seat configuration and mirror configuration, their preferred temperature, and their favorite radio station. When the first user is detected in the first chair, these settings are automatically initiated by the computing entity, where the chair and mirrors are automatically actuated to be in the stored configuration, where AC settings reflect the preferred temperature, and where an audio system tunes to and plays the favorite radio station. A second user sitting in another seat at the same time can similarly have their seating configuration automatically set and/or temperature settings for their occupancy area set via the computing device, via the other seat detecting another frequency corresponding to the second user based on the second user carrying or wearing a portable device transmitting this frequency.

As another example, most recent configuration settings are stored for a first user sitting in the driver's seat and a second user sitting in the passenger seat during a road trip, based on each user interacting with various button circuits 112 to configure settings based on their current preferences (e.g. where current lumbar support configuration of the seat configuration of the driver is based on a more sore back of the user due to the long drive, or where current temperature settings are based on the ambient temperature, the time of day, the clothing the users are wearing, etc.).

The first user and second user may trade off who is driving mid trip, for example, by pulling over and/or when getting gas. This trade off may include turning the car off and back on, for example, when getting gas; or can include the car remaining on, for example, with the engine running, due to a quick trade off in a parking lot or on the side of the road.

Once this first trade-off is complete, the first user is now in the passenger seat and the second user is now in the driver seat. This trade-off can be detected based on the driver's seat sensor circuit detecting the second user's frequency, and based on the passenger seat sensor circuit detecting the first user's frequency. Some or all of the stored configuration for each user in their respective area, such as their seat configuration (e.g. seat height, seat forward or backwards, lumbar support, etc.), temperature settings (e.g. fan speed, seat heating element being on or off, whether heating is applied to feet or chest or both, etc.), and/or other most recent settings can be applied. For example, some or all of the seat configuration and/or temperature settings for the driver's seat while occupied by the first user can be applied automatically to the passenger seat based on detecting the first user in the passenger seat, and vice versa.

Alternatively or in addition, some or all configurations may be specific to whether a user is driving or not. For example, the first user wishes to have a very different seat configuration as a passenger based on not needing to assume an active driving position. As another example, some configurations, such as mirror configurations and/or steering wheel configuration, only apply to the current driver. In some embodiments, the most recent settings for each user can be stored, and can be further mapped to their respective seat. For example, after a second trade-off, when the first user resumes their seat in the driver's seat and the second user resumes their seat in the passenger seat, some or all of the saved configurations for when the first user was last driving are automatically applied, such as the seat configuration for the driver seat, mirror configuration, and/or steering wheel configuration from when they were driving prior to the first trade off. After a third trade off, the driver seat, mirror, and/or steering wheel configurations can similarly be automatically adjusted to assume the last configuration by the second user while in the driver seat prior to the second trade off. The passenger seat configurations can similarly be adjusted based on the last saved configuration for when the respective user was in the passenger seat. In such cases, the temperature configurations can be configured based on the latest setting by the user, regardless of their seat, as these preferences may not be tied to whether the given user is driving. Determination of which preferences be seat-dependent vs. adjusted to the most recent configuration regardless of seat can be preselected, configured via user input to one or more button circuits 112, or otherwise determined.

A timeout period and/or corresponding timeout vehicle status condition can be applied to determine to reset to default settings, default preference configurations, and/or most common preferences for each user, such as a threshold amount of time that the car is off, determining a location of the car is home or at a final destination entered into the navigation system, or another determination. For example, when these conditions are met, the most recent settings may no longer be applicable for the user driving at a later date or on a different trip.

Figure 9:
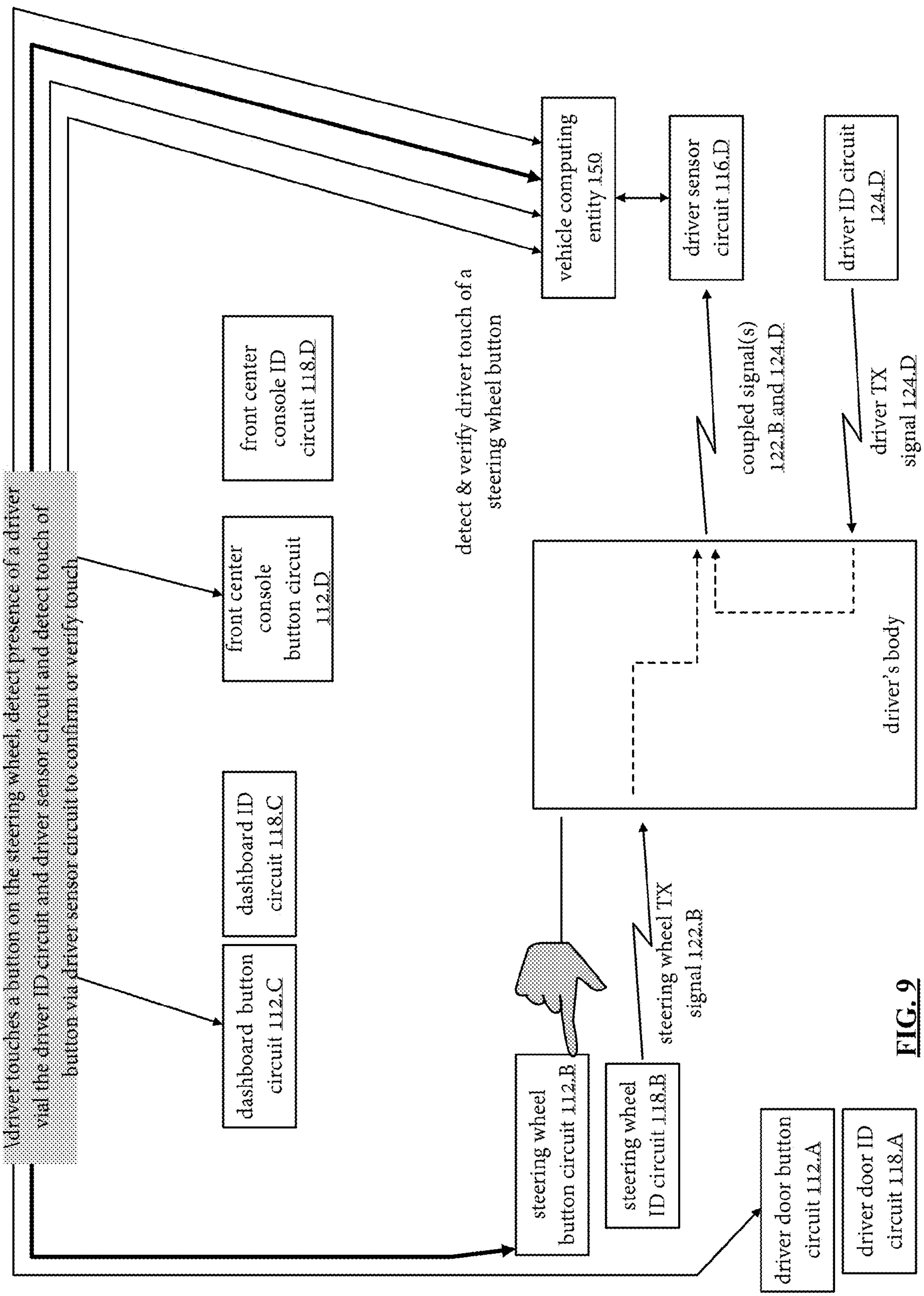
FIG. 9 is a schematic block diagram of an example of sensing a steering wheel button touch and confirmation of touch by a driver in accordance with various embodiments.

FIG. 9 is a schematic block diagram of an example of sensing a steering wheel button touch and confirmation of touch by a driver. In this example, the driver touches and/or puts their hand and/or other body part in proximity to a steering wheel button of steering wheel button circuit 112.B and/or of steering wheel ID circuit 118.B. The steering wheel button circuit 112.B detects the touch and/or other interaction, which can cause steering wheel button circuit 112.B to generate a signal indicating detection its actuation, which can be sent to vehicle computing entity 150. Furthermore, steering wheel ID circuit transmits steering wheel TX signal 124.B, having its unique frequency, through the body of the driver based on user's hand being in proximity to a corresponding electrode 305 due to their touch of the corresponding steering wheel button by the driver. Thus, driver sensor circuit 116.D receives steering wheel TX signal 112.B and/or driver TX signal 124 based on being coupled through the body of the user, which can be detected and indicated in sensed signal data 440 generated by driver sensor circuit 116.D, where sensed signal data 440 can be sent to vehicle computing entity 150. Vehicle computing entity 150 can process the signaling from the button circuit 112 to determine actuation of a steering wheel button, and can further process the respective sensed signal data 440 to verify the actuation of the steering wheel button was performed by the user. Based on this detection and verification, vehicle computing entity 150 can generate control data or otherwise initiate corresponding functionality accordingly.

Figure 10:
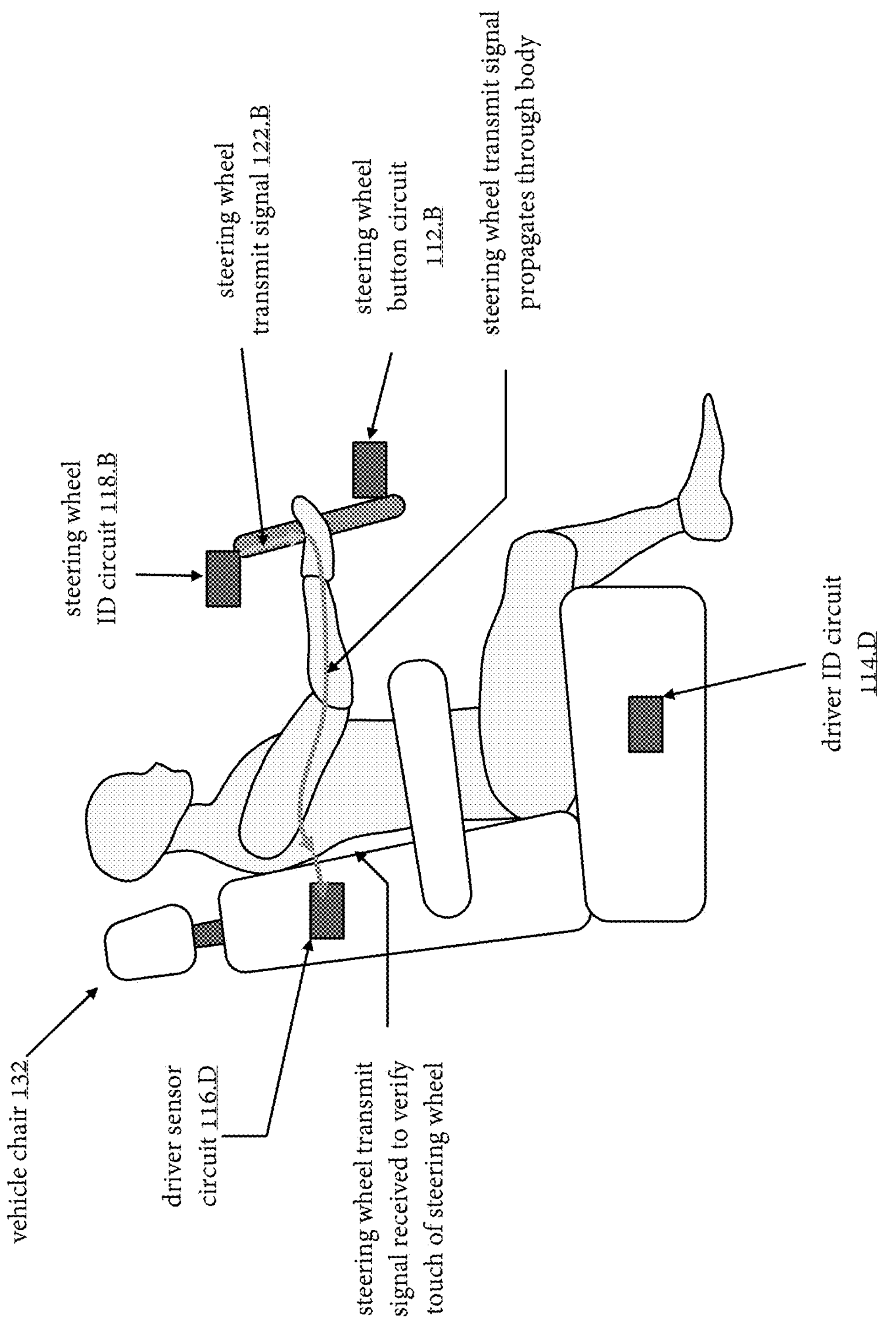
FIG. 10 is a schematic block diagram of another example of sensing a steering wheel button touch and confirmation of touch by a driver in accordance with various embodiments.

FIG. 10 is a schematic block diagram of a particular example of sensing a steering wheel button touch and confirmation of touch by a driver via vehicle chair 132 of FIG. 8A, and/or via integration of steering wheel button circuit 112.B and/or steering wheel ID circuit 118.B within the steering wheel of the vehicle. When the user touches the steering wheel ID circuit, and/or another portion of the steering wheel where the some or all of the steering wheel is electrically conductive to facilitate propagation of steering wheel TX signal 124.B, the steering wheel TX signal 124.B propagates through the user's body for receipt by the driver sensor circuit 116.D. In some embodiments, the steering wheel button circuit 112.A can optionally also detect touches and/or interaction by the user and/or can optionally detect the driver transmit signal 124.D propagated through the user's body, for example, based on the user touching and/or being in close proximity to the button of steering wheel button circuit 112.A, and/or based on some or all of the steering wheel being electrically conductive.

Figure 11:
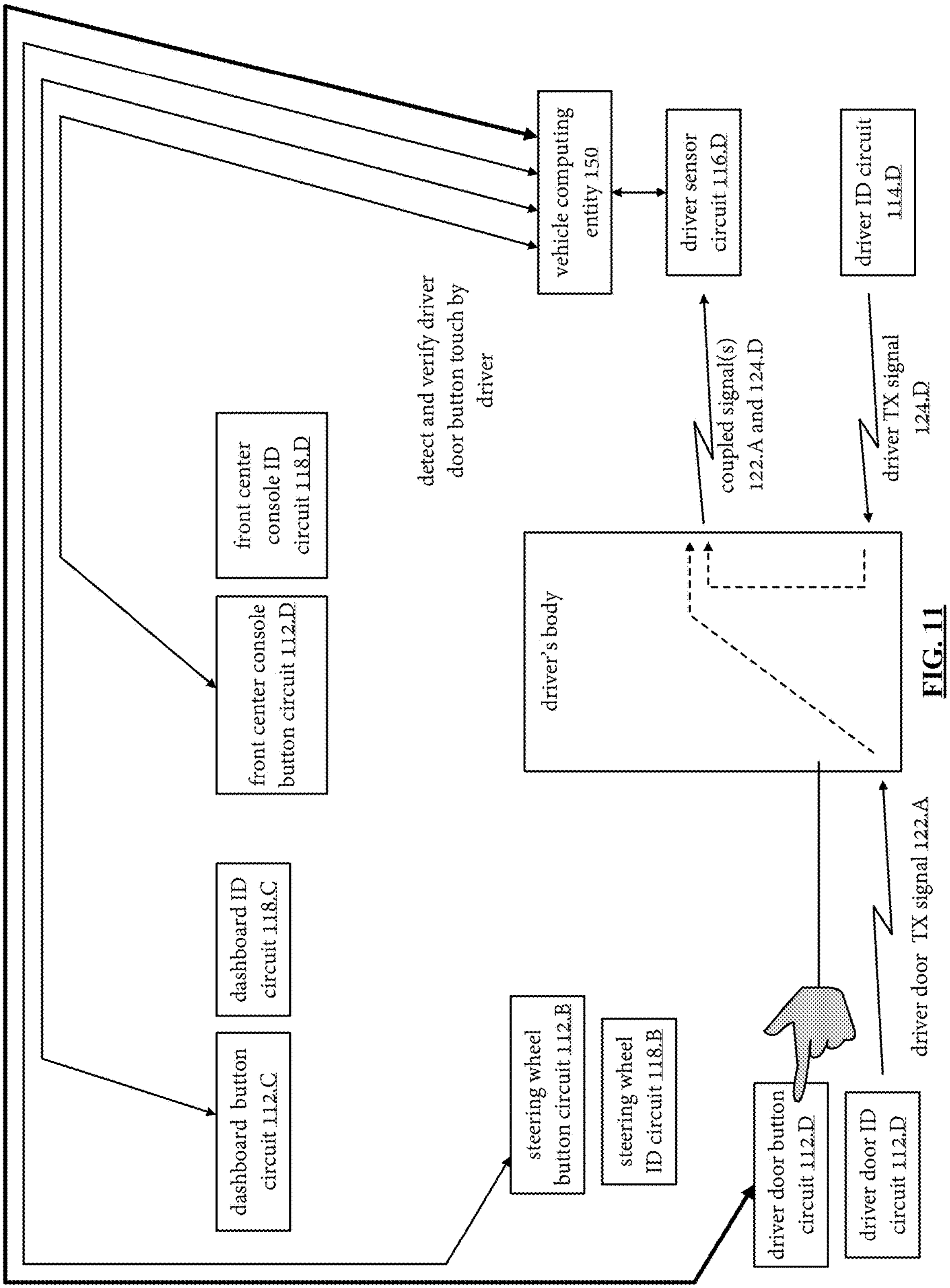
FIG. 11 is a schematic block diagram of an example of sensing a driver door button touch and confirmation of touch by a driver in accordance with various embodiments.

FIG. 11 is a schematic block diagram of an example of sensing a driver door button touch and confirmation of touch by a driver. Interaction with a driver door button can be detected in a same or similar fashion as interaction with steering wheel button discussed in conjunction of FIGS. 9 and 10, based on similar user interaction with a button corresponding to the driver door button circuit 112.A and/or the propagation of TX signal 122.B through the driver's body for detection based on being transmitted by a driver door ID circuit 118.B in proximity to the driver door button circuit 112.A.

Figure 12:
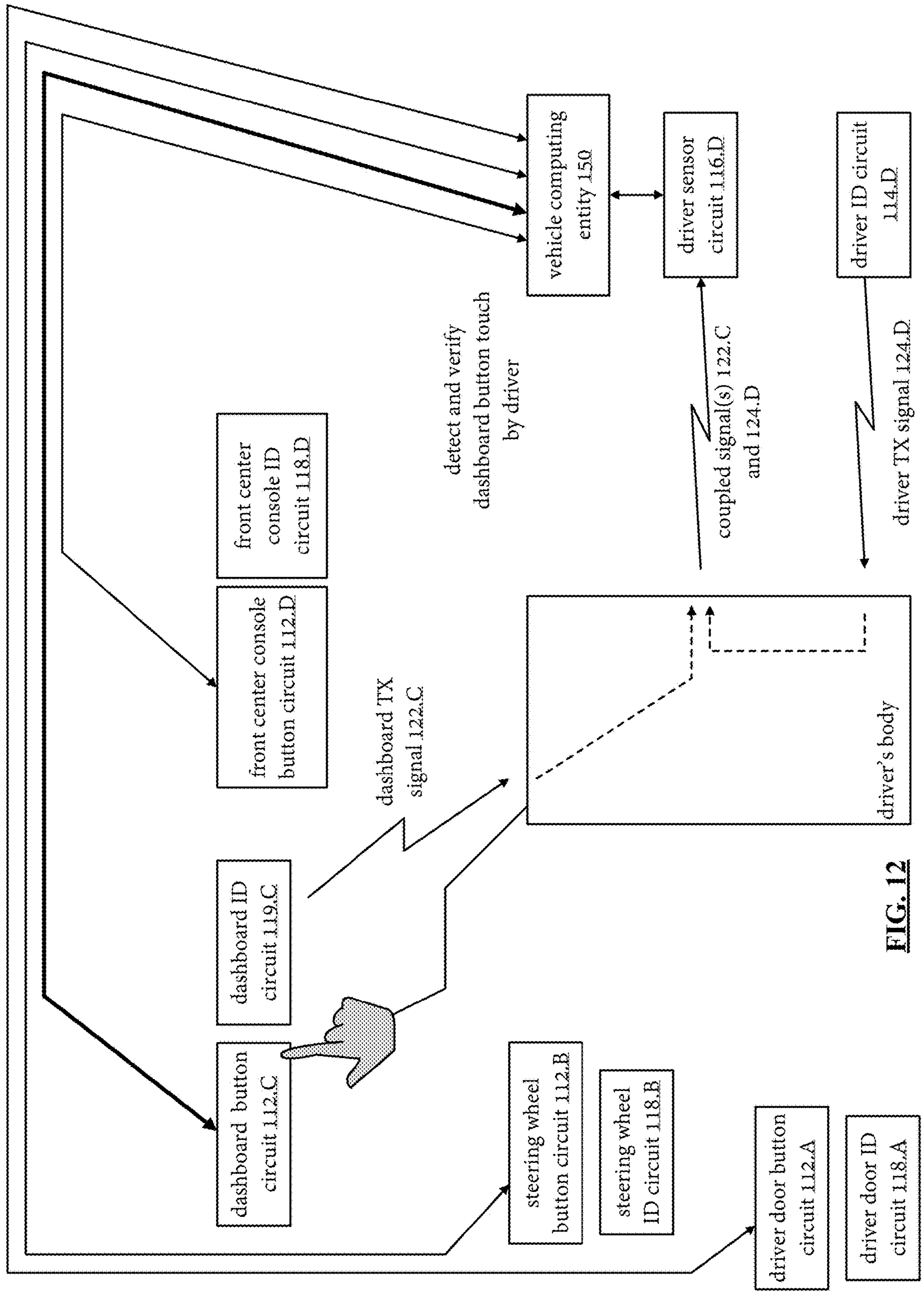
FIG. 12 is a schematic block diagram of an example of sensing a dashboard button touch and confirmation of touch by a driver in accordance with various embodiments.

FIG. 12 is a schematic block diagram of an example of sensing a dashboard button touch and confirmation of touch by a driver. Interaction with a dashboard button can be detected in a same or similar fashion as interaction with steering wheel button discussed in conjunction of FIGS. 9 and 10, based on similar user interaction with a button corresponding to the dashboard button circuit 112.C and/or the propagation of TX signal 122.C through the driver's body for detection based on being transmitted by a dashboard ID circuit 118.C in proximity to the driver door button circuit 112.C.

Figure 13A:
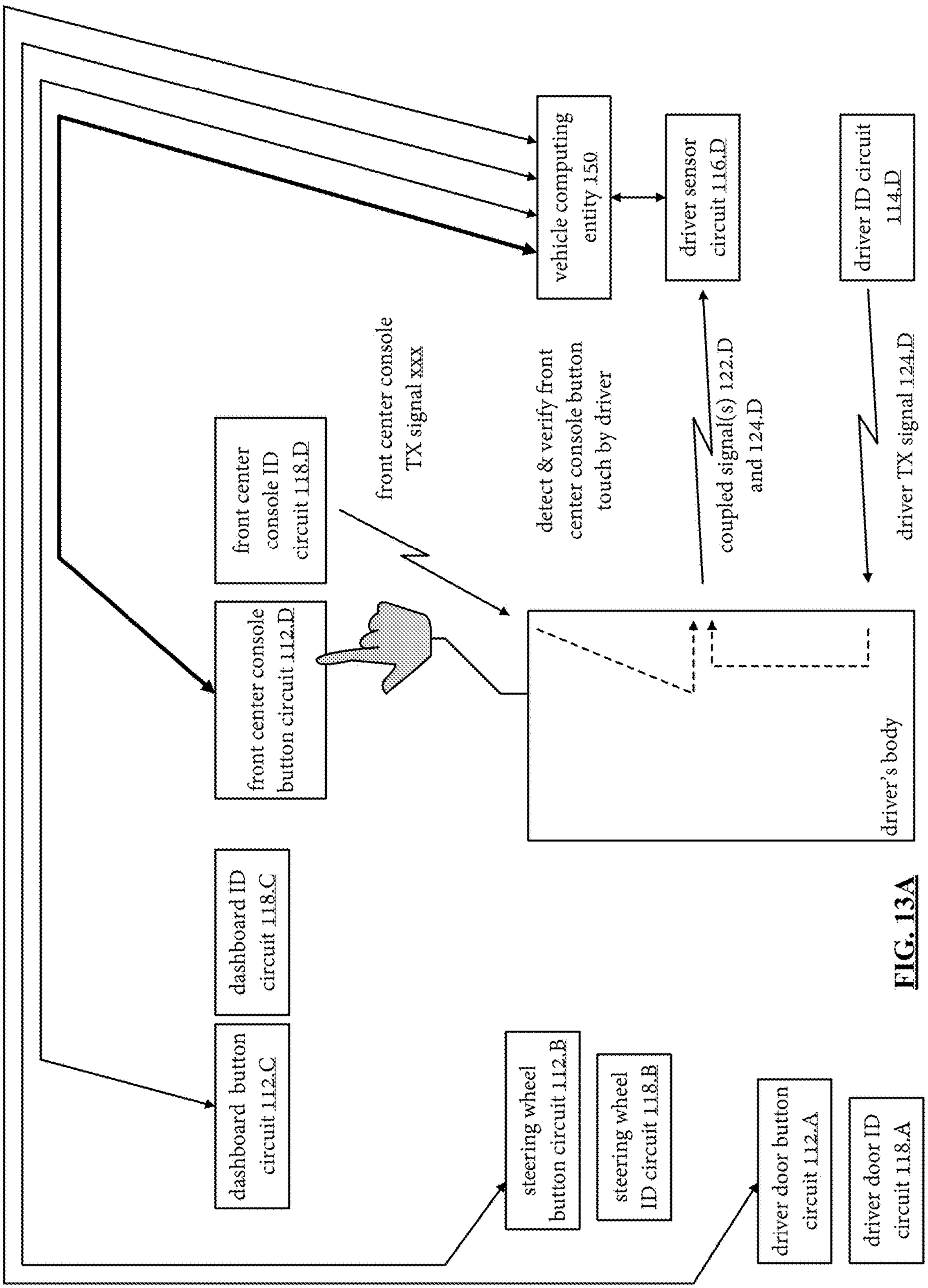
FIG. 13A is a schematic block diagram of an example of sensing a fount center console button touch and confirmation of touch by a driver in accordance with various embodiments.

FIG. 13A is a schematic block diagram of an example of sensing a fount center console button touch and confirmation of touch by a driver. Interaction with a dashboard button can be detected in a same or similar fashion as interaction with steering wheel button discussed in conjunction of FIGS. 9 and 10, based on similar user interaction with a button corresponding to the front center console button circuit 112.D and/or the propagation of TX signal 122.D through the driver's body for detection based on being transmitted by a front center console ID circuit 118.D in proximity to the front center console circuit 112.D.

Figure 13B:
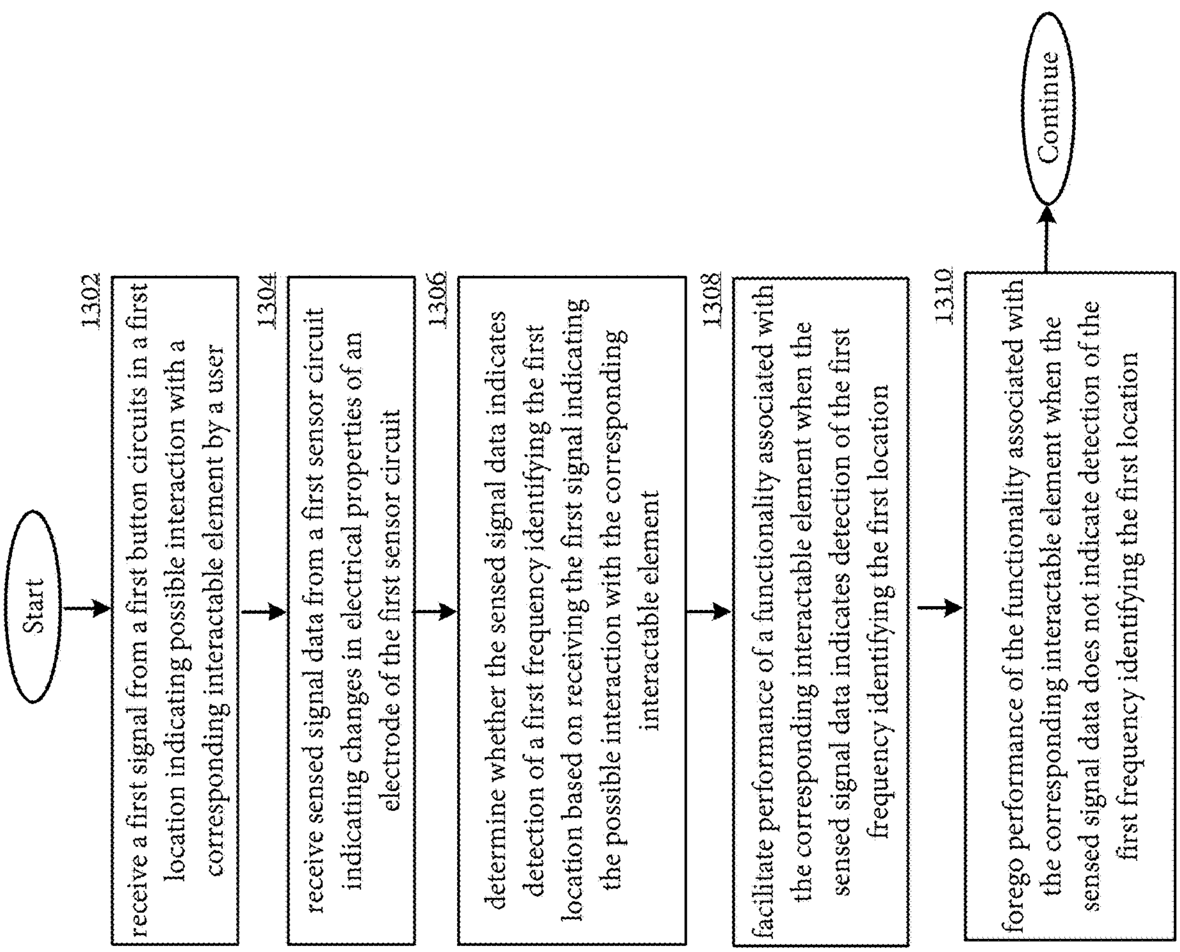
FIG. 13B is a logic diagram of an example method for execution in accordance with various embodiments.

FIG. 13B is a logic diagram illustrating a method of verifying possible button interactions. Some or all of the method of FIG. 13B can be performed via a vehicle computing entity 150, at least one button circuit 112, at least one sensor circuit 116, and/or at least one ID circuit 114 and/or 118, for example, based on some or all functionality discussed in conjunction with one or more of FIGS. 6-13A. Some or all of the method of 13B can be performed via any computing entity of FIGS. 2A-2D and/or any processing module, which can be associated with a corresponding vehicle, or any other system, for example, that includes one or more buttons in one or more different locations having corresponding ID circuits whose interaction is verified via a sensor circuit.

Step 1302 includes receiving a first signal from a first button circuits in a first location indicating possible interaction with a corresponding interactable element (e.g. a corresponding button) by a user. Step 1304 includes receiving sensed signal data from a first sensor circuit indicating changes in electrical properties of an electrode of the first sensor circuit. In various embodiments, the changes in electrical properties of the electrode include changes in impedance of the electrode. Step 1306 includes determining whether the sensed signal data indicates detection of a first frequency identifying the first location based on receiving the first signal indicating the possible interaction with the corresponding interactable element.

Step 1308 includes facilitating performance of a functionality associated with the corresponding interactable element when the sensed signal data indicates detection of the first frequency identifying the first location. For example, in this case, a computing entity identifies the possible interaction as a true interaction by a user with the corresponding interactable element based on the sensed signal data indicating detection of the first frequency identifying the first location, and the computing entity thus performs the corresponding functionality of the corresponding interactable element accordingly.

Step 1310 includes foregoing performance of the functionality associated with the corresponding interactable element when the sensed signal data does not indicate detection of the first frequency identifying the first location. For example, in this case, a computing entity identifies the possible interaction as false interaction with the corresponding interactable element that was not performed by a user based on the sensed signal data not indicating detection of the first frequency identifying the first location, and the computing entity thus does not perform the corresponding functionality of the corresponding interactable element accordingly.

In various embodiments, a first ID circuit transmits an ID signal at the first frequency upon a transmit electrode located in the first location. The sensed signal data can indicate detection of the first frequency identifying the first location based on: a first portion of a human body of the user being in proximity to the transmit electrode of the first ID circuit based on the user interacting with the corresponding interactable element; and/or a second portion of the human body of the user being in proximity to the electrode of the first sensor circuit. For example, the ID signal is propagated through the human body from the first portion of the human body to the second portion of the human body to cause the changes in electrical characteristics of the electrode of the first sensor circuit. When no human body is in proximity to the first ID circuit (e.g. due to the user not interacting with an interactable element in the first location), the ID signal is thus not propagated in this manner for detection by the first sensor circuit, and the sensed signal data thus does not indicate detection of the first frequency due to the ID signal not being propagated.

In various embodiments, the first signal indicating the possible interaction is received in a first temporal period. The performance of the functionality associated with the corresponding interactable element can be facilitated when the sensed signal data indicates detection of the first frequency identifying the first location within the first temporal period. The first temporal period can have a fixed duration, for example, that is less than a millisecond, less than a second, and/or less than 10 seconds. The first temporal period can begin when the first signal is received and/or can elapse after the fixed duration elapses. In such embodiments, when the sensed signal data does not indicate detection of the first frequency within the first temporal period, step 1310 is performed and/or the corresponding functionality is otherwise not performed.

In various embodiments, the first button circuit is one of a plurality of different button circuits in the first location. The method can further include receiving a second signal from a second button circuit in the first location indicating another possible interaction with another corresponding interactable element. The method can further include determining whether the sensed signal data indicates detection of the first frequency identifying the first location based on receiving the second signal indicating the possible interaction with the other corresponding interactable element. When the sensed signal data indicates detection of the first frequency identifying the first location, the method can further include facilitating performance of a second functionality associated with the other corresponding interactable element. When the sensed signal data does not indicate detection of the first frequency identifying the first location, the method can further include foregoing performance of the second functionality associated with the interaction with the other corresponding interactable element.

In various embodiments, the first frequency identifying the first location is one of a set of frequencies each identifying one of a set of different locations including the first location. A second frequency of the set of frequencies can identify a second location that is different from the first location. The method can further include receiving a second signal from a second button circuit in a second location indicating another possible interaction with another corresponding interactable element. The method can further include determine whether the sensed signal data indicates detection of a frequency identifying the second location based on receiving the second signal indicating the possible interaction with the other corresponding interactable element. When the sensed signal data indicates detection of the second frequency identifying the second location, the method can include facilitating performance of a second functionality associated with the other corresponding interactable element when the sensed signal data indicates detection of a second frequency identifying the second location. When the at least one sensed signal data does not indicate detection of the second frequency identifying the second location, the method can further include foregoing performance of the second functionality associated with the interaction with the other corresponding interactable element.

In various embodiments, the set of different locations correspond to a set of different locations within a vehicle including a driver door location; a steering wheel location; a dashboard location; a front center console location; a front passenger door location; a rear center console location; a rear left passenger door location; a rear right passenger door location; and/or any other location within a vehicle and/or including exterior locations of a vehicle.

In various embodiments, the first sensor circuit is one of a set of sensor circuits each corresponding to a set of different occupancy areas. The first sensor circuit can correspond to a first occupancy area of the set of different occupancy areas, for example, based on being located within the first occupancy area. The method can further include determining the user interacting with the corresponding interactable element is located within the first occupancy area when the sensed signal data further indicates detection of a given frequency identifying the first occupancy area.

In various embodiments, a first occupant ID circuit transmits an occupant ID signal at a second frequency upon a transmit electrode located in the first occupancy area. Determining the user interacting with the corresponding interactable element is located within the first occupancy area is based on determining the sensed signal data indicates detection of the second frequency identifying the first occupancy area.

In various embodiments, the set of different occupancy areas correspond to a set of different occupancy areas located within a vehicle including: a driver occupancy area; a front passenger occupancy area; a rear left passenger occupancy area; a rear right passenger occupancy area; and/or any other occupancy area within a vehicle and/or including exterior occupancy locations of a vehicle.

In various embodiments, the corresponding interactable element includes a button, a switch, another electrode, a variable cap, a transducer, a potentiometer, a slider switch a keypad, a touchpad, a touchscreen that displays digital image data, and/or any other interactable element. In various embodiments, the corresponding interactable element includes the other electrode. The first button circuit can transmit a signal upon the other electrode, where the first signal indicates the possible interaction based on including sensed signal data indicating changes in impedance of the other electrode.

In various embodiments, facilitating performance of the corresponding functionality associated with the corresponding interactable element includes generating control data to update a state of at least one corresponding vehicle element. In various embodiments, the at least one corresponding vehicle element includes an air conditioning element; a seat heating element; a seat position control element; a mirror position control element; a radio element; a speaker; an audio control element; a turning signal element; a windshield wiper element; a window element; a sunroof element; a door locking element; and/or any other vehicle element that can configure functionality of and/or state of a vehicle.

In various embodiments, a sensor system includes a first button circuit, such as a button circuit 112 of a corresponding interactable element in a first location. For example, the first location is associated with a location within and/or that includes the exterior of a vehicle. The first location can correspond to any location associated with the system. The sensor system can further include a first sensor circuit, such as a sensor circuit 116.

The sensor system can further include a computing entity, such as a computing entity 16 of FIGS. 2A-2E, a vehicle computing entity 150, a processing module 250, and/or any other computing entity that includes at least one processor operable to perform operations. The computing entity can be operable to perform operations that include: receiving a first signal from the first button circuit indicating possible interaction with the corresponding interactable element by a user; receiving sensed signal data from the first sensor circuit indicating changes in electrical properties of an electrode of the first sensor circuit; determining whether the sensed signal data indicates detection of a frequency identifying the first location based on receiving the first signal indicating the possible interaction with the corresponding interactable element; facilitating performance of a functionality associated with the corresponding interactable element when the sensed signal data indicates detection of the frequency identifying the first location; and/or foregoing performance of the functionality associated with the interaction with the corresponding interactable element when the sensed signal data does not indicate detection of the frequency identifying the first location.

Alternatively or in addition, the computing entity can be operable to perform other operations, for example, such as steps of the method of FIG. 13B and/or of any other method discussed herein. The computing entity can be operable to perform its operations based on the computing entity including a memory that stores operational instructions that, when executed by at least one processor of the computing entity, cause the at least one processor to perform corresponding functionality.

In various embodiments, the sensor system includes a plurality of button circuits, such as a set of one or more button circuits 112, corresponding to a plurality of interactable elements located across a set of different locations. The system can include a set of ID circuits, such as one or more ID circuits 118, where each of the set of ID circuits is operable to transmit an ID signal upon a transmit electrode located in one of the set of different locations. A given ID signal can have a frequency at a corresponding one of a first set of frequencies corresponding to the set of different locations. The system can further include a set of sensor circuits, such as one or more sensor circuits 116. Each sensor circuit can include an electrode and can be operable to generate sensed signal data indicating changes in electrical properties of the electrode. The processing system of the system can be operable to: receive a first signal from a first button circuit of the plurality of button circuits in a first location of the set of different locations indicating possible interaction with a corresponding interactable element by a user; determine whether the sensed signal data of any of the set of sensor circuits indicates detection of a frequency of the first set of frequencies identifying the first location based on receiving the first signal indicating the possible interaction with the corresponding interactable element in the first location; facilitate performance of a functionality associated with the corresponding interactable element when sensed signal data of a first sensor circuit of the set of sensor circuits indicates detection of the frequency identifying the first location; and/or forego performance of the functionality associated with the interaction with the corresponding interactable element when none of the sensed signal data indicates detection of the frequency identifying the first location.

In various embodiments, the sensor system is a vehicle sensor system 100 of a vehicle, wherein the plurality of interactable elements are located across a set of different locations of the vehicle, wherein the set of sensor circuits are located within and/or upon the vehicle, and wherein the functionality associated with the corresponding interactable element is a vehicle-based functionality of an element of the vehicle. The computing entity can be located within and/or upon the vehicle, and/or can communicate with the vehicle via a wired and/or wireless communication connection.

In various embodiments, the sensor system further includes a set of occupant ID circuits, such as one or more ID circuits 114. Each of the set of occupant ID circuits can be operable to transmit a signal upon an electrode located in one of a set of different occupancy areas having a frequency at a corresponding one of a second set of frequencies corresponding to the set of different occupancy areas. The computing entity can be further operable to determine a user in a first occupancy area of the set of different occupancy areas interacted with the corresponding interactable element based on the sensed signal data further indicating a given frequency of the second set of frequencies corresponding to first occupancy area.

In various embodiments, the sensed signal data indicates detection of the frequency identifying the first location and further indicates detection of given frequency identifying the first occupancy area based on: a first portion of a human body of the user being in proximity to the transmit electrode of an ID circuit transmitting its ID signal at the first frequency based on the user interacting with the corresponding interactable element; a second portion of the human body of the user being in proximity to the electrode of the first sensor circuit, where the ID signal is propagated through the human body from the first portion of the human body to the second portion of the human body; and/or a third portion of the human body of the user being in proximity to the electrode of an occupant ID circuit of a first occupancy area transmitting its signal at the given frequency based on the user being within the first occupancy area, where the signal is propagated through the human body from the third portion of the human body to the second portion of the human body. In various embodiments, the sensor system further includes a set of one or more sensor circuits that includes the first sensor circuit, wherein each of the set of sensor circuits has its electrode located in one of the set of different occupancy areas. The second portion of the human body can be in proximity to the electrode of the first sensor circuit based on the user being within the first occupancy area.

Figure 14:
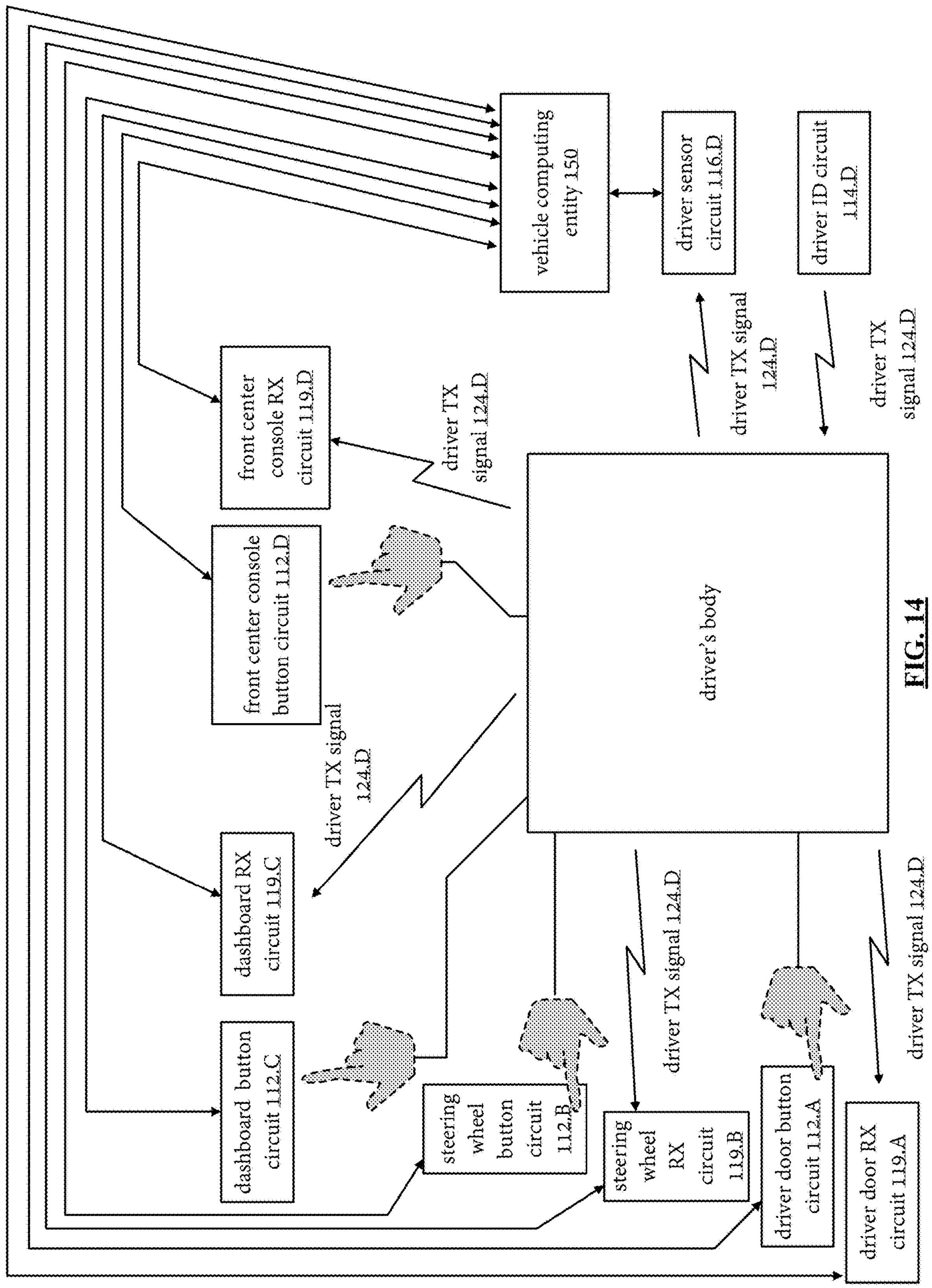
FIG. 14 is a schematic block diagram of another embodiment of a driver area portion of a vehicle sensor system in accordance with various embodiments.

FIG. 14 is a schematic block diagram of another embodiment of a driver area portion of a vehicle sensor system. Dashed indications of user hands indicate different areas where a given user, such as a driver of the vehicle in a corresponding occupancy area 102, can interact with respective buttons, for example, as illustrated in FIG. 6. Other occupancy areas 102 and/or corresponding buttons can be implemented in a same or similar fashion as that of the driver occupancy area 102 of FIG. 14.

The driver area portion of FIG. 14 can be implemented in a similar fashion as that of FIG. 6. However, alternatively or in addition to ID circuits 118 of buttons being operable to transmit signals for propagation through the user's body, one or more receive (RX) circuits 119 can optionally be implemented to detect the driver TX signal 122. Each RX circuit 119 can be implemented as a sensor circuit 116 of FIG. 4, as a button circuit 112 of FIG. 5, and/or as another circuit operable to detect a frequency of a signal propagated through the user's body when the user's body, such as their hand, is touching and/or in proximity to an electrode 405 or other sensor of the RX circuit 119.

When the driver actuates or otherwise interacts with a given button via its respective mechanism, the respective button circuit 112 can send a signal indicating the actuation of the given button to the vehicle computing entity 150 for processing, for example, where the vehicle computing entity 150 enables the corresponding functionality accordingly, as discussed in conjunction with FIG. 6. Rather than simply enabling the corresponding functionality anytime actuation or other interaction with the button is detected, the vehicle computing entity 150 can be operable to only enable the respective functionality when the actuation of the given button is confirmed to have been performed by the driver sitting within the corresponding occupancy area 102, as discussed in conjunction with FIG. 6.

To enable this confirmation, alternatively or in addition to the embodiment of FIG. 6, when the driver touches or is in proximity to an electrode 405 or other sensor of an RX circuit 119, for example, while touching, hovering over, or otherwise interacting with the corresponding button of the corresponding button circuit 112, the corresponding RX circuit 119 can detect the driver TX signal 124.D denoting that the driver is touching, interacting with, or otherwise in proximity to the corresponding button. For example, the sensed signal data 440 or other signaling generated by a given RX circuit 119 indicates the detection of driver TX signal 124.D based on the driver being in proximity to sensor electrode 405 or another sensor of the given RX circuit 119, which can be sent to vehicle computing entity 150.

The vehicle computing entity 150 can receive and process signaling from button circuits 112 as well as sensed signal data 440 from various RX circuits corresponding to the various buttons over time. When the vehicle computing entity 150 receives signaling indicating from a button circuit indicating actuation or other interaction with a given button, and when the sensed signal data 440 received by the vehicle computing entity 150 from the corresponding RX circuit 119 indicates the driver is in proximity to the given button based on detection of the driver TX signal 124, the vehicle computing entity 150 can process the corresponding functionality of the button accordingly. The sensed signal data 440 from the corresponding RX circuit 119 can thus serve as confirmation that the driver indeed intended to interact with corresponding buttons via button circuits when they indicate the driver TX signal 124, for example, as opposed to such button circuits being actuated by accident, by another user, and/or via other objects such as food crumbs or water droplets being inadvertently dropped upon a corresponding sensor, switch, or other mechanism of the button. When a button is actuated but the driver TX signal 124 is not indicated in sensed signal data 440 of a corresponding button circuit, the corresponding functionality is optionally not performed, based on failing to confirm the driver interacted with the corresponding button.

The electrode 405 of a given RX circuit 119 of a given button or part of the vehicle can optionally be the same electrode of a corresponding button circuit 112 of the given button or part of the vehicle. Alternatively, the electrode 405 of a given RX circuit 119 of a given button or part of the vehicle is different from the electrode or other sensor of the corresponding button circuit 112 of the given button or part of the vehicle, for example where both electrode 405 and the other electrode and/or sensor are integrated within the corresponding button, are in close physical proximity to the corresponding button, and/or are in close physical proximity to each other. The electrode 405 of a given RX circuit 119 can otherwise be in close proximity to the physical button that the user touches or otherwise interacts with to actuate corresponding functionality, for example to ensure that the TX signal 124 transmitted by the user's body will be detected by the RX circuit 119 when interacting with the corresponding button.

Figure 15:
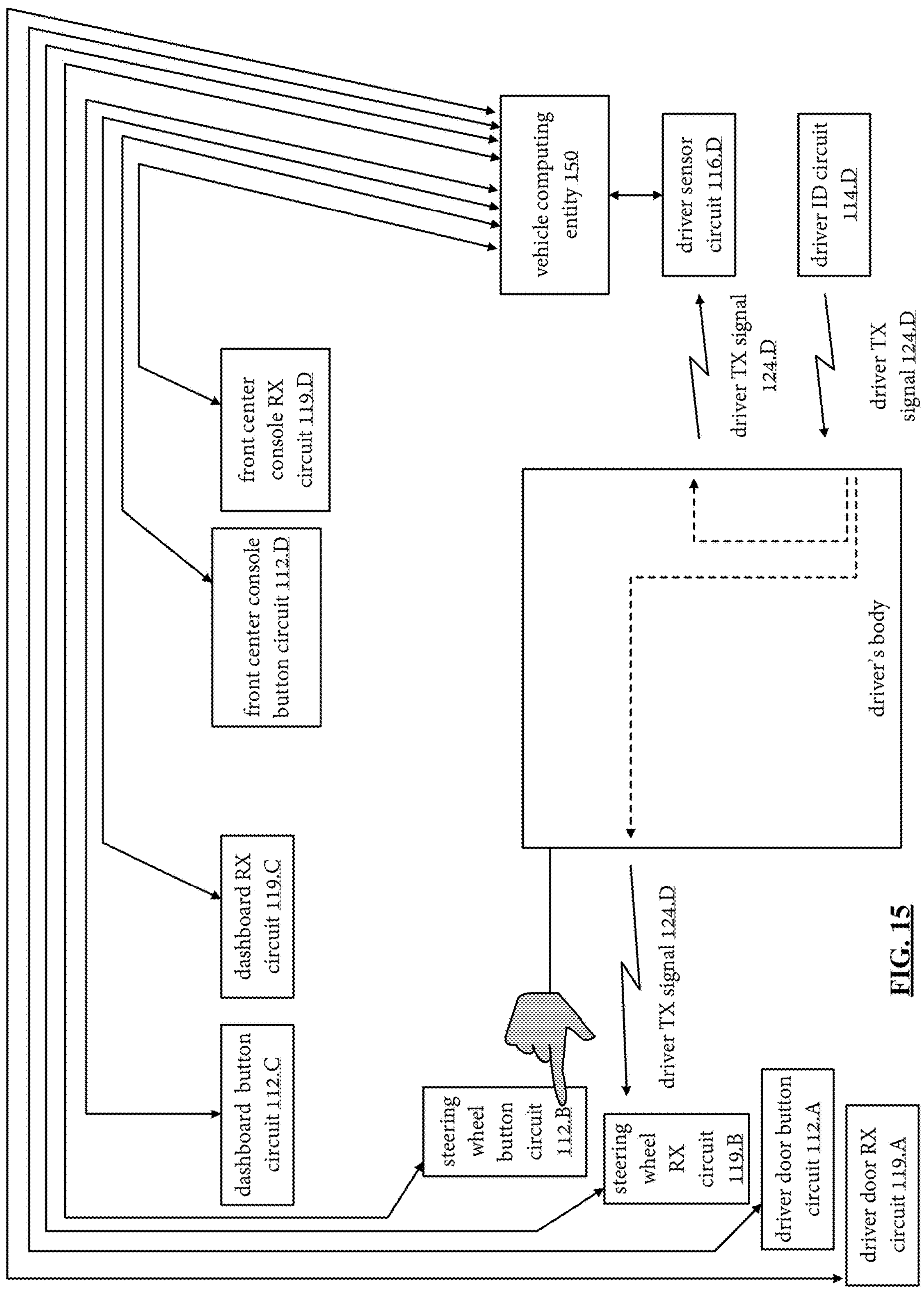
FIG. 15 is a schematic block diagram of another example of sensing a steering wheel button touch and confirmation of touch by a driver in accordance with various embodiments.

FIG. 15 is a schematic block diagram of another example of sensing a steering wheel button touch and confirmation of touch by a driver. When a user interacts with a steering wheel button of steering wheel button circuit 112.B, a corresponding signal is transmitted to vehicle computing entity 150 indicating interaction with the button. The steering wheel RX circuit 119.B detects the driver TX signal 124.D when the user is interacts with steering wheel button 112, for example, based on the user being in proximity to a corresponding electrode.

Figure 16:
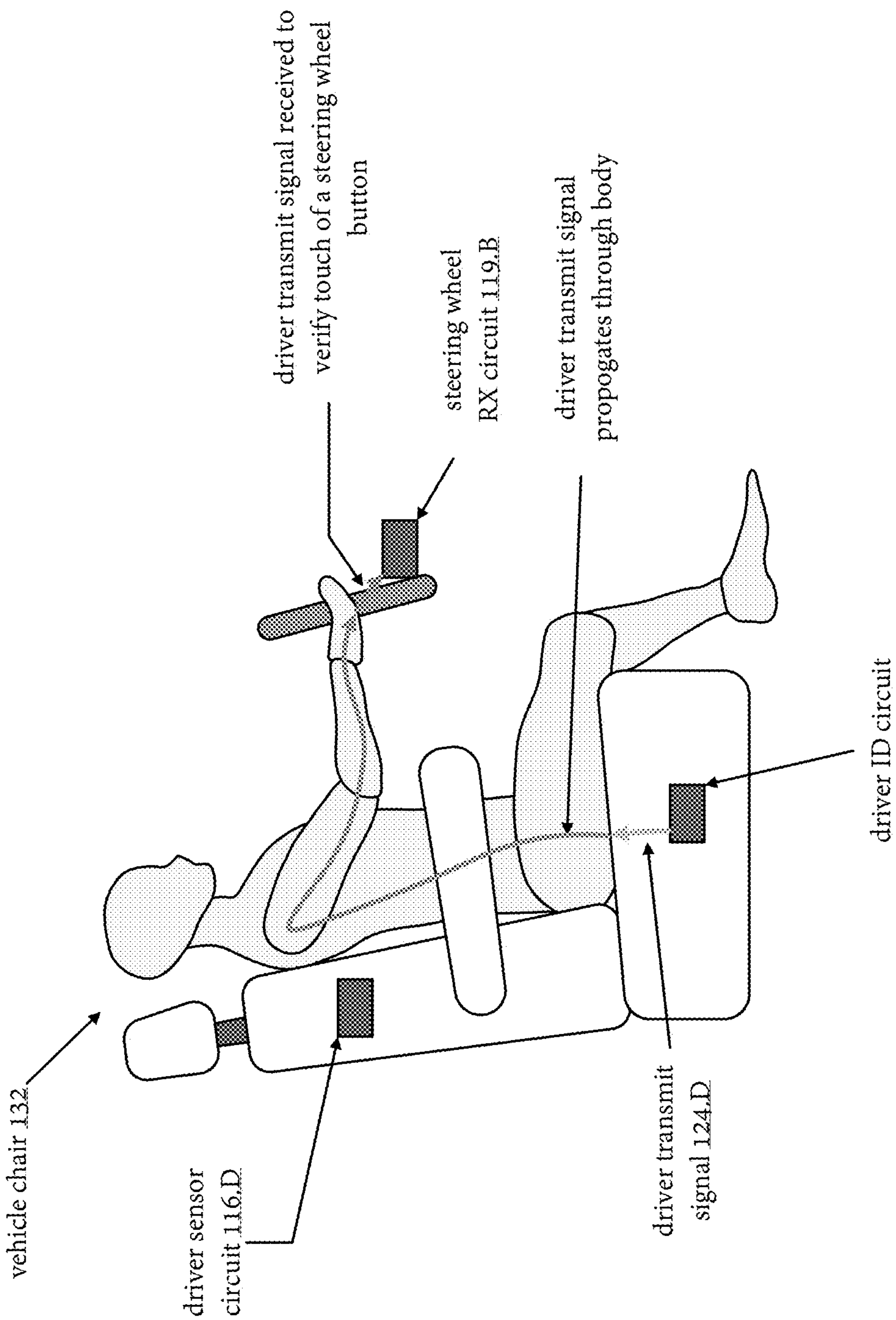
FIG. 16 is a schematic block diagram of another example of sensing a steering wheel button touch and confirmation of touch by a driver in accordance with various embodiments.

FIG. 16 is a schematic block diagram of a particular example of sensing a steering wheel button touch and confirmation of touch by a driver. For example, the vehicle chair of FIG. 8A and/or FIG. 10 is implemented to facilitate transmission and propagation of driver transmit signal 124.D through the driver's body. When the user touches the steering wheel, for example, to interact with a corresponding button, the steering wheel RX circuit 119.B detects the corresponding driver transmit signal 124.D, which can be indicated in sensed signal data 440 sent to the vehicle computing entity 150.

Figure 17:
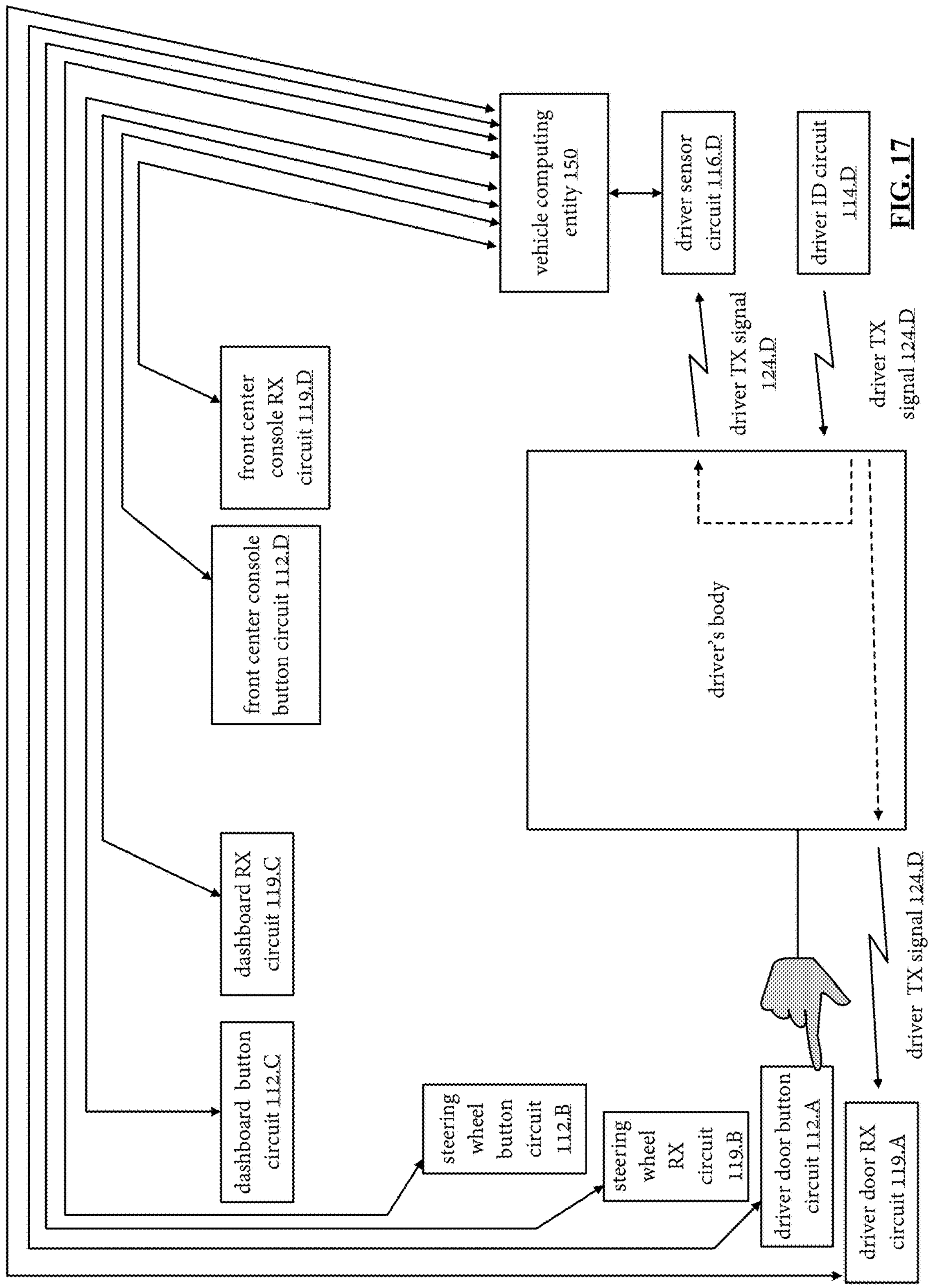
FIG. 17 is a schematic block diagram of another example of sensing a driver door button touch and confirmation of touch by a driver in accordance with various embodiments.

FIG. 17 is a schematic block diagram of another example of sensing a driver door button touch and confirmation of touch by a driver. Interaction with a driver door button can be detected in a same or similar fashion as interaction with steering wheel button discussed in conjunction of FIGS. 15 and 16, based on similar user interaction with a button corresponding to the driver door button circuit 112.A and/or the detection of driver TX signal 124.D through the driver's body via driver door RX circuit 119.A in proximity to the driver door button circuit 112.A.

Figure 18:
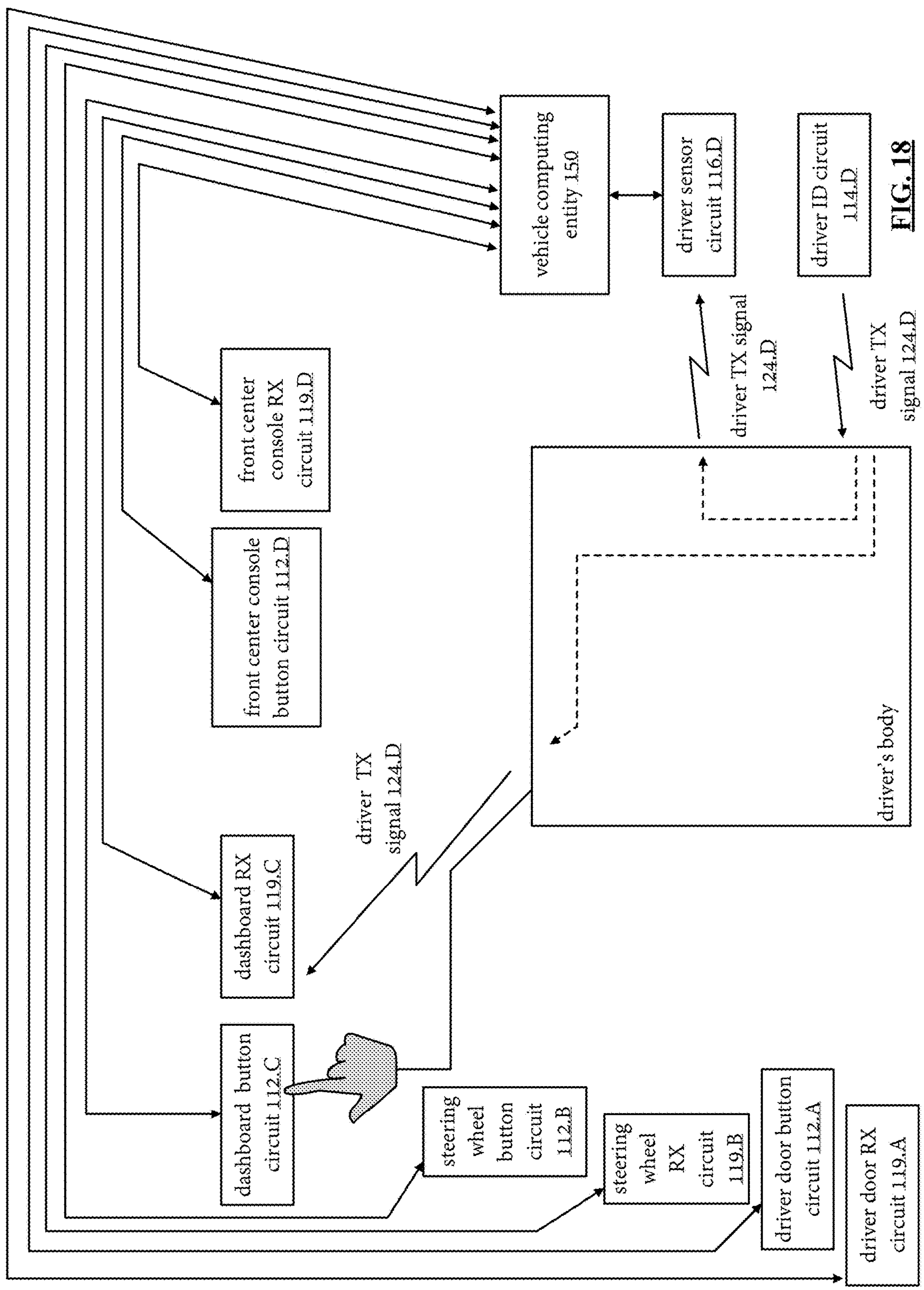
FIG. 18 is a schematic block diagram of another example of sensing a dashboard button touch and confirmation of touch by a driver in accordance with various embodiments.

FIG. 18 is a schematic block diagram of another example of sensing a dashboard button touch and confirmation of touch by a driver. Interaction with a dashboard button can be detected in a same or similar fashion as interaction with steering wheel button discussed in conjunction of FIGS. 15 and 16, based on similar user interaction with a button corresponding to the dashboard button circuit 112.0 and/or the detection of driver TX signal 124.D through the driver's body via dashboard RX circuit 119.0 in proximity to the dashboard button circuit 112.C.

Figure 19A:
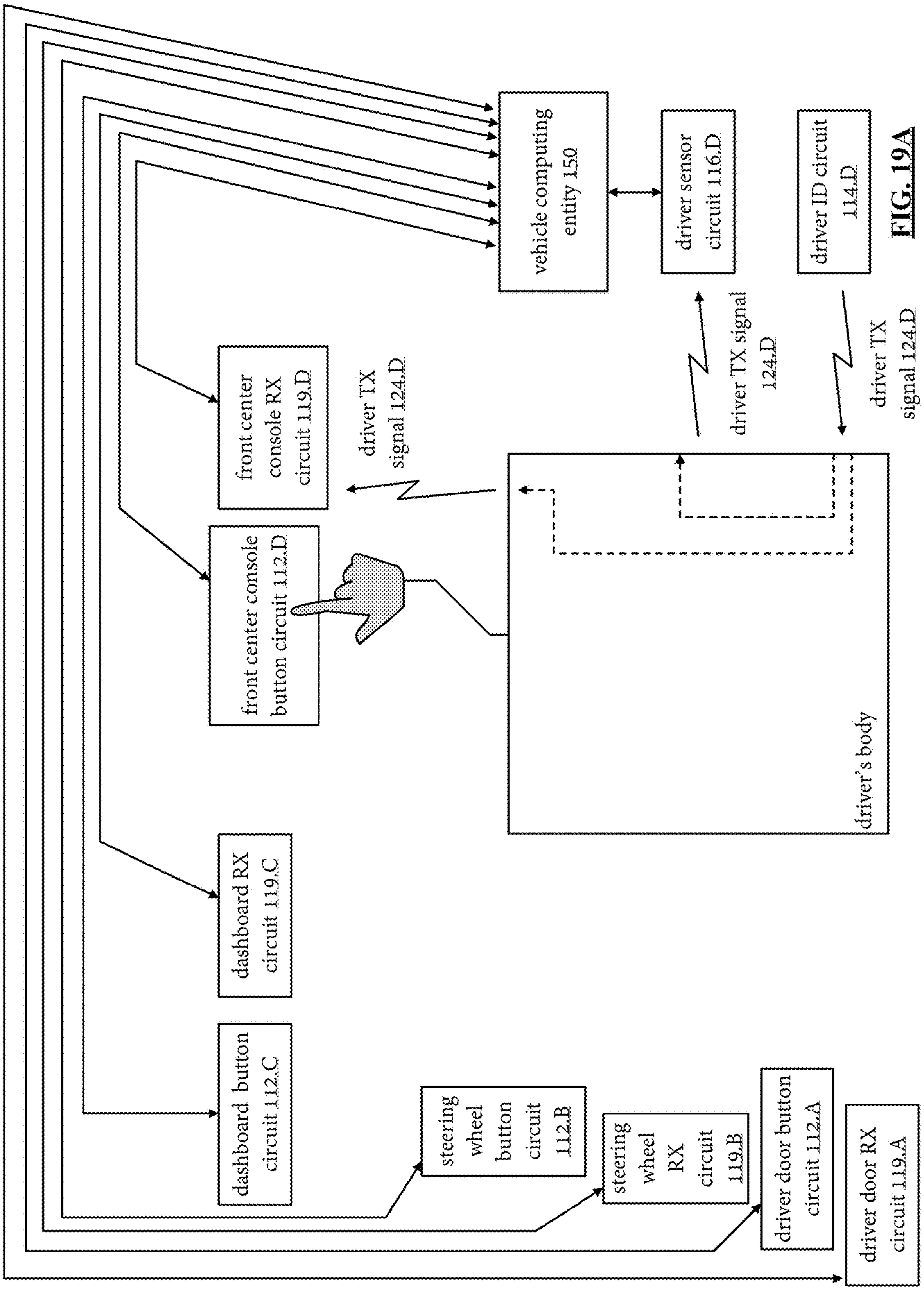
FIG. 19A is a schematic block diagram of another example of sensing a fount center console button touch and confirmation of touch by a driver in accordance with various embodiments.

FIG. 19A is a schematic block diagram of another example of sensing a fount center console button touch and confirmation of touch by a driver. Interaction with a front center console button can be detected in a same or similar fashion as interaction with steering wheel button discussed in conjunction of FIGS. 15 and 16, based on similar user interaction with a button corresponding to the front center console button circuit 112.*d* and/or the detection of driver TX signal 124.D through the driver's body via front center console RX circuit 119.D in proximity to the front center console button circuit 112.D.

Figure 19B:
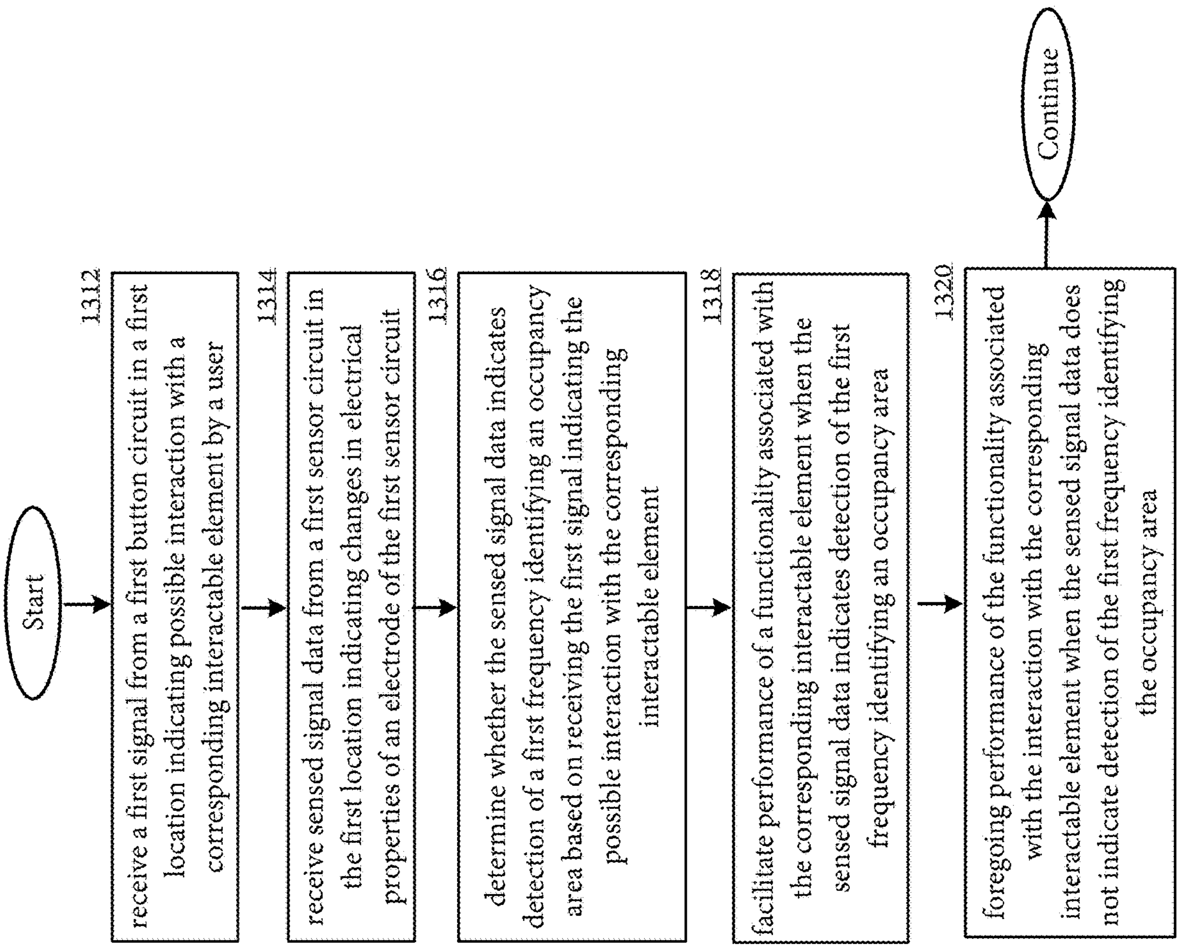
FIG. 19B is a logic diagram of an example method for execution in accordance with various embodiments.

FIG. 19B is a logic diagram illustrating a method of verifying possible button interactions. Some or all of the method of FIG. 19B can be performed via a vehicle computing entity 150, at least one button circuit 112, at least one sensor circuit 116, at least one RX circuit 119, and/or at least one ID circuit 114 and/or 118, for example, based on some or all functionality discussed in conjunction with one or more of FIGS. 14-19A. Some or all of the method of 19B can be performed via any computing entity of FIGS. 2A-2D and/or any processing module, which can be associated with a corresponding vehicle, or any other system, for example, that includes one or more buttons in one or more different locations having corresponding ID circuits whose interaction is verified via a sensor circuit.

Step 1312 includes receiving a first signal from a first button circuit in a first location indicating possible interaction with a corresponding interactable element by a user. Step 1314 includes receiving sensed signal data from a first sensor circuit in the first location indicating changes in electrical properties of an electrode of the first sensor circuit. In various embodiments, the changes in electrical properties of the electrode include changes in impedance of the electrode. Step 1316 includes determining whether the sensed signal data indicating detection of a first frequency identifying an occupancy area based on receiving the first signal indicating the possible interaction with the corresponding interactable element.

Step 1318 includes facilitating performance of a functionality associated with the corresponding interactable element when the sensed signal data indicates detection of the first frequency identifying an occupancy area. For example, in this case, a computing entity identifies the possible interaction as a true interaction by a user with the corresponding interactable element based on the sensed signal data indicating detection of a frequency identifying the an occupancy area, for example, denoting the occupancy area is occupied by a user interacting with the corresponding interactable element location, and the computing entity thus performs the corresponding functionality of the corresponding interactable element accordingly.

Step 1320 includes foregoing performance of the functionality associated with the interaction with the corresponding interactable element when the sensed signal data does not indicate detection of the first frequency identifying the occupancy area. For example, in this case, a computing entity identifies the possible interaction as a false interaction with the corresponding interactable element not performed a user based on the sensed signal data not indicating detection of a frequency identifying an occupancy area, for example, denoting a user occupying an occupancy area did not interacting with the corresponding interactable element location and that the indication was thus false based on not being performed by a person occupying the vehicle or other corresponding area, and the computing entity thus does not perform the corresponding functionality of the corresponding interactable element accordingly.

In various embodiments, a first occupant ID circuit transmits an ID signal at the first frequency upon a transmit electrode located in a corresponding occupancy area. The sensed signal data can indicate detection of the first frequency identifying the occupancy area location based on: a first portion of a human body of the user being in proximity to the transmit electrode of the first ID circuit based on the user occupying of the occupancy area; and/or a second portion of the human body of the user being in proximity to the electrode of the first sensor circuit based on the user interacting with the corresponding interactable element. For example, the ID signal is propagated through the human body from the first portion of the human body to the second portion of the human body to cause the changes in electrical characteristics of the electrode of the first sensor circuit.

In various embodiments, the first signal indicating the possible interaction is received in a first temporal period. Performance of the functionality associated with the corresponding interactable element is facilitated when the sensed signal data indicates detection of the first frequency identifying the occupancy area within the first temporal period. The first temporal period can have a fixed duration, for example, that is less than a millisecond, less than a second, and/or less than 10 seconds. The first temporal period can begin when the first signal is received and/or can elapse after the fixed duration elapses. In such embodiments, when the sensed signal data does not indicate detection of the first frequency within the first temporal period, step 1320 is performed and/or the corresponding functionality is otherwise not performed.

In various embodiments, the first button circuit is one of a plurality of different button circuits in the first location. The method can further include receiving a second signal from a second button circuit in the first location indicating another possible interaction with another corresponding interactable element. The method can further include determining whether the sensed signal data indicates detection of the first frequency identifying the occupancy area based on receiving the second signal indicating the possible interaction with the other corresponding interactable element. When the sensed signal data indicates detection of the first frequency identifying the occupancy area, the method can further include facilitating performance of a second functionality associated with the other corresponding interactable element. When the sensed signal data does not indicate detection of the first frequency identifying the first location, the method can further include foregoing performance of the second functionality associated with the interaction with the other corresponding interactable element.

In various embodiments, the first sensor circuit is one of a set of sensor circuits each corresponding to a set of vehicle locations. The method can further include receiving a second signal from a second button circuit in a second location indicating another possible interaction with another corresponding interactable element. The method can further include determining whether the sensed signal data indicates detection of the first frequency identifying the occupancy area based on receiving the second signal indicating the possible interaction with the other corresponding interactable element. When the sensed signal data indicates detection of the first frequency identifying the occupancy area, the method can further include facilitating performance of a second functionality associated with the other corresponding interactable element. When the sensed signal data does not indicate detection of the first frequency identifying the first location, the method can further include foregoing performance of the second functionality associated with the interaction with the other corresponding interactable element.

In various embodiments, the corresponding interactable element includes a button, a switch, another electrode, a variable cap, a transducer, a potentiometer, a slider switch a keypad, a touchpad, a touchscreen that displays digital image data, and/or other type of interactable element. In various embodiments, the corresponding interactable element includes the other electrode, wherein the first button circuit transmits a signal upon the other electrode, and wherein the first signal indicates the possible interaction based on including sensed signal data indicating changes in impedance of the other electrode.

In various embodiments, facilitating performance of the corresponding functionality associated with the corresponding interactable element includes generating control data to update a state of at least one corresponding vehicle element. In various embodiments, at least one corresponding vehicle element includes an air conditioning element; a seat heating element; a seat position control element; a mirror position control element; a radio element; a speaker; an audio control element; a turning signal element; a windshield wiper element; a window element; a sunroof element; a door locking element; and/or another type of vehicle element.

In various embodiments, a sensor system includes a plurality of button circuits, such as one or more button circuits 112, corresponding to a plurality of interactable elements located across a set of different locations. The sensor system can further include a set of sensor circuits, such as one or more RX circuits 119 and/or sensor circuits 116. Each of the set of sensor circuit can have an electrode located in one of the set of different locations and/or can be operable to generate sensed signal data indicating changes in electrical properties of the electrode. The sensor system can further include a set of occupant ID circuits, such as one or more ID circuits 114, each located in one of a set of occupancy areas. Each of the set of occupant ID circuits can be operable to transmit an ID signal upon a transmit electrode located in one of the set of different locations. The ID signal can have a frequency at a corresponding one of a first set of frequencies corresponding to the set of different locations.

The sensor system can further include a computing entity, such as a computing entity 16 of FIGS. 2A-2E, a vehicle computing entity 150, a processing module 250, and/or any other computing entity that includes at least one processor operable to perform operations. The computing entity can be operable to perform operations that include: receiving a first signal from a first button circuit indicating possible interaction with the corresponding interactable element by a user; receiving sensed signal data from a first sensor circuit indicating changes in electrical properties of the electrode of the first sensor circuit; determining whether the sensed signal data indicates detection of a frequency denoting occupancy area based on receiving the first signal indicating the possible interaction with the corresponding interactable element; facilitating performance of a functionality associated with the corresponding interactable element when the sensed signal data indicates detection of the frequency identifying the occupancy area; and/or foregoing performance of the functionality associated with the interaction with the corresponding interactable element when the sensed signal data does not indicate detection of the frequency identifying the occupancy area:

Alternatively or in addition, the computing entity can be operable to perform other operations, for example, such as steps of the method of FIG. 13B and/or of any other method discussed herein. The computing entity can be operable to perform its operations based on the computing entity including a memory that stores operational instructions that, when executed by at least one processor of the computing entity, cause the at least one processor to perform corresponding functionality.

In various embodiments, the computing entity is operable to receive a first signal from a first button circuit of the plurality of button circuits in a first location of the set of different locations indicating possible interaction with a corresponding interactable element by a user. The computing entity can be further operable to determine whether the sensed signal data of a first sensor circuit of the set of sensor circuits located in the first location in the indicates detection of any frequency of the first set of frequencies identifying any occupancy area of the set of occupancy areas based on receiving the first signal indicating the possible interaction with the corresponding interactable element in the first location. The computing entity can be further operable to facilitate performance of a functionality associated with the corresponding interactable element when the sensed signal data of the first sensor circuit of indicates detection of a given frequency of the first set of frequencies. The computing entity can be further operable to forego performance of the functionality associated with the interaction with the corresponding interactable element when the sensed signal data of the first sensor circuit does not indicate detection of any frequency in the first set of frequencies.

In various embodiments, the set of occupancy areas correspond to a set of different occupancy areas located within a vehicle including a driver occupancy area; a front passenger occupancy area; a rear left passenger occupancy area; and/or a rear right passenger occupancy area.

In various embodiments, the sensor system is a vehicle sensor system of a vehicle. The plurality of interactable elements can be located across a set of different locations of the vehicle, where the set of sensor circuits are located within the vehicle, and wherein the functionality associated with the corresponding interactable element is a vehicle-based functionality of an element of the vehicle.

In various embodiments, the computing entity is further operable to determine a user in a first occupancy area of the set of different occupancy areas interacted with the corresponding interactable element based on the given frequency of the first set of frequencies corresponding to first occupancy area.

In various embodiments, the sensed signal data indicates detection of the given frequency identifying the first occupancy area based on: a first portion of a human body of the user being in proximity to the transmit electrode of an occupant ID circuit transmitting its ID signal at the given frequency based on the user being within the first occupancy area and/or a second portion of the human body of the user being in proximity to the electrode of the first sensor circuit in the first location based on the user interacting with the corresponding interactable element in the first location, wherein the ID signal is propagated through the human body from the first portion of the human body to the second portion of the human body.

In various embodiments, the sensor system further includes a set of occupant sensor circuits, where each of the set of occupant sensor circuit has an electrode located in one of the set of occupancy areas and is operable to generate additional sensed signal data indicating changes in electrical properties of the electrode. The computing entity can be further operable to process the additional sensed signal data. The additional sensed signal data indicates the given frequency based on a third portion of the human body of the user being in proximity to the electrode of an occupant sensor circuit of the first occupancy area based on the user being in the first occupancy area. For example, the ID signal is propagated through the human body from the first portion of the human body to the third portion of the human body.

Figure 20A:
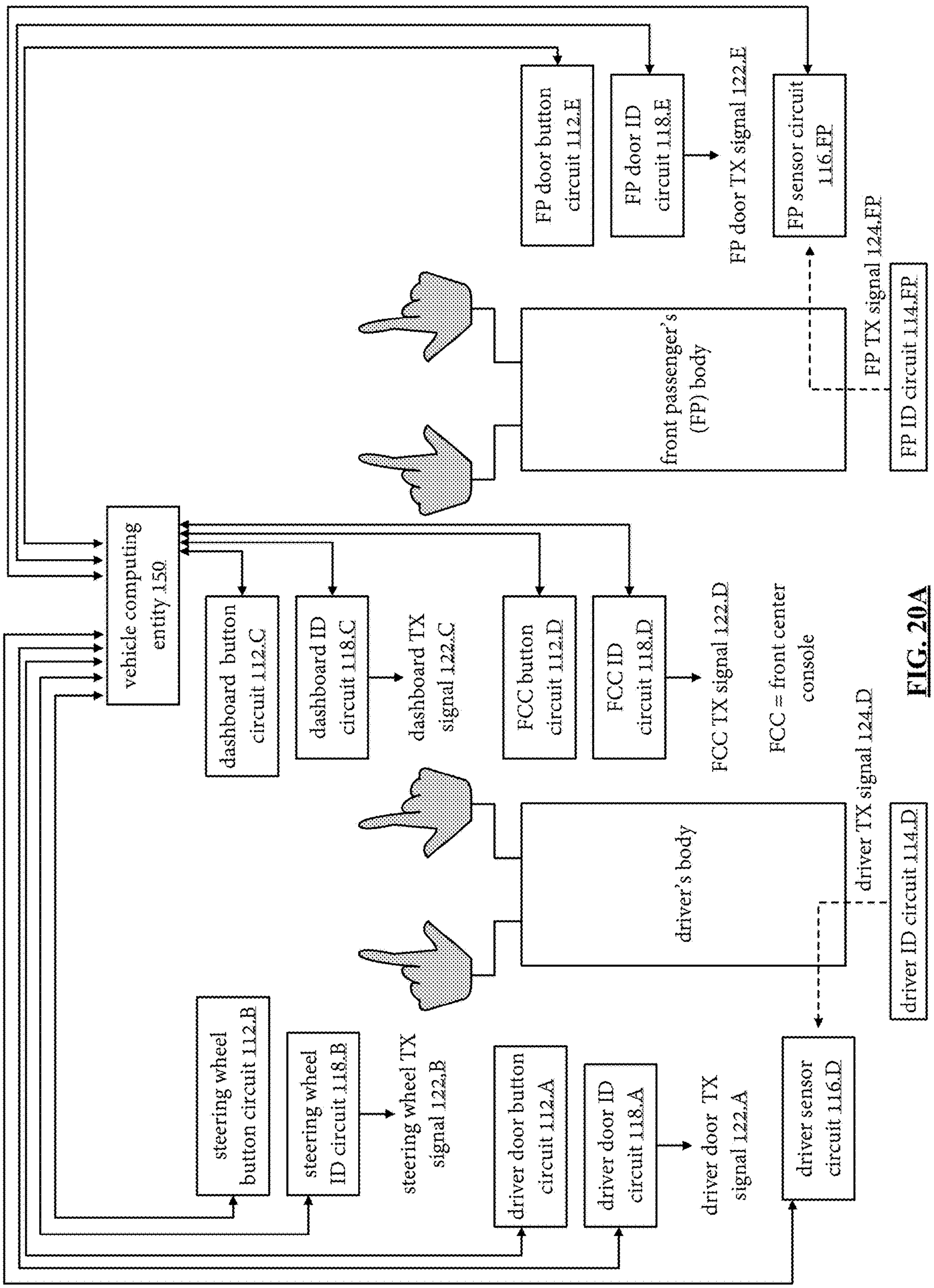
FIG. 20A is a schematic block diagram of an embodiment of a driver area portion and of a front passenger portion of a vehicle sensor system in accordance with various embodiments.

FIG. 20A is a schematic block diagram of an embodiment of a driver area portion and of a front passenger portion of a vehicle sensor system. The various circuits 112, 114, 116, and/or 118 of the front passenger area can be implemented in a same or similar fashion as those of the driver's area, for example, as illustrated and discussed in conjunction with FIGS. 6-13. In particular, as occupants of the driver's and passenger area each interact with various buttons, corresponding TX signals 122 can be propagated through their respective body, which can be detected via the corresponding sensor circuit 116 of the corresponding occupant, for example, integrate within their corresponding vehicle chair 132 in which they are sitting as illustrated in FIGS. 8A and 10. Thus, as sensed signal data 440 is received by the vehicle computing entity 150 based on being generated and transmitted by a given sensor circuit 116, the vehicle computing entity 150 can further determine which user interacted with the corresponding sensor circuit, for example, based on which given sensor circuit 116 from which the sensed signal data 440 was received, and/or based on the ID signal 124 of the driver or front passenger, respectively, being coupled with the corresponding signal in the sensed signal data 440 based on also being propagated through the given user's body for detection.

Figure 20B:
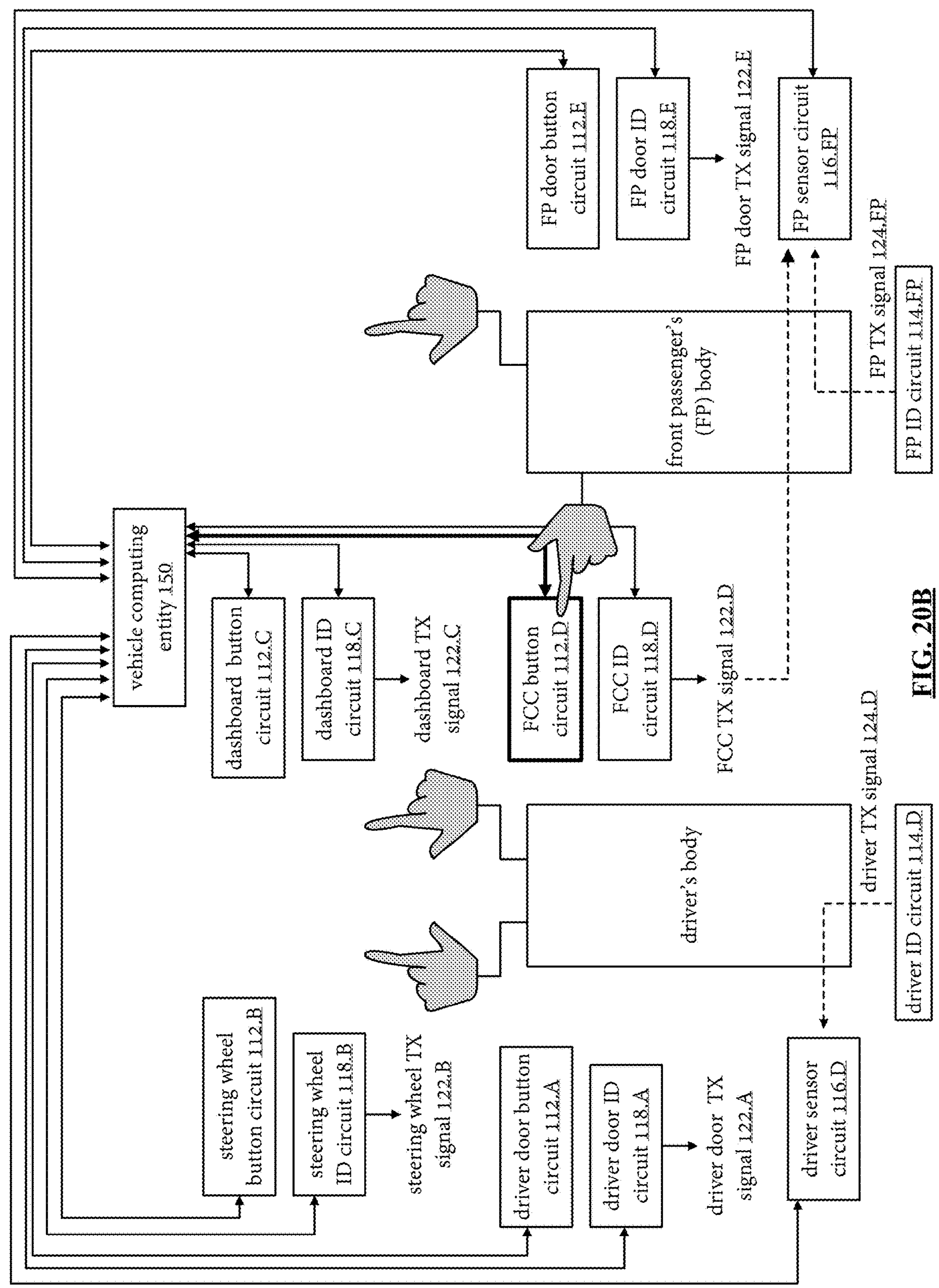
FIG. 20B is a schematic block diagram of another example of sensing a fount center console button touch and confirmation of touch by a front passenger in accordance with various embodiments.

FIG. 20B is a schematic block diagram of a particular example of sensing a front center console button touch and confirmation of touch by a front passenger. While either the driver or front passenger is capable of reaching and interacting with one or more buttons of the front center console at a given time, the vehicle processing system 150 can detect that the front passenger, and not the driver or another user, interacted with a given front center console button of front center console button circuit 112.D based on the FR sensor circuit 116.FP detecting the front center console TX signal 122.D due to being transmitted through the front passengers body based on the front passenger touching and/or interacting with a corresponding front center console button and thus being in proximity to the front center console ID circuit 118.D to enable propagation of the front center console TX signal 122.D through the front passenger's body.

While not illustrated in FIGS. 20A and 20B, detection of other button interaction in one or more rear seats, and determining whether an occupant of the vehicle interacted with the button, and/or further distinguishing which occupant of the vehicle interacted with the button, can be further detected and processed accordingly. While not illustrated in FIGS. 20 and 21A, detection of different users interacting with different buttons can be similarly achieved based on implementing the RX circuits 119 of FIGS. 14-19A to detect the TX signal 124 of the corresponding user that interacted with the given button based on being propagated through that user's body due to transmission by a corresponding ID circuit 114 in proximity to the given user.

This can be useful in determining whether or not to actuate corresponding functionality, for example, based on permissions of the respective detected user. For example, for safety reasons, the front passenger may be allowed to engage with certain buttons while the driver cannot, for example, so that the driver is not distracted while driving. In some embodiments, whether a given user is allowed to interact with a given button is further based on the detected status of the vehicle, such as whether the vehicle is in motion. For example, while either the driver or front passenger can reach and engage with the center console, only the front passenger is allowed to interact with the center console while the vehicle is in motion. In some embodiments, only interactions with the particular buttons that are detected to be performed by the front passenger are processed, for example, while the vehicle is in motion. Subsets of buttons that are allowed to be interacted with can be different for different vehicle conditions. For example, the driver can interact with the navigation data displayed by the center console when in park, but not while the vehicle is in motion, where the front passenger is allowed to update the navigation data at any time. In some embodiments, when a driver is detected to attempt to interact with particular buttons with which they are not allowed to interact with while driving, the vehicle processing system can further facilitate display of and/or playing of a video and/or audio warning notification via a display and/or speakers of the vehicle, for example, to remind the driver to pay attention to driving and not to direct their attention to the front center console while driving.

This can alternatively or additionally be useful in determining how to perform corresponding functionality, for example, based on stored user preferences and/or different corresponding instructions for different users interacting with a given button. For example, when the driver interacts with a button on the center console corresponding to air conditioning and/or heating, only their own air conditioning fans and/or heating element within their driver seat is actuated and/or configured accordingly, based on the driver being detected as the person initiating this functionality. When the front passenger interacts with this same button, their respective air conditioning fans and/or heating element within their own seat is similarly actuated and/or configured based on the front passenger being detected as the person initiating this functionality. Other types of controls can be shared as a same button, where the user that interacted with the button is similarly distinguished and the control is actuated only within their respective area, such as a common button utilized to raise and/or lower windows for different occupancy areas 102; adjust speaker volume for different occupancy areas 102; adjust seat configurations for different occupancy areas 102; and/or other configurable settings for different occupancy areas 102.

Figure 20C:
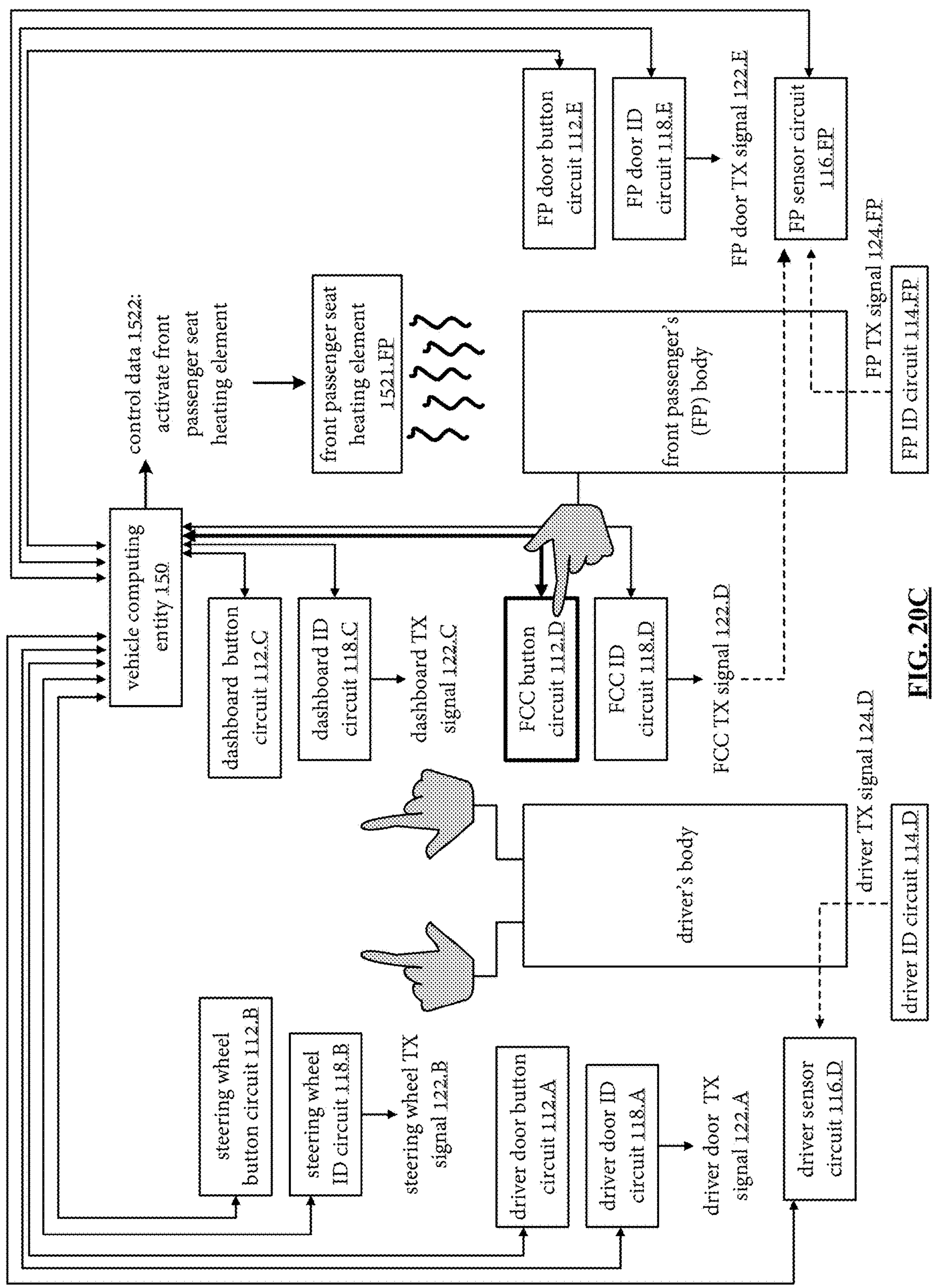
FIG. 20C is a schematic block diagram of another example of sensing a fount center console button touch and confirmation of touch by a front passenger in accordance with various embodiments.
Figure 20D:
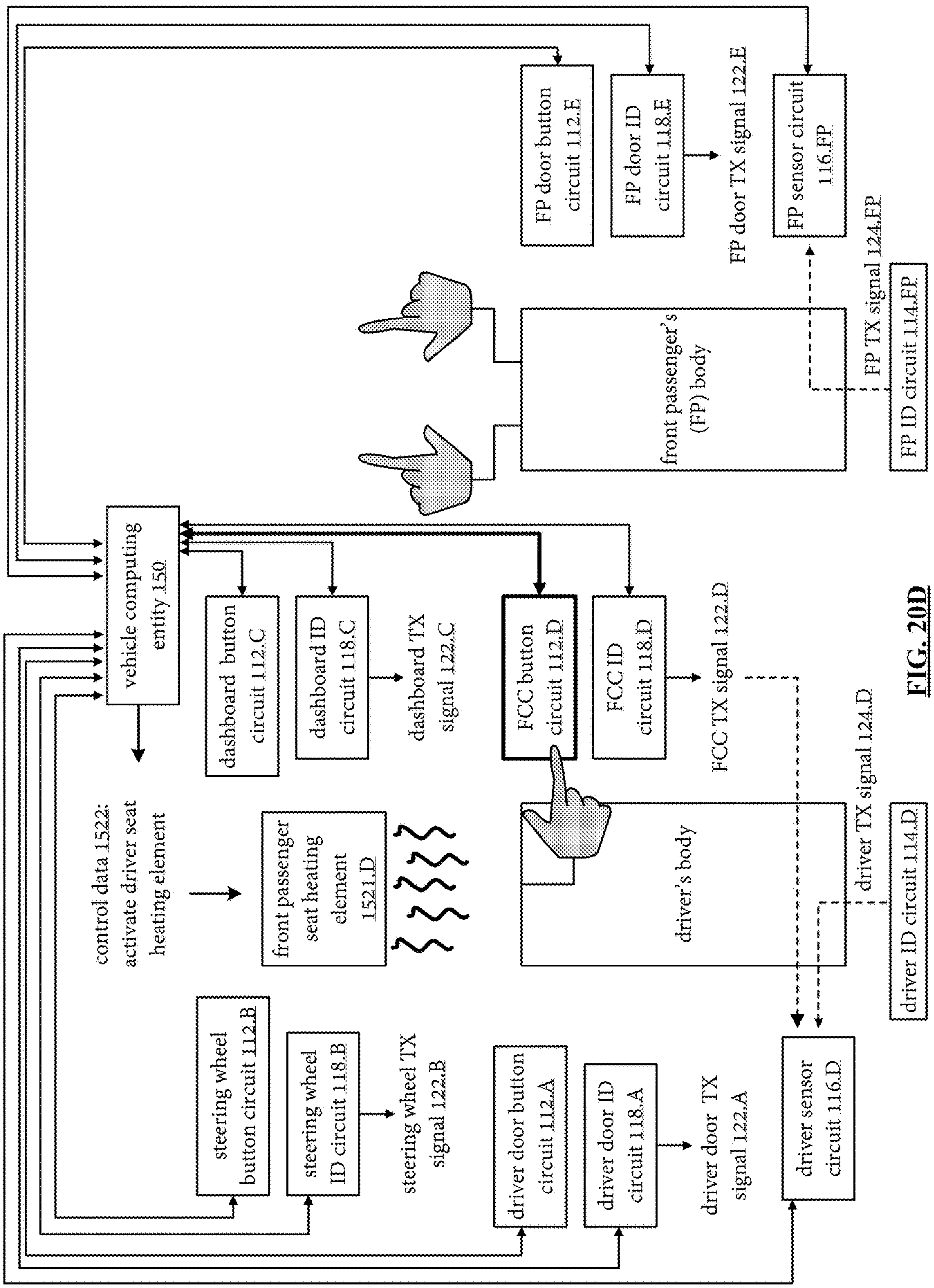
FIG. 20D is a schematic block diagram of another example of sensing a fount center console button touch and confirmation of touch by a driver in accordance with various embodiments.

FIGS. 20C and 20D illustrate embodiments of a vehicle computing entity 150 determining interaction with a same button by different people in a vehicle, and performing different functionality. Similar to as discussed in FIGS. 20A-20B and in FIGS. 6-19B, the occupancy area that includes a user interacting with a given button circuit can be detected via a sensor circuit in their occupancy area detecting the ID frequency for the vehicle location of the button circuit, and/or the occupancy area that includes a user interacting with a given button circuit can be detected via a sensor circuit, such as an RX circuit in proximity to the button circuit detecting the ID frequency for the occupancy location that includes the user.

In this example, an FCC button circuit 112.D given button or other interactable element in the front center console can correspond to activation of a seat heating element 1521. Rather than the vehicle implementing two different buttons to select which seat heating element be activated, such as activation of the driver seat heating element vs. the passenger seat heating element, and/or rather than the vehicle implementing a menu of option requiring further selection of which heating of which seat in the vehicle be activated, a single button and/or single user gesture can correspond to activation of seat heating elements, where the location of the seat heating element to be activated is determined based on detecting which user is interacting with the button as discussed previously.

As illustrated in FIG. 20C, when the front passenger elects to activate their seat heating element, they touch or otherwise interact with the corresponding button. The vehicle computing entity 150 detects the button activation, and further detects the front passenger is the person who interacted with the button. The vehicle computing entity 150 generates and sends control data 1522 to a front passenger seat heating element 1521.FP, and/or corresponding control unit, to cause heating of or otherwise engage and/or configure the front passenger seat heating element 1521.FP accordingly. The vehicle computing entity 150 optionally does not configure the driver's seat heating element, or seat heating elements of other passengers, based on detecting the front passenger as the user who engaged with the corresponding button.

As illustrated in FIG. 20D, when the driver elects to activate their seat heating element, for example, at a different time than that of FIG. 20D, they touch or otherwise interact with the corresponding button. This can be the same button interacted with by the front passenger in FIG. 20C. The vehicle computing entity 150 detects the button activation, and further detects the driver is the person who interacted with the button. The vehicle computing entity 150 generates and sends control data 1522 to a driver seat heating element 1521.D, and/or corresponding control unit, to cause heating of or otherwise engage and/or configure the front passenger seat heating element 1521.D accordingly. The vehicle computing entity 150 optionally does not configure the front passenger's seat heating element, or seat heating elements of other passengers, based on detecting the driver as the user who engaged with the corresponding button.

While FIGS. 20C and 20D illustrate such occupant-based detection and corresponding configuration of different seat heating elements 1521 in different locations, other functionality can similarly be implemented in other locations in this manner. For example, the vehicle computing entity can similarly detect of button activations of button circuits 112 and/or gestures corresponding to other environmental configurations and/or configurable functionality of different respective vehicle areas, such as: seat position configuration, temperature configuration, seat cooling element configuration, volume configuration, air conditioning configuration, fan speed configuration, heating configuration, such as whether heating be applied to the chest area or foot area, a window configuration such as whether windows be raised or lowered, a heads up display configuration, or other functionality. Some or all of these functionalities can be implemented via a same button, for example, in the front center console shared by both the front passenger and driver, or in a rear central area shared by a rear right passenger and rear left passenger. The corresponding functionality can be applied only to the vehicle area of the user detected to have activated the corresponding button, engaged with menu options on a touchscreen, performed a gesture, etc.

In some embodiments, rather than the functionality being directed to environmental controls of distinct occupancy areas and/or seats within the vehicle, the functionality can otherwise be configured differently for different users, based on learned characteristics for users in different occupancy areas, determining which particular person is in the given occupancy area, etc. For example, when the driver select that music be played via interaction with a button, a particular radio station previously configured as a preference for the driver of the vehicle is played based on detecting the driver as being the person engaging with the button. As a further example, when the passenger performs this same interaction, the passenger is identified, and their favorite playlist is played via pairing with the phone identified as the passenger's phone.

In some embodiments, the functionality can be different for different identified users based on detecting known users in various locations within the vehicle, such as which person is driving at a given time, which people are occupying passenger seats, or otherwise identifying people within the vehicle. For example, the passengers are identified based on user ID circuits 114.U or occupant area ID circuits 114 of these users transmitting user signals 126.0 at different, unique frequencies for detection by sensor circuits 116 within the vehicle, such as sensor circuits within corresponding chairs or in corresponding occupancy areas, or RX circuits 119 at different vehicle locations where corresponding buttons are located. The frequency can be transmitted by an ID circuit 114 of an occupancy area based on detecting the presence of the user via detection of a unique user gesture, via a user indication via a button during the trip, via detecting a signal from a portable device of the user at the frequency, or otherwise determining the given user and/or frequency. Alternatively, the frequency can be transmitted by an ID circuit 114.U of a portable device worn or carried the user at their unique frequency as discussed in conjunction with FIGS. 8C 8F, where the portable device corresponds to the user, where different portable devices transmit at different frequencies, and/or where the signal propagates through the user's body.

In such cases, the functionality can be based on the user's preferences for the corresponding functionality. For example, a first user selects a button to set their seat and/or mirrors to stored preferences, where the seat is set accordingly based on accessing their stored preferences in memory accessible by the computing entity. This can further include determining which seat the user is located in, where the corresponding seat is configured accordingly. A second user selecting this same button to set their seat and/or mirrors to stored preferences can similarly have their seat configured accordingly. For example, the second user is in the same seat as the first user at a later time, such as driving the vehicle at a later time. Alternatively, the second user is in a different seat at the same time as the first user being in their seat, where the seat of each user is further detected, for example, based on detection of the user's frequency via a sensor circuit in their chair or otherwise in the corresponding occupancy area.

This can further include determining which seat the user is located in, where the corresponding seat is configured accordingly. A second user selecting this same button to set their seat and/or mirrors to stored preferences can similarly have their seat configured accordingly. For example, the second user is in the same seat as the first user at a later time, such as driving the vehicle at a later time. Alternatively, the second user is in a different seat at the same time as the first user being in their seat, where the seat of each user is further detected, for example, based on detection of the user's frequency via a sensor circuit in their chair or otherwise in the corresponding occupancy area.

Alternatively or in addition, the functionality can be based on the user's preferences for configured commands for different functionalities. For example, a first user performs a first button indication or performs a first gesture detected via one or more button circuits and/or drive sense circuits, and the first functionality is performed based on the first user mapping this gesture and/or a corresponding button to this first functionality. For example, the first user has a first mapping of their steering wheel buttons to functions, where the first user selects a given button which they've configured to be mapped to activating windshield wipers, and the windshield wipers are activated based on detecting the first user is currently driving and/or as the user that interacted with the button.

A second user can perform the same first button indication and a same gesture detected via one or more button circuits and/or drive sense circuits, and the second functionality is performed based on the second user mapping this gesture and/or a corresponding button to this other, second functionality. For example, the second user has a second mapping of their steering wheel buttons to functions, where the second user selects the same given button which they've configured to be mapped to setting cruise control, and cruise control is activated, rather than activation of windshield wipers despite this being the same button, based on detecting the second user is currently driving and/or as the user that interacted with the button. In some cases, different button mappings can be applied to shared buttons, such as buttons in the front center console, where different functionality is performed while both users are in the vehicle based on detecting which user activated the button or performed a corresponding gesture.

As another example, a first user and second user are both detected in the vehicle, and each have stored music configurations, such as preferred radio stations or playlists. When the first user selects an audio button, such as a command to play music, their preferred radio station or playlist is played. When the second user is detected to select this same button, the second user's preferred radio station or playlist is played instead. Alternatively, some controls can be prioritized based on occupancy area, for example, where the driver's audio preferences are automatically applied when the button is selected, regardless of which user selected the button.

As another example, a first user and second user both have cellular phones or other devices that can pair to the vehicle, for example, via Bluetooth. When a first user selects a button to perform a function that involves accessing their cellular phone or device, such as playing music stored on their phone, engaging with an application on their phone, placing a handsfree call, etc., the computing entity automatically facilitates performance of the action based on communicating with the first user's phone and not the second user's phone, and/or based on pairing with the first user's phone and not the second user's phone. When the second user selects the same or different button to perform such as a function, the computing entity automatically facilitates performance of the action based on communicating with the first user's phone and not the second user's phone, and/or based on pairing with the first user's phone and not the second user's phone. This functionality can be based on detection of the user ID frequencies, or based on occupancy area frequencies alone, where the phone detected to be in the same occupancy area is utilized instead of other phones or devices.

Button interactions, driving behavior, etc. by different users can be tracked and stored over time, and/or can optionally be transmitted to another system via a network for storage. This historical data can be utilized to learn user preferences, determine different drivers of the vehicle have different driving habits, such as learned routes, safe or unsafe behavior, etc. Such learned behavior can be accessed and applied when these users are detected to be in the car, for example, where a user's most frequent seating configuration is set as the default seating configuration; where a user detected to run red lights, to stop abruptly, or to misinterpret navigation instructions is given additional prompts to help correct this behavior via a heads up display or center console display when this user is detected to be driving, or when other functionality is based on learned behavior for particular people that use the vehicle over time.

Figure 21A:
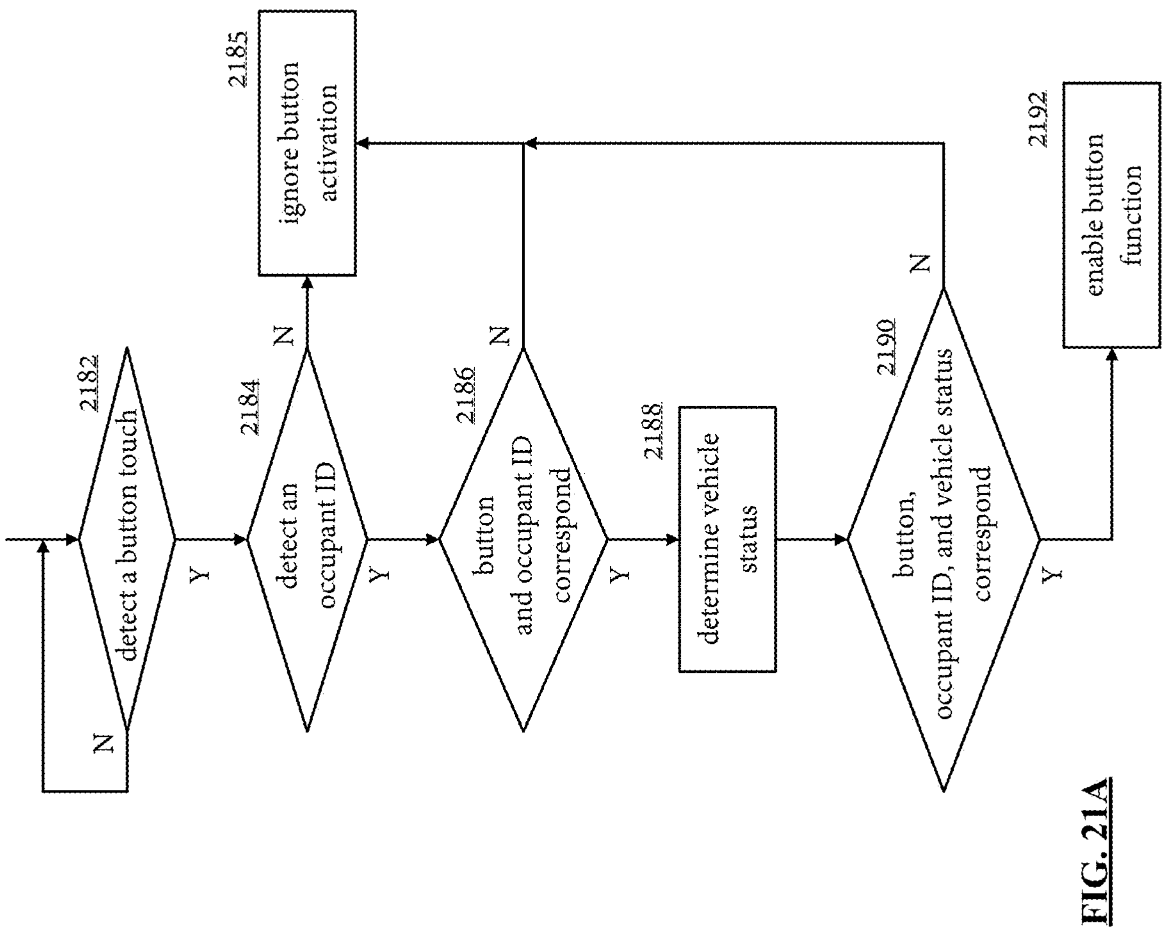
FIG. 21A is a logic diagram of another example of verifying and authorizing a button touch based on occupant location and vehicle status in accordance with various embodiments.

FIG. 21A is a logic diagram of another example of verifying and authorizing a button touch based on occupant location and vehicle status. For example, some or all of the method of FIG. 21A is performed via a vehicle computing entity 150, at least one button circuit 112, at least one sensor circuit 116, at least one ID circuit 114 and/or 118, and/or at least one processing module, for example, based on some or all functionality discussed in conjunction with one or more of FIGS. 1-20A.

Step 2182 includes detecting a button touch or other button interaction. For example, the vehicle computing entity 150 detects a button touch based on receiving a corresponding signal from a corresponding button circuit 112.

Step 2184 includes detecting an occupant ID. Step 2186 includes determining whether the occupant ID and the button of the button touch correspond. When an occupant ID is detected corresponding to the button interaction, the method proceeds to step 2188. When an occupant ID corresponding to the button interaction is not detected, the method proceeds to step 2185.

In some embodiments, the vehicle computing entity 150 detects an occupant ID based on receiving a signal indicating detection of a TX signal 122 of the corresponding button from a sensor circuit 116 corresponding to the occupant ID, for example, based on being in a particular occupancy area 102 of the vehicle such as in and/or near the driver's seat, the front passenger seat, the rear left passenger seat, the rear right passenger seat, and/or another seat of the vehicle, and thus indicating the occupant ID as the driver, front passenger, rear left passenger rear right passenger, or other passenger, respectively. For example, the sensor circuit 116 detected the TX signal 122 of the given button corresponding to the detected button touch based on the respective occupant being in proximity to an electrode 305 of a corresponding ID circuit 118 in proximity to the given button, where the TX signal 122 is propagated through the user's body for detection by the sensor circuit 116 based on the signal being transmitted on the electrode 305 or otherwise by the circuit 118, and based on the user further being in proximity to an electrode 405 of the sensor circuit 116. The TX signal can have a unique frequency identifying the given button from some or all other buttons in the vehicle, where the detection of the signal denotes user interaction with the given button, rather that other buttons of the vehicle. In such embodiments, if a TX signal 122 indicating the given button is detected via sensor circuit 116 corresponding to an occupant, the method proceeds to step 2188. If a TX signal 122 indicating the given button is not detected, the method proceeds to step 2185.

In some embodiments, the vehicle computing entity 150 detects an occupant ID based on receiving a signal indicating detection of a TX signal 124 of the corresponding occupant from an RX circuit 119 corresponding to the given button whose touch was detected. The TX signal 124 can be transmitted by a ID circuit 114, for example, for propagation through a corresponding occupant's body, for example, based on being in a particular occupancy area 102 of the vehicle such as in and/or near the driver's seat, the front passenger seat, the rear left passenger seat, the rear right passenger seat, and/or another seat of the vehicle, and the signal thus indicating the occupant ID as the driver, front passenger, rear left passenger rear right passenger, or other passenger, respectively, for example, via a corresponding frequency uniquely identifying the occupant from other occupants of the vehicle. For example, the RX circuit 119 corresponding to the given button detected the TX signal 124 of the given occupant based on the respective occupant being in proximity to an electrode 405 of the RX circuit 119 in proximity to the given button, where the TX signal 124 is propagated through the user's body for detection by the RX circuit 119 due to the occupant also being in proximity to an electrode 305 of an ID circuit 114 of the respective occupant area. In such embodiments, if a TX signal 124 indicating an occupant is not detected via an RX circuit 119 corresponding to the given button, the method proceeds to step 2185. If a TX signal 124 indicating an occupant is detected via an RX circuit 119 corresponding to the given button, the method proceeds to step 2188.

Step 2185 includes ignoring the button activation based on the occupant ID not being detected in conjunction with the detected button touch in step 2184. In some embodiments, the method further includes send message indicating an invalid touch or indicating a prompt for selection by the user to indicate whether they meant to touch the button. The message can be displayed via a display device of the vehicle, such as an interactive user interface of the front center console or another display, where the user can indicate their selection based on a corresponding touch-based and/or touchless interaction with a corresponding touch screen and/or a corresponding button. The message can be emitted audibly via speakers of vehicle, for example, where the user can vocally confirm their intention for collection via at least one microphone of the vehicle.

Step 2188 includes determining a vehicle status. For example, the vehicle status corresponds to the vehicle: being off; being in motion going slow, being in motion going fast, otherwise being in motion at a particular speed; the vehicle being stopped; the vehicle being in park, drive, neutral, or reverse; the vehicle being in a particular gear; or another vehicle status.

As used herein, one or more types of vehicle status that can be detected can include: whether there is a driver in the driver seat; whether each passenger seat is occupied by a person; whether the vehicle is locked or unlocked, whether the ignition is on or off; whether the engine is running or not; whether the vehicle is moving or not; the speed of the vehicle being within a particular range, being less than a threshold, or being greater than a threshold; the vehicle being in drive, park, or reverse; the vehicle being in a particular gear; the exterior of the vehicle having environmental conditions such as whether it is day or night, rain, snow, various road conditions, temperatures within temperature ranges and/or being higher than or lower than temperature thresholds; location of the vehicle, for example, based on known map data stored in memory, such as whether the vehicle is at and/or near a school, at and/or near a prison, in an intersection vs. a parking lot; in a school zone; on a highway vs. a neighborhood road; at and/or near a configured home and/or work location; and/or other detectable vehicle status.

Step 2190 includes determining whether the vehicle status, occupant ID, and button correspond. When the vehicle status, occupant ID, and button correspond, the method proceeds to step 2192, where the button function of the detected button touch or other indication is enabled. When the vehicle status, occupant ID, and button correspond, the method proceeds to step 2185, where the button function is not enabled and/or where a warning message is optionally conveyed visibly and/or audibly.

For example, if the front passenger attempts to engage with a navigation system displayed via a front center console while vehicle is in motion via a corresponding button, step 2190 can be determined to indicate the vehicle status indicating the vehicle in motion, occupant ID indicating the front passenger, and button indicating the navigation system are determined to correspond, for example, due to passengers being allowed to engage with the navigation system when the vehicle is in motion. As another example, if the driver attempts to engage with a navigation system displayed via a front center console while vehicle is in motion via a corresponding button, step 2190 can be determined to indicate the vehicle status indicating the vehicle in motion, occupant ID indicating the driver, and button indicating the navigation system are determined to not correspond, for example, due to drivers not being allowed to engage with the navigation system when the vehicle is in motion.

Figure 21B:
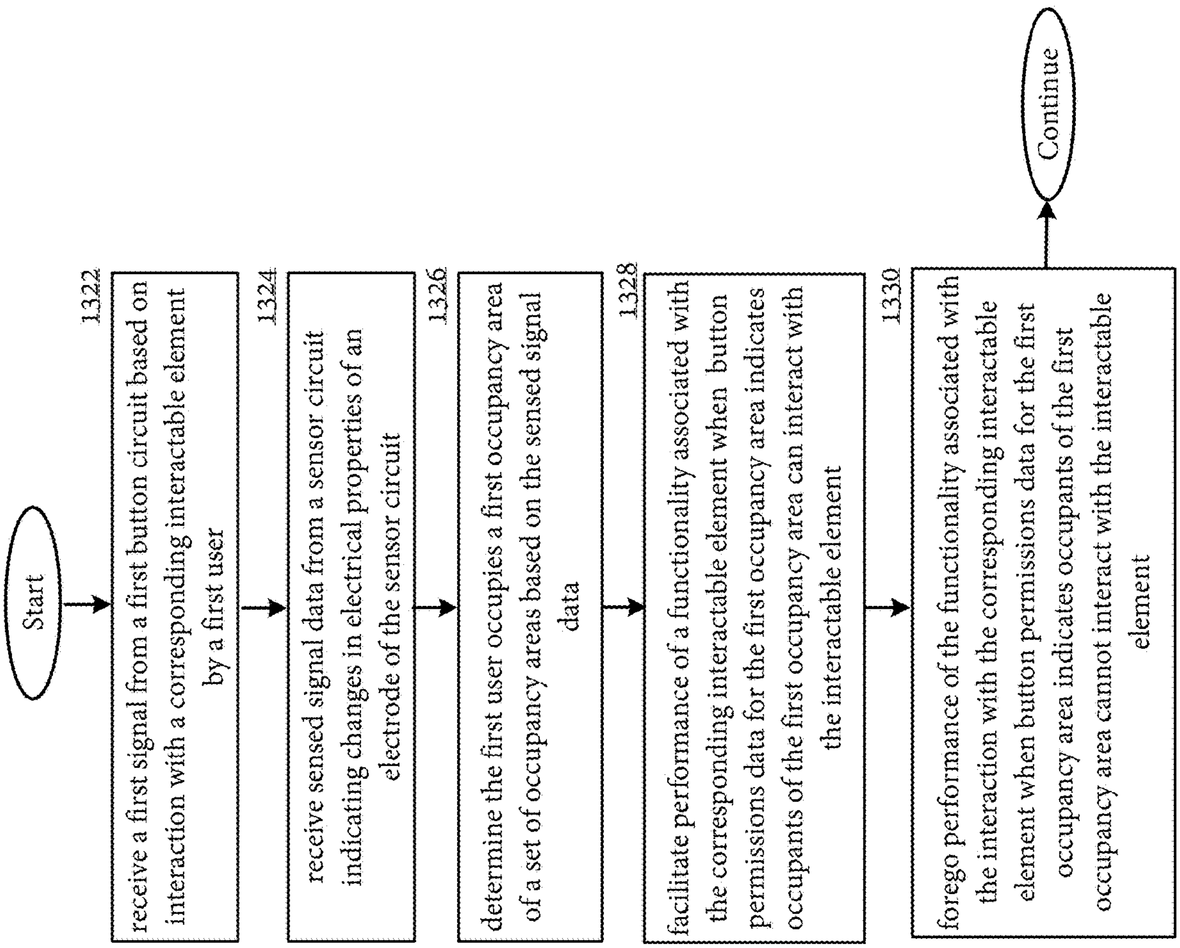
FIG. 21B is a logic diagram illustrating an example method for execution in accordance with various embodiments.

FIG. 21B is a logic diagram illustrating a method of performing functionality of button interactions based on detecting the user that performed the button interaction. Some or all of the method of FIG. 21B can be performed via a vehicle sensor system or other sensor system, a vehicle computing entity 150, at least one button circuit 112, at least one sensor circuit 116, at least one RX circuit 119, and/or at least one ID circuit 114 and/or 118, for example, based on some or all functionality discussed in conjunction with one or more of FIGS. 6-20D. Some or all of the method of 21B can be performed via any computing entity of FIGS. 2A-2D and/or any processing module, which can be associated with a corresponding vehicle, or any other system, for example, that includes one or more buttons in one or more different locations having corresponding ID circuits whose interaction is verified via a sensor circuit. Performing the method of FIG. 21B can be based on performing some or all steps of the method of FIG. 21A, of FIG. 13B, and/or of FIG. 19B.

Step 1322 includes receiving a first signal from a first button circuit, such as a button circuit 112, based on interaction with a corresponding interactable element (e.g. a button) by a first user. Step 1324 includes receiving sensed signal data from a sensor circuit, such as a sensor circuit 116 and/or an RX circuit 119, where the sensed signal data indicates changes in electrical properties of an electrode of the first sensor circuit. Step 1326 includes determining the first user occupies a first occupancy area of a set of occupancy areas based on the sensed signal data. Step 1328 includes facilitating performance of a functionality associated with the corresponding interactable element when button permissions data for the first occupancy area indicates occupants of the first occupancy area can interact with the interactable element. Step 1330 includes foregoing performance of the functionality associated with the interaction with the corresponding interactable element when button permissions data for the first occupancy area indicates occupants of the first occupancy area cannot interact with the interactable element.

In various embodiments, the button permissions data for the first occupancy area indicates a first subset of a plurality of interactable elements with which occupants of the first occupancy area has permission to engage with, and indicates a second subset of the plurality of interactable elements with which occupants of the first occupancy area does not have permission to engage with. The first subset and second subset can be mutually exclusive and collectively exhaustive. In some cases, both the first subset and second subset are non-null. Alternatively, the first subset or second subset can be null. Step 1328 can be performed based on the interactable element being included in the first subset. Step 1330 can be performed based on the interactable element being included in the second subset.

In various embodiments, button permissions data across each of a set of different occupancy areas indicates a first subset of the set of different occupancy areas whose occupants have permission to engage with the given interactable element, and a second subset of the set of different occupancy areas whose occupants do not permission to engage with the given interactable element. The first subset and second subset can be mutually exclusive and collectively exhaustive. In some cases, both the first subset and second subset are non-null. Alternatively, the first subset or second subset can be null. Step 1328 can be performed based on the first occupancy area being included in the first subset for the given interactable element. Step 1330 can be performed based on the interactable element being included in the second subset for the given interactable element.

In various embodiments, the button permissions data is further based on vehicle condition data, where determining whether to perform step 1328 or step 1330 based on determining whether occupants of the first occupancy area can or cannot interact with the given interactable element is further based on at least one current condition associated with a corresponding vehicle. Different occupancy areas can have the same or different permissions imposed for different buttons based on the same or different vehicle conditions. The vehicle condition data can include any of the various vehicle status and/or various vehicle states discussed herein.

In various embodiments, the first occupancy area is identified as a driver occupancy area, and the interactable element is a steering wheel button. The method can include facilitating performance of a functionality associated with the corresponding interactable element based on the button permissions data for the driver occupancy area indicates occupants of the driver occupancy area can interact with steering wheel buttons.

In various embodiments, the first occupancy area is identified as a driver occupancy area, and the interactable element is integrated within a front center console of a corresponding vehicle. The method can include facilitating performance of a functionality associated with the corresponding interactable element based on the button permissions data for the driver occupancy area indicates occupants of the driver occupancy area cannot interact with the front center console.

In various embodiments, the button permissions data for the driver occupancy area indicates occupants of the driver occupancy area cannot interact with the front center console when the vehicle is in motion and/or in drive, and can interact with the front center console when the vehicle is in park. As one example, the method can include facilitating performance of a functionality associated with the corresponding interactable element based on the vehicle determined to be not in motion and/or in park, and based on the occupancy area being identified as the driver occupancy area. As a second example, the method can include facilitating performance of a functionality associated with the corresponding interactable element based on the occupancy area being identified as a passenger occupancy area, even when the vehicle is determined to be in drive and/or in motion. As a third example, the method can include foregoing performance of a functionality associated with the corresponding interactable element based on the occupancy area being identified as a driver occupancy area, and based on the vehicle being determined to be in drive and/or in motion.

Figure 21C:
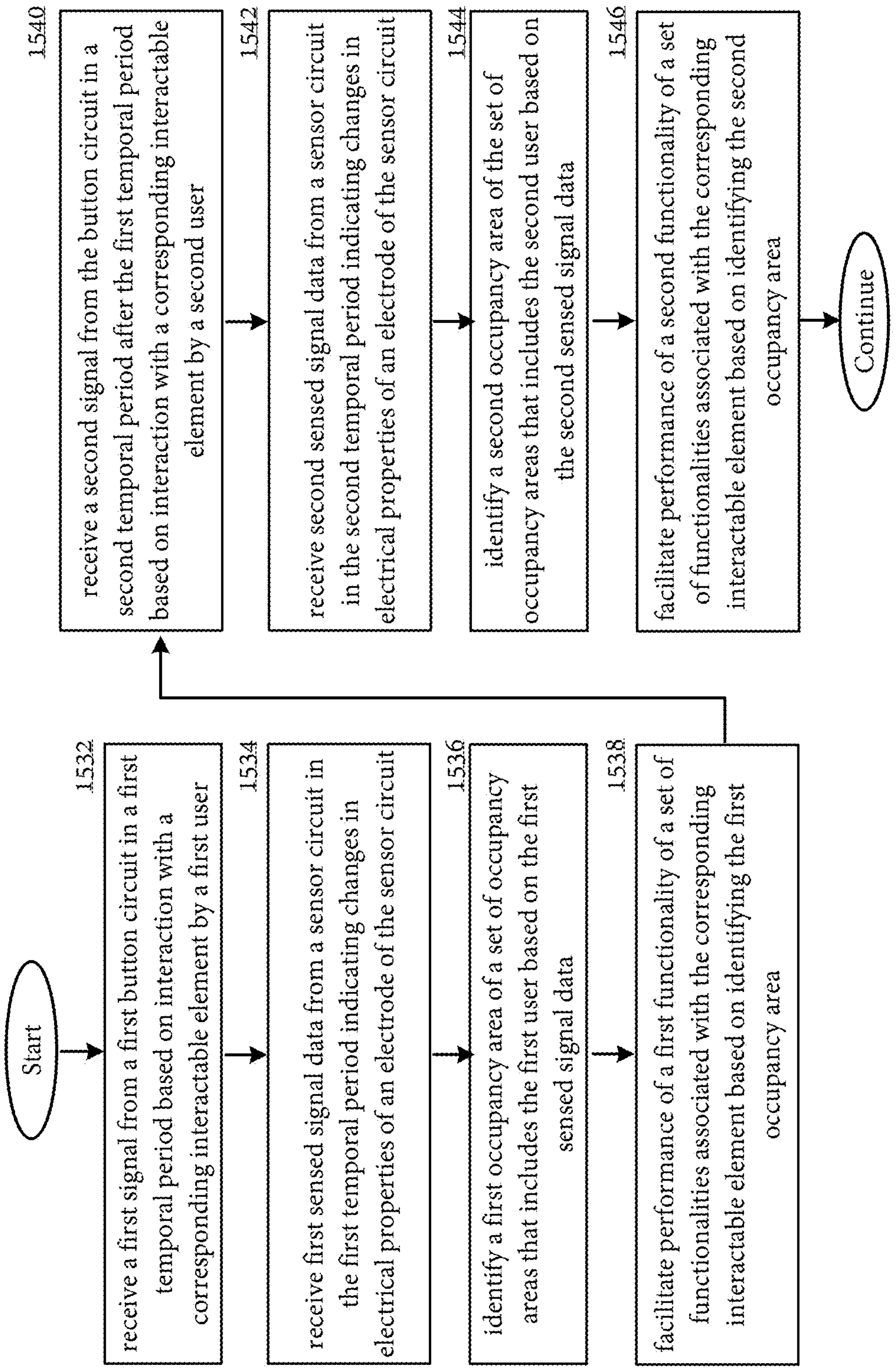
FIG. 21C is a logic diagram illustrating an example method for execution in accordance with various embodiments.

FIG. 21C is a logic diagram illustrating another method of performing functionality of button interactions based on detecting the occupancy area of the user that performed the button interaction. Some or all of the method of FIG. 21C can be performed via a vehicle sensor system or other sensor system, a vehicle computing entity 150, at least one button circuit 112, at least one sensor circuit 116, at least one RX circuit 119, and/or at least one ID circuit 114 and/or 118, for example, based on some or all functionality discussed in conjunction with one or more of FIGS. 6-20D. Some or all of the method of 21B can be performed via any computing entity of FIGS. 2A-2D and/or any processing module, which can be associated with a corresponding vehicle, or any other system, for example, that includes one or more buttons in one or more different locations having corresponding ID circuits whose interaction is verified via a sensor circuit. Performing the method of FIG. 21B can be based on performing some or all steps of the method of FIG. 21A, of FIG. 21B, of FIG. 13B, and/or of FIG. 19B. Some or all steps of FIG. 21C can be implemented to perform the functionality of FIGS. 20C and 20D.

Step 1532 includes receiving a first signal from a first button circuit in a first temporal period based on interaction with a corresponding interactable element by a first user. Step 1534 includes receiving sensed signal data from a sensor circuit in the first temporal period indicating changes in electrical properties of an electrode of the first sensor circuit. Step 1536 includes identifying a first occupancy area of a set of occupancy areas that includes the first user based on the sensed signal data. Step 1538 includes facilitating performance of a first functionality of a set of functionalities associated with the corresponding interactable element based on identifying the first occupancy area.

Step 1540 includes receiving a second signal from the button circuit in a second temporal period after the first temporal period based on interaction with a corresponding interactable element by a second user. Step 1542 includes receiving sensed signal data from the same or different sensor circuit indicating changes in electrical properties of an electrode of the first sensor circuit. Step 1544 includes identifying a second occupancy area of the set of occupancy areas that includes the second user based on the sensed signal data. Step 1546 includes facilitating performance of a second functionality of a set of functionalities associated with the corresponding interactable element based on identifying the second occupancy area.

In various embodiments, the first functionality is associated with the first occupancy area and the second functionality is associated with the second occupancy area. In various embodiments, the first functionality includes configuring a vehicle condition within the first occupancy area, and wherein the second functionality includes configuring the vehicle condition within the second occupancy area. In various embodiments, the vehicle condition includes at least one of: a seat configuration, a temperature configuration, a seat heating element configuration, a seat cooling element configuration, a volume configuration, an air conditioning configuration, a fan speed configuration, a heating configuration, a window configuration, or a heads up display configuration.

In various embodiments, the corresponding interactable element is located in proximity to both the first occupancy area and the second occupancy area. In various embodiments, the corresponding interactable element is located within a front center console area of a vehicle. The first user can be in the first occupancy area based on sitting in a driver's seat of the vehicle, and/or the second user can be in the second occupancy area based on sitting in a front passenger seat of the vehicle.

In various embodiments, the sensor circuit of steps 1534 and 1542 is an RX sensor circuit 119 in proximity to the button circuit and/or the corresponding interactable element. In step 1534, the sensed signal data can indicate a frequency of an ID signal of an ID circuit 114 of a first occupancy area 102, such as the driver occupancy area, where the first occupancy area is detected based on the frequency. In step 1542, the sensed signal data can indicate a frequency of another ID signal of another ID circuit 114 of a second occupancy area 102, such as the front passenger occupancy area, where the second occupancy area is detected based on this other frequency.

In various embodiments, the sensor circuit of step 1534 is sensor circuit 116 in a first occupancy area 102, such as the driver occupancy area, and the sensor circuit of step 1534 is another sensor circuit 116 in a second occupancy area 102, such as the driver occupancy area. In step 1534, the sensed signal data can indicate a frequency of an ID signal of an ID circuit 118 of a vehicle location that includes and/or is in proximity to the button circuit and/or the corresponding interactable element, where the first occupancy area is detected based on the frequency being detected by the sensor circuit 116 in the first occupancy area 102. In step 1534, the sensed signal data can indicate a frequency of the same ID signal of the ID circuit 118 of the vehicle location that includes and/or is in proximity to the button circuit and/or the corresponding interactable element, where the second occupancy area is detected based on the frequency being detected by the sensor circuit 116 in the second occupancy area 102.

In various embodiments, a sensor system includes a button circuits having a corresponding interactable element, a sensor circuit that includes an electrode and is operable to generate sensed signal data indicating changes in electrical properties of the electrode, and a computing entity. The computing entity is operable to receive a first signal from a button circuit in a first temporal period based on interaction with a corresponding interactable element by a first user; receive first sensed signal data the sensor circuits in the first temporal period indicating changes in electrical properties of the electrode of sensor circuit; identify a first occupancy area of a set of occupancy areas that includes the first user based on the first sensed signal data; facilitate performance of a first functionality of a set of functionalities associated with the corresponding interactable element based on identifying the first occupancy area; receive a second signal from the button circuit in a second temporal period after the first temporal period based on interaction with a corresponding interactable element by a second user; receive second sensed signal data the sensor circuit in the second temporal period indicating changes in electrical properties of the electrode of the sensor circuit; identify a second occupancy area of the set of occupancy areas that includes the second user based on the second sensed signal data; and/or facilitate performance of a second functionality of a set of functionalities associated with the corresponding interactable element based on identifying the second occupancy area.

In various embodiments, a sensor system includes a button circuit having a corresponding interactable element; a set of sensor circuits, wherein each sensor circuit includes an electrode and is operable to generate sensed signal data indicating changes in electrical properties of the electrode; and a computing entity operable to: receive a first signal from a button circuit in a first temporal period based on interaction with a corresponding interactable element by a first user; receive first sensed signal data from a first one of the set of sensor circuits in the first temporal period indicating changes in electrical properties of the electrode of the first one of the set of sensor circuits; identify a first occupancy area of a set of occupancy areas that includes the first user based on the first sensed signal data; facilitate performance of a first functionality of a set of functionalities associated with the corresponding interactable element based on identifying the first occupancy area; receive a second signal from the button circuit in a second temporal period after the first temporal period based on interaction with a corresponding interactable element by a second user; receive second sensed signal data from a second one of the set of sensor circuits in the second temporal period indicating changes in electrical properties of the electrode of the second one of the set of sensor circuits; identify a second occupancy area of the set of occupancy areas that includes the second user based on the second sensed signal data; and facilitate performance of a second functionality of a set of functionalities associated with the corresponding interactable element based on identifying the second occupancy area.

Figure 21D:
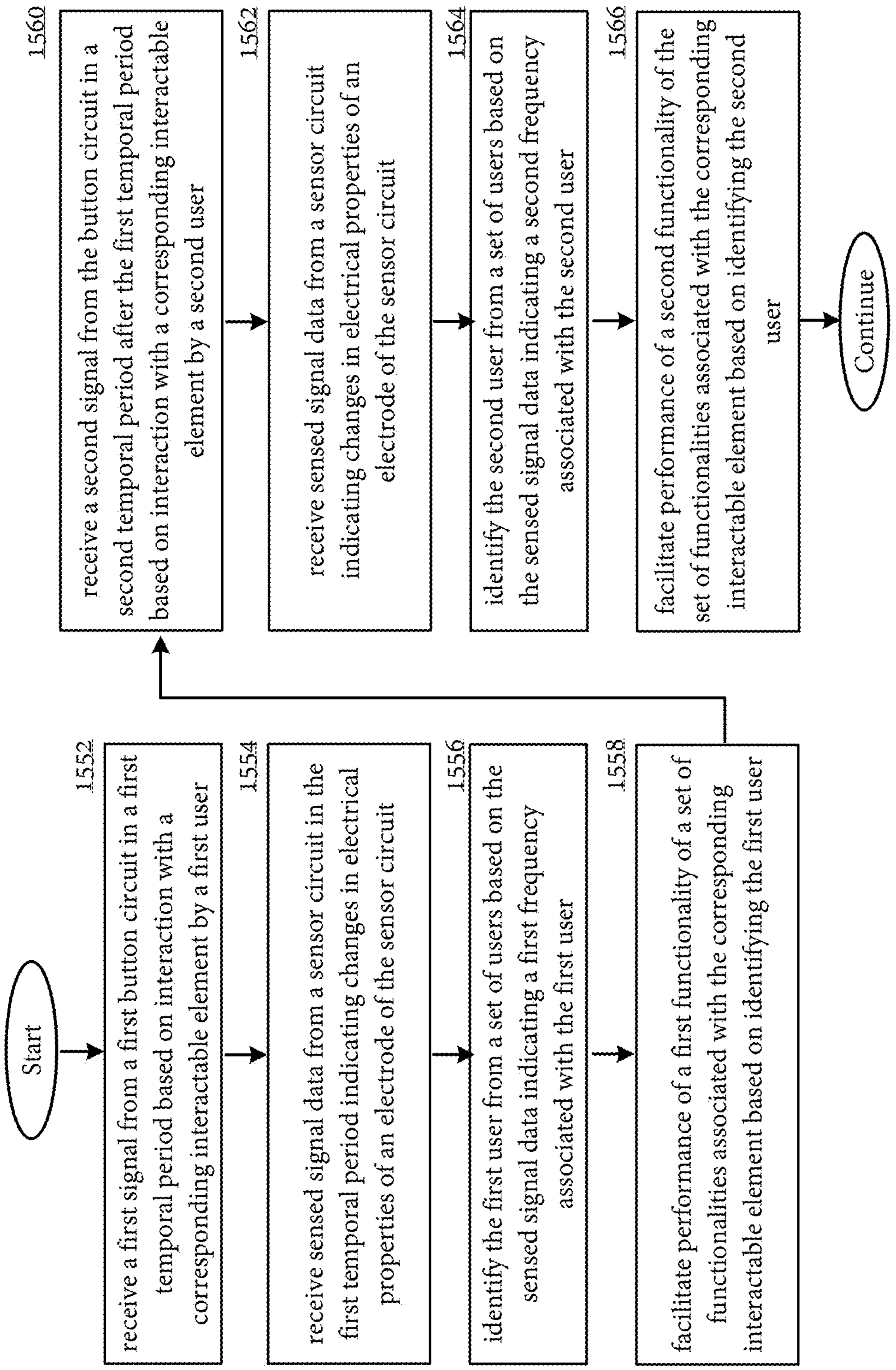
FIG. 21D is a logic diagram illustrating an example method for execution in accordance with various embodiments.

FIG. 21D is a logic diagram illustrating another method of performing functionality of button interactions based on identifying the particular person that performed the button interaction. Some or all of the method of FIG. 21D can be performed via a vehicle sensor system or other sensor system, a vehicle computing entity 150, at least one button circuit 112, at least one sensor circuit 116, at least one RX circuit 119, and/or at least one ID circuit 114 and/or 118, for example, based on some or all functionality discussed in conjunction with one or more of FIGS. 6-20D. Some or all of the method of 21B can be performed via any computing entity of FIGS. 2A-2D and/or any processing module, which can be associated with a corresponding vehicle, or any other system, for example, that includes one or more buttons in one or more different locations having corresponding ID circuits whose interaction is verified via a sensor circuit. Performing the method of FIG. 21B can be based on performing some or all steps of the method of FIG. 21A, of FIG. 21B, of FIG. 13B, and/or of FIG. 19B. Some or all steps of FIG. 21D can be implemented to perform the functionality of FIGS. 20C and 20D. Some or all of the steps of FIG. 21D can be performed in conjunction with the functionality of FIGS. 8C-8E and/or in conjunction with some or all steps of the method of FIG. 8F.

Step 1552 includes receiving a first signal from a first button circuit in a first temporal period based on interaction with a corresponding interactable element by a first user. Step 1554 includes receiving sensed signal data from a sensor circuit in the first temporal period indicating changes in electrical properties of an electrode of the sensor circuit. Step 1556 includes identifying the first user from a set of users based on the sensed signal data indicating a first frequency associated with the first user. Step 1558 includes facilitating performance of a first functionality of a set of functionalities associated with the corresponding interactable element based on identifying the first user.

Step 1560 includes receiving a second signal from the button circuit in a second temporal period after the first temporal period based on interaction with a corresponding interactable element by a second user. Step 1562 includes receiving sensed signal data from the same or different sensor circuit indicating changes in electrical properties of an electrode of the sensor circuit. Step 1564 includes identifying the second user from a set of users based on the sensed signal data indicating a second frequency associated with the second user. Step 1566 includes facilitating performance of a second functionality of the set of functionalities associated with the corresponding interactable element based on identifying the second user.

In various embodiments, the first user is located in a first occupancy area of a vehicle during a vehicle trip, and the second user is located in a second occupancy area of the vehicle during the vehicle trip. The first temporal period and second temporal period can both be during the vehicle trip. In various embodiments, the first user is located in a driver occupancy area of the vehicle and wherein the second user is located in a front passenger occupancy area of the vehicle.

In various embodiments, the first user is located in a first occupancy area of a vehicle during a first vehicle trip, and the second user is located in the first occupancy area of the vehicle during a second vehicle trip. The first temporal period can be during the first vehicle trip, and the temporal period can be during the second vehicle trip. In various embodiments, the first occupancy area is a driver occupancy area, where the first user drives the vehicle during the first vehicle trip, and wherein the second user drives the vehicle during a second vehicle trip.

In various embodiments, the first functionality and the second functionality are performed based on accessing stored preference data and/or historical configuration data for the first user and the second user. In various embodiments, the first functionality corresponds to a first audio functionality and wherein the second functionality corresponds to a second audio functionality. In various embodiments, the first functionality corresponds to a first configuration of one of: a seat, a temperature setting, one or more mirrors, a steering wheel, or a heads up display, and wherein the second functionality corresponds to a second configuration of one of: a seat, a temperature setting, one or more mirrors, a steering wheel, or a heads up display.

Figure 48A:
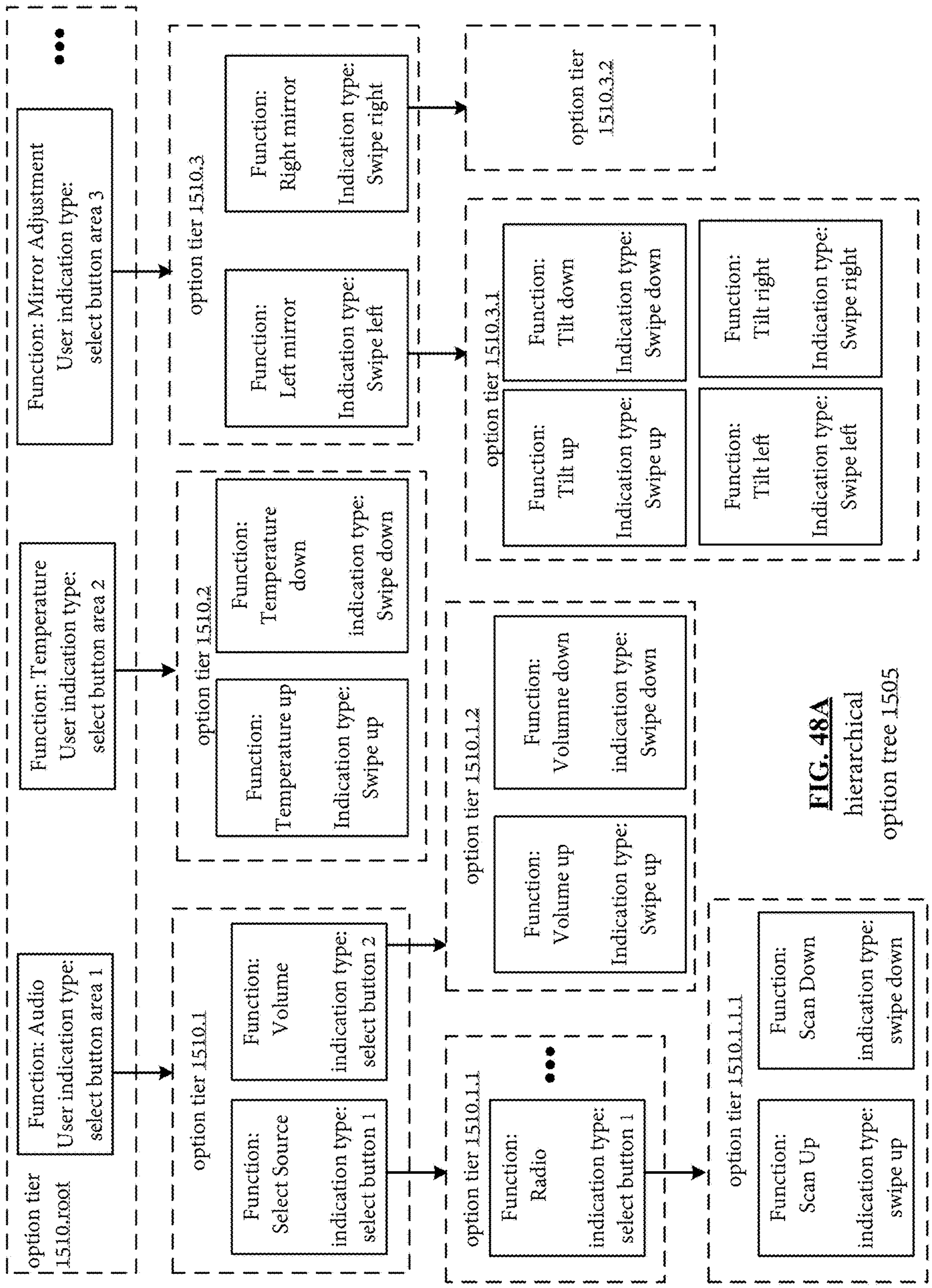
FIG. 48A is an illustration of an example hierarchical option tree in accordance with various embodiments.

In various embodiments, the first functionality is performed based on accessing button configuration data, gesture configuration data, and/or hierarchical option tree data mapped to the first user, such as the hierarchical option tree of FIG. 48A. The second functionality can be performed based on accessing button configuration data, gesture configuration data, and/or hierarchical option tree data mapped to the second user.

Figure 22:
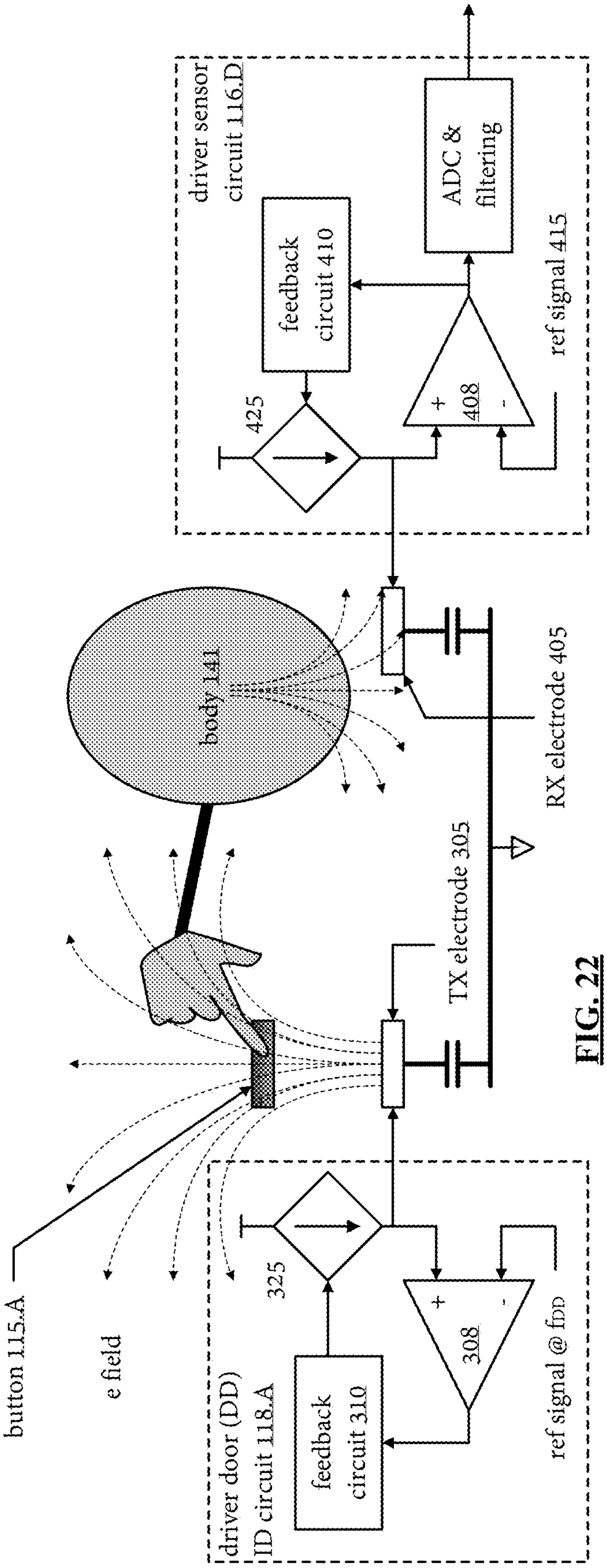
FIG. 22 is a schematic block diagram of an example of sensing an ID of a vehicle locale (e.g., driver door) and button touch via sensor circuit (e.g., a driver sensor circuit) in accordance with various embodiments.

FIG. 22 is a schematic block diagram of an example of sensing an ID of a vehicle locale (e.g., driver door) and button touch via sensor circuit (e.g., a driver sensor circuit). The driver door ID circuit 118.A can be implemented in a same or similar fashion as the driver door ID circuit 118 of FIG. 3. The driver sensor circuit 116.D can be implemented in a same or similar fashion as the sensor circuit 116 of FIG. 4.

In this example a user interacts with a given button 115 of the vehicle locale, such as a button on the driver door. The electrode 305 coupled to driver door ID circuit has a capacitance to ground and produces an electric field (e-field), which is coupled through body 141 of a given user to electrode 405 of driver sensor circuit when the hand, or other body part, is proximal to the button 115, for example, based on the electrode 305 being in physical proximity to the button 115. is near the button. Thus, a corresponding change in capacitance due to coupling of e-field through body to this electrode 405 is detected to indicate that the driver is intentionally pressing the button.

Figure 23:
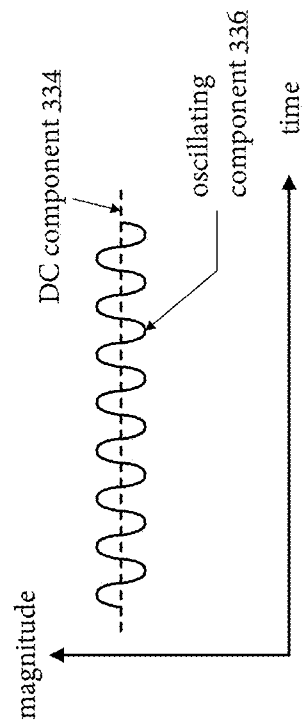
FIG. 23 is a schematic block diagram of an example of reference signal for the driver door ID circuit in accordance with various embodiments.

FIG. 23 is a schematic block diagram of an example of reference signal for the driver door ID circuit of FIG. 22. The reference signal can have a DC component 334 and oscillating component 336.

The DC component 334 can be a DC voltage in the range of a few hundred milli-volts to tens of volts or more. The oscillating component 336 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component).

The frequency and/or other signature of oscillating component 336 can be unique to the given ID circuit 118.A to distinguish the given ID circuit 118.A from other ID circuits, for example, corresponding to other buttons or locations within the vehicle. The induced e-field coupled to the body can thus have the corresponding frequency of oscillating component 336 denoting and/or unique to the given ID circuit from other ID circuits, where the change in capacitance due to coupling of e-field through body to this electrode 405 denotes the given frequency, thus identifying the given ID circuit 118.A.

Figure 24:
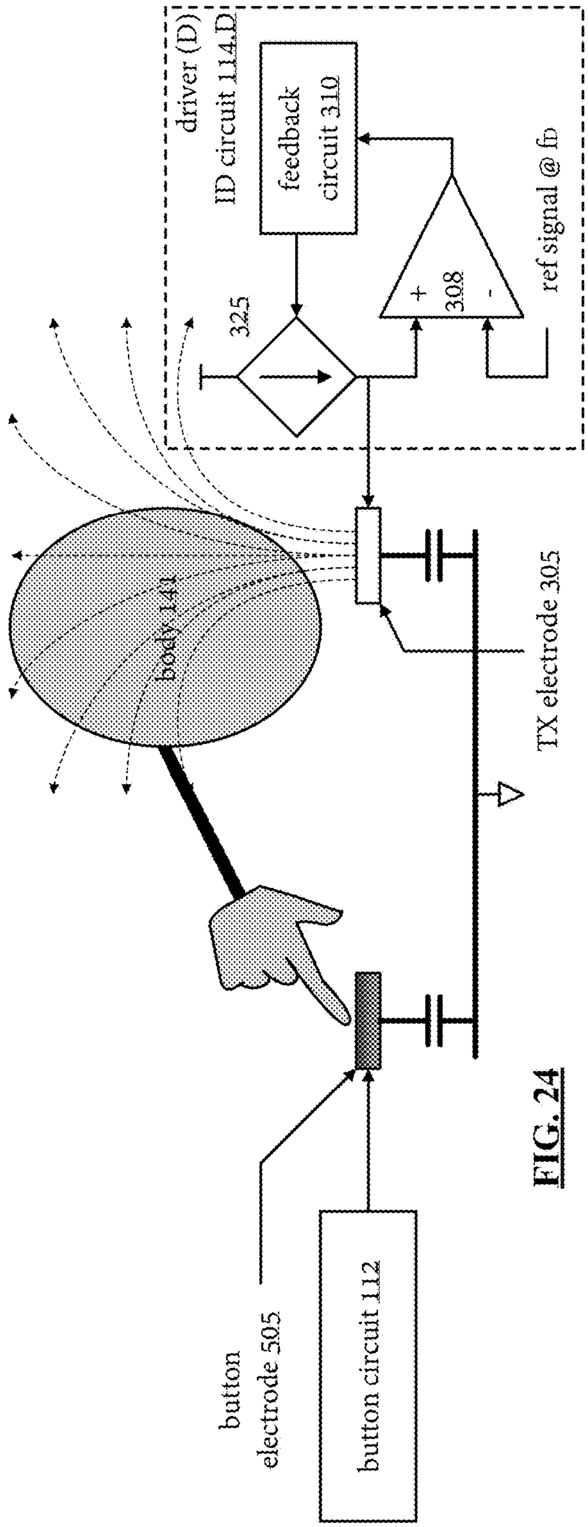
FIG. 24 is a schematic block diagram of an example of transmitting a driver ID via a driver ID circuit and a body to a button circuit in accordance with various embodiments.

FIG. 24 is a schematic block diagram of an example of transmitting a driver ID via a driver ID circuit and a body to a button circuit that includes a button electrode 505 that implements the corresponding button.

The driver TX ID can be transmitted through body 141 to a button circuit having a button electrode 505 of a corresponding button that the user's finger and/or hand touches and/or hovers over to facilitate interaction with the corresponding button. The electrode button circuit 112 can detect presence of driver's ID frequency based on detecting a corresponding change in capacitance due to coupling of the e-field through body to this electrode 505 is detected identify that the driver is pressing the button, rather than another user or inadvertent object.

Figure 25:
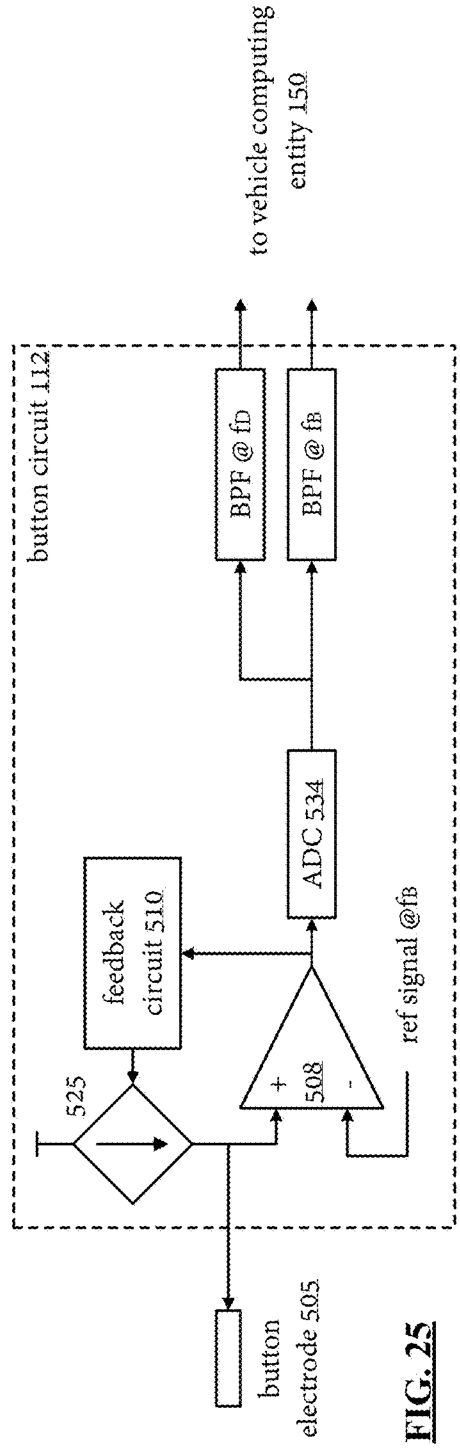
FIG. 25 is a schematic block diagram of an embodiment of a button circuit in accordance with various embodiments.

FIG. 25 is a schematic block diagram of an embodiment of a button circuit 112 of FIG. 24. The button circuit 112 can be implemented in a same or similar fashion as button circuit of FIG. 5. The driver ID circuit 114.D can be implemented in a same or similar fashion as the ID circuit 114 of FIG. 3. The RX circuits 119 of FIGS. 14-19A can optionally be implemented via some or all features and/or functionality of button circuits 112 of FIGS. 24 and/or 25.

In such embodiments, when the driver touches or is in proximity to an electrode 505 of a button circuit 112, for example, while touching, hovering over, or otherwise interacting with the corresponding button, the corresponding button circuit 112 can detect not only a change in impedance or other electrical characteristics denoting a touch and/or touchless indication, but can further detect the driver TX signal 124.D denoting that the driver, and not another user or inadvertent material such as a water droplet, is touching or otherwise interacting with the corresponding button. For example, the sensed signal data 540 generated by a given button circuit 112 indicates the detection of driver TX signal 124.D based on the driver being in proximity to button electrode 505 of the given button circuit 112, which can be sent to vehicle computing entity 150 for processing in accordance with functionality of the given button.

The vehicle computing entity 150 can receive and process sensed signal data 540, or other data indicating interaction with corresponding buttons, from various button circuits 112 over time and, when the sensed signal data 540 indicates a driver or other user is touching the button based on detection of their respective TX signal 124, can process the corresponding functionality accordingly. For example, the vehicle computing entity 150 generates and sends control data to an actuator of a driver door window to cause the window to roll down based on driver door button circuit 112.A having sent sensed signal data 540 indicating the driver TX signal 124.D was detected based on the driver interacting with a driver door button corresponding to driver window controls. As another example, the vehicle computing entity 150 generates and sends control data to an audio system to cause a currently playing song to be skipped to a next song in a given playlist based on steering wheel button circuit 112.B having sent sensed signal data 540 indicating the driver TX signal 124.D was detected due to driver interaction with an electrode 505 of a steering wheel button corresponding to audio controls. The identifiers of different occupants in the vehicle can further be processed, for example, in conjunction with the vehicle status, to determine if the corresponding user is allowed to interact with the given button as discussed previously.

As illustrated in FIG. 25, the button circuit 112 can include a set of band pass filters (BPFs). The filtering circuit 535 of FIG. 5 can optionally be implemented as the set of BPFs of FIG. 25. The set of BPFs can include a BPF centered at frequency $F_D$ of a corresponding ID circuit 114 of one or more occupant areas, and another BPF centered at frequency FB of its own reference signal. In some embodiments, the button circuit 112 of FIGS. 6-13A and/or FIGS. 14-19 is optionally implemented as the button circuit 112 of FIG. 5 and/or of FIGS. 24-25. The BPF at FB can be implemented to give a capacitance value when no other components are present, for example, based on not being touched by a person. The BPF at $F_D$ can be implemented to detect the presence of signals at the corresponding frequency $F_D$, for example, to thus detect the frequency induced by a corresponding e-field induced by a person in proximity to the button while interacting with the button. Thus, the button can be determined to be intentionally touched and/or hovered over when frequency $F_D$ is detected. In some embodiments, some or all ID circuits 114 of some or all occupancy areas, such as multiple different vehicle chairs 132, transmit their respective reference signal at this same frequency $F_D$, where it is not necessary to distinguish between different people in the vehicle, but where intentional touches by people are still distinguishable from other changes, such as changed induced by water droplets, food crumbs, or other objects.

Figure 26:
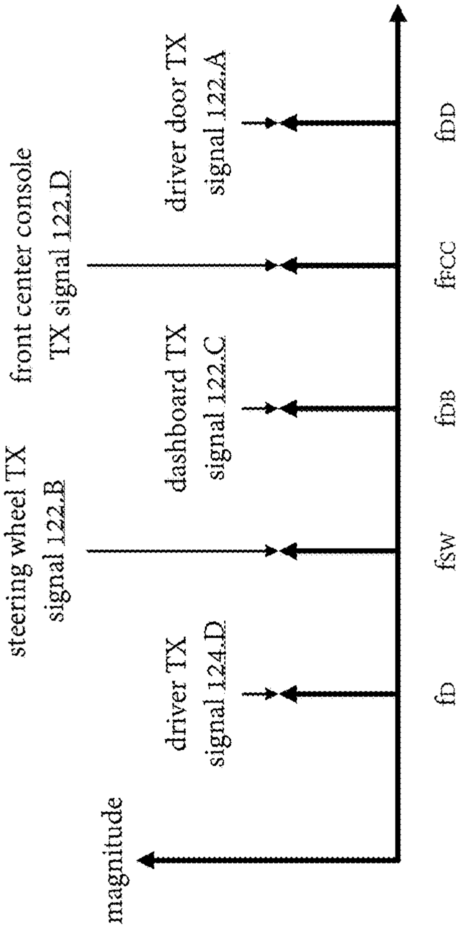
FIG. 26 is a schematic block diagram of an example of different frequencies for a driver TX signal, a steering wheel TX signal, a dashboard TX signal, a front center console TX signal, and a driver drive TX signal in accordance with various embodiments.

FIG. 26 is a schematic block diagram of an example of different frequencies for a driver TX signal, a steering wheel TX signal, a dashboard TX signal, a front center console TX signal, and a driver drive TX signal. Different ID circuits 114 and/or 118 in the vehicle can have reference signals 315 at these different respective frequencies to uniquely identify the different respective occupants, buttons, and/or locations within the vehicle as discussed previously.

Figure 27:
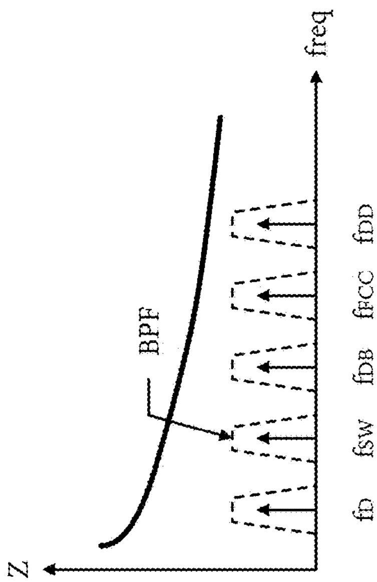
FIG. 27 is a schematic block diagram of an example of impedance change of capacitance of an electrode button versus frequency and bandpass filtering (BPF) at a driver TX signal, a steering wheel TX signal, a dashboard TX signal, a front center console TX signal, and a driver drive TX signal in accordance with various embodiments.

FIG. 27 is a schematic block diagram of an example of impedance change of capacitance of an electrode versus frequency and bandpass filtering (BPF) at a driver TX signal, a steering wheel TX signal, a dashboard TX signal, a front center console TX signal, and a driver drive TX signal. In particular, an RX electrode 405 can have corresponding impedance changes induced at one or more of the frequencies of FIG. 26 at a given time, which can be induced when a user in proximity to RX electrode 405 is also in proximity to a corresponding TX electrode 305 emitting an e-field with the given frequency. Band pass filters can be applied for each frequency of the various ID circuits 114 and/or 118 in the vehicle to enable detection of these frequencies, to detect corresponding button touches and/or occupants accordingly.

Figure 28:
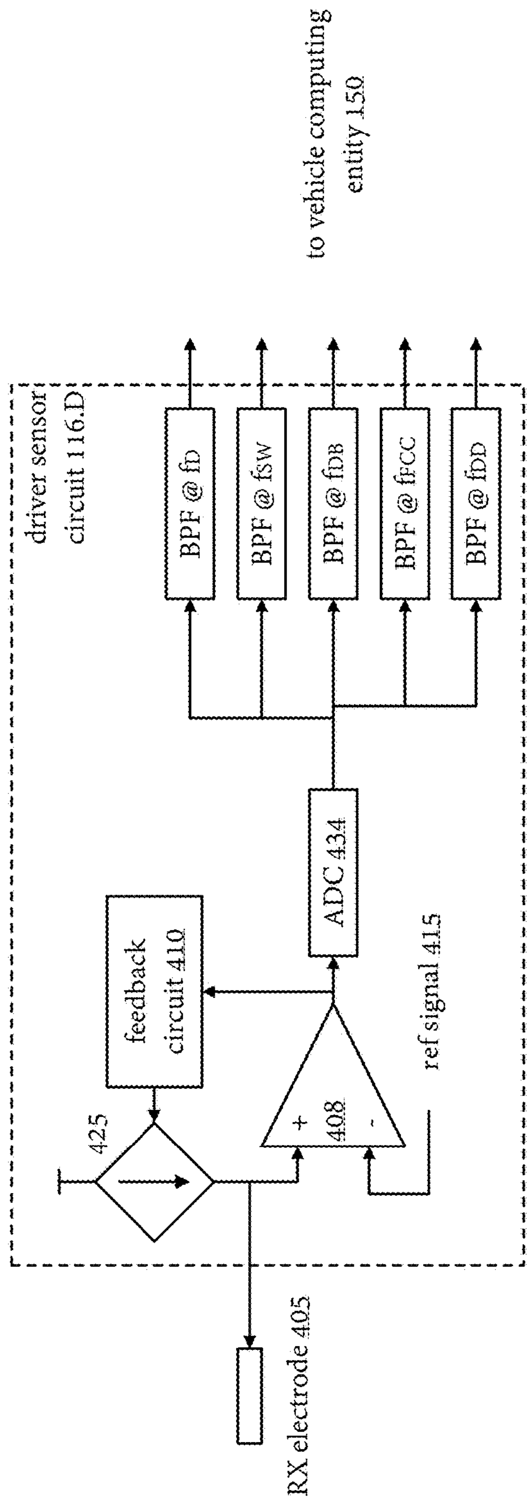
FIG. 28 is a schematic block diagram of an embodiment of a driver sensor circuit in accordance with various embodiments.

FIG. 28 is a schematic block diagram of an embodiment of a driver sensor circuit. For example, the driver sensor circuit 116.D of FIG. 28 is implemented via some or all features and/or functionality of the sensor circuit 116 of FIG. 4, where the filtering circuit 435 is implemented as a set of BPFs centered at the set of frequencies of FIG. 27, enabling identification of: a frequency identifying a driver occupant due to a driver being seated in the driver occupancy area 102.D; a frequency identifying the driver door due to the driver interacting with one or more driver door buttons or otherwise being in proximity to an electrode 305 of driver door ID circuit 118.A; a frequency identifying the steering wheel due to the driver interacting with one or more steering wheel buttons or otherwise being in proximity to an electrode 305 of steering wheel ID circuit 118.B; a frequency identifying the dashboard due to the driver interacting with one or more dashboard buttons or otherwise being in proximity to an electrode 305 of dashboard ID circuit 118.C; a frequency identifying the front center console due to the driver interacting with one or more front center console buttons or otherwise being in proximity to an electrode 305 of front center console ID circuit 118.D; and/or other frequencies of other ID circuits in the vehicle with corresponding BPFs in the set of BPFs. Note that the reference frequency of FIG. 28 can be DC rather than AC, as no oscillating component is necessary due to the electrode being configured to sense signals rather than transmit signals.

Figure 29:
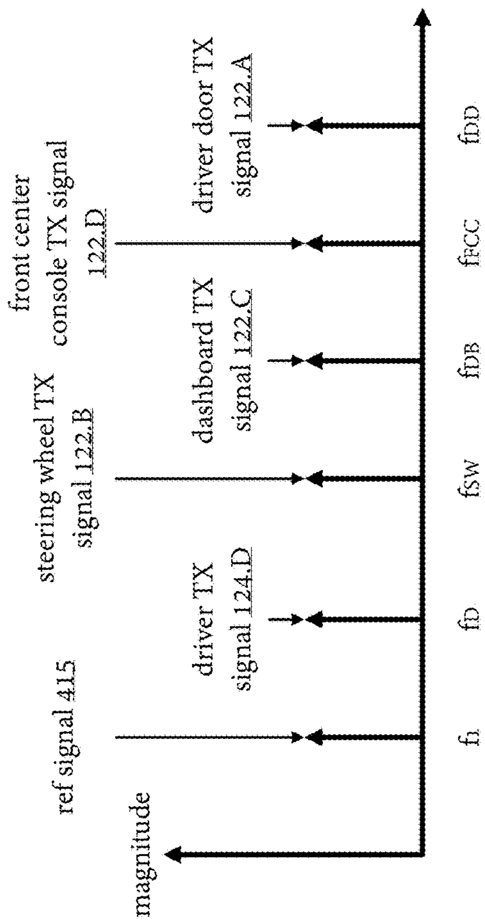
FIG. 29 is a schematic block diagram of another example of different frequencies for a reference signal, a driver TX signal, a steering wheel TX signal, a dashboard TX signal, a front center console TX signal, and a driver drive TX signal in accordance with various embodiments.
Figure 30:
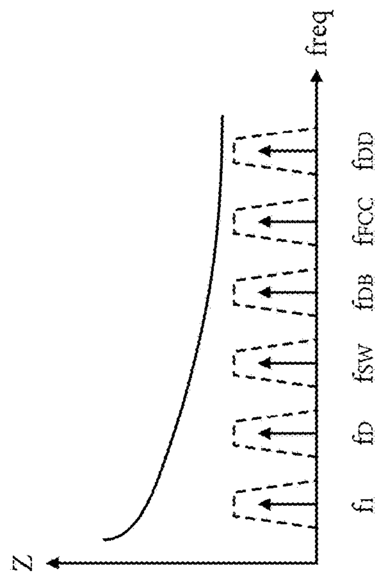
FIG. 30 is a schematic block diagram of another example of impedance change of capacitance of an electrode button versus frequency and bandpass filtering (BPF) at a reference signal, a driver TX signal, a steering wheel TX signal, a dashboard TX signal, a front center console TX signal, and a driver drive TX signal in accordance with various embodiments.
Figure 31:
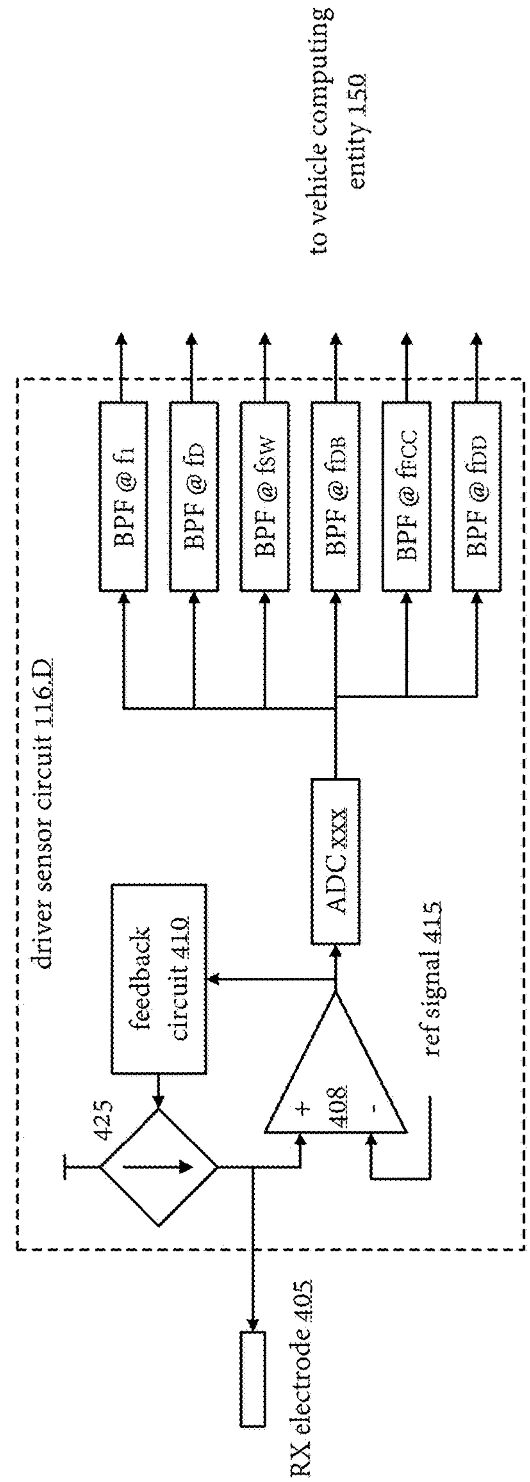
FIG. 31 is a schematic block diagram of another embodiment of a driver sensor circuit in accordance with various embodiments.

FIGS. 29-31 present another embodiment of a driver sensor circuit 116 that enables detection of a set of signals at respective frequencies, where the reference signal includes an AC component at a particular frequency F1 that can further be identified via a corresponding band pass filter of the driver sensor circuit 116, giving a capacitance value for cases when no other components are present.

FIG. 29 is a schematic block diagram of another example of different frequencies for a reference signal, a driver TX signal, a steering wheel TX signal, a dashboard TX signal, a front center console TX signal, and a driver drive TX signal. Different ID circuits 114 and/or 118 in the vehicle can have reference signals 315 at these different respective frequencies to uniquely identify the different respective occupants, buttons, and/or locations within the vehicle as discussed previously. Reference signal 415 can correspond to the reference signal 415 of a driver sensor circuit 116.D.

FIG. 30 is a schematic block diagram of another example of impedance change of capacitance of an electrode button versus frequency and bandpass filtering (BPF) at a reference signal, a driver TX signal, a steering wheel TX signal, a dashboard TX signal, a front center console TX signal, and a driver drive TX signal. In particular, an RX electrode 405 can have corresponding impedance changes induced at one or more of the frequencies of FIG. 29 at a given time, which can be induced when a user in proximity to RX electrode 405 is also in proximity to a corresponding TX electrode 305 emitting an e-field with the given frequency. Band pass filters can be applied for each frequency of the various ID circuits 114 and/or 118 in the vehicle to enable detection of these frequencies, to detect corresponding button touches and/or occupants accordingly as discussed in conjunction with FIG. 27. The reference frequency can give a capacitance value for cases when no other components are present.

FIG. 31 is a schematic block diagram of another embodiment of a driver sensor circuit. For example, the driver sensor circuit 116.D of FIG. 31 is implemented via some or all features and/or functionality of the sensor circuit 116 of FIG. 4 and/or FIG. 28, where the filtering circuit 435 is implemented as a set of BPFs centered at the set of frequencies of FIG. 31, enabling identification of corresponding signals as discussed in conjunction with FIG. 28. The driver sensor circuit 116.D of FIG. 31 can further include a BPF centered at the reference frequency, for example, to identify when no other components are present and/or when chances in capacitance and/or inductance are not induced via touch. The reference signal 415 of such embodiments can have a DC component and can further have an AC component at frequency F1.

Figure 32:
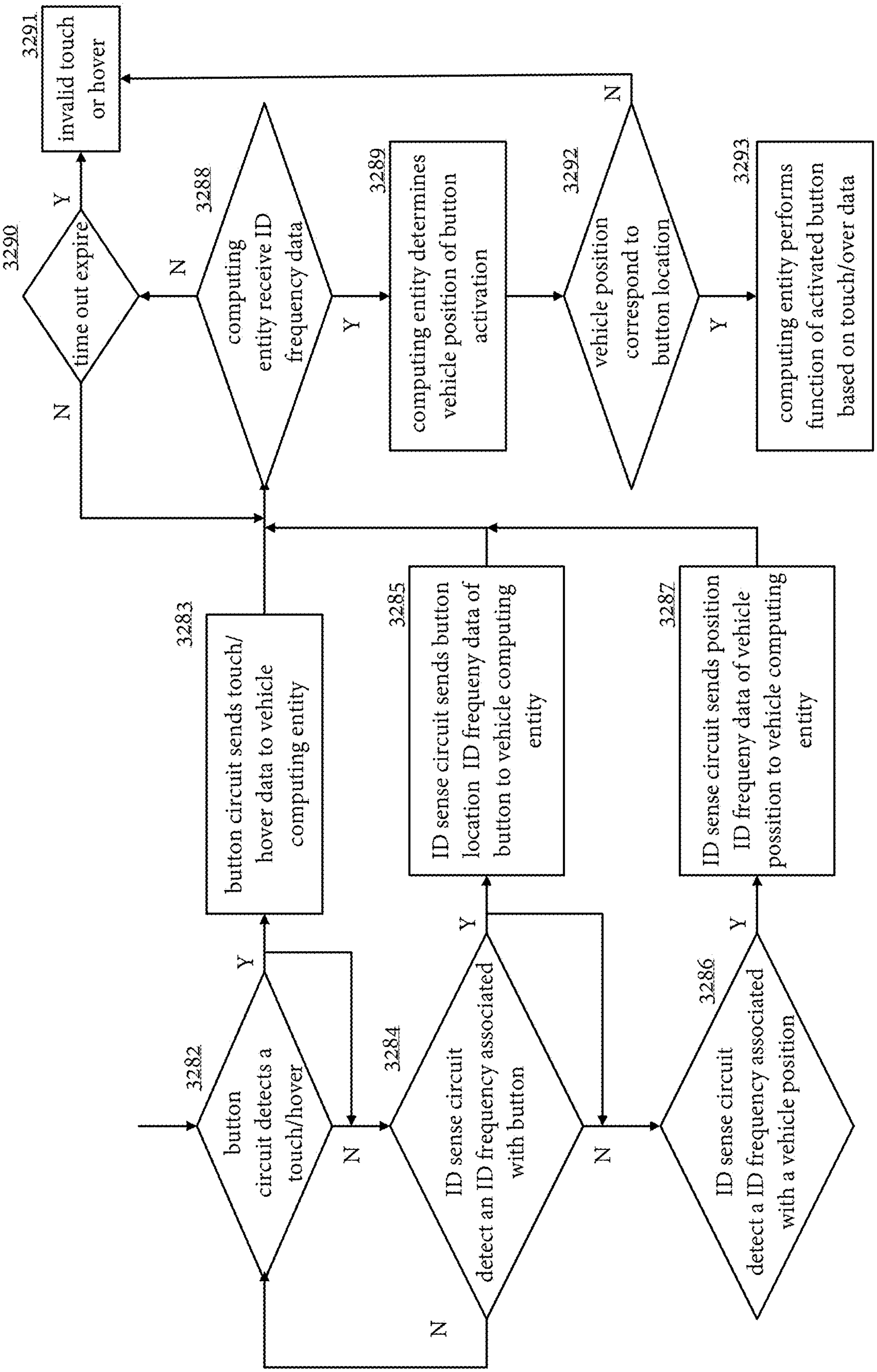
FIG. 32 is a logic diagram of an example of a method of detecting and verifying a touch of a button in accordance with various embodiments.

FIG. 32 is a logic diagram of an example of a method of detecting and verifying a touch of a button. For example, some or all of the method of FIG. 32 is performed via a vehicle computing entity 150, at least one button circuit 112, at least one sensor circuit 116, at least one ID circuit 114 and/or 118, and/or at least one processing module, for example, based on some or all functionality discussed in conjunction with one or more of FIGS. 1-31. As a particular example, a set of circuits of FIGS. 6-13A of one or more occupancy areas of a vehicle are implemented to facilitate execution of FIG. 32. Some or steps of FIG. 32 can be performed in conjunction with executing the method of FIG. 21A, the method of FIG. 13B, and/or any other method described herein.

Step 3282 includes a button circuit 112 detecting a touch and/or hover. When a button circuit 112 detects a touch and/or hover, the method proceeds to step 3283, where the button circuit 112 sends the touch and/or hover data to vehicle computing device 150, for example, based on generating and sending corresponding signaling to vehicle computing device 150 of step 3283. The touch/hover data can include sensed data (e.g. capacitance values generated by a button circuit 112 of FIG. 5) and/or or processed sensed data (e.g., touch detected, hover, hover at x cm from button). The touch/hover data can correspond to any other indication that a corresponding button was actuated or interacted with, such as a switch being flipped or a knob being turned.

Step 3284 includes an ID sense circuit, such as driver sensor circuit 116.D or a sensor circuit for another occupancy area 103, detecting an ID frequency associated with the button, for example, based on receiving the signal generated via an ID circuit 118 of the corresponding button being propagated through the user's body. The ID frequency can be detected via the ID sense circuit being implemented as sensor circuit 116 as discussed in conjunction with some or all of FIGS. 22-31. When the ID sense circuit detects an ID frequency associated with the button, the ID sense circuit sends button location ID frequency data of the button to the vehicle computing entity 150 in step 3285. For example, the unique frequency of the button is indicated and/or determined based on detection of the unique frequency, such as $f_{SW}$, $f_{DB}$, $f_{FCC}$, and/or $f_{DD}$.

Step 3286 includes the ID sense circuit detecting an ID frequency associated with a vehicle position. For example, this includes detecting an ID frequency associated with a corresponding occupancy area, such as the driver ID frequency or a passenger ID frequency generated by a corresponding ID circuit 114. When the ID sense circuit detecting an ID frequency associated with a vehicle position, the ID sense circuit sends position ID frequency data of the vehicle position to vehicle computing entity 150 in step 3287. For example, the unique frequency of the corresponding occupancy area is indicated and/or determined based on detection of the corresponding unique frequency, such as such as $f_D$, $f_{RP}$, $f_{RLP}$, and/or $f_{RRP}$ of a driver ID circuit 116.D, front passenger ID circuit 116.FP, rear left passenger ID circuit 116.RLP, and/or rear fight passenger ID circuit 116.RRP, respectively.

Step 3288 includes the vehicle computing entity 150 receiving ID frequency data detected in steps 3284 and/or 3286, and/or the touch/hover data of the button touch detected in step 3282. Once a time out expire of step 3290 is reached, for example, based on not receiving ID frequency data for a button touch within a given temporal period after the button touch and/or hover is detected, the button touch and/or hover is determined to be invalid in step 3291, for example, where the corresponding button functionality is not performed via the vehicle computing entity 150.

When the vehicle computing entity 150 receives the receiving ID frequency data and/or the touch/hover data, the vehicle computing entity 150 determines a vehicle position of the button activation in step 3289, for example, based on the unique frequency detected due to user proximity to a corresponding ID circuit 114 generating a signal at the corresponding frequency. The vehicle computing entity 150 can further determine whether the vehicle position corresponds to the button location in step 3292. For example, this determination is based on the location of buttons in the vehicle and/or permissions to activate different buttons for different occupants of the vehicle as discussed previously. When the vehicle computing entity 150 can determines the vehicle position does not correspond to the button location in step 3292, the vehicle computing entity 150 does not perform the function of the activated button, and instead determines the touch and/or hover was invalid.

When the vehicle computing entity 150 can determines the vehicle position corresponds to the button location in step 3292, the vehicle computing entity 150 perform the function of the activated button. The function perform can be based on processing the touch/hover data. For example, rather than simply actuating a functionality, where a button turns this functionality on or off, the motion of the touch, distance of a hover from a corresponding electrode, a touch-based or touchless gesture, or other characteristics of the touch can induce corresponding functionality, where a given button is capable of inducing different functionality for different types of touches, hovers, and/or other interactions with the given button. Such functionality is discussed in further detail herein.

Figure 33:
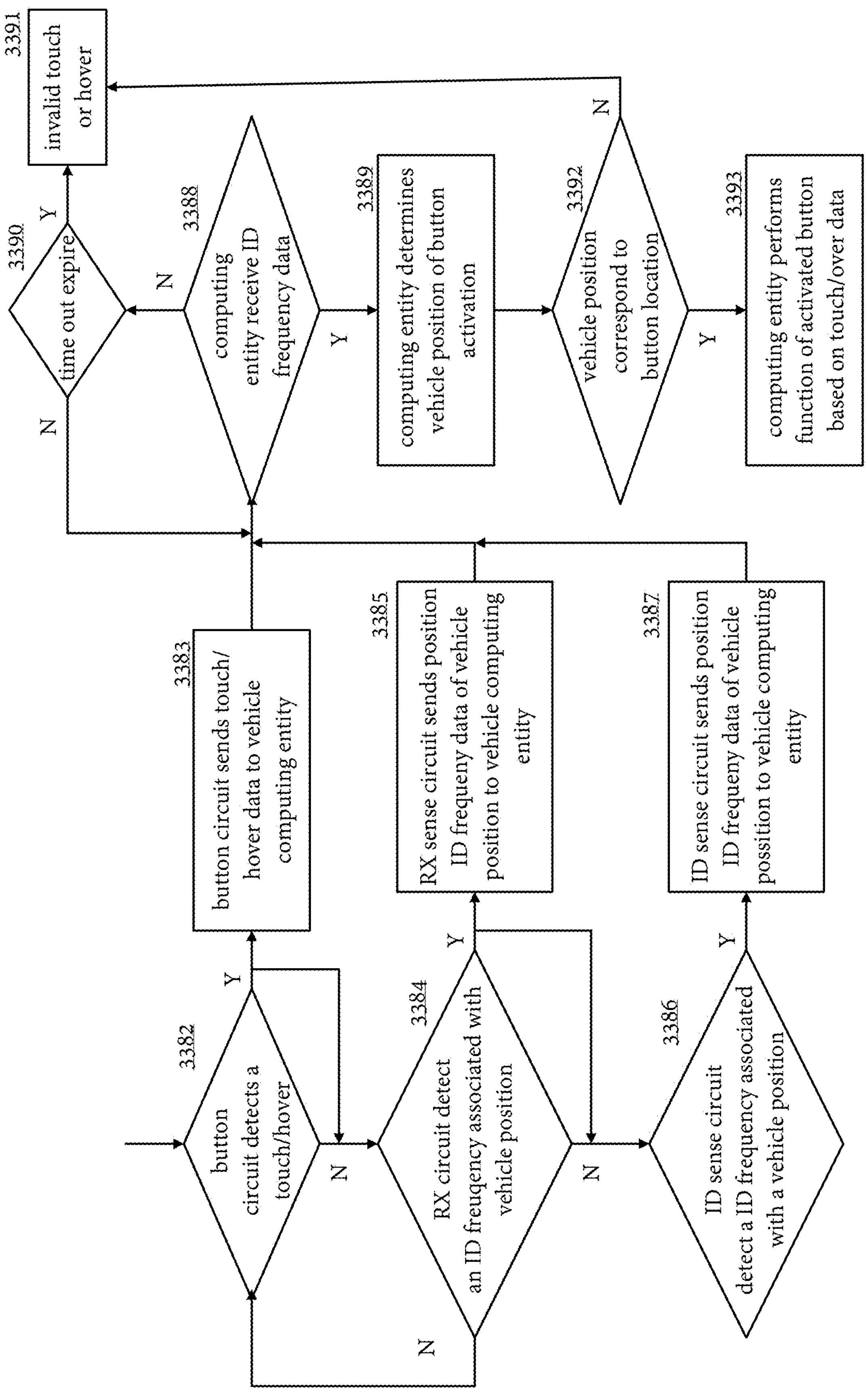
FIG. 33 is a logic diagram of another example of a method of detecting and verifying a touch of a button in accordance with various embodiments.

FIG. 33 is a logic diagram of another example of a method of detecting and verifying a touch of a button. For example, some or all of the method of FIG. 33 is performed via a vehicle computing entity 150, at least one button circuit 112, at least one sensor circuit 116, at least one ID circuit 114 and/or 118, and/or at least one processing module, for example, based on some or all functionality discussed in conjunction with one or more of FIGS. 1-31. As a particular example, a set of circuits of FIGS. 14-19 of one or more occupancy areas of a vehicle are implemented to facilitate execution of FIG. 33. Some or steps of FIG. 33 can be performed in conjunction with executing the method of FIG. 21, FIG. 19B, and/or FIG. 32.

Step 3382 includes a button circuit 112 detecting a touch and/or hover. When a button circuit 112 detects a touch and/or hover, the method proceeds to step 3283, where the button circuit 112 sends the touch and/or hover data to vehicle computing device 150, for example, based on generating and sending corresponding signaling to vehicle computing device 150 in step 3383. The touch/hover data can include sensed data (e.g. capacitance values generated by a button circuit 112 of FIG. 5) and/or or processed sensed data (e.g., touch detected, hover, hover at x cm from button). The touch/hover data can correspond to any other indication that a corresponding button was actuated or interacted with, such as a switch being flipped or a knob being turned.

Step 3384 includes an RX sense circuit, such as an RX circuit 119 of a button area or vehicle area, detecting an ID frequency associated with a vehicle, for example, based on receiving the signal generated via an ID circuit 114 of the corresponding occupancy area 102 being propagated through the user's body. The ID frequency can be detected via the RX sense circuit being implemented as sensor circuit 116 as discussed in conjunction with some or all of FIGS. 22-31. When the RX sense circuit detects an ID frequency associated with a vehicle position, the ID sense circuit sends vehicle position ID frequency data of the vehicle position to the vehicle computing entity 150 in step 3385. For example, the unique frequency of the occupancy area is indicated and/or determined based on detection of the unique frequency, such as $f_D$, $f_{FP}$, $f_{RLP}$, and/or $f_{RRP}$ of a driver ID circuit 116.D, front passenger ID circuit 116.FP, rear left passenger ID circuit 116.RLP, and/or rear fight passenger ID circuit 116.RRP, respectively.

Step 3386 includes an ID sense circuit, such as sensor circuit 116 of a given occupancy area, detecting an ID frequency associated with a vehicle position. For example, this includes detecting an ID frequency associated with a corresponding occupancy area, such as the driver ID frequency or a passenger ID frequency generated by a corresponding ID circuit 114. When the ID sense circuit detecting an ID frequency associated with a vehicle position, the ID sense circuit sends position ID frequency data of the vehicle position to vehicle computing entity 150 in step 3387. For example, the unique frequency of the corresponding occupancy area is indicated and/or determined based on detection of the corresponding unique frequency, such as such as $f_D$, $f_{FP}$, $f_{RLP}$, and/or $f_{RRP}$ of a driver ID circuit 116.D, front passenger ID circuit 116.FP, rear left passenger ID circuit 116.RLP, and/or rear fight passenger ID circuit 116.RRP, respectively.

Step 3388 includes the vehicle computing entity 150 receiving ID frequency data detected in steps 3384 and/or 3386, and/or the touch/hover data of the button touch detected in step 3382. Once a time out expire of step 3390 is reached, for example, based on not receiving ID frequency data for a button touch within a given temporal period after the button touch and/or hover is detected, the button touch and/or hover is determined to be invalid in step 3391, for example, where the corresponding button functionality is not performed via the vehicle computing entity 150.

When the vehicle computing entity 150 receives the receiving ID frequency data and/or the touch/hover data, the vehicle computing entity 150 determines a vehicle position of the button activation in step 3389, for example, based on the unique frequency detected due to user proximity to a corresponding ID circuit 118 generating a signal at the corresponding frequency. In step 3392, the vehicle computing entity 150 can further determine whether the vehicle position indicated in step 3387 corresponds to the button location indicated in step 3385. For example, this determination is based on the location of buttons in the vehicle and/or permissions to activate different buttons for different occupants of the vehicle as discussed previously. When the vehicle computing entity 150 can determines the vehicle position does not correspond to the button location in step 3392, the vehicle computing entity 150 does not perform the function of the activated button, and instead determines the touch and/or hover was invalid.

When the vehicle computing entity 150 determines the vehicle position corresponds to the button location in step 3392, the vehicle computing entity 150 performs the function of the activated button in step 3393. The function can be performed based on processing the touch/hover data. For example, rather than simply actuating a functionality, where a button turns this functionality on or off, the motion of the touch, distance of a hover from a corresponding electrode, a touch-based or touchless gesture, or other characteristics of the touch can induce corresponding functionality, where a given button is capable of inducing different functionality for different types of touches, hovers, and/or other interactions with the given button. Such functionality is discussed in further detail herein.

Figure 34:
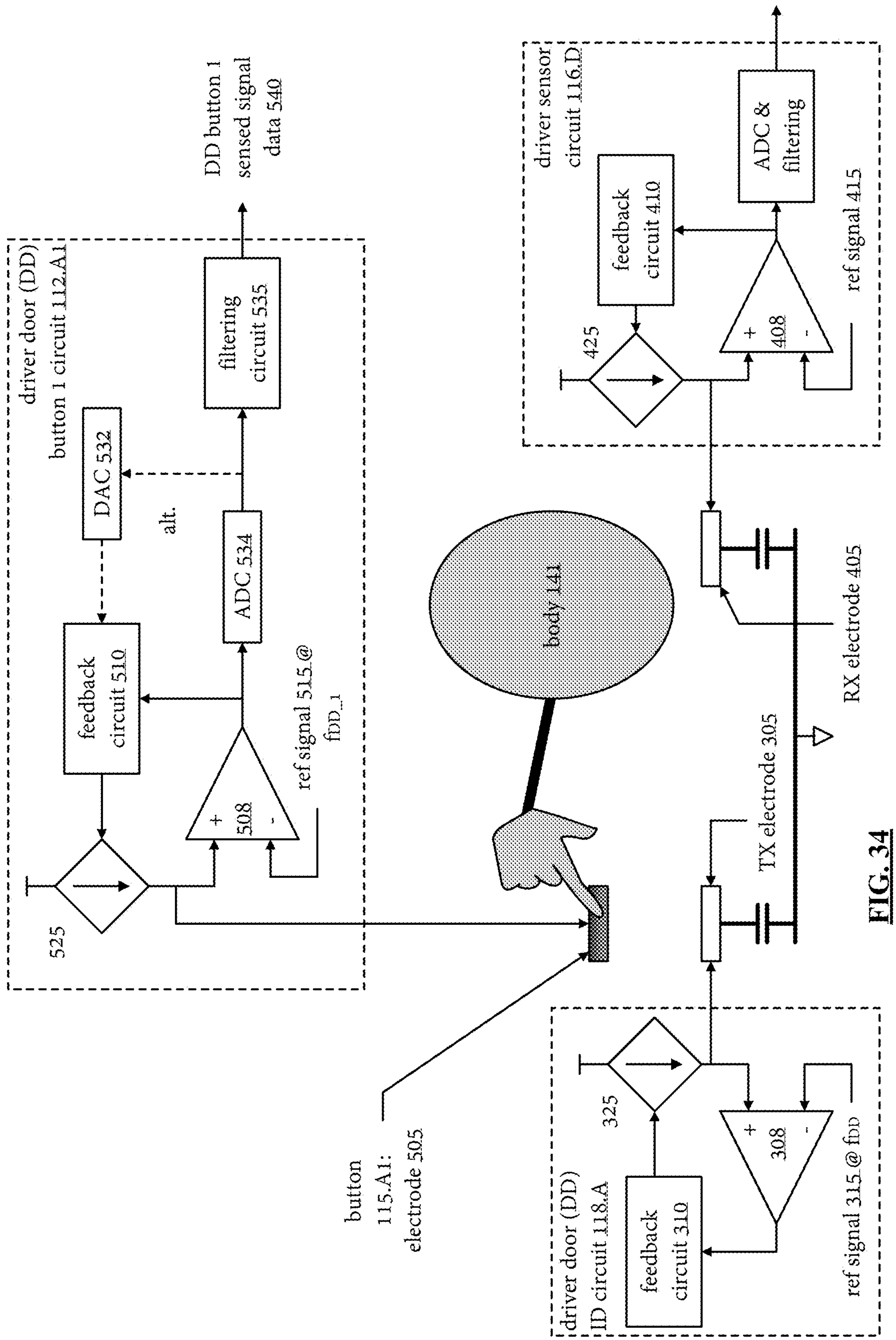
FIG. 34 is a schematic block diagram of example of detecting and verifying a touch of a driver door button in accordance with various embodiments.

FIG. 34 is a schematic block diagram of example of detecting and verifying a touch of a driver door button. The detecting and verifying a touch of a driver door button of FIG. 34 can be similar to at illustrated in FIG. 22, where a button circuit 112.A1 for a first button 1 of the driver door is implemented as a button circuit 112 of FIG. 5, for example, where a touch and/or hover is detected via interaction with a corresponding electrode implemented as, integrated within, and/or in proximity to a corresponding button 115.A1. When a user hover their hand, finger, or other body part in proximity to the electrode 505 in interacting with the button, this touch and/or hover can induce corresponding changes in impedance, capacitance, and/or other electrical characteristics of electrode 505 that are detected and indicated in sensed signal data 540 as discussed previously, to denote that the button has been activated and/or otherwise interacted with by a person. The interaction can further be verified as being by a person, and optionally be determine whether this person is in a corresponding vehicle position that has permission to interact with this button, via driver sensor circuit 116.D receiving reference signal 315 at frequency $f_{DD}$ of an ID circuit for the driver door in proximity to this driver door button as discussed previously.

Figure 35:
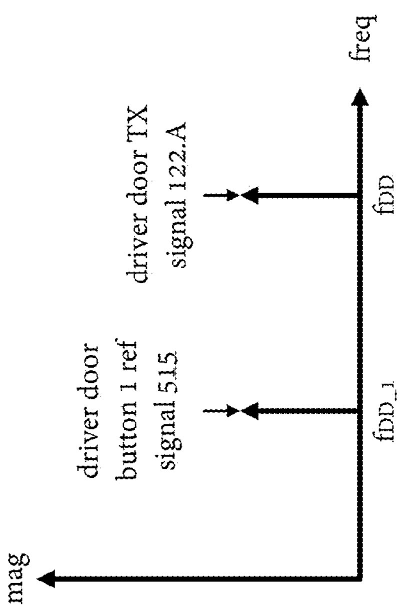
FIG. 35 is a schematic block diagram of an example of different frequencies for a driver door button reference signal and a driver drive TX signal in accordance with various embodiments.

FIG. 35 is a schematic block diagram of an example of different frequencies for a driver door button reference signal and a driver drive TX signal, for example, of the button circuit 112.A1 and the ID circuit 11 and the ID circuit 118.A of the driver door as illustrated in FIG. 34. $F_{DD}$ can be the frequency of the reference signal 315 and corresponding transmit signal 122.A of the driver door ID circuit 118.A as discussed previously, which can be different from $F_{DD\_1}$, the frequency of reference signal 515 of the driver door ID button 1 circuit 112.A1.

Figure 36:
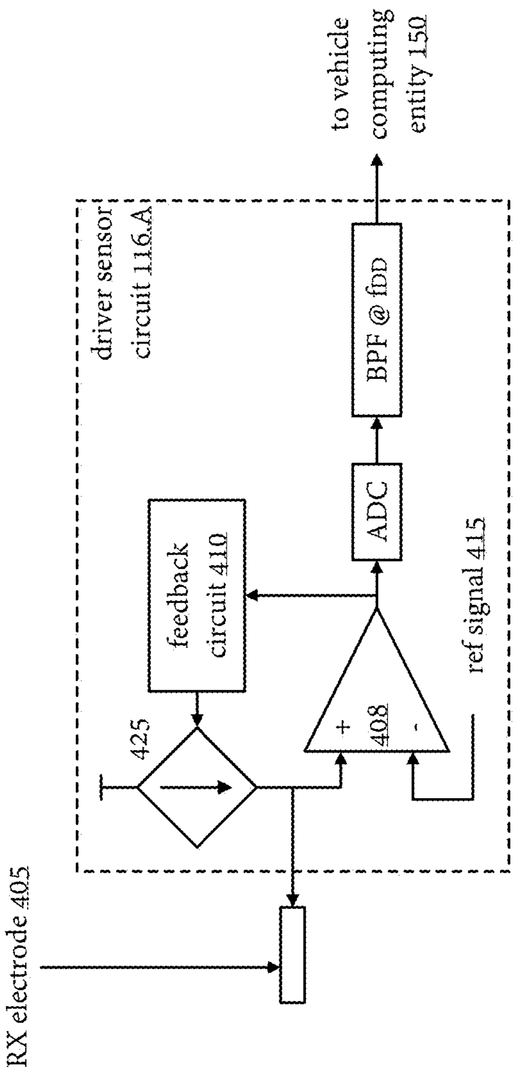
FIG. 36 is a schematic block diagram of another embodiment of a driver sensor circuit in accordance with various embodiments.

FIG. 36 is a schematic block diagram of another embodiment of a driver sensor circuit 116.A. The driver sensor circuit can have a BPF centered at the frequency $F_{DD}$ of driver door TX signal 122.A as discussed previously, for example, in addition to BPFs for other TX signals 122 for other ID circuits of other areas as discussed in conjunction with FIGS. 22-31. The driver sensor circuit 116 can detect a touch and/or hover of button 1 on the driver door and to confirm via driver door TX signal that driver is touching button 1 based on the electrode 305 ID circuit for the driver door being in proximity to button 1 of the driver door as discussed previously. Such changes in impedance self-capacitance and/or output of the BPF at $f_{DD\_1}$ can be sent to vehicle computing entity 150 to indicate whether a touch and/or hover is detected. In particular, a change in the impedance can be indicative of a touch. For example, an increase in self-capacitance (e.g., the capacitance of the electrode with respect to a reference (e.g., ground, etc.)) is indicative of a touch on the electrode.

Figure 37:
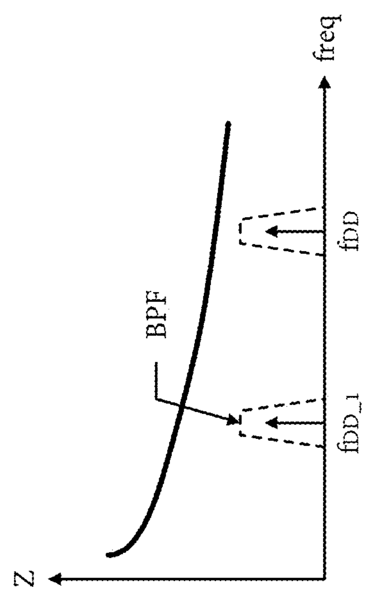
FIG. 37 is a schematic block diagram of another example of impedance change of capacitance of an electrode button versus frequency and bandpass filtering (BPF) at a reference signal and a driver drive TX signal in accordance with various embodiments.

FIG. 37 is a schematic block diagram of another example of impedance change of capacitance of an electrode button versus frequency and bandpass filtering (BPF) at a reference signal and a driver drive TX signal. In an example, the first oscillating component at $f_{DD\_1}$ is used to measure the impedance of self-capacitance (e.g. the magnitude).

Figure 38:
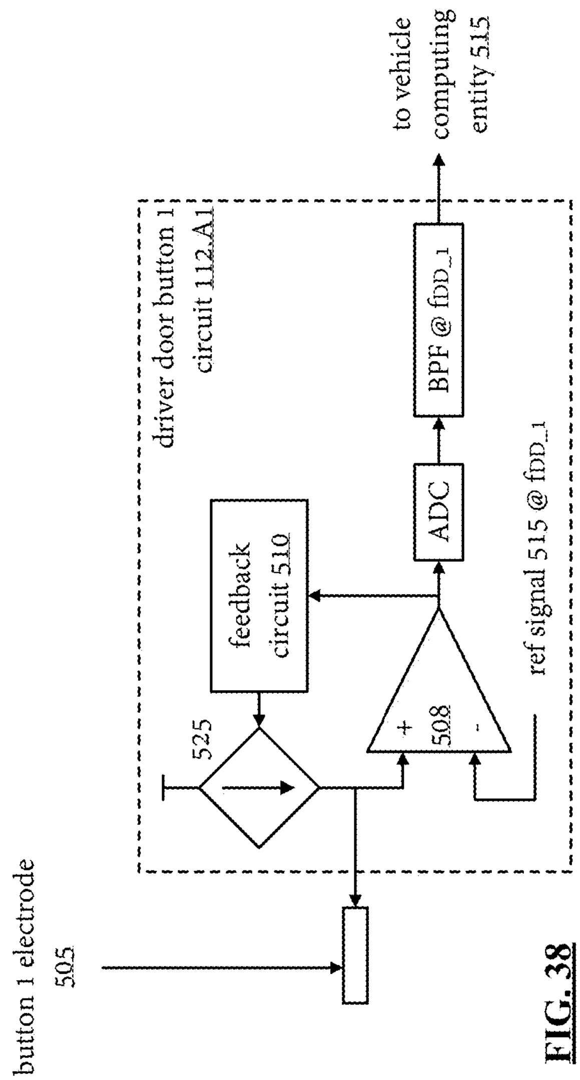
FIG. 38 is a schematic block diagram of another embodiment of a driver door button circuit in accordance with various embodiments.

FIG. 38 is a schematic block diagram of another embodiment of a driver door button circuit 112.A1. The button circuit 112.A1 can include a BPF centered at frequency $f_{DD\_1}$ of its reference signal 515, for example, to enable detection of self-capacitance of the electrode 505 of the corresponding button 115.1. Changes in self-capacitance indicate interaction with the corresponding button, for example, induced by a person hovering over the button, touching the button, or optionally other objects such as water droplets or crumbs touching the button. One or more other buttons on the driver door can be implemented in a similar fashion, where touches to any button on the driver door are detected via such button circuits, and are confirmed via the driver sensor circuit 116.A of FIG. 36. One or more other buttons in other areas of the car, such as on the dashboard, front center console, other doors, and/or steering wheel can have their own button circuits implemented similarly, which can be confirmed via the driver sensor circuit 116.A implementing BPFs for frequencies of ID circuits at these other areas of the vehicle as discussed previously.

Figure 39:
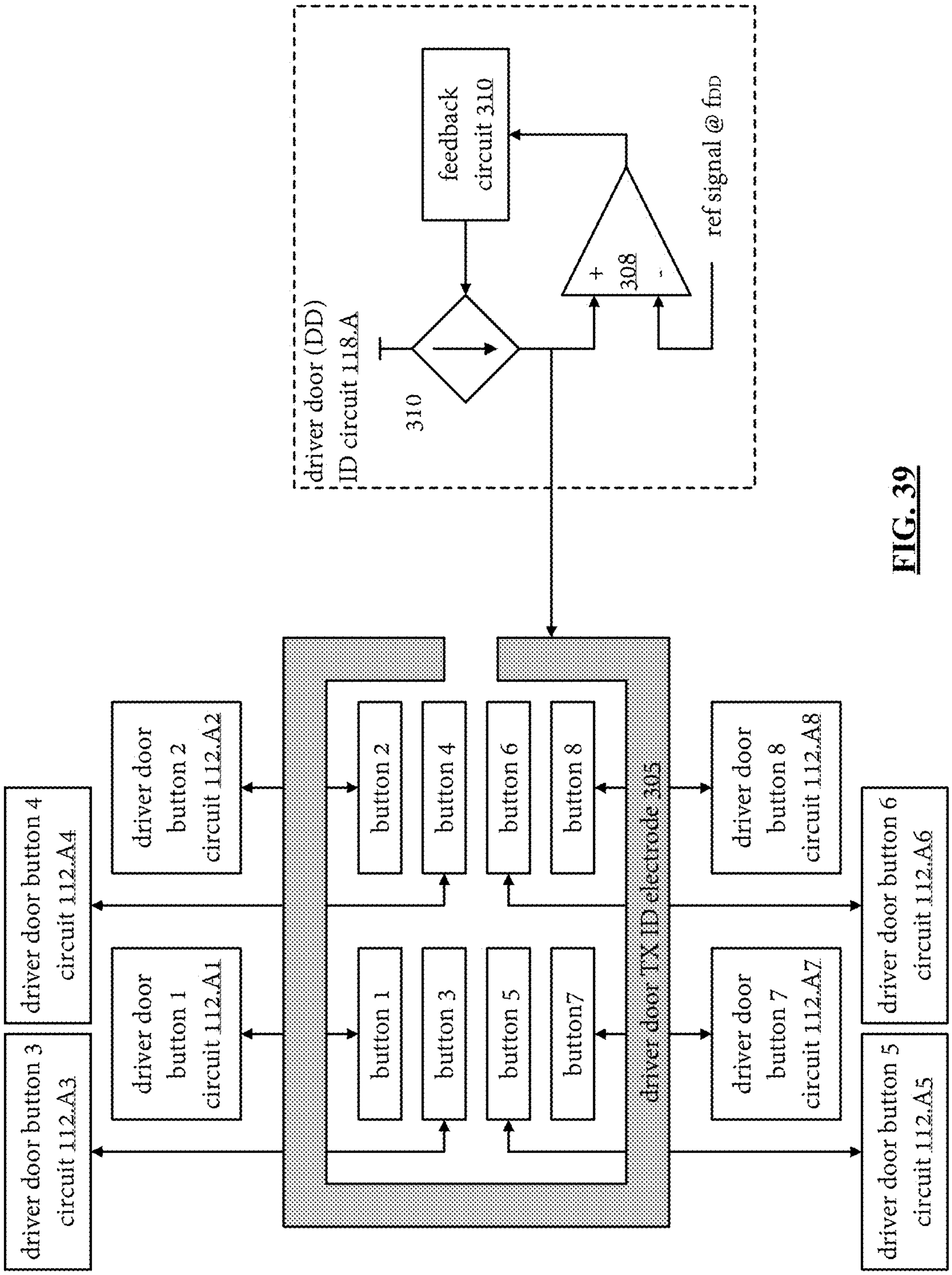
FIG. 39 is a schematic block diagram of an embodiment of a driver door ID electrode, a plurality of driver door button circuits, and a driver door ID circuit in accordance with various embodiments.

FIG. 39 is a schematic block diagram of an embodiment of a driver door ID electrode, a plurality of driver door button circuits, and a driver door ID circuit. A set of buttons 1-8 can each be implemented as switches, potentiometers, electrodes 505, and/or other button mechanisms. Each button can have a corresponding button circuit of a set of button circuits 112.A1-112.A8, where some or all button circuits are implemented as illustrated in FIG. 38, for example, having different frequencies of their respective reference signals 515. These different buttons can induce different functionality, such as locking or unlocking the door, causing a window to move up or down, engaging child locks, or other functionality.

The driver door TX ID electrode 305 of the driver door ID circuit 118.A can be in proximity to all buttons, for example, by surrounding the set of buttons in a shape as illustrated in FIG. 39 or otherwise forming a shape that is in proximity to all buttons of the corresponding vehicle portion, to thus be in proximity to a hand or finger of a user when interacting one or more of the set of buttons and thus render its TX signal 122 to be propagated through the user's body for detection via a sensor ID circuit 116 with which the corresponding user is in proximity as discussed previously.

The driver door can have any number of one or more buttons in any configuration. Other vehicle areas, such as other driver doors, the steering wheel, dashboard, front center console, rear center console, or other locations having buttons within the vehicle, can be similarly implemented as having a set of one or more buttons all being in proximity to a given electrode 305 of a corresponding ID circuit 118.

Figure 40A:
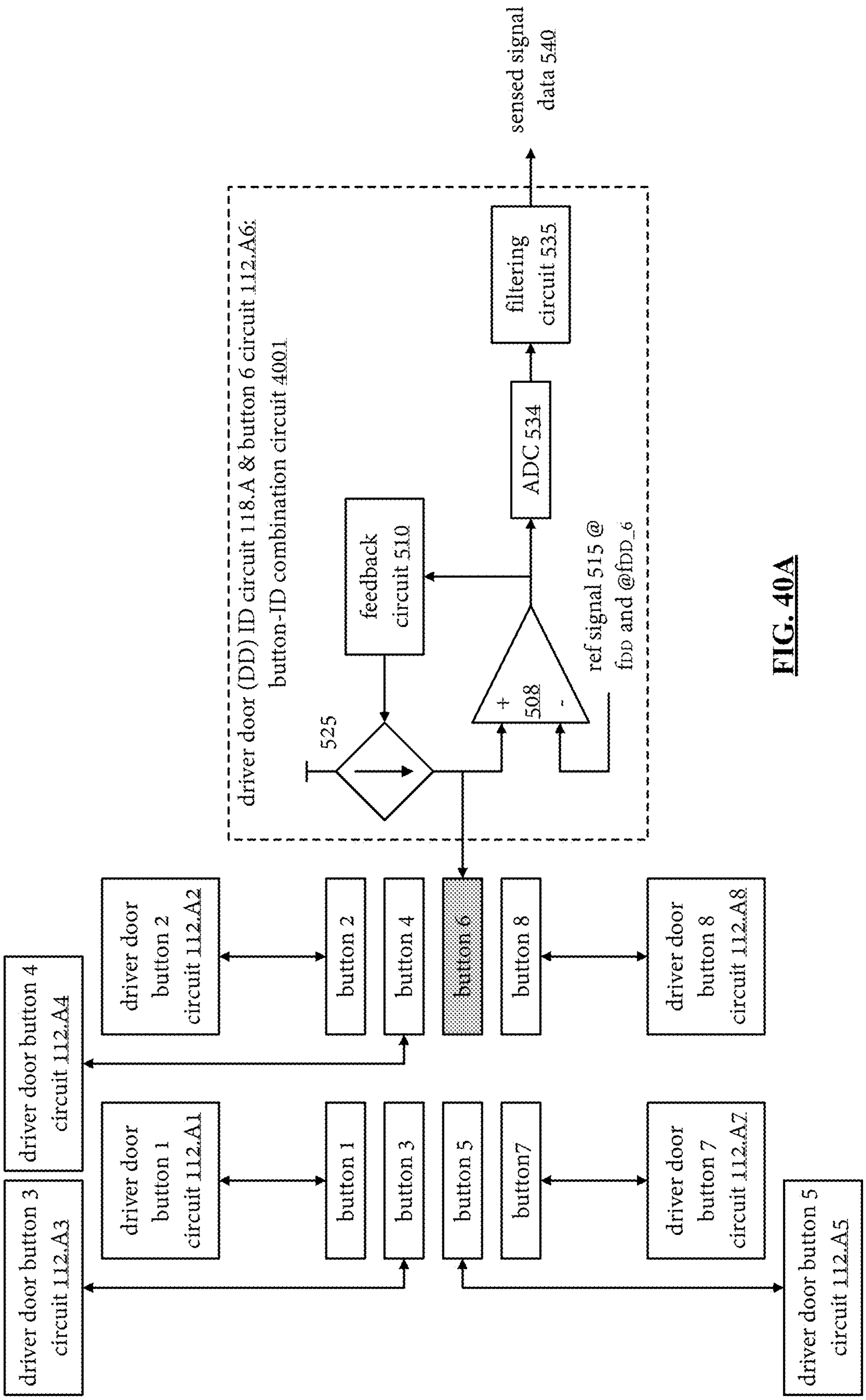
FIG. 40A is a schematic block diagram of an embodiment of a button electrode (e.g., button 6) functioning as a driver door ID electrode for a plurality of driver door button circuits, functioning as a button electrode for a driver door button circuit, and being coupled to a driver door ID & button circuit in accordance with various embodiments.

FIG. 40A is a schematic block diagram of an embodiment of a button electrode (e.g., button 6) functioning as a driver door ID electrode for a plurality of driver door button circuits, functioning as a button electrode for a driver door button circuit, and being coupled to a driver door ID & button circuit. In particular, button 6 has a reference signal having oscillating AC components at both frequency $F_{DD}$ of the corresponding TX signal 122 of the ID circuit for the driver door, as well as frequency $F_{DD\_6}$ for the corresponding button to detect mutual-capacitance when the user engages with button 6 rather than other buttons. The signal can be transmitted on the corresponding electrode 505 of button 6, which causes reference signal 515 to be transmitted as TX signal 122.A through the user's body when interacting with any of the buttons 1-8, as they are all in close physical proximity to each other on the driver door, to enable verification of the user's interaction with driver door buttons when various buttons are touched and/or hovered over by the user. The button 6 circuit can further detect changes in self-capacitance denoting hovering over button 6, rather than other buttons, to enable detection of interaction with the given button 6. Other buttons 1-5 and 7-8 can have button circuits 112 operating with oscillating components of only their own reference signal as illustrated in FIG. 38, as they are not also implemented as the ID circuit 118, and/or can be implemented as other types of buttons.

As illustrated in FIG. 40A, the driver door ID circuit 118.A and button 6 circuit 112.A6 in this example are implemented collectively via a same circuit, which can be denoted as a button-ID combination circuit 4001.

Figure 40B:
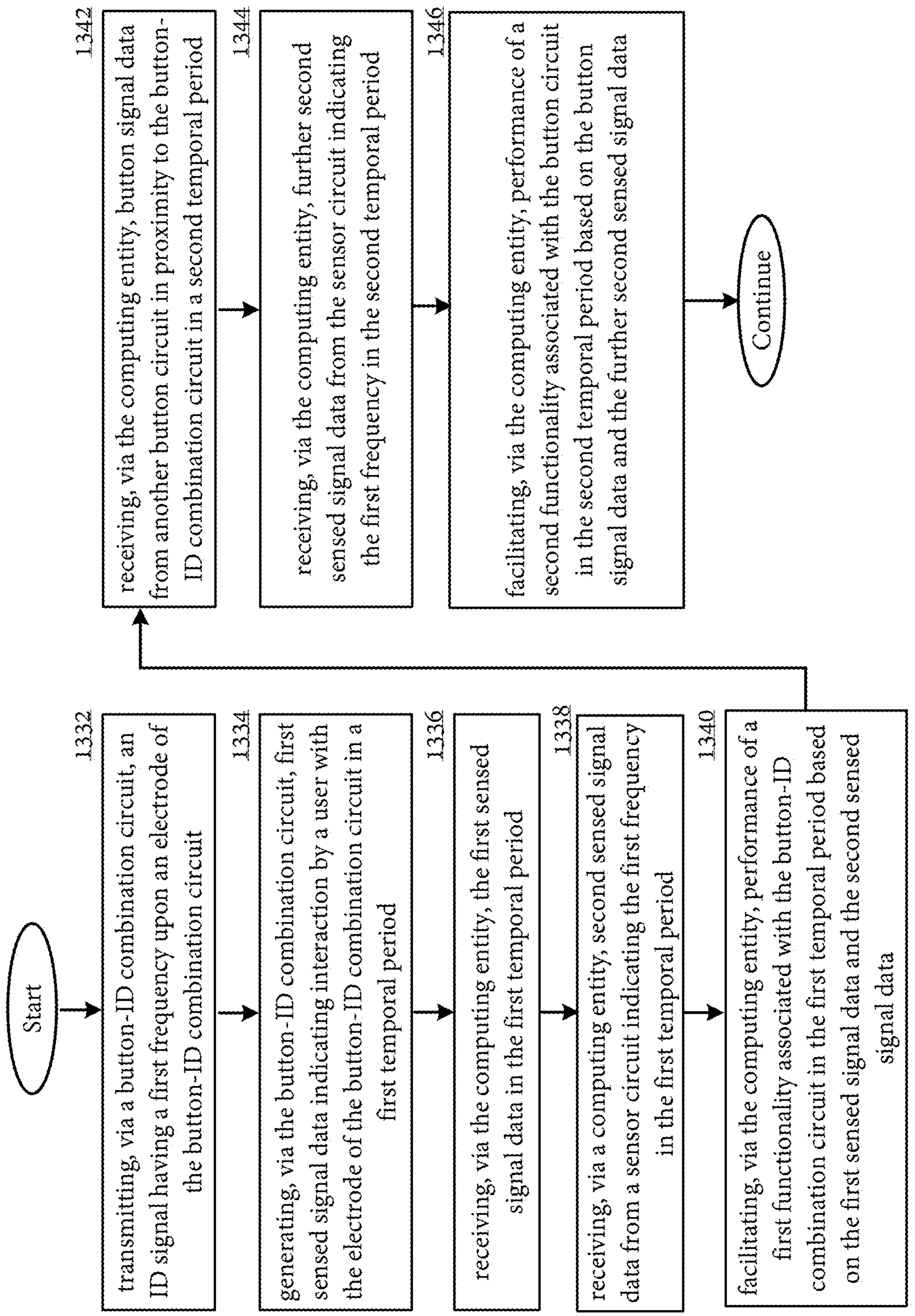
FIG. 40B is a logic diagram illustrating an example method for execution in accordance with various embodiments.

FIG. 40B is a logic diagram illustrating a method of verifying possible button interactions. Some or all of the method of FIG. 40B can be performed via a vehicle computing entity 150, a button-ID combination circuit 4001, at least one other button circuit 112, and/or at least one sensor circuit 116, for example, based on some or all functionality discussed in conjunction with one or more of FIGS. 6-13B and/or one or more of FIGS. 34-40A. Some or all of the method of 40B can be performed via any computing entity of FIGS. 2A-2D and/or any processing module, which can be associated with a corresponding vehicle, or any other system, for example, that includes one or more buttons in one or more different locations having corresponding ID circuits whose interaction is verified via a sensor circuit. Some or all of the method of 40B can be performed based on performing the method of FIG. 13B. Some or all of the method of 40B can be performed based on implementing a button configuration that is the same as and/or similar to the example of FIG. 40A, where a button-ID combination circuit 4001 is in proximity to a set of other button circuits 112.

Step 1332 includes transmitting, via a button-ID combination circuit, an ID signal having a first frequency upon an electrode of the button-ID combination circuit. Step 1334 includes generating, via the button-ID combination circuit, first sensed signal data indicating interaction by a user with the electrode of the button-ID combination circuit in a first temporal period. Step 1336 includes receiving, via the computing entity, the first sensed signal data in the first temporal period. Step 1338 includes receiving, via a computing entity, second sensed signal data from a sensor circuit, such as a sensor circuit 116, indicating the first frequency in the first temporal period. Step 1340 includes facilitating, via the computing entity, performance of a first functionality associated with the button-ID combination circuit in the first temporal period based on the first sensed signal data and the second sensed signal data. For example, steps 1334-1340 are performed by performing steps 1302-1308 of FIG. 13B in a first temporal period.

Step 1342 includes receiving, via the computing entity, button signal data from another button circuit in proximity to the button-ID combination circuit in a second temporal period. Step 1344 includes receiving, via the computing entity, further second sensed signal data from the sensor circuit indicating the first frequency in the second temporal period. Step 1346 includes facilitating, via the computing entity, performance of a second functionality associated with the button circuit in the second temporal period based on the button signal data and the further second sensed signal data. For example, steps 1342-1346 are performed by performing steps 1302-1308 of FIG. 13B in a second temporal period. The second temporal period can be strictly after and/or overlapping with the first temporal period.

In various embodiments, the second sensed signal data indicates detection of the first frequency based on: a first portion of a human body of the user being in proximity to the transmit electrode of the button-ID combination circuit based on the user interacting with the electrode of the button-ID combination circuit; and/or a second portion of the human body of the user being in proximity to the electrode of the sensor circuit. For example, the ID signal is propagated through the human body from the first portion of the human body to the second portion of the human body to cause changes in electrical characteristics of the electrode of the sensor circuit, which are detected to generate the sensed signal data.

In various embodiments, the further second sensed signal data indicates detection of the first frequency based on the same or different first portion of a human body of the user being in proximity to the transmit electrode of the button-ID combination circuit based on the user interacting with the other button circuit and based on the other button circuit being in proximity to the button-ID combination circuit; and/or the same or different second portion of the human body of the user being in proximity to the electrode of the sensor circuit. The ID signal can be propagated through the human body from the first portion of the human body to the second portion of the human body to cause changes in electrical characteristics of the electrode of the sensor circuit.

Figure 41:
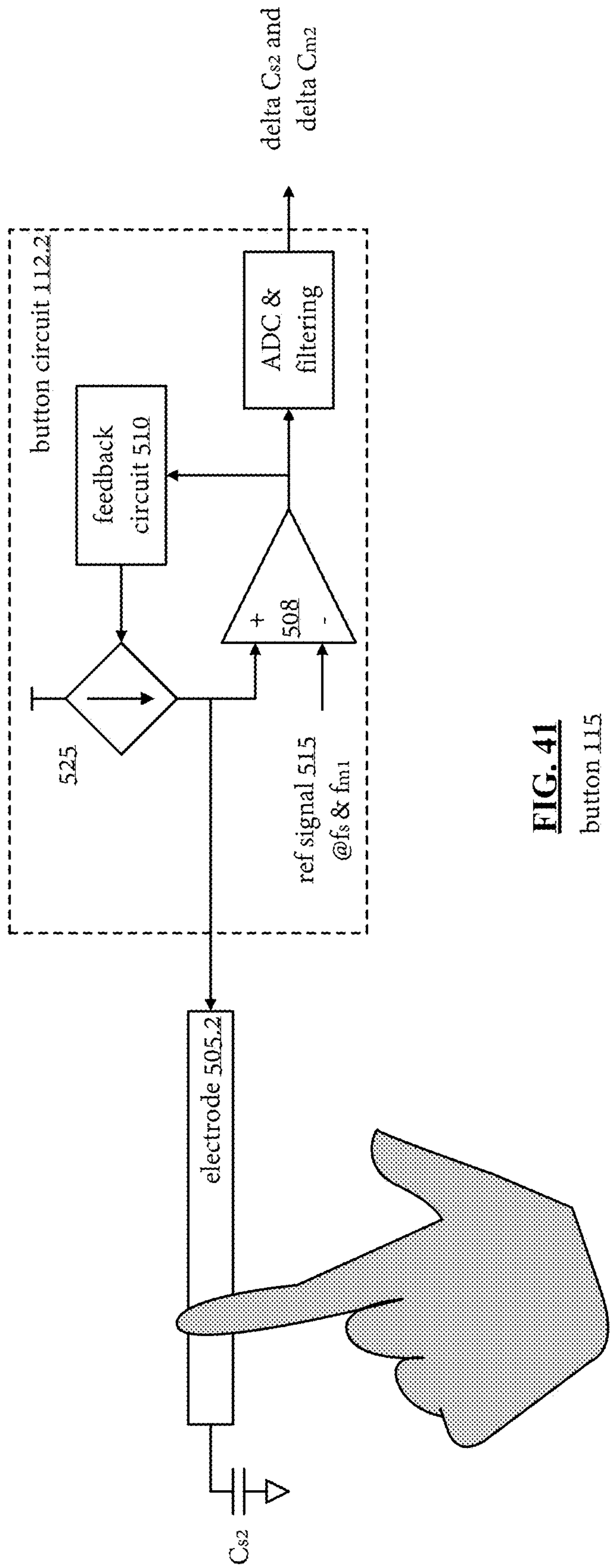
FIG. 41 is a schematic block diagram of an embodiment of a button electrode and a button circuit configured to perform a button function in accordance with various embodiments.

FIG. 41 is a schematic block diagram of an embodiment of a button electrode 505.2 and a button circuit 112.2 configured to perform a button function for a given button 115. The electrode 505.2 can have a self-capacitance $C_{s2}$. For example, the self-capacitance can correspond to a parasitic capacitance created by the electrode with respect to other conductors (e.g., ground, conductive layer(s), and/or one or more other electrodes). Electrode can include a resistance component and, as such, can produce a distributed R-C circuit. The longer the electrode, the greater the impedance of the distributed R-C circuit. For simplicity of illustration the distributed R-C circuit of an electrode is represented as a single parasitic capacitance.

The electrode 505.2 can further have a mutual-capacitance with other electrodes in the vicinity, such as other electrodes 505 of other buttons in physical proximity, one or more electrode 305 of an ID circuit in the vicinity, and/or one or more electrodes of an RX circuit 119 in the vicinity. Examples of induced mutual-capacitance with other buttons is illustrated in FIG. 42.

The reference signal 515 can have oscillating components at a first frequency $f_s$ and a second frequency $f_{m1}$. In an example, the first oscillating component $f_s$ is used to measure the impedance of self-capacitance (e.g. the magnitude), where changes in self-capacitance $C_{s2}$ are indicated in sensed signal data 540 or other output, for example, after applying an ADC and filtering circuit 535, such as a BPF centered at $f_s$. Alternatively or in addition, the second oscillating component $f_{m1}$ is used to measure the impedance of mutual-capacitance (e.g. the magnitude). Note that the second frequency $f_{m1}$ may be greater than the first frequency $f_{m2}$. In some embodiments, the DC component of the reference signal 515 can is optionally used to measure resistance of an electrode.

Figure 42:
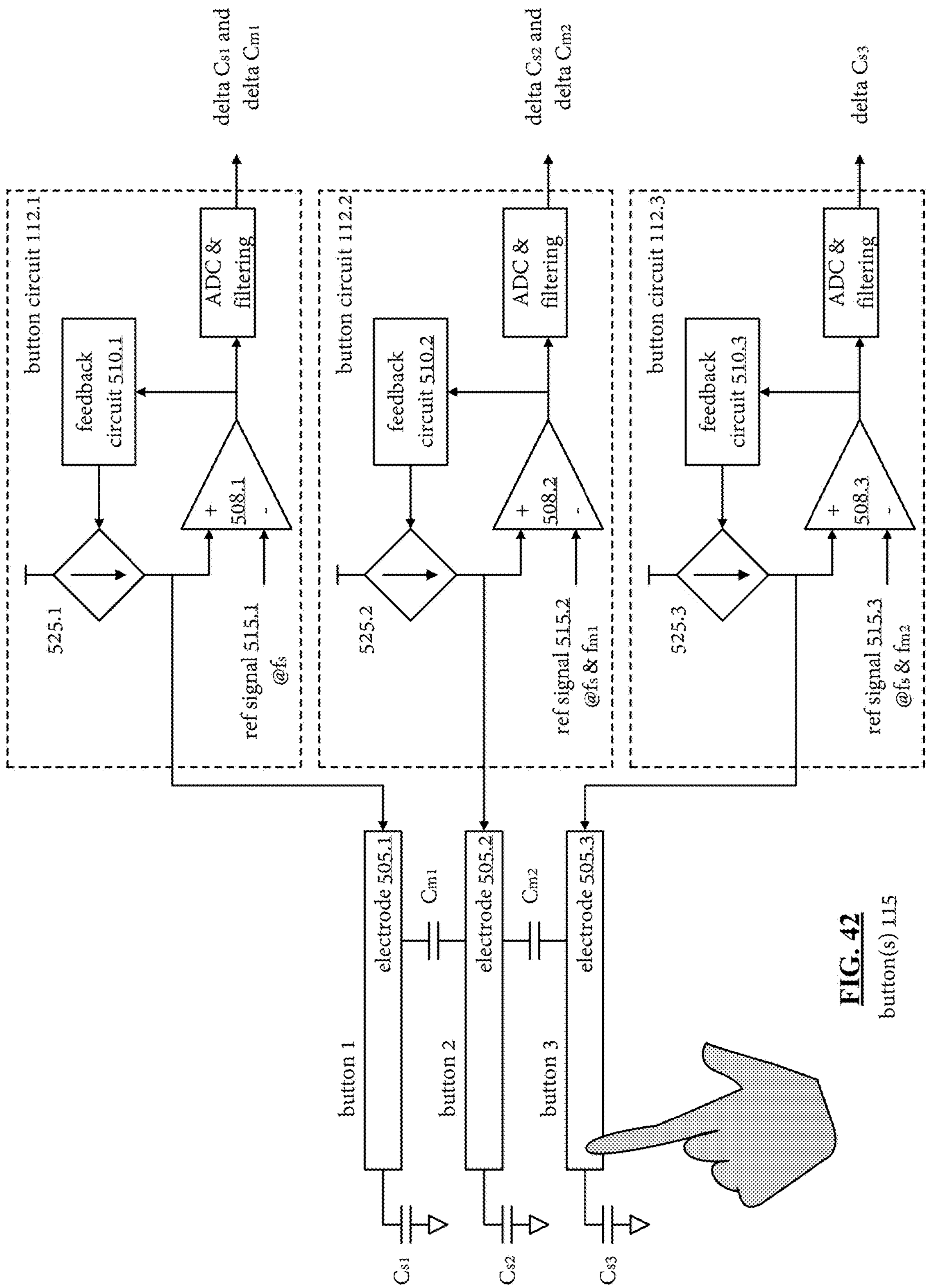
FIG. 42 is a schematic block diagram of an embodiment of a plurality of button electrodes and a plurality of button circuits performing a plurality of individual button functions in accordance with various embodiments.

FIG. 42 is a schematic block diagram of an embodiment of a plurality of button electrodes and a plurality of button circuits performing a plurality of individual button functions. For example, interaction with different buttons corresponds to different discrete selections of different functionality, such as selection of a particular radio station to be played, where different buttons correspond to different radio stations. While FIG. 42 depicts a set of three parallel electrodes, any other number of two or more of parallel electrodes can be implemented in a similar fashion to induce corresponding individually selectable functionality.

The set of electrodes 505 of a set of multiple buttons each inducing different individual functionality can be in parallel as illustrated in FIG. 42. Adjacent electrodes 505 in the set of parallel electrodes can have corresponding mutual-capacitances accordingly. Changes in self-capacitance and mutual-capacitance can be measured for different electrodes 505 of different button circuits based on corresponding frequencies of corresponding reference signals $f_s$ and $f_{m2}$, for example, via applying corresponding band pass filters as discussed previously. Changes in self and/or mutual-capacitance of a given button circuit 112 can be utilized to detect whether the corresponding button was touched and/or hover over.

Each button circuit can use the same frequency for self-capacitance (e.g., $f_s$), which can cause the different electrodes to be at the same potential, which can substantially eliminate cross-coupling between the electrodes. This can provide a shielded (i.e., low noise) self-capacitance measurement for the active button circuits 112. In this example, with the second button circuit transmitting the second frequency component $f_{m1}$, it has a second frequency component in its sensed signal, but is primarily based on the row electrode's self-capacitance with some cross coupling from other electrodes carrying signals at different frequencies. The cross coupling of signals at other frequencies injects unwanted noise into this self-capacitance measurement and hence it is referred to as unshielded. The different button circuits can utilize different frequencies for mutual-capacitance.

For example, an increase in self-capacitance (e.g., the capacitance of the electrode with respect to a reference (e.g., ground, etc.)) is indicative of a touch on the electrode. As another example, a decrease in mutual-capacitance (e.g., the capacitance between a row electrode and a column electrode) is also indicative of a touch near the electrodes. Note that the representation of the impedance is a digital value, an analog signal, an impedance value, and/or any other analog or digital way of representing a sensor's impedance.

The changes in self and mutual-capacitance can be sent to vehicle computing entity 150 for processing, for example, where the corresponding functionality is enabled when: the measured change in self-capacitance of a given button circuit meets and/or exceeds a given self-capacitance threshold and/or is otherwise processed to indicate a touch or hover is detected; the measured change in mutual-capacitance of a given button circuit meets and/or falls below a given mutual-capacitance threshold and/or is otherwise processed to indicate a touch or hover is detected; and/or the corresponding detected touch is confirmed and/or verified via sensor circuit 116 and/or RX circuit 119 as described previously.

In some embodiments, when self-capacitance and/or mutual-capacitance for multiple buttons change to indicate touches at a given time, as the different buttons correspond to different discrete selections, the vehicle computing entity determines: that a button with the greatest self-capacitance and/or greatest increase in self-capacitance across a set of adjacent buttons is selected, and that the other buttons are not selected; that a button with the lowest mutual-capacitance and/or greatest decrease in mutual-capacitance across a set of adjacent buttons is selected, and that the other buttons are not selected; and/or that one button is selected and the other adjacent buttons are not selected based on having changes and/or magnitudes of mutual-capacitance and/or self-capacitance that are most indicative of a touch and/or hover.

Figure 43A:
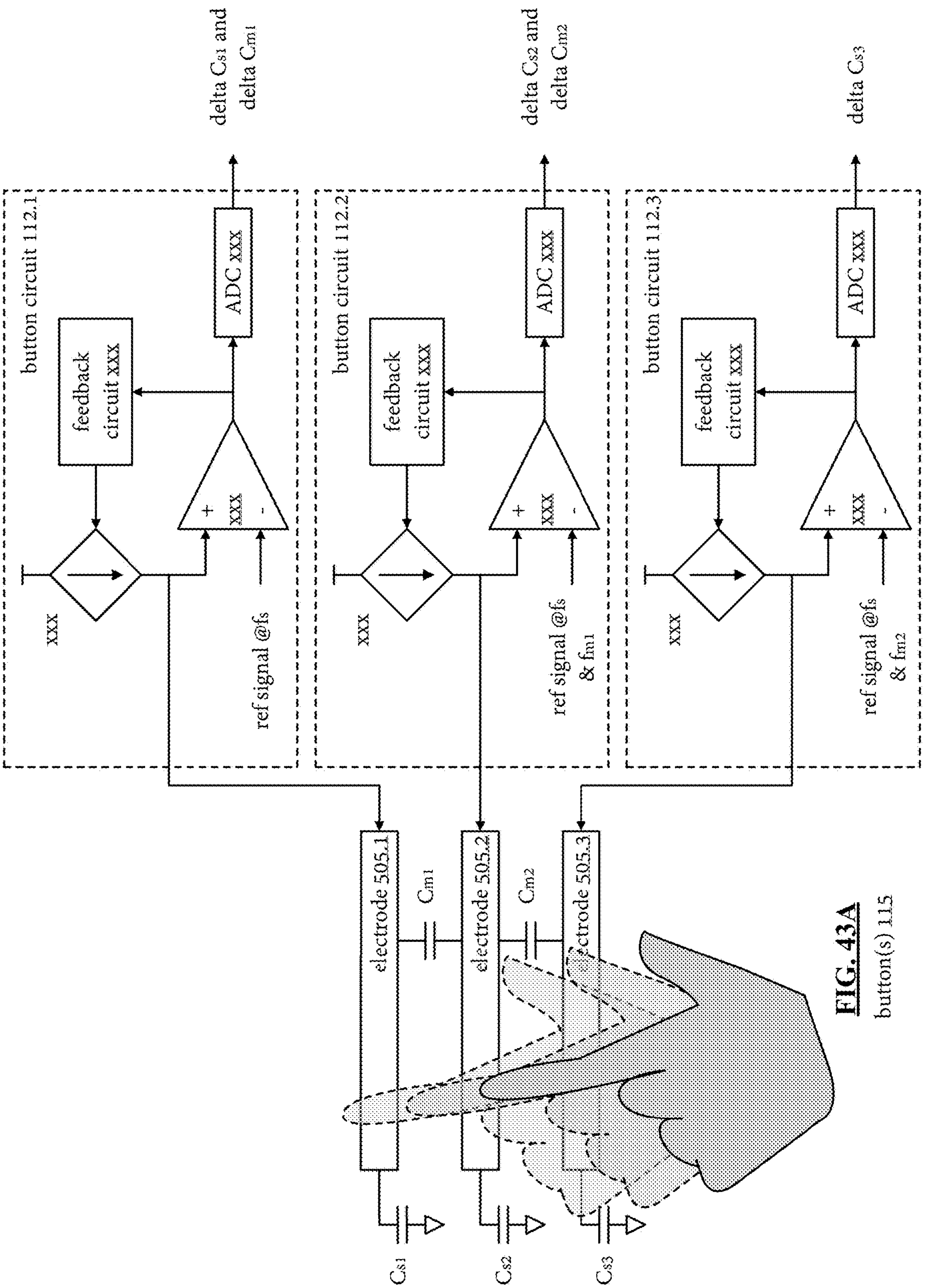
FIG. 43A is a schematic block diagram of an embodiment of the plurality of button electrodes and the plurality of button circuits of FIG. 42 perform a single button function in accordance with various embodiments.

FIG. 43A illustrates another example of a set of parallel electrodes 505 having a set of corresponding button circuits 112, for example, in a same configuration as illustrated in FIG. 42. However, alternatively or in addition to the individual button electrodes 505 being individually selectable to induce corresponding individual functionality as discussed in FIG. 42, interaction via a gesture or movement detectable across some or all of the set of electrodes 505, such as a swipe downwards as illustrated in FIG. 43A, can induce a corresponding single functionality. Thus, alternatively or in addition to a set of parallel button electrodes and corresponding button circuits being implemented to detect selection of individual functionality of different corresponding buttons, the set of parallel button electrodes can be applied in parallel to implement a single button 115 and/or to otherwise denote selection of a particular corresponding functionality corresponding to the detected gesture or movement.

In such embodiments, the user can move hand in a direction or the opposite direction, such as up or down relative to the set of electrodes, to induce corresponding functionality in either of two "directions" or in either of two configurations, such as: radio tuning to scroll through stations at higher and/or lower station frequencies, respectively; moving a window up or down, respectively, to open or close the window; turning volume up or down, configuring temperature, AC strength, and/or heating strength up or down, respectively; opening or closing a sunroof; locking or unlocking a door; playlist scrolling to scroll through an ordered set of songs in a playlist; turning windshield wipers on or off; turning a directional signal on or off in a corresponding one of the two possible directions to denote the left or right directional signal; moving and/or tilting side mirrors in respective directions; adjusting a seat in a respective direction; and/or other functionality.

The gesture or movement can be based on detecting and processing changes in self and/or mutual-capacitance across a given temporal period, for example, to determine that a finger is moving relative to different ones of the parallel electrodes, such as swiping downwards starting at electrode 505.1 and ending at electrode 505.3 within the temporal period, based on detecting which of the electrodes 505 is being touched and/or hovered over at a given time, and tracking the changes in which of the electrodes 505 is being touched and/or hovered over across the temporal period. For example, in the case of a downward swipe, the electrode 505.1 is detected to be touched and/or hovered over at a first time, the electrode 505.2 is detected to be touched and/or hovered over at a second time t2, and the electrode 505.3 is detected to be touched and/or hovered over at a third time t3. The speed of movement and/or length of a corresponding temporal period can have threshold maximums and/or minimums utilized to detect the corresponding movement and/or gesture. Repeated gestures in a given direction can be detected to denote continued scrolling, such as through possible volumes and/or radio stations.

The individual selection of a given button can be distinguished from such scrolling and/or other movement. For example, each electrode 505 can have an individual functionality when selected individually as discussed in conjunction with FIG. 42, where different functionality from any of this set of individual functionality is induced when the user is detected to swipe up or down across the electrodes 505 as discussed in conjunction with FIG. 43A. This can be ideal in reducing the number of buttons required in the vehicle, as a same button can be interacted with to induce multiple different functionality that could otherwise necessitate multiple buttons.

As a particular example, the set of parallel electrodes 505 are implemented for configuration of a radio station to be played via speakers of the vehicle. Individual selection of a given electrode, when detected, can induce selection of a corresponding pre-selected one of a set of pre-selected radio stations, where each electrode corresponds to a different one of a set of pre-selected radio stations, for example, previously configured by the user via interaction with this set of electrodes 505 and/or different electrodes and/or buttons in the vehicle. Swiping up or down across the set of electrodes induces tuning across all frequencies in a corresponding direction, including those not denoted in the pre-selected set of stations, when the user wishes to instead scan for radio stations rather than selected from the pre-selected set. Alternatively, swiping up or down across the set of electrodes induces volume control of the playing of the radio station.

As another particular example, the set of parallel electrodes 505 are implemented for configuration of windows opening or closing. Individual selection of a given electrode, when detected, can induce selection of a corresponding one of a set of windows in the vehicle, where the number of electrodes in the set of electrodes is greater than or equal to the number of windows in the car controllable by a corresponding user, where the driver can configure multiple windows via their driver door. The user can further swipe up or down, for example, starting at the selected electrode, to induce opening or closing of the corresponding door. In such cases, additional electrodes that do not correspond to any windows can optionally be implemented to enable the corresponding swipe movement to be detected past any initially selected electrode in either direction. Alternatively, after selecting the given window via a corresponding tap or click, the user scrolls across the set of electrodes, starting with any electrode, to move the corresponding window up or down accordingly. In such cases, additional electrodes optionally need not be implemented.

As another particular example, the set of parallel electrodes 505 are implemented for configuration of multiple different settings. For example, one button corresponds to selection of temperature configuration; another button corresponds to selection of volume configuration; another button corresponds to selection of window configuration; another button corresponds to selection of window configuration; another button corresponds to selection of radio station configuration; another button corresponds to playlist configuration; another button corresponds to selection of seat adjustment; another button corresponds to selection of mirror adjustment; and/or any other buttons alternatively or additionally correspond to configuration of other settings in the vehicle, for example, that can be adjusted or otherwise configured as a plurality of discrete and/or continuous settings in a range of settings. The user can first select one of the set of buttons to denote which of the set of corresponding settings they wish to configure, for example, via a tap or click denoting selection of the button from other buttons as discussed in FIG. 42. The detected touch can be processed by the vehicle computing system 150 to determine which setting is selected to be configured and/or updated. The user can then swipe up or down to adjust the setting "up" or "down" with respect to the plurality of discrete and/or continuous option in the range of options of the corresponding setting. The denoted direction of swiping, speed of swiping, length of time spent swiping, number of repeated swipes, and/or other characteristics of the swiping can be detected and processed to cause the vehicle computing system 150 to adjust the selected setting "up" or "down", for example, from its current state and/or from a default state respectively. Such embodiments of performing multiple sequential selections and/or gestures can optionally be facilitated via a hierarchical option tree as discussed in conjunction with FIG. 48A.

A predetermined timeout period from the initial selection and/or from the last detected swiping motion can optionally be enforced to denote when swiping configuration to the given setting is no longer detected and processed for the selected setting. Alternatively or in addition, selection of a new setting via an individual button can be detected to automatically change which setting is configurable via swiping.

Figure 43B:
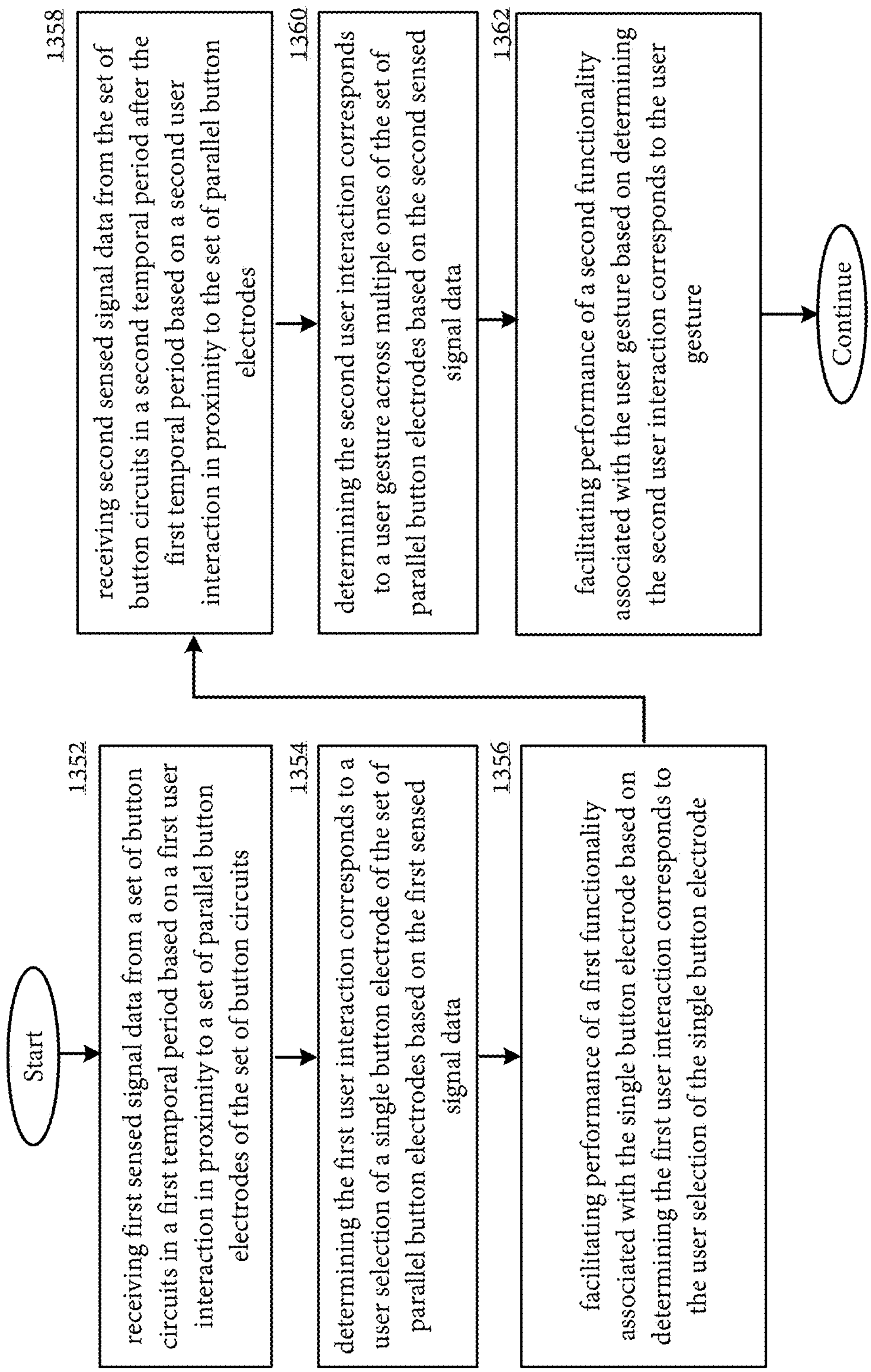
FIG. 43B is a logic diagram illustrating an example method for execution in accordance with various embodiments.

FIG. 43B is a logic diagram illustrating a method of performing functionality based on detected interactions with button electrodes of button circuits. Some or all of the method of FIG. 43B can be performed via a vehicle computing entity 150 and/or at least one button circuit 112, for example, based on some or all functionality discussed in conjunction with one or more of FIGS. 6-13A and/or FIGS. 34-43A. Some or all of the method of 43B can be performed via any computing entity of FIGS. 2A-2D and/or any processing module, which can be associated with a corresponding vehicle, or any other system, for example, that includes one or more buttons implemented via parallel electrodes. Some or all of the method of 43B can be performed based on performing the method of FIGS. 13B and/or 19B. Some or all of the method of 43B can be performed based on implementing a button configuration that is the same as and/or similar to the example of FIGS. 42 and 43A, where individual selection of individual ones of the set of parallel button electrodes is distinguished from and processed differently from swiping gestures across some or all of the parallel button electrodes.

Step 1352 includes receiving first sensed signal data from a set of button circuits in a first temporal period based on a first user interaction in proximity to a set of parallel button electrodes of the set of button circuits in the first temporal period. Step 1354 includes determining the first user interaction corresponds to a user selection of a single button electrode of a set of parallel button electrodes corresponding to the set of button circuits based on the first sensed signal data. Step 1356 includes facilitating performance of a first functionality associated with the single button electrode based on determining the first user interaction corresponds to the user selection of the single button electrode. Step 1358 includes receiving second sensed signal data from the set of button circuits in a second temporal period after the first temporal period based on a second user interaction in proximity to the set of parallel button electrodes in the second temporal period. Step 1360 includes determining the second user interaction corresponds to a user gesture across multiple ones of the set of parallel button electrodes based on the second sensed signal data. Step 1362 includes facilitating performance of a second functionality associated with the user gesture based on determining the second user interaction corresponds to the user gesture.

In various embodiments, the user gesture is performed in a first direction that is orthogonal to a lengthwise direction, such as a direction of the longest dimension, of the set of parallel button electrodes. The first direction can further be parallel with a plane that includes and/or intersects all of the set of parallel button electrodes, such as a plane that includes flat surfaces of the set of parallel electrodes.

In various embodiments, the method further includes receiving third sensed signal data from the set of button circuits in a third temporal period after the first temporal period based on a third user interaction in proximity to the set of button circuits. The method can further include determining the third user interaction corresponds to a second user gesture across multiple ones of the set of parallel button electrodes based on the third sensed signal data, wherein the second user gesture is in a second direction parallel with and opposite the direction of the user gesture. For example, the user gesture is “upward” or “rightwards” across the set of parallel electrodes, based on an orientation of the set of parallel electrodes, while the second user gesture is either “downward” or “leftwards”, respectively. The method can further include facilitating performance of a third functionality associated with the second user gesture based on determining the third user interaction corresponds to the second user gesture across the multiple ones of the set of parallel button electrodes, wherein the third functionality is different from the second functionality. The second functionality and third functionality can correspond to configuration of a directional setting, such as increase or decrease of volume, temperature, fan speed, heating intensity, etc. and/or such as up and/or down of windows, radio station frequency, etc., and/or such as left and/or right of a turn signal, seeking through a playlist, etc.

In various embodiments, the user selection is performed via a user gesture in a second direction that is orthogonal to the lengthwise direction of the set of parallel button electrodes. This second direction can be further orthogonal with the plane that includes the set of parallel button electrodes. For example, the user taps upon, click upon, and/or moves from a first point at a first distance away from an electrode in a direction orthogonal to the plane to a second point at a second distance away from the electrode in the direction orthogonal to the plane, where the second distance is closer than the first distance.

In various embodiments, the first functionality is one of a set of different functionalities corresponding to the set of different parallel button electrodes, where each different parallel button electrodes, when selected individually, induces one of the set of set of different functionalities. The second functionality can be distinct from all of this set of different functionalities. In various embodiments, the second functionality is selected from one of a set of possible second functionalities based on the user selection of the single button electrode. For example, the user selection of the single button electrode selects which setting will be configured via the user gesture.

Figure 44A:
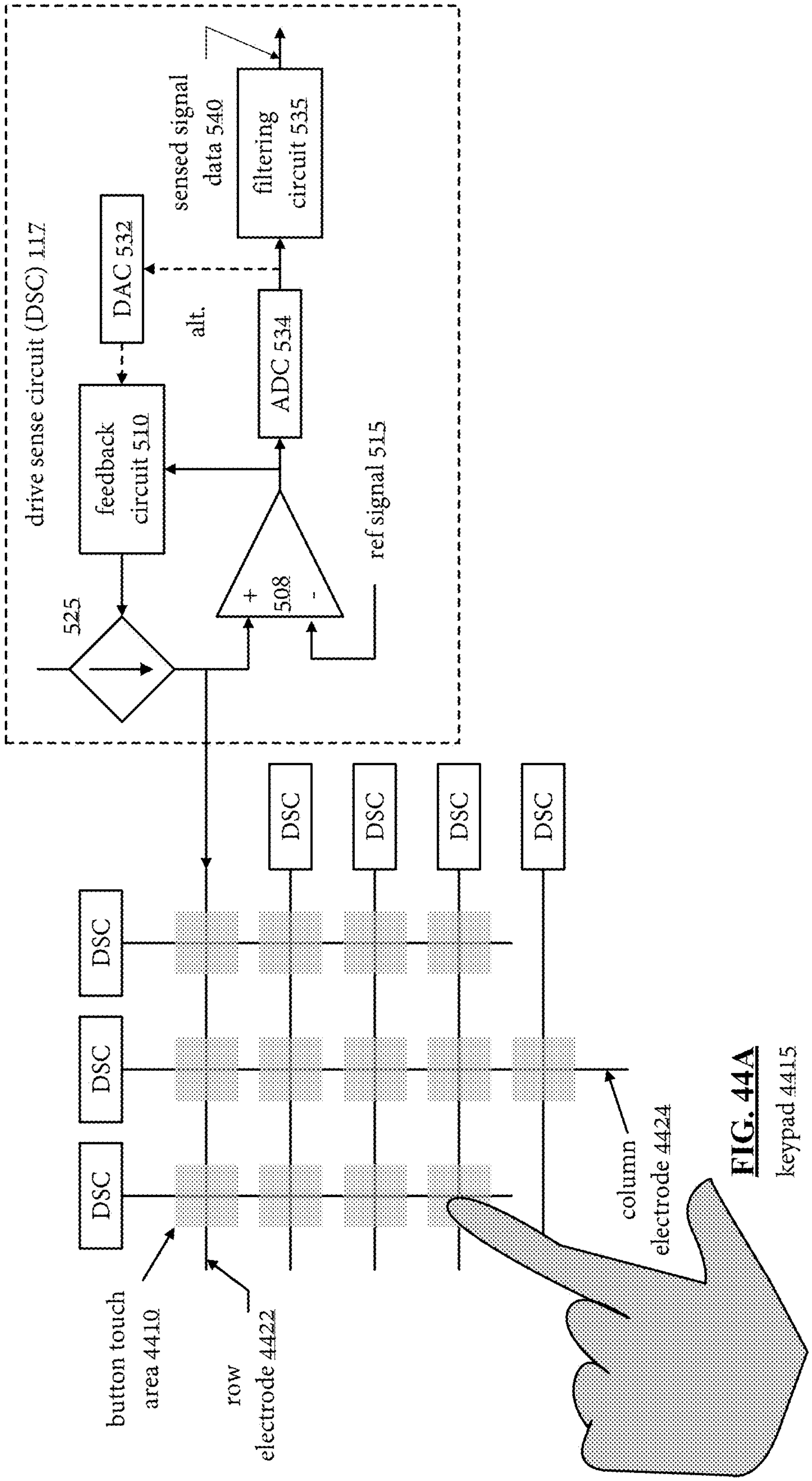
FIG. 44A is a schematic block diagram of an embodiment of a keypad in accordance with various embodiments.

FIG. 44A is a schematic block diagram of an embodiment of a keypad 4415 that includes a plurality of buttons 115 as a plurality of touch areas 4410 at a plurality intersections of a plurality of parallel row electrodes 4422 and a plurality of parallel column electrodes 4424. Each parallel row electrode 4422 and each parallel row electrode 4422 can be implemented as an electrode 505 of a button circuit 112.

Each row electrode 505 can be coupled to a drive sense circuit (DSC) 117, which can be implemented in a same or similar fashion as any embodiment of the button circuit 112 described herein. Each column electrode 505 can be coupled to a drive sense circuit (DSC) 117, which can be implemented in a same or similar fashion as any embodiment of the button circuit 112 described herein.

For example, alternatively or in addition to having a plurality of electrodes 505 in parallel in a same row as illustrated in FIGS. 42 and 43A as a plurality of row electrodes 4422, a plurality of column electrodes 4424 can further be in parallel as illustrated in FIGS. 42 and 43A, and can further be perpendicular to the plurality of row electrodes 4422 to form an array as illustrated in FIG. 44A. The plurality of row electrodes 4422 can lie on a first plane that is parallel to and offset from a second plane that includes the plurality of row electrodes 4422.

Each of the plurality of row electrodes 4422 can have a same self-capacitance. Each of the plurality of column electrodes 4424 can have a same self-capacitance, which can be the same as or different from the self-capacitance of the plurality of row electrodes 4422. Changes in self-capacitance can be induced due to touches and/or hovering by a hand or finger, which can be detected via a DSC of the corresponding row or column electrode 505.

Each row electrode 4422 can have a mutual-capacitance with some or all of the plurality of column electrodes 4424, where changes in mutual-capacitance of a given row electrode with one or more column electrodes 4424 is detectable via the DSC 117 of the given row electrode 4422. Each column electrode 4422 can thus have a mutual-capacitance with some or all of the plurality of row electrodes 4422, where changes in mutual-capacitance of a given column electrode 4424 with one or more row electrodes 4422 is similarly detectable via the DSC 117 of the given column electrode 4424.

Thus, touches to particular button touch areas 4410 can be distinguishable based on inducing corresponding changes to the mutual-capacitance between a given row and column electrode and/or based on inducing corresponding changes in self-capacitance to the given row and/or given column electrode. Individual button touch areas 4410 can therefore be implemented as their own buttons 115 as described herein, where the plurality of DSCs collectively implement one or more button circuits 112 utilized to detect touches and/or hovers over this set of buttons, where different button touch areas 4410, when touched and/or hovered over and/or when the touches and/or hovers are optionally verified as being by a user in an occupancy area allowed to interact with the button, are processed via vehicle processing system 150 to cause the vehicle processing system 150 to initiate corresponding functionality in a same or similar fashion as any other button described herein. Alternatively, the full keypad 4415 can be implemented as a single button 112, where different combinations and/or orderings of interaction with different button touch areas 4410 can be processed differently to induce corresponding functionality.

Each button touch area 4410 can be implemented as its own single graphical display, where the keypad is implemented via a plurality of different graphical displays corresponding to the plurality of intersections. Alternatively, a full graphical display, such as a touch screen, can be implemented to include all of the plurality of button touch areas 4410 at the plurality of intersections. In other embodiments, rather than implementing one or more touch screen displays, a rubber, plastic, and/or silicon pad, for example, having the tactile feel of a physical button, can be integrated over each corresponding button touch area to enable a user to feel corresponding discrete buttons. The graphical display; the rubber, plastic, and/or silicon pad; or other top surface above the electrodes; can have a corresponding icon, picture, or text displayed based on being printed, embossed, and/or digitally displayed to denote which button touch areas 4410, when selected, corresponds to which function as its own button 115.

Figure 44B:
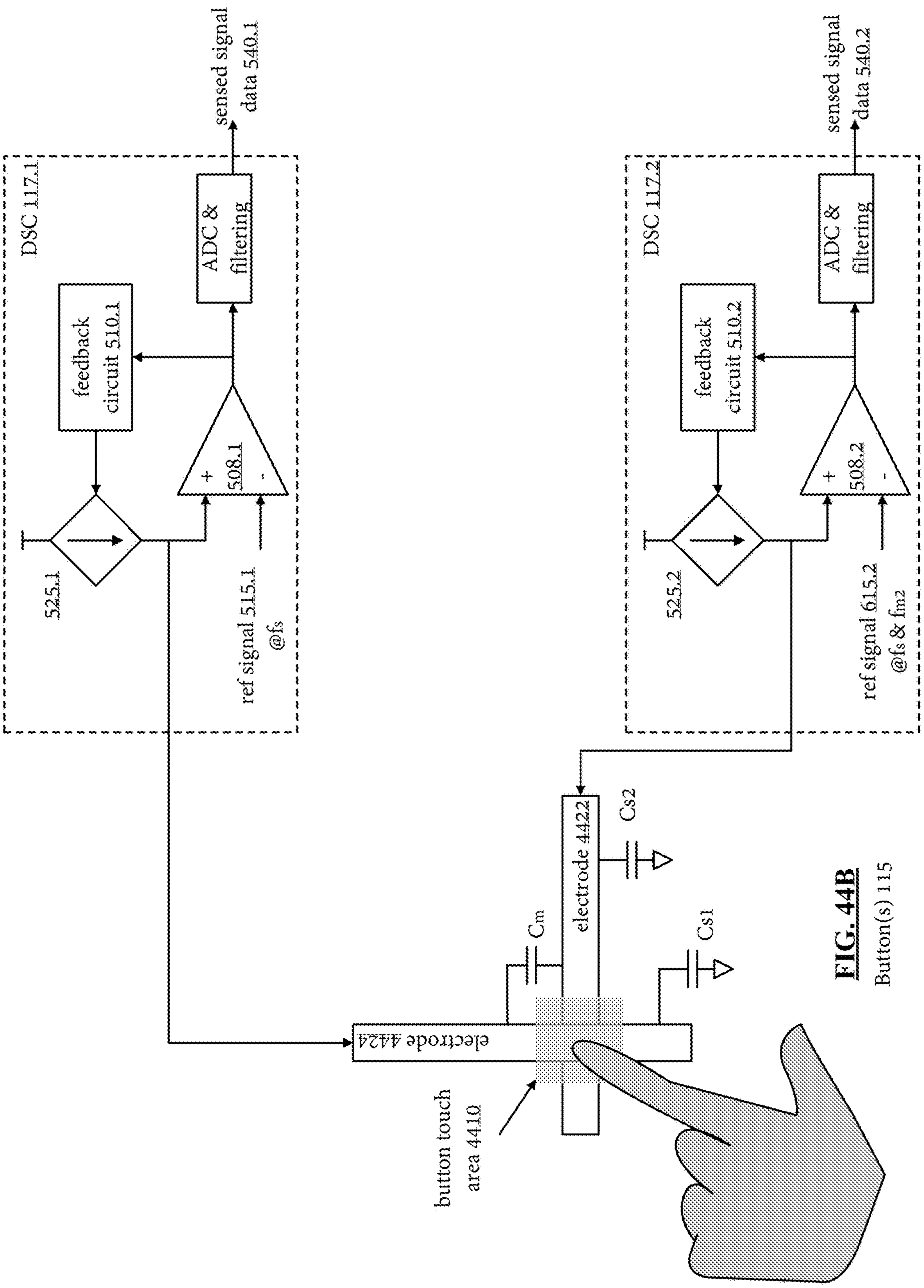
FIG. 44B is a schematic block diagram of an embodiment of a row electrode and column electrode in accordance with various embodiments.

FIG. 44B illustrates an example embodiment of detection of a touch and/or hover in proximity to a given button touch areas 4410 of a corresponding row electrode 4422 and column electrode 4424 of FIG. 44A. As an example, a first reference signal 515.1 (e.g., analog or digital) is provided to a drive sense circuit 117.1 of the given column electrode 4424, and a second reference signal 515.2 (e.g., analog or digital) is provided to the second drive sense circuit 117.2 of the given row electrode 4422. The first reference signal includes a DC component and/or an oscillating at frequency fs. The second reference signal includes a DC component and/or at least two oscillating components: the first at frequency fs and the second at frequency fm1.

The first drive sense circuit 117.1 generates a corresponding signal based on the reference signal 515.1 and provides the sensor signal to the column electrode 4424. The second drive sense circuit generates another sensor signal based on the reference signal 117.2 and provides the sensor signal to the row electrode 4422.

In response to the sensor signals being applied to the electrodes, the first drive sense circuit 117.1 generates first sensed signal data 540, which can include a component at frequency $f_s$ and a component a frequency $f_{m2}$. The component at frequency $f_s$ corresponds to the self-capacitance of the column electrode 85-*c* and the component a frequency $f_{m1}$ corresponds to the mutual-capacitance between the row and column electrodes 4422 and 4424. The self-capacitance can be expressed as 1/(2πfsCs1) and the mutual-capacitance can be expressed as 1/(2πfsCm_0), for example, when no touch and/or hover is induced by a finger.

Also, in response to the sensor signals being applied to the electrodes, the second drive sense circuit 117.2 generates a second sensed signal 540.2, which includes a component at frequency $f_s$ and a component a frequency $f_{m1}$. The component at frequency $f_s$ corresponds to a shielded self-capacitance of the row electrode 4422 and the component a frequency $f_{m1}$ corresponds to an unshielded self-capacitance of the row electrode 4422. The shielded self-capacitance of the row electrode can be expressed as 1/(2πfsCs2) and the unshielded self-capacitance of the row electrode is expressed as 1/(2πfm1Cs2), for example, when no touch and/or hover is induced by a finger.

With each active drive sense circuit of both rows and column using the same frequency for self-capacitance (e.g., $f_s$), the row and column electrodes are at the same potential, which can substantially eliminate cross-coupling between the electrodes. This can provide a shielded (i.e., low noise) self-capacitance measurement for the active drive sense circuits. In this example, with the second drive sense circuit transmitting the second frequency component, it has a second frequency component in its sensed signal, but is primarily based on the row electrode's self-capacitance with some cross coupling from other electrodes carrying signals at different frequencies. The cross coupling of signals at other frequencies injects unwanted noise into this self-capacitance measurement and hence it is referred to as unshielded.

When a finger touch or hover proximal to the electrodes is induced by a user interacting with the keypad, the self-capacitance and the mutual-capacitance of the electrodes are changed. This change can be detected via the corresponding DCSs to detect the touch and/or hover at the corresponding button touch area 4410.

For example, impedance of the self-capacitance at $f_s$ of the column electrode 4424 can be changed to include the effect of the finger capacitance. As such, the magnitude of the impedance of the self-capacitance of the column electrode equals 1/(2πfs*(Cs1+Cfinger1)), where $C_{finger1}$ denotes a capacitance to the column electrode 4424 induced by the presence of the finger, which is included the sensed signal data 540.1 to denote a change in self-capacitance caused by the corresponding finger touch. The second frequency component at fm1 corresponds to the magnitude of the impedance of the mutual-capacitance, which includes the effect of the finger capacitance. As such, the magnitude of the impedance of the mutual-capacitance can be equal to 1/(2πfm1Cm2), where $C_{m2}=(C_{m1}*C_{finger1})/(C_{m1}+C_{finger1})$.

Continuing with this example, the first frequency component at fs of the second sensed signal 540.2 can corresponds to the magnitude of the impedance of the shielded self-capacitance of the row electrode 4422 at $f_s$, which is also affected by the finger capacitance. As such, the magnitude of the impedance of the capacitance of the row electrode 85-*r* equals 1/(2πfs*(Cs2+Cfinger2)), where $C_{finger2}$ denotes a capacitance to the row electrode 4422 induced by the presence of the finger. The second frequency component at fm1 of the second sensed signal data 540.2 corresponds to the magnitude of the impedance of the unshielded self-capacitance at fm1, which includes the effect of the finger capacitance and can be equal to 1/(2πfm1*(Cs2+Cfinger2)).

The frequency component corresponding to a self-capacitance of a given row electrode 4422 can be measured via its DSC 117, for example, via corresponding BPFs at corresponding frequency $f_s$. Changes, such as increases, in magnitude of this frequency corresponding to self-capacitance can be utilized to determine the given row electrode 4422 is touched and/or hovered over. The frequency component corresponding to a mutual-capacitance with each given column electrode 4424 with which the given row intersects can be measured via a DSC 117 of the given row electrode 4422, for example, via corresponding BPFs at corresponding set of frequencies. Changes, such as decreases, in magnitude of different ones of the corresponding set of frequencies can be utilized to determine which ones of the set of button touch areas of the given row electrode are touched and/or hovered over.

Alternatively or in addition, the frequency component corresponding to a self-capacitance of a given column electrode 4424 can be measured via its DSC 117, for example, via corresponding BPFs at corresponding frequency $f_s$. Changes, such as increases, in magnitude of this frequency corresponding to self-capacitance can be utilized to determine the given row electrode 4422 is touched and/or hovered over. The frequency component corresponding to a mutual-capacitance with each given row electrode 4422 with which the given column intersects can be measured via a DSC 117 of the given column electrode 4424, for example, via corresponding BPFs at corresponding set of frequencies. Changes, such as decreases, in magnitude of different ones of the corresponding set of frequencies can be utilized to determine which ones of the set of button touch areas of the given column electrode are touched and/or hovered over.

The vehicle computing device 150 can process various sensed signal data 540 from some or all of a set of DSCs of a keypad 4415 to identify ones of the set of button touch areas 4410 where a touch and/or hover is detected, and/or to identify an ordered set of button touch areas 4410 touched within a given temporal period. Corresponding functionality can be performed accordingly.

Figure 44C:
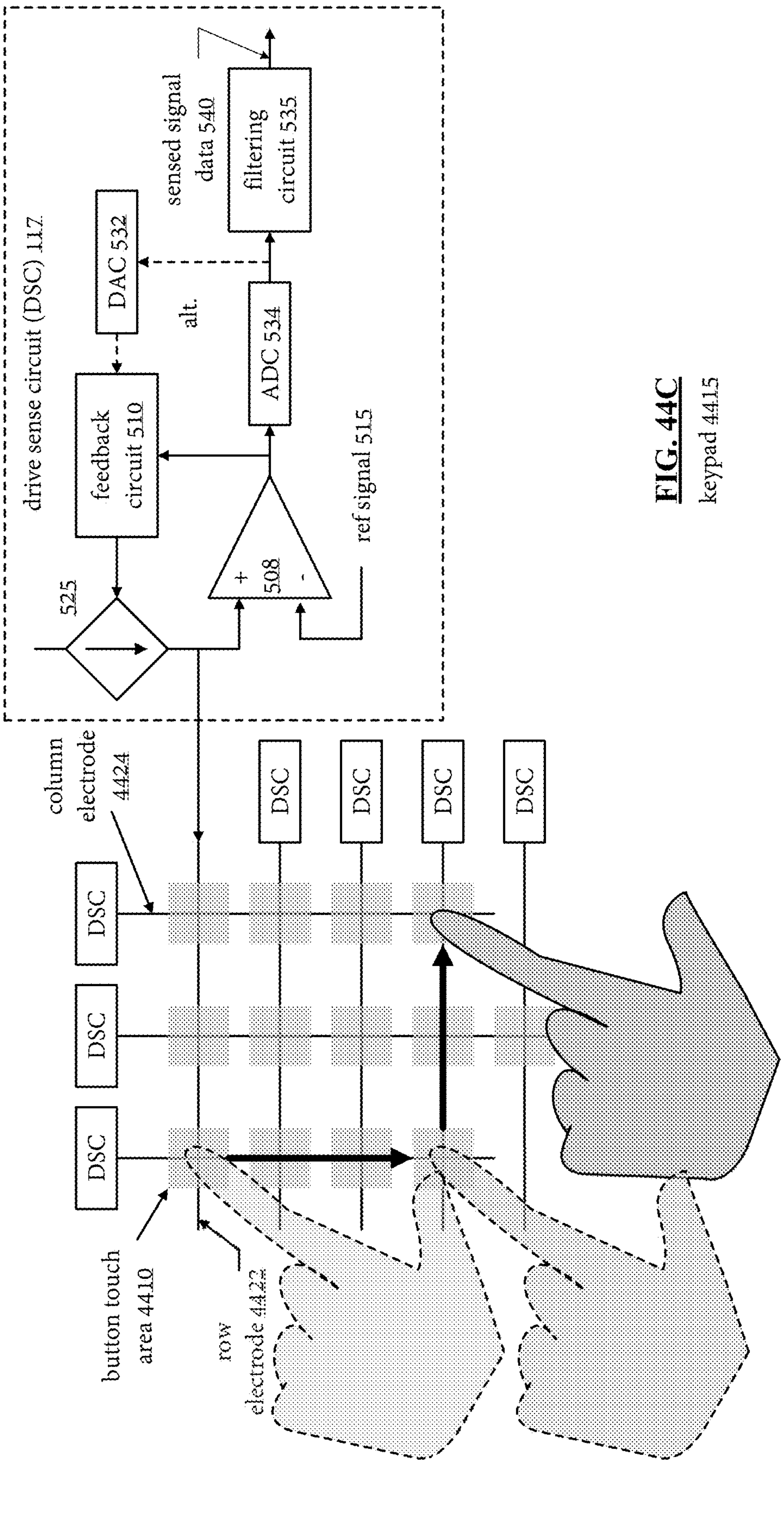
FIG. 44C is a schematic block diagram of an embodiment performance of a gesture via a keypad in accordance with various embodiments.

FIG. 44C illustrates an embodiment of set of parallel row electrodes 4422 and set of parallel column electrodes 4424 of a keypad 4415, for example, in a same configuration as illustrated in FIG. 44A. However, alternatively or in addition to the individual button touch areas 4410 being individually selectable to induce corresponding individual functionality as discussed in FIGS. 44A and 44B, interaction via a gesture or movement detectable across some or all of the set of button touch areas 4410, such as a swipe downward and then to the right in an "L" gesture as illustrated in FIG. 44C, can induce a corresponding single functionality. Thus, alternatively or in addition to a set of button touch areas 4410 being implemented to detect selection of individual functionality of different corresponding buttons of a keypad, the grid of electrodes can be applied to implement a single button 115 and/or to otherwise denote selection of a particular corresponding functionality corresponding to the detected gesture or movement in a similar fashion as discussed in conjunction with FIG. 43A. This can be favorable over a set of parallel electrodes of FIG. 43A, as a wider range of different gestures can be induced and detected separately, as detection of movement across two dimensional space rather than one-dimensional space of FIG. 43A can be leveraged to enable detection of a larger set of gestures, such as: swiping up and/or down; swiping left and/or right; swiping diagonally from corner to corner; drawing a circle; drawing a shape by intersecting some or all button touch areas 4410 in a given order, such as drawing an "L" as illustrated in FIG. 44C; and/or other gestures. In such embodiments, the keypad is optionally implemented via a smooth surface enabling a user to seamlessly perform the gesture across multiple button touch areas 4410 while continually touching the surface.

Corresponding functionality can be similar to that discussed in conjunction with FIG. 43A. For example, in some cases, a click or tap to any given button touch area 4410 is utilized to perform a corresponding given functionality of a first set of functionalities corresponding to the set of button touch areas 4410, while a gesture across multiple button touch areas 4410 denotes another corresponding functionality of a second set of functionalities corresponding to possible gestures across the set of button touch areas 4410. As another example, a, click or tap to any given button touch area 4410 is first performed to select a given setting to be configured, as the corresponding gesture following the click or tap is utilized to configure the given setting accordingly, where different types of gestures can configure the given setting accordingly. As a particular example, a button touch areas 4410 corresponding to window controls is selected, and a diagonal gesture corresponding to window selection is then performed. If the user swipes diagonally from the bottom left to top right, the front passenger window is lowered; if the user swipes diagonally from the top left to bottom right, the rear right passenger window is lowered; if the user swipes diagonally from the top right to bottom left, the rear left passenger window is lowered; and/or if the user swipes diagonally from the bottom right to top left, the driver window is lowered. As another particular example, a button touch areas 4410 corresponding to audio control is selected, and the user performs a swiping motion to configure audio control. Swiping right and left can configure seeking through items in a playlist and/or tuning the radio. Swiping up and down can configure volume at which the audio control is played. Such embodiments of performing multiple sequential selections and/or gestures can optionally be facilitated via a hierarchical option tree as discussed in conjunction with FIG. 48A.

A timeout period from the selection and/or from the last detected gesture can be enforced to denote when swiping configuration to the given setting is no longer detected and processed for the selected setting. Alternatively or in addition, selection of a new setting via an individual button touch areas 4410 can be detected to automatically change which setting is configurable via corresponding gestures.

Figure 44D:
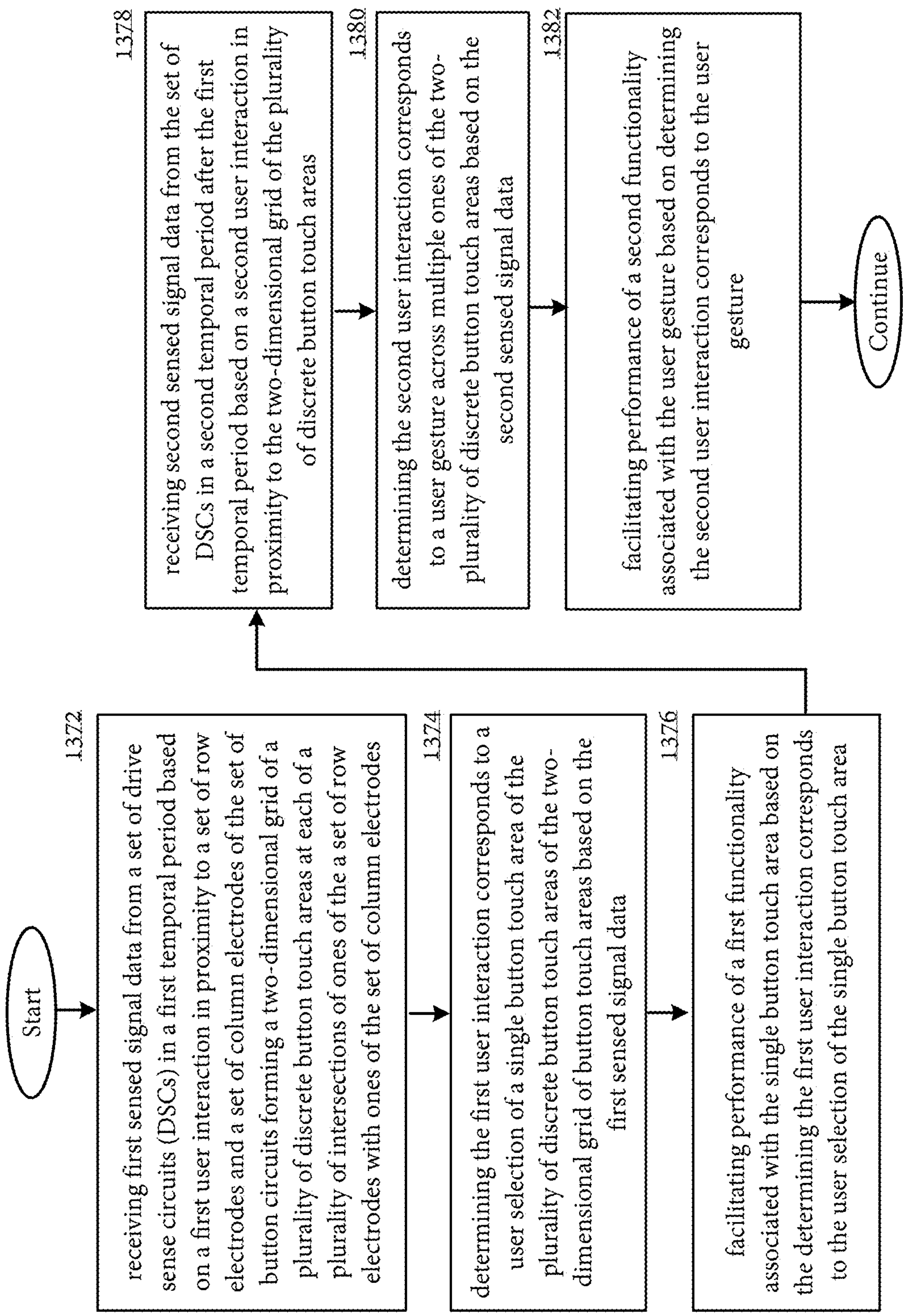
FIG. 44D is a is a logic diagram illustrating an example method for execution in accordance with various embodiments.

FIG. 44D is a schematic block diagram illustrating an example embodiment of a touch sensor device. Some or all features and/or functionality of the touch sensor device of FIG. 44D can optionally implement the implement the keypad of FIGS. 44A-44C, the set of parallel electrodes of FIGS. 42-43B, and/or the touchpad of FIGS. 46A and/or 46B.

In this embodiment, a set of second electrodes 278, which can implement the row electrodes 4422 of FIG. 44A, are perpendicular and on a different layer than a set of first electrodes 277, which can implement the column electrodes 4424 of FIG. 44A. For each cross-point of a first electrode and a second electrode, a touch sense cell 280 is created, which can implement the button touch areas 4410 of FIG. 44A. At each touch sense cell 280/cross-point, a mutual-capacitance ($C_{m\_0}$) can be created between the crossing electrodes at each cross-point.

A drive sense circuit (DSC), such as DSC 117, can be coupled to each corresponding one of the electrodes. The drive sense circuits (DSC) can transmit signals to the electrodes and generates sensed signals 120 that indicates the loading on the electrode signals of the electrodes. When no touch or touchless indication is present, each touch cell 280 will have a similar mutual-capacitance, $C_{m\_0}$. When a traditional proximal touch or touchless indication is applied on or near a touch sense cell 280 by a finger, for example, the mutual-capacitance of the cross point will decrease (creating an increased impedance). Based on these impedance changes of the various distinguishing components of sensed signals 120, the processing module can generate capacitance image data as, for example, captured frames of data that indicate the magnitude of the capacitive coupling at each of the cross-points indicative of variations in their mutual-capacitance and further can be analyzed to determine the location of touch(es), or touchless indication(s), for example, as selections of individual button touch areas or gestures across multiple button touch areas.

Figure 44E:
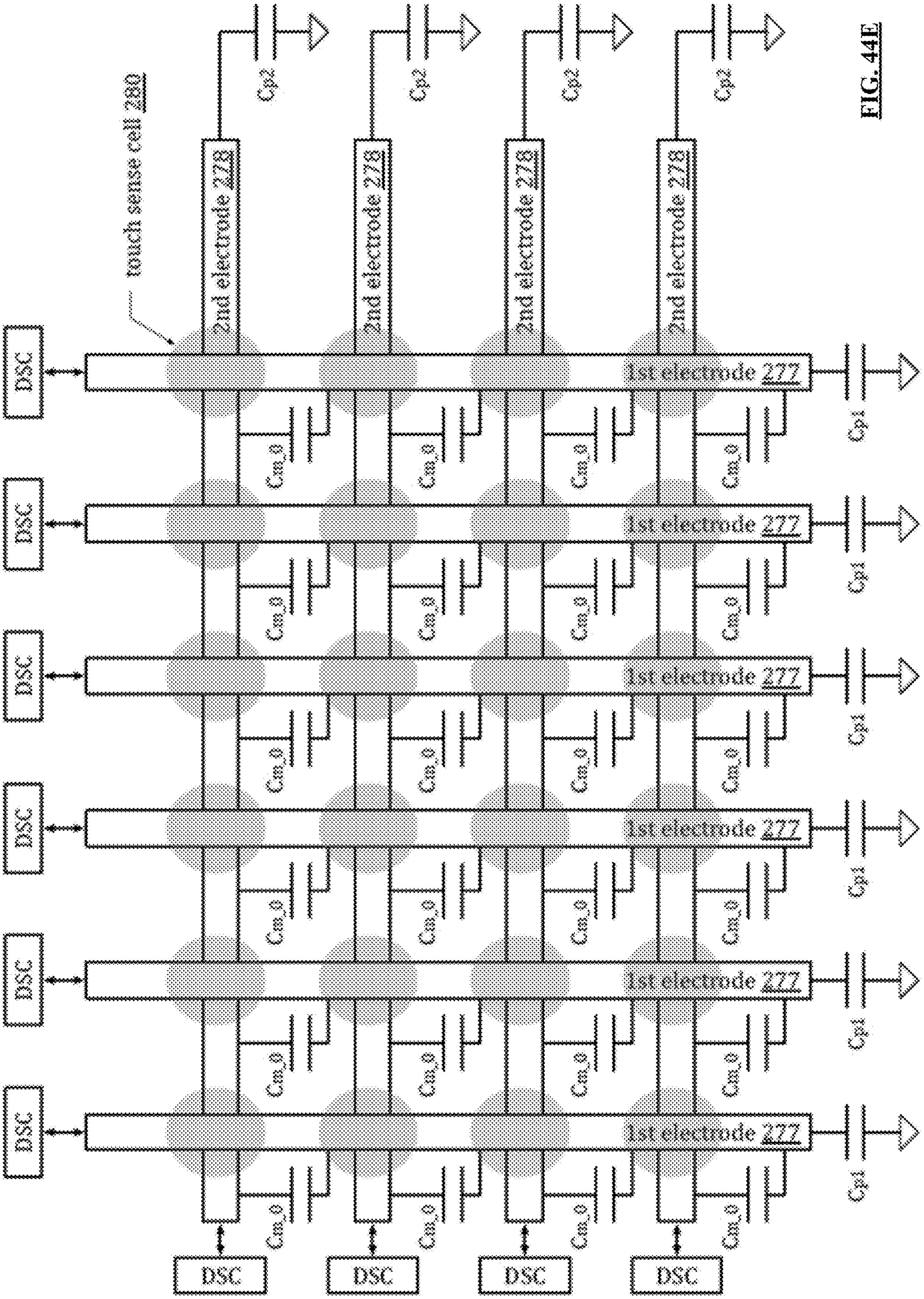
FIG. 44E is a schematic block diagram of an embodiment of detecting touch and/or touchless indications to a touch sensor device in accordance with various embodiments.

FIG. 44E is a schematic block diagram of an embodiment of a touch sensor device in accordance with the present disclosure. Some or all features and/or functionality of the touch sensor device of FIG. 44E can optionally implement the implement the keypad of FIGS. 44A-44C, the set of parallel electrodes of FIGS. 42-43B, and/or the touchpad of FIGS. 46A and/or 46B.

This diagram shows a touch sensor device that includes electrodes 85 that are arranged in rows and columns, for example, as row electrodes 4422 column electrodes 4424. One or more processing modules is implemented to communicate and interact with the first set of DSCs 117 that couple to the row electrodes via an interface 86 and a second set of DSCs 28 that are coupled to the column electrodes via an interface 87.

With respect to signaling provided from the DSCs 117 to the respective column and row electrodes, note that mutual signaling is performed in certain examples. With respect to mutual signaling, different signals can be provided via the respective DSCs 117 that couple to the row and column electrodes. For example, a first mutual signal is provided via a first DSC 117 to a first row electrode via the interface 86, and a second mutual signal is provided via second DSC 117 to a second row electrode via the interface 86, etc. Generally speaking, different respective mutual signals are provided via different respective DSCs 117 to different respective row electrodes via the interface 86 and those different respective mutual signals are then detected via capacitive coupling into one or more of the respective column electrodes via the different respective DSCs 28 that couple to the row electrodes via the interface 87. Then, the respective DSCs 117 that couple to the column electrodes via interface 87 are implemented to detect capacitive coupling of those signals that are provided via the respective row electrodes via the interface 86 to identify the location of any interaction with the corresponding set of button touch areas, for example, of a keypad or touchpad.

From certain perspectives and generally speaking, mutual signaling can facilitate not only detection of interaction with the panel or touchscreen but can also provide disambiguation of the location of the interaction with the panel or touchscreen. In certain examples, one or more processing modules is configured to process both the signals that are transmitted, received, and simultaneously sensed, etc. in accordance with mutual signaling with respect to a panel or touchscreen display.

For example, as a user interacts with the touch sensor device, such as based on a touch or touchless indication from a finger or portion of the user's body, etc., there will be capacitive coupling of the signals that are provided via the row electrodes into the column electrodes proximally close to the cross-points of each of those row and column electrodes. Based on detection of the signal that has been transmitted via the row electrode into the column electrode, detection of touchless and/or touch-based indications is facilitated based on the capacitive coupling that is based on the user interaction with the panel or touchscreen display via, for example, via a finger or object. The one or more processing modules 42 can be configured to identify the location of the user interaction with the based on changes in the sensed signals caused by changes in mutual-capacitance at the various cross-points. In addition, note that non-user associated objects may also interact with the panel or touchscreen display, such as based on capacitive coupling between such non-user associated objects, such as water droplets with the panel or touchscreen display that also facilitate capacitive coupling between signals transmitted via a row electrode into corresponding column electrodes at a corresponding cross-points in the row, or vice versa.

Consider two respective interactions with the touch sensor device as shown by the hashed circles, then a corresponding heat map or other capacitance image data 233 showing the electrode cross-point intersection may be generated by the one or more processing modules interpreting the signals provided to it via the DSCs 117 that couple to the row and column electrodes.

Capacitance image data 233 can indicate ones of a plurality of locations in two dimensional space, corresponding to intersections of row and column electrodes projected upon a corresponding two-dimensional plane, where possible touch-based and/or touchless indications are detected. For example, the capacitance image data 233 can indicate a user or other object is touching a corresponding point on the plane, and/or hovering over the plane at a close enough distance where the hovering similarly induces changes in capacitance at these locations. In cases where the user is detected to be hovering, for example, where a user's finger hovers over the location, the capacitance image data can be considered a projection of the user's finger, or other detected object, upon a corresponding two-dimensional plane, where intersections of electrodes detecting such changes in capacitance are included upon a line that also includes the user's finger or other hovering object, and where this line is orthogonal to and/or substantially orthogonal to a corresponding two-dimensional plane and/or surface of the touch sensor device.

Known touch and/or touchless capacitance thresholds can be utilized to confirm such indications and/or distinguish such indications by users interacting with the touch sensor device from other objects, such as water droplets. The touch and/or touchless indications can further be confirmed via ID signals being detected by sensor circuits to confirm the touch was performed by a human body in a corresponding occupancy area as discussed previously.

In addition, with respect to this diagram and others herein, the one or more processing modules and DSC may be implemented in a variety of ways. In certain examples, the one or more processing modules includes a first subset of the one or more processing 42 that are in communication and operative with a first subset of the one or more DSCs (e.g., those in communication with one or more row electrodes of a touch sensor device) and a second subset of the one or more processing modules that are in communication and operative with a second subset of the one or more DSCs 28 (e.g., those in communication with column electrodes of a touch sensor device).

In even other examples, the one or more processing modules includes a first subset of the one or more processing modules that are in communication and operative with a first subset of one or more DSCs (e.g., those in communication with one or more row and/or column electrodes) and a second subset of the one or more processing modules that are in communication and operative with a second subset of one or more DSCs (e.g., those in communication with electrodes of another device entirely, such as another touch sensor device, an e-pen, etc.).

In yet other examples, the first subset of the one or more processing modules, a first subset of one or more DSCs, and a first subset of one or more electrodes 85 are implemented within or associated with a first device, and the second subset of the one or more processing modules, a second subset of one or more DSCs 28, and a second subset of one or more electrodes 85 are implemented within or associated with a second device. The different respective devices (e.g., first and second) may be similar type devices or different devices. For example, they may both be devices that include touch sensors (e.g., without display functionality). For example, they may both be devices that include touch-screens (e.g., with display functionality). For example, the first device may be a device that include touch sensors (e.g., with or without display functionality), and the second device is an e-pen device.

In an example of operation and implementation, with respect to the first subset of the one or more processing modules that are in communication and operative with a first subset of one or more DSCs, a signal #1 is coupled from a first electrode 85 that is in communication to a first DSC of the first subset of one or more DSCs that is in communication and operative with the first subset of the one or more processing modules to a second electrode 85 that is in communication to a first DSC of the second subset of one or more DSCs that is in communication and operative with the second subset of the one or more processing modules.

When more than one DSC is included within the first subset of one or more DSCs, the signal #1 may also be coupled from the first electrode 85 that is in communication to a first DSC of the first subset of one or more DSCs that is in communication and operative with the first subset of the one or more processing modules to a third electrode 85 that is in communication to a second DSC of the second subset of one or more DSCs 28 that is in communication and operative with the second subset of the one or more processing modules 42.

Generally speaking, signals may be coupled between one or more electrodes 85 that are in communication and operative with the first subset of the one or more DSCs associated with the first subset of the one or more processing modules and the one or more electrodes 85 that are in communication and operative with the second subset of the one or more DSCs (e.g., signal #1, signal #2). In certain examples, such signals are coupled from one electrode 85 to another electrode 85.

In some examples, these two different subsets of the one or more processing modules 42 are also in communication with one another (e.g., via communication effectuated via capacitive coupling between a first subset of electrodes 85 serviced by the first subset of the one or more processing modules and a second subset of electrodes 85 serviced by the first subset of the one or more processing modules, via one or more alternative communication means such as a backplane, a bus, a wireless communication path, etc., and/or other means). In some particular examples, these two different subsets of the one or more processing modules are not in communication with one another directly other than via the signal coupling between the one or more electrodes 85 themselves.

A first group of one or more DSCs can be implemented simultaneously to drive and to sense respective one or more signals provided to a first of the one or more electrodes 85. In addition, a second group of one or more DSCs can be implemented simultaneously to drive and to sense respective one or more other signals provided to a second of the one or more electrodes 85.

For example, a first DSC is implemented simultaneously to drive and to sense a first signal via a first sensor electrode 85. A second DSC is implemented simultaneously to drive and to sense a second signal via a second sensor electrode. Note that any number of additional DSCs implemented simultaneously to drive and to sense additional signals to additional electrodes 85 as may be appropriate in certain embodiments.

Note also that the respective DSCs may be implemented in a variety of ways. For example, they may be implemented within a device that includes the one or more electrodes, as they may be implemented within a parallel set of electrodes of FIGS. 42-43B, a keypad of FIGS. 44A-44C, a touchpad and/or touchscreen of FIGS. 46A-46B, a touchscreen display of a center console, distributed among the device that includes the one or more electrodes that does not include display functionality, such as a vehicle window, door, ceiling, floor, or other portions of a vehicle. In some embodiments, a single DSC can be implemented as a button circuit 112 having a single electrode similarly able to detect whether touch and/or touchless indications by a person are performed to activate functionality of the button.

Some or all of the respective DSCs can be implemented to drive "external sensors", such as the TX electrodes 305 that are adjacent to and/or implemented as buttons described herein, where the respective ID circuit 114 and/or 118 is optionally implemented as a DSC 117. In such embodiments, some or all TX electrodes 305 described herein can implemented to simultaneously be driven as both an TX and RX sensor, where a respective DSC 117 simultaneously transmits and receives signals upon these TX electrodes 305. Alternatively or in addition, some or all of the respective DSCs can be implemented to drive external sensors, such as RX electrodes 405 and/or button electrodes 505 that are adjacent to and/or implemented as buttons described herein, where some or all respective RX circuits 119, sensor circuits 116, and/or button circuits 112 described herein are optionally implemented as DSCs 117. In such embodiments, some or all RX electrodes 405 and/or button electrodes 505 described herein can implemented to simultaneously be driven as both an TX and RX sensor, where a respective DSC 117 simultaneously transmits and receives signals upon these RX electrodes 405 and/or button electrodes 505. Examples of such external sensors are described in greater detail in conjunction with FIGS. 45B-45D.

Figure 44F:
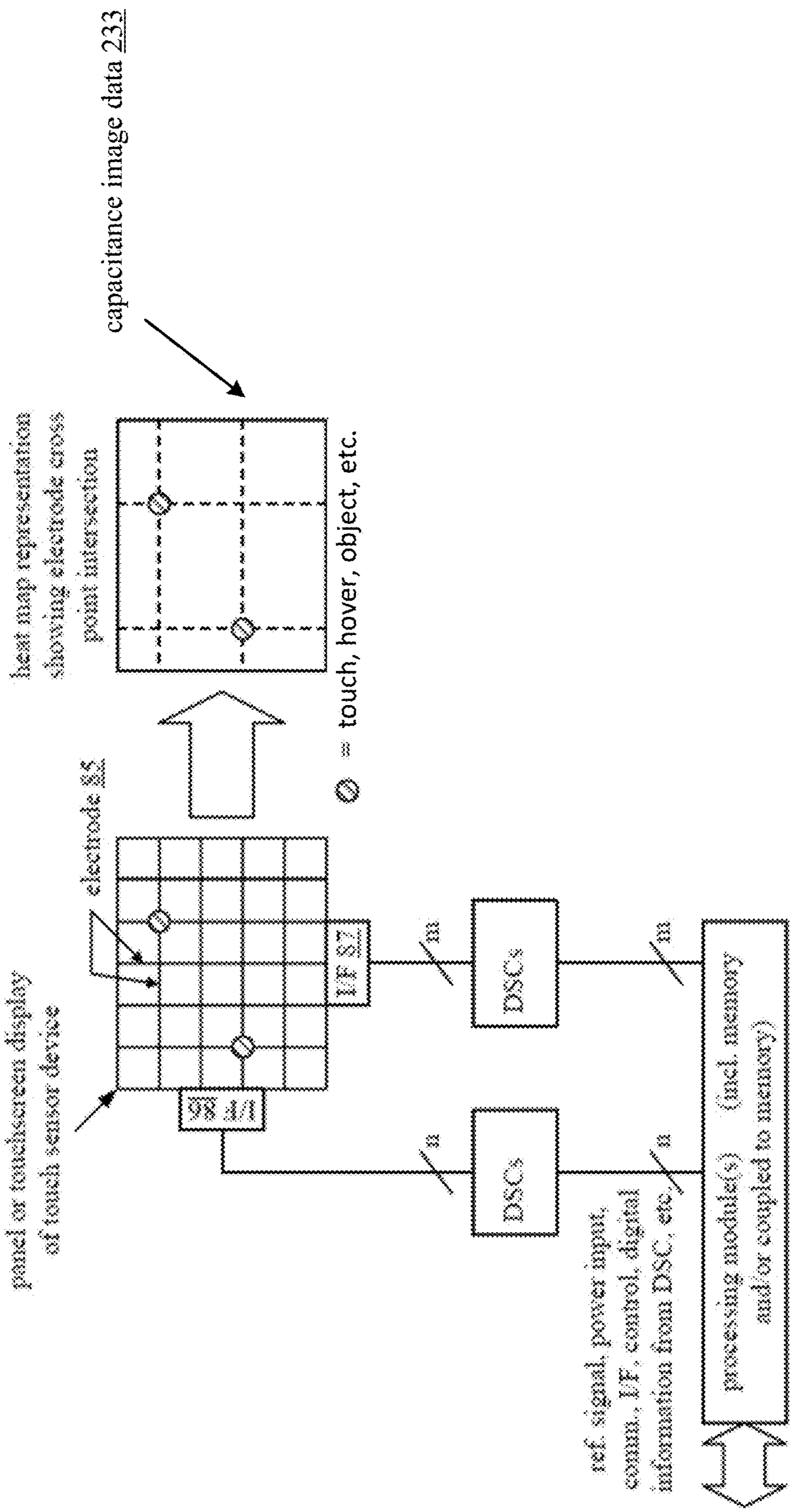
FIG. 44F is a schematic block diagram of an embodiment of detecting touch and/or touchless indications to a touch sensor device in accordance with various embodiments.

FIG. 44F is a logic diagram illustrating a method of performing functionality based on detected interactions with button touch areas formed at intersections of row and column electrodes of DSCs. Some or all of the method of FIG. 44F can be performed via a vehicle computing entity 150, and/or at least one DSC 117, for example, based on some or all functionality discussed in conjunction with one or more of FIGS. 6-13A and/or FIGS. 34-44C. Some or all of the method of 44F can be performed via any computing entity of FIGS. 2A-2D and/or any processing module, which can be associated with a corresponding vehicle, or any other system, for example, that includes one or more buttons implemented via with button touch areas formed at intersections of row and column electrodes of DSCs. Some or all of the method of 44F can be performed based on performing the method of FIGS. 13B and/or 19B. Some or all of the method of 44F can be performed based on implementing a button configuration of button touch areas that is the same as and/or similar to the example of FIGS. 44A-44C, where individual selection of individual ones of the set of button touch areas is distinguished from and processed differently from motion gestures across two or more different button touch areas.

Step 1372 includes receiving first sensed signal data from a set of drive sense circuits (DSCs) in a first temporal period based on a first user interaction in proximity to a set of row electrodes and a set of column electrodes of the set of button circuits. This set of row electrodes and a set of column electrodes forming a two-dimensional grid of a plurality of discrete button touch areas at each of a plurality of intersections of ones of the set of row electrodes with ones of the set of column electrodes.

Step 1374 includes determining the first user interaction corresponds to a user selection of a single button touch area of the plurality of discrete button touch areas of the two-dimensional grid of button touch areas based on the first sensed signal data. Step 1376 includes facilitating performance of a first functionality associated with the single button touch area based on the determining the first user interaction corresponds to the user selection of the single button touch area.

Step 1378 includes receiving second sensed signal data from the set of DSCs in a second temporal period after the first temporal period based on a second user interaction in proximity to the two-dimensional grid of the plurality of discrete button touch areas. Step 1380 includes determining the second user interaction corresponds to a user gesture across multiple ones of the two-plurality of discrete button touch areas based on the second sensed signal data. Step 1382 includes facilitating performance of a second functionality associated with the user gesture based on determining the second user interaction corresponds to the user gesture.

In various embodiments, the user gesture is performed based on moving over a proper subset of the set of button touch areas included in the two-dimensional grid of button touch areas. In various embodiments, the two-dimensional grid of button touch areas includes a plurality of parallel rows of button touch areas, where each button touch area of one of the plurality of parallel rows is included in one of a plurality of parallel columns orthogonal to the plurality of parallel rows. The proper subset can include at least two electrodes included in two different rows of the plurality of parallel rows, and can further includes at least two electrodes included in two different columns of the plurality of parallel columns.

In various embodiments, the method includes receiving third sensed signal data from the set of DSCs in a third temporal period after the first temporal period based on a third user interaction in proximity to the set of DSCs. The method can further include determining the third user interaction corresponds to a second user gesture across multiple ones of the set of parallel button touch areas based on the third sensed signal data, wherein the second user gesture is different from the user gesture. The method can further include facilitating performance of a third functionality associated with the second user gesture based on determining the third user interaction corresponds to the second user gesture across the multiple ones of the set of parallel button touch areas, where the third functionality is different from the second functionality. In various embodiments, the user gesture includes a first linear motion in a first direction parallel with a plane that includes the two-dimensional grid of button touch areas, and/or the second user gesture includes a second linear motion in a second direction parallel with the plane that includes the two-dimensional grid of button touch areas, where the first direction is orthogonal to and/or not parallel with, the second direction.

In various embodiments, the user gesture is performed in a two-dimensional motion. The two-dimensional motion can be parallel with the two-dimensional grid of button touch areas. The two-dimensional motion can include a first motion component in a first direction parallel with a plane that includes the two-dimensional grid of button touch areas and/or a second motion component in a second direction parallel with the plane that includes the two-dimensional grid of button touch areas, wherein the second direction is not parallel with the first direction. In various embodiments, the two-dimensional motion is non-linear.

In various embodiments, the user selection is performed via a user gesture in a second direction that is orthogonal to the lengthwise direction of the set of parallel button touch areas, and orthogonal with the plane that includes the two-dimensional grid of button touch areas.

In various embodiments, the first functionality is one of a set of different functionalities corresponding to the set of buttons, and the second functionality is distinct from all of the set of different functionalities. In various embodiments, the second functionality is selected from one of a set of possible second functionalities based on the user selection of the single button touch area.

Figure 45A:
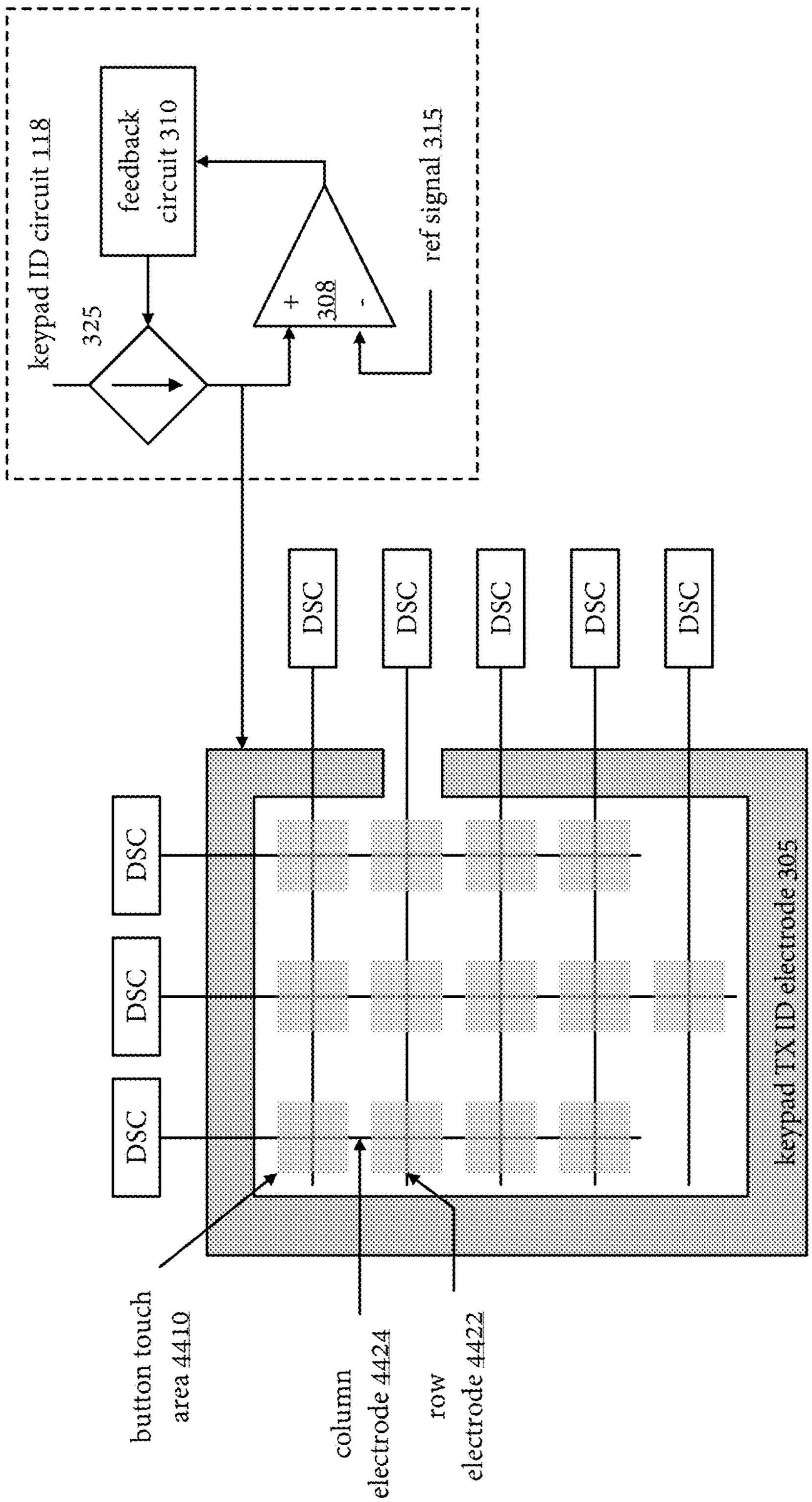
FIG. 45A is a schematic block diagram of an embodiment of a keypad, a keypad TX ID electrode, and a keypad ID circuit in accordance with various embodiments.

FIG. 45A is a schematic block diagram of an embodiment of a keypad 4415 of FIG. 44A, a keypad TX ID electrode 305, and a keypad ID circuit 118. As discussed previously, interaction with the keypad can be verified as being performed by a person rather than other inadvertent objects, and can further be verified to determine whether the user is allowed to engage with the keypad based on their position in the vehicle as discussed previously. The keypad TX ID electrode 305 can surround and/or be in proximity to all button touch areas 4410 in the configuration of FIG. 45A or another configuration such that a signal at the corresponding frequency transmitted by keypad ID circuit 118 is propagated through the user's body and detectable by a sensor circuit 116 accordingly as discussed previously. The keypad ID circuit can be implemented as the ID circuit of FIG. 3 and/or via some or all features and/or functionality of any ID circuit 118 and/or 114 described herein.

In some embodiments, the keypad TX ID electrode 305 is implemented as one or more external sensors (pads, strips, shaped patterns, etc.), which can be located in proximity to a corresponding XY grid of electrodes, can be spread apart, and/or can be not overlapping with another external sensor or XY pattern of electrodes, such as the grid of electrodes of keypad 4415.

Figure 45B:
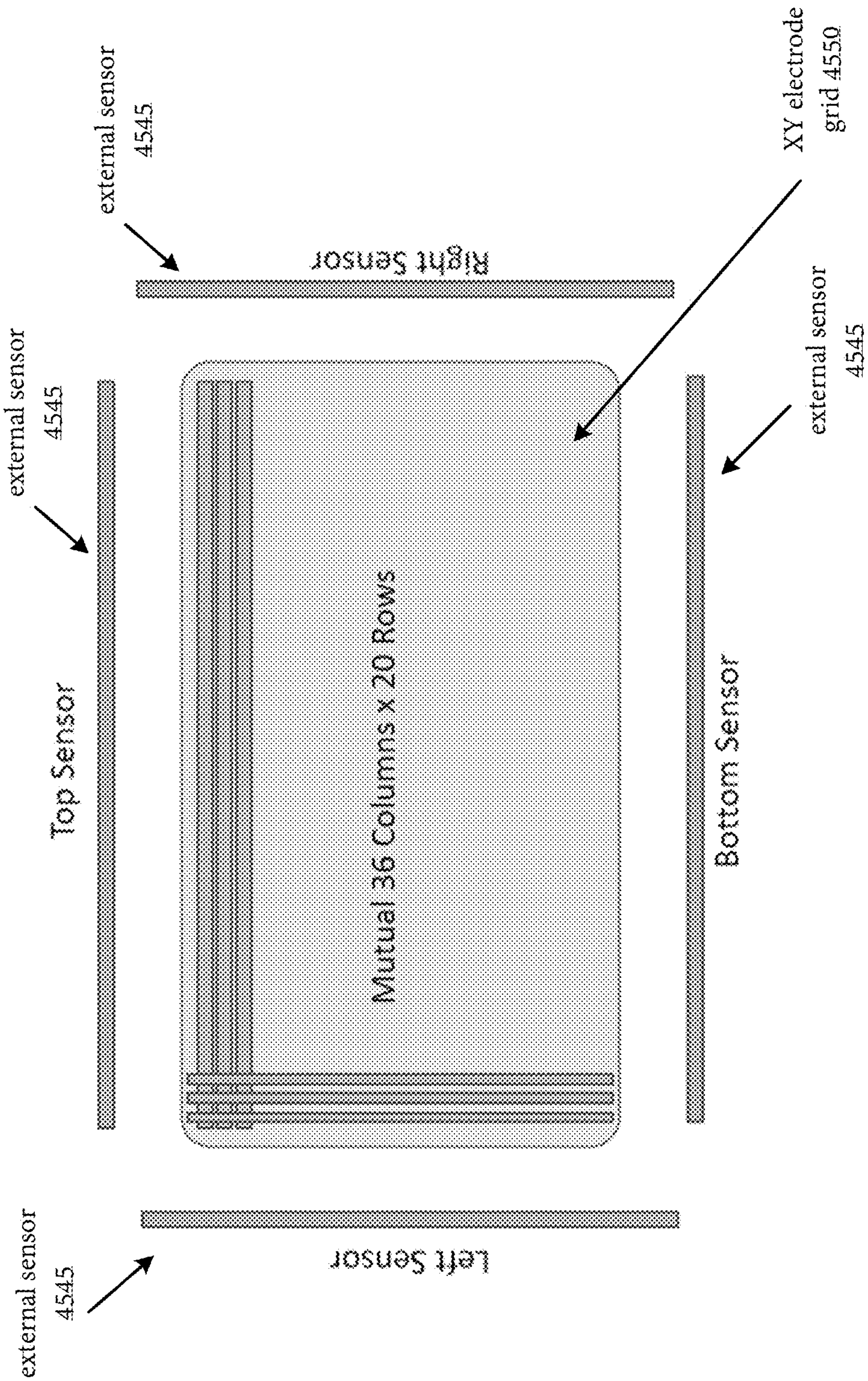
FIG. 45B is a schematic block diagram of an embodiment of external sensors in accordance with various embodiments.

FIG. 45B illustrates an example of implementing external sensors 4545 in proximity to an XY electrode grid 4550. The XY electrode grid 4550 can be implemented as the keypad 4415, a touchpad such as the touchpad of FIG. 46A, a touch screen, touch sensor panel or other grid of row electrodes 4422 and column electrodes 4424 driven by corresponding DSCs 117. Some or all features and/or functionality of external sensors 4545 can be utilized to implement one or more keypad TX ID electrodes 305 of FIG. 45B, any other TX electrode 114 and/or 118 described herein, any RX electrode 119 described herein, any button electrode 505 described herein, and/or any other electrode and/or sensor described herein. For example, the keypad TX ID electrodes 305 is implemented by multiple different external sensors 4545, such as four different external sensors 4545, surrounding the perimeter of a corresponding XY electrode grid 455. Each external sensor 4545 can optionally be parallel to row electrodes 4422 and/or column electrodes 4424 of a corresponding XY electrode grid 4550 as illustrated in the example of FIG. 45B. Each external sensor 4545 can be implemented via pads, strips, shaped patterns, other electrodes, etc.

The XY electrode grid 4550 can have TX rows with unique mutual frequencies & a common self-frequency, and/or RX columns with a common self-frequency. The set of external sensors 4545 can each be driven as both as a RX and a TX channel.

Such external sensors can be defined as a TX sensors operable to detect self & mutual capacitance, or a RX sensors operable to detect self-capacitance. A given external sensor, such as a keypad TX ID electrode 305 or other electrode 305, 405, and/or 505 described herein, can optionally be simultaneously driven as both TX and RX sensor, which can increase range of detection based on the self-signal being driven and interpreted internally on two self-channels. Using the two self-signals can help in defining which mutual touch signal is detected on a touch panel, such as keypad 4415, by a unique user. In particular, this can leverage a high rate of data capture, such as 300 frames per second, with high signal to noise ratio (SNR) and low drive signals and the capability to simultaneously transmit and receive on the same channel, allows for higher proximity detection and signal encoding and decoding.

Figure 45C:
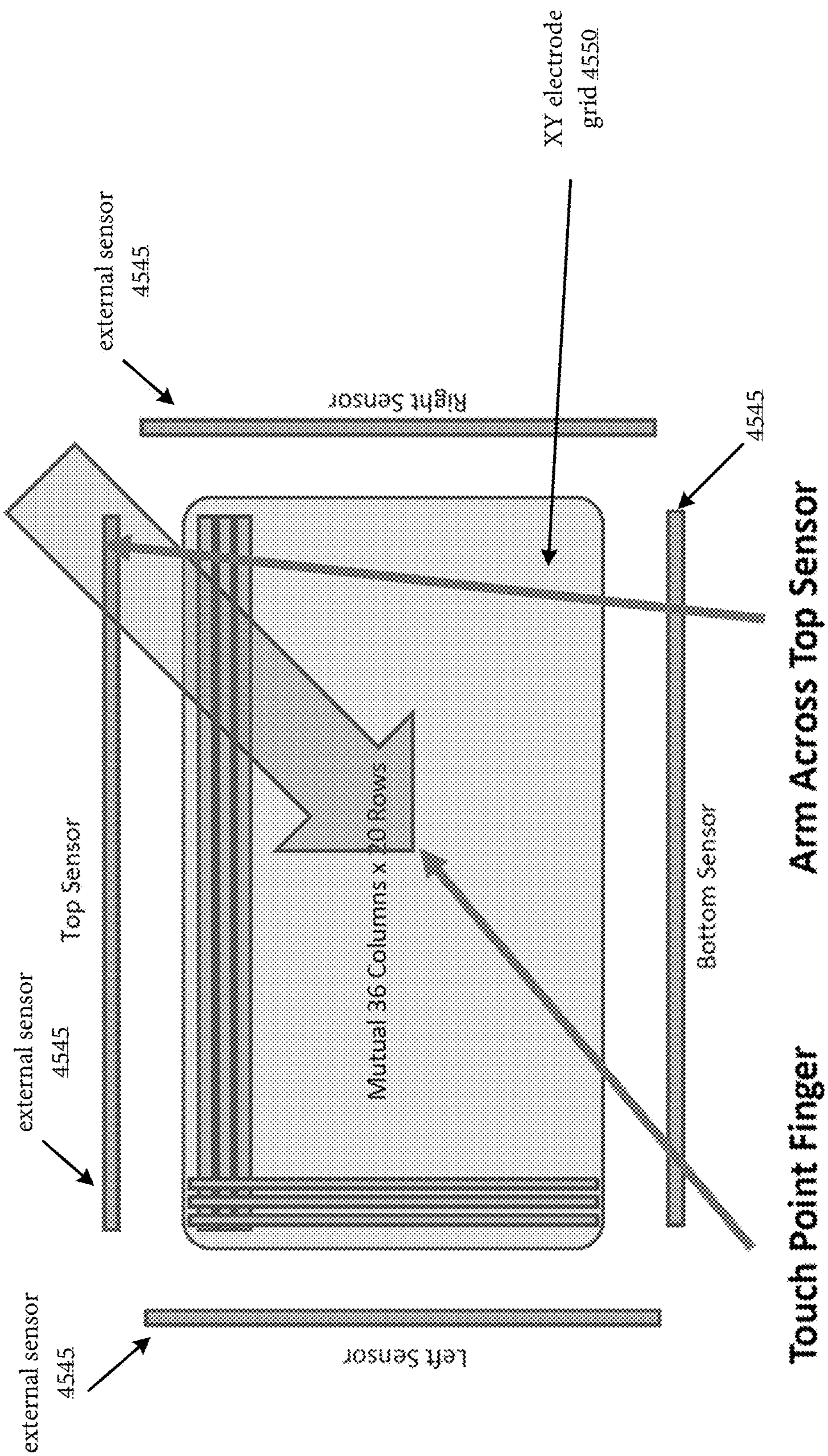
FIG. 45C is a schematic block diagram of an embodiment of external sensors in accordance with various embodiments.
Figure 45D:
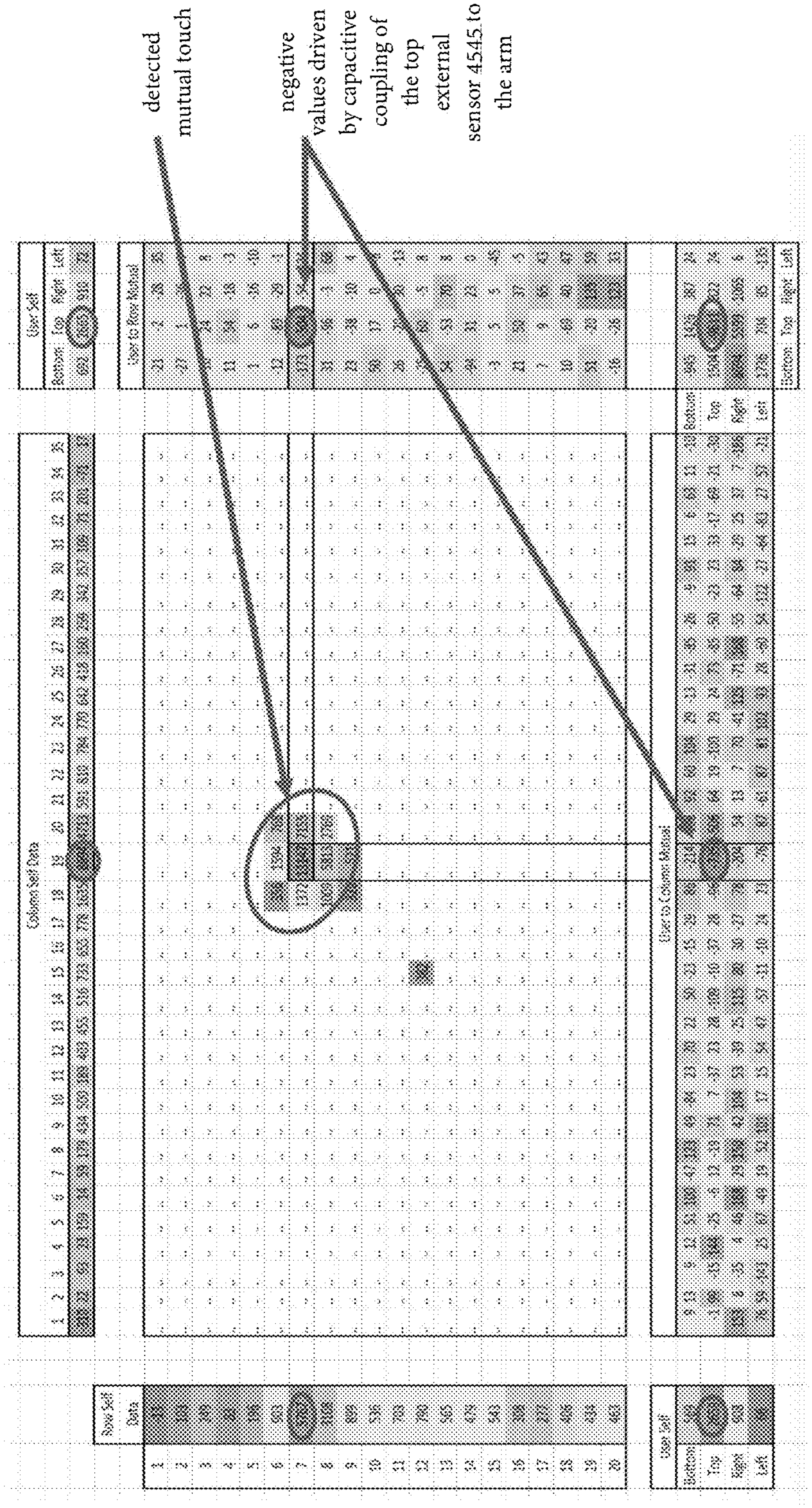
FIG. 45D is an illustration of example data generated in detecting a touch in accordance with various embodiments.

Any TX electrode 305 described herein can optionally be implemented as an electrode of a DSC 117 operable to simultaneously transmit and receive instead of being implemented as an electrode of an ID circuit 114 and/or 118, and can optionally be implemented as an external electrode that is adjacent to, spread apart from, and/or not overlapping with another external sensor or XY pattern of electrodes. Any RX and/or button electrode 405 and/or 505 described herein can optionally be implemented as an electrode of a DSC 117 operable to simultaneously transmit and receive instead of being implemented as an electrode of an ID circuit 114 and/or 118, and can optionally be implemented as an external electrode that is adjacent to, spread apart from, and/or not overlapping with another external sensor or XY pattern of electrodes. FIG. 45C illustrates an example of detecting a touch point upon the XY electrode grid 4550 of FIG. 45B via a finger, where a corresponding arm is detected as touching or hovering over the top external sensor 4545. FIG. 45D illustrates a corresponding example of data collected during this touch of FIG. 45C. As illustrated in FIGS. 45C and 45D, a mutual touch on the touch panel can produce a very positive value compared to when the row/column intersecting was baselined. An external sensor 4545, when capacitively coupled (e.g. to a arm of a person when touching the touch panel) when a touch and/or hover is made on the touch panel via a corresponding finger, the result can be very negative verses the baseline value.

Figure 46A:
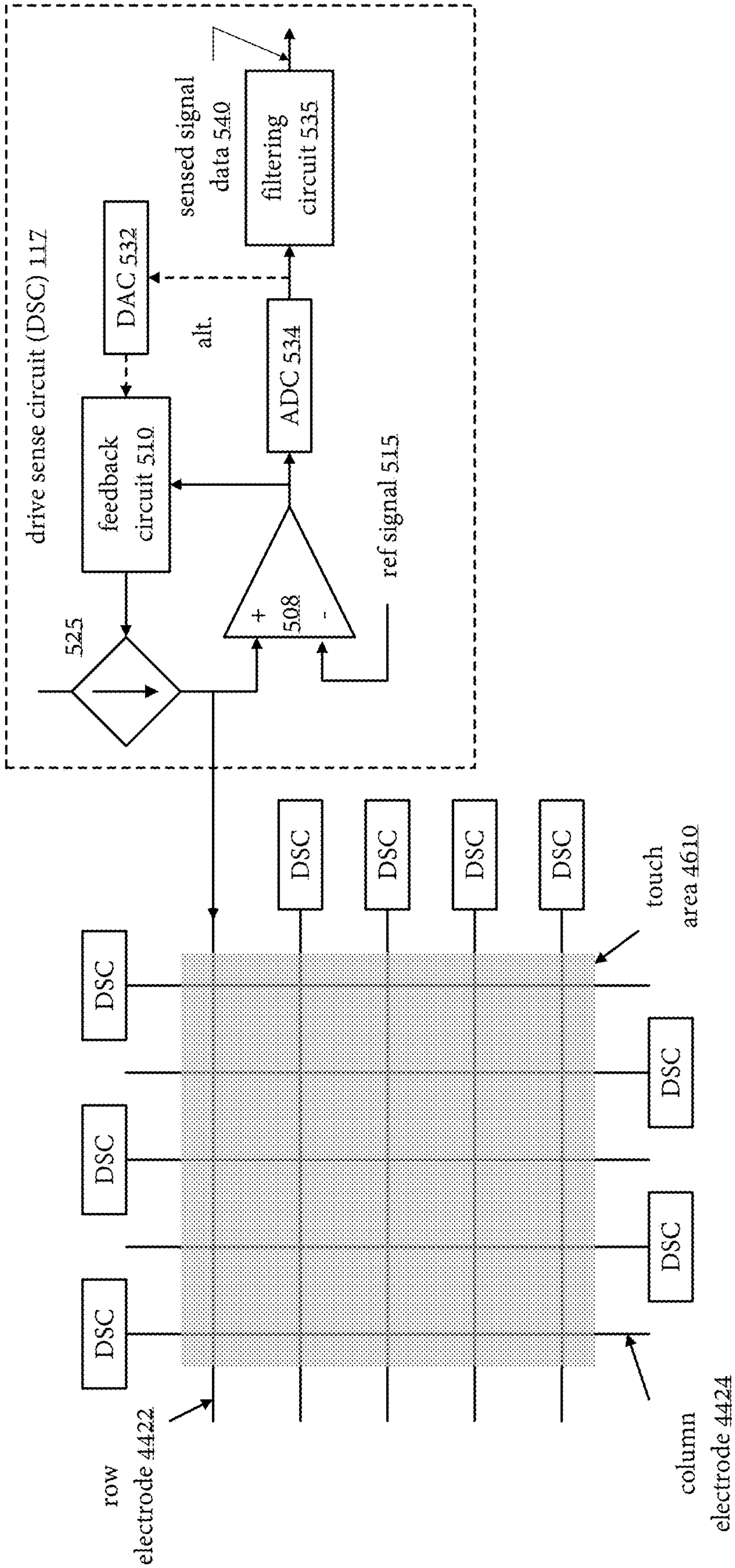
FIG. 46A is a schematic block diagram of an embodiment of a touchpad in accordance with various embodiments.

FIG. 46A is a schematic block diagram of an embodiment of a touchpad 4615 that can implement a single button or multiple buttons 115. The touchpad 4615 of FIG. 46A can be implemented in a same or similar fashion as the keypad 4415 of FIGS. 44A-44C and/or 45. The touchpad 4615 of FIG. 46A can optionally be implemented based on some or all functionality of the touch sensor device of FIGS. 44D and/or 44E. The touchpad 4615 can be implemented via a plurality of row electrodes 4422 and column electrodes 4424 with corresponding DSCs 117 as discussed in conjunction with FIGS. 44A-45. However, rather than having a plurality of individual button touch areas 4410, for example, distinguished via discrete graphical displays and/or different physical silicon, rubber, or plastic pads, a single button touch areas 4410 can be implemented, such as a same smooth surface, a same silicon, rubber, or plastic pad, and/or a same graphical display, for example, displaying various virtual buttons of a graphical user interface displayed by a touch screen display for touch and/or touchless interaction by a user. The touchpad 4615 can be implemented via a greater number of and/or a greater density of row electrodes 4422 and column electrodes 4424 to facilitate a greater plurality of intersections detecting touch and/or touchless interactions for more granular detection of users touching and/or hovering over the touchpad.

The single touchpad 4615 can be preferred in cases where some or all button interactions are performed via gestures and/or via touch, as a same smooth surface can be implemented for ease of performing these gestures. The plurality of individual button touch areas 4410 of FIGS. 44A-45A can be preferred in cases where some or all button interactions are performed via discrete selections of individual buttons and/or are performed by a driver where it is preferred for the driver to be able to feel the boundaries and configuration of different buttons without necessitating looking at the keypad 4415. For example, a front center console is implemented as a touchpad 4615, while a set of driver door buttons and/or set of steering wheel buttons are implemented via a keypad 4415 with raised and/or tactilely distinguishable physical pads for each button touch area 4410. The touchpad 4615 can optionally be implemented as a touchscreen that further includes a display that displays graphical image data, such as a graphical user interface (GUI) that includes a plurality of buttons in different locations of the display, where functionality is performed based on users being detected to select and/or perform gestures while touching and/or hovering over these respective different locations.

Figure 46B:
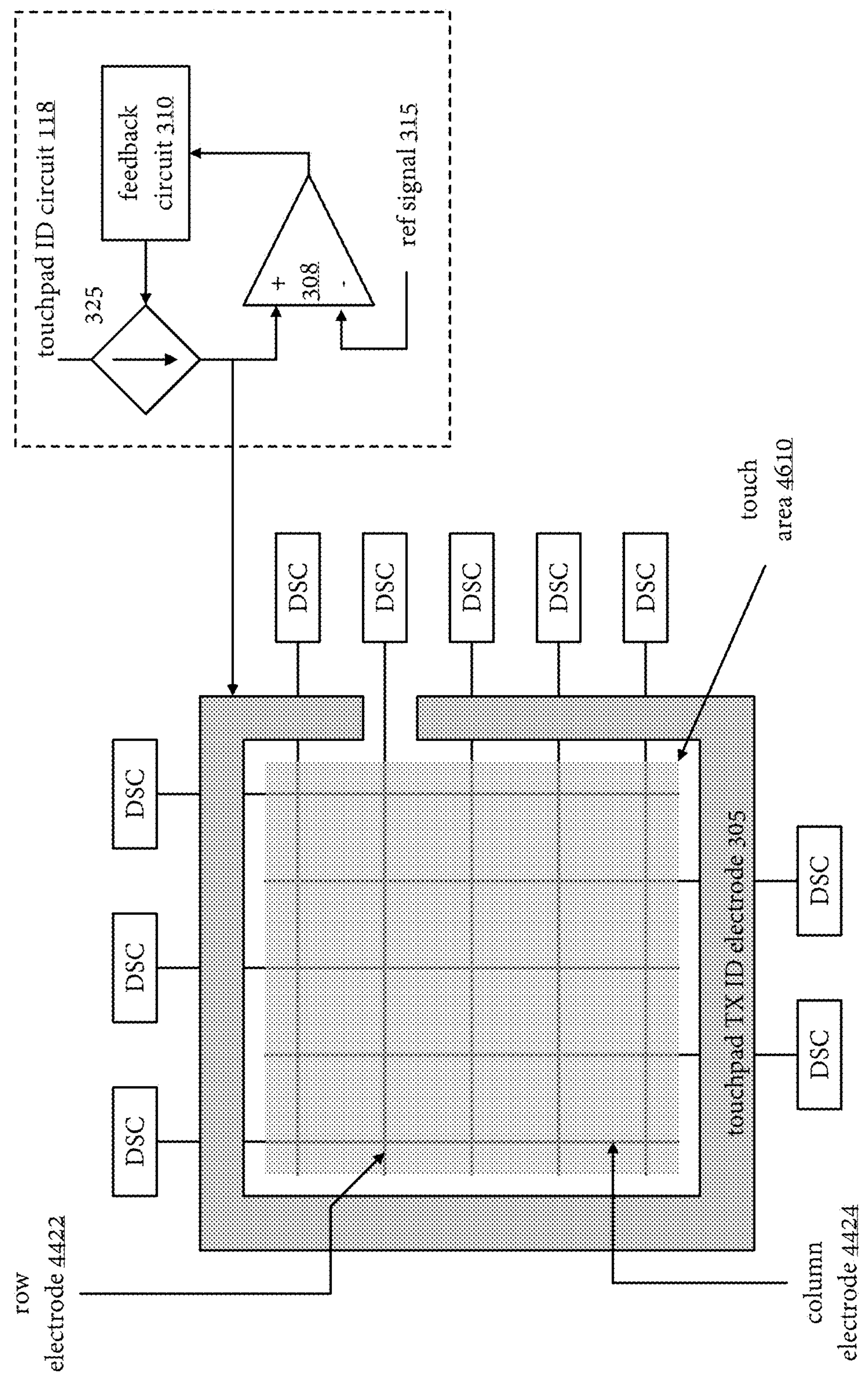
FIG. 46B is a schematic block diagram of an embodiment of a touchpad, a touchpad TX ID electrode, and a touchpad ID circuit in accordance with various embodiments.

FIG. 46B is a schematic block diagram of an embodiment of a touchpad 4615, a touchpad TX ID electrode 305, and a touchpad ID circuit 118. The touchpad 4615, touchpad TX ID electrode 305, and/or touchpad ID circuit 118 can be implemented in a same or similar fashion as the keypad 4415, keypad TX ID electrode 305, and/or keypad ID circuit 118, respectively, discussed in conjunction with FIG. 45. The keypad TX ID electrode 305 can otherwise surround and/or have portions in physical proximity to all regions of the touch area 4610, such that a signal at the corresponding frequency transmitted by touchpad ID circuit 118 is propagated through the user's body and detectable by a sensor circuit 116 accordingly as discussed previously. The touchpad ID circuit can be implemented as the ID circuit of FIG. 3 and/or via some or all features and/or functionality of any ID circuit 118 and/or 114 described herein. In some embodiments, the touchpad TX ID electrode 305 is implemented as one or more external sensors simultaneously driven as both TX and RX sensors in a same or similar fashion as discussed in conjunction with the keypad TX ID electrode 305 of FIG. 45A and/or as illustrated in FIGS. 45B-45D.

Figure 46C:
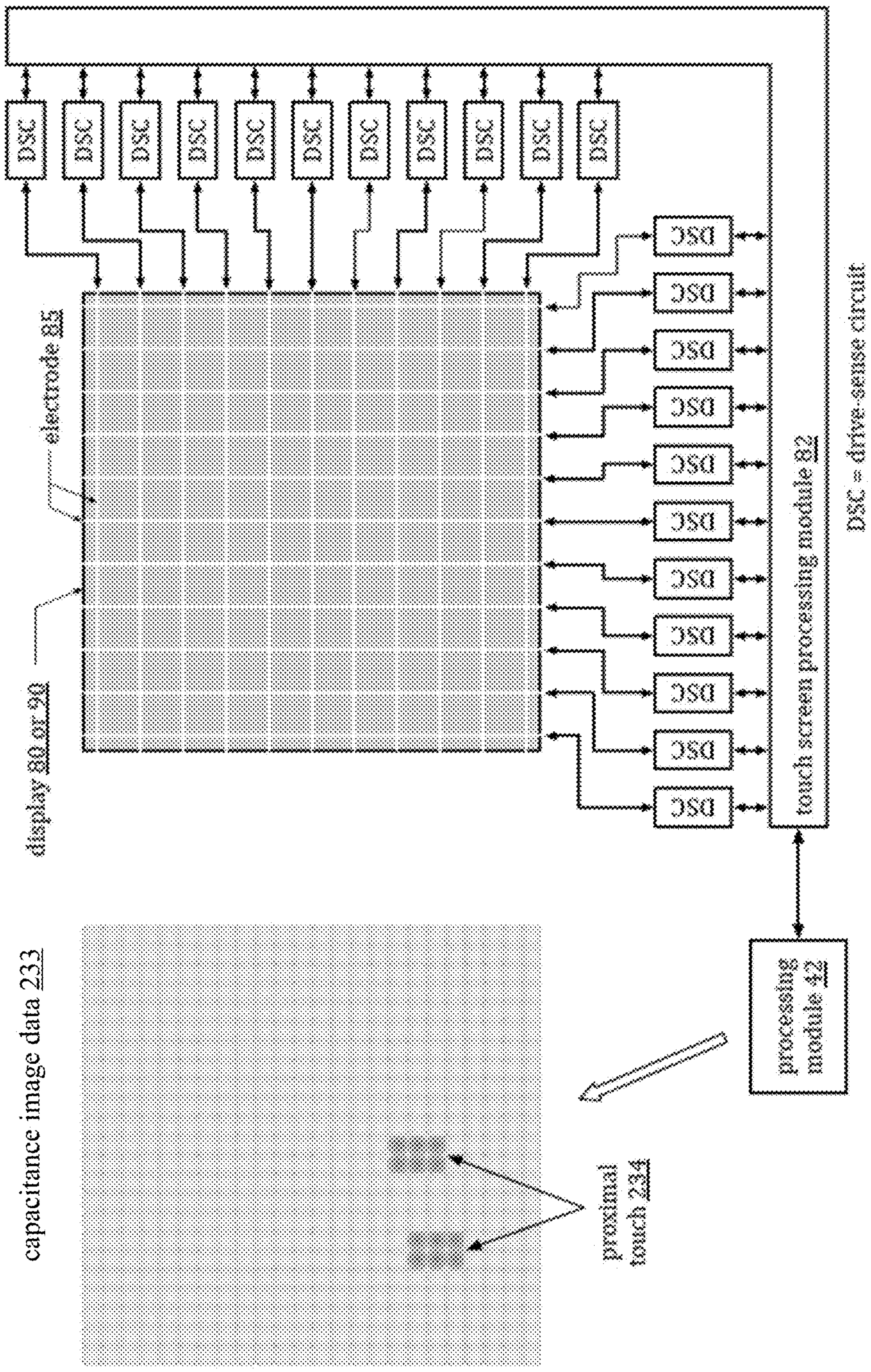
FIG. 46C is a schematic block diagram of an embodiment of a touch sensor device in accordance with various embodiments.

FIG. 46C illustrates an example embodiment of a touchscreen having a display. For example, the touchscreen of FIG. 46C implements the touchpad of FIGS. 46A and/or 46B. Alternatively, the touchpad of FIGS. 46A and/or 46B has no display.

Touch-based and/or touchless indications can be detected by a processing module to determine the location of two touches or touchless indications 234 based on effected rows and columns, as illustrated in FIG. 46C. The x-y coordinates of the touches on the display can be determined accordingly, where corresponding capacitance image data 233 indicating these locations can be generated.

Figure 47B:
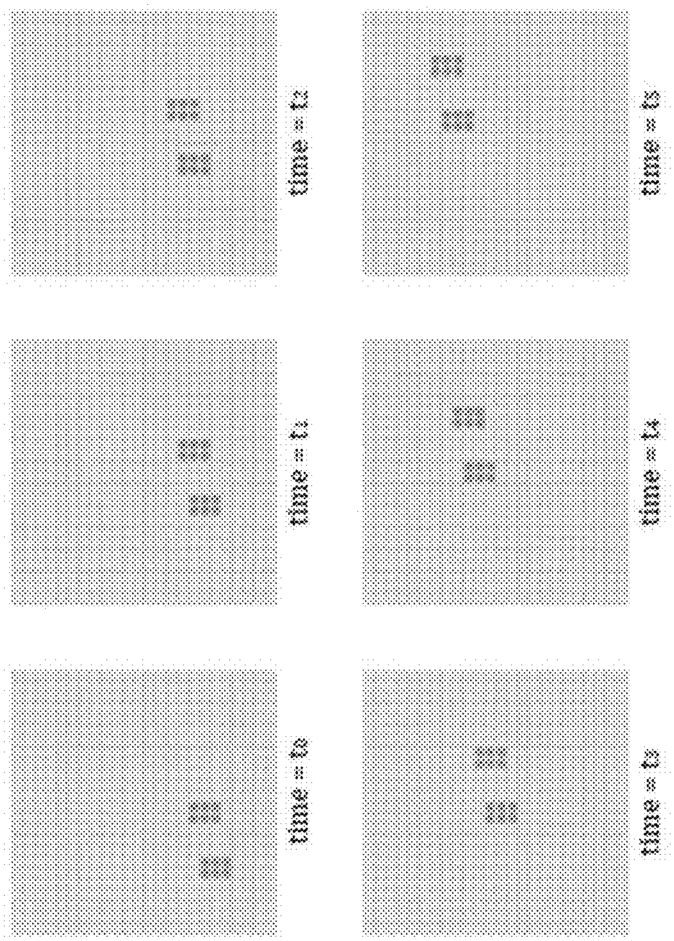
FIG. 47B is a schematic block diagram illustrating detection of changes in capacitance image data over time in accordance with various embodiments.
Figure 47A:
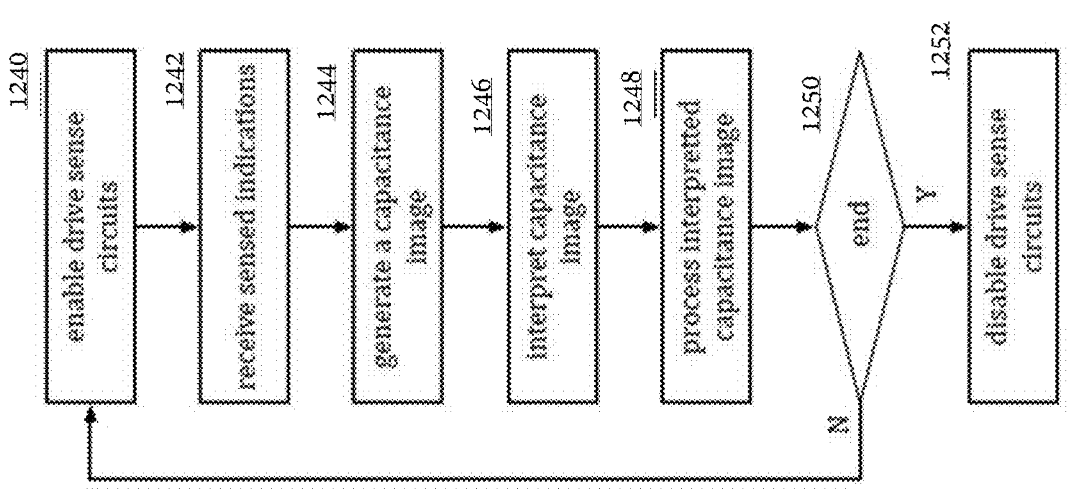
FIG. 47A is a logic diagram illustrating an example method for execution in accordance with various embodiments.

FIG. 47A illustrates a logic diagram illustrating an example method for execution. Some or all of the method of FIG. 47A can be performed via a vehicle sensor system or other sensor system, a vehicle computing entity 150, and/or at least one DSC 117, for example, based on some or all functionality discussed in conjunction with FIGS. 44A-46C. Some or all of the method of 47A can be performed via any computing entity of FIGS. 2A-2D and/or any processing module, which can be associated with a corresponding vehicle, or any other system, for example, that includes a touch sensor device and/or a plurality of DSCs operable to detect touch and/or touchless indications.

The method begins at step 1240 where the processing module enables (for continuous or periodic operation) the drive-sense circuits to provide a sensor signals to the electrodes. For example, the processing module provides a control signal to the drive sense circuits to enable them. The control signal allows power to be supplied to the drive sense circuits, to turn-on one or more of the components of the drive sense circuits, and/or close a switch coupling the drive sense circuits to their respective electrodes.

The method continues at step 1242 where the processing module receives, from the drive-sense circuits, sensed indications regarding (self and/or mutual) capacitance of the electrodes. The method continues at step 1244 where the processing module generates capacitance image data, such as capacitance image data 233 for a corresponding plurality of intersections or row and column electrodes projected upon a corresponding two-dimensional area, based on the sensed indications. As part of step 1244, the processing module can optionally store the capacitance image in memory. The method continues at step 1246 where the processing module interprets the capacitance image data to identify one or more proximal touches (e.g., actual physical contact or near physical contact) of the row and column electrodes, corresponding button touch areas, and/or a corresponding surface.

The method continues at step 1248 where the processing module processes the interpreted capacitance image to determine an appropriate action. For example, if the touch(es) corresponds to a particular button, a corresponding action is performed. As another example, of the touches are in a sequence, then the appropriate action is to interpret the gesture and then determine the particular action. This can include utilizing a hierarchical option tree of FIG. 48A, a mapping of different button touch areas to different functions, and/or a mapping of different gestures to different functions. The hierarchical option tree and/or such mappings can be stored and accessed in corresponding memory accessible to the processing module.

The method continues at step 1250 where the processing module determines whether to end the capacitance image generation and interpretation. If so, the method continues to step 1252 where the processing module disables the drive sense circuits. If the capacitance image generation and interpretation is to continue, the method reverts to step 1240.

FIG. 47B is a schematic block diagram of an example of generating a set of sequential capacitance image data 233 over a time period. In this example, two touches or corresponding hovers are detected at time t0 and move across and upwards through corresponding over times t0 through t5. The movement can correspond to a gesture or action performed by a user interacting with corresponding buttons, a corresponding touchscreen, or other corresponding interactable area.

Figure 47C:
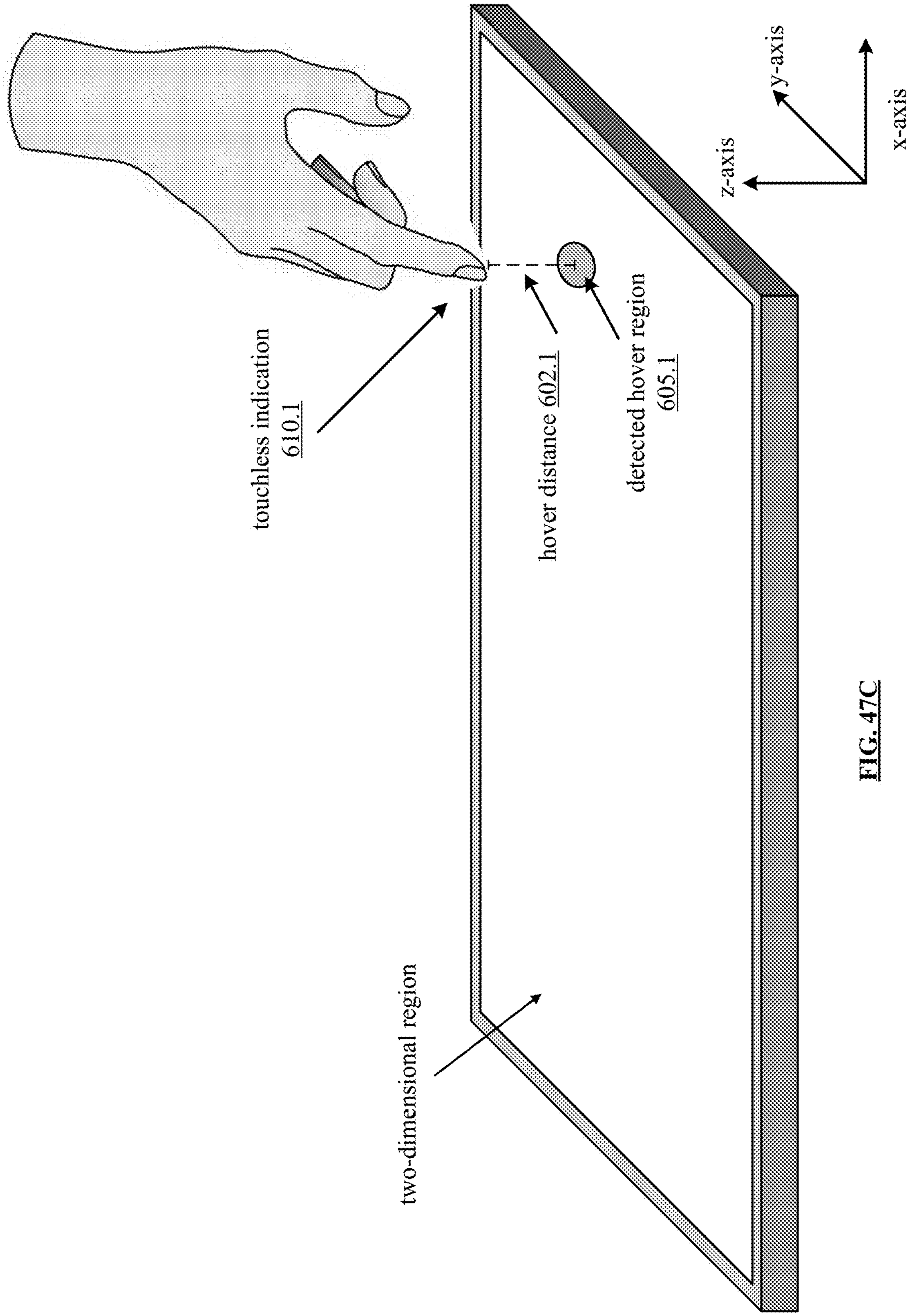
FIG. 47C is an illustration of a hover region and hover distance based on a human interacting with a two-dimensional area in accordance with various embodiments.
Figure 56:
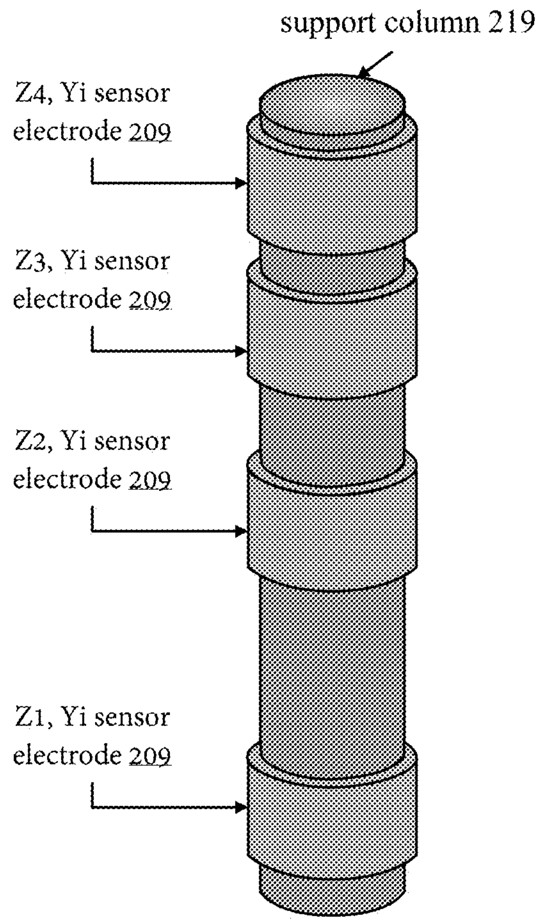
FIG. 56 is a schematic block diagram of another embodiment of Z sensor circuits in accordance with various embodiments.

FIG. 47C illustrates an example embodiment of a touchless indication utilized to engage with a button, single electrode, set of parallel electrodes, set of row and column electrodes, keypad, touchpad, or touchscreen described herein. As depicted in FIG. 56, the surface of a corresponding two-dimensional area that include one or more electrodes operable to detect touches to and/or hovers above the two-dimensional area can define and/or be parallel with an x-y plane with an x-axis and y-axis. A distance between the user's finger and the two-dimensional area projected upon a z-axis orthogonal to the x-y plane can be a non-zero hover distance 602.1, based on the finger hovering over the two-dimensional area without touching the two-dimensional area.

When the hover distance 602 is sufficiently small, such as less than 1 centimeter, less than 10 centimeters, and/or otherwise close enough to render detectable changes to the self-capacitance and/or the mutual-capacitance of one or more electrodes, a corresponding location on the two-dimensional area over which the finger or object is hovering can be identified. In this example, a hover region 605.1 upon the x-y plane is identified, for example, based on detecting capacitance variation data at corresponding cross points of the plurality of electrodes indicating a hovering finger and/or object at this region. For example, the hover region 605 corresponds to portions of the hovering finger within sufficient hover distance 602 to render detection. This detection of an object hovering over the screen without touching can be similar to the detection of actual touch of the screen described herein, for example, where different threshold capacitance variations are utilized to detect a hovering finger and/or object. For example, threshold self-capacitance and/or mutual-capacitance indicating physical touch can be higher than the threshold self-capacitance and/or mutual-capacitance indicating a hovering object.

The identification of hover region 605 can be utilized to detect a corresponding touchless indication 610 by a user. For example, a user can use their finger, pen, or other object can interact with graphical image data, such as a graphical user interface or other displayed image data displayed via a touch screen, or to otherwise interact with buttons or other areas having no display, via one or more touchless indications, for example, in a same or similar fashion as interaction via physical touch.

In some embodiments, a user can optionally interact with electrodes and/or buttons of some or all button circuits 112 entirely via touchless indications 610, where the user need not physically touch the button electrodes to "click on" buttons. These touchless indications 610 can include: statically hovering over the two-dimensional area at hover distance 602; dynamically hovering over the touch screen with movements along the x-y plane at hover distance 602, for example, to perform a gesture-based command and/or to interact with different button areas or different individual buttons of the x-y plane; dynamically hovering over the two-dimensional area with movements along the z-axis to change the hover distance 602, for example, to perform a gesture-based command and/or to interact with a corresponding button area or button; and/or other hover-based and/or gesture-based indications that optionally do not involve any physical touching of the two-dimensional area. In some embodiments, different types of touchless indications 610 can optionally correspond to different gesture-based commands utilized to invoke different types of interactions.

Figure 47F:
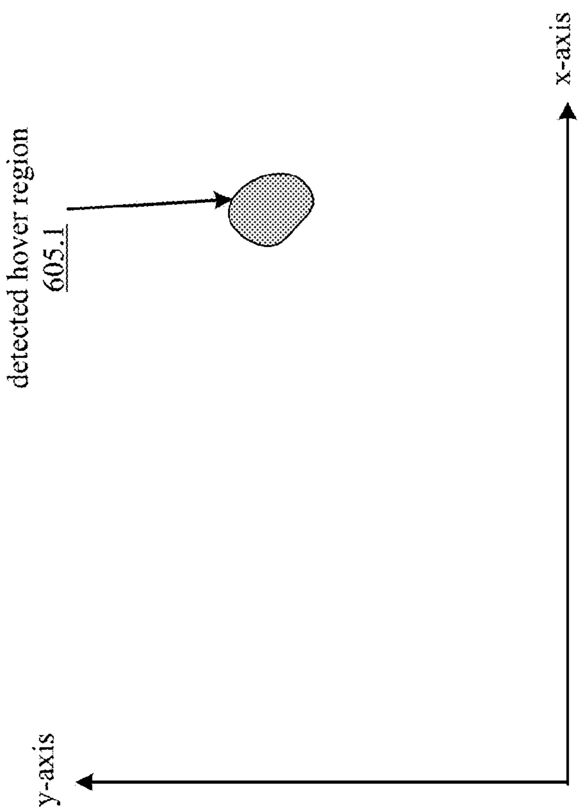
FIG. 47F is an illustrations of an example hover region in accordance with various embodiments.
Figure 47D:
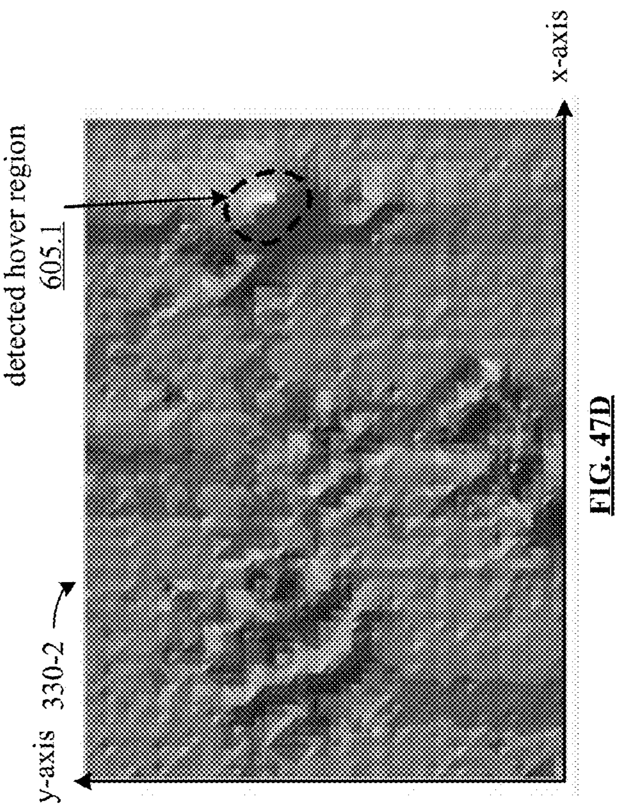
FIGS. 47D and 47E are illustrations of example capacitance image data in accordance with various embodiments.
Figure 47E:
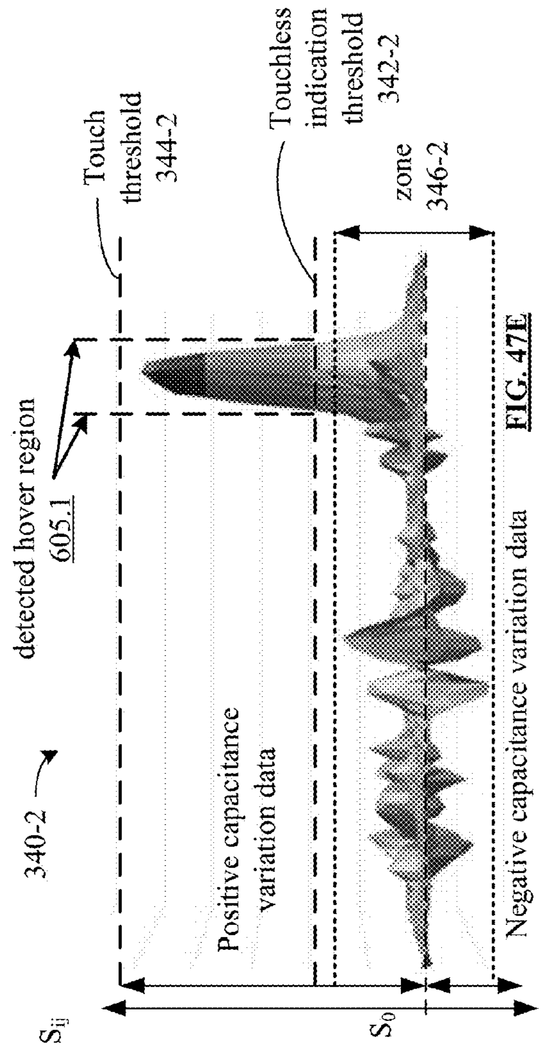

FIGS. 47D and 47D are graphical diagrams 330-2 and 340-2 of an embodiment of capacitance image data 233 in accordance with the present disclosure. In particular, capacitance image data is presented in response to the touchless indication presented in conjunction with FIG. 47C. FIG. 47D presents a 2-D heat map representation where differing colors represent the magnitude of the positive capacitance variation data and the negative capacitance variation data. The two dimensions heatmap of FIG. 57A can correspond to the x axis and y axis of the x-y plane of touch screen 16, where the heatmap depicts positive capacitance variation data and the negative capacitance variation data detected across various locations of the x-y area of touch screen 16. FIG. 47E presents a 3-D heat map representation where differing colors represent the magnitude of the positive capacitance variation data and the negative capacitance variation data.

In particular, the presence of the touchless indication is clearly indicated by the peak in positive capacitance touch data that is above a touchless indication threshold 342-2 but below a touch threshold 344-2. For example, the detected hover region can be determined based on portions of the heatmap 47A with positive capacitance variation data exceeding the touchless indication threshold 342-2. Compensated capacitance image data can be optionally generated to subtract, remove or ignore portions of the positive capacitance variation data and the negative capacitance variation data within the zone 346-2 and/or by increasing the touchless indication threshold 342-2 to be above this zone 346-2. A condition detection function corresponding to a touchless indication can be performed detect and identify that a finger is in close proximity to the display surface based on the location of the positive peak in the positive capacitance variation data that exceeds the touchless indication threshold 342-2 but below the touch threshold 344-2. In the example shown, the touchless threshold 342-2 is placed slightly above, such as a predetermined value above, the upper threshold of the zone 346-2. In other examples, the touchless indication threshold 342-2 can be set at the upper threshold of the zone 346-2.

In addition, a further condition detection function corresponding to a touch can detect and identify that a finger is physically touching the surface of the display based on the location of the positive peak in the positive capacitance variation data that exceeds the touch threshold 344-2. Alternatively, touches are not distinguished from touchless interactions, and only the touchless threshold is utilized.

FIG. 47F illustrates the detected hover region 605.1 detected as discussed based on processing the capacitance image data of FIGS. 47D and 47E. In particular, FIG. 47F illustrates the projection of the detected hover region 605.1 upon the corresponding x-y plane, for example, corresponding to the two-dimensional plane of display 50 and/or otherwise corresponding to the planar surface of the touch screen and/or the planar display of graphical image data by the touchscreen. The boundary of detected hover region 605.1 illustrated in FIG. 47C corresponds to the boundary of corresponding capacitance variance data in the two-dimensional heat map of FIG. 47D that compares favorably to the touchless indication threshold. This hover region 605 thus depicts the portion of the touch screen over which an object is detected to be hovering, such as the finger of FIG. 47C at the hover distance 602.1 in this example. This hover region 605 can be further processed, for example, to induce corresponding selections and/or interactions with buttons at corresponding portions of the x-y plane as described herein.

Figure 47G:
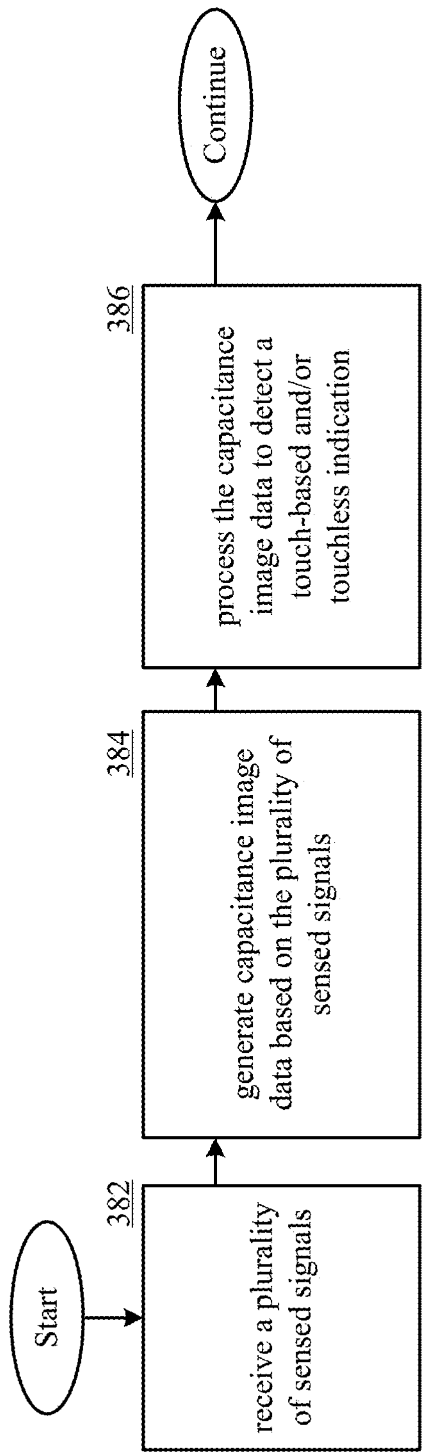
FIG. 47G is a logic diagram illustrating an example method for execution in accordance with various embodiments.

FIG. 47G illustrates a flow diagram of an embodiment of a method in accordance with the present disclosure. Some or all of the method of FIG. 47G can be performed via a vehicle sensor system or other sensor system, a vehicle computing entity 150, and/or at least one DSC 117, for example, based on some or all functionality discussed in conjunction with FIGS. 44A-46C. Some or all of the method of 47A can be performed via any computing entity of FIGS. 2A-2D and/or any processing module, which can be associated with a corresponding vehicle, or any other system, for example, that includes a touch sensor device and/or a plurality of DSCs operable to detect touch and/or touchless indications.

Step 382 includes receiving a plurality of sensed signals. For example, performing step 382 includes receiving sensed indications of self-capacitance and/or mutual-capacitance of one or more individual electrodes and/or at intersections of row electrodes and column electrodes. For example, the plurality of sensed signals can indicate variations in capacitance associated with the plurality of cross points formed by a plurality of row electrodes and a plurality of column electrodes as discussed previously herein.

Step 384 includes generating capacitance image data, such as capacitance image data 233, based on the plurality of sensed signals. For example, performing step 384 includes performing step 312 and/or otherwise includes generating capacitance image data that includes positive capacitance variation data and negative capacitance variation data. The capacitance image data can be associated with the plurality of cross points, for example, such as a two-dimensional heat map of capacitance variation data corresponding to the plurality of cross-points across a corresponding two-dimensional area. The capacitance image data can include capacitance variation data corresponding to variations of the capacitance image data from a nominal value.

Step 386 includes processing the capacitance image data to detect a touchless indication. For example, performing step 386 includes processing capacitance image data to identify the presence or absence of various conditions, such as presence of absence of a condition corresponding to at least one touchless indication, and/or to characterize the conditions that were identified, such as characterizing the touchless indication. The touchless indication can be detected based on identifying portions of the capacitance image data, such as a hover region 605, having capacitance variation data comparing favorably to a touchless indication threshold such as touchless indication threshold 342. The touchless indication can optionally be detected based on identifying portions of the capacitance image data, such as a hover region 605, having capacitance variation data comparing favorably to the touchless indication threshold, and also comparing unfavorably to a touch threshold such as touch threshold 344.

In some embodiments, such detection of objects hovering over and/or touching electrodes of a two-dimensional area as discussed in conjunction with FIGS. 47A-47G can be implemented to perform object location detection and/or contour determination via electrodes one or more a two-dimensional areas as discussed in conjunction with some or all of FIGS. 50A-82. For example, detection of such hover distances and/or hover regions by one or more electrodes can be utilized to determine corresponding distances of electrodes having known locations from objects in three-dimensional space to aid in determining the location in three-dimensional space occupied by such objects and/or to determine the contouring of such objects.

FIG. 48A illustrates an embodiment of a hierarchical option tree 1505. The hierarchical option tree 1505 can correspond to a hierarchical menu structure applied to button interactions, for example, upon a same set of buttons and/or same set of electrodes or other one or more buttons, such as a single electrode, a set of proximal electrodes such as the embodiment of FIGS. 39 and/or 40, Figures a set of parallel electrodes such as the embodiment of FIGS. 42-43B, a keypad 4415, a touchpad 4615, a touchscreen displaying buttons or options as graphical image data of a graphical user interface, a touch sensor device of FIGS. 44E-44F and/or of 47A-47G and/or any other button and/or set of electrodes operable to detect user interaction and/or user input, such as via detection of touchless and/or touch-based interaction.

A user can make a selection of functionality based on navigating through a path of the hierarchical option tree 1505 via a plurality of ordered interactions with the one or more buttons and/or one or more electrodes. Some or all interactions can be known and/or inherent such as up and down motions to increase or decrease a configurable setting such as audio volume or temperature, can be displayed with instructions for options based on a prior selection via a display device, can be printed on corresponding, or can otherwise be conveyed to users.

Data conveying such one or more hierarchical option tree 1505 for one or more individual buttons and/or one or more different sets of buttons can be stored in a memory module, for example, of a vehicle, of a vehicle computing system 150, and/or of another computing system. For example, a vehicle computing system 150, other computing system, or other processing module of a vehicle sensor system or other sensor system can access the hierarchical option tree 1505 in memory to determine mappings of user indication types to functions, and the pathways via unique sets of multiple consecutive user indication types to various different functionality to be performed, for example, where a command to roll down the driver window involves a first unique set of multiple consecutive user indication types via interaction with a given set of one or more buttons and/or electrodes, and where a command to adjust tilt the left side mirror downwards involves a second unique set of multiple consecutive user indication types via interaction with this same given set of one or more buttons and/or electrodes, where the second unique set of multiple consecutive user indication types is different from the first unique set of multiple consecutive user indication types.

The hierarchical option tree of FIG. 48A serves as an example set of option tiers and corresponding pathways to different functionality. Any configuration of and/or commands to perform any type of vehicle functionality described herein can be indicated in one or more hierarchical option trees for one or more individual button circuits or sets of multiple buttons and/or electrodes, via navigation via one or more tiers. Hierarchical option trees can optionally be configurable, such that pathways are shorter for options they invoke more often and/or where gestures they find intuitive and/or easy to perform are configured as user indication types for corresponding options.

Starting at a root option tier 1510.root, one of a set of different user indication types to the one or more buttons and/or electrodes can be detected, where each different user indication type denotes a corresponding option dictating the next option tier 1510 with which the user will select a further option. Each option tier, as a set of child nodes from a parent option, can have different user indication types corresponding to different selected functions and/or configuration options. For example, from a given option tier 1510.3, a set of multiple children option trees 1510.3.1 and 1510.3.2 each correspond to one corresponding option of the option tier 1510.3 Once a leaf node is reached, a corresponding functionality denoted by the set of consecutive selections from the root can be performed. In this example, tilting the left mirror down can include first selecting button area three to denote mirror configuration, then swiping left to denote configuration of the left mirror, then swiping down to denote the left mirror be tilted down. Timeouts and/or required timing between indications and/or in which to perform all user indications can be applied, for example, where the computing entity automatically resets to the root option tier if no leaf is reached within a predetermined temporal period, such as 5 seconds or another time period.

In this example, some or all different user indication types are different button areas, such as different buttons in a same vehicle location, different electrodes of a same area and/or set of electrodes, different button touch areas of a same keypad or touchpad, different displayed buttons on a touchscreen, etc. Some or all different user indication types of the root option tier, or any option tier, can include selection of an individual electrode and/or individual button area, a gesture or other movement across multiple different button areas and/or electrodes, a simultaneous selection of multiple different button areas and/or electrodes for example, via multiple fingers and/or hands, and/or any other detectable touch-based and/or touchless interaction proximal to corresponding electrodes, buttons, other sensors, etc. Various user indication types can correspond to any type of gesture described herein. Detection of different user indication types to determine which option set and/or which final function be invoked can include performing the gesture detection function of FIGS. 84A-84E and/or the anatomical feature mapping function of FIGS. 83A-83D.

Different types of user indications can otherwise be distinguished based on which electrodes detect changes in impedance, self-capacitance, and/or mutual-capacitance, the magnitude of these changes, detected movement across and/or projected upon one or more two-dimensional planes that include multiple electrodes or other sensors; based on detection of hover distance from electrodes; based on detection of whether the gesture involved a touch or was entirely touchless, based on a detected configuration of the hand, fingers or the human body; based on detection of which occupant in the vehicle performed the gesture and/or detection of the location of the user that performed the gesture within a corresponding three-dimensional space; based on detection of which body part, such as which finger or which hand performed the gesture; based on corresponding voice activation or other detectable commands; based on the current state and/or status of the vehicle, such as any vehicle status described herein; based on which particular person is identified to be performing the interaction based on detection of a corresponding user ID signal 126.U, and/or other distinguishing characteristics detectable via various functionality described herein.

Different option tiers 1510 can extend different numbers of levels until a leaf node is reached. Different option tiers can have different numbers of options for different numbers of functions and corresponding indication types. Some option tiers can include only button selections of a single button area or electrode as its set of indication types. Some option tiers can include only gestures across multiple button areas or electrode as its set of indication types Some option tiers can include a combination of gestures and individual button selections as its set of indication types. Different individual buttons and/or sets of buttons of a keypad, touchpad, set of proximal parallel and/or grid of electrodes, different buttons in a same vehicle location, and/or different sets of buttons across different vehicle buttons can each have their own hierarchical option tree 1505, for example, with root options and/or other option tiers inducing different functionality and/or having same or different types of indication types.

For example, the selection of a configurable option via an individual button selection, and then the configuration of the selected option via a gesture across a set of button areas, can be performed in this fashion via a corresponding hierarchical option tree 1505 as discussed in conjunction with the keypad 4415 of FIGS. 44A-44C and/or the set of parallel electrodes of FIGS. 42 and 43A.

Some hierarchical option trees 1505 for individual buttons and/or sets of buttons can include some or all leaf-level functionality as the root level, where only a single user indication need be performed for a corresponding functionality to be performed. Some hierarchical option trees 1505 for individual buttons can include a root level with a single indication type, such as pushing or otherwise activating a corresponding button, where a corresponding functionality is performed when the button is activated.

Figure 48B:
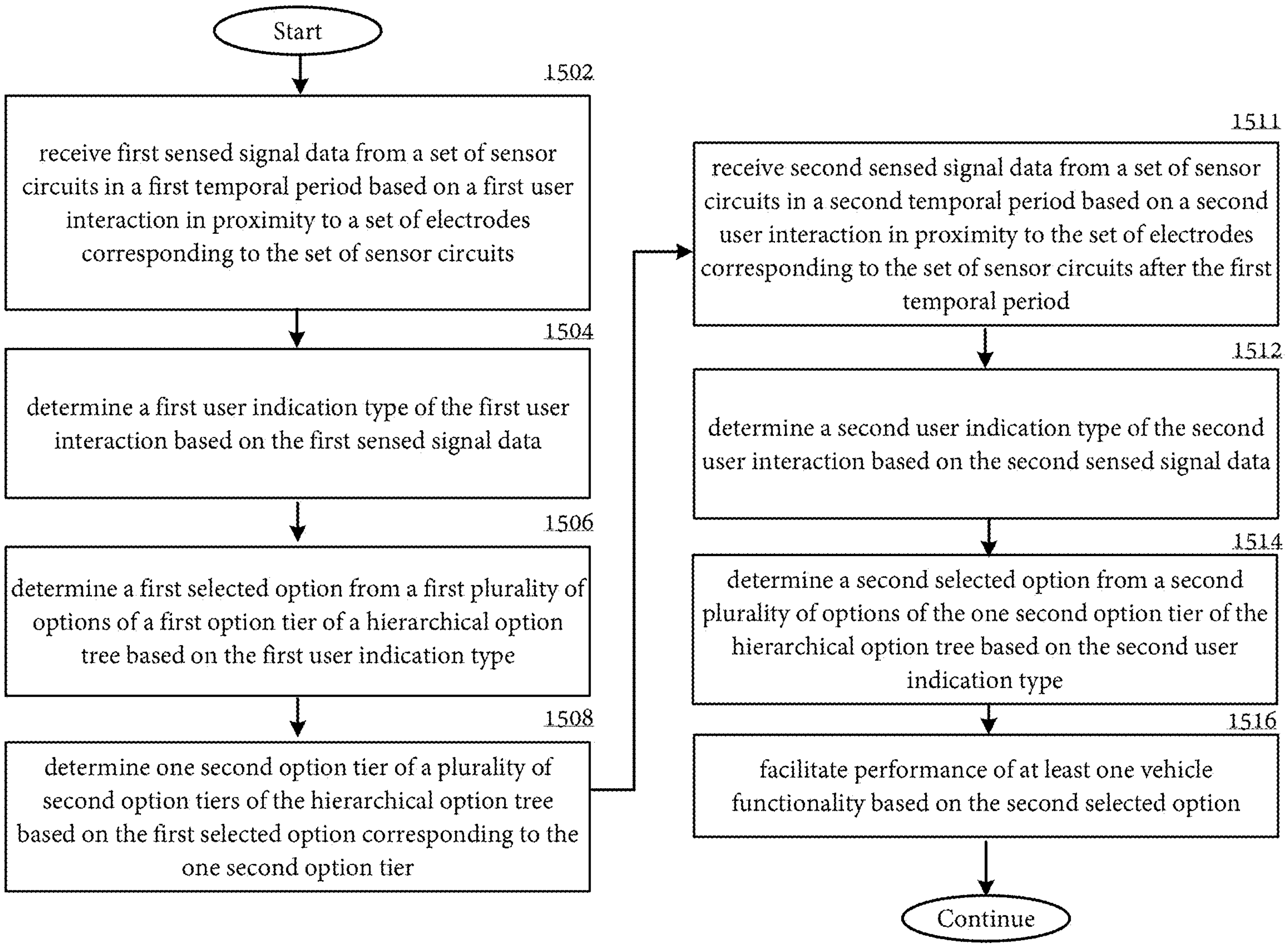
FIG. 48B is a logic diagram illustrating an example method for execution in accordance with various embodiments.

FIG. 48B is a logic diagram illustrating a method of performing functionality based on detected interactions with buttons and/or electrodes, for example, based on a hierarchical option tree such as that of the example of FIG. 48A. Some or all of the method of FIG. 48B can be performed via a vehicle computing entity 150 and/or at least one button circuit 112, for example, based on some or all functionality discussed in conjunction with one or more of FIGS. 6-47G. Some or all of the method of 48B can be performed via any computing entity of FIGS. 2A-2D and/or any processing module, which can be associated with a corresponding vehicle, or any other system, for example, that includes one or more buttons implemented via one or more corresponding electrodes. Some or all of the method of 48B can be performed based on performing the method of FIGS. 13B, 19B, 43B, and/or 44D. Some or all of the method of 48B can be performed based on implementing a button configuration that is the same as and/or similar to the example of FIGS. 42 and 43A, and/or the example of FIGS. 44A-44C where individual selection of individual ones of the set of parallel button electrodes and/or button touch areas is distinguished from and processed differently from swiping gestures across some or all of the parallel button electrodes and/or different button touch areas.

Step 1502 includes receiving first sensed signal data from a set of sensor circuits in a first temporal period based on a first user interaction in proximity to a set of electrodes corresponding to the set of sensor circuits. Step 1504 includes determining a first user indication type of the first user interaction based on the first sensed signal data. Step 1506 includes determining a first selected option from a first plurality of options of a first option tier of a hierarchical option tree based on the first user indication type. Step 1508 includes determining one second option tier of a plurality of second option tiers of the hierarchical option tree based on the first selected option corresponding to the one second option tier.

Step 1511 includes receiving second sensed signal data from a set of sensor circuits in a second temporal period based on a second user interaction in proximity to the same or different set of electrodes corresponding to the set of sensor circuits after the first temporal period. Step 1512 includes determining a second user indication type of the second user interaction based on the second sensed signal data. Step 1514 includes determining a second selected option from a second plurality of options of the one second option tier of the hierarchical option tree based on the second user indication type. Step 1516 includes facilitating performance of at least one vehicle functionality based on the second selected option. Alternatively, the method can repeat steps 1511-1514 following step 1514 for one or more additional option tiers 1510 branching from on previously selected option tiers in the hierarchical option tree.

Figure 49:
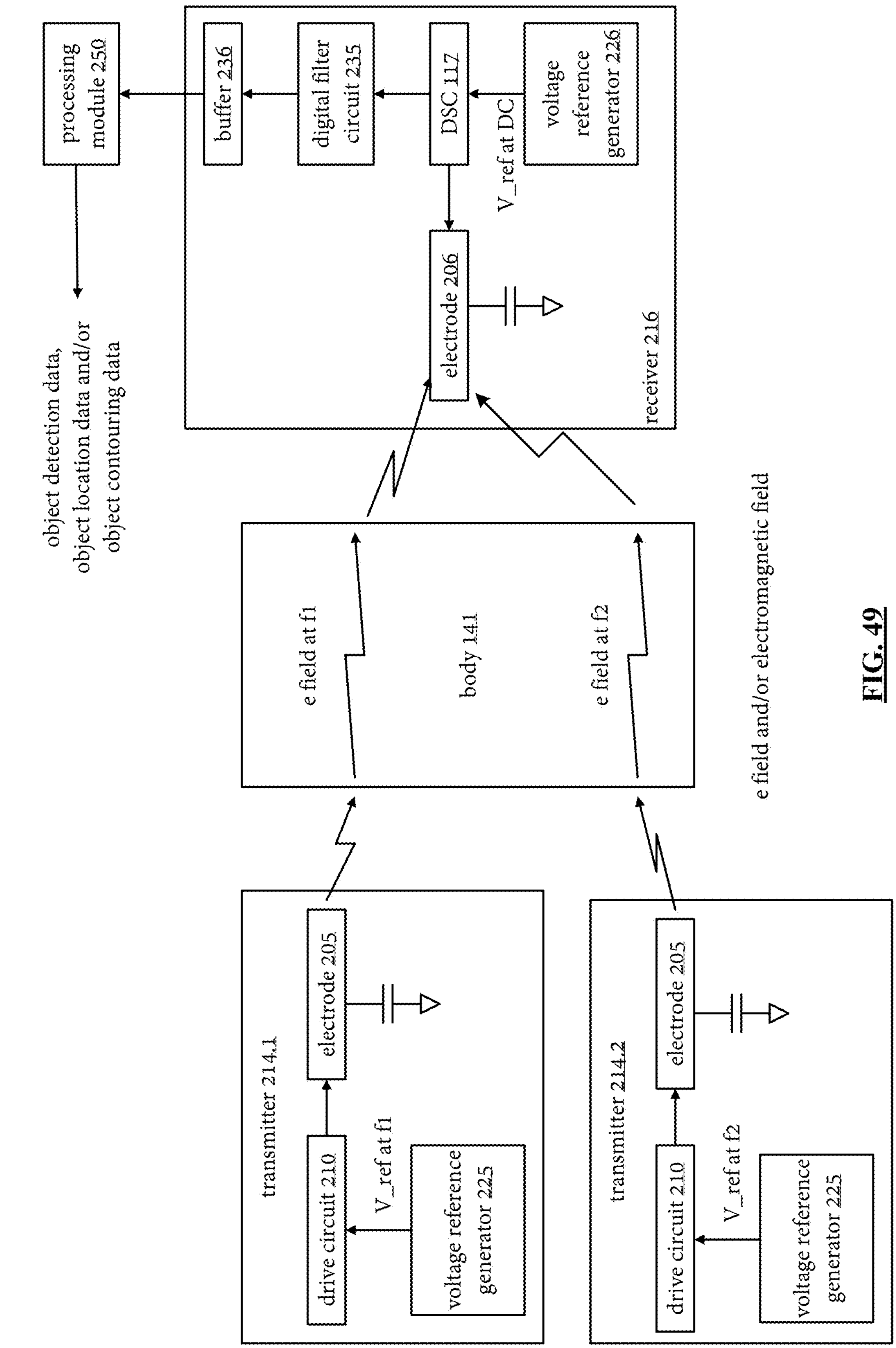
FIG. 49 is a schematic block diagram of an embodiment of a plurality of transmitters transmitted via a body to a receiver in accordance with various embodiments.

FIG. 49 is a schematic block diagram of an embodiment of a plurality of transmitters, which can include at least two or more transmitters 214, that transmit e-fields and/or electromagnetic fields via a body to a receiver 216. Some or all transmitters 214 can be implemented utilizing some or all functionality of any embodiment of the ID circuit 114, ID circuit 118, and/or DSC 117 described previously. Receiver 216 can be implemented utilizing some or all functionality of any embodiment of a sensor circuit 116, DSC 117, and/or RX circuit 119 described previously. Any embodiment of button circuits 112, ID circuits 114 and/or 118, sensor circuits 116, DSCs 117, and/or RX circuits 119 described herein can optionally be implemented via some or all functionality of the transmitter 214 and/or receiver 216 of FIG. 49.

Each transmitter 214 can include a voltage reference generator 168 that generates a voltage reference at a given frequency, which can be unique to different transmitters to identify different transmitters. In this example, transmitter 214.1 has a voltage reference generator 225 that generates V_ref at frequency f1, for example, having an AC component oscillating with a component at f1, and transmitter 214.2 has a voltage reference generator 225 that generates a reference voltage V_ref at frequency f2, for example, having an AC component oscillating with a component at f2, where f2 is different from f1. A drive circuit 210 can receive V_ref and can be operable to transmit a corresponding signal with a corresponding frequency upon an electrode 205. For example, the drive circuit 210 and electrode 205 are implemented as an ID circuit 114 and/or 118, where electrode is electrode 305, and where V_ref is implemented as reference signal 315. The drive circuit 210 can otherwise be implemented to generate and transmit a signal upon electrode 205 based on V_ref.

Corresponding e-fields can be transmitted through a body 141, for example, of a person. For example, the e-fields are propagated based on the body 141 being in proximity to electrodes 205 of the corresponding electrodes 205. A receiver can include an electrode 206 and DSC that senses the e-fields at f1 and f2, for example, when the body 141 is in proximity to electrode and induces corresponding changes in impedance upon electrode 206 of receiver 216. The DSC 117 can be implemented as DSC 117 of FIGS. 44A-47 and/or as a sensor circuit 116 of FIG. 4 or any other sensor circuit 116 described herein to generate sensed signal data, for example, that indicates detection of f1 and f2 when corresponding e-fields are propagated through a body 141 when in proximity to electrode 206. The DSC can utilize a DC reference voltage V_ref, for example, with no AC components, generated via a voltage reference generator 226, which can be the same or similar to voltage reference generator 225 but instead operable to generate a DC reference voltage rather than a reference voltage having an AC component. A digital filter circuit 235 and/or buffer 236 can be applied to further process the sensed signal data. For example, digital filter circuit 235 and/or the DSC 117 includes a set of band pass filters that includes one band pass filter centered at f1 and another band pass filter centered at f2 to enable detection of f1 and f2 and/or to enable measurement of magnitude of each frequency component in sensed signal data.

A processing module 250 can further process and/or perform various functionality based on the output of receiver 216, for example, based on whether various frequencies are detected due to the body 141 being in proximity to various corresponding transmitters 214. The processing module 250 can be implemented via a vehicle computing entity 150, any other computing entity 16 of FIGS. 2A-2E, and/or any other processing module that includes at least one processor. For example, the processing module can generate object detection data, object location data, and/or object contouring based on signals received from multiple receivers 216, and/or based on sensed signal data generated by multiple DSCs 117, sensor circuits 116, and/or button circuit 112.

Figure 50A:
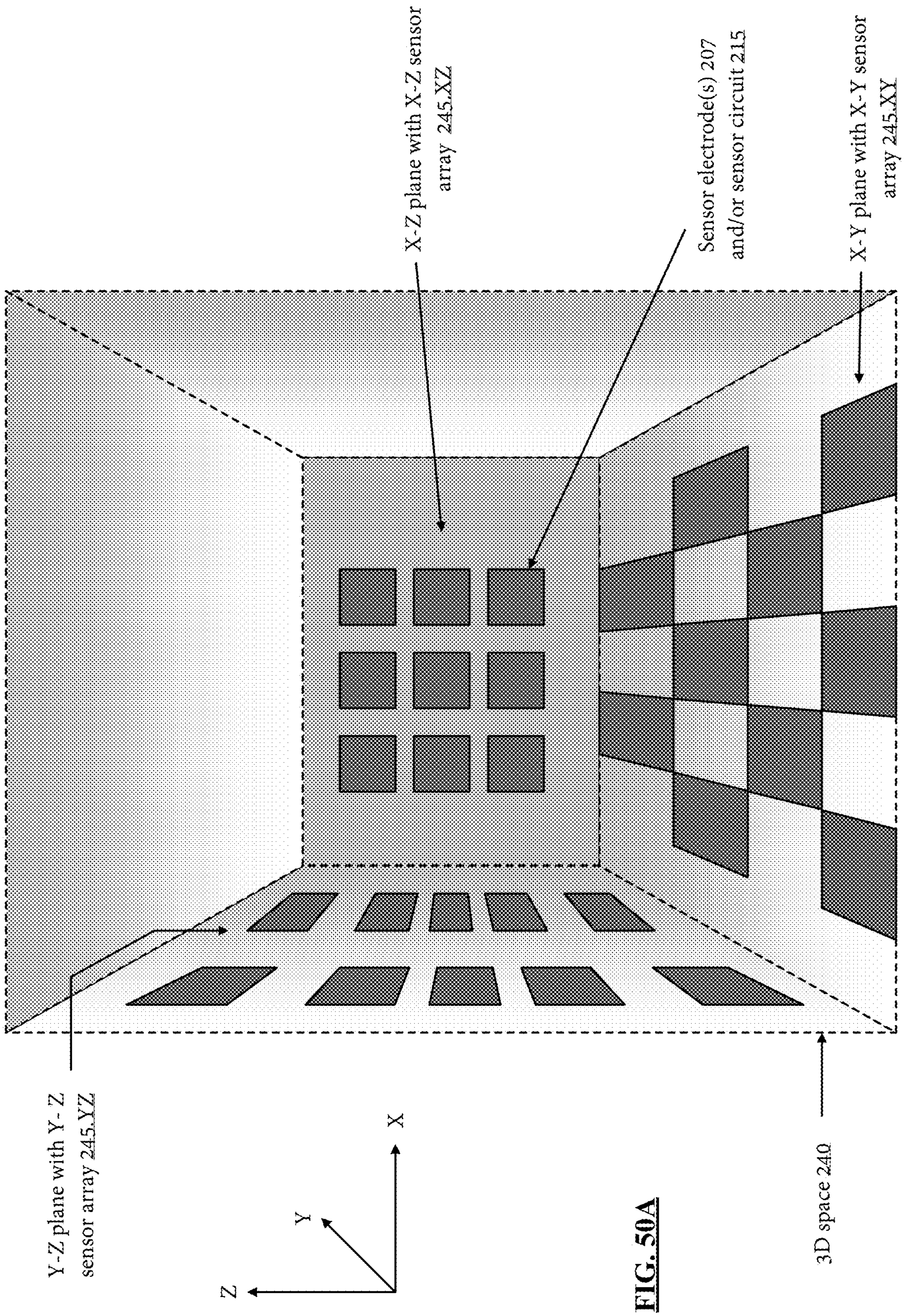
FIG. 50A is a schematic block diagram of an embodiment of three-dimensional (3D) space having X, Y, and Z sensors for 3D object sensing in accordance with various embodiments.
Figure 50B:
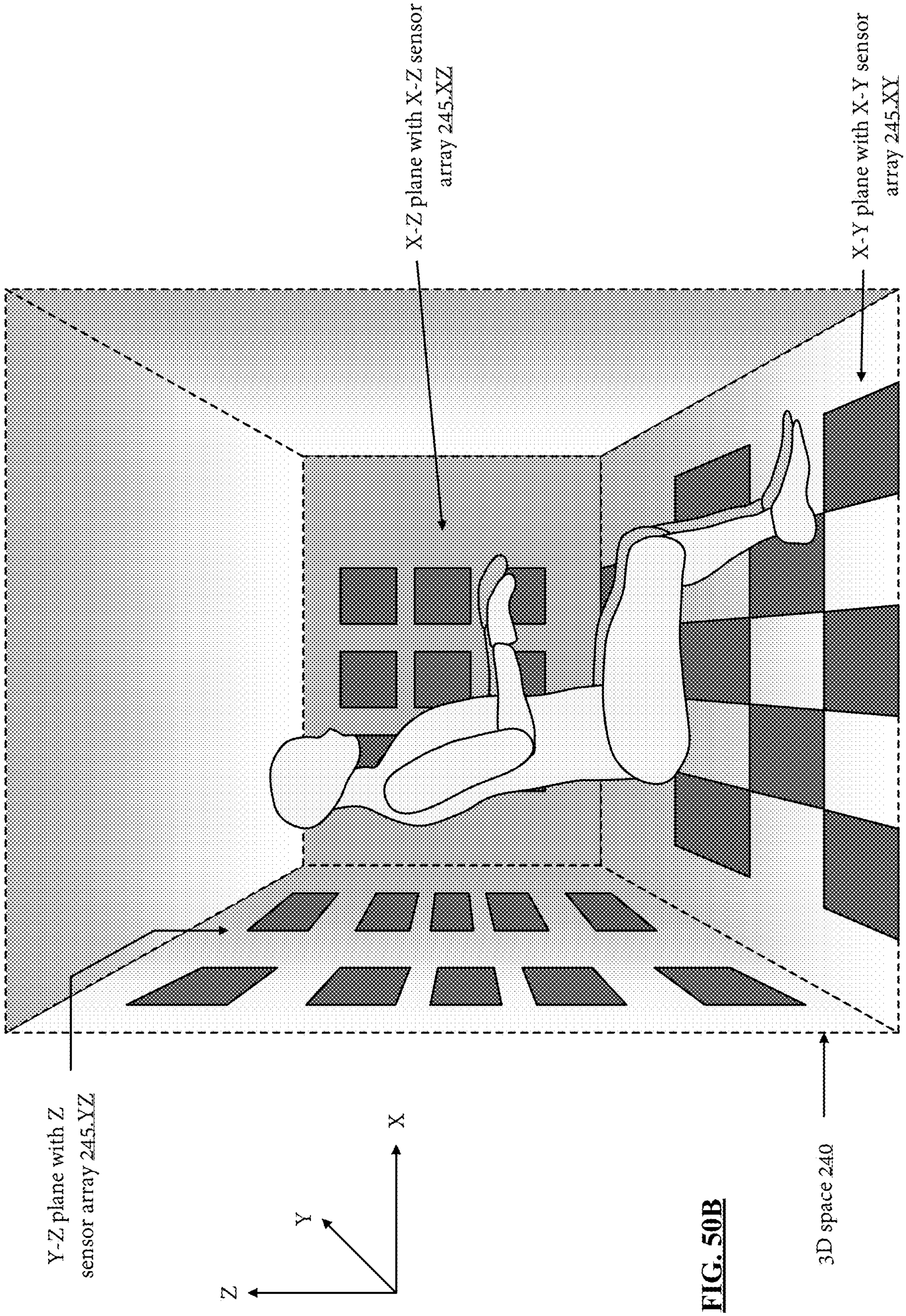
FIG. 50B is a schematic block diagram of an example of three-dimensional (3D) sensing using X, Y, and Z sensors in accordance with various embodiments.

FIG. 50A is a schematic block diagram of an embodiment of three-dimensional (3D) space 240 having X, Y, and Z sensors for 3D object sensing. FIG. 50B is a schematic block diagram of an embodiment of the 3D space 240 of FIG. 50A that is occupied by a person or other object, where the 3D object sensing is performed to enable: detection of the presence of the person or other object; measuring of the size of the person or other object; determination of contours of the person or other object; mapping of the configuration of the person or other object, such as the location and/or orientation of various body parts of a person at a given time; and/or other mapping of people or objects in the 3D space.

In this example of FIGS. 50A and 50B, a set of three sensor arrays are included on three orthogonal planes, such as the floor and two walls, of the 3D space 240: an X-Y sensor array 245.XY upon an X-Y plane of the 3D space; an X-Z sensor array 245.XZ upon an X-Z plane of the 3D space; and a Y-Z sensor array 245.YZ upon a Y-Z plane of the 3D space. Other sensor arrays can be implemented via any number of different orthogonal or non-orthogonal planes in the same 3D space in other embodiments. The 3D space 240 can be a vehicle, such as any embodiment of a vehicle discussed in conjunction with FIGS. 1-47 and/or any other vehicle. The 3D space can be any indoor and/or outdoor space, such as a room of a building.

Each sensor array 245 can include a plurality of sensor electrodes 207 or other sensors, and a plurality of corresponding sensor circuits 215. Each sensor electrode 207 having a corresponding sensor circuit 215 is denoted as a different shaded block of the corresponding plane. For example, each sensor array 245 includes such electrodes or other sensors arranged in a grid pattern, checkered pattern, or otherwise dispersed across the plane in a uniform pattern for sensing coverage across all relevant portions of the corresponding plane. The same or different pattern and/or spacing of electrodes can be applied for sensor array on the various planes.

Some or all sensor electrodes 207 and corresponding sensor circuits 215 can be operable to receive and process e-fields as electrodes 206 and/or 405 of circuits 216, 116, and/or 117, for example, to detect frequencies transmitted via other electrodes of sensor arrays in the 3D space. Some or all sensor electrodes 207 can be operable to alternatively or additionally transmit signals to induce a corresponding e-field at a corresponding frequency as electrodes 205 and/or 305 of circuits 214, 114, 117, and/or 118, for example, for detection via other electrodes of sensor arrays in the 3D space. In particular, a given electrode 207 can optionally transmit a signal at their own respective frequency, where e-fields induced by other electrodes 207 having different unique frequencies cause detectable changes to the impedance of the given electrode 207 enabling the given sensor circuit 215 to further detect presence of objects in the 3D space.

The sensed signal data generated by different sensor circuits 215 across different planes can be processed via a processing module to facilitate generation of 3D mapping data indicating the presence of, location of, and/or shape of objects in the 3D space. Two sensor arrays 245 upon two different planes in the 3D space 240 can be sufficient to determine general object location and/or size. Three or more planes can be implemented to further determine object contour.

Figure 51:
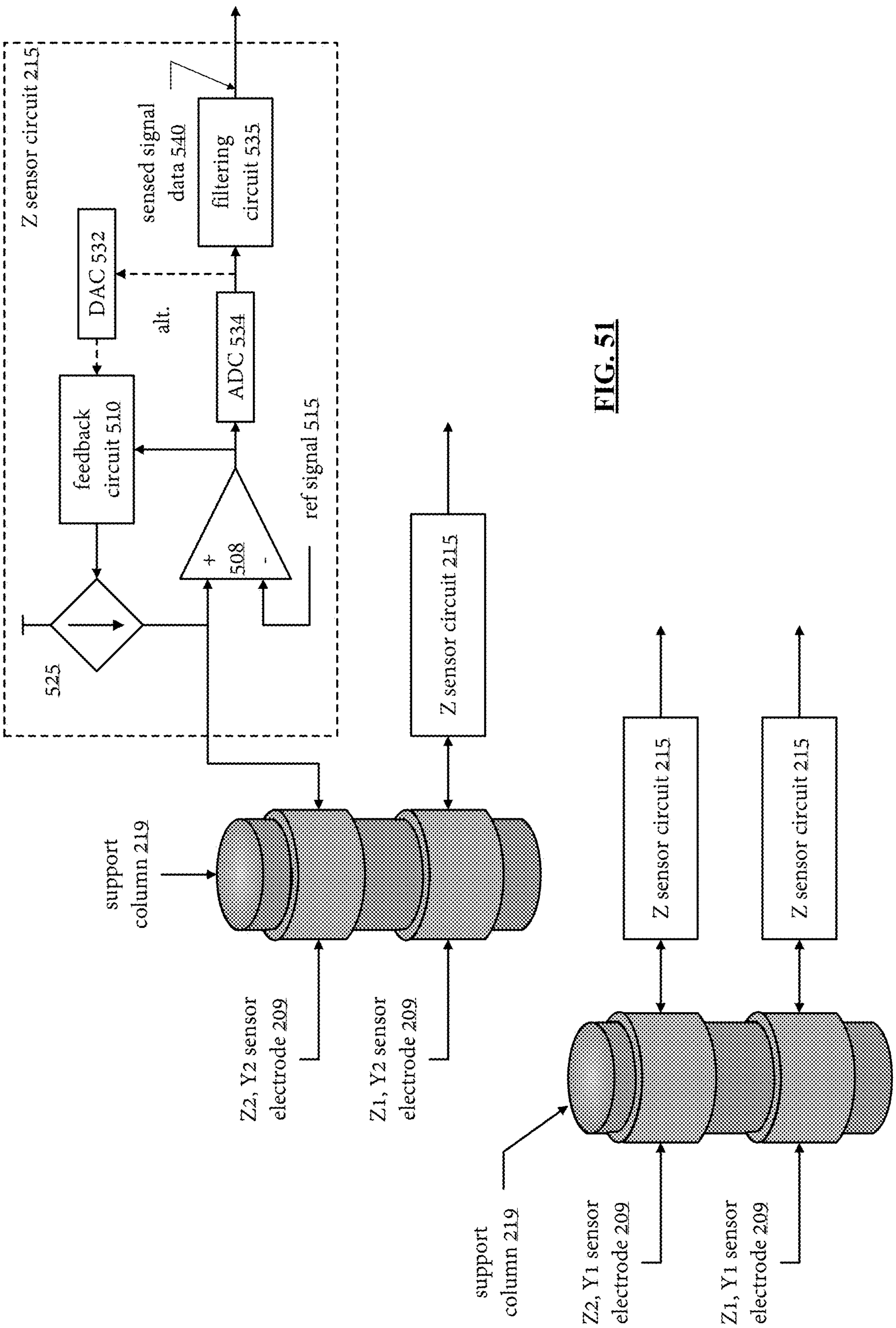
FIG. 51 is a schematic block diagram of an embodiment of Z sensor circuits in accordance with various embodiments.

FIG. 51 is a schematic block diagram of an embodiment of Z sensor circuits 215. Alternatively to a sensor array in 3D space including electrodes 207 implemented as a plurality of flat plates, the Z sensor circuits 215, such as some or all sensor circuits of the X-Z plane or Y-Z plane, can be coupled to supported sensor electrodes 209 that partially or fully surround a corresponding cylinder, or other shape, of a corresponding support structure, such as support column 219 of FIG. 51. The sensor electrodes 209 can utilize some or all functionality of electrodes 207, where sensor electrodes 209 are not flat and/or otherwise have non-flat surfaces upon which signals can be transmitted and/or whose impedance can change due to e-fields in the vicinity, as illustrated in FIG. 51. Any other electrodes described herein can be implemented via some or all functionality of the sensor electrodes 209 of FIG. 51.

In such embodiments, a given sensor electrode of a given plane, such as the Y-Z plane as illustrated in FIG. 51, does not have a corresponding surface that is flat upon the given plane, but instead fully or partially surrounds a support structure, such as a support column 219 or other rod extending in the z direction. In the case where the support column 219 extends in the z direction, the sensor electrode 209 can thus have a portions of its surface upon multiple planes, rather than just a single plane such as the X-Y plane or the Y-Z plane, such as multiple different of planes that are tangent to a circular cross-section of the electrode 209 perpendicular to the z direction, and/or multiple planes that include segments of a polygonal cross-section of the electrode 209 perpendicular to the z direction. This can enable the electrode 209 to transmit and/or receive signals from a plurality of different directions. A corresponding ground plane can similarly partially surround the support column for each electrode 209 as illustrated and discussed in conjunction with FIG. 52.

A given support column 219 can include multiple sensor electrodes 209 with corresponding sensor circuits 215. Multiple different support columns including one or more such sensor electrodes 209 can lie upon the same plane, such as the Y-Z plane as illustrated FIG. 51. A set of support columns 219 of a given plane can all be parallel, such as all extending in the z direction as illustrated in FIG. 51. Optionally, one or more support columns can extend in different, non-parallel directions on the same plane.

In cases where the z-direction is perpendicular to the ground and/or opposite the direction of gravity, the support columns 219 supporting the electrodes 209 in this fashion can be ideal in enabling these electrodes to be supported above the ground. Other support mechanisms can optionally be utilized to support any electrodes 209, for example, where electrodes 209 are implemented as flat electrodes 207 upon flat surfaces of the 3D space such as walls, the floor, the ceiling, flat siding of support structures, or other flat surfaces. While FIG. 51 depicts the support columns as having a central axis running along the corresponding column parallel to the z direction.

Support columns 219 can optionally run in any direction, and can optionally be in a direction non-parallel to the x, y, or z axis. Support columns 219 can optionally implemented based on a corresponding frame and/or support of the corresponding 3D space, such as a vehicle frame of a corresponding vehicle and/or other frame supporting walls, a ceiling, and/or other elements of the given 3D space, where the existing infrastructure of the 3D space required to support elements of the 3D space are leveraged as support columns 219 or other support mechanisms to support electrodes flat upon their flat and/or encasing some or all of the inner and/or outer surface of their non-flat surface.

While each support column 219 of FIG. 51 includes two electrodes 209, more than two electrodes can be included in a given column. The spacing between electrodes 209 on a given column can be uniform, where all spacing is the same. The spacing between electrodes 209 can optionally different, for example, increasing and/or decreasing monotonically up and/or down the column in accordance with an exponential and/or logarithmic function. Any non-monotonically increasing or decreasing spacing between electrodes 209 on a given column can be applied, for example, where higher densities of electrodes 209 are included in places in the corresponding direction where occupancy is more likely to be detected and/or where more granularity of location determination is desired, and/or where spacing of electrodes is based on restrictions in infrastructure of the support column enabling support of other elements of the given 3D space, such as a roof, ceiling, or windshield. Different support columns 219 on the same plane or different planes can have a same or different number of electrodes with same or different spacing.

The Z sensor circuit 215 of a given electrode 209 can be implemented in a same or similar fashion as a DSC circuit 117 as illustrated in FIG. 51, in a same or similar fashion as the receiver 216 and/or a transmitter 214 of FIG. 50A, in a same or similar fashion as a sensor circuit 116, in a same or similar fashion as an ID circuit 114 and/or 118, and/or utilizing some or all features and/or functionality of any circuit described herein. Note that the Z sensor circuit 215 of FIG. 51 corresponds to electrodes 209 of a support column 219 extending in the z direction. Other sensor circuits 215 can be identically and/or similarly implemented for other electrodes 209 and/or 207 of a 3D space of any support column in any direction and/or upon any plane of the 3D space.

Figure 52:
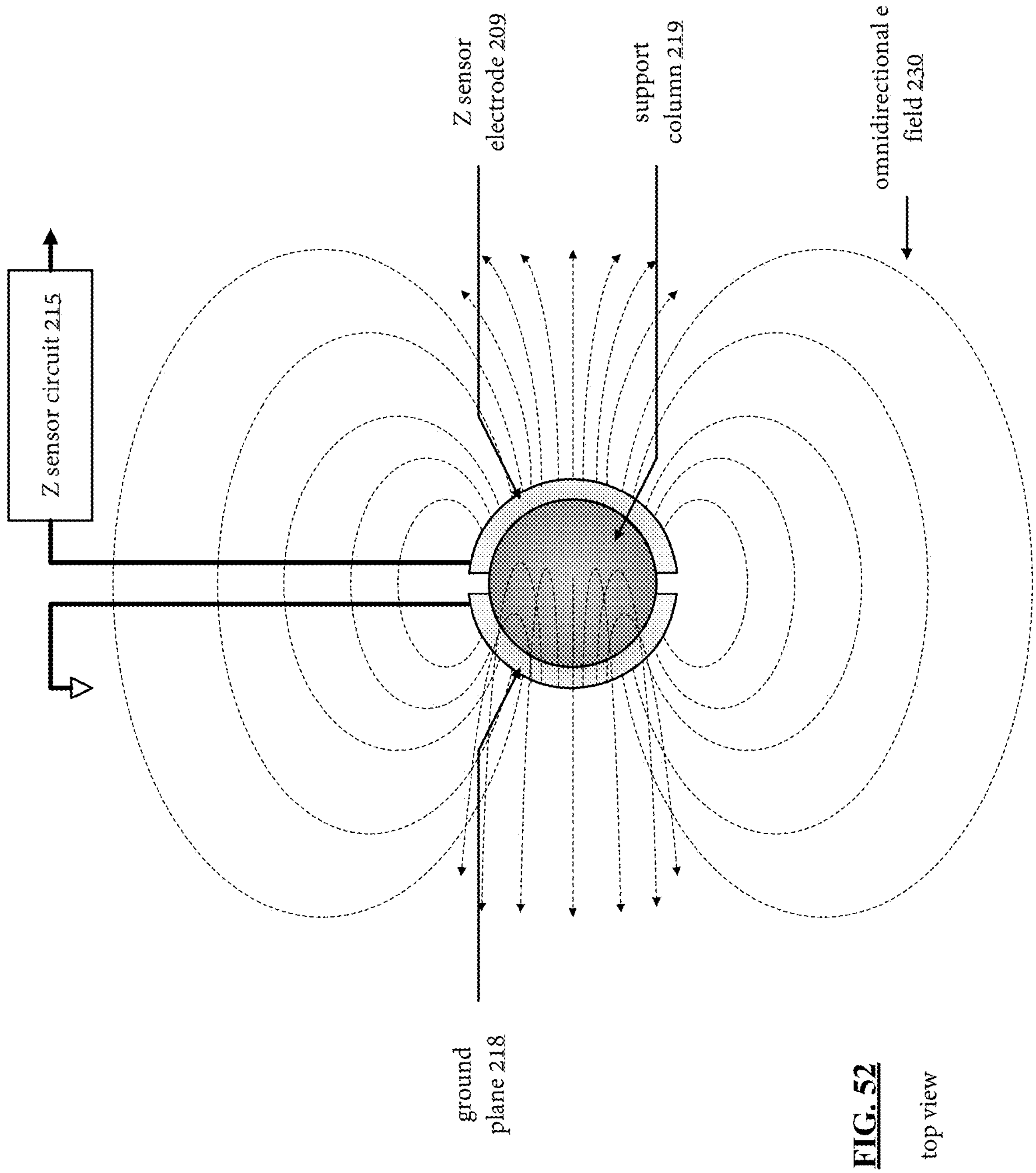
FIG. 52 is a schematic block diagram of an example of e-field radiation of a Z sensor circuit in accordance with various embodiments.

FIG. 52 is a schematic block diagram of an example of e-field radiation of a Z sensor circuit. A top view and/or cross-sectional view of a support column 219 is presented, illustrating how a given Z sensor electrode partially surrounds the support column 219, for example, encasing less than or approximately equal to 180 degrees around the cylindrical surface of the support column 219. The opposing side of the support column 219 can be partially surrounded via a ground plane 218 corresponding to the electrode 209, for example, where the corresponding ground plane 218 also encasing less than or approximately equal to 180 degrees around the cylindrical surface of the support column 219, for example, at a same lengthwise along the column, were a top end of the z sensor electrode 209 and ground plane 218 optionally end at a boundary defined by a same plane intersecting the support column perpendicular to the z direction or other direction through which the support column runs, and/or where a bottom end of the z sensor electrode 209 and ground plane 218 optionally end at another boundary defined by another same plane intersecting the support column perpendicular to the z direction or other direction through which the support column runs, perpendicular to the first same plane, where a distance between the first same plane and second same plane define a portion of the rod along the z direction or other direction that thus includes both the z sensor electrode 209 and the corresponding ground plane 218. Some or all other electrodes 209 of a given support column can similarly surround the support column 219 along one side with a corresponding ground plane 218 along the other side. Note that the ground "plane" 218 need not lie flat, and can optionally correspond to a portion of a cylindrical surface as illustrated in FIG. 52.

The resulting e-field of the given electrode 209, due to a signal being transmitted upon the electrode 209 based on the reference signal, can be omnidirectional and/or substantially omnidirectional with respect to a plane orthogonal to the axis through which the support structure runs, such as the z axis, due to the configuration of the Z sensor electrode and ground plane together fully encircling and/or almost fully encircling the support column 219. This can be ideal in enabling transmission of the corresponding e-field in 360 degrees for detection by a wider number of other sensor circuits 215 of the 3D space.

Figure 54:
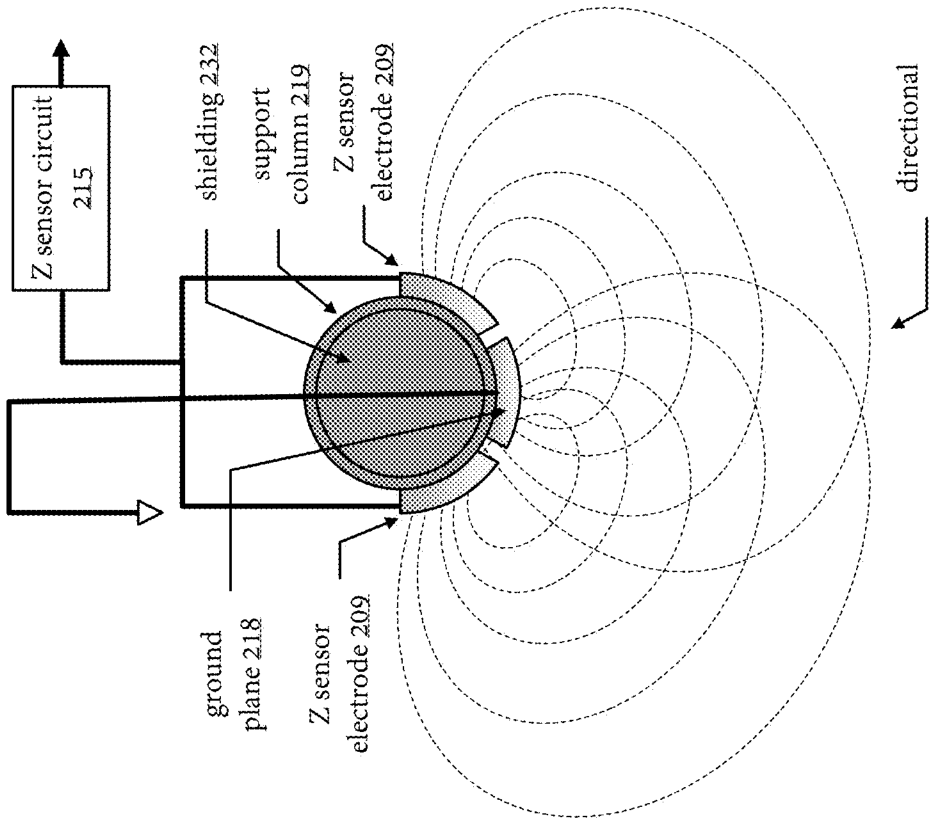
FIG. 54 is a schematic block diagram of another example of e-field radiation of a Z sensor circuit in accordance with various embodiments.
Figure 53:
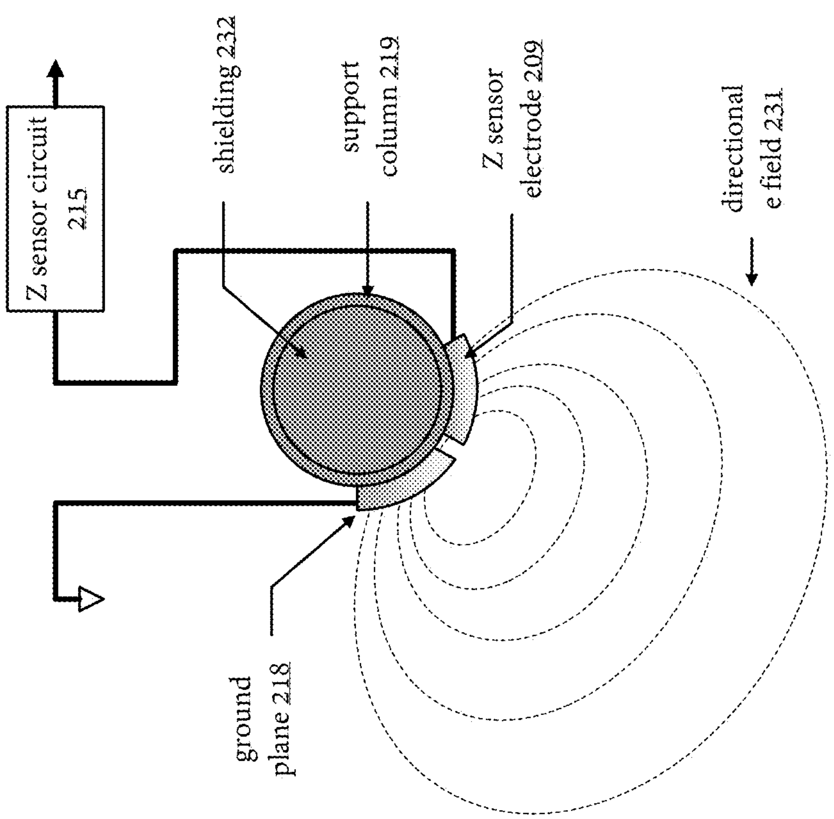
FIG. 53 is a schematic block diagram of another example of e-field radiation of a Z sensor circuit in accordance with various embodiments.
Figure 55:
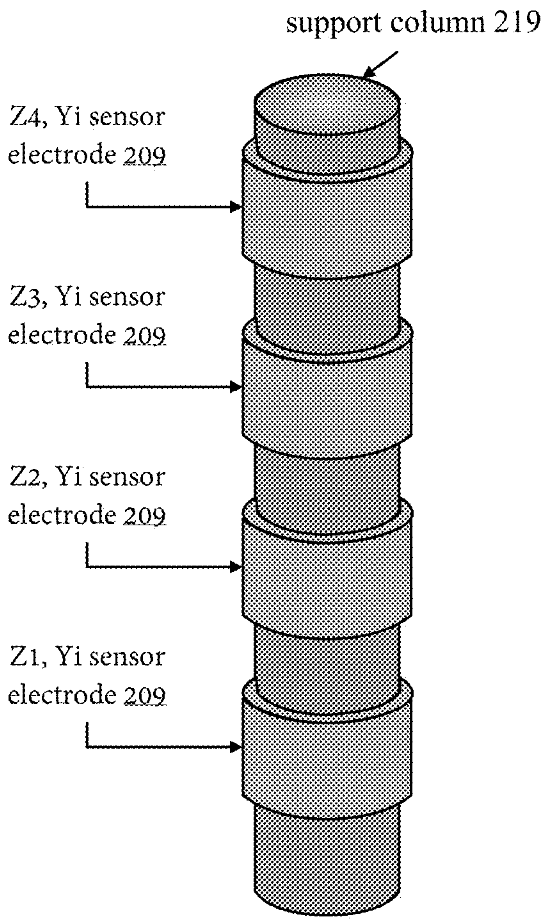
FIG. 55 is a schematic block diagram of another embodiment of Z sensor circuits in accordance with various embodiments.

FIGS. 53 and 54 are schematic block diagrams of examples of e-field radiation of Z sensor circuits that result in directional e-fields. Rather than collectively fully or substantially encircling the cylindrical surface of the support structure as illustrated in FIG. 52 to induce an omnidirectional e-field, the electrode 209 and corresponding ground plane 218 can partially surround the cylindrical surface of the support structure to induce a directional e-field 231. In the embodiment of FIG. 54, a single Z sensor electrode and corresponding ground plane 218 collectively encompass less than 180 degrees of the outer surface of the support structure, and induce a directional e-field 231 accordingly, for example, centered at the gap between the Z sensor electrode and corresponding ground plane 218. In the embodiment of FIG. 55, a two different Z sensor electrodes 209 of a same sensor circuit 215 and corresponding ground plane 218 between these two different Z sensor electrodes also collectively encompass less than 180 degrees of the outer surface of the support structure, and induce a directional e-field 231 accordingly, for example, centered at the gap between the Z sensor electrode and corresponding ground plane 218. The column support 219 can further be implemented to include shielding 232 to induce the corresponding directional e-field 231. Such embodiments can be preferred in cases where object detection is not implemented omnidirectionally relative to a given support structure, for example, where the support structure is implemented as and/or within an outer wall, door, frame, or boundary of the 3D space and does not facilitate object detection outside the 3D space.

FIGS. 55-57A are a schematic block diagrams of example embodiments of electrodes 209 of Z sensor circuits on a given support column 219. FIG. 55 illustrates an embodiment where linear spacing is employed, where distances between respective sensors 209 on the support column 219 are equally spaced along the support column 219, for example, in accordance with a linear function. FIG. 56 illustrates an embodiment where non-linear spacing, such as squared spacing, is employed, where distances between respective sensors 209 on the support column 219 are non-equally spaced and monotonically increasing, for example, based on the squaring of a number denoted by an ordering of a corresponding electrode, where a first distance is a factor of 1, the second distance is a factor of 4, and the third distance is a factor of 9. Other non-linear functions utilized to space respective sensors 209 on the support column 219 can similarly be employed.

Figure 57A:
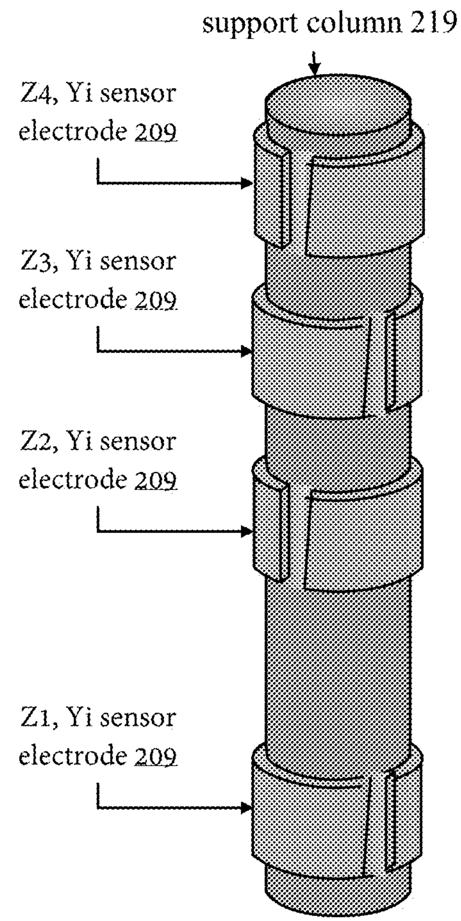
FIG. 57A is a schematic block diagram of another embodiment of Z sensor circuits in accordance with various embodiments.

The sensors 209 of the examples of FIGS. 55 and 56 can optionally implement omnidirectional electrodes 209 and/or electrodes with a directional e-field in a same direction with respect to the z axis or other axis of the corresponding support column. As illustrated in FIG. 57A, linearly, and/or non-linearly spaced electrodes 209 can further be implemented to induce different, discrete directional zones based on configuring the portions around the support column which each sensor electrode and each corresponding ground plane are positioned, for example, with respect to a cross-sectional surface of the support column 219. For example, some or all different electrodes 209 can be configured to emit directional e-fields in different directions relative to the z axis or other axis of the corresponding support column, for example, each centered based on a center of the portion in which the corresponding one or more electrodes and corresponding ground plane is positioned as illustrated and discussed in conjunction with FIGS. 53 and 54.

Figure 57B:
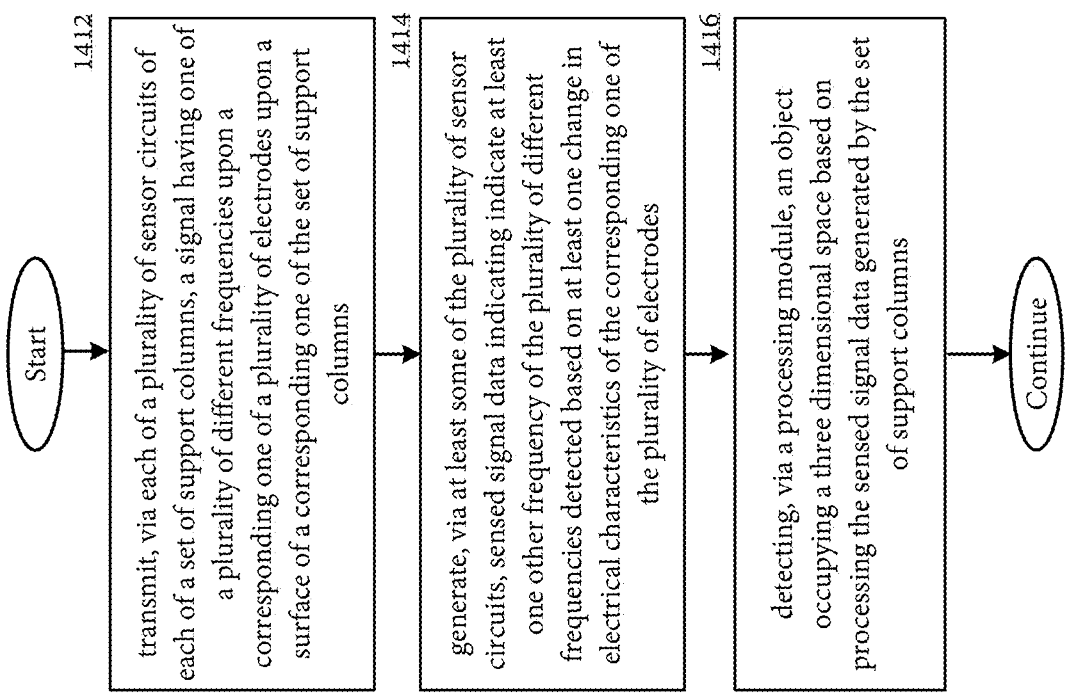
FIG. 57B is a logic diagram illustrating an example method for execution in accordance with various embodiments.

FIG. 57B is a logic diagram illustrating a method of detecting an object occupying a three-dimensional space via one or more support columns 219. Some or all of the method of FIG. 76B can be performed via a processing module 250, at least one sensor circuit 215, at least one transmitter 214, and/or at least one receiver 216. for example, based on some or all functionality discussed in conjunction with one or more of FIGS. 51-57A and/or FIGS. 58-64. Some or all of the method of 57B can be performed via any computing entity of FIGS. 2A-2D and/or any processing module, which can be associated with a corresponding vehicle, a vehicle sensor system 100, another sensor system, or any other system, for example, that includes sensor circuits 215 on multiple planes operable to transmit a signal at a respective frequencies and/or to detect frequencies transmitted by other sensor circuits. Some or all of the method of 57B can be performed based on performing the method of FIG. 76A or 76B and/or some or all steps of any other method described herein.

Step 1412 includes transmitting, via each of a plurality of sensor circuits of each of a set of support columns, a signal having one of a plurality of different frequencies upon a corresponding one of a plurality of electrodes upon a surface of a corresponding one of the set of support columns. Step 1414 includes generating, via at least some of the plurality of sensor circuits, sensed signal data indicating indicate at least one other frequency of the plurality of different frequencies detected based on at least one change in electrical characteristics of the corresponding one of the plurality of electrodes. Step 1416 includes detecting, via a processing module, an object occupying a three dimensional space based on processing the sensed signal data generated by the set of support columns.

In various embodiments, a sensor system includes a set of one or more support columns, such as support columns 219. Each support column can include a first end and a second end in their longest dimension. A line from the first end to a second end of each support column can be in a first direction, where the first direction for all of the set of support columns are optionally parallel. Alternatively, the first direction for two or more support columns is orthogonal or otherwise non-parallel.

Each support column can include a plurality of electrodes, such as electrodes 209, spaced upon the surface of the support column in the longest dimension between the first end and the second end. Each of the plurality of electrodes can encase, or otherwise be included upon, at least a portion of an outer surface of the support column.

Each support column can further include and/or be coupled to a plurality of sensor circuits corresponding to the plurality of electrodes, such as sensor circuits 215. Each of the plurality of sensor circuits can be operable to transmit a signal having one of a plurality of different frequencies upon a corresponding one of the plurality of electrodes. For example, the frequency of the signal transmitted by any one of the plurality of sensor circuits on a given support column can be different from all frequencies of signals transmitted by all other ones of the plurality of sensor circuits on the same support column, as well as all other pluralities of sensor circuits on other ones of the set of support columns.

Each of the plurality of sensor circuits can be further operable to generate sensed signal data indicating at least one other frequency of the plurality of different frequencies detected based on at least one change in electrical characteristics, such as changes in impedance, of the corresponding one of the plurality of electrodes.

The sensor system can further include a processing module, such as processing module 250, that is operable to determine an object is occupying a three dimensional space based on processing the sensed signal data generated by the set of support columns. For example, the sensor system can further determine the location, size, shape, and/or contouring of the object based on some or all functionality described in further detail herein.

In various embodiments, the first direction is orthogonal to a plane of the planar array of electrodes. In various embodiments, the first direction is orthogonal to the direction of gravity and/or includes at least one component orthogonal to the direction of gravity. In various embodiments, the first direction of all of the support columns are included on a same plane, such as the z-y plane and y-z plane. In various embodiments, the first direction of all of the support columns are included on two or more different planes, such as the z-y plane and the y-z plane illustrated and discussed herein. The two or more different planes can be orthogonal planes.

In various embodiments, the set of support columns are integrated within a support structure of a three-dimensional space. For example, the three-dimensional space is a bounded space, such as a building, a room, a vehicle, or a covered outdoor space. In various embodiments, the support columns are integrated within at least one of: walls, columns, beams, a floor, or a ceiling of the bounded space.

In various embodiments, the outer surface of the support column is a cylindrical surface, and wherein plurality of electrodes encase at least a portion of the cylindrical surface. In various embodiments, the some or all of plurality of electrodes of at least one of the set of support columns induce an omnidirectional e-field based on a fraction of the circumference of the cylindrical surface encased by the plurality of electrodes being greater than a threshold fraction, for example, as illustrated in FIG. 52. In various embodiments, some or all of plurality of electrodes of at least one of the set of support columns each induce a directional e-field in a direction orthogonal to the first direction based on a fraction of the circumference of the cylindrical surface encased by the plurality of electrodes being less than a threshold fraction, for example, as illustrated in FIG. 53 and/or FIG. 54. In various embodiments, the directional e-field induced by the plurality of electrodes are in a set of parallel directions. In various embodiments, directional e-field induced by the plurality of are in a set of non-parallel directions, for example, as illustrated in FIG. 57A.

In various embodiments, plurality of electrodes of at least one of the set of support columns are spaced in accordance with a linear spacing, for example, as illustrated in FIG. 55. In various embodiments, the plurality of electrodes of at least one of the set of support columns are spaced in accordance with a non-linear spacing, for example, as illustrated in FIGS. 56 and 57A. In various embodiments, the non-linear spacing can be in accordance with exponential function and/or a logarithmic function. In various embodiments, the spacing between electrodes monotonically increases from the first end to the second end.

In various embodiments, the sensor system further includes at least one planar array of electrodes. The at least one planar array of electrodes can include a second plurality of sensor circuits each operable to: transmit a signal having one of the plurality of different frequencies upon at least one corresponding electrode of the planar array of electrodes; and/or generate sensed signal data indicating indicate at least one other frequency of the plurality of different frequencies detected based on at least one change in electrical characteristics of the upon at least one corresponding electrode of the planar array of electrodes. Detecting the location occupied by the object in three dimensional space can be further based on processing the sensed signal data generated by the second plurality of sensor circuits.

Figure 58:
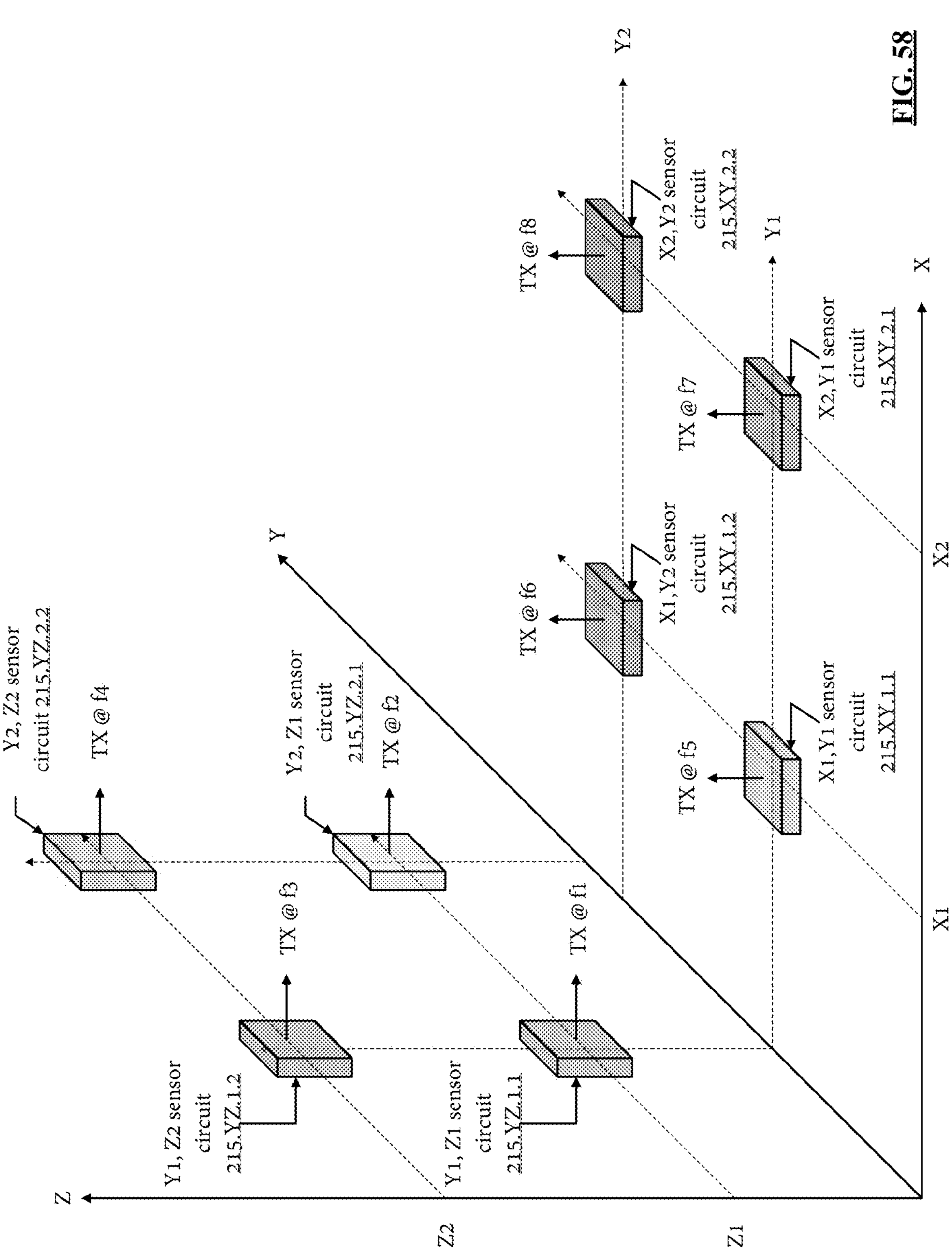
FIG. 58 is a schematic block diagram of an example of sensor circuits in a Y-Z plane and an X-Y plane in accordance with various embodiments.

FIG. 58 is a schematic block diagram of an example of sensor circuits in a Y-Z plane and an X-Y plane. Some or all of the sensor circuits 215 of FIG. 58 can be implemented to include electrodes 207 of FIGS. 50A and 50. For example, some or all of the electrodes of sensor circuits 215 of FIG. 58 are flat electrodes 207 lying flush to the corresponding planes. Alternatively or in addition, some or all electrodes of sensor circuits 215 of FIG. 58 are non-flat electrodes, such as electrodes 209 partially or fully surrounding a corresponding support column 219 and emitting directional or non-directional e-fields accordingly, such as directional e-fields centered in a direction orthogonal to the corresponding plane, based on implementing some or all features and/or functionality discussed in conjunction with FIGS. 51-57. For example, each plane includes two support columns 219 that each include two electrodes of the sensor circuits 215, where the two support columns 219 of the X-Y plane have parallel axes extending in the X direction or the Y direction along the X-Y plane, and/or where the two support columns 219 of the Y-Z plane have parallel axes extending in the Y direction or the Z direction along the Y-Z plane. Some or all features and/or functionality of FIG. 58 can implement the sensor arrays of FIGS. 50A and/or 50, and/or can implement any sensor circuits and/or corresponding electrodes described herein.

Figure 59:
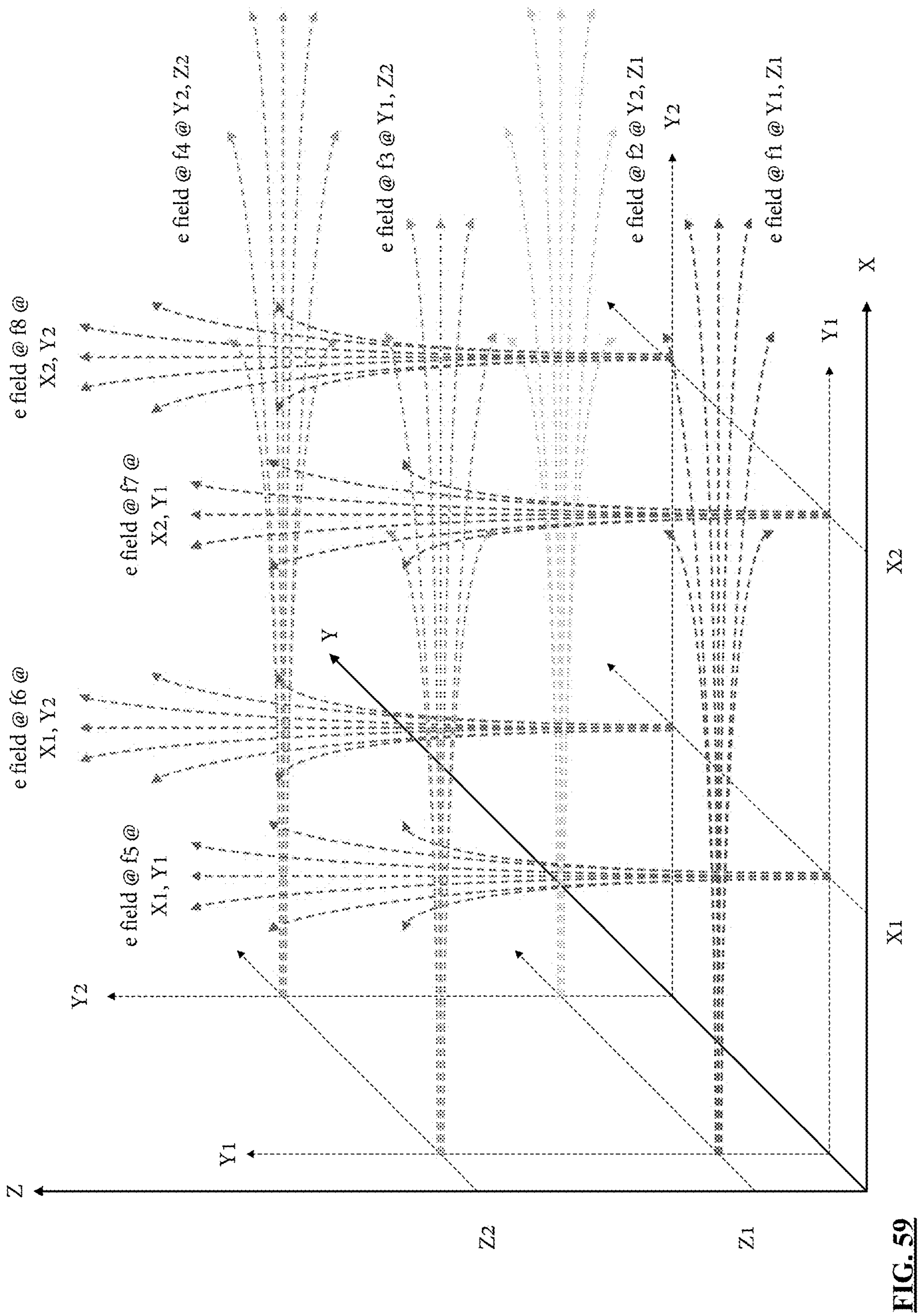
FIG. 59 is a schematic block diagram of an example of e-fields produced by sensor circuits in a Y-Z plane and an X-Y plane in accordance with various embodiments.

FIG. 59 is a schematic block diagram of an example of e-fields produced by sensor circuits upon the Y-Z plane and the X-Y plane, such as the sensor circuits of FIG. 58. Each e-field can be directional and can be centered at a direction perpendicular to the corresponding plane, for example, extending from a position on the corresponding plane corresponding to a position of the corresponding electrode 207 of FIG. 58, as illustrated in FIG. 59. Each e-field generated by a given sensor circuit 215 can have a corresponding frequency, for example, uniquely identifying the corresponding sensor circuit 215, such as the known position of the corresponding electrode emitting the corresponding e-field. In this example, the depicted set of eight electrodes upon the two orthogonal planes each emit e-fields having oscillating components at one of a corresponding set of different, identifying frequencies f1-f8.

FIGS. 60-64 are schematic block diagram of an example of e-fields produced by sensor circuits in a Y-Z plane and an X-Y plane for sensing an object when an object is present. For example, FIGS. 60-64 present examples of the Y-Z plane and the X-Y plane of the 3D space of FIG. 59 when an object is present. The thicker outlines of e-fields depicted in FIGS. 60-64 denote e-fields engaged for an object, for example, based on propagating through the object, such as a person and/or other object through which the e-field is propagated, due to the position of their respective electrodes in the 3D space, the directionality of the e-fields from these respective electrodes, and/or the position of the object in the 3D space. The e-fields passing through an object can have a change in intensity and/or other changes in characteristics that are detectable by other sensors, such as other sensor circuits 215 that are also emitting their own e-field at their own frequency.

For example, the electrode of a given sensor circuit 215 detects one or more signals at given frequencies due to a corresponding e-fields being transmitted by one or more other corresponding sensor circuits 215. Changes in corresponding electrical characteristics of the electrode 207 of this given sensor circuit 215 over time can be detected via the given sensor circuit 215, where changes in intensity of and/or other characteristics of one or more of these frequencies can be detected and processed to indicate that the e-fields are passing through an object, rather than air and/or empty space. The sensed signal data generated across all sensor circuit 215 can be processed via a processing module to identify which corresponding electrodes experienced changes in impedance patterns induced by various e-fields emitted by other electrodes, where the location of each electrode sensing changes in e-fields and the location of each electrode inducing these e-fields whose changes were sensed can be utilized to determine whether an object is present, and to determine the size and location of a corresponding object accordingly.

Figure 60:
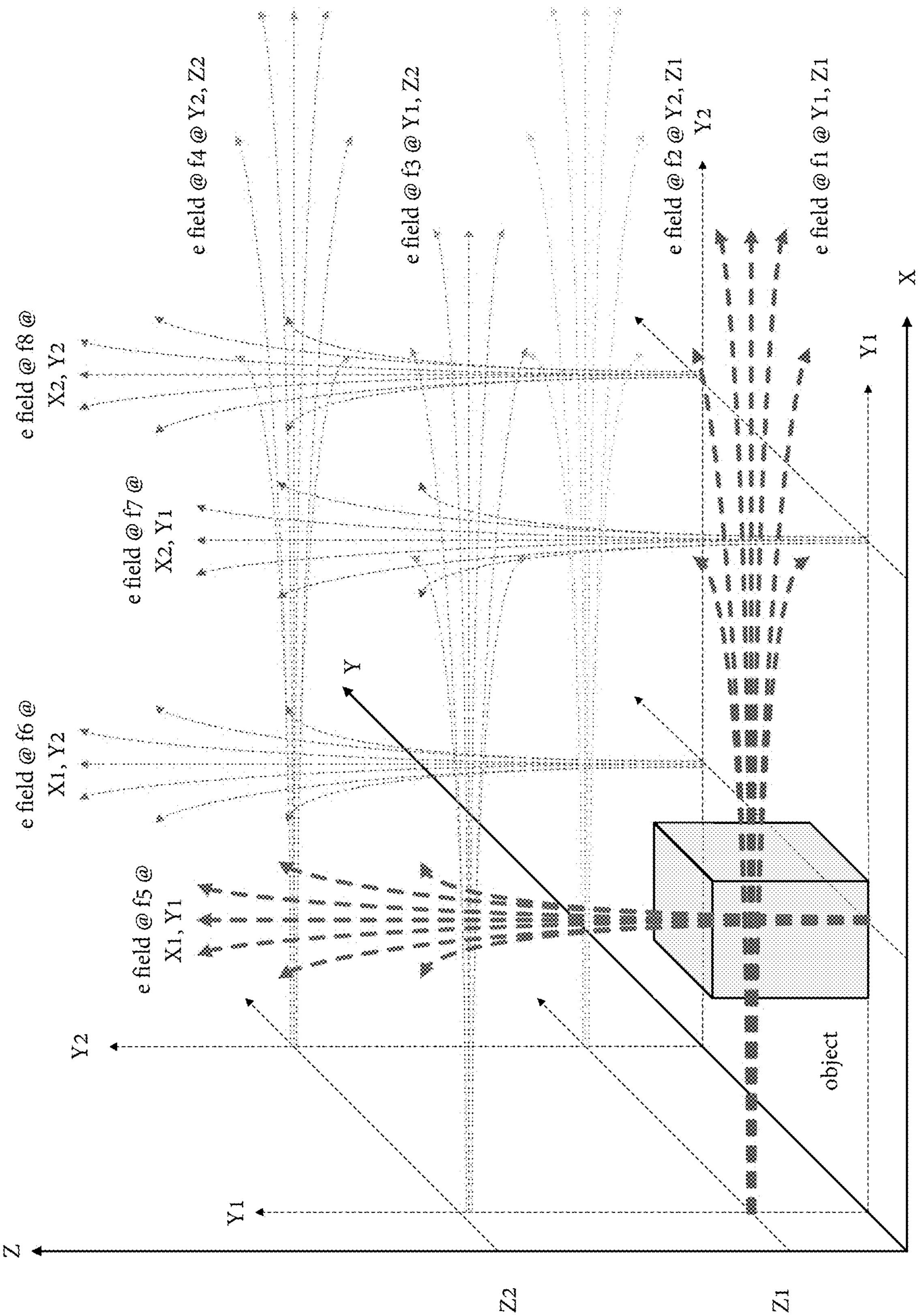
FIG. 60 is a schematic block diagram of an example of e-fields produced by sensor circuits in a Y-Z plane and an X-Y plane for sensing an object in accordance with various embodiments.

In the example of FIG. 60, an object is detected and its location is determined based on the sensor circuit 215 at Y1, Z1 detecting the e-field with frequency f5 due to the presence of an object and/or the sensor circuit 215 at Y1, Z1 detecting the e-field with frequency f1 due to the presence of the object. Other sensors circuits 215 of the Y-Z plane may not detect the e-field with frequency f5 due to the presence of the object not being in proximity to these other sensors circuits 215 of the Y-Z plane, and thus not propagating the corresponding e-field to their respective electrodes. Other sensors circuits 215 of the X-Y plane may not detect the e-field with frequency f1 due to the presence of the object not being in proximity to these other sensors circuits 215 of the X-Y plane The approximate size, location, and/or shape of object can be determined based on processing corresponding sensed signal data indicating: only sensor circuit sensor circuit 215 at Y1, Z1 detecting the e-field with frequency f5, only sensor circuit sensor circuit 215 at X1, Y1 detecting the e-field with frequency f1, and/or no other e-fields detected by sensor circuits 215 and/or being detected to change from a base state indicating no occupancy. For example, the object can be determined to be in the intersection of a line in the x direction passing through Y1, Z1 and another line in the z direction passing through X1, Y1, i.e. at point X1, Y1, Z1 in the 3D space, based on sensing of both corresponding e-fields emitted from these electrodes in these respective directions, and/or based on detecting changes in characteristics induced by these e-fields from a base state corresponding to no occupancy. The same object and/or or other objects are determined not to be present at any other intersections of other corresponding lines extending from electrodes in the X-Y plane in the z direction with lines extending from electrodes in the Y-Z plane in the x direction, and thus not be in the space of any corresponding points, due to corresponding e-fields not being detected and/or being detected as not changing from a base state indicating no occupancy.

In some embodiments, based an intensity and/or level of the detected e-fields, the processing module can determine an approximate 3D contour of object. In some cases, detection of the f1 e-field and/or the f5 e-field by other sensor circuits 215 on the X,Y plane or the Y,Z plane can be processed to aid in determining contour of object.

Figure 61:
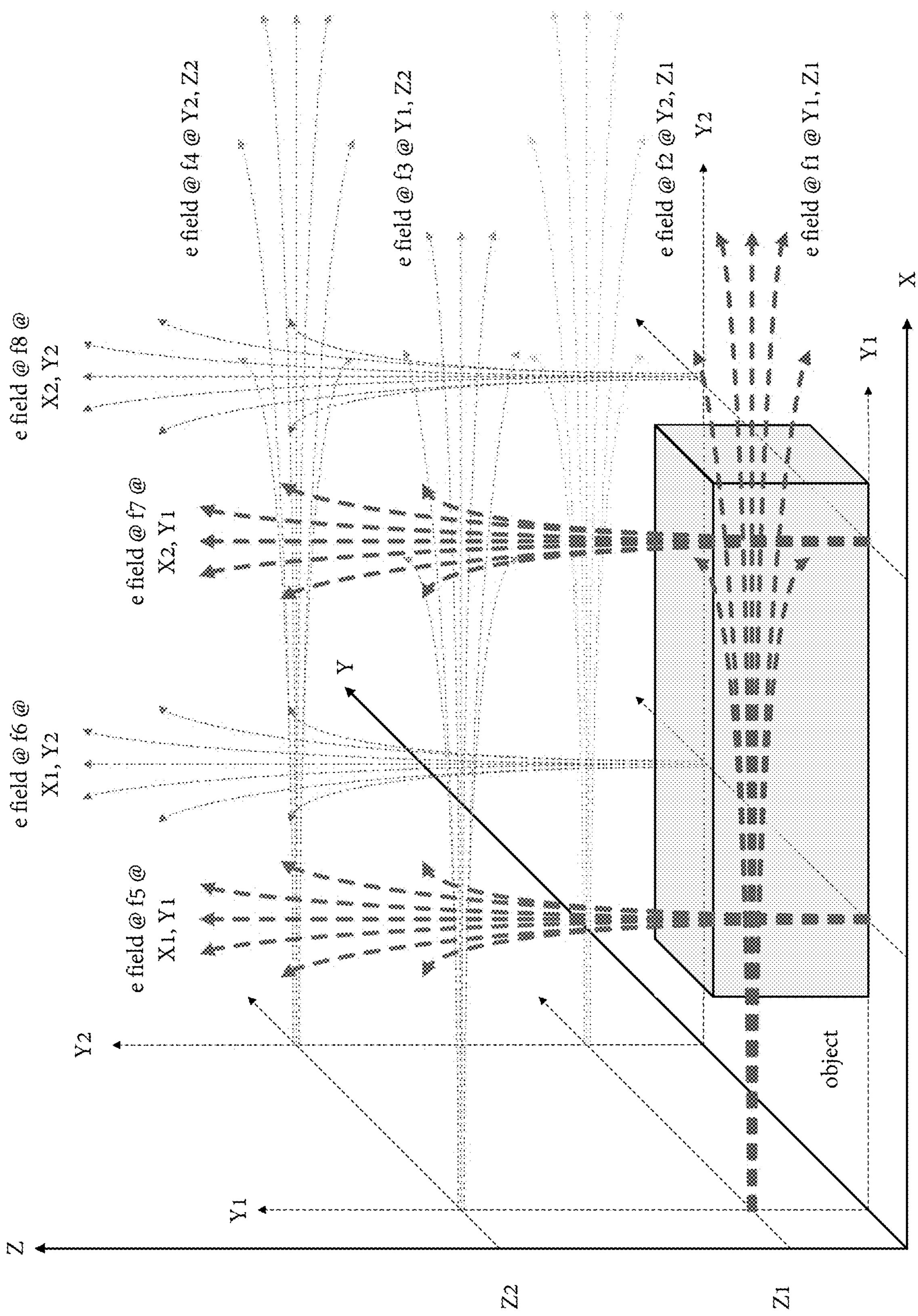
FIG. 61 is a schematic block diagram of another example of e-fields produced by sensor circuits in a Y-Z plane and an X-Y plane for sensing an object in accordance with various embodiments.

In the example of FIG. 61, the e-fields f5 and f1 are again detected as discussed in conjunction with FIG. 60 due to an object again being at the corresponding location. However, due to the object extending further in the x direction in the example of FIG. 61, the e-field with frequency f7 emitted by the electrode at X2, Y1 is detected by the sensor circuit 215 at Y1, Z1, and/or the e-field with frequency f1 is detected by the sensor circuit 215 at X1, Y1. These further detections can indicate that a corresponding object is present. For example, the object can be determined to be in the space of both points X1, Y1, Z1 and X2, Y1, Z1, and/or not other points.

Figure 62:
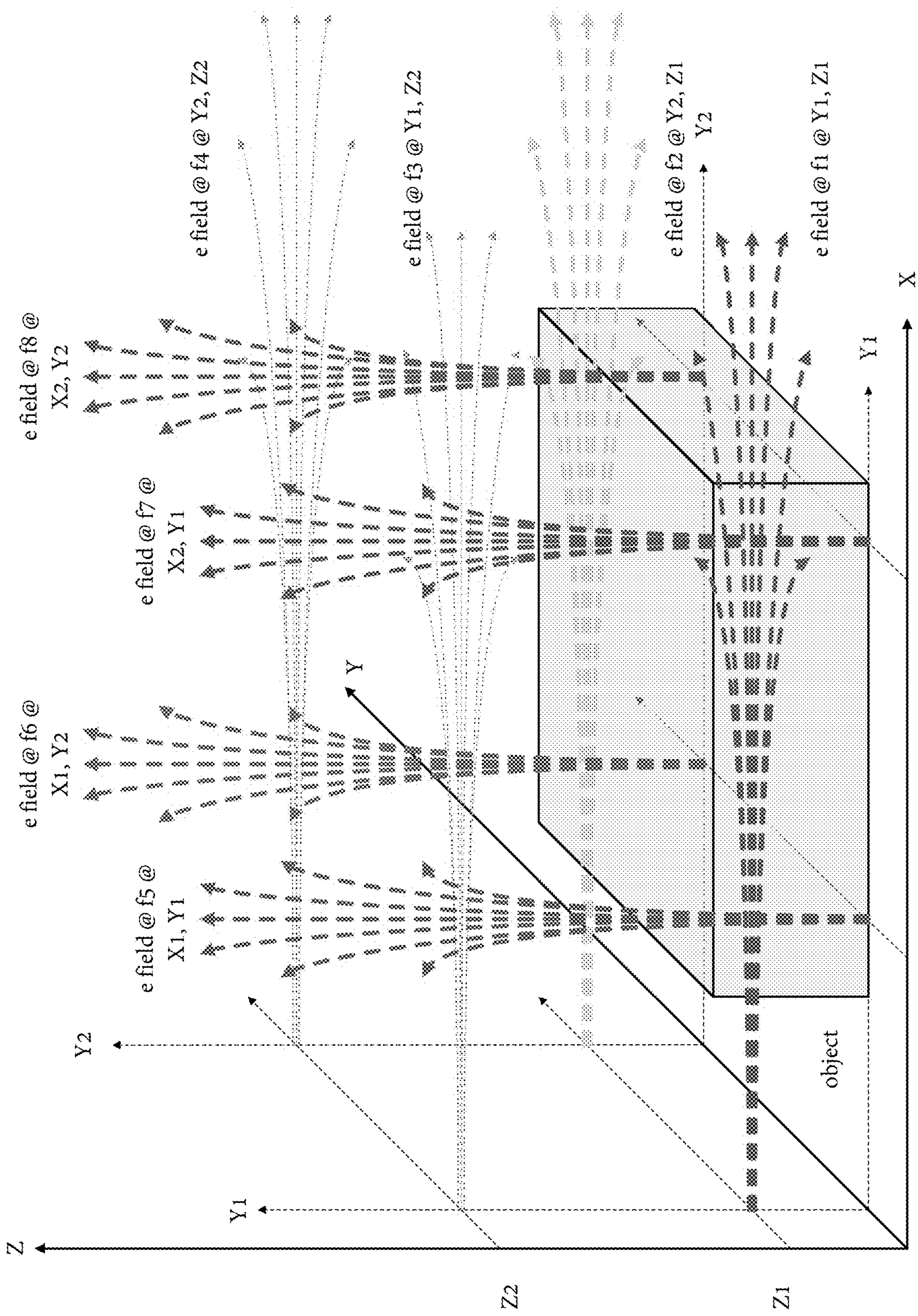
FIG. 62 is a schematic block diagram of another example of e-fields produced by sensor circuits in a Y-Z plane and an X-Y plane for sensing an object in accordance with various embodiments.

In the example of FIG. 62, the sensor circuit 215 at Y1, Z1 and Y2, Z1 detects frequencies f5, f6, f7, and f8 based on all of these frequencies propagating through the object of FIG. 62 and to the given electrode at Y1, Z1 and Y2, Z1. The sensor circuits 215 at each of X1, Y1; X2, Y2; X1, Y2; and X2, Y2 detect frequency f1 and f2 based on f1 and f2 propagating through the object of FIG. 62 to each of these electrodes. The corresponding object can be determined to be in the space of each of the points X1, Y1, Z1; X2, Y1, Z1; X1, Y2, Z1; and X2, Y2, Z1, and/or not other points.

Figure 63:
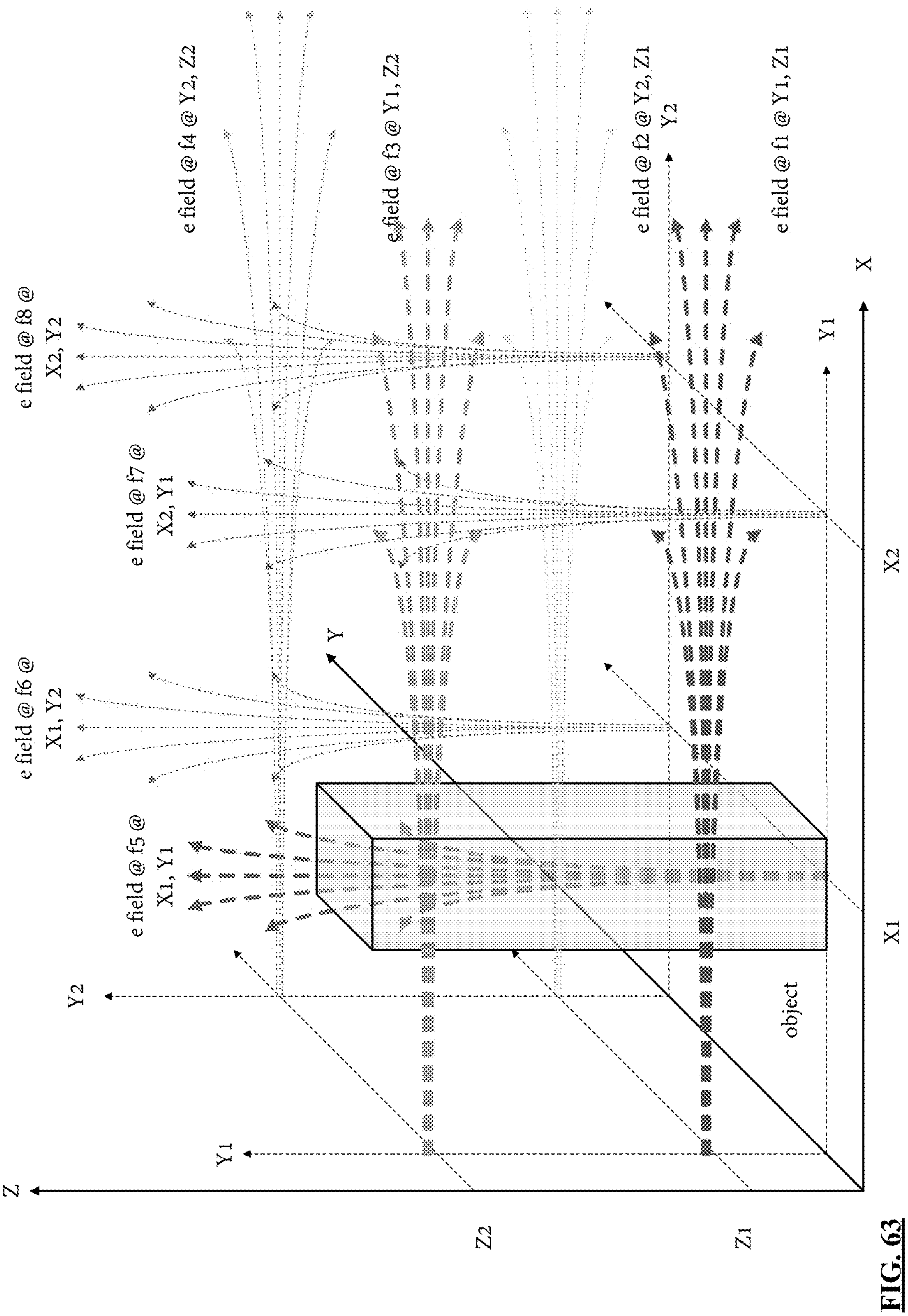
FIG. 63 is a schematic block diagram of another example of e-fields produced by sensor circuits in a Y-Z plane and an X-Y plane for sensing an object in accordance with various embodiments.

In the example of FIG. 63, sensor circuits 215 at Y1, Z1 and Y1, Z2 detect frequency f5 e-field based on e-field with frequency f5 propagating through the object of FIG. 63 and to the given electrodes at Y1, Z1 and Y1, Z2. The sensor circuits 215 at X1, Y1 detects frequencies f1 and f3 based on e-fields with these frequencies propagating through the object of FIG. 63 to the given electrodes at X1, Y1 and X1, Y2. The corresponding object can be determined to be in the space of both of the points X1, Y1, Z1 and X1, Y1, Z2, and/or not other points.

Figure 64:
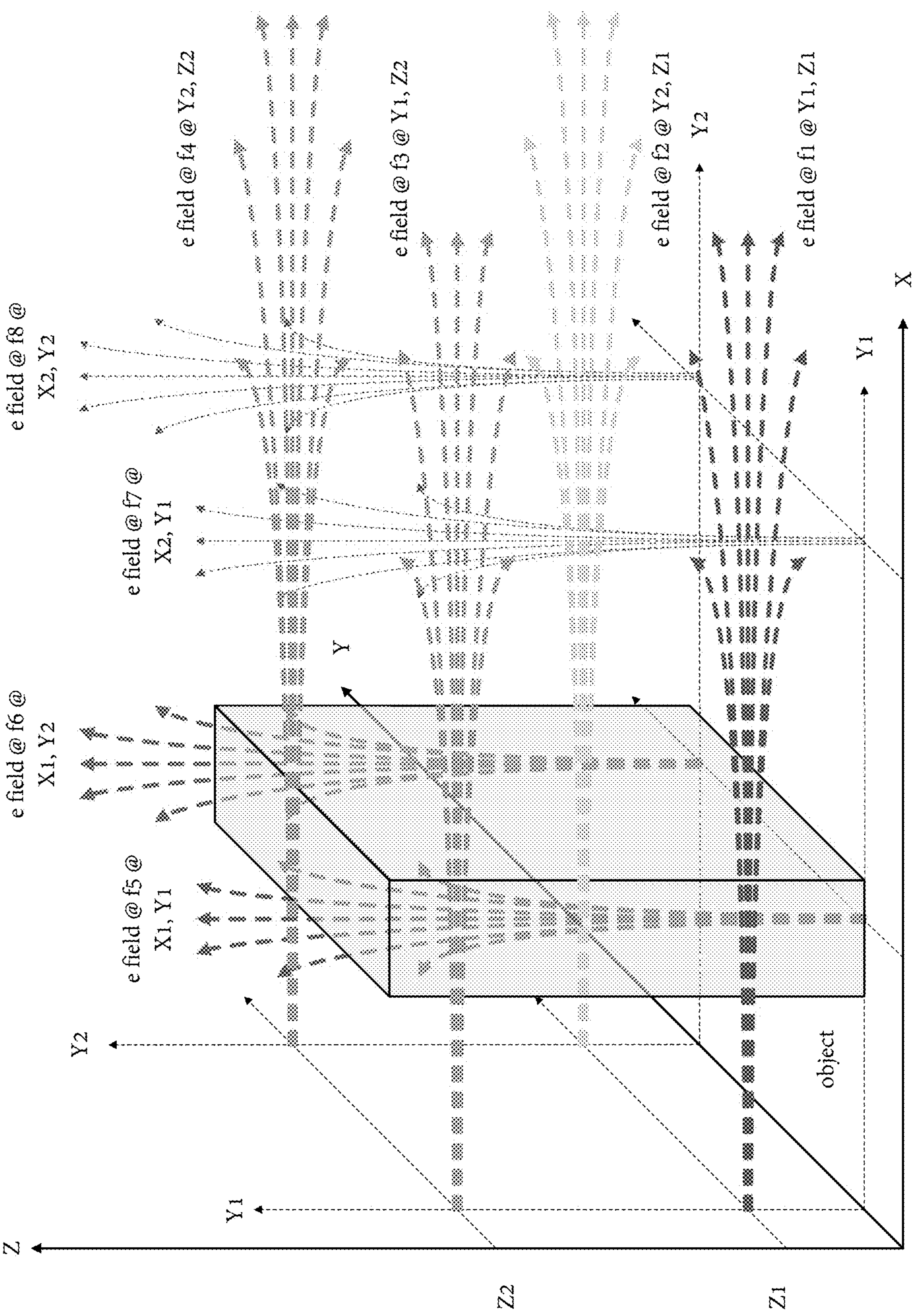
FIG. 64 is a schematic block diagram of another example of e-fields produced by sensor circuits in a Y-Z plane and an X-Y plane for sensing an object in accordance with various embodiments.

In the example of FIG. 64, sensor circuits 215 at Y1, Z1; Y1, Z2; Y2, Z1; and Y2, Z2 detect frequencies f5 and f6 e-fields based on e-fields with these frequencies propagating through the object of FIG. 64 and to the corresponding electrodes. The sensor circuits 215 at X1, Y1 and X1, Y2 detect frequencies f1, f2, f3, and f4 based on e-fields with these frequencies propagating through the object of FIG. 64 to the given electrodes at X1, Y1 and X1, Y2. The corresponding object can be determined to be in the space of all of the points X1, Y1, Z1; X1, Y1, Z2; X1, Y2; Z1; and X1, Y2, Z2, and/or not other points.

In other embodiments, rather than each electrode being operable to both transmit e-fields and detect other e-fields as illustrated and discussed in conjunction with FIGS. 58-64, some electrodes can be operable as transmitters only, for example, being implemented as transmitters 214, and other electrodes can be operable as receivers only, for example, being implemented as receivers 216. A same plane can include both transmitter and receiver electrodes accordingly. Thus, when a given receiver electrode on a first plane detects an e field transmitted by a given transmitter electrode on a second plane, the location of the receiver electrode on the second plane and the location of the transmitter on the first plane can similarly be utilized to identify a corresponding coordinate in 3D space that includes an object.

Figure 65:
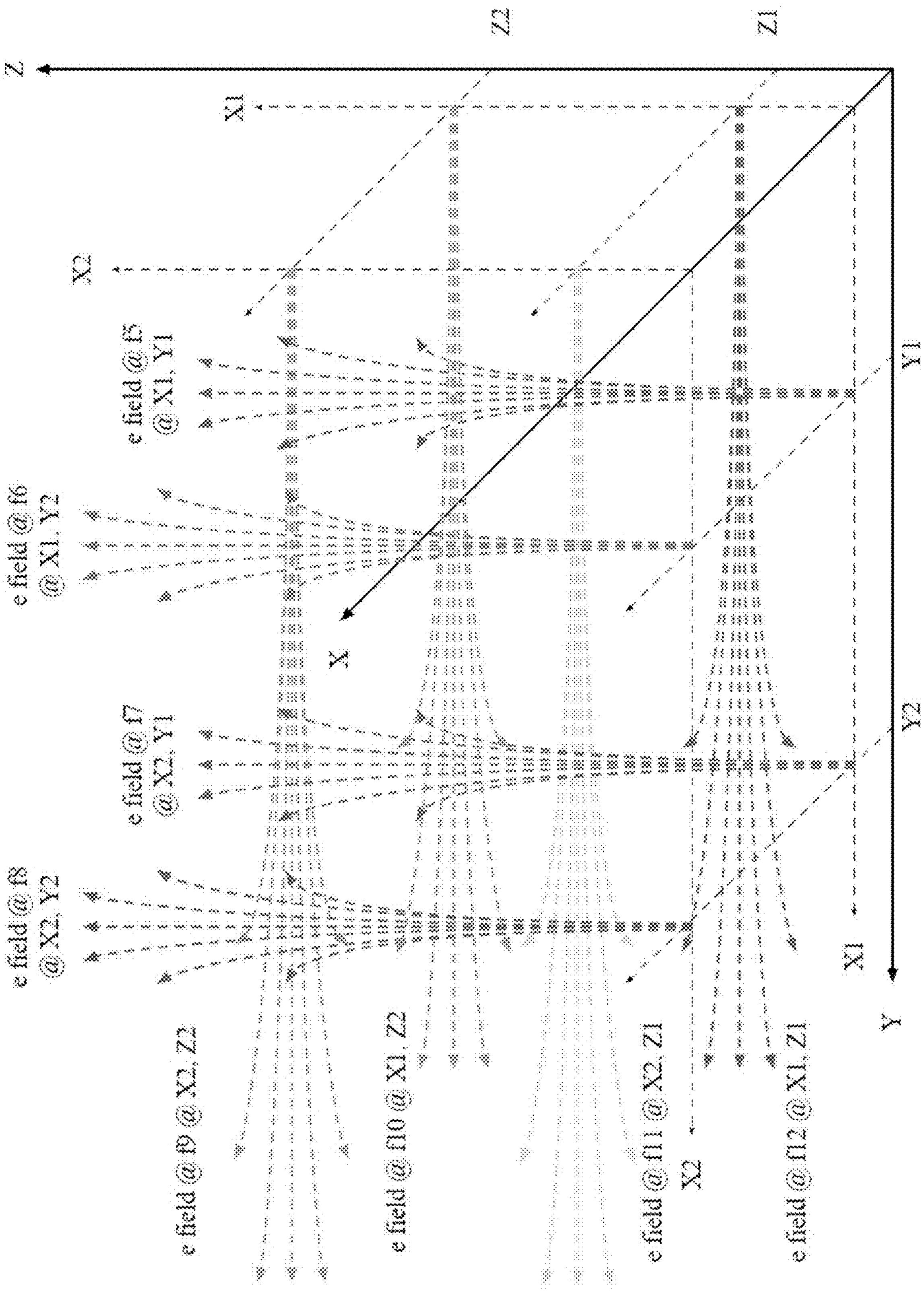
FIG. 65 is a schematic block diagram of an example of e-fields produced by sensor circuits in a X-Z plane and an X-Y plane in accordance with various embodiments.

FIG. 65 is a schematic block diagram of an example of e-fields produced by sensor circuits in a X-Z plane and an X-Y plane. In some embodiments, sensor circuits 215 of the X-Z plane of FIG. 65 can be implemented in a similar fashion as illustrated in FIG. 58 to induce the corresponding e-fields at respective frequencies A 3D space can optionally utilize the X-Z plane of FIG. 65 in addition to the Y-Z plane and the X-Y plane of FIGS. 58-64, where the X-Y plane of FIG. 65 is the X-Y plane of FIGS. 58-64. Sensing of e-fields emitted by electrodes upon 3 different planes, such as 3 orthogonal planes, can implement the set of sensor arrays of FIGS. 50A and 50, and can optionally be utilized to further enable contour determination for detected objects.

For example, sensed signal data received from sensor circuits 215 at each of these three planes can indicate detected e-fields as discussed previously, where a given sensor circuit on a given first plane of the set of three planes can thus detect frequencies of e-fields emitted by electrodes of sensor circuits on the two other planes of the set of three planes. This sensed signal data can be processed by a processing module to generate contouring data for detected objects to approximate a shape and/or contouring of the respective object.

As another example, one or more sensor circuits 215 one or more planes can further generate sensed signal data indicating changes in mutual and/or self-capacitance indicative of an object hovering over and/or near the corresponding electrode, and/or the distance at which the object is hovering over the corresponding plane and/or otherwise in proximity to the corresponding electrode as a function of change in mutual and/or self-capacitance, for example, from a base level mutual and/or self-capacitance indicative of no object.

As used herein, "hovering" over a plane can correspond to being adjacent to the plane without intersecting the plane and/or without touching electrodes upon the plane, for example, via a hover distance 602. In some embodiments, "hovering" over a given electrode as discussed herein can be relative to an orientation of the corresponding plane that includes the electrode, where a distance to the object from the corresponding electrode measured in a direction orthogonal to the corresponding plane can be determined, for example, based on measuring a change in mutual-capacitance and/or self-capacitance. For example, an object is "hovering" over a given electrode if the object's projection upon a plane that includes the electrode includes a plurality of points that includes some or all points corresponding to the location of the electrode. Sensor circuits on a given plane that detect the electrode hovering over their given electrode can be utilized to map the projection of the object upon the given plane as 2D object image data for the given plane.

Such 2D object image data generated based on sensor circuits of each plane, such as each of three or more planes, can be combined to construct and/or estimate a three-dimensional surface mapping of the object, which can be indicative of the contouring of the object, for example, as discussed in further detail in conjunction with FIG. 77, and FIGS. 79-80C. For example, capacitance image data 233 implemented as a heat map denoting various distances of detected objects, such as an absolute and/or relative distance of a hovering finger as illustrated in the example of FIGS. 47C-47F, can be utilized to determine object contouring data. In particular, sensed signal data of sets of electrodes upon each of a set of two or more planes, such as two or three planes of electrode arrays of FIGS. 50A-65, can be processed to generate capacitance image data 233 for each plane, where the capacitance image data 233 generated for multiple planes is combined to determine three-dimensional contouring of an object.

An object can also induce changes upon electrodes of a plane while hovering over the plane, even if not hovering over these electrodes directly. For example, the object can induce a change in mutual-capacitance and/or self-capacitance of an electrode, even if not hovering directly over and/or being directly adjacent to a corresponding electrode, due to influencing e-fields transmitted by these electrodes and detected by these electrodes in detecting self-capacitance changes. Even in cases where an object is positioned at an angle offset from the flat plate or surface of an electrode on a given plane, for example, where the object's projection upon the given plane is at a plurality of points of the given plane that does not include points of a given electrode's position, the sensor circuit of the given electrode can still be helpful in determining contouring of the object. For example, distances to the object in 3D space can be determined, which can also be utilized to map the projection of the object upon the given plane as the 2D object image data for the given plane. The 2D object image data for the given plane can be considered a type of capacitance image data 233, even when the object did not hover directly over some or all electrodes whose capacitive changes were utilized to generate the 2D object image data.

FIGS. 66-75 illustrate such examples where changes in self-capacitance and/or mutual-capacitance due to an object's affects upon e-fields produced by various electrodes that are detectable by these various electrodes and/or neighboring electrodes can be utilized to compute and/or estimate distances from a detected objects surface, which can be combined for multiple electrodes across multiple planes to generate contouring data for the detected object.

Figure 66:
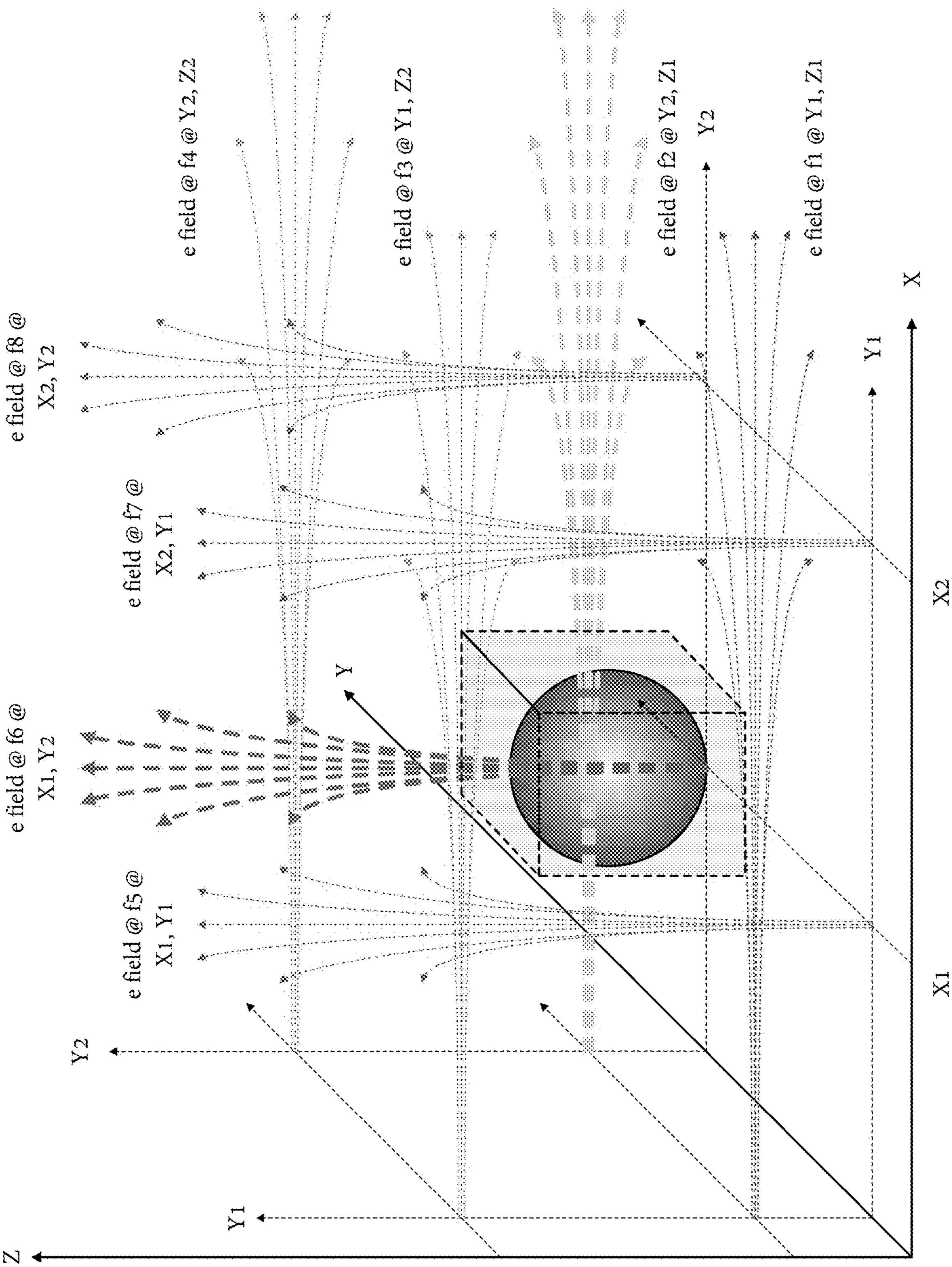
FIG. 66 is a schematic block diagram of another example of e-fields produced by sensor circuits in a Y-Z plane and an X-Y plane for sensing an object in accordance with various embodiments.

FIG. 66 is a schematic block diagram of another example of e-fields produced by sensor circuits in a Y-Z plane and an X-Y plane for sensing an object. In this example, an object can be determined to be at the point X1, Y2, Z1, and/or not other points, as discussed previously, due to detection of e-fields at f6 and at f2 being detected as propagating through the object as discussed previously, where thicker e-field lines again illustrate engaged e-fields due to passage through an object. The electrodes 207 of sensor circuits 215 on the X-Y plane, X-Z plane, and/or Y-Z plane can further be operable to perform hover detection to detect the presence and/or distance to objects in proximity to the corresponding electrode to resolve contour details, for example, in this case, to determine the object is spherical. This can include detecting and measuring changes in mutual-capacitance of electrodes for ungrounded objects, and/or detecting and measuring changes in both mutual-capacitance and self-capacitance of electrodes for grounded objects. The electrodes can be implemented as electrodes 207 and/or 209 which can be flat or surrounding some or all of a support column 219 as discussed previously.

Figure 67:
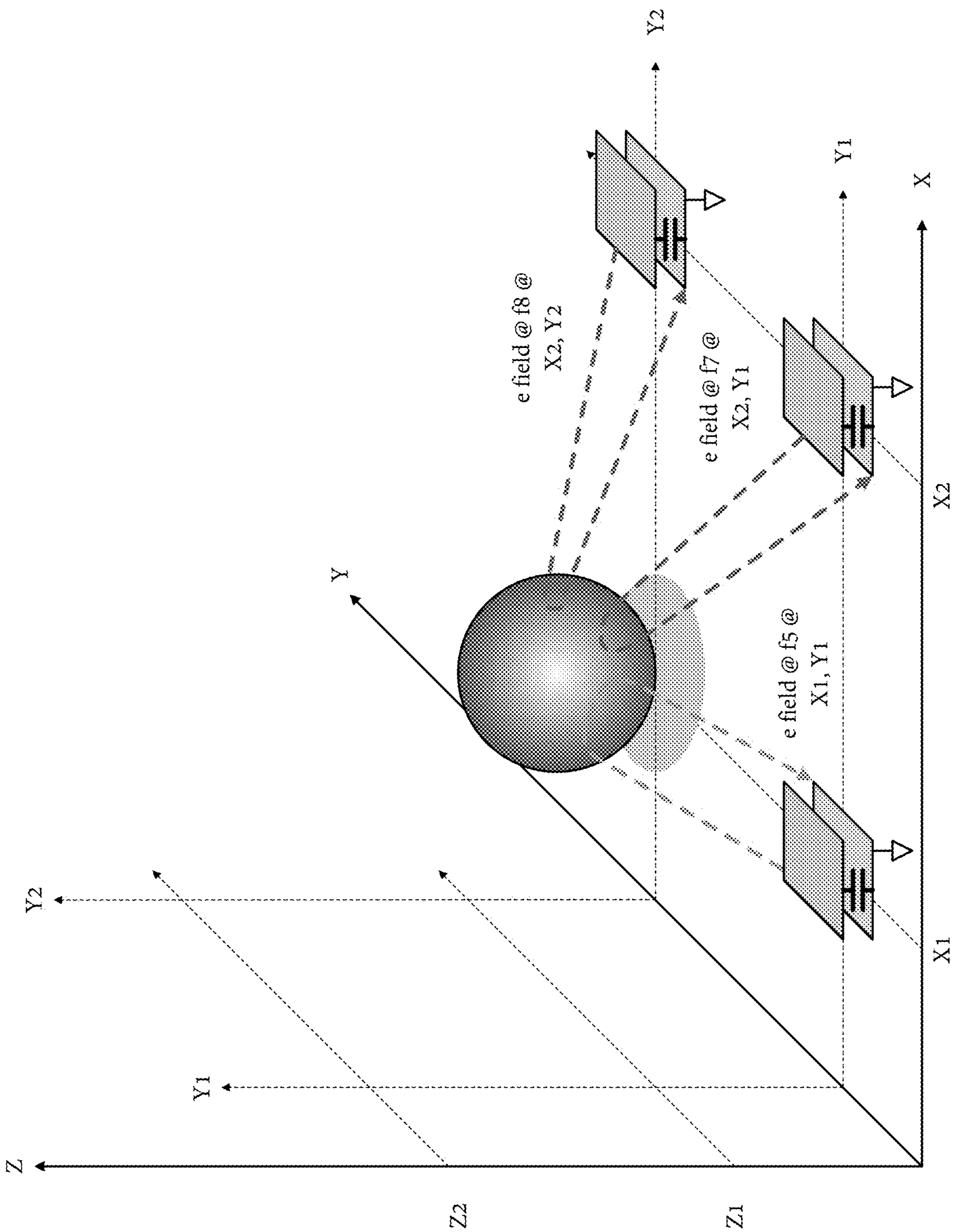
FIG. 67 is a schematic block diagram of an example of e-fields produced by sensor circuits in an X-Y plane for sensing an object image in the X-Y plane via self-capacitance in accordance with various embodiments.

FIG. 67 is a schematic block diagram of an example of e-fields produced by sensor circuits in an X-Y plane for sensing an object image in the X-Y plane via self-capacitance. In particular, changes in self-capacitance of electrodes 207 can be induced when an object in the vicinity is grounded. These changes can be detected via a corresponding sensor circuit 215, for example, where the magnitude and/or changes in of the frequency component at the given frequency of reference signal 515 of the sensor circuit 215 is indicated in sensed signal data 540 for each sensor circuit 215, for example, based on applying a band pass filter centered at this corresponding frequency and/or performing other filtering. For example, an increase in self-capacitance (e.g., the capacitance of the electrode with respect to a reference (e.g., ground, etc.)) can be indicative of an object being the vicinity of the electrode.

As depicted in FIG. 67, electrodes can be implemented as flat plates having a gap with a corresponding grounding plane, inducing a corresponding self-capacitance. Note that the electrodes can be implemented to have surfaces upon and/or parallel with the respective plane as illustrated in FIG. 67, or in any other orientation relative to the respective plane. The electrodes can optionally have rounded and/or non-flat surfaces, for example, based on being electrodes 209 of support columns 219 or other rods along the X-Y plane.

A measured amount of increase in self-capacitance can be indicative of a distance to the object from to the corresponding electrode, for example, where a first self-capacitance value indicates a first distance from an object, a second self-capacitance value indicates a second distance from an object, and the second distance is determined to be smaller than the first distance based on a magnitude of the first self-capacitance being greater than a magnitude of the second self-capacitance, and/or based on a magnitude of a first increase in self-capacitance from a base value to attain the first self-capacitance being greater than a magnitude of a second increase in self-capacitance from a base value to attain the second self-capacitance. An electrode's distance from an object for a given magnitude and/or change in self-capacitance can be processed via a sensor circuit 215 and/or processing module receiving sensed sensor data 540 via performing a corresponding calculation, via accessing a lookup table mapping magnitudes and/or changes in self-capacitance to distance values, and/or via another determination.

Figure 69:
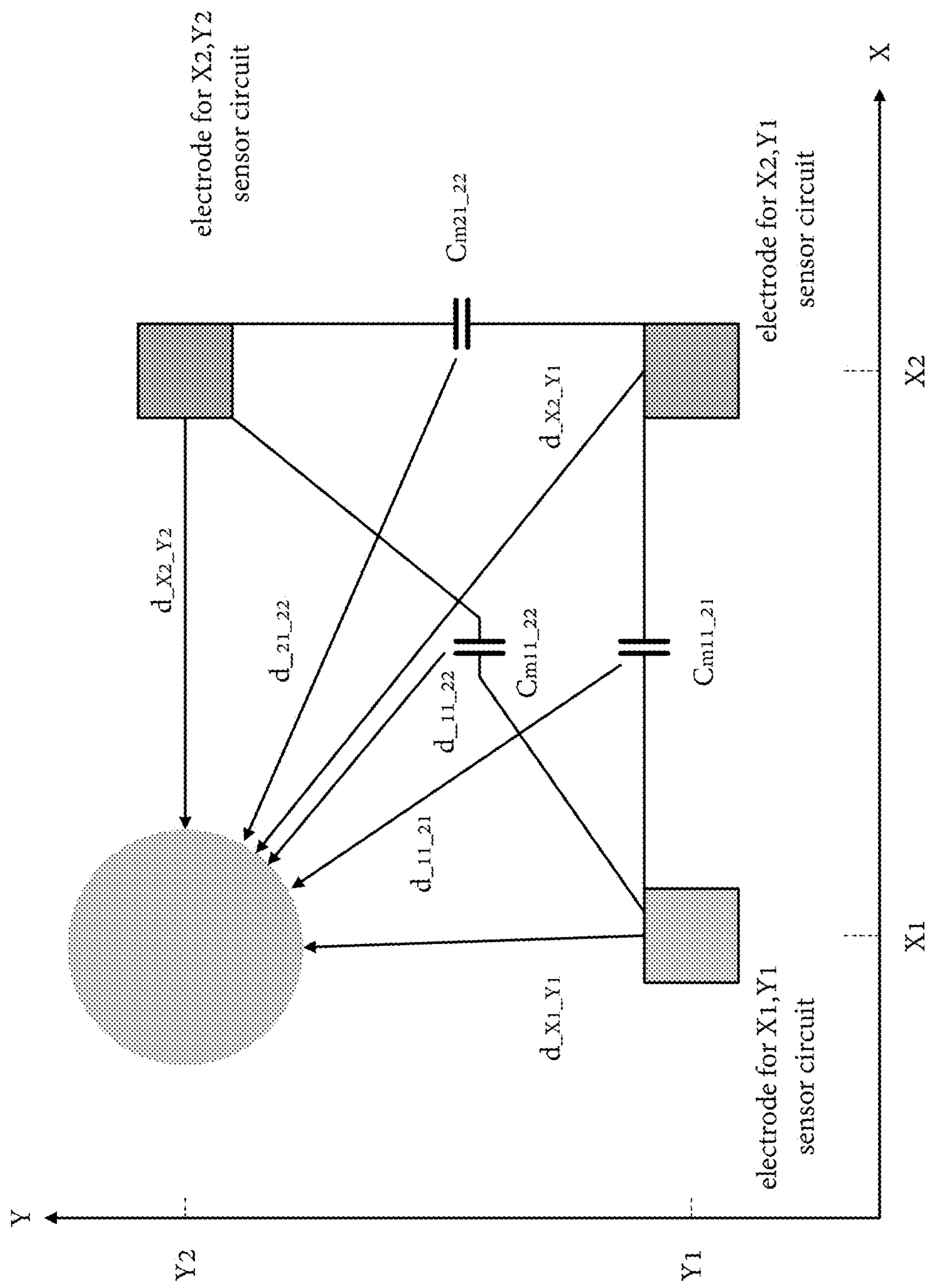
FIG. 69 is a schematic block diagram of an example of distances determined from data produced by sensor circuits in an X-Y plane regarding the object image in accordance with various embodiments.

The determined distance value can be indicative of a closest point of the object to the given electrode. Based on further determining which point(s) in the 3D plane include the object as discussed previously, the distances can be utilized to compute an angle to the object in the plane. For example, the magnitude of the distance determined for a given electrode is applied to a directional vector from the point of the given electrode to another point, such as a single point determined to contain an object, and/or a closest point from the point of the given electrode determined to contain an object. The given point defining this directional vector for a given electrode can be determined based on a calculation and/or lookup table accessible in memory, for example, denoting the known positions of all electrodes 207 of the 3D space and/or their known distances from each other in the 3D space. Thus, a vector with magnitude denoting the distance to the object's surface and direction denoting angle to the object's surface, presumed to be the closest point on the objects surface relative to the given electrode, can be determined. An example of measured distances via self-capacitances for contouring is illustrated in FIG. 69.

Combining this vector data determined for a set of different electrodes across one or more planes can be utilized to determine a 3D contour mapping for a corresponding object, which can correspond to a determined and/or estimated contouring of the detected object. In particular, a point is defined for each vector based on its starting point at the corresponding electrode, its magnitude, and its direction, resulting in a plurality of points which are determined and/or estimated to correspond to the outer surface of the corresponding object, denoting the surface contouring of the corresponding object. In this example, the full spherical contouring of the object can be determined and/or estimated based on collecting distance measurements denoting this contouring via sensor circuits 215 of electrodes on three or more planes. In some cases, gathering a full 360 degree 3D contouring can require more than three planes of electrodes that are orthogonal or non-orthogonal, and/or otherwise require dispersing of electrodes that can detect self-capacitance changes for corresponding vectors that can be directed towards the given point in 3D space in all directions.

The configuration of electrodes in the 3D space can affect the granularity at which objects are detected and contoured. For example, dispersing electrodes having corresponding sensor circuits 215 in a higher density upon a given plane can enable greater granularity in detecting object locations and/or in generating 3D contour mapping. Dispersing electrodes having corresponding sensor circuits 215 in a higher density a greater number of planes can enable greater granularity generating 3D contour mapping, for example, to determine the contour of the object on a greater number of its sides.

Figure 68:
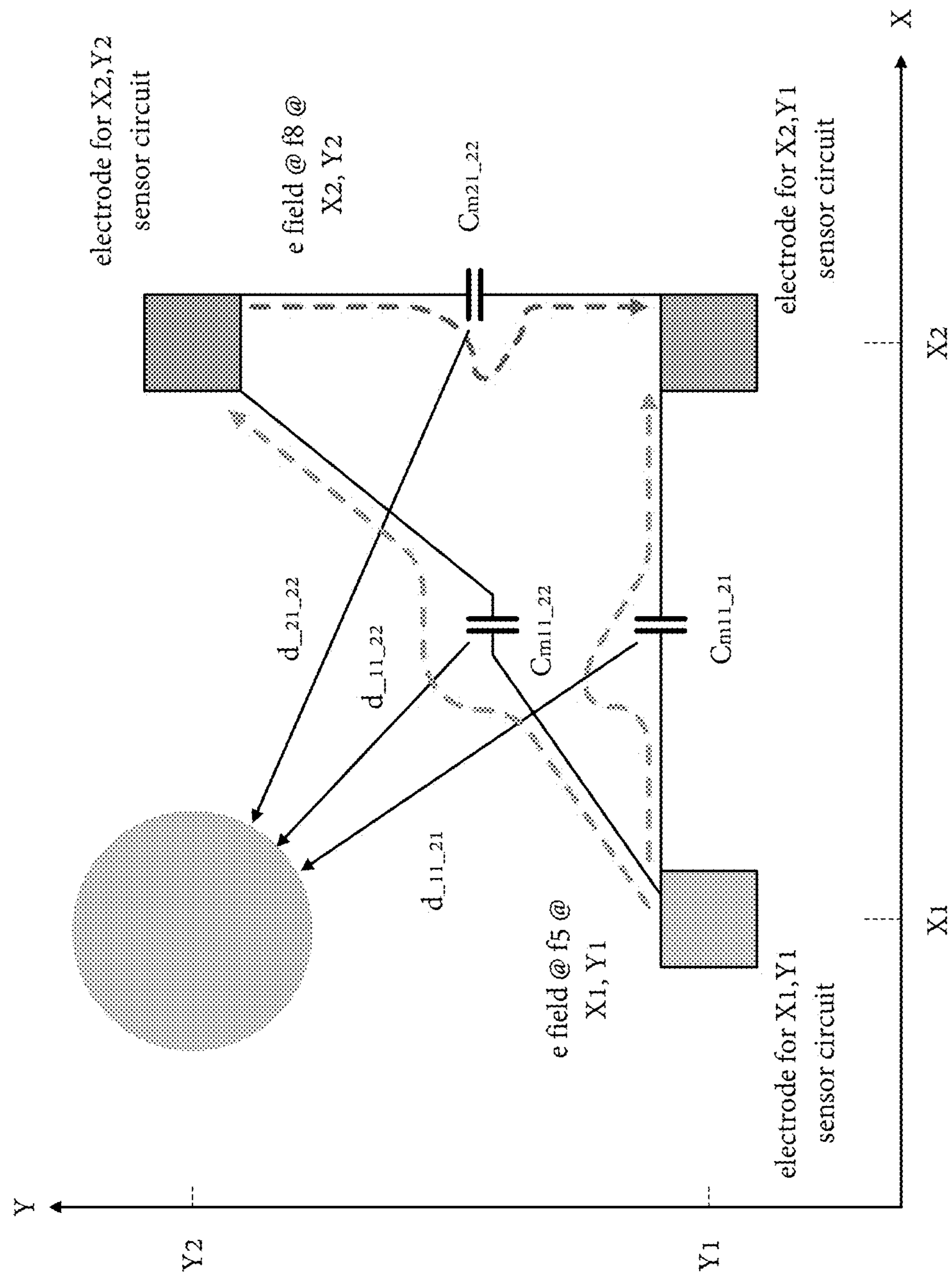
FIG. 68 is a schematic block diagram of an example of e-fields produced by sensor circuits in an X-Y plane for sensing an object image in the X-Y plane via mutual-capacitance in accordance with various embodiments.

FIG. 68 is a schematic block diagram of an example of e-fields produced by sensor circuits in an X-Y plane for sensing an object image in the X-Y plane via mutual-capacitance. Because the presence of the objects affects e-fields of various electrodes, mutual-capacitance between various electrodes can change accordingly. Measured changes in mutual-capacitance between various electrodes can similarly be indicative of the contouring of a detected object, and can be utilized instead of or in addition to the changes in self-capacitance discussed in conjunction with FIG. 67 to map surface contouring of an object detected in the 3D space accordingly.

The distance to the object from a pair electrodes can similarly be computed based on the interference by the object to the mutual-capacitance between the pair of electrodes. These changes can similarly be detected via a corresponding sensor circuit 215, for example, where the magnitude and/or changes in of the frequency component at the given frequency of reference signals 515 of other electrodes, indicative of mutual-capacitance with these other electrodes, is indicated in sensed signal data 540 for each sensor circuit 215 of a given electrode, for example, based on applying a band pass filter centered at frequencies of neighboring electrodes on the same plane and/or performing other filtering. For example, a decrease in mutual-capacitance can be indicative of an object being the vicinity of the electrode and/or being in the vicinity of a space between the electrode and a neighboring electrode with which it has this mutual-capacitance.

In this example, the electrode for the X2, Y2 sensor circuit 215 has changes in mutual-capacitance $C_{m11\_22}$ between electrode X1, Y1, and X2, Y2 induced by changes in e-field at f5 emitted by the electrode at X1, Y1 due to the presence of the object in the vicinity, and these changes can be measured based on determining the changes corresponding to the frequency component at f5, for example, by applying a band pass filter centered at f5, to determine changes in mutual-capacitance with f5, which is processed via the sensor circuit 215 and/or a processing module to render distance $d_{11\_22}$ accordingly. While not illustrated, the electrode for the X1, Y1 sensor circuit 215 can also have changes in mutual-capacitance induced by the e-field at f8 emitted by the electrode at X2, Y2, and these changes can be measured to render distance d_11_22 accordingly via such measurements by X1, Y1 sensor circuit 215 alternatively or in addition to those by the X2, Y2 sensor circuit 215.

Distance $d_{\_11\_21}$ can similarly be determined based on changes in mutual-capacitance $C_{m11\_21}$ induced by e-field emitted by electrode X1, Y1 at frequency f5 detected by the electrode X2, Y1 as illustrated in FIG. 68, and/or can optionally be determined based on changes in mutual-capacitance $C_{m11\_21}$ induced by e-field emitted by electrode X2, Y1 at frequency f7 detected by the electrode X1, Y1. Distance $d_{\_21\_22}$ can similarly be determined based on changes in mutual-capacitance $C_{m21\_22}$ induced by e-field emitted by electrode X2, Y2 at frequency f8 detected by the electrode X2, Y1 as illustrated in FIG. 68, and/or can optionally be determined based on changes in mutual-capacitance $C_{m21\_22}$ induced by e-field emitted by electrode X2, Y1 at frequency f7 detected by the electrode X2, Y2.

A measured amount of decrease in mutual-capacitance can be indicative of a distance to the object from to the corresponding electrode, and/or from a midpoint of a shortest segment separating the corresponding electrode from another electrode with which the corresponding electrode has this mutual-capacitance. For example, a first mutual-capacitance value indicates a first distance from an object, a second mutual-capacitance value indicates a second distance from an object, and the second distance is determined to be smaller than the first distance based on a magnitude of the second mutual-capacitance being greater than a magnitude of the first self-capacitance, and/or based on a magnitude of a second increase in self-capacitance from a base value to attain the second self-capacitance being greater than a magnitude of a first increase in self-capacitance from a base value to attain the first self-capacitance. An electrode's distance from an object for a given magnitude and/or change in self-capacitance can be processed via a sensor circuit 215 and/or processing module receiving sensed sensor data 540 via performing a corresponding calculation, via accessing a lookup table mapping magnitudes and/or changes in mutual-capacitance to distance values, and/or via another determination.

The determined distance value can be indicative of a closest point of the object to the given electrode. Based on further determining which point(s) in the 3D plane include the object as discussed previously, the distances can be utilized to compute an angle to the object in the plane. For example, the magnitude of the distance determined for a given pair of electrodes mutual-capacitance is applied to a directional vector from the midpoint, or another point, between the pair of electrodes. The direction of this directional vector is from this the midpoint, or another point, between the pair of electrodes towards a point determined to contain an object, such as a single point determined to contain an object, and/or a closest point from the point of the given electrode determined to contain an object. The given point defining this directional vector for a mutual-capacitance between a pair of electrodes can be determined based on a calculation and/or lookup table accessible in memory, for example, denoting the known positions of all electrodes 207 of the 3D space, their known distances from each other in the 3D space, and/or the positions of their respective midpoints. Thus, a vector with magnitude denoting the distance to the object's surface and direction denoting angle to the object's surface, presumed to be the closest point on the objects surface relative to the given electrode, can be determined. Combining this vector data determined for a set of different electrodes across one or more planes can be utilized to determine a 3D contour mapping for a corresponding object, which can correspond to a determined and/or estimated contouring of the detected object.

Alternatively or in addition to this computing of distances to the object in 3D space, the distance values can be projected upon the x-y plane directly to render 2D image data, such as capacitance image data 233, for the given object as a projection upon the corresponding plane, for example, based on the corresponding angle of the determined vector determined based on the portion of the 3D space in which the object is detected to be located. In the example of FIG. 68, depicted distances $d_{\_11\_21A}$, $d_{\_11\_22}$, and $d_{\_21\_22}$ can be projected distances to the projected surface of the object upon the x-y plane. In such embodiments, these distances $d_{\_11\_21A}$, $d_{\_11\_22}$, and $d_{\_21\_22}$ are optionally determined based on projecting the corresponding vector whose magnitude and angle are determined as discussed upon the corresponding plane. Alternatively or in addition, the distances $d_{\_11\_21A}$, $d_{\_11\_22}$, and $d_{\_21\_22}$ are determined directly based on the measured changes in mutual-capacitance.

This vector data determined based on measuring changes in mutual-capacitances can be utilized instead of or in addition to the vector data determined based on measuring changes in self-capacitances as discussed in conjunction with FIG. 67 to determine surface contouring. For example, utilizing both types of vector data based on electrodes detecting changes in their self-capacitance as well as changes in mutual-capacitance with other electrodes can render richer contouring data, as a greater number of distances from a greater number of points are thus determined.

FIG. 69 is a schematic block diagram of an example of distances determined from data produced by sensor circuits in an X-Y plane regarding the object image. In this example, distances $d_{\_X1\_Y1}$, $d_{\_X2\_Y1}$, and $d_{\_X2\_Y2}$ are measured based on self-capacitances detected via sensor circuits 215 of electrodes at X1, Y1; X2, Y1, and X2, Y2, respectively, for example, as discussed in conjunction with FIG. 67. Distances $d_{\_11\_22}$, $d_{\_21\_22}$, and $d_{\_11\_21}$ are measured as discussed in conjunction with FIG. 68. Note that in the case where the object is not grounded, the distances measured via self-capacitance, such as distances $d_{\_X1\_Y1}$, $d_{\_X2\_Y1}$, and $d_{\_X2\_Y2}$ are not measured and/or utilized for contour mapping due to the self-capacitances not being indicative of the object's presence due to the object not being grounded. In such cases, the processing module optionally relies exclusively upon the distances measured via mutual-capacitances alone to determine contour mapping. Distances can optionally always be measured via mutual-capacitances as discussed in conjunction with FIG. 68, regardless of whether the object is grounded.

In some embodiments, the distance values distances $d_{\_X1\_Y1}$, $d_{\_X2\_Y1}$, and $d_{\_X2\_Y2}$ can be projected upon the x-y plane directly to render 2D image data for the given object as a projection upon the corresponding plane, for example, based on the corresponding angle of the determined vector determined based on the portion of the 3D space in which the object is detected to be located. In this example, depicted distances $d_{\_X1\_Y1}$, $d_{\_X2\_Y1}$, and $d_{\_X2\_Y2}$ can be projected distances to the projected surface of the object upon the x-y plane, as illustrated in FIG. 69. In such embodiments, these distances $d_{\_X1\_Y1}$, $d_{\_X2\_Y1}$, and $d_{\_X2\_Y2}$ are optionally determined based on projecting the corresponding vector whose magnitude and angle are determined as discussed upon the corresponding plane. Alternatively or in addition, the distances $d_{\_X1\_Y1}$, $d_{\_X2\_Y1}$, and $d_{\_X2\_Y2}$ are determined directly based on the measured changes in self-capacitance.

Figure 70:
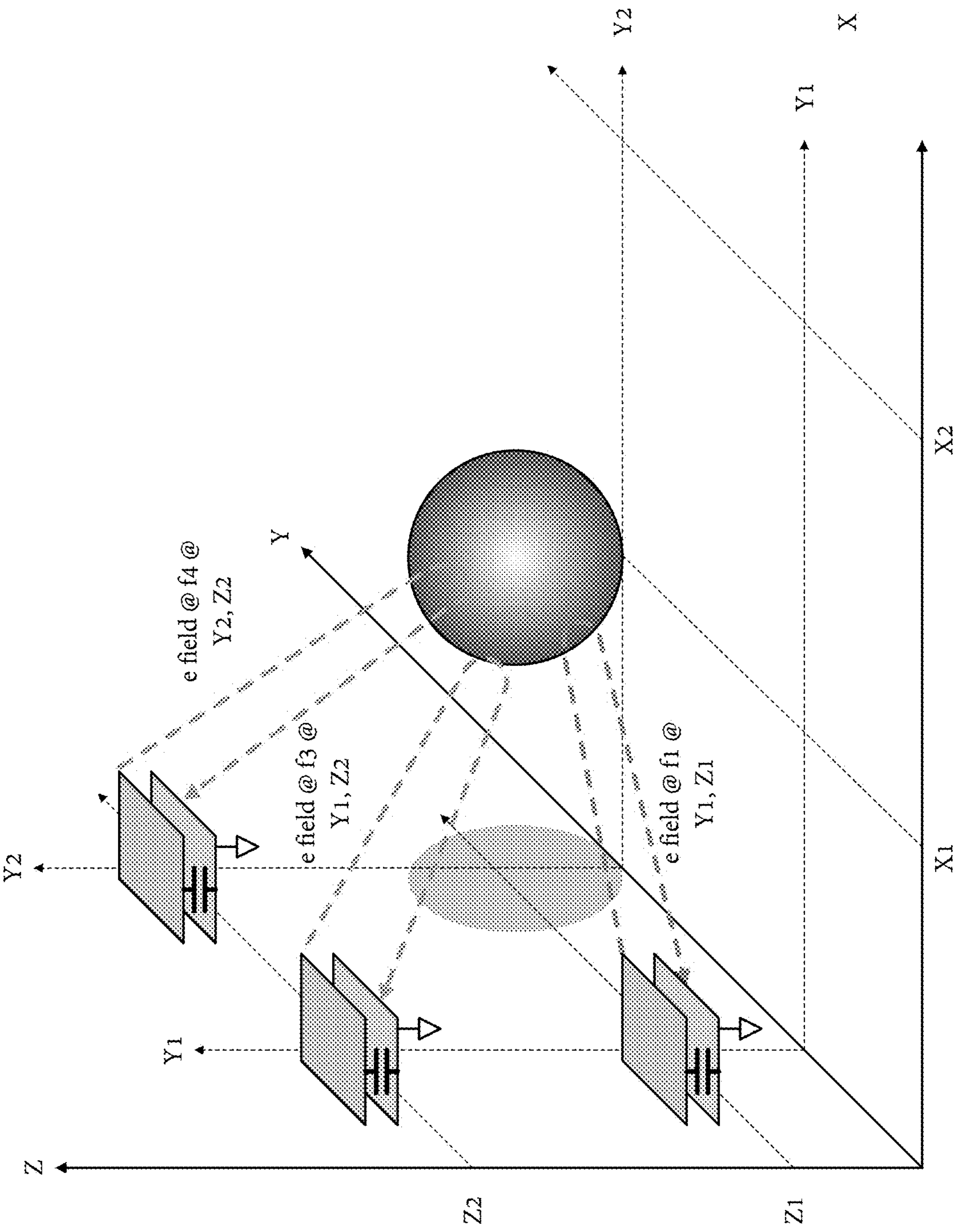
FIG. 70 is a schematic block diagram of an example of e-fields produced by sensor circuits in a Y-Z plane for sensing an object image in the Y-Z plane via self-capacitance in accordance with various embodiments.
Figure 71:
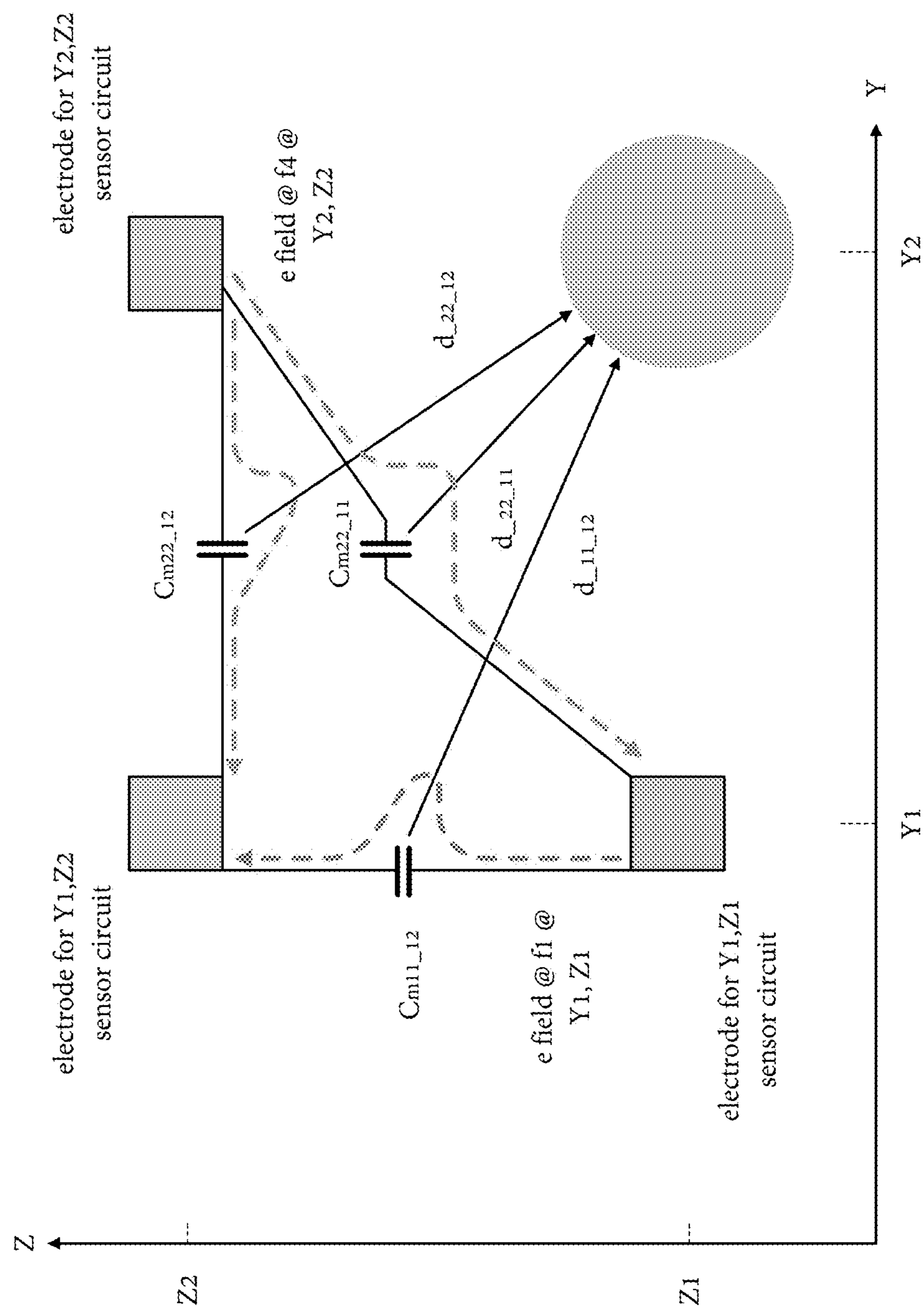
FIG. 71 is a schematic block diagram of an example of e-fields produced by sensor circuits in a Y-Z plane for sensing an object image in the Y-Z plane via mutual-capacitance in accordance with various embodiments.
Figure 72:
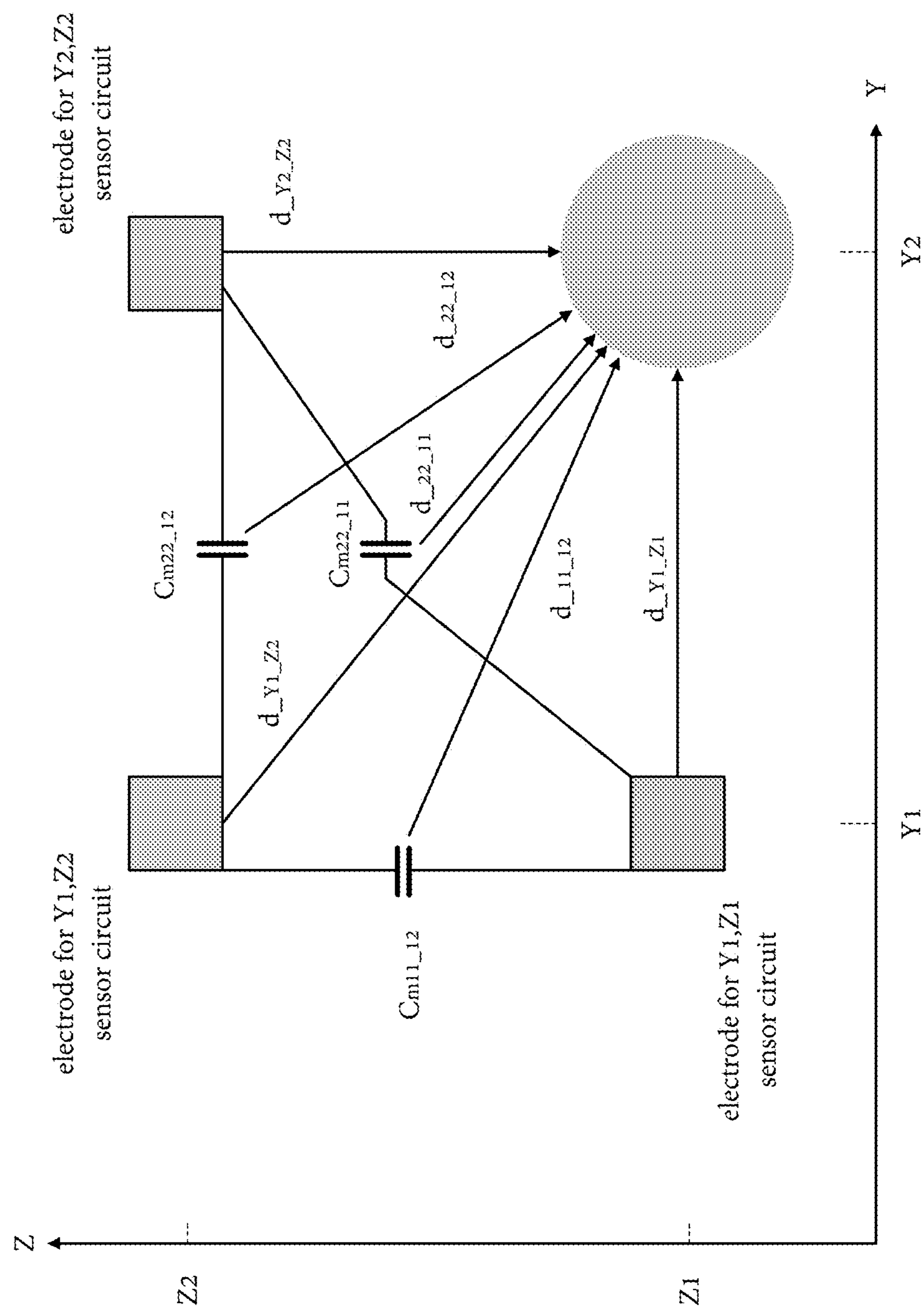
FIG. 72 is a schematic block diagram of an example of distances determined from data produced by sensor circuits in a Y-Z plane regarding the object image in accordance with various embodiments.

FIGS. 70-72 present embodiments of determining distance data based on self and/or mutual-capacitance via sensor circuits in a Y-Z plane to perform object contouring. FIG. 70 is a schematic block diagram of an example of e-fields produced by sensor circuits in a Y-Z plane for sensing an object image in the Y-Z plane via self-capacitance. FIG. 71 is a schematic block diagram of an example of e-fields produced by sensor circuits in a Y-Z plane for sensing an object image in the Y-Z plane via mutual-capacitance. FIG. 72 is a schematic block diagram of an example of distances determined from data produced by sensor circuits in a Y-Z plane regarding the object image.

For example, alternatively or in addition to performing distance measurements via sensor circuits of the X-Y plane based on self-capacitance and/or mutual-capacitance as discussed and illustrated in conjunction with FIGS. 67-69, similar distance measurements can similarly be performed based on self-capacitance via sensor circuits of the Y-Z plane. For example, the same object of FIGS. 67-69 occupying the space at X1, Y2 has further contouring of its 3D surface determined based on further utilizing the electrodes and corresponding sensor circuits of the Y-Z plane to achieve contouring data for the object from a greater number of angles and/or sides of the object. Some or all of the functionality of sensor circuits and electrodes of the X-Y plane described in conjunction with FIGS. 67-69 can be implemented via the sensor circuits and electrodes of the Y-Z plane of FIGS. 70-72.

Note that the electrodes of the Y-Z plane can be implemented to have surfaces on planes parallel with the surfaces of electrodes of the X-Y plane, for example, as illustrated in FIGS. 70 and 67, respectively, and/or can otherwise be implemented to have surfaces orthogonal to and/or otherwise non-parallel with the Y-Z plane as illustrated in FIG. 70. Alternatively, the electrodes can have their surfaces parallel with the Y-Z plane in a similar fashion as illustrated in FIG. 67, and/or in any other orientation relative to the respective plane. The electrodes can optionally have rounded and/or non-flat surfaces, for example, based on being electrodes 209 of support columns 219 or other rods along the Y-Z plane.

Figure 73:
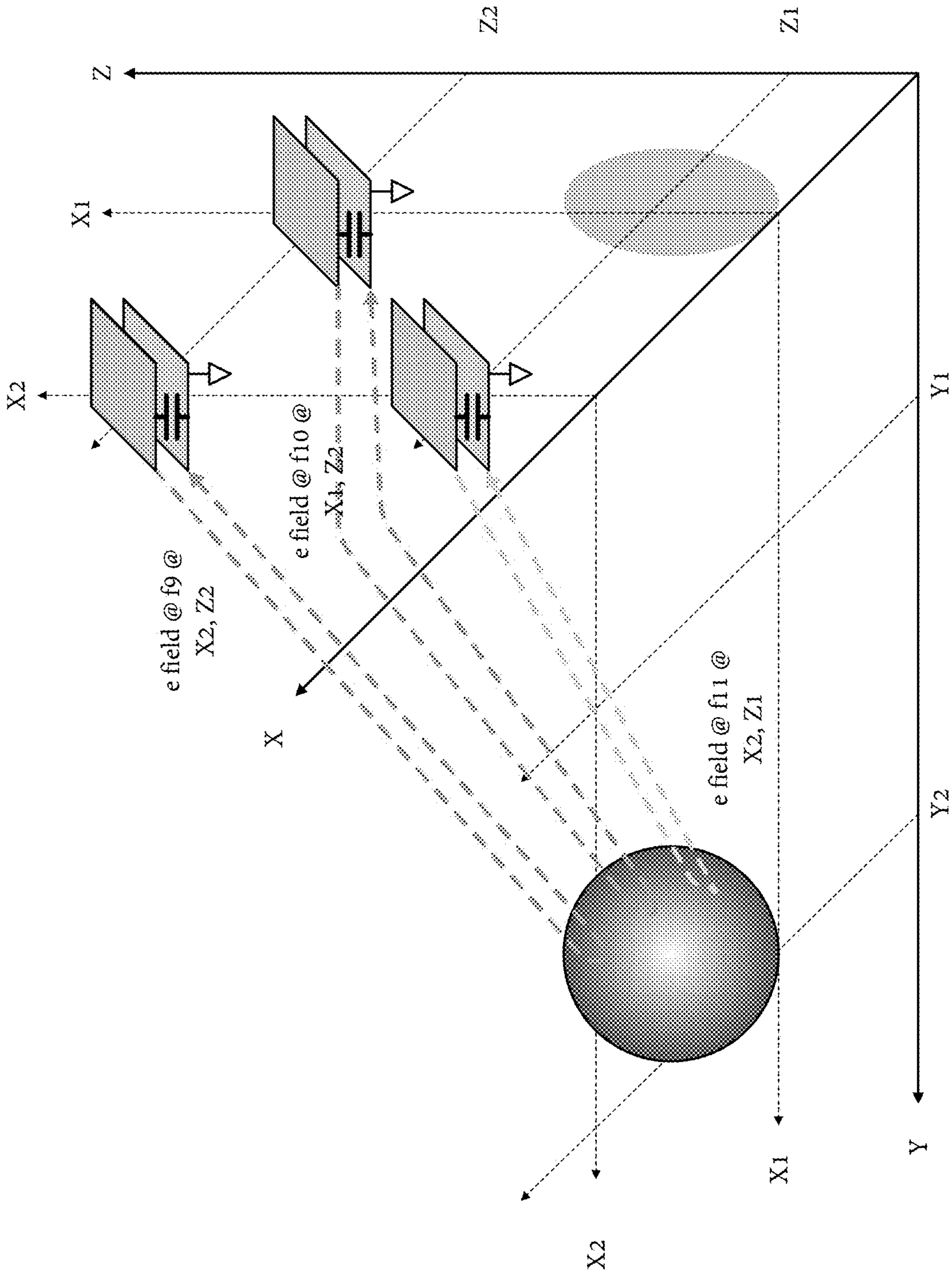
FIG. 73 is a schematic block diagram of an example of e-fields produced by sensor circuits in an X-Z plane for sensing an object image in the X-Z plane via self-capacitance in accordance with various embodiments.
Figure 74:
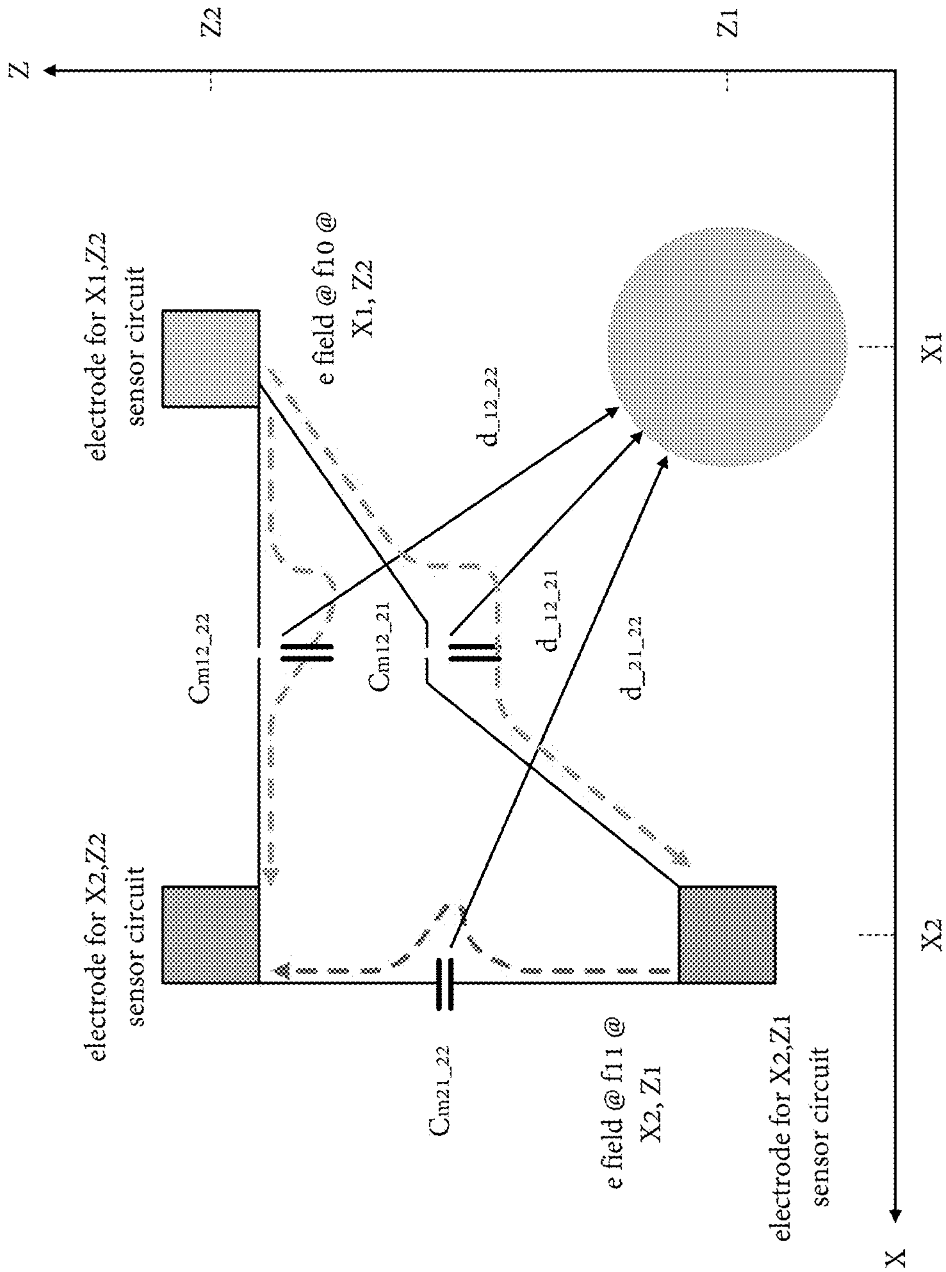
FIG. 74 is a schematic block diagram of an example of e-fields produced by sensor circuits in an X-Z plane for sensing an object image in the X-Z plane via mutual-capacitance in accordance with various embodiments.
Figure 75:
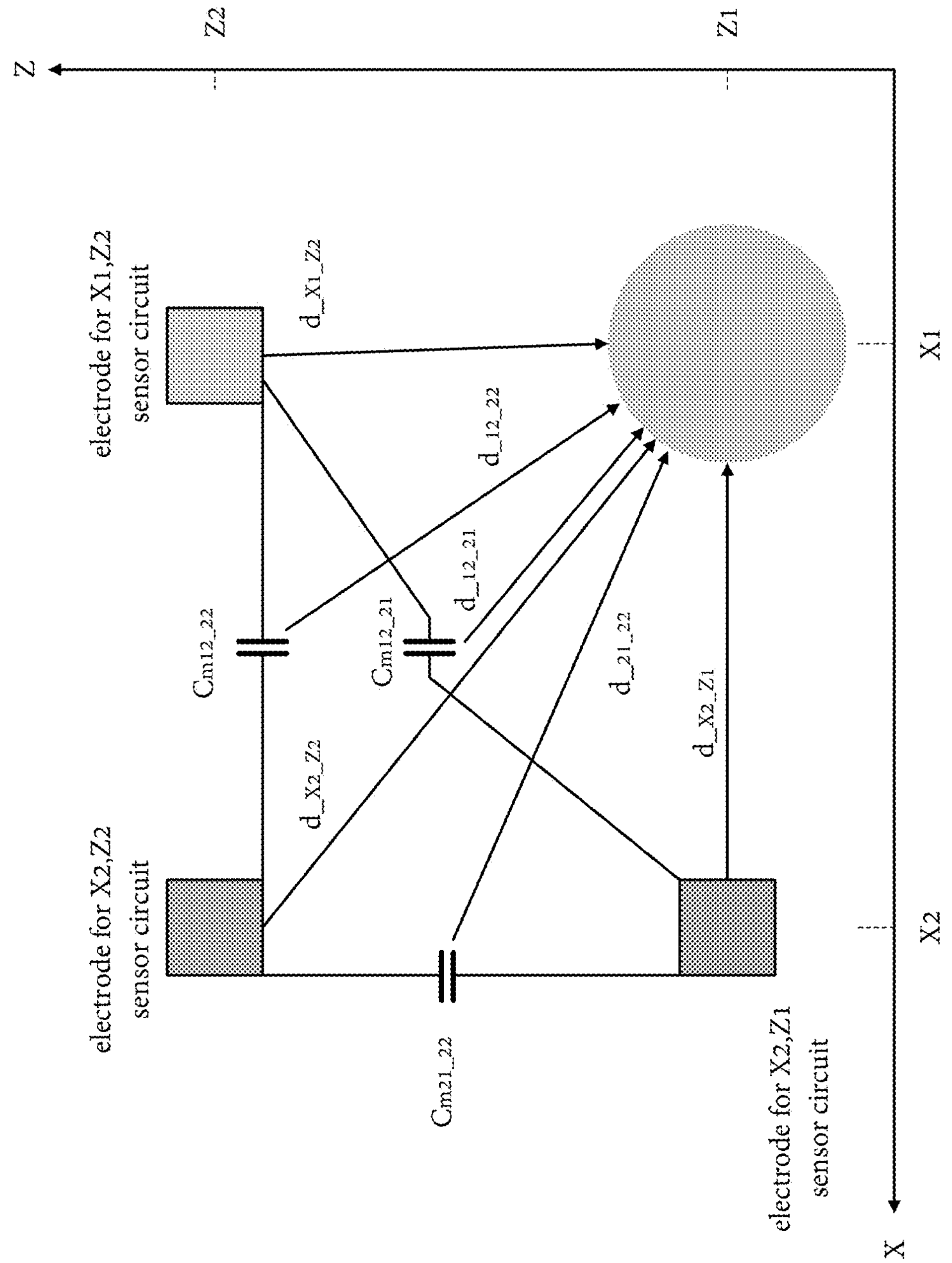
FIG. 75 is a schematic block diagram of an example of distances determined from data produced by sensor circuits in an X-Z plane regarding the object image in accordance with various embodiments.

FIGS. 73-75 present embodiments of determining distance data based on self and/or mutual-capacitance via sensor circuits in a X-Z plane to perform object contouring. FIG. 73 is a schematic block diagram of an example of e-fields produced by sensor circuits in an X-Z plane for sensing an object image in the X-Z plane via self-capacitance. FIG. 74 is a schematic block diagram of an example of e-fields produced by sensor circuits in an X-Z plane for sensing an object image in the X-Z plane via mutual-capacitance. FIG. 75 is a schematic block diagram of an example of distances determined from data produced by sensor circuits in an X-Z plane regarding the object image.

For example, alternatively or in addition to performing distance measurements via sensor circuits of the X-Y plane and/or the Y-Z plane based on self-capacitance and/or mutual-capacitance as discussed and illustrated in conjunction with FIGS. 67-72, similar distance measurements can similarly be performed based on self-capacitance via sensor circuits of the X-Z plane. For example, the same object of FIGS. 67-69 and/or of FIGS. 70-72 occupying the space at X1, Y2 has further contouring of its 3D surface determined based on further utilizing the electrodes and corresponding sensor circuits of the X-Z plane to achieve contouring data for the object from a greater number of angles and/or sides of the object. Some or all of the functionality of sensor circuits and electrodes of the X-Y plane and/or the Y-Z described in conjunction with FIGS. 67-72 can be implemented via the sensor circuits and electrodes of the X-Z plane of FIGS. 73-75.

Note that the electrodes of the X-Z plane can be implemented to: have surfaces on planes parallel with the surfaces of electrodes of the X-Y plane, for example, as illustrated in FIGS. 73 and 67, respectively: have surfaces on planes parallel with the surfaces of electrodes of the Y-Z plane, for example, as illustrated in FIGS. 73 and 70, respectively; and/or have surfaces orthogonal to and/or otherwise non-parallel with the X-Z plane as illustrated in FIG. 73. Alternatively, the electrodes can have their surfaces parallel with the X-Z plane in a similar fashion as illustrated in FIG. 67, and/or in any other orientation relative to the respective plane. The electrodes can optionally have rounded and/or non-flat surfaces, for example, based on being electrodes 209 of support columns 219 or other rods along the X-Z plane.

Figure 76A:
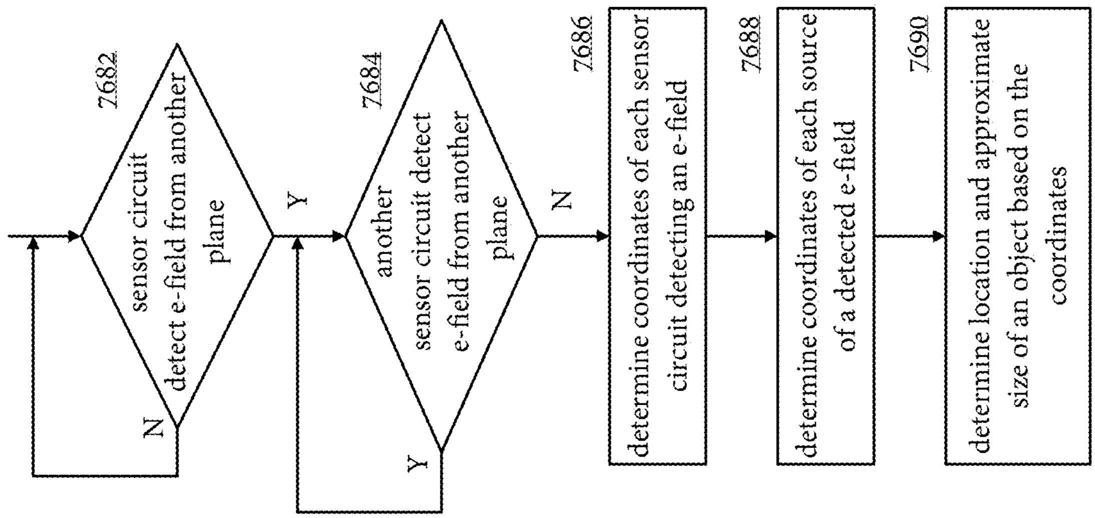
FIG. 76A is a logic diagram of an example of method for determining approximate size and location of an object in accordance with various embodiments.

FIG. 76A is a logic diagram of an example of method for determining approximate size and location of an object. For example, some or all steps of the method of FIG. 76A are performed via a processing module 250, one or more sensor circuits 215, and/or one or more electrodes 207 and/or 209, for example, based on some or all functionality discussed in conjunction with FIGS. 49-50 and/or FIGS. 58-64. Some or all steps of the method of FIG. 76A can be performed in conjunction with some or all steps of any one or more other methods described herein.

Step 7682 includes a sensor circuit of a given plane detecting an e-field from another plane. If a sensor circuit detects an e-field from another plane, the method continues to Step 7684, where another sensor circuit detect e-field from another plane. The other sensor circuit is optionally on a different plane from the given plane. If another sensor circuit also detects an e-field from another plane, the method continues to step 7686, which includes determining coordinates of each sensor circuit detecting an e-field. Step 7688 includes determine coordinates of each source of a detected e-field. For example, a source of a detected e-field is identified based on a frequency of the detected e-field that uniquely identifies the source. Step 7690 includes determining the location and approximate size of an object based on the coordinates determined in steps 7686 and/or 7688.

Figure 76B:
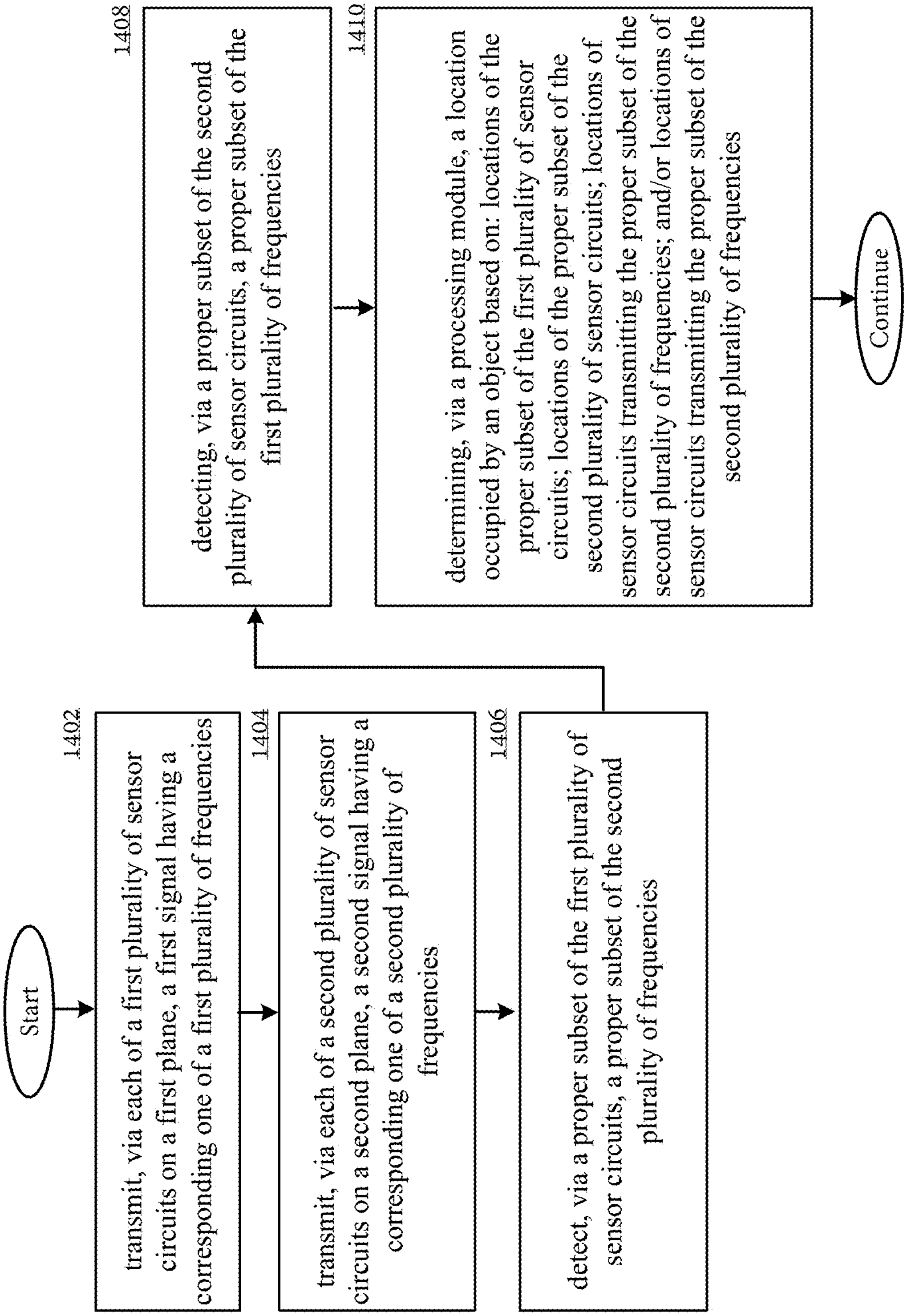
FIG. 76B is a is a logic diagram of an example method for execution in accordance with various embodiments.

FIG. 76B is a logic diagram illustrating a method of determining approximate size and/or and location of an object. Some or all of the method of FIG. 76B can be performed via a processing module 250, at least one sensor circuit 215, at least one transmitter 214, and/or at least one receiver 216. for example, based on some or all functionality discussed in conjunction with one or more of FIGS. 58-64. Some or all of the method of 76B can be performed via any computing entity of FIGS. 2A-2D and/or any processing module, which can be associated with a corresponding vehicle, a vehicle sensor system 100, another sensor system, or any other system, for example, that includes sensor circuits 215 on multiple planes operable to transmit a signal at a respective frequencies and/or to detect frequencies transmitted by other sensor circuits. Some or all of the method of 76B can be performed based on performing the method of FIG. 76A and/or some or all steps of any other method described herein.

Step 1402 includes transmitting, via each of a first plurality of sensor circuits on a first plane, a first signal having a corresponding one of a first plurality of frequencies. Step 1404 includes transmitting, via each of a second plurality of sensor circuits on a second plane, a second signal having a corresponding one of a second plurality of frequencies. Step 1406 includes detecting, via a proper subset of the first plurality of sensor circuits, a proper subset of the second plurality of frequencies. Step 1408 includes detecting, via a proper subset of the second plurality of sensor circuits, a proper subset of the first plurality of frequencies. Step 1410 includes determining, via a processing module, a location occupied by an object, and/or its true and/or approximate shape and/or size, based on: locations of the proper subset of the first plurality of sensor circuits; locations of the proper subset of the second plurality of sensor circuits; locations of sensor circuits transmitting the proper subset of the second plurality of frequencies; and/or locations of sensor circuits transmitting the proper subset of the second plurality of frequencies.

In various embodiments, the location occupied by an object is based on a proper subset of coordinates in three-dimensional space of a plurality of coordinates in three-dimensional space, where only the proper subset of coordinates in three-dimensional space are determined to be occupied by the object and/or wherein some or all of a set difference between the plurality of coordinates and the proper subset of the plurality of coordinates are determined to not be occupied by the object.

The proper subset of coordinates in three-dimensional space are determined to be occupied by the object can be utilized to further determine a size of the object, such as a number of coordinates occupied if the coordinates are evenly distributed, for example, where an approximate and/or maximum a volume is determined based on the number of coordinates occupied. Each individual coordinate can correspond to a known unit of volume, for example, based on its distance from neighboring coordinates and/or based on the surface area of respective electrodes on the first plane and second plane, where a summation of the known unit of volume across all of the occupied coordinates can be utilized to determine the volume.

The proper subset of coordinates in three-dimensional space are determined to be occupied by the object can be utilized to further determine a shape of the object, such as approximate and/or maximal dimensions of the object in three dimensions based on the proper subset of coordinates occupied an approximate outline and/or outermost surface of the object, and/or the dimensions of a region that bounds and/or includes some or all of outer surface of the object. Various dimensions of the object can be determined based on distances between respective ones of the set of coordinates.

In various embodiments, a first plurality of lines intersect the first plurality of sensor circuits in a first direction orthogonal to the first plane, and a second plurality of lines intersect the second plurality of sensor circuits in a second direction orthogonal to the second plane. The plurality of coordinates can be formed at intersections of the first plurality of lines and the second plurality of lines. Determining the location, size and/or shape of the object includes determining a proper subset of the plurality of coordinates occupied by the object based locations of the proper subset of the first plurality of sensor circuits; locations of the proper subset of the second plurality of sensor circuits; locations of sensor circuits transmitting the proper subset of the second plurality of frequencies; and/or locations of sensor circuits transmitting the proper subset of the second plurality of frequencies.

In various embodiments, the proper subset of the second plurality of frequencies are detected via the proper subset of the first plurality of sensor circuits based on the location of the object, based on the locations of the proper subset of the first plurality of sensor circuits, and based on the locations of sensor circuits transmitting the proper subset of the second plurality of frequencies, where electric fields emitted by the sensor circuits transmitting the proper subset of the second plurality of frequencies propagate through the object for detection by the proper subset of the first plurality of sensor circuits. In various embodiments, the proper subset of the first plurality of frequencies are detected via the proper subset of the second plurality of sensor circuits based on the location of the object, based on the locations of the proper subset of the second plurality of sensor circuits, and based on the locations of sensor circuits transmitting the proper subset of the first plurality of frequencies, where electric fields emitted by the sensor circuits transmitting the proper subset of the first plurality of frequencies propagate through the object for detection by the proper subset of the second plurality of sensor circuits.

In various embodiments, electrodes of the first plurality of sensor circuits on the first plane form a grid pattern on the first plane having a plurality of rows and columns, where each row includes multiple ones of the first plurality of sensor circuits and where each column includes multiple ones of the first plurality of sensor circuits. In various embodiments, electrodes of the second plurality of sensor circuits on the second plane form a grid pattern on the second plane having a plurality of rows and columns, where each row includes multiple ones of the first second of sensor circuits and where each column includes multiple ones of the second plurality of sensor circuits. In various embodiments, electrodes of the first plurality of sensor circuits on the first plane form first pattern on the first plane, and wherein electrodes of the second plurality of sensor circuits on the second plane form a second pattern that is different from the first pattern.

In various embodiments each of the first plurality of sensor circuits and second plurality of sensor circuits transmit their signal upon a corresponding electrode, and where each of proper subset of the first plurality of sensor circuits and the proper subset of the second plurality of sensor circuits further detect the proper subset of the second plurality of frequencies based on changes in electrical characteristics of the corresponding electrode.

In various embodiments, some or all of the electrodes on the first plane only transmit signals and/or only detect frequencies, for example, implemented as transmitters 214 and/or receivers 216 only. In some or all of the electrodes on the first plane only transmit signals and/or only detect frequencies, for example, implemented as transmitters 214 and/or receivers 216 only. For example, only steps 1402, 1408, and 1410 are performed, where the location occupied by an object, and/or its true and/or approximate shape and/or size, is determined based on: locations of the proper subset of the second plurality of sensor circuits on the second plane, and locations of sensor circuits on the first plane transmitting the proper subset of the first plurality of frequencies.

Figure 77:
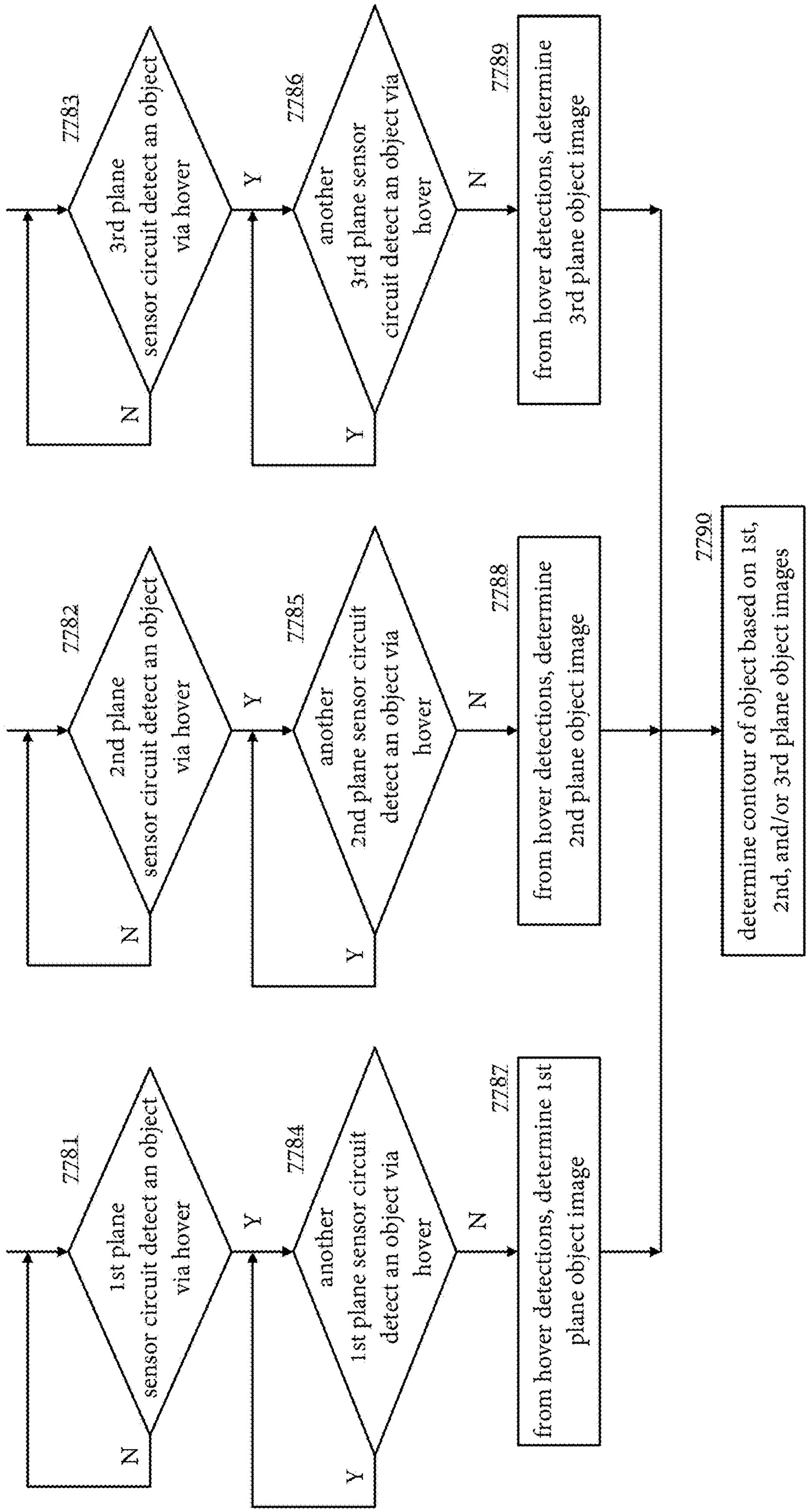
FIG. 77 is a logic diagram of an example of method for determining contour of an object in accordance with various embodiments.

FIG. 77 is a logic diagram of an example of method for determining contour of an object. For example, some or all steps of the method of FIG. 77 are performed via a processing module 250, one or more sensor circuits 215, and/or one or more electrodes 207 and/or 209, for example, based on some or all functionality discussed in conjunction with FIGS. 49-50, 65-75, and/or FIGS. 80A-80D. Some or all steps of the method of FIG. 77 can be performed in conjunction with some or all steps of FIG. 76A and/or in conjunction with some or all steps of any one or more other methods described herein.

Step 7781 includes a sensor circuit of a first plane detecting an object via detecting hovering of the object over the first plane. Step 7784 includes at least one other sensor circuit of the first plane detecting an object via detecting hovering of the object over the first plane. The object detected in steps 7781 and 7784 can correspond to the same object. When the two or more sensor circuits of the first plane detect an object via such hover detections, step 7787 is performed to determine a first plane object image, for example, in a same or similar fashion as illustrated in FIGS. 68 and/or 69, where the first plane is the x-y plane. Determining the first plane object image can be based on performing some or all steps of FIG. 78A for the first plane.

Step 7782 includes a sensor circuit of a second plane detecting the object via detecting hovering of the object over the second plane. Step 7785 includes at least one other sensor circuit of the second plane detecting an object via detecting hovering of the object over the second plane. The second plane can be orthogonal to the first plane or otherwise different from the first plane. The object detected in steps 7782 and 7785 can correspond to the same object, for example, hovering over different portions of the second plane and detected by corresponding different sensor circuits. The object detected in steps 7782 and 7785 can correspond to the same object detected in steps 7781 and 7784, for example, based on hovering over both the first plane and the second plane. When the two or more sensor circuits of the second plane detect an object via such hover detections, step 7788 is performed to determine a second plane object image, for example, in a same or similar fashion as illustrated in FIGS. 71 and/or 72, where the second plane is the y-z plane. Determining the second plane object image can be based on performing some or all steps of FIG. 78A for the second plane.

Step 7783 includes a sensor circuit of a third plane detecting the object via detecting hovering of the object over the third plane. Step 7786 includes at least one other sensor circuit of the third plane detecting an object via detecting hovering of the object over the third plane. The third plane can be orthogonal to the first plane and/or the second plane or otherwise different from the first plane and the second plane. The object detected in steps 7783 and 7786 can correspond to the same object, for example, hovering over different portions of the third plane and detected by corresponding different sensor circuits. The object detected in steps 7783 and 7786 can correspond to the same object detected in steps 7781 and 7784 and/or in steps 7782 and 7785, for example, based on hovering over the third plane, as well as the first plane and/or the second plane. When the two or more sensor circuits of the third plane detect an object via such hover detections, step 7789 is performed to determine a third plane object image, for example, in a same or similar fashion as illustrated in FIGS. 74 and/or 75, where the third plane is the x-z plane. Determining the third plane object image can be based on performing some or all steps of FIG. 78A for the third plane.

Step 7790 includes determining contour of the object based on the first, second, and/or third plane object images. For example, the contour of a three dimensional image in the 3D space is determined based on combining and/or otherwise processing the two-dimensional images of the first, second, and/or third plane. Performing step 7790 can include performing some or all steps of FIG. 79.

Figure 78A:
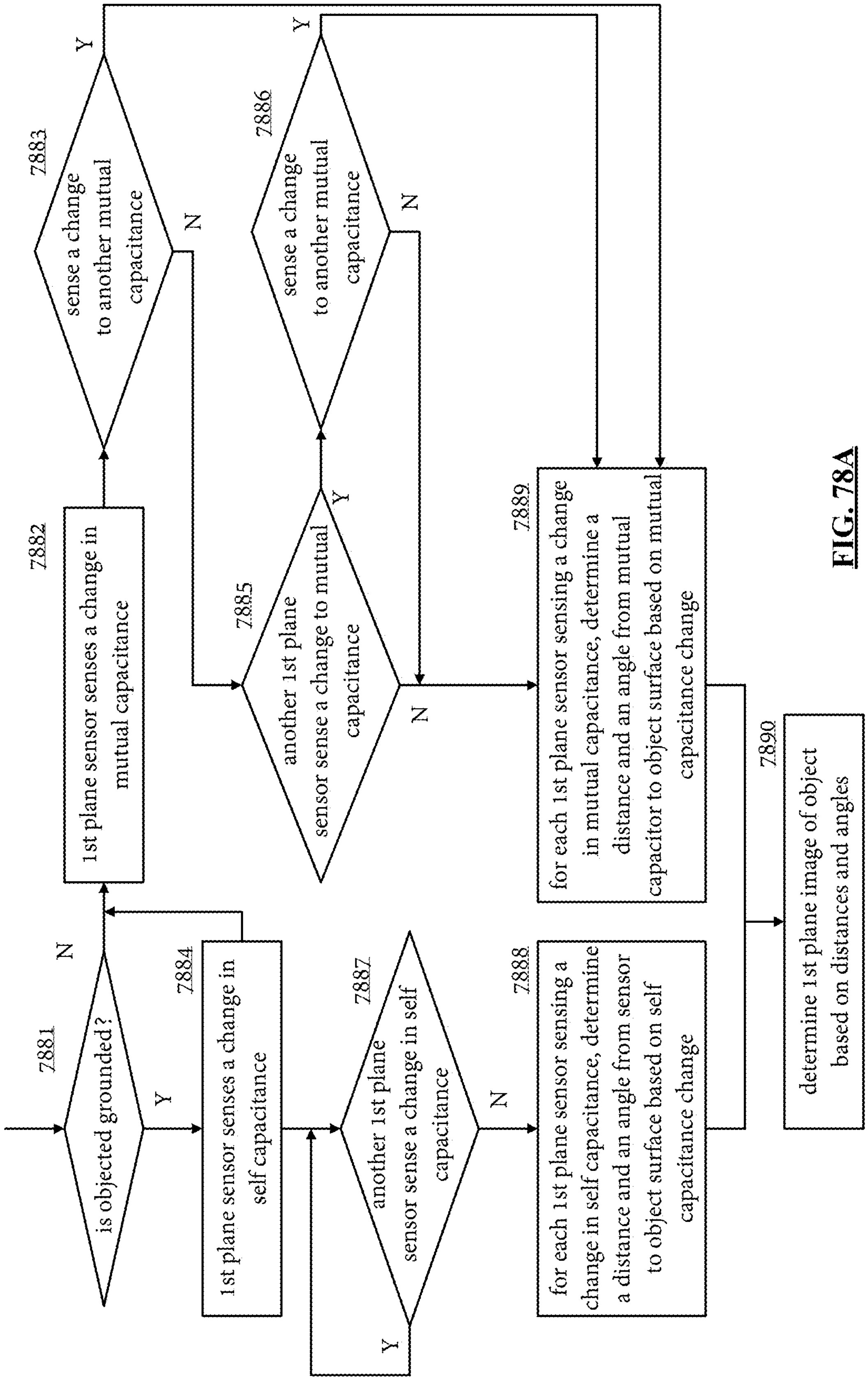
FIG. 78A is a logic diagram of an example of method for determining a first plane image of an object in accordance with various embodiments.
Figure 78B:
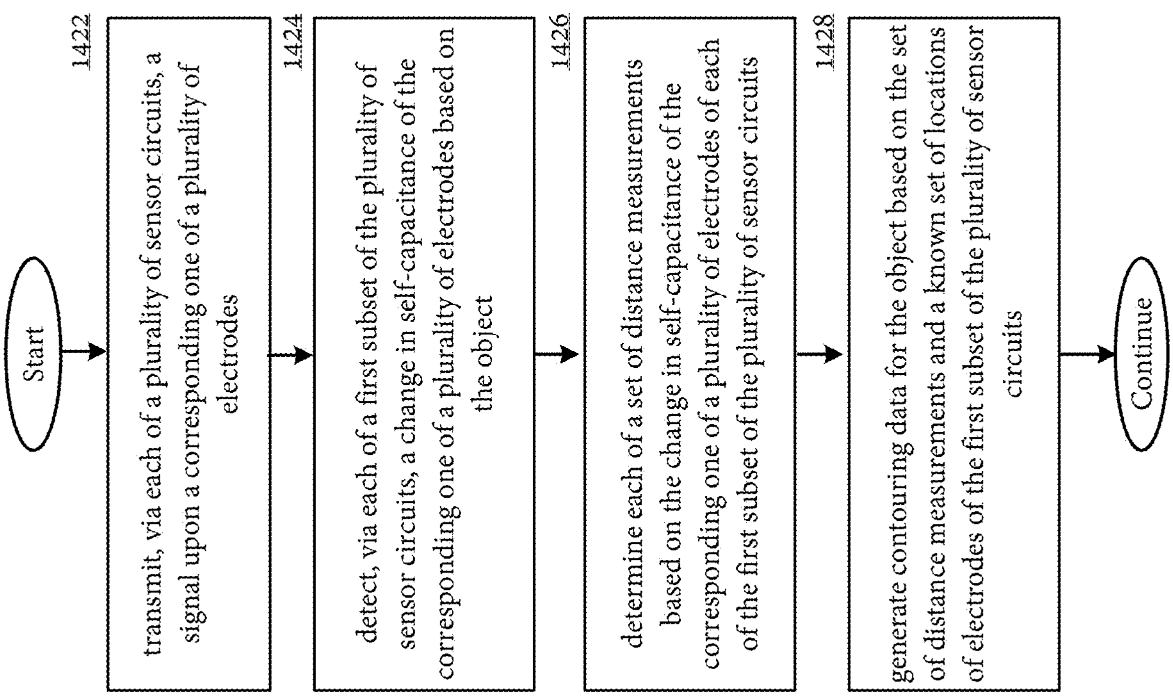
FIG. 78B is a logic diagram of an example method for execution in accordance with various embodiments.

FIG. 78A is a logic diagram of an example of method for determining a first plane image of an object. For example, some or all steps of the method of FIG. 78A are performed via a processing module 250, one or more sensor circuits 215, and/or one or more electrodes 207 and/or 209, for example, based on some or all functionality discussed in conjunction with FIGS. 49-50 and/or FIGS. 65-75. Some or all steps of the method of FIG. 78A can be performed in conjunction with some or all steps of FIG. 76, FIG. 77 and/or any one or more other methods described herein. While the steps of FIG. 78A are performed for a first plane, the same or similar method can be performed for a second plane and/or a third plane.

Step 7881 includes determining whether a detected object is grounded. For example, the detection and/or location of the object is determined based on performing the method of FIG. 76.

When the object is grounded, step 7884 is performed, where a first plane sensor senses a change in self-capacitance. Performing step 7884 can be performed as discussed in conjunction with FIGS. 67 and/or 69. In step 7887, at least one other 1st plane sensor can sense a change in self-capacitance.

In step 7888, for each first plane sensor sensing a change in self-capacitance in steps 7884 and 7887, a distance and an angle from sensor to object surface can be determined based on self-capacitance change. The angle from the sensor to object surface can further be determined based on a detected location of the object, such as coordinates of the object determined by also performing some or all of method of FIG. 76. Each distance and angle can correspond to a vector in three dimensional space with a component orthogonal to the first plane. Alternatively or in addition, each distance and angle can correspond to a vector in two dimensional vector upon the first plane, for example, based on projecting the three dimensional vector upon the first plane. Self-capacitances can be measured and utilized to determine distances in steps 7884, 7887, and 7888 only when the detected object is determined to be grounded in step 7881.

After performing step 7884 and/or when the detected object is determined to be not grounded in step 7881, step 7882 is performed where a first plane sensor senses a change in mutual-capacitance, for example, with a first other sensor on the first plane. Step 7883 can also be performed where this first plane sensor senses one or more other change in mutual-capacitance, for example, with one or more second other sensors on the first plane. Step 7885 can also be performed where a different first plane sensor senses a change in mutual-capacitance, for example, with a first other sensors on the first plane. Step 7886 can also be performed, where the different first plane sensor senses one or more other change in mutual-capacitance, for example, with a second one or more other sensors on the first plane.

In step 7889, for each first plane sensor sensing a change in self-capacitance in steps 7882, 7883, 7885, and/or 7886, a distance and an angle from a mutual capacitor to object surface can be determined based on mutual-capacitance change. The angle from the mutual capacitor to object surface can further be determined based on a detected location of the object, such as coordinates of the object determined by also performing some or all of method of FIG. 76. The location of the mutual capacitor can be based on the locations of two respective sensors having a mutual-capacitance, such as a midpoint between the locations of the two respective sensors and/or another location between the two respective sensors, upon the first plane. Each distance and angle can correspond to a vector in three dimensional space with a component orthogonal to the first plane. Alternatively or in addition, each distance and angle can correspond to a vector in two dimensional vector upon the first plane, for example, based on projecting the three dimensional vector upon the first plane. Mutual-capacitances can be measured and utilized to determine distances in steps 7882, 7883, 7885, and/or 7886 regardless of whether the detected object is determined to be grounded in step 7881.

Step 7890 includes determine the first plane image of object based on these distances and angles. The first plane image can correspond to a projection of the object's surface upon the first plane. Alternatively or in addition, the method can include utilizing the distances and angles to determine corresponding points upon the object's surface in three dimensional space, for example, where the object's contouring is determined based upon these points alternatively or in addition to its projection upon the first plane.

FIG. 76B is a logic diagram illustrating a method of contouring of an object. Some or all of the method of FIG. 78B can be performed via a processing module 250, at least one sensor circuit 215, at least one transmitter 214, and/or at least one receiver 216. for example, based on some or all functionality discussed in conjunction with one or more of FIGS. 65-77. Some or all of the method of 78B can be performed via any computing entity of FIGS. 2A-2D and/or any processing module, which can be associated with a corresponding vehicle, a vehicle sensor system 100, another sensor system, or any other system, for example, that includes sensor circuits 215 on multiple planes operable to detect changes in self-capacitance induced by objects in the vicinity. Some or all of the method of 78B can be performed in conjunction with performing the method of FIG. 76A, FIG. 77, FIG. 78A and/or some or all steps of any other method described herein.

Step 1422 includes transmitting, via each of a plurality of sensor circuits, a signal upon a corresponding one of a plurality of electrodes, such as electrodes 207 and/or 209. Step 1424 includes detecting, via a first subset of the plurality of sensor circuits, a change in self-capacitance of the corresponding one of a plurality of electrodes based on the object. Step 1426 includes determining each of a set of distance measurements based on the change in self-capacitance of the corresponding one of a plurality of electrodes of each of the first subset of the plurality of sensor circuits, for example, via a processing module. Step 1428 includes determining contouring data for the object based on the set of distance measurements and a known set of locations of electrodes of the first subset of the plurality of sensor circuits, for example, via a processing module.

In various embodiments, the method further includes determining a location occupied by an object in three-dimensional space based on sensed signal data generated via a second subset of the plurality of sensor circuits, for example, based on performing some or all steps of the method of FIG. 76B. In various embodiments, the first subset of the plurality of sensor circuits and the second subset of the plurality of sensor circuits are mutually exclusive. Alternatively, at least one of the second subset of the plurality of sensor circuits is included in the first subset of the plurality of sensor circuits.

In various embodiments, the method can further include determining a set of angle measurements for each of the set of distance measurements based on the location occupied by the object and based on one of the known set of locations of a corresponding one of the first subset of the plurality of sensor circuits. The contouring data for the object can be generated further based on applying the set of angle measurements to the set of distance measurements.

In various embodiments, the location occupied by an object in three-dimensional space includes a plurality of three-dimensional coordinates occupied by the object. Determining each of the set of angle measurements can includes selecting one of the plurality of three-dimensional coordinates closest to the one of the known set of locations of the corresponding one of the first subset of the plurality of sensor circuits.

In various embodiments set of two-dimensional projections of the location occupied by the object upon each of a set of two-dimensional planes that includes the plurality of electrodes includes a first set of known locations of electrodes of the second subset of the plurality of sensor circuits. In various embodiments, the set of two-dimensional projections of the location occupied by the object upon the of the set of two-dimensional planes does not include a second set of known locations of electrodes of the first subset of the plurality of sensor circuits.

In various embodiments, the contouring data for the object includes a plurality of points in three-dimensional space determined to correspond to a surface of the object. In various embodiments, the contouring data for the object includes a set of two-dimensional projections of the surface of the object upon a corresponding set of two-dimensional planes that include the plurality of electrodes.

In various embodiments, the signal transmitted by each of a plurality of sensor circuit has a corresponding one of a set of different frequencies, where the change in self-capacitance of each of the corresponding plurality of electrodes is detected based on detecting the one of the different frequencies. In various embodiments, the change in self-capacitance of each of the corresponding plurality of electrodes is detected based on the object being grounded. In various embodiments, the contouring data is generated based on determining the object is grounded.

Figure 78C:
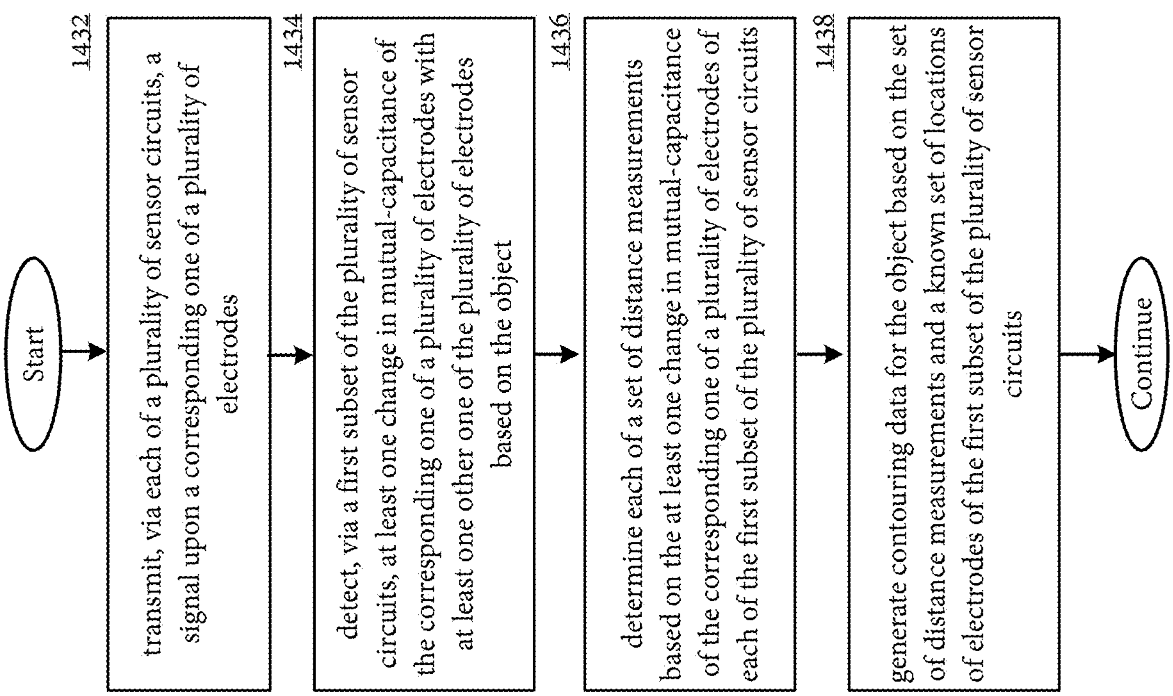
FIG. 78C is a logic diagram of an example method for execution in accordance with various embodiments.

FIG. 78C is a logic diagram illustrating a method of contouring of an object. Some or all of the method of FIG. 78C can be performed via a processing module 250, at least one sensor circuit 215, at least one transmitter 214, and/or at least one receiver 216. for example, based on some or all functionality discussed in conjunction with one or more of FIGS. 65-77. Some or all of the method of 78C can be performed via any computing entity of FIGS. 2A-2D and/or any processing module, which can be associated with a corresponding vehicle, a vehicle sensor system 100, another sensor system, or any other system, for example, that includes sensor circuits 215 on multiple planes operable to detect changes in mutual-capacitance induced by objects in the vicinity. Some or all of the method of 78C can be performed in conjunction with on performing the method of FIG. 76A, FIG. 77, FIG. 78A, FIG. 78B and/or some or all steps of any other method described herein.

Step 1432 includes transmitting, via each of a plurality of sensor circuits, a signal upon a corresponding one of a plurality of electrodes, such as electrodes 207 and/or 209. Step 1434 includes detecting, via a first subset of the plurality of sensor circuits, at least one change in mutual-capacitance of the corresponding one of a plurality of electrodes with at least one other one of the plurality of electrodes based on the object. Step 1436 includes determining each of a set of distance measurements based on the at least one change in mutual-capacitance of the corresponding one of a plurality of electrodes of each of the first subset of the plurality of sensor circuits. Step 1438 includes generating contouring data for the object based on the set of distance measurements and a known set of locations of electrodes of the first subset of the plurality of sensor circuits.

In various embodiments, generating contouring data for the object based on the determining a set of start points between each pair of electrodes having a change in mutual-capacitance utilized to determine a corresponding one of the set of distance measurements. Each of the set of distance measurements is applied to a corresponding one of the set of start points.

In various embodiments, the start point of a given pair of electrodes is a midpoint between known locations of the pair of electrodes. In various embodiments, each given pair of electrodes are on a same two-dimensional plane, and each corresponding one the set of start points are on the same two-dimensional plane as the given pair of electrodes. In various embodiments, a first subset of pairs of electrodes are all on a first two-dimensional plane, and a second subset of pairs of electrodes are all on a second two-dimensional plane. The second two-dimensional plane can be orthogonal to the first two-dimensional plane and/or can be non-parallel with the second two-dimensional plane.

In various embodiments, the method includes determining a location occupied by an object in three-dimensional space based on sensed signal data generated via a second subset of the plurality of sensor circuit, for example, based on performing some or all of the method of FIG. 76B. In various embodiments, the method can further include determining a set of angle measurements for each of the set of distance measurements based on the location occupied by the object and/or based on a pair of the known set of locations of a corresponding pair of the first subset of the plurality of sensor circuits having the mutual-capacitance utilized to determine the each of the set of distance measurements. The contouring data for the object can be generated based on applying the set of angle measurements to the set of distance measurements. In various embodiments, the contouring data can be further generated based on applying each given angle measurement and corresponding distance measurement to a corresponding start point between a pair of electrodes having the mutual-capacitance.

In various embodiments, the location occupied by an object in three-dimensional space includes a plurality of three-dimensional coordinates occupied by the object. Determining each of the set of angle measurements can include selecting one of the plurality of three-dimensional coordinates closest to a midpoint, or other point, between the pair of the known set of locations of a corresponding change in mutual-capacitance. In various embodiments, the first subset of the plurality of sensor circuits and the second subset of the plurality of sensor circuits are mutually exclusive. In various embodiments, at least one sensor circuits in the first subset of the plurality of sensor circuits is also included in the second subset of the plurality of sensor circuits.

In various embodiments, a set of two-dimensional projections of the location occupied by the object upon each of a set of two-dimensional planes that includes the plurality of electrodes includes a first set of known locations of electrodes of the second subset of the plurality of sensor circuits. In various embodiments, the set of two-dimensional projections of the location occupied by the object upon the of the set of two-dimensional planes does not include a second set of known locations of electrodes of the first subset of the plurality of sensor circuits. In various embodiments, the set of two-dimensional projections of the location occupied by the object upon the of the set of two-dimensional planes does not include a second set of known locations of electrodes with which each of the first subset of the plurality of sensor circuits have a mutual-capacitance.

In various embodiments, the contouring data for the object includes a plurality of points in three-dimensional space determined to correspond to a surface of the object. In various embodiments, the contouring data for the object includes a set of two-dimensional projections of the surface of the object upon a corresponding set of two-dimensional planes that include the plurality of electrodes.

In various embodiments, the signal transmitted by each of a plurality of sensor circuit has a corresponding one of a set of different frequencies, and wherein the self-capacitance of each of the corresponding plurality of electrodes is detected based on detecting the one of the different frequencies. In various embodiments, the at least one mutual-capacitance determined by each of the plurality of sensor circuits is based on detecting at least one other frequency of the set of different frequencies transmitted by at least one other one of the plurality of sensor circuits upon at least one other electrode in proximity to the corresponding one of the plurality of electrodes of the each of the plurality of sensor circuits.

Figure 79:
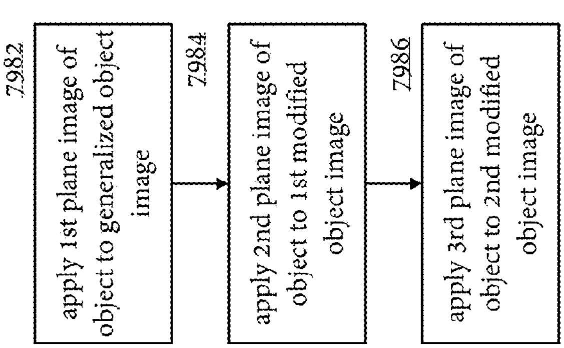
FIG. 79 is a logic diagram of an example of method for determining a contoured object from first, second, and third plane images of an object in accordance with various embodiments.

FIG. 79 is a logic diagram of an example of method for determining a contoured object from first, second, and third plane images of an object. For example, some or all steps of the method of FIG. 79 are performed via a processing module 250, one or more sensor circuits 215, and/or one or more electrodes 207 and/or 209, for example, based on some or all functionality discussed in conjunction with FIGS. 49-50, FIGS. 65-75, and/or FIGS. 80A-80D. Some or all steps of the method of FIG. 79 can be performed in conjunction with some or all steps of FIG. 76, FIG. 77, FIG. 78A and/or any one or more other methods described herein.

Figure 80A:
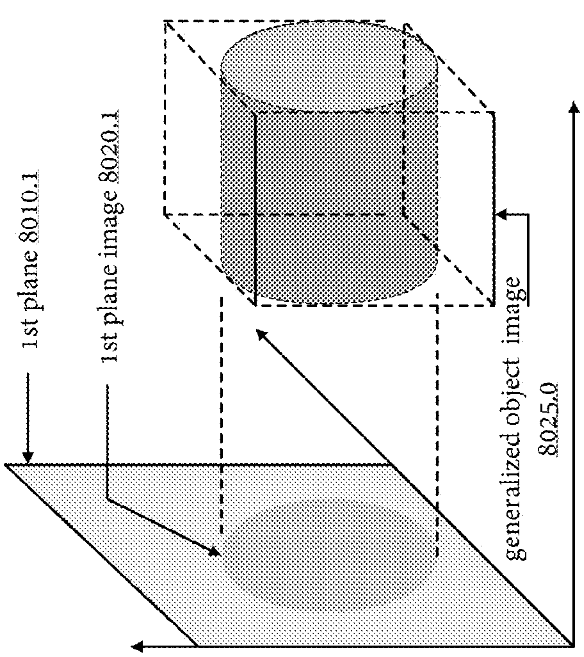
FIGS. 80A-80D are schematic block diagrams of an example of determining a contoured object from first, second, and third plane images of an object in accordance with various embodiments.

Step 7982 includes applying a first plane image of object to a generalized object image in three dimensional space to determine a first modified object image. For example, step 7982 is performed as illustrated in FIG. 80A to determine the first modified object image of FIG. 80B. The first plane image can be determined by performing some or all steps of FIG. 78A for the first plane.

Figure 80B:
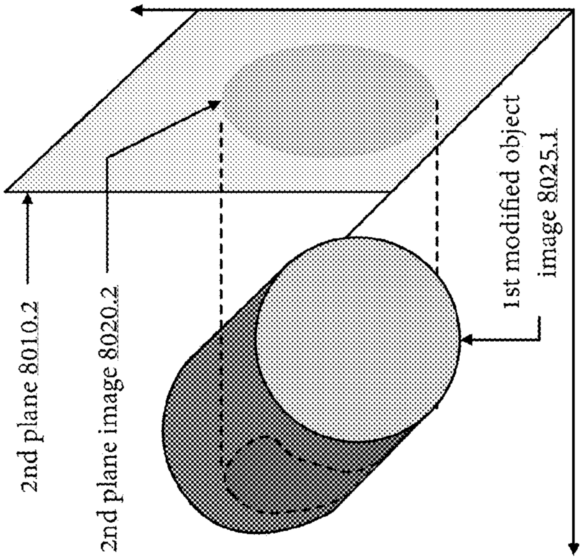

Step 7984 includes applying a second plane image of object to the first modified object image to determine a second modified object image in three dimensional space. For example, step 7984 is performed as illustrated in FIG. 80B to determine the second modified object image of FIG. 80C. The second plane image can be determined by performing some or all steps of FIG. 78A for the second plane.

Figure 80C:
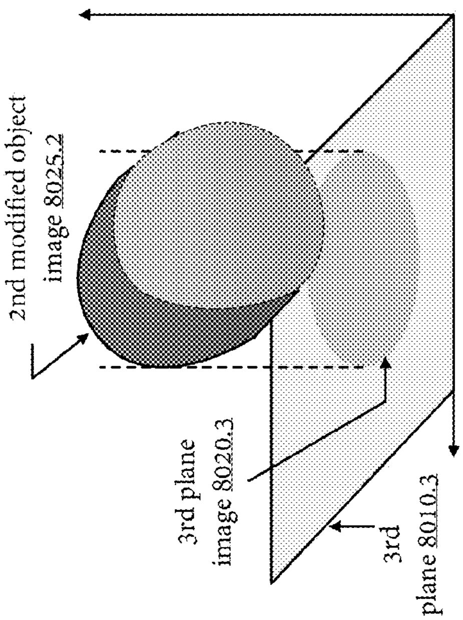

Step 7986 includes applying a third plane image of object to the second modified object image to determine a contoured in three dimensional space. For example, step 7986 is performed as illustrated in FIG. 80C to determine the contoured object image of FIG. 80D. The third plane image can be determined by performing some or all steps of FIG. 78A for the third plane.

FIGS. 80A-80D are schematic block diagrams of an example of determining a contoured object from first, second, and third plane images of an object, for example, based on performing some or all steps of FIG. 79. The example object of FIGS. 80A-80D can be spherical, and can optionally correspond to the example object of FIGS. 65-75.

A generalized object image can correspond to a cubical shape and/or other shape. The generalized object image 8025.0 can have a size and/or borders based on the locations of a corresponding set of sensors that detect the object, for example, as discussed in conjunction with FIGS. 58-64.

As illustrated in FIG. 80A, applying a determined first plane image 8020.1 to the generalized object image 8025.0 can be utilized to determine a first modified object image 8025.1. In this example, the first modified image corresponds to a cylindrical contouring based on the first plane image 8020.1 being a circle projected on the first plane 8010.1. For example, the first plane 8010.1 is the x-y plane, where the first plane image 8020.1 is determined as discussed in conjunction with FIGS. 67-69. As another example, the first plane image 8020.1 is determined as capacitance image data 233 generated via some or all features and/or functionality discussed in conjunction with FIGS. 47A-47F.

As illustrated in FIG. 80B, applying a determined second plane image 8020.2 to the first modified object image 8025.1 can be utilized to determine a second modified object image 8025.2. In this example, the second modified object image is generated by modifying the cylindrical contouring of the first modified object image based on the second plane image 8020.2 being a circle projected on the second plane 8010.2. For example, the second plane 8010.2 is the y-z plane, where the second plane image 8020.2 is determined as discussed in conjunction with FIGS. 70-72. As another example, the second plane image 8020.2 is determined as capacitance image data 233 generated via some or all features and/or functionality discussed in conjunction with FIGS. 47A-47F.

Figure 80D:
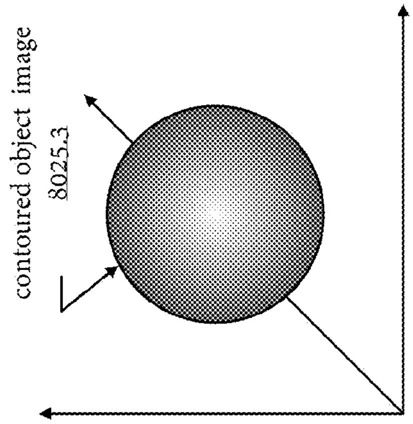

As illustrated in FIG. 80C, applying a determined third plane image 8020.3 to the second modified object image 8025.2 can be utilized to determine the contoured object image 8035.3, which is illustrated in FIG. 80D. In this example, the contoured object image 8035.3 is modified from the contouring of the second modified object image to render a spherical surface contouring based on the third plane image 8020.3 being a circle projected on the second plane 8010.3. For example, the third plane 8010.3 is the x-z plane, where the third plane image 8020.3 is determined as discussed in conjunction with FIGS. 73-75. As another example, the third plane image 8020.3 is determined as capacitance image data 233 generated via some or all features and/or functionality discussed in conjunction with FIGS. 47A-47F.

Figure 81:
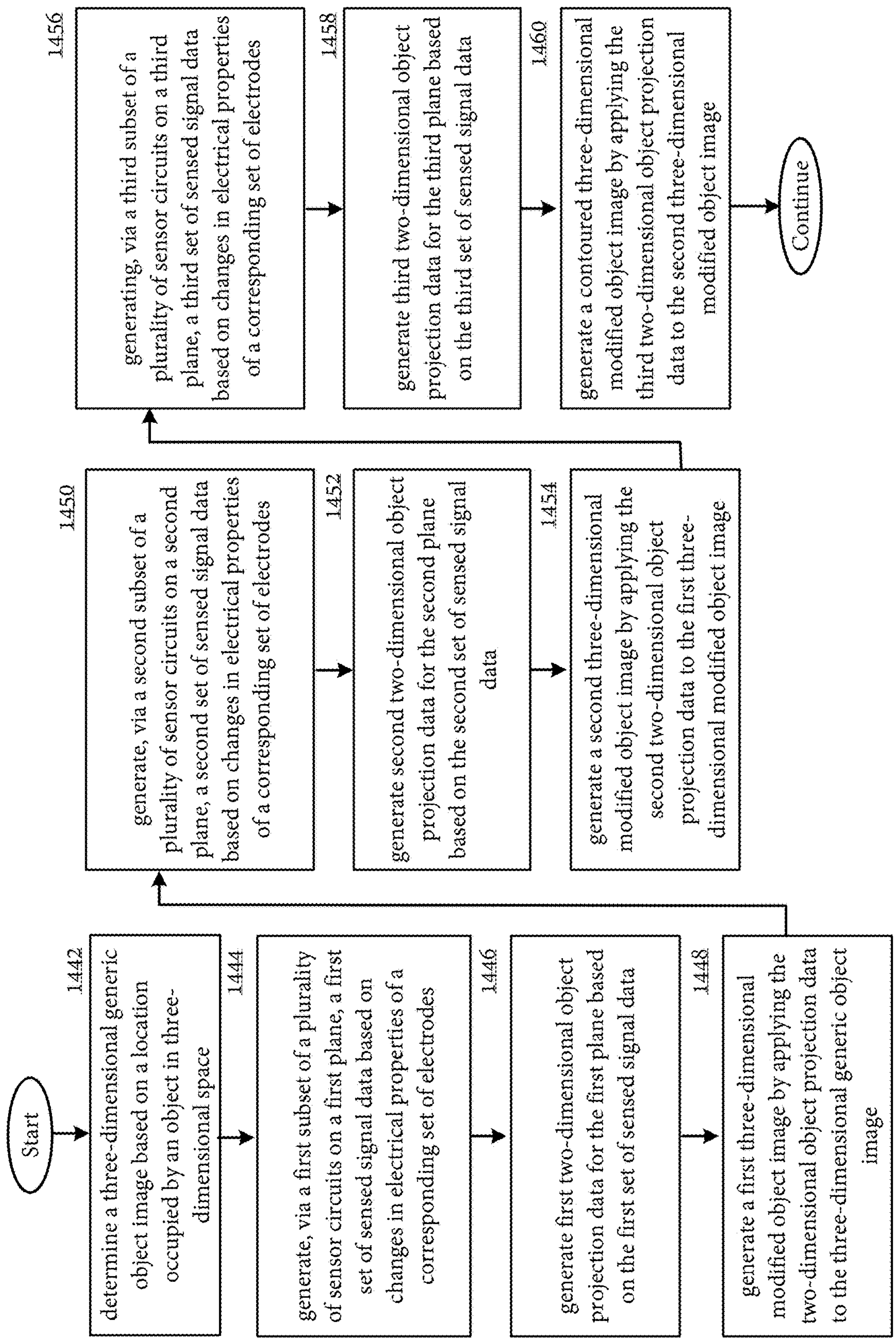
FIG. 81 is a logic diagram of an example of a method for execution in accordance with various embodiments.

FIG. 81 is a logic diagram illustrating a method of contouring of an object. Some or all of the method of FIG. 81 can be performed via a processing module 250, at least one sensor circuit 215, at least one transmitter 214, and/or at least one receiver 216. for example, based on some or all functionality discussed in conjunction with one or more of FIGS. 65-80. Some or all of the method of 81 can be performed via any computing entity of FIGS. 2A-2D and/or any processing module, which can be associated with a corresponding vehicle, a vehicle sensor system 100, another sensor system, or any other system, for example, that includes sensor circuits 215 on multiple planes operable to detect changes in electrical properties induced by objects in the vicinity. Some or all of the method of FIG. 81 can be performed in conjunction with performing the method of FIG. 76A, FIG. 77, FIG. 78A, FIG. 78B, FIG. 78C, and/or some or all steps of any other method described herein.

Step 1442 includes determining a three-dimensional generic object image based on a location occupied by an object in three-dimensional space. Step 1444 includes generating, via a first subset of a plurality of sensor circuits on a first plane, a first set of sensed signal data based on changes in electrical properties of a corresponding set of electrodes. Step 1446 includes generating first two-dimensional object projection data for the first plane based on the first set of sensed signal data, for example, via a processing module. Step 1448 includes generating a first three-dimensional modified object image by applying the two-dimensional object projection data to the three-dimensional generic object image, for example, via a processing module.

Step 1450 includes generating, via a second subset of a plurality of sensor circuits on a second plane, a second set of sensed signal data based on changes in electrical properties of a corresponding set of electrodes. Step 1452 includes generating second two-dimensional object projection data for the second plane based on the second set of sensed signal data, for example, via a processing module. Step 1454 includes generating a second three-dimensional modified object image by applying the second two-dimensional object projection data to the first three-dimensional modified object image, for example, via a processing module.

Step 1456 includes generating, via a third subset of a plurality of sensor circuits on a third plane, a third set of sensed signal data based on changes in electrical properties of a corresponding set of electrodes. Step 1458 includes generating third two-dimensional object projection data for the third plane based on the third set of sensed signal data, for example, via a processing module. Step 1460 includes generating a contoured three-dimensional modified object image by applying the third two-dimensional object projection data to the second three-dimensional modified object image, for example, via a processing module.

In various embodiments, the first plane, the second plane, and/or the third plane are orthogonal planes. In various embodiments, the first plane, the second plane, and/or the third plane are non-parallel planes.

In various embodiments, some or all of the electrodes of the first subset of a plurality of sensor circuits on the first plane are included within the locations of the first two-dimensional object projection upon the first plane. In various embodiments, some or all of the electrodes of the first subset of the plurality of sensor circuits on the first plane are not included within the locations of the first two-dimensional object projection upon the first plane.

In various embodiments, some or all of the electrodes of the second subset of a plurality of sensor circuits on the second plane are included within the locations of the second two-dimensional object projection upon the second plane. In various embodiments, some or all of the electrodes of the second subset of the plurality of sensor circuits on the second plane are not included within the locations of the second two-dimensional object projection upon the second plane.

In various embodiments, some or all of the electrodes of the second subset of a plurality of sensor circuits on the third plane are included within the locations of the third two-dimensional object projection upon the second plane. In various embodiments, some or all of the electrodes of the second subset of the plurality of sensor circuits on the third plane are not included within the locations of the third two-dimensional object projection upon the third plane.

In various embodiments, the changes in electrical characteristics are based on detected changes in mutual-capacitance of corresponding electrodes, detected changes in self-capacitance of corresponding electrodes, and/or detected changes in impedance of corresponding electrodes.

Figure 82:
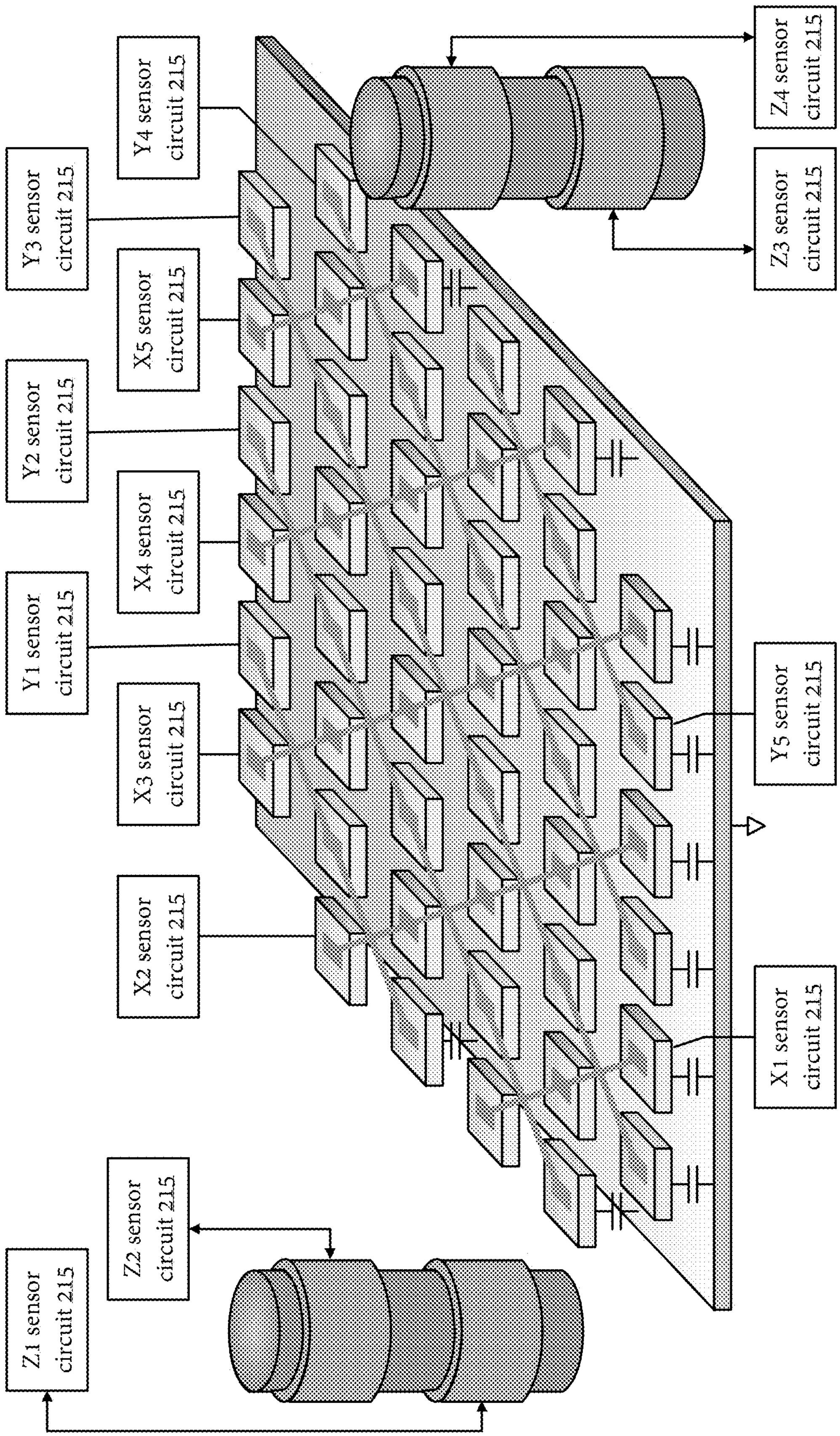
FIG. 82 is a schematic block diagram of an embodiment of a three-dimensional (3D) space having X, Y, and Z sensors for 3D object sensing in accordance with various embodiments.

FIG. 82 is a schematic block diagram of an embodiment of a three-dimensional (3D) space having X, Y, and Z sensors for 3D object sensing. A plurality of X sensor circuits on parallel to an x axis and/or a plurality of Y sensor circuits parallel to an x axis can have one or more corresponding electrodes 207 upon a corresponding surface, such as the x-y plane described herein. The y axis can be orthogonal to the x axis. In the case where a given sensor circuits has multiple electrodes, a location of a detected object, for example, projected upon the x-y plane, can be based on an intersection of a given Y sensor circuit and X sensor circuit detecting a given signal from another plane, such as a frequency associated with an electrode of a Z sensor circuit 215.

Two or more Z sensor circuits 215 can each be integrated upon a given support column 219 or other structure, such as another rod parallel with the Z direction and/or along another direction having a component in the Z direction. Two or more such support columns 219 can be implemented, to enable detection in two or three corresponding planes, such as the y-z plane and/or the x-z plane.

Other configurations of electrodes 207 and/or 209 and/or corresponding sensor circuits 215 upon one or more flat surfaces and/or one or more support structures can be implemented for other 3D spaces to enable detection of objects in 3D spaces of other embodiments utilizing some or all functionality described in conjunction with some or all features and/or functionality described in conjunction with FIGS. 58-80D. In any given configuration, the location of each electrode on a given surface and/or of a given support structure can be known and/or fixed, for example, where corresponding coordinates upon a given plane and/or in the 3D space are known and/or fixed, and/or its location with respect to locations other electrodes in the 3D space is known and/or fixed. These locations can be utilized to determine location and/or contouring of objects, for example, where angles and/or intersections described herein to contour and/or detect object are determined based on these known locations as described previously.

Figure 83A:
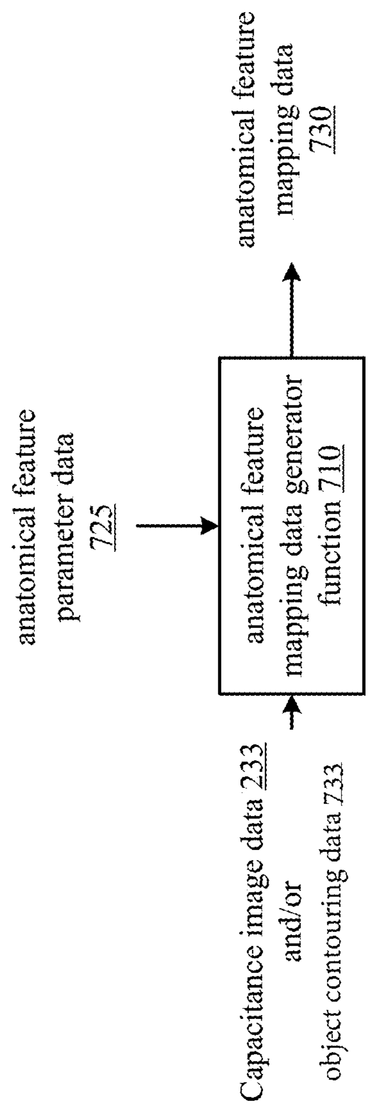
FIG. 83A is a schematic block diagram of an anatomical feature mapping data generator function 710 in accordance with various embodiments.

FIG. 83A illustrates an embodiment of an anatomical feature mapping data generator function for execution by a processing module. Some or all of the function of FIG. 47G can be performed via a vehicle sensor system or other sensor system, a vehicle computing entity 150. The atomical feature mapping data generator function can be performed via any computing entity of FIGS. 2A-2D and/or any processing module, which can be associated with a corresponding vehicle, or any other system, for example, that includes a touch sensor device and/or a plurality of DSCs operable to detect objects touching and/or hovering over electrodes and/or a corresponding plane, which can be utilized to determine a mapping of anatomical features of a human accordingly.

As illustrated in FIG. 83A, anatomical feature mapping data 730 can be generated based on processing capacitance image data 233 and/or object contouring data 733.

For example, the capacitance image data 233 can be generated as discussed in conjunction with some or all of FIGS. 42A-47G, where one or more hands, one or more fingers, or other part of a human body touching and/or hover over electrodes, such as button electrodes of a button circuit 112, electrodes of a sensor circuit 116, electrodes of DSCs 117, electrodes of a set of parallel electrodes, of a keypad 4415, of a touchpad 4615, of a touchscreen displaying graphical image data, of a touch sensor device, or any other circuit having electrodes sensing corresponding changes in mutual-capacitance and/or self-capacitance indicative of a touching and/or hovering object at a corresponding location projected upon a corresponding two-dimensional space, where one or more corresponding hover distances are optionally detected.

As another example, alternatively or in addition to the generation of capacitance image data 233, object contouring data 733 can be generated as discussed in conjunction with some or all of FIGS. 66-82, where one or more one or more hands, one or more fingers, a head, one or more arms, a chest, shoulders, facial features, or other appendages and/or contoured anatomical features of a human induce corresponding changes in mutual and/or self-capacitance that result in measured distances utilized contour a detected object, and/or occupy different coordinate locations of a detected object, where contouring data for the object is optionally not generated and where anatomical features are still detectable via a shape and/or size of occupied locations induced by different anatomical features. This can be utilized to detect that a given detected object is a human, rather than some other object in the three-dimensional space. This can be further utilized to detect gestures being performed by the human in three-dimensional space, the location and/or orientation of the human, locations and/or orientation of various different body parts of the human, a height and/or size of the human, to track movement of the human and/or to track movement of one or more of their body parts in the three-dimensional space, or to otherwise map various anatomical features of the human detected to occupy the three-dimensional space. The object contouring data can correspond to two-dimensional object projections upon one or more planes, or three-dimensional object images, such as contoured object images, as discussed in conjunction with some or all features and/or functionality of FIGS. 65-81, for example, to detect anatomical features in contoured two-dimensional projections or a three-dimensional contoured image corresponding to a human, such as a humans head, arms, chest, shoulders, hands, fingers, facial features, or other contoured anatomical features of a human.

The anatomical feature mapping data 730 can indicate a physical mapping of anatomical features hovering over one or more two-dimensional planes, based on detecting the corresponding features in capacitance image data 233 and/or object contouring data 733. For example, this mapping is a projection of the detected anatomical features upon the x-y plane, and/or a mapping of these features in the three-dimensional space that includes the x-y plane, relative to the position of the x-y plane. As another example, this mapping is a projection of the detected anatomical features upon multiple different planes, such as the x-y plane, the x-z plane, and/or the y-z plane of FIGS. 50A-82.

The mapping can indicate a position and/or orientation of various features, and can further identify the detected features as particular anatomical features, such as particular fingers and/or parts of the hand. For example, the anatomical feature mapping data 730 identifies and further indicates position and/or orientation of some or all anatomical features of a given finger, of a given hand, of multiple hands, and/or of objects held by one or more hands. The anatomical feature mapping data generator function 710 can generate the anatomical feature mapping data 730 based on processing the capacitance image data 233 and/or object contour data 733 at a particular time and/or in capacitance image data and/or object contour data generated across a temporal period, for example, to track the detected features as they change position and/or orientation.

The anatomical feature mapping data generator function 710 can generate the anatomical feature mapping data 730 based on utilizing anatomical feature parameter data 725. Given capacitance image data can be processed based on and/or compared to the anatomical feature parameter data 725 to enable identification and/or characterization of particular anatomical features detected to be hovering over the touch screen.

The anatomical feature parameter data 725 can be predetermined, stored in memory accessible by the processing module, received from a server system via a network connection, configured by a user, generated automatically, for example, based on learned characteristics of the hand of a user interacting with of the two-dimensional area and/or within a three-dimensional space over time, and/or can otherwise be determined.

The anatomical feature parameter data 725 can indicate a known structure and/or known characteristics of one or more anatomical features for detection. In particular, the anatomical feature parameter data 725 can indicate and/or be based on known and/or expected size and/or shape of the hand, various movements and/or positions of the hand, shape and/or length of individual fingers, relative position of different fingers on the right hand and on the left hand, various movements and/or positions of the fingers relative to the hand, and/or other parameters characterizing hands and/or fingers, and/or characteristics of capacitance image data for various configurations of the hand when hovering over a corresponding touch screen. In some embodiments, non-anatomical features can similarly be detected and mapped in a similar fashion.

Performing the anatomical feature mapping data generator function 710 can be based on performing at least one image processing function. For example, performing the image processing function can include utilizing a computer vision model trained via a training set of capacitance image data, for example, imposed via various configurations of the hand hovering over a corresponding touch screen display. For example, labeling data for capacitance image data in the training set of capacitance image data can indicate the presence of hover regions, the location and/or bounds of hover regions, a particular finger and/or other particular anatomical feature to which the hover region corresponds, a corresponding orientation and/or configuration of the hand inducing the capacitance image data, and/or other labeling data. The computer vision model can be trained via at least one machine learning function and/or technique and/or at least one artificial intelligence function and/or technique. Performing the anatomical feature mapping data generator function can include utilizing at least one machine learning function and/or technique and/or at least one artificial intelligence function and/or technique.

Figure 83B:
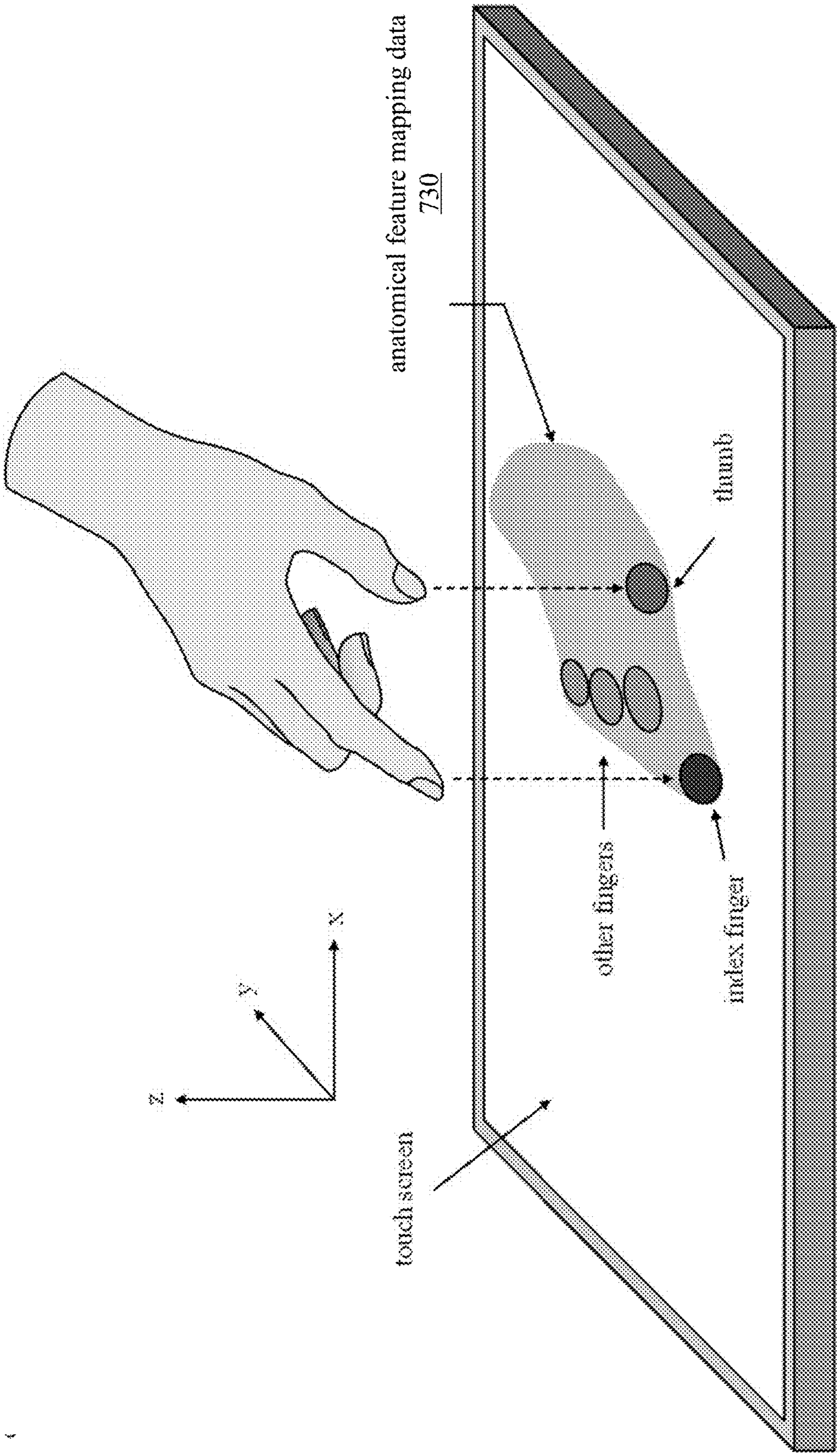
FIG. 83B is an illustration of example anatomical feature mapping data in accordance with various embodiments.

FIG. 83B illustrates a pictorial representation of how detected patterns of hover regions in capacitance image data can be utilized to: detect a one or more hands hovering over the touch screen; map the location of individual fingers of the hand and/or the palm of the hand; and/or determine an orientation of the hand and/or of the individual fingers with respect to the x-y plane and/or with respect to the z-axis. In particular, anatomical feature mapping data 730 can be generated to detect particular anatomical features, such as the thumb, index finger, middle finger, ring finger, pinky finger, and/or palm of the right hand and/or the left hand based on utilizing known anatomical structure of the hand to identify corresponding patterns corresponding to different parts of the hand, and/or other anatomical features hovering over the touch screen such as a face, in the capacitance image data. The anatomical feature mapping data 730 can indicate the position of these various anatomical features, such as different fingers of the hand, in two dimensional and/or three dimensional space relative to the touch screen based on corresponding capacitance variance data induced by the hand, and based on leveraging known structure of the hand to detect the features of the hand in the capacitance image data.

For example, FIG. 62C depicts the anatomical feature mapping data 730 as a corresponding heat map in the x-y plane, indicated by corresponding capacitance image data, for example, as discussed in conjunction with FIGS. 56-59B. The anatomical feature mapping data 730 can indicate areas on the x-y plane where different particular fingers and/or the palm are hovering over the touch screen. In the example illustrated in FIG. 62C, darker shading indicates higher detected positive capacitance variation data based on fingers that are closer to the touch screen can have hover regions in the capacitance image data with higher positive capacitance variation data, while fingers that are further from the touch screen can have hover regions in the capacitance image data with lower positive capacitance variation data.

In some cases, multiple fingers can induce hover regions 605 based on having capacitance variation data comparing favorably to the touchless indication threshold. In some cases, only one finger is actually intended to render a touchless interaction, where the other fingers should be ignored. In some cases, the finger actually intended to render a touchless interaction may have lower average and/or lower maximum capacitance variance data measured in its hover region 605 than other fingers, for example, due to being further away from the screen during some or all of its interaction with the graphical image data displayed by the touch screen.

The mapping and tracking of one or more hands can be accomplished based on the capacitance image data and/or based on known properties of the hand. This can be utilized to identify some or all fingers and/or parts of the hand as artifacts and/or as false touchless indications, where one or more fingers utilized to perform touchless interactions are detected and tracked in the capacitance image data over time.

In some cases, this can include determining a particular one or more fingers responsible for interaction with the graphical image data displayed by the touch screen, such as the thumb and/or the index finger. This can be based on expected fingers utilized for particular gestures, for interaction with particular types of graphical image data, and/or other touchless indications. Alternatively or in addition, this can be based on user configuration and/or learned user behavior over time to determine preferred fingers and/or a preferred hand of the user for performing various gestures, for interacting with various types of graphical image data, and/or performing any other touchless indications. The determined one or more fingers expected and/or known to be responsible for performing touchless interactions can be identified in the capacitance image data, for example, relative to other portions of the hand that are detected, and/or can be tracked over time accordingly.

In some embodiments, the hover regions 605 for these determined fingers can be processed as true touchless indications, for example, when applicable based on otherwise meeting the touchless indication threshold parameter data 615 at various times. In some embodiments, the hover regions 605 for other fingers can be processed as false touchless indications at all times and/or can have stricter corresponding touchless indication threshold parameter data 615 required to determine their interactions are true touchless indications, for example, due to being less commonly used and/or less likely to be used. In some embodiments, other hover regions 605 detected but determined not to be a part of the mapped hand can be processed as false touchless indications at all times based on being identified as artifacts. Alternatively, in some embodiments, a pen or other tool held by the user can similarly be mapped and tracked to render corresponding true touchless indications.

In this example, the thumb and index finger are detected as being closest to the screen based on being differentiated from the other fingers based on their relative ordering upon the hand, and based on their corresponding hover regions having highest capacitance variance data. In some embodiments, only the index finger's hover region in this example is determined to correspond to a true touchless indication based on being detected to be closest to the screen, based on the index finger being determined to be most likely to perform touchless indications, and/or based on the hover region count parameters indicating use of only one finger. In other embodiments, both the index finger's hover region and the thumb's hover region in this example are determined to correspond to true touchless indications based on both being detected to be closest to the touch screen, based on the index finger being determined to be most likely to perform touchless indications, based on the hover region count parameters indicating use of two fingers, and/or based on the user performing a gesture involving the use of two fingers, such as the index finger and the thumb.

Figure 83C:
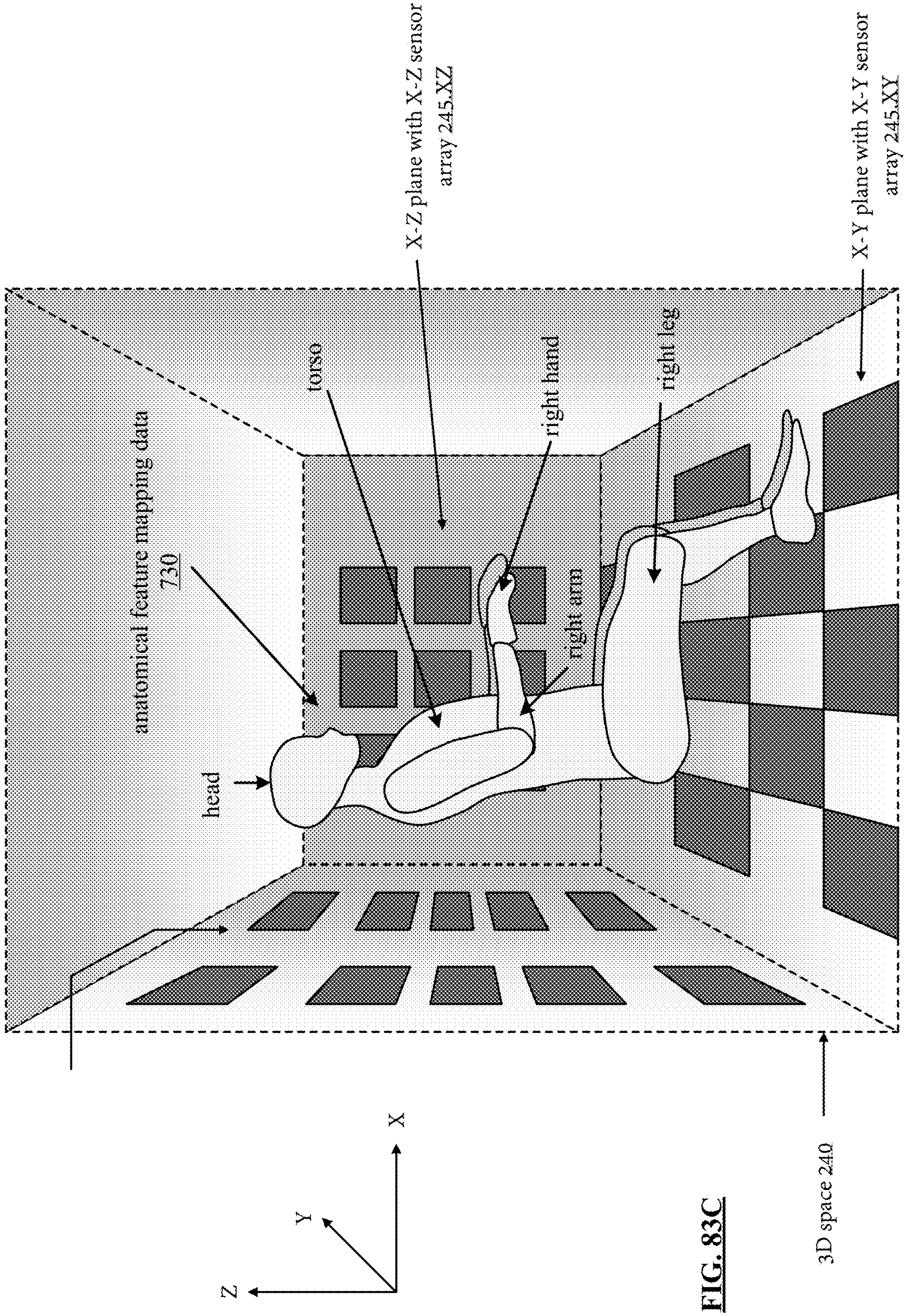
FIG. 83C is an illustration of another example anatomical feature mapping data in accordance with various embodiments.

FIG. 83C illustrates another example of anatomical feature mapping data generated based on contouring a detected human in a three-dimensional space. The contoured features can be identified accordingly based on known anatomy of the human body in a same or similar fashion as discussed in conjunction with FIG. 62C, where heat maps for multiple two-dimensional projections upon different planes are generated as contour data projected upon the multiple planes detecting distances from the object, and/or where the object is three-dimensionally depicted based on a plurality of distances from a plurality surfaces of the human based on human anatomy.

Figure 83D:
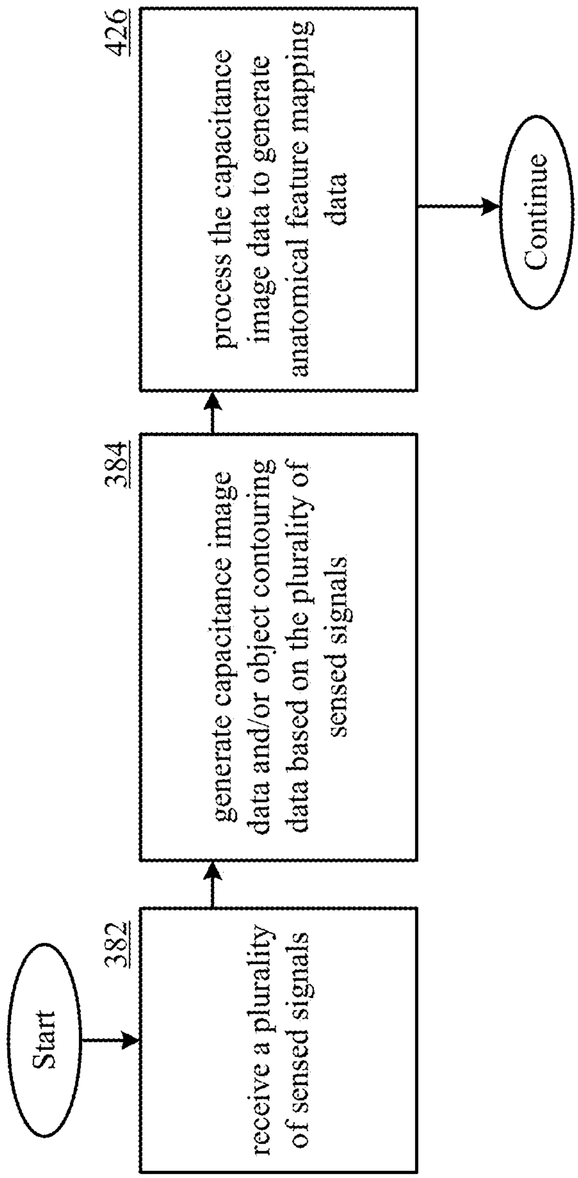
FIG. 83D is a logic diagram of an example of a method for execution in accordance with various embodiments.

FIG. 83D illustrates a flow diagram of an embodiment of a method in accordance with the present disclosure. Some or all of the method of FIG. 83D can be performed via a vehicle sensor system or other sensor system, a vehicle computing entity 150, at least one button circuit 112, and/or at least one DSC 117, for example, based on some or all functionality discussed in conjunction with FIGS. 83A-83C. Some or all of the method of 83D can be performed via any computing entity of FIGS. 2A-2D and/or any processing module, which can be associated with a corresponding vehicle, or any other system, for example, that includes a touch sensor device and/or a plurality of DSCs operable to detect hovering human features and/or detect humans occupying three-dimensional space.

Step 382 includes receiving a plurality of sensed signals. For example, performing step 382 includes receiving sensed indications of self and/or mutual-capacitance. The plurality of sensed signals can indicate variations in capacitance associated with the plurality of cross points formed by a plurality of electrodes as discussed previously herein, and/or other variations in capacitance of any electrodes on one or more planes as discussed previously herein.

Step 384 includes generating capacitance image data and/or object contouring data based on the plurality of sensed signals. For example, performing step 384 includes performing step 312 and/or otherwise includes generating capacitance image data including positive capacitance variation data and negative capacitance variation data. The capacitance image data can be associated with the plurality of cross points, for example, such as a two-dimensional heat map of capacitance variation data corresponding to the plurality of cross-points across a corresponding two-dimensional area. The capacitance image data can include capacitance variation data corresponding to variations of the capacitance image data from a nominal value. As another example, performing step 384 includes performing some or all features and/or functionality to detect distances from the surface of an object and determine points upon its surface in three-dimensional space and/or its projection upon multiple two-dimensional planes to render a three-dimensional contoured image accordingly as discussed in conjunction with some or all of FIGS. 50A-82.

Step 426 includes processing the capacitance image data and/or the object contouring data to generate anatomical feature mapping data. Performing step 426 can include detecting at least one hover region 605 in given capacitance image data at a given time and/or across a temporal period and/or processing the hover region 605 as a potential touchless indication. The anatomical feature mapping data can be detected based on identifying portions of the capacitance image data, such as a hover region 605, having capacitance variation data comparing favorably to a touchless indication threshold such as touchless indication threshold 342. The anatomical feature mapping data can optionally be detected based on identifying hover regions 605 with shapes and/or relative positions comparing favorably to known anatomy of a hand and/or a finger. The anatomical feature mapping data can be determined based on features of a contoured object of the contoured object data.

In some embodiments, the method further includes detecting a touchless interaction based on the anatomical feature mapping. This can include determining one or more particular fingers in the anatomical feature mapping as fingers responsible for touchless indications, and/or determining one or more particular fingers in the anatomical feature mapping as artifacts to be ignored. In some embodiments, the method further includes determining a portion of three-dimensional space is occupied by a human based on the anatomical feature mapping data indicating human anatomical features, and/or determining the size, height, orientation, and/or movements of the human and/or one or more of their individual body parts.

FIGS. 84A-84E present embodiments where one or more types of gestures, such as gesture commands by a user are detected. For example, one or more types of touch-based and/or touchless gestures can be performed via hover and/or touch to one or more buttons, a single button electrode, a parallel set of button electrodes, a grid of button electrodes, a keypad, a touchpad, a touchscreen displaying graphical image data, and/or other electrodes having corresponding button circuits 112 and/or DCSs 117. As another example, one or more types of gestures can be performed in three-dimensional space where two or more planes of electrodes detect the location and movement of corresponding objects and/or body parts.

Such gestures performed within a temporal period, for example, via one or more fingers one or more hands, head motions, or other detectable motions of the body, can correspond to various types of interface commands utilized to facilitate various types of user interaction with functionality, such as commands to perform vehicle functionality and/or configure vehicle settings as described herein alternatively or in addition to simply activating a corresponding button.

Figure 84A:
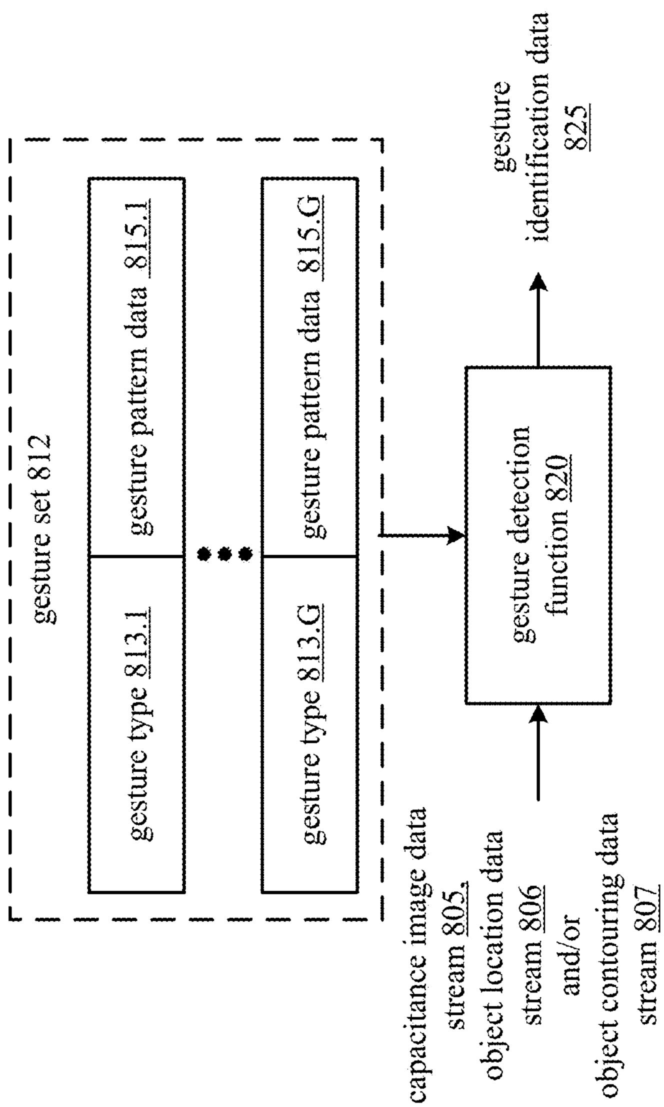
FIG. 84A is a schematic block diagram of a gesture detection function in accordance with various embodiments.

FIG. 84A is a schematic block diagram of an embodiment of a gesture identification function 820 in accordance with the present disclosure. For example, the gesture identification function 820 can be implemented to detect gestures. This can include detecting the presence or absence of various conditions corresponding to one or more types of gestures, and/or to characterize the conditions that were identified, such as distinguishing the type of gesture, its corresponding location, and/or corresponding command data corresponding to performance of the particular gesture. The touchless indication determination function 630 can otherwise be performed by a processing module, vehicle computing entity, or other computing entity in processing streams of capacitance image data generated over time and/or streams of object location data and/or object contouring data generated over time.

The gesture identification function 820 can be performed by processing a capacitance image data stream 805, for example, that includes a stream of sequentially generated capacitance image data 1300, to enable detection and/or tracking of movements of touching and/or hovering fingers and/or objects based on corresponding changes in capacitance image data of the capacitance image data stream 805 across a temporal period. This can include: detecting and tracking one or more hover regions 605 in the stream of sequentially generated capacitance image data within a temporal period; detecting and tracking anatomical feature mapping data 730 in the stream of sequentially generated capacitance image data within a temporal period; and/or otherwise detecting changes in the capacitance image data denoting performance of particular gestures by one or more fingers, hands, or objects hovering over the two-dimensional area.

The gesture identification function 820 can be alternatively or additionally performed by processing an object location stream 806 and/or an object contouring stream 807, for example, that includes a stream of sequentially generated object location data denoting coordinates in three dimensional space occupied by an object as discussed in conjunction with FIGS. 58-64 and/or object contouring data 733, to enable detection and/or tracking of movements of fingers, hands, arms, legs, the head, other body parts, and/or objects based on corresponding changes in object location data of the object location stream 806 and/or of object contouring data of the object contouring stream 807 across a temporal period. This can include: detecting and tracking one or coordinates occupied by a detected object in three-dimensional space, and whether the occupied coordinates changes within the temporal period; detecting and tracking contouring of an object based on measuring distances from a located object's surface occupying three-dimensional space for detection of larger movements, and whether the orientation of the object and/or position of the object within a same location changes within the temporal period for detection of more granular movements; detecting and tracking anatomical feature mapping data 730 generated from the stream of object location data and/or stream of object contouring data within a temporal period; and/or otherwise detecting changes in the object location data and/or object contouring data denoting performance of particular gestures by one or more fingers, hands, arms, legs, the head, other body parts or objects within the three-dimensional space.

Performing the gesture identification function 820 can include generating corresponding gesture identification data 825 identifying a particular gesture type 813, for example, from a set of different possible gestures of a gesture set 812. A given gesture type 813 can be identified based on the capacitance image data stream 805, the object location stream 806 and/or the object contouring stream 807 comparing favorably to corresponding gesture pattern data 815 of the given gesture type 813. Different gesture types 813 can have different gesture pattern data 815, indicating respective differences in these different gestures. The gesture pattern data 815 for each gesture type 813 of the gesture set 812 can be predetermined, stored in memory accessible by a processing module, received from a server system via a network connection, configured by a user, generated automatically, for example, based on learned characteristics of touchless indications by the user over time, and/or can otherwise be determined.

Given gesture pattern data 815 can indicate: a number of fingers, hands, other body parts, and/or other objects involved in the corresponding type of gesture; threshold minimum and/or maximum time frames for performing the gesture as a whole and/or for performing discrete segments of the gesture; shape, speed, direction, and/or ordering of movement to perform the gesture with respect to a first plane, such as the x-y plane and/or any arbitrary plane within a three-dimensional space to enable a user to perform the gesture facing any direction; speed, direction, and/or ordering of movement to perform the gesture with respect to the z-axis; shape, speed, direction, and/or ordering of movement to perform the gesture with respect to one or more other planes, such as the y-z plane or the x-z plane, or other arbitrary planes enabling a user to perform the gesture facing any direction; and/or other parameters defining the gesture and/or indicating threshold requirements for detection of the gesture.

The gesture pattern data 815 can optionally indicate relative position and/or orientation of anatomical features and/or other identifiable objects in performing the gesture, or movement patterns relating to the relative position and/or orientation of anatomical feature and/or other identifiable objects in performing the gesture, such as various finger and/or hand manipulation, changes in orientation or position of various body parts, and/or other features. For example, performing the gesture identification function 820 to identify a given gesture can include generating and/or processing anatomical feature mapping data 730 to identify static and/or dynamic properties of various features, such as various fingers, in the anatomical feature mapping data 730 that match and/or compare favorably to gesture pattern data 815 of a given type of gesture.

In some embodiments, the gesture pattern data 815 can indicate a corresponding gesture pattern performed based on changes in configuration of one or more joints of a particular finger via anatomical properties of individual fingers, such as patterns relating to bending at or straightening at one or more joints of the given finger, and/or moving towards and/or away from other fingers. For example, one given gesture pattern can involve one or more fingers statically maintaining and/or moving in or out of a straightened position, while another one given gesture pattern can involve one or more fingers statically maintaining and/or moving in or out of a bent position, such as the forming of a fist. Other joints can similarly be involved, where other gestures include nodding or shaking of the head, rotating an arm, kicking a leg, etc.

In some embodiments, the gesture pattern data 815 can indicate a corresponding gesture pattern performed based on changes in position and/or orientation of the hand via anatomical properties of the hand, such as patterns relating to bending and/or rotating about the wrist, motion and/or rotation induced by bending and/or rotating about the elbow and/or shoulder. For example, one given gesture pattern can involve the hand rotating about the wrist, where the top of the hand moves towards and/or away from the top of the forearm, while another given gesture pattern can involve the hand rotating about another direction such as orthogonal direction, based on the top of the hand and the forearm rotating together from the elbow.

In some cases, the gesture pattern data 815 can involve at least one touch to a button, surface, or electrode, for example, by one or more particular fingers, but the corresponding type of gesture can be distinguished from other types of gestures based on static and/or dynamic characteristics of other fingers and/or parts of the hand that are hovering over the touch screen. For example, one given gesture pattern can involve touching the screen via a given finger, such as the index finger, while the remainder of the fingers are bent to form a fist, another given gesture pattern can also involve touching the screen via the given finger, while the remainder of the fingers are extended, and/or another given gesture pattern can also involve touching the screen via the index finger, while the thumb dynamically moves up and down while hovering. In such cases, while touch-based detection of the given finger touching may be involved in these gestures, distinguishing of a given gesture, and thus identification of a particular corresponding command, requires detection and characterizing of hovering features, such as the other fingers of the hand, for example, based on generating and processing anatomical feature mapping data 730.

The gesture identification data 825 can optionally indicate a gesture starting position, gesture ending position, and/or tracked movement from the starting position to the ending position. The starting position and/or the ending position can be an x-y position, such as a hover region 605 and/or touchless indication point 745. The starting position, the ending position, and/or respective movement can optionally have a z-component, based on respective hover distance and/or changes in hover distance when performing the gesture and/or if the gesture is detected in three-dimensional space via electrodes located upon multiple planes. If multiple fingers, hands and/or object are involved in performing the gesture, the gesture identification data 825 can further indicate gesture starting position, ending position, and/or tracked movement from the starting position to the ending position for each finger, hand, and/or object.

The starting position, ending position, and/or tracked movement can further identify particular interaction and/or command indicated by the gesture, for example, based on an interface element and/or properties of a selectable region at the starting position and/or ending position. As a particular example, a type of gesture can be identified as a selection gesture, and a touch point, hover region and/or touchless indication point identified for the selection gesture can indicate selection of a selectable region, such as a particular button, at the hover region, touch point, and/or touchless indication point.

The gesture detection function 820 can be operable to detect any other gestures discussed herein, such as: selection of an individual button electrode of a set of parallel button electrodes as discussed in conjunction with FIG. 42 swiping up and down and/or left or right across a set of parallel button electrodes as discussed in conjunction with FIG. 43A; selection of an individual button touch area 4410 of a keypad 4415 as discussed in conjunction with FIG. 44A; swiping and/or moving across multiple button touch area 4410 of keypad 4415 in a particular order as discussed in conjunction with FIG. 44C; and/or any other gestures, button interaction, or detectable movements described herein. These gestures of FIGS. 42, 43A, 44A, and/or 44C can be performed as touch-based gestures and/or via hovering over corresponding button electrodes and/or a corresponding surface as a touchless interaction.

Figure 84B:
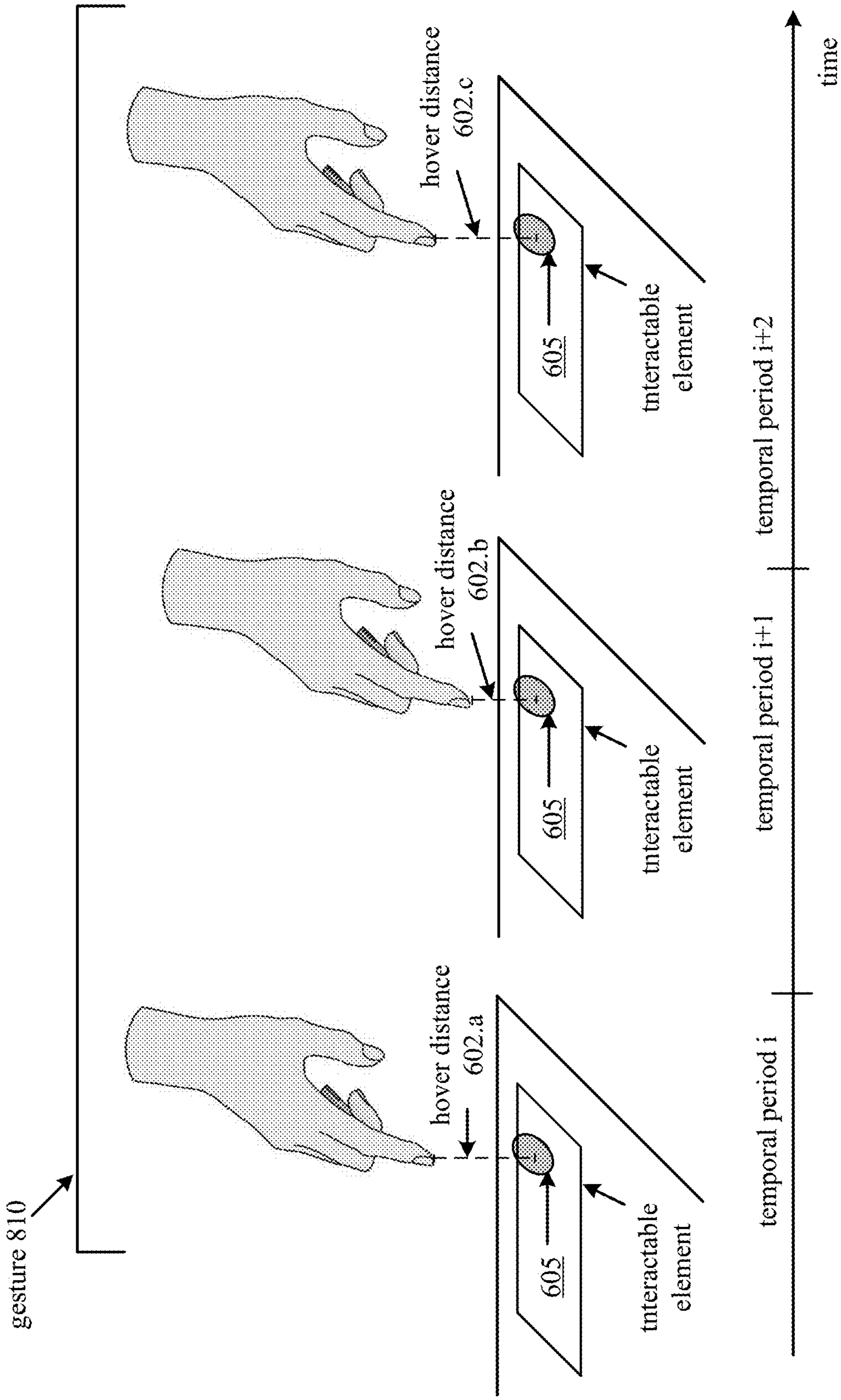
FIG. 84B is illustration of detection of an example gesture in accordance with various embodiments.

FIG. 84B illustrates performance and detection of an example gesture 810. The gesture 810 of FIG. 84B can correspond to an example gesture type 813 corresponding to a touchless selection gesture performed across three consecutive temporal periods i, i+1, i+2 of same or different lengths. The hover regions 605, absolute hover distances 602, and/or relative hover distances 602, can be in capacitance image data across these three consecutive temporal periods for comparison with gesture pattern data 815 to identify a type of gesture corresponding to the touchless selection gesture.

In this example, the touchless selection gesture can have corresponding gesture pattern data 815 denoting a pattern of a single finger, or other object: hovering at a first hover distance 602.*a* in a first temporal period i; transitioning, in a second temporal period i+1 following the first temporal period, from the first hover distance 602.*a* to a second hover distance 602.*b* that is smaller than the first hover distance 602.*a*, for example, by at least a threshold amount; and transitioning, in a third temporal period i+2 following the second temporal period, from the second hover distance 602.*b* to a third hover distance 602.*c* that is greater than second hover distance 602.*b*, for example, by at least a threshold amount, and/or that is similar to the first hover distance 602.*a*.

The gesture pattern data 815 for the touchless selection gesture can optionally indicate a threshold difference in hover distance between the first hover distance 602.*a* and the second hover distance 602.*b*, and/or between the second hover distance 602.*b* and the third hover distance 602.*c*. The gesture pattern data 815 for the touchless selection gesture can indicate a threshold difference in hover distance between the first hover distance 602.*a* and the second hover distance 602.*b*, and/or between the second hover distance 602.*b* and the third hover distance 602.*c*. The gesture pattern data 815 can indicate threshold minimum and/or maximum distances for the first hover distance 602.*a*, the second hover distance 602.*b*, and/or the third hover distance 602.*c*. The hover distance for a potential and/or true touchless indication can be computed and/or estimated as a function of positive capacitance variation data of a corresponding hover region and/or touchless indication point as discussed previously.

The gesture pattern data 815 for the touchless selection gesture can optionally indicate a threshold minimum and/or maximum time for the transition between the first hover distance and the second hover distance, and/or for the transition between the second hover distance and the third hover distance. This can include a threshold minimum and/or maximum time span for temporal period i, i+1, and/or i+2.

The gesture pattern data 815 for the touchless selection gesture can indicate maximum and/or minimum threshold rates of change of hover distance, for example, as the speed of the finger in transitioning between different hover distances.

The gesture pattern data 815 for the touchless selection gesture can indicate maximum threshold movement of the corresponding hover region in the x-y plane, for example, where detection of the touchless selection gesture requires that the hover region position remain relatively stable, for example, by remain within a threshold area size, and/or not moving in position by more than a threshold amount during performance of the gesture.

The touchless indication point of the touchless selection gesture can be utilized to determine a corresponding "click" point for the corresponding gesture. This can be based on an average touchless indication point across the duration of the gesture, an initial touchless indication point of the hover region in temporal period i, touchless indication point of the hover region in temporal period i+1, for example, with maximum positive capacitance variance data and/or minimal hover distance within the touchless selection gesture, a final touchless indication point of the hover region in temporal period i+2, or based on other processing of hover regions across the some or all of the tracked touchless selection gesture.

While not depicted, other types of gestures can correspond to other types of patterns involving movement relative to the z-axis similar to the example of FIG. 66B where hover distance changes with respect to a corresponding gesture pattern. While not depicted, other types of gestures can correspond to other types of patterns involving movement relative to the x-y plane, where the position of hover region changes with respect to a corresponding gesture pattern. While not depicted, other types of gestures can correspond to other types of patterns involving movement relative to the x-y plane and/or the z-axis for multiple hover regions, corresponding to fingers of the same or different hand, where the position of hover region changes with respect to a corresponding gesture pattern. Some types of gestures can correspond to other types of patterns involving particular movement of one or both hands, for example, detected based on anatomical feature mapping data tracked over a temporal period indicating the user's hand moved in accordance with the respective pattern.

Figure 84C:
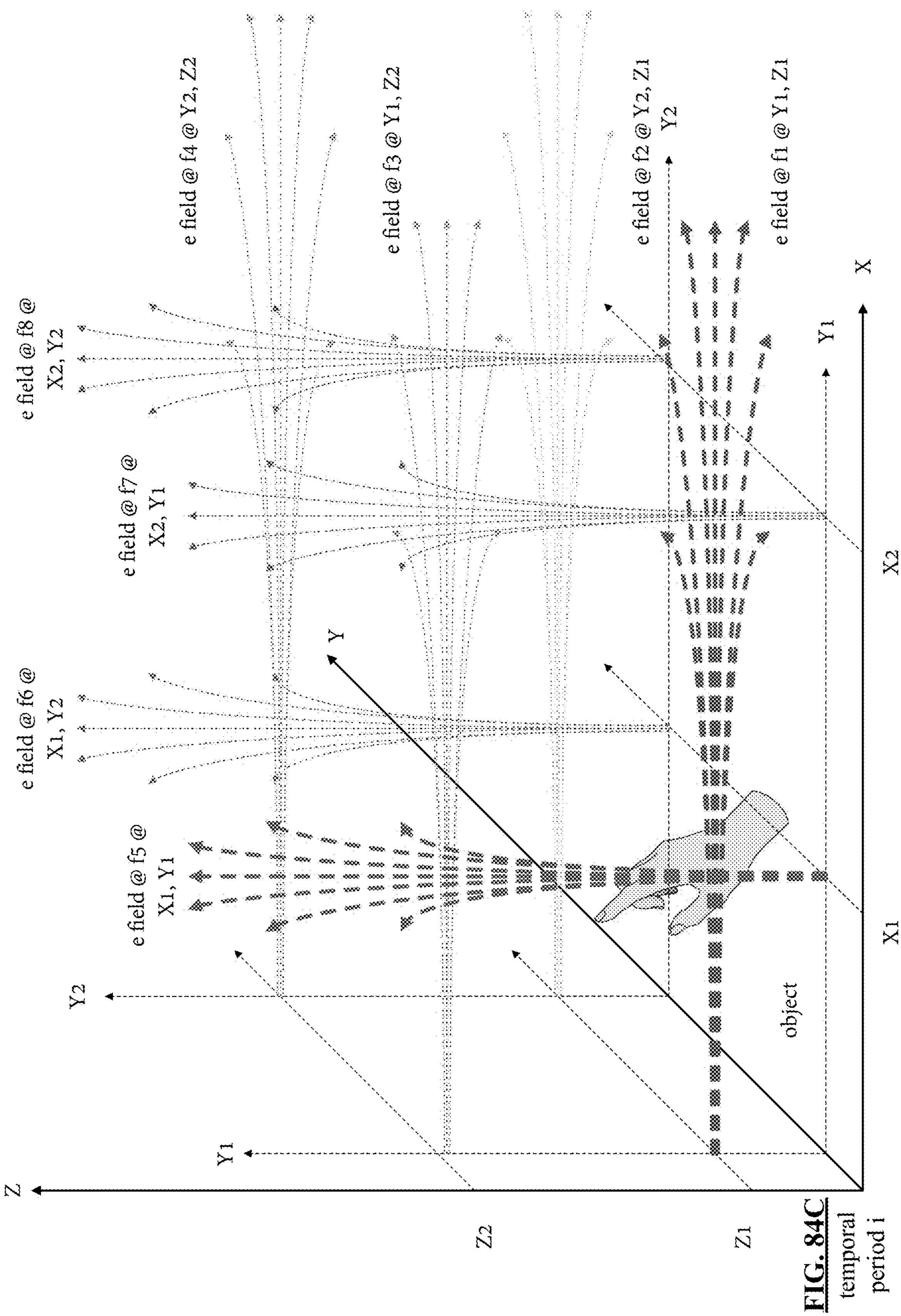

FIGS. 84C and 84D illustrates performance and detection of another example gesture 810. The gesture 810 of FIG. 84B can correspond to an example gesture type 813 corresponding to a gesture performed across two consecutive temporal periods i and i+1 of same or different lengths.

As illustrated in FIG. 84C, in temporal period i, a hand or other object is detected to be occupying the space at coordinate (x1, y1, z1), for example, via some or all functionality discussed in conjunction with FIGS. 58-64. In some embodiments, the configuration of the fingers of the hand, such as its illustrated configuration where the hand is pointing the index finger, may also be integral in distinguishing the gesture, and this configuration of the hand can optionally be determined based on further generating contouring data for the hand via some or all functionality discussed in conjunction with FIGS. 66-81D. and/or via a higher density of electrodes performing the occupancy detection of FIGS. 58-64.

As illustrated in FIG. 84D from temporal period i to temporal period i+1, the hand moved from occupying the space at coordinate (x1, y1, z1) to occupying the space at coordinate (x1, y1, z2), for example, based on a human moving their hand upwards in the z direction accordingly. The hand or other object can be detected to be occupying the space at coordinate (x1, y1, z2) in temporal period i+1 accordingly for example, via some or all functionality discussed in conjunction with FIGS. 58-64. In embodiments where configuration of the fingers of the hand are integral in distinguishing the gesture, this configuration of the hand maintaining the pointing of the index finger configuration can optionally be determined based on again generating contouring data for the hand via some or all functionality discussed in conjunction with FIGS. 66-81D. and/or via a higher density of electrodes performing the occupancy detection of FIGS. 58-64.

Figure 84E:
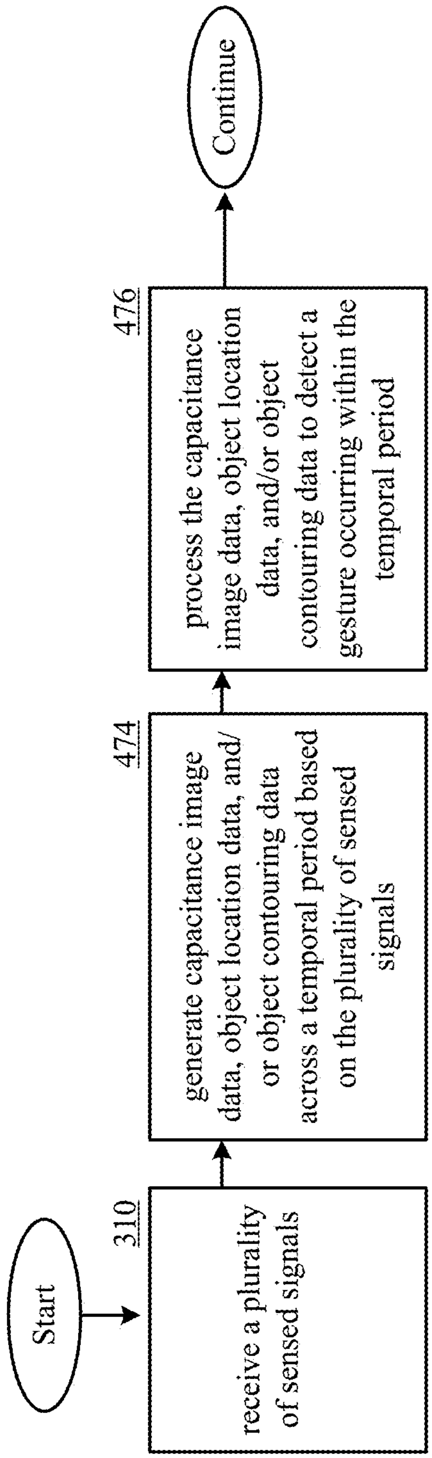
FIG. 84E is a logic diagram of an example of a method for execution in accordance with various embodiments.

FIG. 84E illustrates a flow diagram of an embodiment of a method in accordance with the present disclosure. Some or all of the method of FIG. 84E can be performed via a vehicle sensor system or other sensor system, a vehicle computing entity 150, at least one button circuit 112, and/or at least one DSC 117, for example, based on some or all functionality discussed in conjunction with FIGS. 84A-84D. Some or all of the method of 83E can be performed via any computing entity of FIGS. 2A-2D and/or any processing module, which can be associated with a corresponding vehicle, or any other system, for example, that includes a touch sensor device and/or a plurality of DSCs operable to detect movement of hovering objects and/or detect movement of objects occupying three-dimensional space.

Step 382 includes receiving a plurality of sensed signals. For example, performing step 382 includes receiving sensed indications of self and/or mutual-capacitance. The plurality of sensed signals can indicate variations in capacitance associated with the plurality of cross points formed a plurality of electrodes as discussed previously herein, and/or other variations in capacitance of any electrodes on one or more planes as discussed previously herein.

Step 474 includes generating capacitance image data across a temporal period based on the plurality of sensed signals. For example, performing step 474 includes performing step 384, step 312, and/or otherwise includes generating capacitance image data including positive capacitance variation data and negative capacitance variation data. The capacitance image data can be generated for multiple points in time across a temporal period, where a stream of sequential capacitance image data is generated within the temporal period. The capacitance image data can be associated with the plurality of cross points, for example, such as a two-dimensional heat map of capacitance variation data corresponding to the plurality of cross-points across a corresponding two-dimensional area. The capacitance image data can include capacitance variation data corresponding to variations of the capacitance image data from a nominal value.

As another example, performing step 474 includes performing some or all features and/or functionality to coordinates occupied by objects in three-dimensional space as discussed in conjunction with some or all of FIGS. 58-64. As another example, performing step 384 includes performing some or all features and/or functionality to detect distances from the surface of an object and determine points upon its surface in three-dimensional space and/or its projection upon multiple two-dimensional planes to render a three-dimensional contoured image accordingly as discussed in conjunction with some or all of FIGS. 66-81D.

Step 476 includes processing the capacitance image data to identify a gesture occurring within the temporal period. The gesture can be detected based on identifying portions of the capacitance image data generated within the time period comparing favorably to gesture pattern data 815. The gesture can be identified as a given type of gesture of a set of different types of gestures, for example, based on the capacitance image data, object location data, and/or object contouring data generated within the time period comparing more favorably to the gesture pattern data 815 of the given type of gesture than the gesture pattern data of some or all other types of gestures. The identified gesture can optionally be processed as a command for interaction with graphical image data displayed by a display of a touch screen, for example, to induce a change in the display of the graphical image data, to induce performance of a vehicle functionality and/or to induce configuration of a vehicle setting via the gesture, and/or to otherwise process and/or execute some or all of the corresponding command.

Figure 85A:
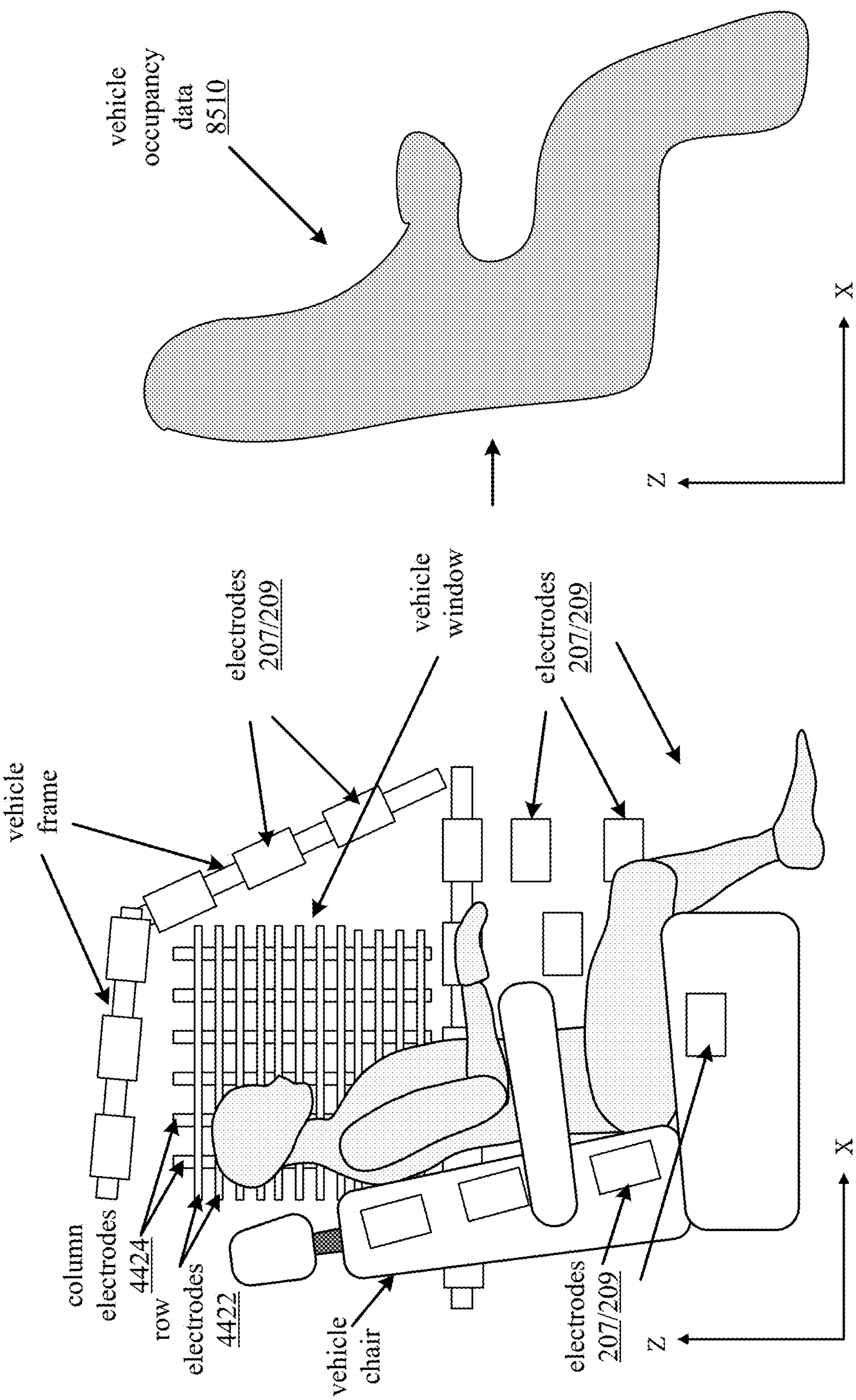
FIG. 85A illustrates an embodiment of a vehicle operable to generate vehicle occupancy data in accordance with various embodiments.

FIG. 85A illustrates an example embodiment of a side interior view of a vehicle that includes a plurality of electrodes and corresponding sensor circuits integrated in various locations of the vehicle, such as within a frame of the vehicle, on windows of the vehicle, within chairs of the vehicle, or within other physical components of the vehicle. For example, in addition to implementing electrodes within a vehicle to facilitate detection and/or confirmation of button interaction as discussed in conjunction with FIGS. 1-48B, an interior of a vehicle and/or some or all exterior proximal to the vehicle can be implemented as a three-dimensional space 240 of FIGS. 50A and 50B having a plurality of electrodes and corresponding sensor circuits 215 and/or DCSs 117.

In some embodiments, as depicted in the example of FIG. 85A, the vehicle can include vehicle frame having electrodes upon and/or integrated within frame, with corresponding sensor circuits. For example, these electrodes of the vehicle frame are implemented as electrodes 209 of the support columns 219 of FIGS. 51-57B having corresponding sensor circuits 215. The vehicle frame can include structure supporting the structure of the vehicle, such as its roof, side walls surrounding doors, structure of the doors themselves, structure surrounding front and/or back windshields, structure supporting or integrated within vehicle walls, ceiling, or floor, the dashboard of the vehicle, and/or other structural components of the vehicle.

In some embodiments, as depicted in the example of FIG. 85A, the vehicle can have windows having electrodes upon and/or integrated within the window. For example, these electrodes of one or more vehicle windows and/or windshields are implemented as row and column electrodes, for example, as discussed in conjunction with FIGS. 47A-47G operable to generate capacitance image data. Alternatively, other electrodes such as electrodes 207 and/or 209 are implemented within windows, where windows on different planes are operable to detect portions of the chair that are occupied as discussed in conjunction with FIGS. 58-64.

In some embodiments, as depicted in the example of FIG. 85A, the vehicle can have chairs having electrodes, such as electrodes 207 and/or 209, upon and/or within various portions of the chair. For example, the vehicle chair is implemented via an occupancy area ID circuit having an electrode transmitting an ID signal, with one or more sensor circuits detecting the ID signal integrated within other portions of the chair as discussed in conjunction with FIGS. 8A-8F to detect whether a person is occupying the chair. The chair can otherwise have electrodes 207 and/or 209 in various portions operable to detect portions of the chair that are occupied as discussed in conjunction with FIGS. 58-64.

Some or all of the vehicle can thus have electrodes 207 and/or 209 upon different planes having sensor circuits 215 that can detect signals with unique frequencies transmitted by other electrodes on planes through people sitting in the vehicle as discussed in conjunction with FIGS. 58-64; can have electrodes 207 and/or 209 upon different planes that can further detect changes in self and/or mutual-capacitance to contour detected people as discussed in conjunction with FIGS. 65-81D; can have electrodes 4422 and/or 4424 one or more planes facing within the vehicle or facing the exterior of the vehicle having DSCs 117 that can detect changes in self and/or mutual-capacitance to generate capacitance image data for the corresponding plane from within the vehicle and/or from outside the vehicle as discussed in conjunction with FIGS. 47A-47G; and/or that have other types of electrodes and/or corresponding circuits operable to transmit and/or detect changes in electrical characteristics upon the electrodes as discussed herein based on people inside the vehicle or proximal to the exterior of the vehicle. In some embodiments, the vehicle includes one or more vehicle chairs 132 to detect people occupying the vehicle chairs as discussed in conjunction with FIGS. 8A-8E.

At least one vehicle computing entity 150 of the vehicle can receive and process various sensed signal data as described herein, for example, based on implementing the processing module 250 of FIGS. 49-81A, to detect people within a vehicle or proximal to the exterior of the vehicle. For example, the vehicle computing entity 150 can generate vehicle occupancy data 8510 indicating an approximate image of people or objects inside the vehicle, which can be projected upon one or more planes, and/or corresponding to a three-dimensional region, based on functionality described herein. The vehicle computing entity 150 can generate vehicle occupancy data 8510 that indicates: whether or not each seat of the vehicle is detected to be occupied by a person or other object; shape, size, and/or location determined for detected people in the vehicle or proximal to the vehicle exterior; determined orientation of people, and/or their body parts, that are detected within the vehicle or proximal to the vehicle exterior; tracked movements of people in the vehicle or proximal to the vehicle exterior;

anatomical feature mapping data generated for detected people in the vehicle or proximal to the vehicle exterior; detected gestures performed by people in the vehicle or proximal to the vehicle exterior to perform corresponding vehicle functionality in response; detected button interactions performed by people in the vehicle or proximal to the vehicle exterior to perform corresponding vehicle functionality in response as discussed in conjunction with FIGS. 1-48B; and/or other determinations based on sensed signal data as described herein, which can be processed to determine vehicle status, occupancy, user commands, safety of users in the vehicle, and/or to perform any vehicle functionality described herein.

Figure 85B:
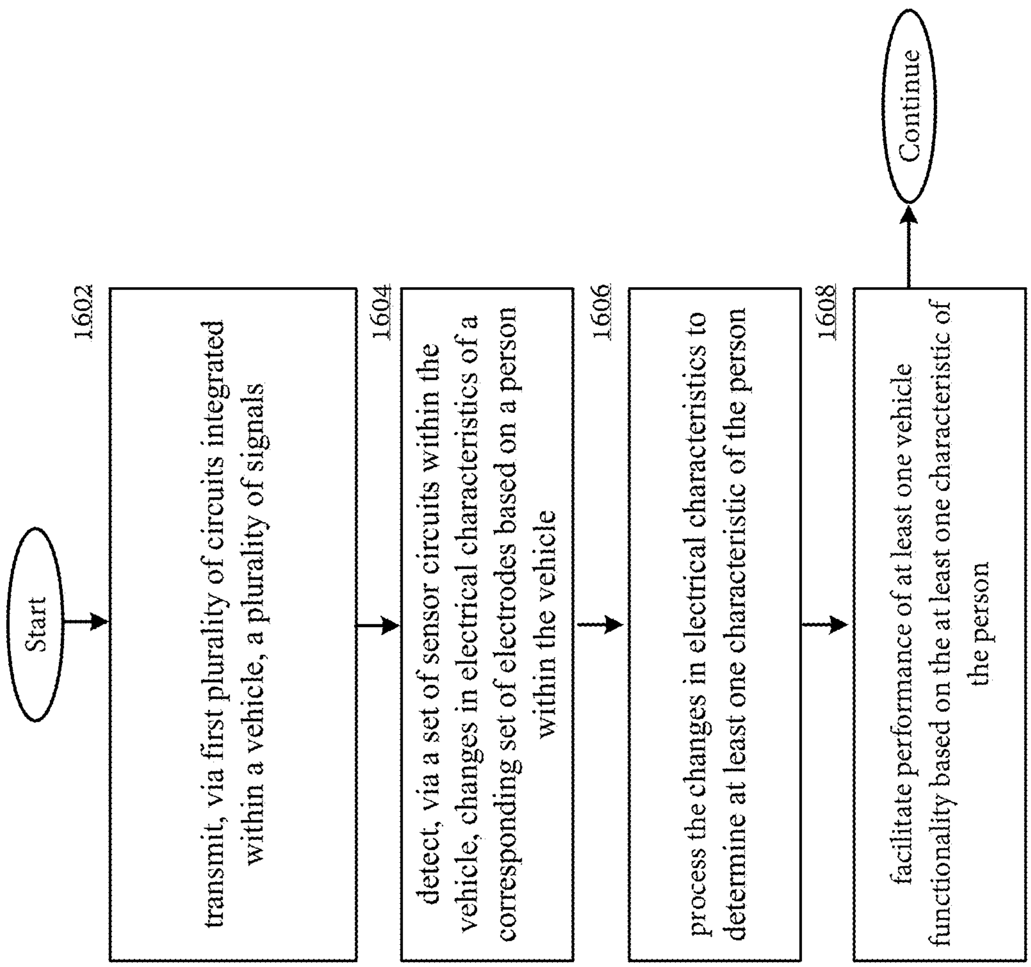
FIG. 85B is a logic diagram of an example of a method for execution in accordance with various embodiments.

FIG. 85B illustrates a method for execution. Some or all of the method of FIG. 85B can be performed via at least one vehicle computing entity 150, at least one processing module 250, at least one sensor circuit 215, at least at least one button circuit 112, at least at least one sensor circuit 116, at least at least one DSC 217, at least one ID circuit 114 and/or 118, at least one transmitter 214, at least one receiver 216, and/or via other circuits and/or processing resources described herein, for example, based on some or all functionality discussed in conjunction with one or more of FIGS. 1-85A. Some or all of the method of 85B can be performed via any computing entity of FIGS. 2A-2D and/or any processing module, which can be associated with a corresponding vehicle, or any other system, for example, that includes one or more electrodes and corresponding sensor circuits or other corresponding circuits described herein upon and/or integrated within various parts of the vehicle. Some or all of the method of 85B can be performed based on performing some or all steps of any other method described herein.

Step 1602 includes transmitting, via first plurality of circuits integrated within a vehicle, a plurality of signals. Different signals transmitted by some or all different circuits can have unique frequencies to identify the different corresponding electrodes. Different signals transmitted by some or all different circuits can optionally have common frequencies. Some or all of the plurality of circuits can be implemented as ID circuits 114 and/or 118, sensor circuits 215, transmitters 214 DSCs 117, and/or other circuits.

Step 1604 includes detecting, via a set of sensor circuits within the vehicle, changes in electrical characteristics of a corresponding set of electrodes based on a person within the vehicle. The set of sensor circuits can be a proper subset of the first plurality of circuits, for example, all implemented as sensor circuits 215. Alternatively, some or all of the set of sensor circuits can be different from the first plurality of circuits, for example, based on being located on different planes within the vehicle, and/or based on the first plurality of circuits being operable to transmit signals as transmitters 214 while the set of sensor circuits are operable to receive signals as receivers 216. Some or all of the set of sensor circuits can be implemented as sensor circuits 215, sensor circuits 116, DSCs 117, and/or RX circuits 119.

Step 1606 includes processing the changes in electrical characteristics to determine at least one characteristic of the person, for example, by generating vehicle occupancy data 8510 indicating the at least one characteristic of the person can be included in the vehicle occupancy data 8510. The at least one characteristic of the person can include: a location of the person; an occupancy area 102 occupied by the person; a set of coordinates in two-dimensional space corresponding to a projection of the person on a corresponding two dimensional plane; a corresponding heat map, such as capacitance image data, for the set of coordinates in two-dimensional space corresponding to a projection of the person to indicate distance of different portions of the person from the two-dimensional plane; a proper subset of coordinates in three-dimensional space determined to be occupied by the person based on known locations of the electrodes of the first plurality of sensor circuits and/or the set of sensor circuits; movement of the person in three-dimensional space based on tracking the location occupied by the person over time; a user ID of the person based on detecting a corresponding frequency in a user ID signal 126.U; anatomical feature mapping data 710 for the person. In some cases, step 1606 includes determining that no person is detected, where the characteristic of the person is optionally that the person is not detected, as discussed in conjunction with FIGS. 86A-86C.

Performing step 1606 can include generating capacitance image data 233 and/or a capacitance image data stream 805 for one or more two-dimensional areas having electrodes; generating object location data and/or an object location data stream 806 for one or more three-dimensional areas having electrodes on two or more planes; generating object contouring data 733 and/or an object location data stream 807 for a detected object in more three-dimensional areas having electrodes on three or more planes; and/or generating other data based on sensed signal data.

Step 1608 includes facilitate performance of at least one vehicle functionality based on the at least one characteristic of the person. This can include performing any vehicle functionality and/or configuration described herein.

Figure 85C:
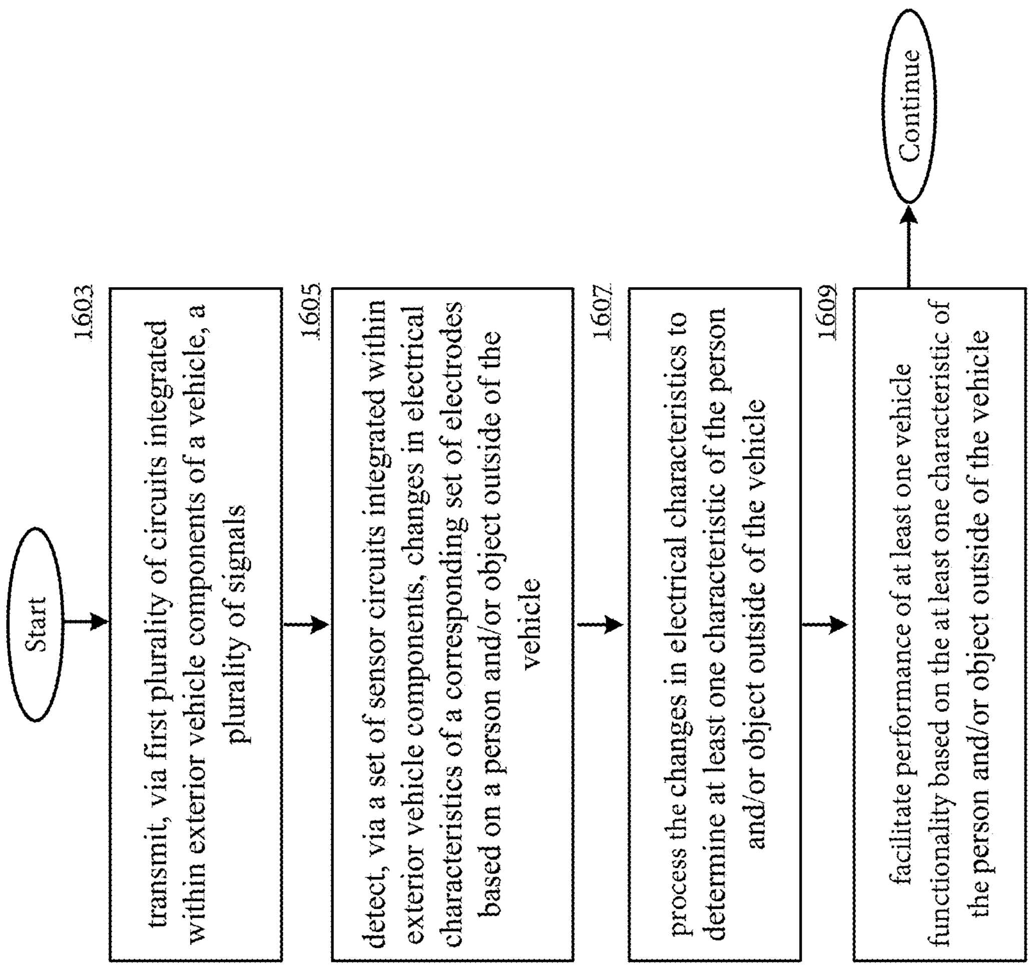
FIG. 85C is a logic diagram of an example of a method for execution in accordance with various embodiments.

FIG. 85C illustrates a method for execution. Some or all of the method of FIG. 85C can be performed via at least one vehicle computing entity 150, at least one processing module 250, at least one sensor circuit 215, at least at least one button circuit 112, at least at least one sensor circuit 116, at least at least one DSC 217, at least one ID circuit 114 and/or 118, at least one transmitter 214, at least one receiver 216, and/or via other circuits and/or processing resources described herein, for example, based on some or all functionality discussed in conjunction with one or more of FIGS. 1-85B. Some or all of the method of 85C can be performed via any computing entity of FIGS. 2A-2D and/or any processing module, which can be associated with a corresponding vehicle, or any other system, for example, that includes one or more electrodes and corresponding sensor circuits or other corresponding circuits described herein upon and/or integrated within various parts of the vehicle. Some or all of the method of 85C can be performed based on performing some or all steps of any other method described herein.

Step 1603 includes transmitting, via first plurality of circuits integrated within exterior vehicle components of a vehicle, a plurality of signals. Different signals transmitted by some or all different circuits can have unique frequencies to identify the different corresponding electrodes. Different signals transmitted by some or all different circuits can optionally have common frequencies. Some or all of the plurality of circuits can be implemented as ID circuits 114 and/or 118, sensor circuits 215, transmitters 214 DSCs 117, and/or other circuits. Performing step 1603 can be the same or similar to performing step 1602.

Step 1605 includes detecting, via a set of sensor circuits integrated within the same or different exterior vehicle components, changes in electrical characteristics of a corresponding set of electrodes based on a person and/or object outside of the vehicle. The set of sensor circuits can be a proper subset of the first plurality of circuits, for example, all implemented as sensor circuits 215. Alternatively, some or all of the set of sensor circuits can be different from the first plurality of circuits, for example, based on being located on different planes within the vehicle, and/or based on the first plurality of circuits being operable to transmit signals as transmitters 214 while the set of sensor circuits are operable to receive signals as receivers 216. Some or all of the set of sensor circuits can be implemented as sensor circuits 215, sensor circuits 116, DSCs 117, and/or RX circuits 119. Performing step 1605 can be the same or similar to performing step 1604.

The exterior vehicle components can include exterior vehicle surfaces; exterior vehicle body; vehicle frame, vehicle doors, the underside of a vehicle, the roof of a vehicle, doors of a vehicle, windows of a vehicle, a hood of the vehicle, outer door handles of a vehicle, side mirrors of a vehicle, or other exterior vehicle components. In some embodiments, multiple planes are implemented to include electrodes based on including electrodes on car sides and side mirrors, for example, to detect people in the space adjacent to the front car doors and the side mirrors as they attempt to enter and/or unlock the car.

Some or all of the plurality of circuits can be the same or different plurality of circuits integrated to transmit signals for receipt by electrodes within the vehicle to detect people or objects within the vehicle. Some or all of set of sensor circuits can be the same or different set of sensor circuits integrated to receive signals via electrodes within the vehicle to detect people or objects within the vehicle.

Step 1607 includes processing the changes in electrical characteristics to determine at least one characteristic of the person and/or object outside of the vehicle. The person can be standing in proximity to the vehicle, such as an owner of the vehicle, a passenger of the vehicle, a malicious intruder of the vehicle, a pedestrian or biker passing in the vicinity the vehicle while in motion, or another person The object can optionally be: another vehicle beside the vehicle, in front of the vehicle, or behind the vehicle; features of the road beneath the vehicle; trees, roofs, or maximum height indicator rods above the vehicle; a curb beside the vehicle; a fire hydrant beside the vehicle; or other object in proximity to the vehicle. Performing step 1607 can be the same as or similar to performing step 1606.

Step 1609 includes facilitating performance of at least one vehicle functionality based on the at least one characteristic of the person and/or object outside of the vehicle. This can include displaying or audibly conveying an alert, transmitting a notification via a network, unlocking the vehicle, locking the vehicle, activating a vehicle alarm, opening a door automatically, opening the trunk automatically, engaging windshield wipers, and/or performing other exterior vehicle functionality described herein.

For example, the car is unlocked and/or locked based on detecting a person in proximity to the car, for example, based on detecting their unique ID, for example, as they engage with a door button and/or keypad to enter a secure passcode and/or perform a secure gesture. As another example, the trunk is opened based on electrodes on the back bumper, under the car, and/or in proximity of the trunk detecting a person in proximity to the car, detect their unique frequency, and/or detect a gesture, such as a foot kick in proximity to the trunk. As another example, an alarm is activated based on detecting a person in proximity to the vehicle; processing anatomical feature mapping data and/or movements of the person to determine the person is trying to break into the vehicle; not detecting a key fob and/or user ID signal associated with an owner of the vehicle; not detecting a correct gesture or button interaction required to unlock the vehicle; or other determination. As another example, a blind spot detector and/or adaptive cruise control is enabled based on detection of other vehicles in proximity to the vehicle while in motion. As another example, parking assistance is provided based on detecting distances from curbs, driveways, other cars, fire hydrants, and/or people or other obstacles in the vicinity. As another example, objects above car, such as above the hood of the car via electrodes on the car hood, can be detected with the distance to the object measured as a hover distance and/or via self-capacitance or mutual-capacitance measurements to detect distance to a roof, tree branch, or maximum height indicator rods under which the car attempts to navigate, where an alert is conveyed when the height of this object is less than or within a threshold amount from the height of the vehicle, where attempting to drive under this obstacle would be unsafe. As another example, contour of road under car can be measured via such distance measurements while driving and/or while parked to generate alerts and/or data for road servicing based on detection of potholes. As another example, differences in detected e fields emitted under different road conditions can be detected via electrodes under the car to detect corresponding different road conditions, such as whether the road is icy. As another example, water droplets touching the front windshield and/or other vehicle exterior surfaces are detected via exterior electrodes to determine that it is raining, where windshield wipers are activated in response.

Figure 85D:
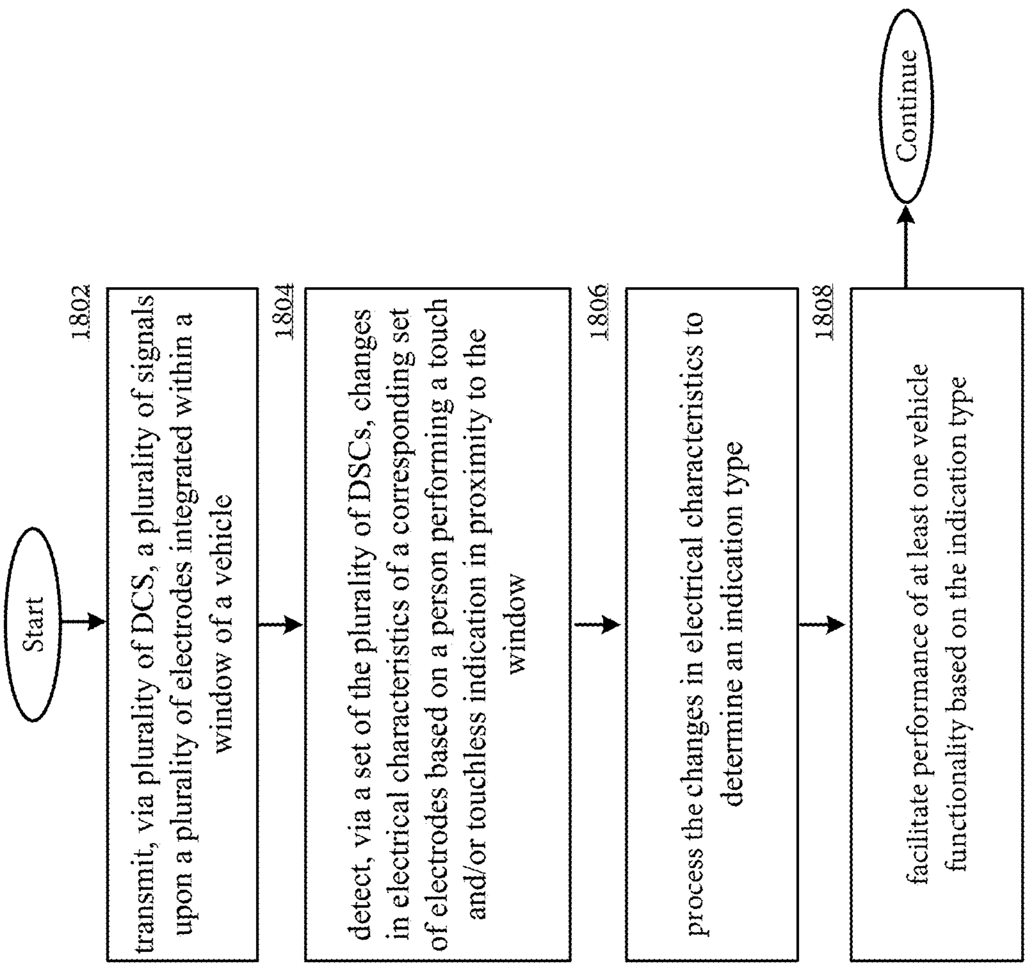
FIG. 85D is a logic diagram of an example of a method for execution in accordance with various embodiments.

FIG. 85D illustrates a method for execution. Some or all of the method of FIG. 85D can be performed via at least one vehicle computing entity 150, at least one processing module 250, at least one sensor circuit 215, at least at least one button circuit 112, at least at least one sensor circuit 116, at least at least one DSC 217, at least one ID circuit 114 and/or 118, at least one transmitter 214, at least one receiver 216, and/or via other circuits and/or processing resources described herein, for example, based on some or all functionality discussed in conjunction with one or more of FIGS. 1-85C. Some or all of the method of 85D can be performed via any computing entity of FIGS. 2A-2D and/or any processing module, which can be associated with a corresponding vehicle, or any other system, for example, that includes one or more electrodes and corresponding sensor circuits or other corresponding circuits described herein upon and/or integrated within one or more windows and/or windshields of the vehicle. Some or all of the method of 85D can be performed based on performing some or all steps of any other method described herein.

Step 1802 includes transmitting, via a plurality of DSCs such as DSCs 117 or other circuits, a plurality of signals upon a plurality of electrodes integrated within a window and/or windshield of a vehicle. For example, the plurality of electrodes include row and/or column electrodes integrated within the window, for example, where the window is integrated via some or all features and/or functionality of touch sensor devices of FIGS. 47A-47G, of touchpads 4615 of FIGS. 46A-46C, and/or of keypads 4415 of FIGS. 44A-44F. Some or all of the plurality of electrodes can be implemented as button electrodes of a button circuit 112.

In various embodiments, a portion of the window that includes the plurality of electrodes can be transparent, translucent, and/or can enable a person to see object on the other side of the window through the window. Some or all other portions of the window can be made of glass, plexiglass, laminated safety glass, tempered glass, plastic, and/or one or more transparent and/or translucent materials.

Step 1804 includes detecting, via a set of the plurality of DSCs integrated within the window, changes in electrical characteristics of a corresponding set of electrodes based on a person performing a touch and/or touchless indication in proximity to the window. For example, the changes in electrical characteristics are indicated in sensed signal data and/or are based on changes in impedance, mutual-capacitance, and/or self-capacitance induced by the person, such as a hand, arm, and/or one or more fingers of the person touching and/or hovering next to the window. The person can be in proximity to the window from inside the vehicle, for example, while the vehicle is moving and/or while the person is sitting in a vehicle chair of an occupancy area of the vehicle. The person can be in proximity to the window from outside the vehicle, for example, while the vehicle is parked and/or the person is standing next to a door containing the window.

Step 1806 includes processing the changes in electrical characteristics to determine an indication type. The indication type can correspond to a touch-based or touchless interaction with the surface of the window, such as: a touch; a tap; a wave of the hand; a gesture performed while touching the surface of window via part of the hand such as one or more fingers; a gesture performed while hovering next to the surface of window via part of the hand such as one or more fingers, for example, at a detectable hover distance from the window; a gesture performed by a head of the person next to the surface of window, such as a head nod or a head shake, or other indication type. For example, processing the changes in electrical characteristics includes generating capacitance image data 233, anatomical feature mapping data 730, and/or gesture identification data 825, where the where the indication type is determined based on the capacitance image data 233, anatomical feature mapping data 730, and/or gesture identification data 825. This can be based on identifying a subset of the plurality of electrodes that a part of a person, such as a person's hand or finger, is touching and/or in close proximity to. This can be based on identifying a subset of cross points of row electrodes and column electrodes of the plurality of electrodes that a part of a person, such as a person's hand or finger, is touching and/or in close proximity to. Step 1806 can be performed via a vehicle processing module 150, for example, based on receiving sensed signal data from the set of DSCs indicating the changes in electrical characteristics.

Step 1808 includes facilitating performance of at least one vehicle functionality based on the indication type. The at least one vehicle functionality can include any vehicle functionality and/or configuration of a vehicle setting described herein. The at least one vehicle functionality can be performed based on determining the at least one vehicle functionality is mapped to the indication type, for example, in an option tier of a hierarchical option tree 1505 and/or in finger-based command mapping data for the window, which can be the same as or similar to the finger-based command mapping data of FIG. 9810.

Figure 86A:
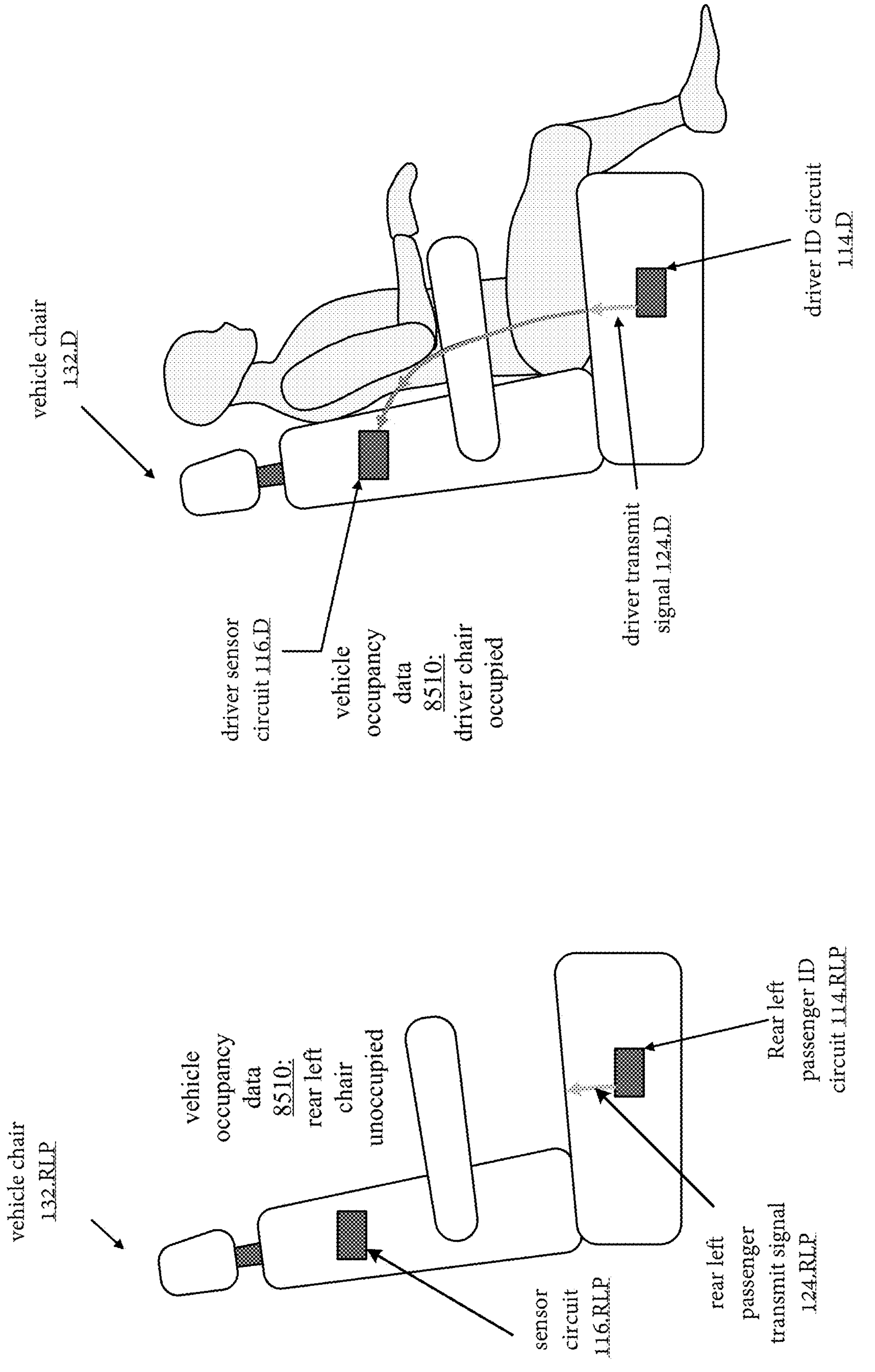
FIG. 86A is an illustration of generating vehicle occupancy data in a vehicle in accordance with various embodiments.
Figure 86B:
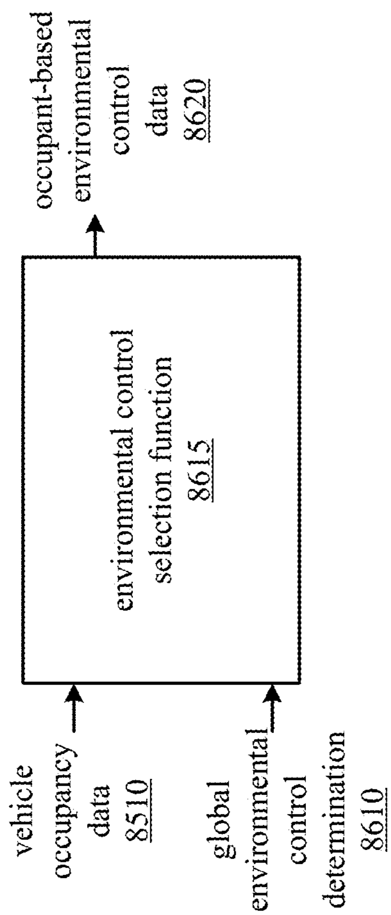
FIG. 86B is a schematic block diagram of an environmental control selection function in accordance with various embodiments.

FIGS. 86A-86B illustrate an embodiment of a vehicle operable to detect which chairs or other occupancy areas 102 of a plurality of chairs or other occupancy areas 102 in the vehicle are occupied. As illustrated in FIG. 86A, the driver's seat is occupied and the rear passenger seat is not occupied. Occupancy data 8510 can be generated based on various sensor circuits in the vehicle indicating that the driver's seat is occupied and the rear passenger seat is not occupied. In the example, of FIG. 86A, this occupancy data 8510 is generated via implementing a plurality of chairs in the vehicle as vehicle chairs 132 of FIG. 8A. Alternatively or in addition, any other means of generating occupancy data 8510 via sensor circuits and/or ID circuits in any other locations within the vehicle are utilized to determine which occupancy areas of the vehicle are occupied by people and which aren't, utilizing some or all features and/or functionality of FIGS. 85A-85B, where detected characteristic of FIG. 85B is optionally whether the person is not detected.

In some cases, when people are detected in particular occupancy areas, various vehicle functionality is automatically enabled within these occupancy areas. Alternatively or in addition, when people are not detected in particular occupancy areas, various vehicle functionality is automatically disabled within these occupancy areas. For example, facilitating the performance of at least one vehicle functionality based on the at least one characteristic of the person in step 1608 includes enabling or disabling functionality in different occupancy areas based on whether people are present.

In some embodiments, these functionalities correspond to environmental controls, such as air conditioning, heating, speakers playing music, or other output of devices located across some or all locations within the car. The regions within the car that this environmental functionality is enabled, such as turned on, can be based on whether occupants are detected to be present in these areas, based on the occupancy data 8510 indicating which occupancy areas are occupied by people and which are not.

This can include performance of an environmental control selection function 8615 via a vehicle computing entity 150 and/or other processing system, where a global environmental control determination 8610 is processed in conjunction with the occupancy data 8510 to generate occupant-based environmental control data 8620.

The global environmental control determination 8610 can be based on a button indication or other determination to activate a particular environmental control in some or all of the car, such as rolling down windows, turning on AC, turning on seat heaters, turning on seat cooling devices, turning on other heating devices, turning on speakers, turning on entertainment systems, turning on heads up displays, and/or activating other systems. The occupancy data 8510 can indicate a first subset of a plurality of different occupancy areas in the vehicle that are detected to be occupied, and a second subset of a plurality of different occupancy areas in the vehicle that are detected to be unoccupied. The first and second subset can be mutually exclusive and collectively exhaustive with respect to the plurality of different occupancy areas. In some cases, the first or second subset is null at a given time. In some cases, both the first and second subset are non-null at a given time.

The occupant-based environmental control data 8620 can indicate control data specifying which devices in which areas be turned on and/or enabled for the type of environmental control of the global environmental control determination 8610 due to the corresponding portion of the car being occupied, and which devices in which areas be turned off and/or disabled due to the corresponding portion of the car being unoccupied. For example, the occupant-based environmental control data 8620 indicates devices for the given type of environmental control in the first subset of the plurality of occupancy areas be activated, and indicates devices for the given type of environmental control in the second subset of the plurality of occupancy areas not be activated.

For example, when a driver selects to turn on AC via a button selection and/or the vehicle computing system automatically turns on AC based on another determination, the AC units in only occupancy areas that are occupied are turned on accordingly. As another example, when a driver selects to turn on music via a button selection and/or the vehicle computing system automatically turns on music based on another determination, the speakers in only occupancy areas that are occupied play the music. As another example, when vehicle computing system automatically turns on a movie or other entertainment content via an entertainment system via display devices on seat backs of rear seats in the vehicle, the seat backs only display the entertainment content in only occupancy areas that are occupied. This can be favorable over necessitating that different users turn on their own devices via their own button interactions. For example, the global environmental control determination 8610 is based on a single button interaction, other command, or a predetermined setting, to activate the corresponding environmental control for all occupied seats. This can also be more energy efficient than automatically turning on devices in all locations regardless of whether they are occupied.

In some cases, the occupancy data can enable other functionality, which can be based on a vehicle status such as whether or not the vehicle is on and/or in motion. For example, the occupancy data indicates a driver seat is not occupied and/or the vehicle condition indicates the car is off. Other occupants can be detected in the vehicle, such as dogs or children in the backseat. The AC and/or heat automatically turned on and/or windows can be rolled down in response, based on the exterior temperature. An alert can optionally be sent to the driver, such as a text message or call to their mobile device or an alert signal to their key fob, indicating that an occupant is detected to be left unattended in the vehicle. This alert can optionally be triggered based upon a predetermined amount of time elapsing.

Figure 86C:
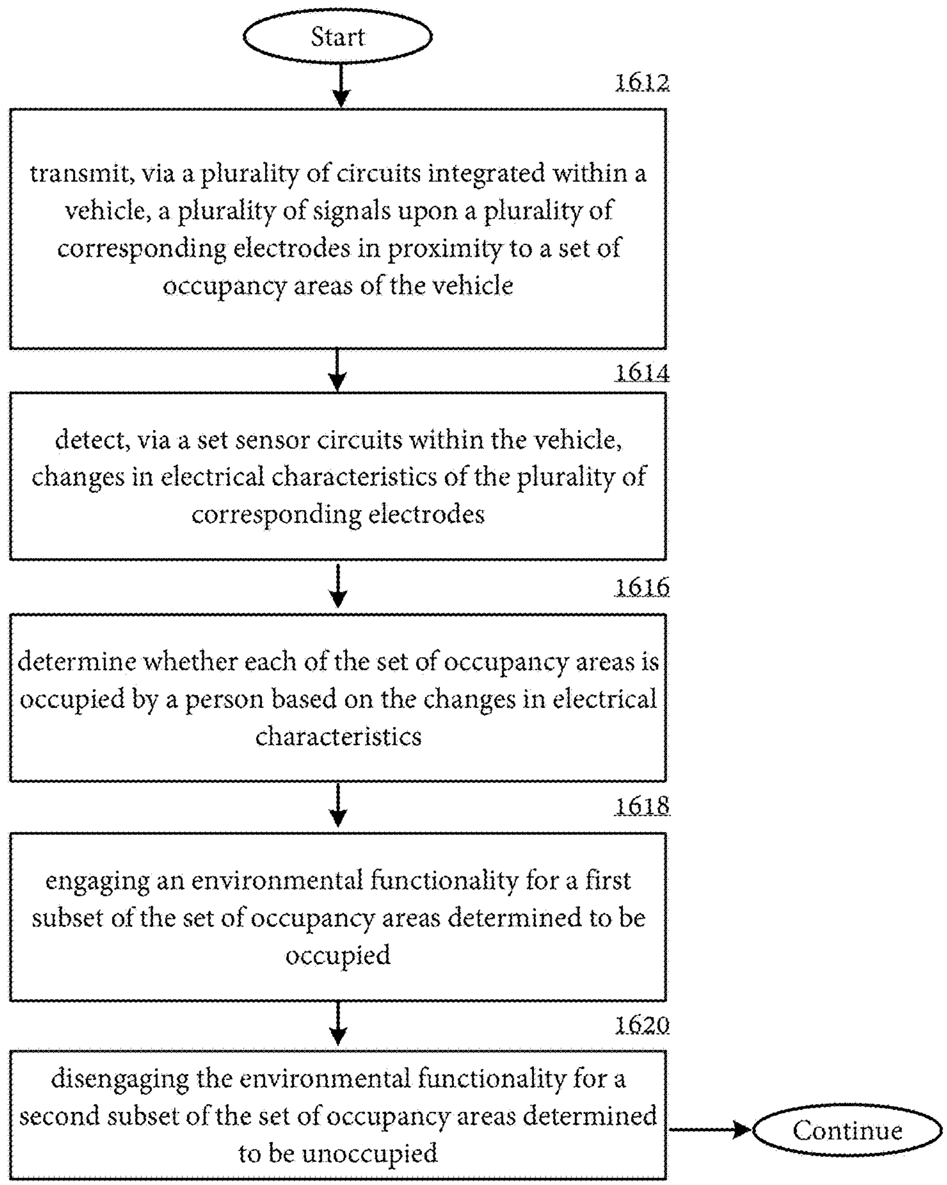
FIG. 86C is a logic diagram of an example of a method for execution in accordance with various embodiments.

FIG. 86C illustrates a method for execution. Some or all of the method of FIG. 86C can be performed via at least one vehicle computing entity 150, at least one processing module 250, at least one sensor circuit 215, at least at least one button circuit 112, at least at least one sensor circuit 116, at least at least one DSC 217, at least one ID circuit 114 and/or 118, at least one transmitter 214, at least one receiver 216, at least one vehicle chair 132, and/or via other circuits and/or processing resources described herein, for example, based on some or all functionality discussed in conjunction with one or more of FIGS. 86A-86B. Some or all of the method of 86C can be performed via any computing entity of FIGS. 2A-2D and/or any processing module, which can be associated with a corresponding vehicle, or any other system, for example, that includes one or more electrodes and corresponding sensor circuits or other corresponding circuits described herein upon and/or integrated within various parts of the vehicle. Some or all of the method of 86C can be performed based on performing some or all steps of FIG. 85B.

Step 1612 includes transmitting, via first plurality of circuits integrated within a vehicle, a plurality of signals upon a plurality of electrodes in proximity to a set of occupancy areas of the vehicle. Different signals transmitted by some or all different circuits can have unique frequencies to identify the different corresponding electrodes. Different signals transmitted by some or all different circuits can optionally have common frequencies. Some or all of the plurality of circuits can be implemented as ID circuits 114 and/or 118, sensor circuits 215, transmitters 214 DSCs 117, and/or other circuits. Performing step 1612 can include performing step 1602. The set of different occupancy areas can include a driver occupancy area, a front passenger occupancy area, a rear left passenger occupancy area, a rear right passenger occupancy area, and/or other occupancy areas. Different occupancy areas can each correspond to one of a plurality of different seats, such as a set of vehicle chairs 132 of the vehicle.

Step 1614 includes detecting, via a set of sensor circuits within the vehicle, changes in electrical characteristics of a corresponding set of electrodes. The set of sensor circuits can be a proper subset of the first plurality of circuits, for example, all implemented as sensor circuits 215. Alternatively, some or all of the set of sensor circuits can be different from the first plurality of circuits, for example, based on being located on different planes within the vehicle, and/or based on the first plurality of circuits being operable to transmit signals as transmitters 214 while the set of sensor circuits are operable to receive signals as receivers 216. Some or all of the set of sensor circuits can be implemented as sensor circuits 215, sensor circuits 116, DSCs 117, and/or RX circuits 119. Performing step 1614 can include performing step 1604.

Step 1616 includes determining whether each of the set of occupancy areas is occupied by a person based on the changes in electrical characteristics. Performing step 1616 can include performing step 1606, where the detected characteristic is whether a person is present or not. Step 1616 can include generated occupancy data 8510 indicating a first subset of the set of occupancy areas that are occupied and/or a second subset of the set of occupancy areas that are unoccupied.

Step 1618 includes engaging an environmental functionality for a first subset of the set of occupancy areas determined to be occupied. Step 1618 is optionally not performed if the first subset is null. Step 1620 includes disengaging the environmental functionality for a second subset of the set of occupancy areas determined to be unoccupied. Step 1620 is optionally not performed in the second subset is null. Performing steps 1618 and 1620 can include performing step 1608, where the vehicle functionality is only performed in areas detected to be occupied in the occupancy data 8510. The environmental functionality can include air conditioning, heating, playing of music via speakers, playing of entertainment content via display devices, displaying data via a heads up display, rolling down a window, or any other vehicle functionality having corresponding devices in different occupancy areas that can be engaged in some areas and disengaged in others.

Figure 87A:
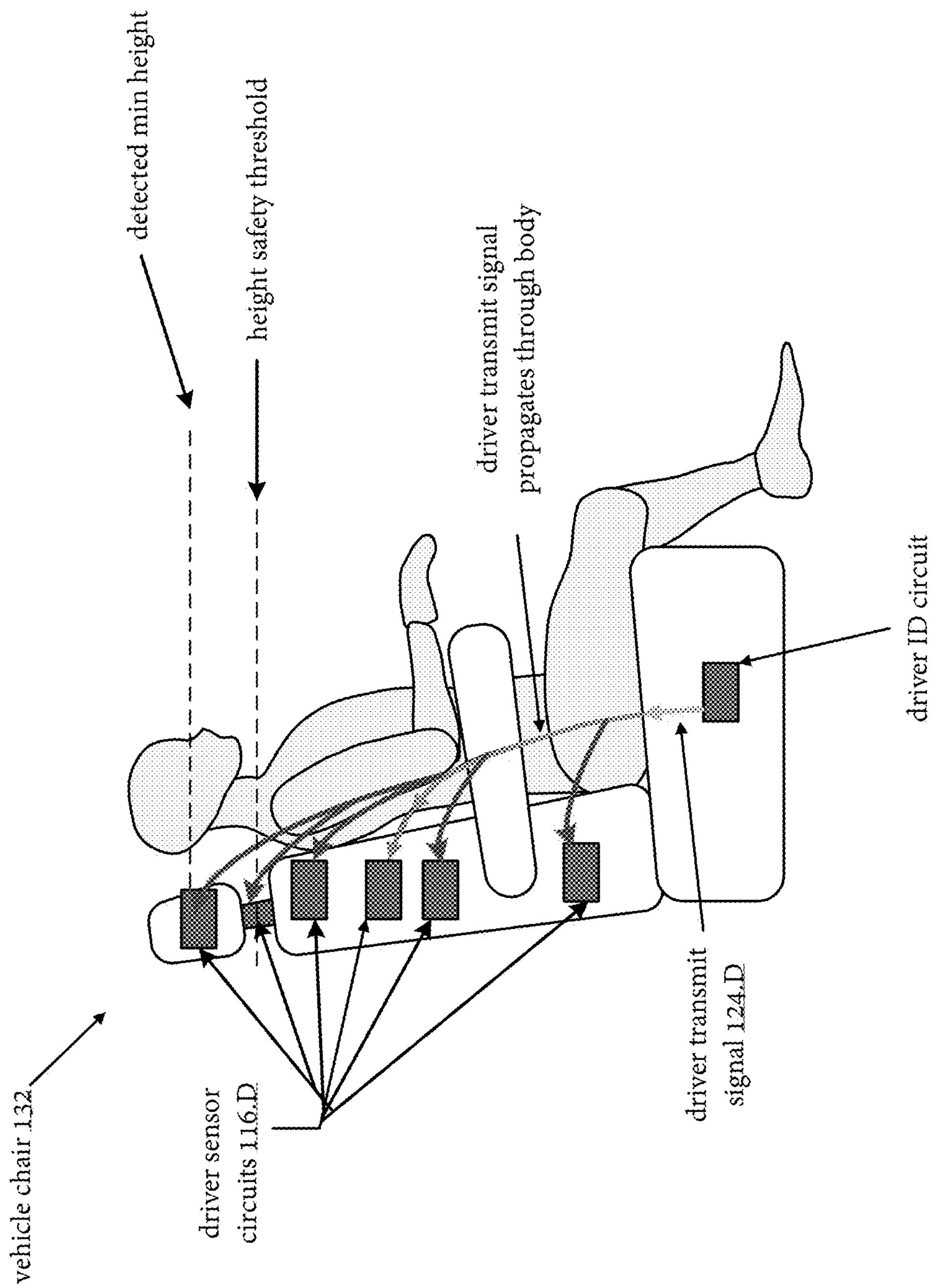
FIGS. 87A-87B are illustrations of detecting height data in accordance with various embodiments.
Figure 87B:
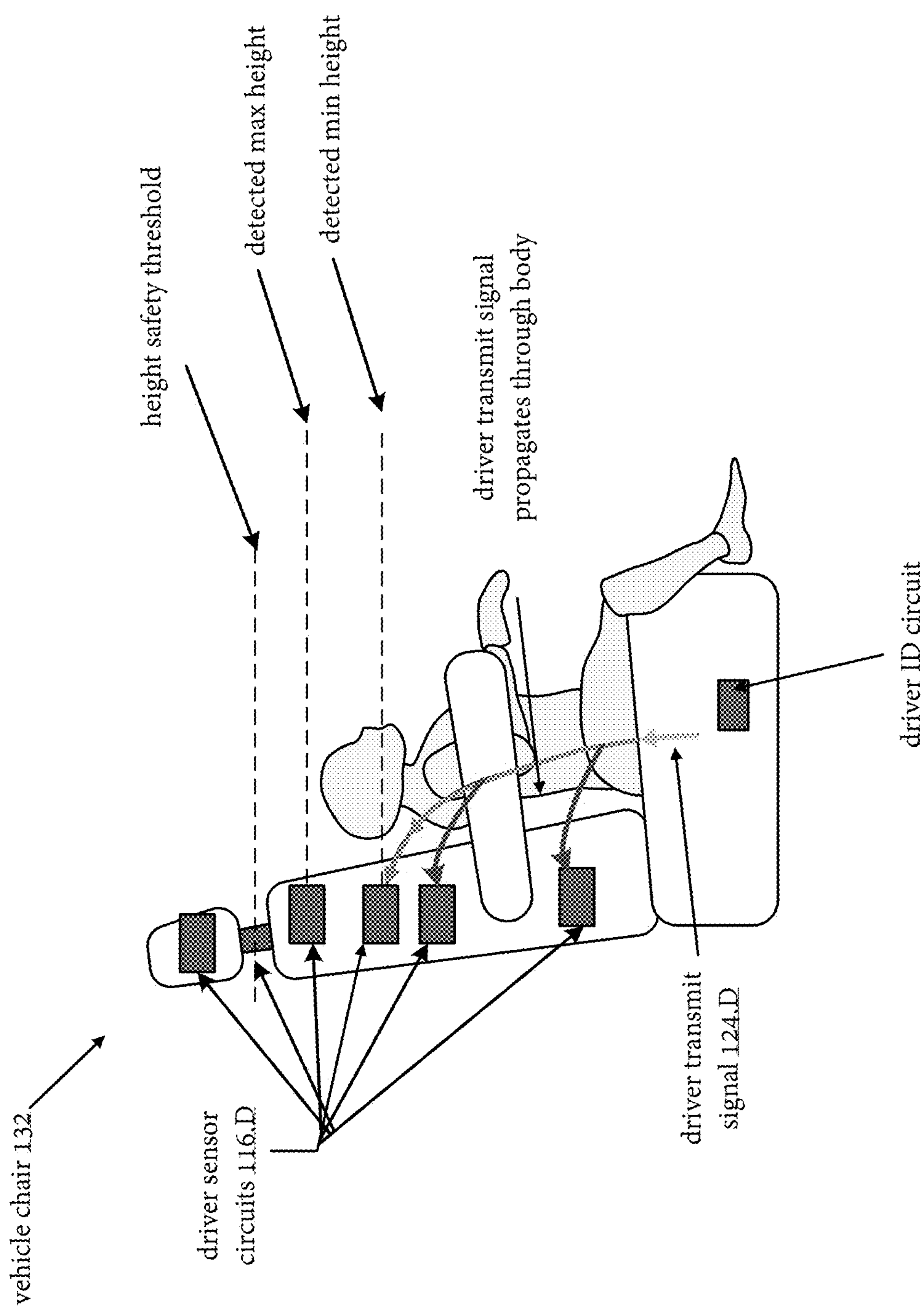

FIGS. 87A-87B illustrate embodiments of a vehicle operable to detect the height of a user. A plurality of electrodes of sensor circuits 116 and/or DSCs 117 with corresponding electrodes can be integrated into a chair at a plurality of corresponding heights as illustrated in FIGS. 87A and 87B. As illustrated in FIG. 87A, if a driver is tall enough such that their body reaches the top of the seat, sensor circuits 116 within all heights of the seat can detect the ID signal accordingly based on being propagated through the user's body to all of the sensor circuits due to the driver's height. As illustrated in FIG. 87B, if an occupant is shorter, for example, because they are a child, not all sensor circuits 116 within the vehicle seat detect the ID signal based on the driver's body not being in proximity to the higher electrodes in the seat, and thus these electrodes not detecting the signal. However, as the lower sensor circuits 116 do detect the ID signal, occupancy of the seat can still be detected.

Furthermore, based on the location of the highest electrode detecting the ID signal and/or based on the location of the lowest electrode detecting the ID signal, a height range, such as a minimum height and/or maximum height of the occupant, can be determined accordingly. The height range, such as the detected maximum height, can be compared to one or more safety threshold parameters, such as a minimum height threshold for passengers in the corresponding seat.

The detected height range can be determined by vehicle computing entity 150 and/or another processing module based on sensed signal data received from various sensor circuits or other circuits for electrodes on vehicle chairs and/or in other portions of the vehicle. For example, the portions of space in the z direction within a chair and/or in a direction orthogonal to the seat that is detected to include a part of the user's body is determined based on locations of a first subset of sensor circuits detecting an ID signal or other frequency denoting occupancy at a corresponding one or more heights and/or other coordinates, and based on locations of a second subset of sensor circuits detecting an ID signal or other frequency denoting non-occupancy at a corresponding one or more heights and/or other coordinates. For example, the detected height range can be indicated in and/or generated based on vehicle occupancy data 8510 of FIGS. 85A and 85B based on the vehicle being implemented via some or all corresponding features and/or functionality of FIG. 85A, where a detected characteristic of FIG. 85B is the height of a person.

When the height range compares unfavorably to height requirements, such as a detected height, a detected maximum height of a height range, and/or a detected minimum height of a height range, being less than to a required minimum height, a safety alert can be communicated, for example, via graphical display data displaying a notification via a display of the vehicle and/or via speakers of the vehicle audibly playing a notification. For example, the notification can alert a driver and/or passengers that it is unsafe for an occupant with the detected height range comparing unfavorably to height requirements, and/or can recommend a booster chair for passengers in an unsafe height range. When the height range compares favorably to height requirements, such as a detected height, a detected maximum height of a height range, and/or a detected minimum height of a height range, being greater than a required minimum height, no alert is displayed. Maximum height requirements can be imposed instead of or in addition to minimum height requirements. The height requirements can be based on airbag deployment and/or position of airbags and/or based on other safety concerns. For example, the vehicle functionality of FIG. 85B can include displaying or audibly playing an alert.

In some embodiments, the detected height range of one or more passengers corresponds to a detected vehicle status and/or detected vehicle state of the vehicle as described herein. Some or all possible functionality of the vehicle, such as vehicle functionality of FIG. 85B induced when the unfavorable height is detected, can be based on this detected vehicle status and/or detected vehicle state as discussed previously. For example, the vehicle cannot start or enter drive mode if the driver, front passenger, and/or another occupant does not meet the height requirement for their occupancy area. As another example, various button functionality for buttons interacted with by users is or isn't allowed to be initiated by users not meeting height requirements.

Some or all vehicle chairs of the vehicle can be implemented in this manner to detect the height of corresponding occupants, if occupied. Different seats can have different corresponding thresholds. Alternatively or in addition to utilizing sensor circuits and corresponding electrodes integrated into a vehicle seat, such as a vehicle chair 132 of FIG. 8A, the vehicle can utilize other electrodes and corresponding circuits on other portions of the car to detect the occupant in different occupancy areas, for example, based on determining coordinates in of three-dimensional space that are occupied via electrodes on different planes, and based on determining the height of the highest one of these coordinates detected to be occupied. As another example, anatomical feature mapping data generated for occupants in the vehicle can be utilized to determine height of the corresponding detected people. In some cases, the height requirements correspond to a region in space and/or relative to the chair where a head must be positioned and/or a chest must be positioned, and the detected position of the head and/or chest can be compared to these requirements to determine whether notifications be displayed and/or played audibly, restrictions of the vehicle, and/or vehicle status.

In some embodiments, the height of a user is utilized to automatically set various vehicle configurations. For example, a detected driver height range is processed via the vehicle computing system, and the side mirror configuration, seat configuration such as seat height, steering wheel position, heads up display position projected upon the front windshield, and/or other configurations are automatically adjusted based on control data generated by the vehicle computing system based on the detected driver height. For example, a proposed and/or optimal configuration of these various elements are configured based on a determined viewing angle and/or eye level of the user based on their detected height and/or position of their head in anatomical feature mapping data. The driver can optionally reconfigure some or all of these auto-selected settings via user input to one or more button circuits and/or other vehicle commands. Passengers can similarly have their seat position and/or heads up display automatically configured based on their detected height and/or head position.

In some embodiments, booster chairs and/or car seats for children can have unique impedance patterns detectable via electrodes on sensor circuits integrated within and/or in proximity to vehicle seats, can have identifiable shapes detectable in capacitance image data and/or object contouring data, can emit identifying frequencies detectable by electrodes on sensor circuits integrated within and/or in proximity to vehicle seat, and/or can otherwise be detected by sensor circuits described herein. The use and/or safety considerations regarding the use of the booster chairs and/or car seats can be processed as additional vehicle status data and/or to render generation of additional alerts, for example, based on if the seat containing a booster chair or car seat is unsafe for the booster chair, such as a driver seat or front passenger seat; based on the type of detected booster seat and/or car seat being inappropriate for the detected size and/or height of the corresponding person, such as the user being too tall or too short for the detected booster seat or car seat; and/or based on the position and/or configuration of the detected booster seat and/or car seat, for example, in capacitance image data and/or object contouring data indicating the detected booster seat and/or car seat is not attached or oriented correctly and/or safely, and/or that the human in the booster seat and/or car seat is not in a correct position and/or not secured in seat belts or harnessing correctly. In some cases, when these unsafe conditions are detected, the vehicle does not start and/or does not drive.

In some cases, certain button functionality is not enabled by users detected to be occupying seats that contain car seats and/or booster seats, such as not being allowed to unlock or open doors and/or windows, for example, to prevent a toddler from inadvertency activating vehicle functionality based on accidently touching corresponding buttons. In such embodiments, alternatively or in addition to detecting the presence of the car seats and/or booster seats, the corresponding user is automatically detected as discussed previously, and has such restrictions imposed due to a known age and/or known restrictions, such as parental restrictions set for this user.

Figure 87C:
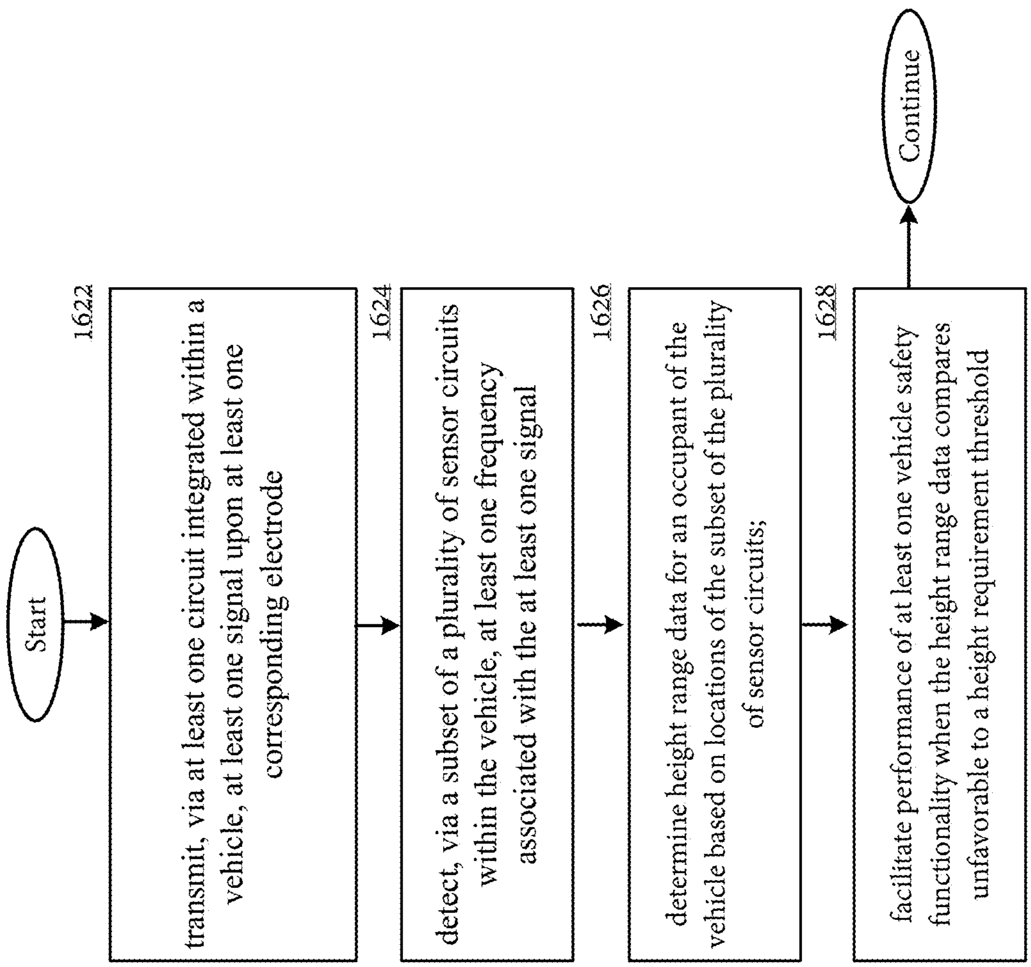
FIG. 87C is a logic diagram of an example of a method for execution in accordance with various embodiments.

FIG. 87C illustrates a method for execution. Some or all of the method of FIG. 87C can be performed via at least one vehicle computing entity 150, at least one processing module 250, at least one sensor circuit 215, at least at least one button circuit 112, at least at least one sensor circuit 116, at least at least one DSC 217, at least one ID circuit 114 and/or 118, at least one transmitter 214, at least one receiver 216, at least one vehicle chair 132, and/or via other circuits and/or processing resources described herein, for example, based on some or all functionality discussed in conjunction with one or more of FIGS. 87A-87B. Some or all of the method of 87C can be performed via any computing entity of FIGS. 2A-2D and/or any processing module, which can be associated with a corresponding vehicle, or any other system, for example, that includes one or more electrodes and corresponding sensor circuits or other corresponding circuits described herein upon and/or integrated within various parts of the vehicle. Some or all of the method of 87C can be performed based on performing some or all steps of FIG. 85B.

Step 1622 includes transmitting, via at least one circuits integrated within a vehicle, at least one signal upon at least one corresponding electrodes. Different signals transmitted by some or all different circuits can have unique frequencies to identify the different corresponding electrodes. Different signals transmitted by some or all different circuits can optionally have common frequencies. The at least one of circuit can be implemented as ID circuits 114 and/or 118, sensor circuits 215, transmitters 214, DSCs 117, and/or other circuit. Performing step 1622 can include performing step 1602. The at least one circuit can be integrated within a vehicle chair 132 and/or can be in proximity to a seat of the vehicle. Step 1622 can include transmitting the at least one signal via circuits integrated within and/or in proximity to multiple different vehicle chairs.

Step 1624 detecting, via a subset of a plurality of sensor circuits within the vehicle, at least one frequency associated with the at least one signal. The plurality of sensor circuits can be a subset of the first plurality of circuits, for example, all implemented as sensor circuits 215. Alternatively, some or all of the plurality of sensor circuits can be different from the first plurality of circuits, for example, based on being located on different planes within the vehicle, and/or based on the first plurality of circuits being operable to transmit signals as transmitters 214 while the set of sensor circuits are operable to receive signals as receivers 216. Some or all of the set of sensor circuits can be implemented as sensor circuits 215, sensor circuits 116, DSCs 117, and/or RX circuits 119. Performing step 1624 can include performing step 1604. The plurality of sensor circuits can be integrated within a vehicle chair 132, for example, at a plurality of different heights in the back of the chair as illustrated in FIGS. 87A and 87B. Step 1624 can include detecting signals via sensor circuits within multiple different chairs.

Step 1626 includes determining height range data for an occupant of the vehicle based on locations of the subset of the plurality of sensor circuits. Performing step 1626 can include performing step 1606, where the detected characteristic is a height of a person. Step 1626 can include generating occupancy data 8510 indicating a height of a corresponding person.

Step 1628 includes facilitate performance of at least one vehicle safety functionality when the height range data compares unfavorable to a height requirement threshold. Performing step 1628 can include performing step 1608, where the at least one vehicle functionality includes the at least one vehicle safety functionality. The at least one vehicle safety functionality can correspond to display of a notification, playing of a notification, disabling the vehicle from starting or driving, disabling airbags, or other safety functionality.

Figure 88A:
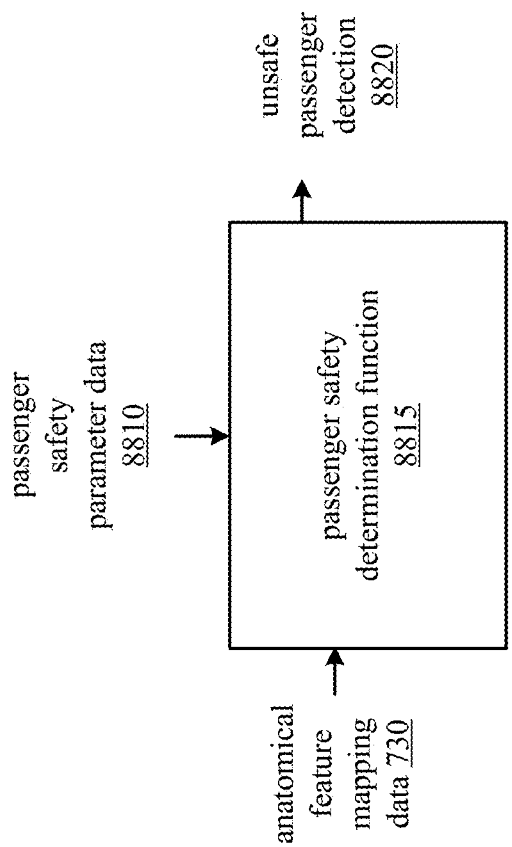
FIG. 88A is a schematic block diagram of a passenger safety determination function in accordance with various embodiments.

FIG. 88A illustrates an embodiment of a passenger safety determination function 8815 that utilizes anatomical feature mapping data 730 and/or other occupancy data 8510 to generate unsafe passenger detection data 8820. In particular, the detection of various people, their respective position of their respective body parts, detection of other object, and/or detection of vehicle status, can be utilized to determine whether a passenger is assuming an unsafe position or activity, and/or whether other unsafe conditions are met. The passenger safety determination function 8815 can be performed by vehicle computing entity 150 and/or another processing module.

Performing the passenger safety determination function 8815 can include determining whether the anatomical feature mapping data 730 and/or other occupancy data 8510 compares favorably to passenger safety parameter data 8810. For example, the passenger safety parameter data can indicate conditions indicated by the anatomical feature mapping data 730 and/or other occupancy data 8510 that must be met by some or all detected passengers. For example, the passenger safety parameter data can include a set of requirements, such as: the driver having both hands on the steering wheel; the driver facing forward; the driver not reaching into the back seat; the driver not holding or looking down at a cellular phone or other mobile device; some or all passengers in other occupancy areas facing forward; feet of occupants being on the floor; feet of occupants not being on the dashboard or on a set in front of them; passengers having their head at least at the minimum passenger height, and/or not being slumped too low in their seats; passengers keeping their arms and legs inside the vehicle, and not outside a window; a threshold proportion of arm and/or leg that can extend out the window safely; that each vehicle seat can be occupied by exactly one passengers, without additional passengers squeezing in a same seat as a first passenger in the vehicle chair, being on laps of other passengers, or laying across passengers in a bench seat; all people in the vehicle being seated in their own chair; no passengers occupying the trunk or truck bed of the vehicle; car seats being installed in the correct configuration; seat belts being worn across passenger bodies in a correct configuration; and/or other parameters. The passenger safety parameter data 8810 can optionally include the height requirements of FIGS. 87A and 87B, where the passenger safety parameter data 8810 indicates when occupants are detected not to meet the height requirements.

Some or all of these parameters can further be based on a vehicle status, such as whether the vehicle is on and/or in motion, for example, where some or all of these conditions are only required to be upheld while the vehicle is being driven. Some or all of these parameters can further be based on the location of the vehicle, the speed of the vehicle, which user is driving the vehicle, whether the corresponding occupant is a child and/or exceeds a minimum height threshold; and/or other vehicle conditions described herein. Unsafe conditions corresponding to a vehicle being in park and/or off can correspond to the detection of occupants, such as children and/or animals, in the vehicle left unattended, where no driver is detected; left in the vehicle when exterior temperature conditions exceed or fall below threshold temperatures indicating risk of heat exhaustion and/or hypothermia; left in the vehicle for at least a threshold amount of time; and/or other conditions.

When the anatomical feature mapping data 730 and/or other occupancy data 8510 indicates one or more requirements of passenger safety parameter data 8810 are not met and/or when the anatomical feature mapping data 730 and/or other occupancy data 8510 otherwise compares unfavorably to passenger safety parameter data 8810, the vehicle can perform a corresponding vehicle function such as displaying or audibly conveying an alert indicating the unsafe activity, prohibiting the vehicle from being turned on or being put into drive; sending a text message to an owner of and/or person leasing the vehicle, parent of the driver of the vehicle, an insurance company associated with an owner or driver of the vehicle; and/or other entity indicating the unsafe behavior; auto-dialing 911; turning on camera systems or other sensors to collect additional information regarding the safety of the vehicle; or other functions. For example, the vehicle system audibly reminds the driver to pay attention to the road based on detecting the driver is turned around and reaching their arms into the backseat.

Figure 88B:
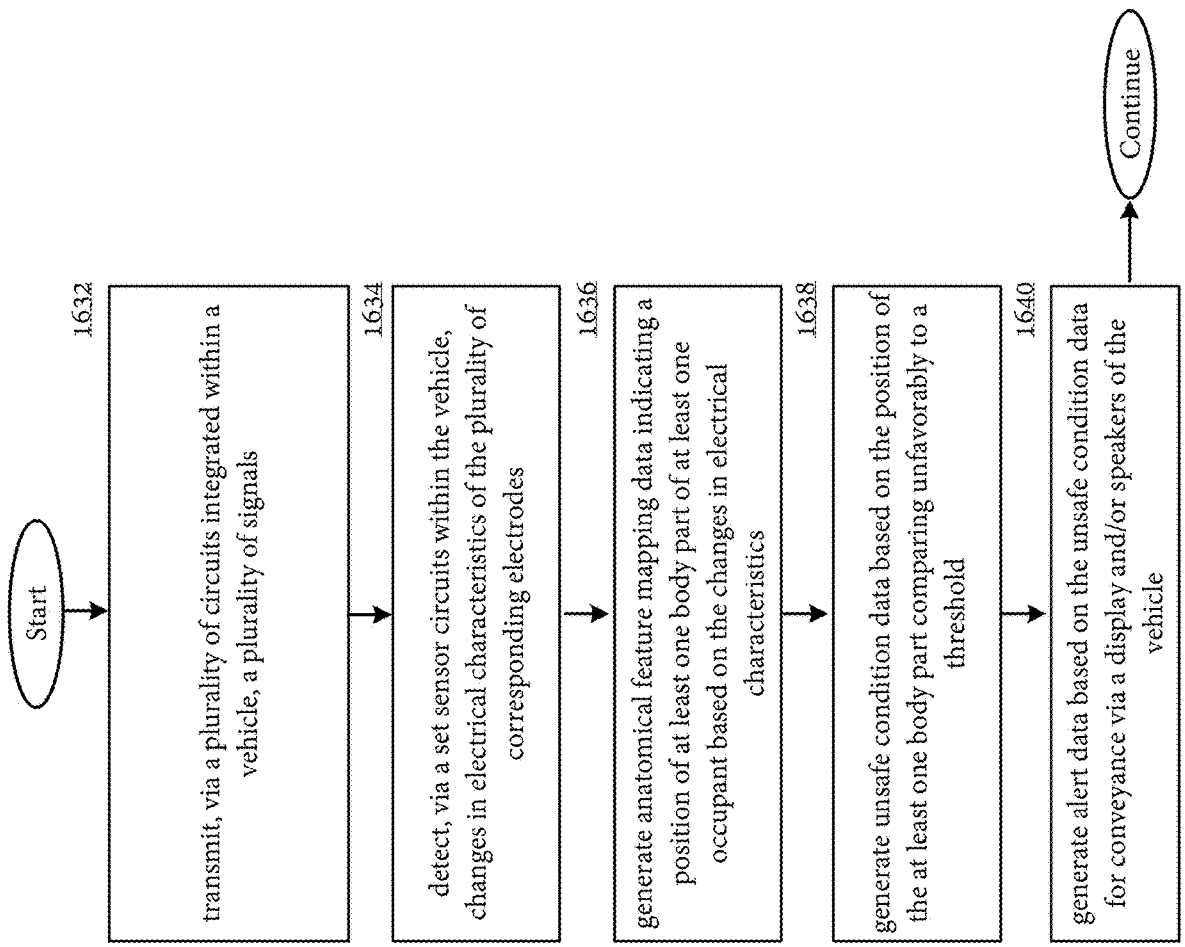
FIG. 88B is a logic diagram of an example of a method for execution in accordance with various embodiments.

FIG. 88B illustrates a method for execution. Some or all of the method of FIG. 88B can be performed via at least one vehicle computing entity 150, at least one processing module 250, at least one sensor circuit 215, at least at least one button circuit 112, at least at least one sensor circuit 116, at least at least one DSC 217, at least one ID circuit 114 and/or 118, at least one transmitter 214, at least one receiver 216, at least one vehicle chair 132, and/or via other circuits and/or processing resources described herein, for example, based on some or all functionality discussed in conjunction with one or more of FIG. 88A. Some or all of the method of 88B can be performed via any computing entity of FIGS. 2A-2D and/or any processing module, which can be associated with a corresponding vehicle, or any other system, for example, that includes one or more electrodes and corresponding sensor circuits or other corresponding circuits described herein upon and/or integrated within various parts of the vehicle. Some or all of the method of 88B can be performed based on performing some or all steps of FIG. 85B and/or FIG. 83D.

Step 1632 includes transmitting, via a plurality of circuits integrated within a vehicle, a plurality of signals. Different signals transmitted by some or all different circuits can have unique frequencies to identify the different corresponding electrodes. Different signals transmitted by some or all different circuits can optionally have common frequencies. The at least one of circuit can be implemented as ID circuits 114 and/or 118, sensor circuits 215, transmitters 214, DSCs 117, and/or other circuit. Performing step 1632 can include performing step 1602.

Step 1634 includes detecting, via a set of sensor circuits within the vehicle, changes in electrical characteristics of the plurality of corresponding electrodes. The plurality of sensor circuits can be a subset of the first plurality of circuits, for example, all implemented as sensor circuits 215. Alternatively, some or all of the plurality of sensor circuits can be different from the first plurality of circuits, for example, based on being located on different planes within the vehicle, and/or based on the first plurality of circuits being operable to transmit signals as transmitters 214 while the set of sensor circuits are operable to receive signals as receivers 216. Some or all of the set of sensor circuits can be implemented as sensor circuits 215, sensor circuits 116, DSCs 117, and/or RX circuits 119. Performing step 1634 can include performing step 1604. Performing step 1634 can include generating capacitance image data 233, object detection data, and/or object contouring data 733.

Step 1636 includes generating anatomical feature mapping data indicating a position of at least one body part of at least one occupant based on the changes in electrical characteristics. Performing step 1636 can include performing some or all steps of FIG. 83D and/or can include performing anatomical feature mapping data generator function 710 capacitance image data 233, object detection data, and/or object contouring data 733 as discussed in conjunction with FIGS. 83A-83C.

Step 1638 includes generating unsafe condition data based on the position of the at least one body part comparing unfavorably to a threshold. Performing step 1638 can include performing the passenger safety determination function 8815 of FIG. 88A and/or can include comparing the anatomical feature mapping data to passenger safety parameter data 8810 accessed in memory and/or otherwise determined by the vehicle computing entity.

Step 1640 includes generating alert data based on the unsafe condition data for conveyance via a display and/or speakers of the vehicle. The method can alternatively or additionally include performing vehicle functionality based on the unsafe condition data. For example, step 1608 is performed, where the unsafe condition data is the at least one characteristic. This can include not enabling the vehicle to be driven, transmitting alerts, texts, phone calls, or other notifications via a network, and/or performing any other vehicle functionality described herein based on the unsafe condition data.

Figure 89:
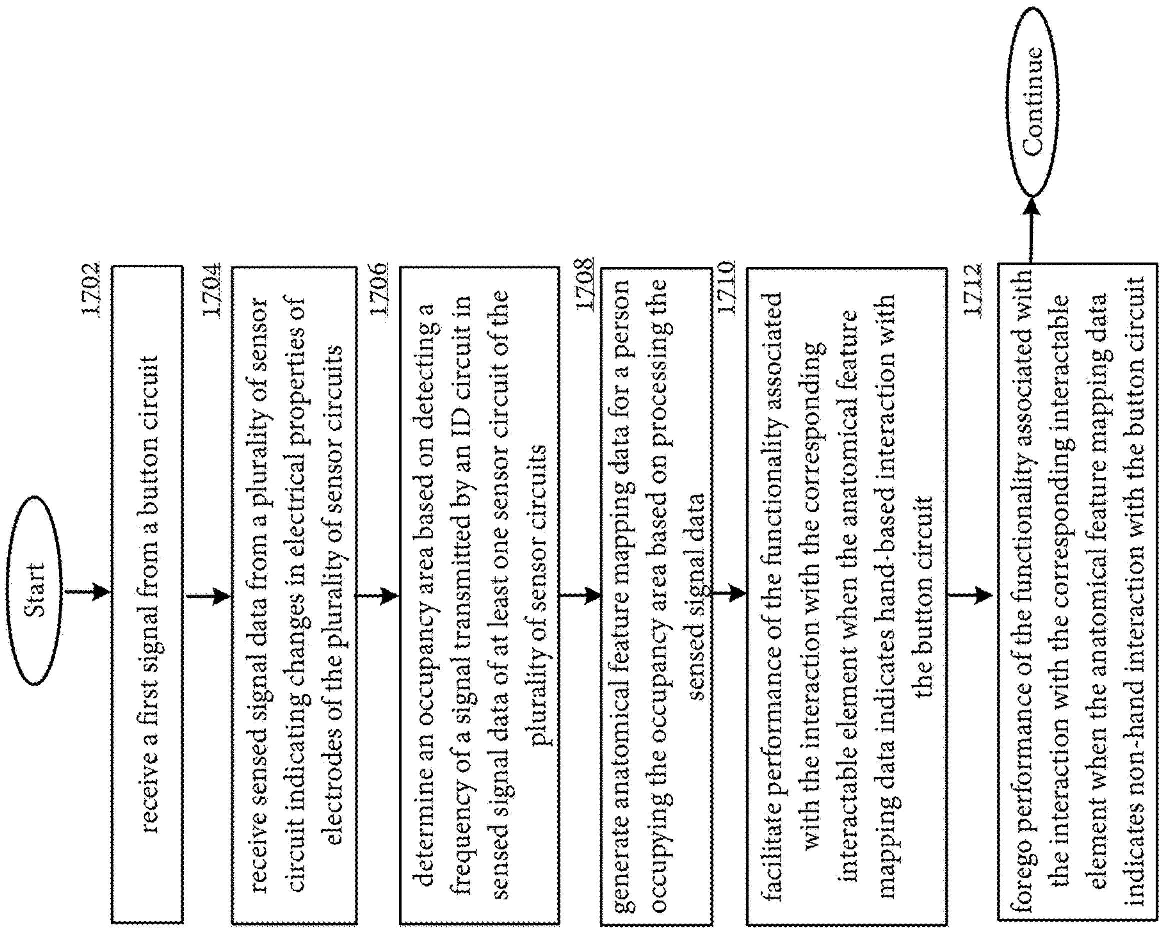
FIG. 89 is a logic diagram of an example of a method for execution in accordance with various embodiments.

FIG. 89 is a logic diagram illustrating a method for enhanced button verification based on utilizing anatomical feature mapping data generated via capacitance image data, object location data, and/or object contouring data generated by various sensor circuits in the vehicle. For example, the sensor circuits are integrated within the various structure of the vehicle, for example, as illustrated in FIG. 85A, to determine the body position of users as discussed in conjunction with FIG. 88A-88B. Alternatively or in addition, this anatomical feature mapping data is generated via capacitance image data generated via a touch screen, touch pad, and/or touch sensor device implementing a corresponding button circuit and/or in proximity to a corresponding button circuit.

The anatomical feature mapping data can be processed to verify whether button interactions are intentional or accidental, based on the body position of the user indicating the user is interacting with the button via their hand and/or finger, or is accidentally pushed up against and/or accidentally touched the button via another body part, such as their knee, elbow, forearm or leg pressed against the corresponding button region, such as a door panel area or center console based on the user leaning this body part against the door panel area or center console. The anatomical feature mapping data can be utilized verify button interaction instead of or in addition to detection of a corresponding signal propagating through the user's body as discussed in conjunction with FIGS. 1-48B. For example, an ID signal propagating through the user's body would be detected in cases where an inadvertent body part, such as knee, elbow, forearm, or leg of the user resting against the button to inadvertently activate the button despite the interaction being unintentional.

The sensor circuits of RX sensor circuits 119, sensor circuits 116, button circuits 112, and/or DSCs 117 of FIGS.

1-48B detecting and/or verifying button interactions can be implemented as the sensor circuits that further generate anatomical feature mapping data. Alternatively, additional sensor circuits, such as various sensor circuits 215 and/or various DCSs 117 of FIG. 85A, are implemented to determine body position which is utilized in conjunction with signals received by RX sensor circuits 119, sensor circuits 116, button circuits 112, and/or DSCs 117 of FIGS. 1-48B to determine whether detected and/or verified touches are in fact intentional.

This can be based on determining which body part activated the button and comparing the body part to body part parameter data for the button, indicating which body part is intended to interact with the button, such as a hand, a particular hand, a particular finger of the hand, or other body part. When the body part that activated the button matches this body part parameter data and/or is determined to correspond to a hand or finger, the corresponding button functionality is performed. When the body part that activated the button does not match this body part parameter data and/or is determined to not correspond to a hand or finger, the corresponding button functionality is not performed.

Some or all of the method of FIG. 89 can be performed via a vehicle computing entity 150 at least one button circuit 112, at least one RX circuit 119, at least one sensor circuit 116, at least one ID circuit 114 and/or 118, at least one DSC 117, and/or at least one sensor circuit 215. Some or all of the method of FIG. 89 can be performed via any computing entity of FIGS. 2A-2D and/or any processing module, which can be associated with a corresponding vehicle, or any other system, for example, that includes one or more buttons. Some or all of the method of 89 can be performed based on performing the method of FIG. 13B, FIG. 19B, FIG. 83D, and/or FIG. 85B.

Step 1702 includes receiving a first signal from a button circuit, such as a button circuit 112 and/or any button circuit described herein of a corresponding one or more buttons, touch screen, touch pad, key pad, or other interactable element.

Step 1704 includes receiving sensed signal data from a plurality of sensor circuit indicating changes in electrical properties of electrodes of the plurality of sensor circuits. The plurality of sensor circuits can include sensor circuits 215 of two or more planes, DSCs 117 of a two dimensional area, sensor circuits 116 of an occupancy area, RX circuits 119 proximal to the button circuit, and/or other sensor circuits.

Step 1706 includes determining an occupancy area based on detecting a signal transmitted by an ID circuit in sensed signal data of at least one sensor circuit of the plurality of sensor circuits. For example, the ID circuit is an ID circuit 118 proximal to the button circuit and the at least one sensor circuit is a sensor circuit 116 of an occupancy area. As another example, the ID circuit is an ID circuit 114 of an occupancy area and the at least one sensor circuit is an RX circuit 119.

Step 1708 includes generating anatomical feature mapping data for a person occupying the occupancy area based on processing the sensed signal data. This can include generating capacitance image data, object detection data, and/or object contouring data based on the sensed signal data. This can include performing some or all of the method of FIG. 83D.

Step 1710 includes facilitate performance of the functionality associated with the interaction with a corresponding interactable element of the button circuit when the anatomical feature mapping data indicates hand-based interaction with the button circuit. Step 1712 includes foregoing performance of the functionality associated with the interaction with a corresponding interactable element when the anatomical feature mapping data indicates non-hand interaction with the button circuit. In some embodiments, when the anatomical feature mapping data indicates non-hand interaction with the button circuit, the user can be notified and/or asked to confirm the interaction via a notification conveyed via speakers and/or audio. The seat of the user can automatically reconfigure if the user is detected to be pressed against the button due to the current position of their seat.

Figure 90:
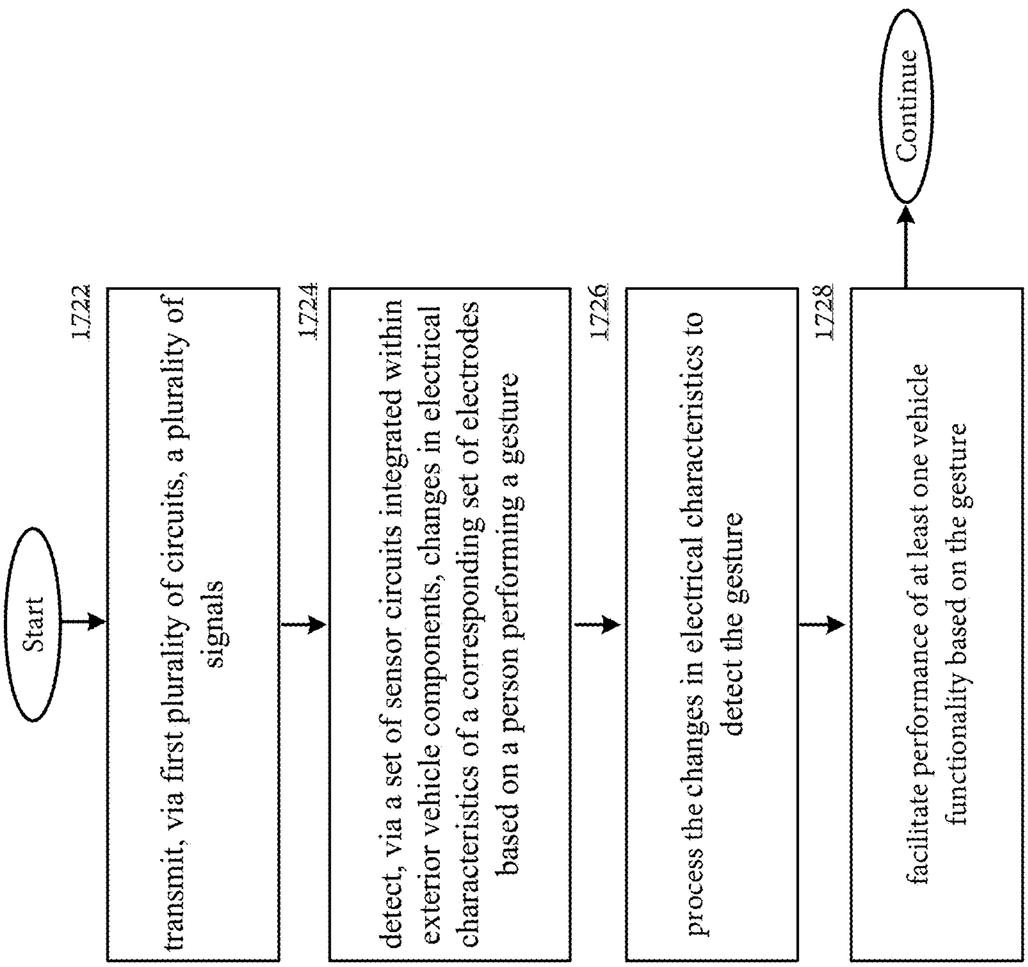
FIG. 90 is a logic diagram of an example of a method for execution in accordance with various embodiments.

FIG. 90 is a logic diagram illustrating a method for performing vehicle functionality based on gesture detection. Some or all of the method of FIG. 90 can be performed via a vehicle computing entity 150 at least one button circuit 112, at least one RX circuit 119, at least one sensor circuit 116, at least one ID circuit 114 and/or 118, at least one DSC 117, and/or at least one sensor circuit 215. Some or all of the method of FIG. 90 can be performed via any computing entity of FIGS. 2A-2D and/or any processing module, which can be associated with a corresponding vehicle, or any other system, for example, that includes one or more buttons. Some or all of the method of 89 can be performed based on performing the method of FIG. 83D, FIG. 84E, and/or FIG. 85B.

Step 1722 includes transmitting, via first plurality of circuits integrated within exterior vehicle components of a vehicle, a plurality of signals. Different signals transmitted by some or all different circuits can have unique frequencies to identify different corresponding electrodes. Different signals transmitted by some or all different circuits can optionally have common frequencies. The at least one of circuit can be implemented as ID circuits 114 and/or 118, sensor circuits 215, transmitters 214, DSCs 117, and/or other circuit. Performing step 1722 can include performing step 1602.

Step 1724 includes detecting, via a set of sensor circuits integrated within exterior vehicle components, changes in electrical characteristics of a corresponding set of electrodes based on a person performing a gesture. The plurality of sensor circuits can be a subset of the first plurality of circuits, for example, all implemented as sensor circuits 215. Alternatively, some or all of the plurality of sensor circuits can be different from the first plurality of circuits, for example, based on being located on different planes within the vehicle, and/or based on the first plurality of circuits being operable to transmit signals as transmitters 214 while the set of sensor circuits are operable to receive signals as receivers 216. Some or all of the set of sensor circuits can be implemented as button circuits 112, sensor circuits 215, sensor circuits 116, DSCs 117, and/or RX circuits 119. Performing step 1724 can include performing step 1604. Performing step 1724 can include generating a stream of capacitance image data 233, a stream of object detection data, and/or a stream of object contouring data 733.

Step 1726 includes processing the changes in electrical characteristics to detect the gesture. Performing step 1726 can include performing some or all steps of FIG. 84E. Performing step 1726 can include performing step 1606, where the characteristic of the person is the gesture.

Step 1728 includes facilitating performance of at least one vehicle functionality based on the gesture. Performing step 1726 can include performing step 1608. The at least one vehicle functionality can be mapped to the gesture, where the gesture is a set of different gestures inducing different corresponding vehicle functionalities. The at least one vehicle functionality can be further based on a vehicle status of the vehicle, detecting which occupant performed the gesture based on identifying which occupancy area contained the gesture and/or which person detected in the vehicle was detected to perform the gesture, and/or other conditions.

In some embodiments, the gesture is detected regardless of its start and end position relative to any two-dimensional surface. For example, the user can choose any start position in three dimensional space, for example, while sitting in the vehicle, and perform the gesture from this chosen start position, rather than the start position needing to be proximal to a touch screen and/or a corresponding button displayed upon the touch screen. As a further example, the user can choose any end position in three dimensional space, for example, where a two-dimensional plane encompassing the movement of the gesture can optionally be in any orientation and/or can be in more than one orientation. For example, rather than being confined to detection via a single two-dimensional plane, the object detection and/or contouring of FIGS. 49-82 is implemented via a plurality of sensor circuits 215 throughout the vehicle as illustrated in FIG. 85A, where detection of a gesture performed in one or more of a set of multiple planes is possible, and/or where the movement of a given gesture is not confined to a single plane.

In some embodiments, any user in the vehicle can optionally be detected to be performing the gesture. The same or different functionality is performed based on which user in the vehicle is performing the gesture. For example, when the driver performs a gesture to lower their window, the driver window is lowered, and when the front passenger is detected to perform this identical gesture, the passenger window is lowered. The occupant-specific functionality can be implemented via some or all features and/or functionality discussed in conjunction with FIGS. 20C, 20D, and/or FIGS. 21A-21C, where gestures are detected to be performed by different occupants instead of or in addition to button interactions, where different functionality is enabled for different occupants performing the same gesture, and/or where no functionality is performed if the corresponding occupant is restricted from activating the command.

For example, the occupant performing a gesture can be based on the determined location of the gesture, such as 3D coordinates containing the gesture, and determining which one of the set of occupancy areas contains most or all of these 3D coordinates. As another example, the occupant performing a gesture can be based on anatomical feature mapping data for different occupants, where a given occupant is detected to perform the gesture based on tracking their body part, and the occupancy area for the rest of the occupant's body, such as the chair they are sitting in, is further determined based on the anatomical feature mapping data. As another example, when gestures are performed in proximity to a given button area, such as a hand of the user in proximity to a touch screen, key pad, set of parallel electrodes, or other or button operable via gestures as discussed previously, the occupant performing the gesture can further be determined based on detecting a button ID frequency via their sensor circuit 116 and/or based on detecting their occupant ID and/or user ID via RX circuit 119 in proximity to this area.

The anatomical feature mapping data can be utilized to determine which body part performed the gesture, where different body parts induce different functions. For example, a given gesture can be performed by the right hand or left hand, where a given right component is activated when a given gesture is detected to be performed by the right hand, and where a given left component is activated when a given gesture is detected to be performed by the left hand.

For example, the right hand of the driver performs a first gesture corresponding to lowering the window, and the front passenger window is lowered based on detecting the first gesture and further determining the right hand performed the gesture based on the anatomical feature mapping data. The left hand of the driver performs the first to lowering the window, and the driver window is lowered based on detecting the first gesture and further determining the left hand performed the gesture based on the anatomical feature mapping data. The right hand of the driver performs a second gesture corresponding to a turn signal, and a right turn signal is activated based on detecting the second gesture and further determining the right hand performed the gesture based on the anatomical feature mapping data. The left hand of the driver performs the second gesture corresponding to the turn signal, and a left turn signal is activated based on detecting the second gesture and further determining the left hand performed the gesture based on the anatomical feature mapping data.

Some gestures can be secure, for example, corresponding to unlocking a glove box from the interior and/or unlocking the car from the exterior. This can include performing a more complex gesture, such as drawing a shape in mid-air, that, while not necessarily secure from passengers, can be difficult to guess if an intruder were to attempt to unlock the car or glove box having not seen the driver perform the action. When the secret gesture is detected, the corresponding functionality, such as unlocking a glove box from the interior and/or unlocking the car from the exterior, is performed.

Figure 91:
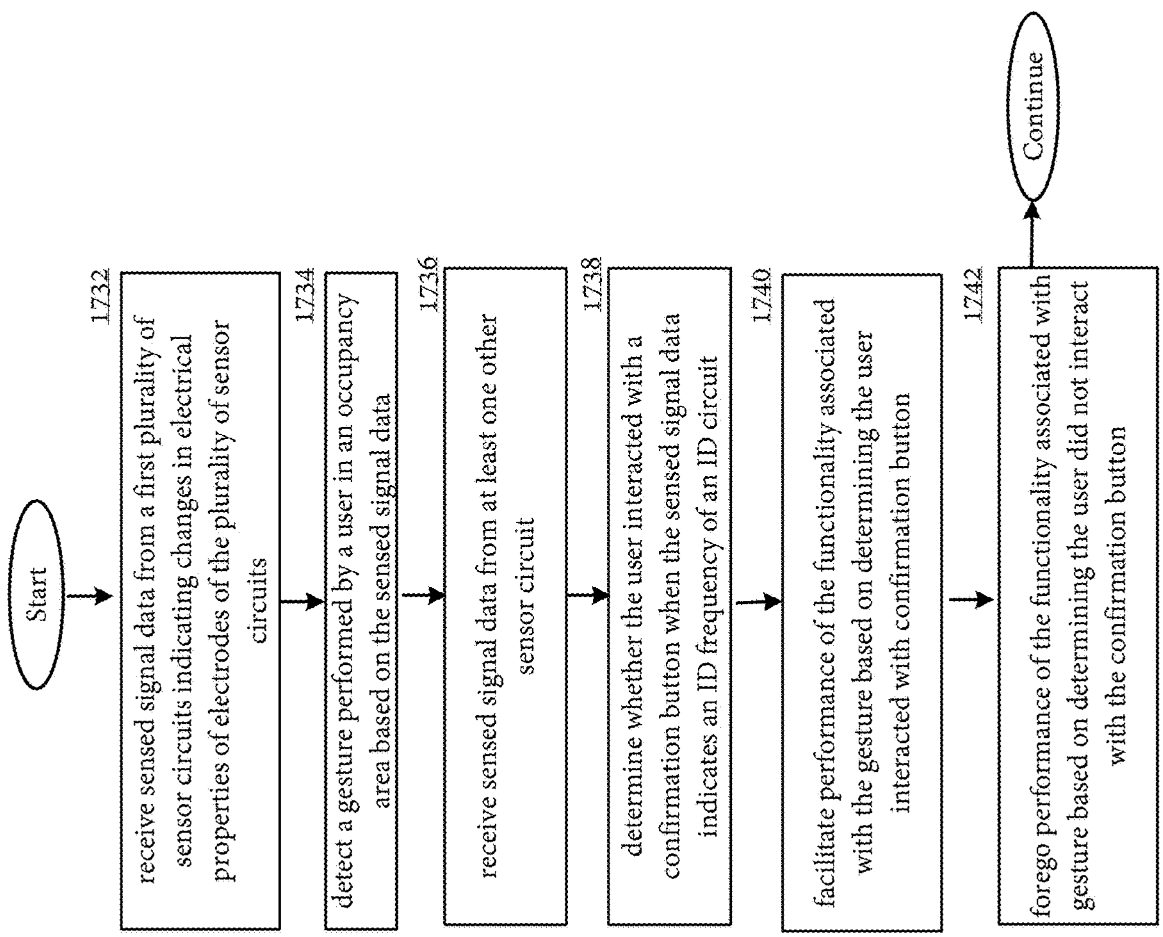
FIG. 91 is a logic diagram of an example of a method for execution in accordance with various embodiments.

FIG. 91 is a logic diagram illustrating a method for performing vehicle functionality based on confirming gesture detection and/or identifying the occupant performing a gesture via gesture confirmation buttons. Some or all of the method of FIG. 91 can be performed via a vehicle computing entity 150 at least one button circuit 112, at least one RX circuit 119, at least one sensor circuit 116, at least one ID circuit 114 and/or 118, at least one DSC 117, and/or at least one sensor circuit 215. Some or all of the method of FIG. 91 can be performed via any computing entity of FIGS. 2A-2D and/or any processing module, which can be associated with a corresponding vehicle, or any other system, for example, that includes one or more buttons. Some or all of the method of 89 can be performed based on performing the method of FIG. 83D, FIG. 84E, FIG. 85B, and/or FIG. 90.

Step 1732 includes receiving sensed signal data from a first plurality of sensor circuits indicating changes in electrical properties of electrodes of the plurality of sensor circuits. For example, performing step 1732 includes performing step 1724.

Step 1734 includes detecting a gesture performed by a user in an occupancy area based on the sensed signal data. For example performing step 1734 includes performing step 1726.

Step 1736 includes receiving sensed signal data from at least one other sensor circuit, such as a sensor circuit 116 and/or RX circuit 119. Step 1738 includes determine whether the user interacted with a confirmation button when the sensed signal data indicates an ID frequency of an ID circuit. The confirmation button can be implemented as any button described herein that is implemented via a button circuit 112, that is in proximity to an RX circuit 119 of a given button area, and/or that is in proximity to an ID circuit 118 of a given button area. Thus, when a user touches or interacts with the button, their interaction is confirmed based on the sensor circuit 116 and/or RX circuit 119 detecting a frequency transmitted by an ID circuit of an ID circuit 118 and/or 114, respectively, as discussed in conjunction with FIGS. 1-48B.

Step 1740 includes facilitating performance of the functionality associated with the gesture based on determining the user interacted with confirmation button. Step 1742 includes foregoing performance of the functionality associated with gesture based on determining the user did not interact with the confirmation button.

Thus, a user can confirm they wish to perform a given gesture based on performing the gesture while touching the button. For example, the right hand performs the gesture while a finger on the left hand touches the button, for example, on the steering wheel or in a different location. This can be ideal in cases where occupants of the vehicle often dance to music or converse with each other via gestures that could inadvertently be processed as vehicle gestures, to enable users to confirm that they are intentionally performing the gesture as a command to perform a vehicle functionality.

Alternatively or in addition, the confirmation button can be useful in identifying which occupant, and/or particular user via a user ID signal, is performing the gesture in cases where different occupant-based functionalities are performed for different occupants as discussed previously.

Alternatively or in addition, different confirmation buttons can be implemented for different types of functionality to distinguish between commands of same or similar gestures. For example, a first button indicating to audio configuration is selected, and while this button is pushed, gestures to configure audio are performed. Corresponding audio functionality is configured based on the first button indicating audio configuration being detected as being selected. A second button indicating cruise control settings is selected, and while this button is pushed, gestures to configure cruise control are performed, where some of these gestures are the same as or similar to those to configure audio. Corresponding cruise control functionality is configured based on the second button indicating cruise control configuration being detected as being selected. Such embodiments can be ideal in reducing a number of commands required, where up, down, left, right, and select gestures are performed to activate functionality for many different settings, and where the pressed button indicates which setting is being configured via these respective motions.

In some embodiments, rather than detecting occupant frequencies and/or button area frequencies of ID signals, the button is simply pushed and/or otherwise interacted with via any button circuit, where a corresponding frequency is not detected to confirm the button interaction, and where any pushing of the button during the gesture performance is sufficient.

In some embodiments, the same or similar confirmation can be performed for voice commands instead of or in addition to performing these confirmations for gesture commands. This can be ideal in identifying which occupant is speaking to enable corresponding functionality based on the occupant. This can be ideal in ensuring that the user was intentionally giving a voice command, rather than inadvertently speaking.

Figure 92A:
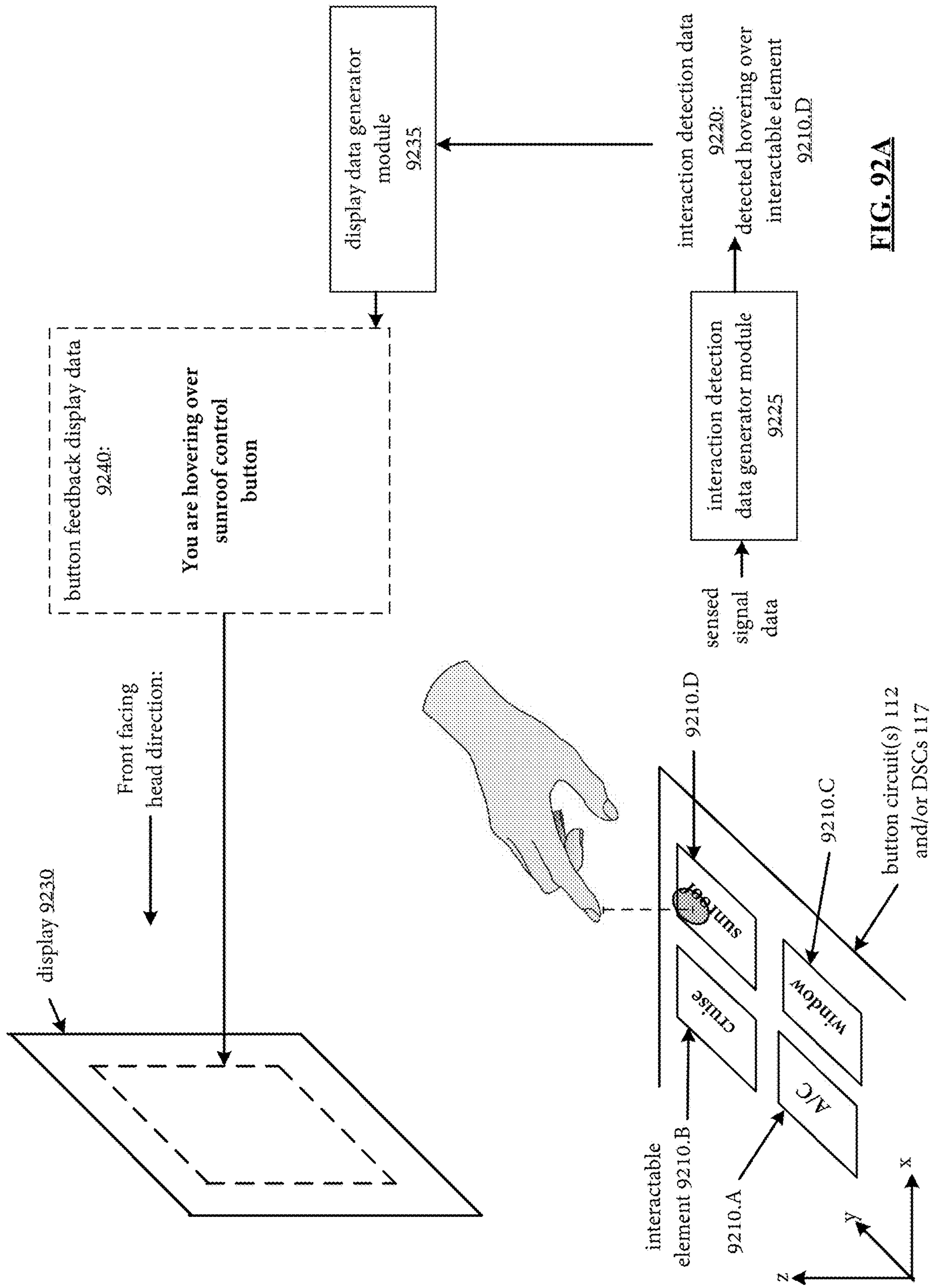
FIG. 92A is an illustration of generation of example button feedback display data based on detected interaction with interactable elements in accordance with various embodiments.

FIG. 92A presents an embodiment of processing sensed signal data to generate button feedback display data 9240 for display via a display 9230. Some or all features and/or functionality of FIG. 92A can be performed via a vehicle computing entity 150 and/or any other computing entity. Some or all features and/or functionality of FIG. 92A can implemented based on implementing some or all features and/or functionality discussed in conjunction with some or all of FIGS. 1-49, and/or based on implementing any other features and/or functionality discussed herein.

A user can interact with and/or near one or more interactable elements 9210, such as the plurality of interactable elements 9210.A, 9210.B, 9210.C, and/or 9210.D of this example. Any other number of interactable elements 9210 and/or any other spatial arrangement of interactable elements 9210 can be implemented in other embodiments.

The interactable elements 9210 can be implemented as buttons, such as electrodes and/or other types of buttons described herein, for example, having corresponding button circuits 112, corresponding RX circuits 119, and/or corresponding ID circuits 118. An individual interactable element 9210 can be implemented via a single electrode of a button circuit and/or multiple electrodes of one or more button circuits and/or DSCs. The plurality of interactable elements 9210 can be implemented as different button touch areas 4410 of a keypad 4415; different parallel electrodes of a set of parallel electrodes of FIGS. 42 and 43A; different portions of a touchpad 4615; and/or different portions of a touch screen, such as different graphically displayed buttons in graphical image data displayed by the touch screen. Some or all of the plurality of interactable elements 9210 are not implemented via electrodes, and are instead implemented as switches and/or other types of buttons, where proximal interaction is detected based on changes in electrical characteristics induced upon other electrodes of RX circuits 119 and/or sensor circuits 215 in proximity to these buttons when the user is interacting with these buttons, as discussed previously.

The plurality of interactable elements 9210 can be in a same area, such as a driver door panel or other door panel, on a steering wheel, on a dashboard, on a front center console, in any vehicle occupancy area, or in another portion of the car. For example, the plurality of interactable elements 9210 are all in close proximity, such as within a same 6 inch by 6 inch area, and/or are all implemented on a driver door button panel.

The sensed signal data can be generated via one or more button circuits 112, RX circuits 119, DSCs 117, and/or other circuits described herein. For example, a touch point or hover region 605 is detected, for example, based on capacitance image data 233 and/or based on otherwise detecting corresponding changes in self-capacitance and/or mutual-capacitance of electrodes implementing and/or in proximity to the plurality of interactable elements 9210 as discussed previously.

The sensed signal data can be processed via an interaction detection data generator module 9225 to generate interaction detection data 9220. The interaction detection data generator module 922 can be implemented via at least one processor and/or memory of a vehicle computing entity 150 and/or via another processing module. The interaction detection data 9220 can indicate a particular interactable element being touched and/or hovered over, which can be determined via the interaction detection data generator module 9225 based on the sensed signal data as described herein. This can include generating and processing capacitance image data 633 and/or comparing changes in measured capacitance values to one or more threshold, such as a touch threshold or touchless threshold. The interaction detection data 9220 can optionally indicate a gesture 810 performed via interaction across one or more interactable elements 9210 over time being touched and/or hovered over, which can be determined via the interaction detection data generator module 9225 based on the sensed signal data generated over a temporal period as described herein. The interaction detection data 9220 can optionally indicate anatomical feature mapping data 730 based on interaction across one or more interactable elements 9210 being touched and/or hovered over by one or more fingers of a hand, or other detected body parts, which can be determined via the interaction detection data generator module 9225 based on the sensed signal data as described herein.

In this example, a hover region is detected to be mostly or fully within a region that includes a "sunroof" button implemented as interactable element 9210. For example, the user's finger is hovering over this button based on the user contemplating and/or being about to interact with a different button, such as the "cruise" button to activate cruise control or the "window" button to lower the window. For example, the user is hovering over the wrong button due to the user not looking down at the panel of buttons, for example, based on the user being a driver of a vehicle and interacting the buttons while looking forward at the road due to driving the vehicle. For example, the buttons are not in the driver's line of sight while looking at the road, for example, based on being implemented as a panel of buttons on a driver door below a window on the driver door, or based on being implemented in a front center console area. In embodiments where the interactable elements are implemented on a driver door button panel, the finger can optionally be a finger of the left hand rather than the depicted right hand, for example, based on the vehicle being a car with a driver's seat on the left side.

Rather than necessitating that a user look at the panel of buttons, such as a driver needing to look away from the road to confirm which button they are activating, a display 9230 can be implemented to display button feedback display data 9240 that indicates data regarding detecting interaction with and/or detected hovers in proximity to the set of buttons. For example, the display 9230 is a heads-up display projected upon a windshield, enabling the driver to view the graphically depicted button feedback display data 9240 projected upon the windshield while looking forward at the road. As another example, the display 9230 is a front center console display or dashboard display, enabling the driver to view the graphically depicted button feedback display data 9240 rendered upon the front center console display or dashboard display rather than down at their hand interacting with a driver door button panel. The display 9230 can be implemented via any other type of display in any other vehicle location that can be viewed by a user in an occupancy area 102 while interacting with the set of buttons from their occupancy area 102, for example, while sitting in a vehicle chair of their occupancy area 102.

A display data generator module 9235 can process the interaction detection data 9220 to generate button feedback display data 9240 for display via the display 9230. In this example, the button feedback display data 9240 indicates that the user is hovering over the sunroof control button. While the button feedback display data 9240 is depicted as text in this example, a display of a corresponding icon, an amination, and/or other data depicting the button is about to be selected can be indicated.

Optionally, instead of or in addition to indicating the button over which a user is hovering prior to button activation, the button feedback display data 9240 indicates the selected button after activation, for example, for functionality such as activation of seat heaters or activation of 4 wheel drive that may not otherwise be immediately obvious, enabling the user to confirm the intended button was selected and/or to enable the user to undo the action via repushing the same button or performing another button, gesture, and/or voice based cancellation and/or undo command. The button feedback display data 9240 can visually differentiate between detection of a hover vs. detection of a touch (e.g. based on detecting touches and hovers separately based on using the touch threshold and/or computing a hover distance) and/or can visually differentiate between whether the button has or has not yet been selected (e.g. based on receiving an indication that button was interacted with from a corresponding button circuit 112).

Figure 92B:
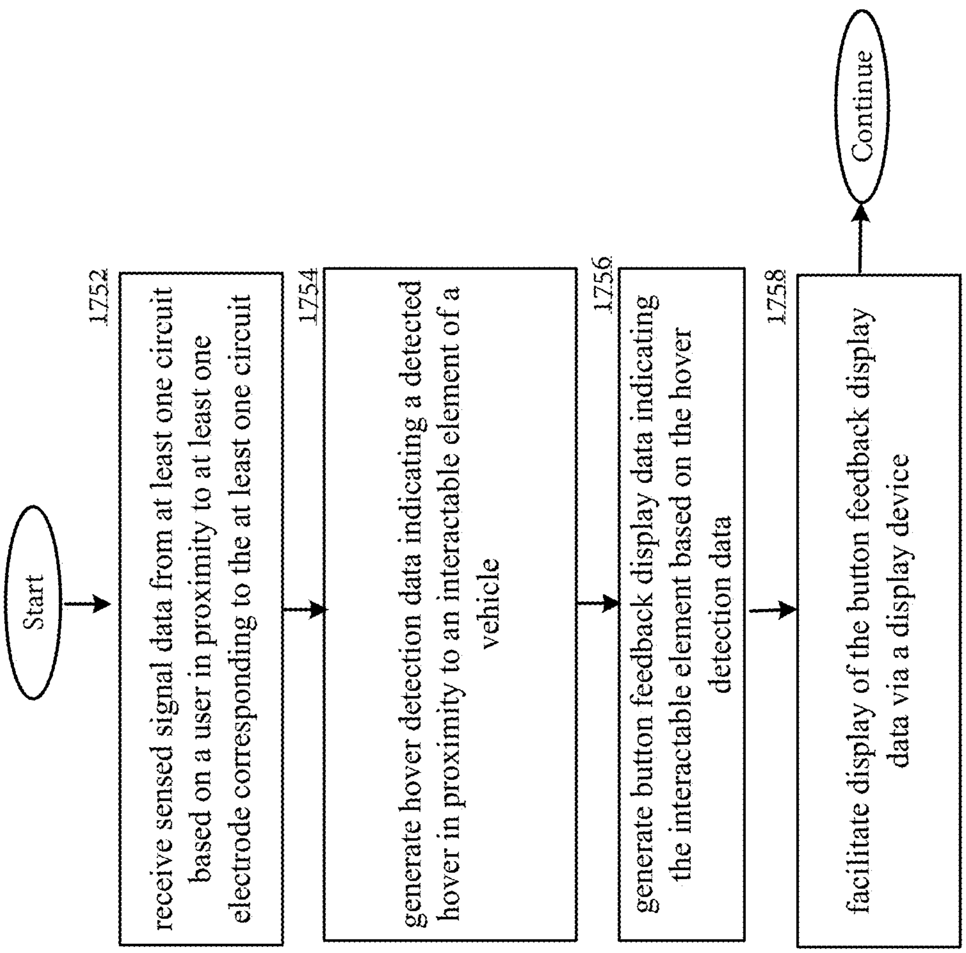
FIG. 92B is a logic diagram of an example of a method for execution in accordance with various embodiments.

FIG. 92B is a logic diagram illustrating a method of generating and displaying button feedback display data based on detected interactions with buttons and/or electrodes, for example, based on implementing some or all functionality discussed in conjunction with FIG. 92A. Some or all of the method of FIG. 92B can be performed via a vehicle computing entity 150 at least one button circuit 112, and/or at least one DSC 117, for example, based on some or all functionality discussed in conjunction with one or more of FIGS. 1-48B. Some or all of the method of FIG. 92B can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 92B can be performed based on performing the method of FIGS. 13B, 19B, 43B, 44D, and/or 48B Some or all of the method of FIG. 92B can be performed based on performing one or more steps of any other method described herein.

Step 1752 includes receiving sensed signal data from at least one circuit based on a user in proximity to at least one electrode corresponding to the at least one circuit. Step 1754 includes generating hover detection data indicating a detected hover in proximity to an interactable element of a vehicle. In various embodiments, the hover detection data is implemented as the interaction detection data 9220 of FIG. 92A. Step 1756 includes generating button feedback display data indicating the interactable element based on the hover detection data. Step 1758 includes facilitating display of the button feedback display data via a display device.

In various embodiments, generating the hover detection data includes comparing a change in capacitance indicated in the sensed signal data to at least one of: a touchless threshold, such as touchless indication threshold 342 of FIG. 47E, or a touch-based threshold, such as touch threshold 344 of FIG. 47E.

In some embodiments, the detected hover is differentiated from a detected touch. In other embodiments, the detected hover is not differentiated from a detected touch. In some embodiments, a detected touch of a corresponding interactable element is implemented as the detected hover, where the detected touch does not activate the corresponding interactable element, for example, based on the corresponding interactable element being a button or switch and based on the user's finger simply resting upon, and not pressing or otherwise activating, the button or switch. In some embodiments, a detected touch of a corresponding interactable element is implemented as the detected hover, where the detected touch does not activate the corresponding interactable element, for example, based on the corresponding interactable element being activated via a gesture, and based on the user's finger simply resting upon the interactable element, and not performing the gesture.

In various embodiments, generating the hover detection data includes measuring a plurality of changes in capacitance for a plurality of locations corresponding to a plurality of interactable elements, and further includes identifying the interactable element from the plurality of interactable elements based on having a greatest change in capacitance of the plurality of changes in capacitance.

In various embodiments, the method includes generating capacitance image data based on the sensed signal data. The hover detection data can indicate the detected hover in proximity to the interactable element based on a location of a detected hover region of the capacitance image data overlapping with a location of the interactable element.

In various embodiments, the at least one circuit includes an RX circuit in proximity to the interactable element. Generating the hover detection data can includes identifying a frequency of an occupancy area ID signal in the sensed signal data based on the occupancy area ID signal being propagated through a human body of the user. The occupancy area ID signal can be transmitted via an ID circuit, for example, integrated within the user's chair.

In various embodiments, the at least one circuit includes a sensor circuit in an occupancy location that includes the user. Generating the hover detection data includes identifying a frequency of a vehicle location ID signal in the sensed signal data based on the vehicle location ID signal being propagated through a human body of the user. The frequency of the vehicle location ID signal can uniquely identify the interactable element from other interactable elements. The sensor circuit can optionally be integrated within the user's chair.

In various embodiments, the at least one circuit includes a plurality of drive sense circuits (DSCs) of a plurality of row electrodes and a plurality of column electrodes. Each of the plurality of drive sense circuits can transmit a signal upon one of a corresponding plurality of electrodes. The interactable element can optionally be implemented as some or all of a touch screen, touchpad, keypad, or touch sensor device that includes the plurality of drive sense circuits, the plurality of row electrodes and the plurality of column electrodes.

In various embodiments, the interactable element includes a single button touch area of a plurality of button touch areas formed at intersections of the plurality of row electrodes and the plurality of column electrodes. In various embodiments, interactable element includes a graphical image data of a virtual button displayed via a touch screen display that includes the plurality of row electrodes and the plurality of column electrodes.

In various embodiments, the at least one circuit includes a button circuit for the interactable element, and wherein the button circuit transmits a signal upon a corresponding electrode. The corresponding electrode can be implemented as the interactable element. In various embodiments, the at least one circuit includes a plurality of button circuits for a plurality of parallel electrodes. The hover detection data can indicate the interactable element based on detecting a hover over a corresponding one of the plurality of parallel electrodes.

In various embodiments, the button feedback display data graphically displays a name of a vehicle function associated with the interactable element and/or an icon denoting the vehicle function associated with the interactable element.

In various embodiments, the interactable element is one of a plurality of interactable elements. The method can further include generating subsequent hover detection data indicating a detected hover in proximity to a second interactable element of the vehicle based on subsequently received sensed signal data. The method can further include generating subsequent button feedback display data indicating the second interactable element based on the hover detection data. The method can further include facilitating display of the subsequent button feedback display data. For example, the first interactable element is not activated by the user, and the user moves their hand to hover over the second interactable element instead, based on the user viewing the button feedback display data and realizing they are inadvertently hovering over the wrong button. In various embodiments, the plurality of interactable elements are in close physical proximity, for example, all within a same 6 inch by 6 inch panel. In various embodiments, the user's hand obstructs the user's view of some or all of the plurality of interactable elements when hovering over a given interactable element.

In various embodiments, the method includes detecting a touch-based interaction with the interactable element after facilitating display of the button feedback display data. The method can further include facilitating performance of at least one vehicle functionality based on detecting the touch-based interaction with the interactable element. In various embodiments, detecting the touch-based interaction includes receiving subsequent sensed signal data from the at least one circuit, and further includes generating indication detection data identifying the touch-based interaction based on the subsequent sensed signal data. In various embodiments, detecting the touch-based interaction includes receiving at least one signal from another circuit that is different from the at least one circuit. In various embodiments, detecting the touch-based interaction includes receiving at least one signal from a button circuit of the interactable element denoting activation of the interactable element based on the user touching, pushing, or otherwise activating a corresponding button, switch, or other type of interactable element via touch.

In various embodiments, the display device is one of: a heads-up display, a front center console display, or a dashboard display. In various embodiments, the interactable element is located on one of: a driver door of the vehicle, a front center console of the vehicle, a steering wheel of the vehicle, or a dashboard of the vehicle.

In various embodiments, the display device is in view of the user when facing forward to view a road through a front windshield of the vehicle while driving the vehicle. In various embodiments, the interactable element is not in view of the user when facing forward to view the road through the front windshield of the vehicle while driving the vehicle. Alternatively or in addition, the interactable element is not in view of the user when hovering over the interactable element via their hand.

In various embodiments, facilitating display of the button feedback display data via the display device includes at least one of: sending the button feedback display data to the display device for display, or rendering the button feedback display data as graphical image data displayed via the display device.

In various embodiments, a sensor system includes a display device located in a first vehicle location, a plurality of circuits corresponding to a plurality of interactable elements located in a second vehicle location, and a computing entity. The computing entity can be operable to receive sensed signal data from at least one circuit of the plurality of circuits based on a user in proximity to at least one electrode corresponding to the at least one circuit; generate hover detection data indicating a detected hover in proximity to one of the plurality of interactable elements; generate button feedback display data indicating the interactable element based on the hover detection data; and/or facilitate display of the button feedback display data via the display device.

In various embodiments, a sensor system includes a display device located in a first vehicle location, a plurality of circuits corresponding to a plurality of interactable elements located in a second vehicle location, and a computing entity. The computing entity can be operable to: receive sensed signal data from at least one circuit of the plurality of circuits based on a user in proximity to at least one electrode corresponding to the at least one circuit; generate interaction detection data indicating a detected interaction in proximity to one of the plurality of interactable elements; generate button feedback display data indicating the interactable element based on the interaction detection data; and/or facilitate display of the button feedback display data via the display device.

In various embodiments, the plurality of interactable elements are implemented as: a set of parallel electrodes via some or all features and/or functionality of FIGS. 42 and 43A; a set of button touch areas of a keypad 4415 via some or all features and/or functionality of FIGS. 44A-44F; some or all portions of a touchpad 4615 via some or all features and/or functionality of FIGS. 46A-46C; some or all portions of a touch sensor device via some or all features and/or functionality of FIGS. 47A-47G; one or more graphically displayed buttons displayed via a display, such as a display of a touch screen implemented as a touch sensor device via some or all features and/or functionality of FIGS. 47A-47G; one or more buttons having button circuits 112; and/or any other type of button or other interactable element.

In various embodiments, the plurality of electrodes are implemented as: one or more button electrodes 505 of one or more button circuits 112; a set of parallel electrodes, such as parallel electrodes of FIGS. 42 and 43A; a set of row electrodes 4422 and column electrodes 4424 of a keypad 4415 of FIGS. 44A-44F; a set of row electrodes 4422 and column electrodes 4424 of a touchpad 4615 of FIGS. 46A-46C; a set of row electrodes 4422 and column electrodes 4424 of a touch screen or other touch sensor device of FIGS. 47A-47G; one or more RX electrodes 119 in proximity to the plurality of interactable elements; one or more electrodes 207 and/or 209 of one or more sensor circuits 215 and/or one or more receivers 216; and/or other electrodes and/or other sensors.

Figure 93A:
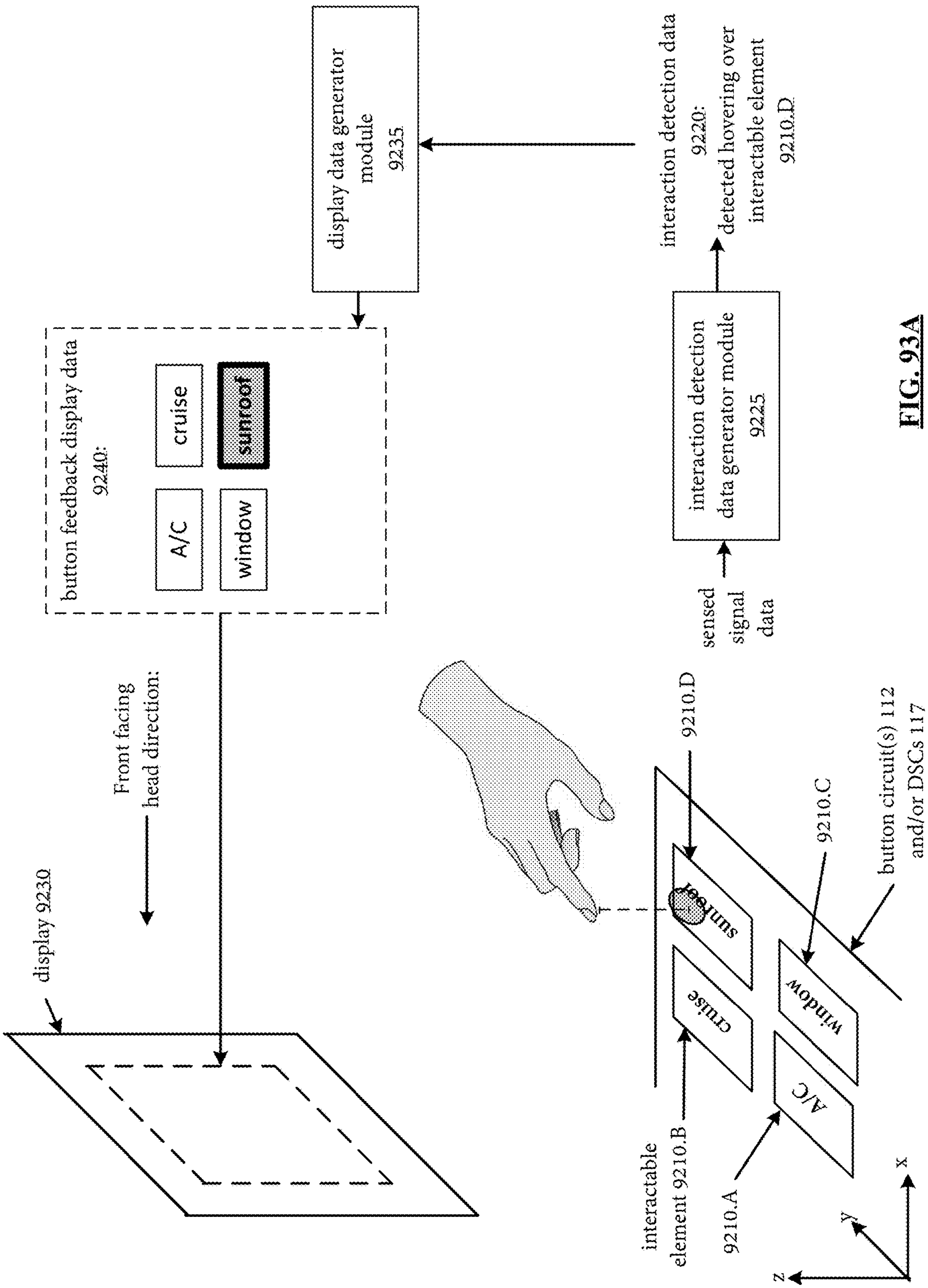
FIG. 93A is an illustration of generation of example button feedback display data based on detected interaction with interactable elements in accordance with various embodiments.
Figure 93B:
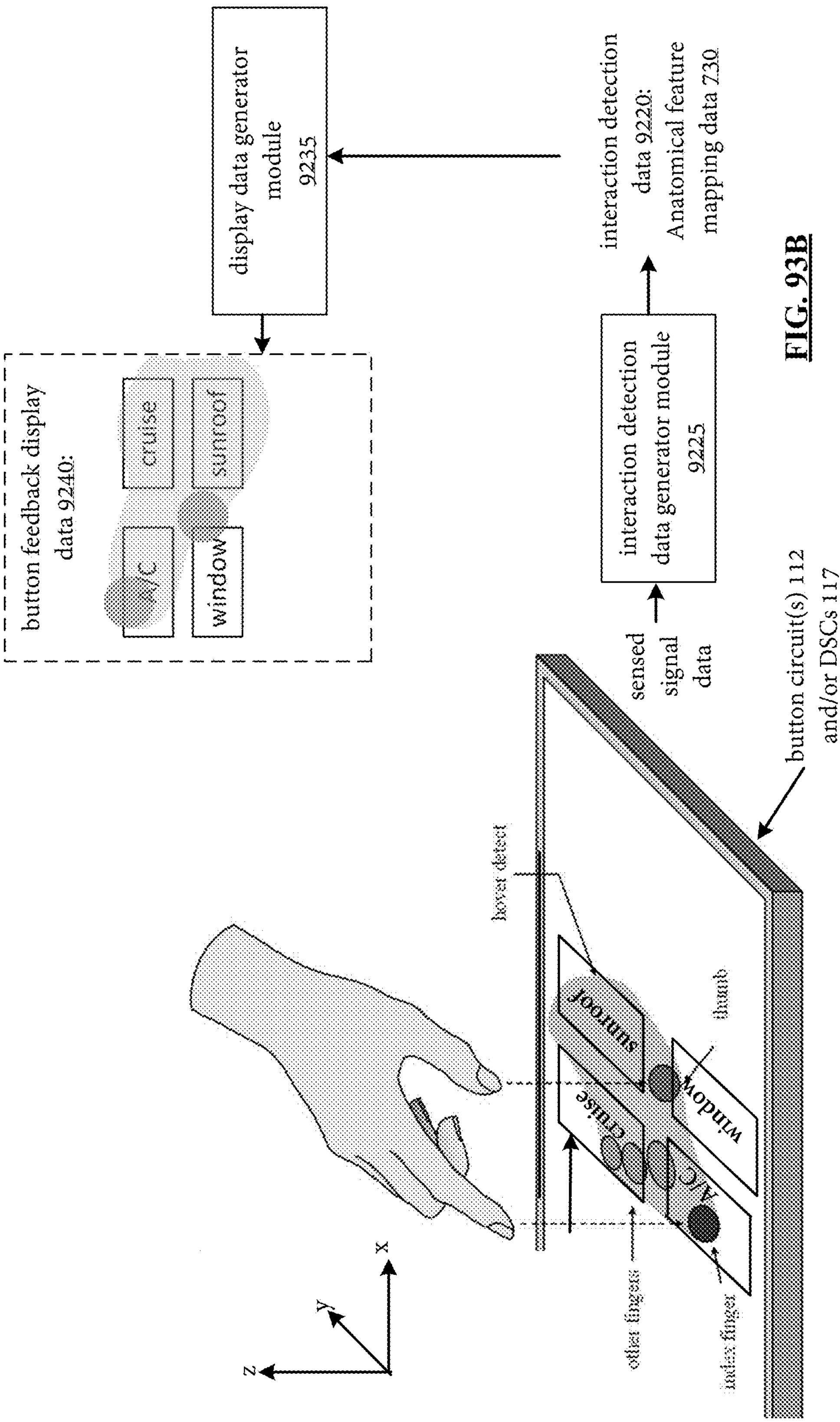
FIG. 93B is an illustration of generation of example button feedback display data based on detected interaction with interactable elements in accordance with various embodiments.

FIGS. 93A and 93B illustrate embodiments of generating and displaying button feedback display data 9240 that indicates a hover, or other touch-based and/or touchless indication detected in indication detection data 9220 based on sensed signal data, based on graphically depicting the hover or selection in relation to the spatial arrangements of a set of interactable elements 9210. Some or all features and/or functionality of the button feedback display data 9240 of FIGS. 93A and/or 93B can be utilized to implement the button feedback display data 9240 of FIG. 92A.

In the example of FIG. 93A, the button feedback display data 9240 depicts the set of interactable elements to represent their spatial arrangement on a corresponding panel or surface. In this case, the buttons all lie on a plane parallel to the x-y plane, where the button feedback display data is displayed by a display on and/or is projected onto the y-z plane. The spatial arrangements of the buttons on the x-y plane with respect to the user's position (e.g. if they were to look down at the buttons from their seat), can be depicted as the graphical display of the set of buttons on the z-y plane with respect to the user's position (e.g. if they were to look forward at the display from their seat).

Other planes can include the set of interactable elements and/or the display in other embodiments, where these planes are optionally non-orthogonal, and/or where the corresponding surfaces are optionally not flat. The plane or other surface that includes the displayed button feedback display data 9240 can correspond to a windshield surface upon which the button feedback display data 9240 is projected and/or a display device of a front center console, back of a headrest, or a dashboard. The plane or other surface that includes the set of buttons can be a button panel, keypad, touchpad, touch screen, or other surface on a door, on a steering wheel, on a dashboard, on a front center console, or in another location.

Displaying spatial information denoting the detected user position (e.g. position of hovering or touching finger) in proximity to a set of buttons can be useful in enabling the user to move their finger to the intended position without looking down (e.g. the user in this example wishes to roll down the window, and knows to move their finger to the left of its current position based on the button feedback display data 9240 highlighting, displaying in a different color, or otherwise denoting that they are detected to be currently hovering over the sunroof button, and not the other buttons). In some embodiments, when the user is hovering over none of the buttons, the button feedback display data 9240 can indicate that no buttons are hovered over and/or can optionally a detected position of the hand in relation to the set of buttons (e.g. indicate that the finger/hand is detected to be to the right of all of the buttons, and that the user should thus move their hand/finger to the left to interact with any of the buttons)

FIG. 93B illustrates another example of button feedback display data 9240 that visually conveys spatial information denoting the detected user position in proximity to a set of buttons. Instead of or in addition to simply highlighting or otherwise distinguishing which button is currently hovered over in relation to the other buttons as illustrated in FIG. 93A, the button feedback display data 9240 can indicate the position and/or orientation of the hand, such as the detected location of particular fingers and/or the palm, based on generating anatomical feature mapping data 730 as part of generating the interaction detection data 9220. This can include displaying raw and/or modified anatomical feature mapping data 730, such as an illustration of a hand shape and/or individual fingers in relation to the spatial button arrangement, rather than a full heat map. The user can view the position of their hand in relation to the set of buttons to determine how to orient their hand and/or particular fingers accordingly to select the appropriate button.

Figure 93C:
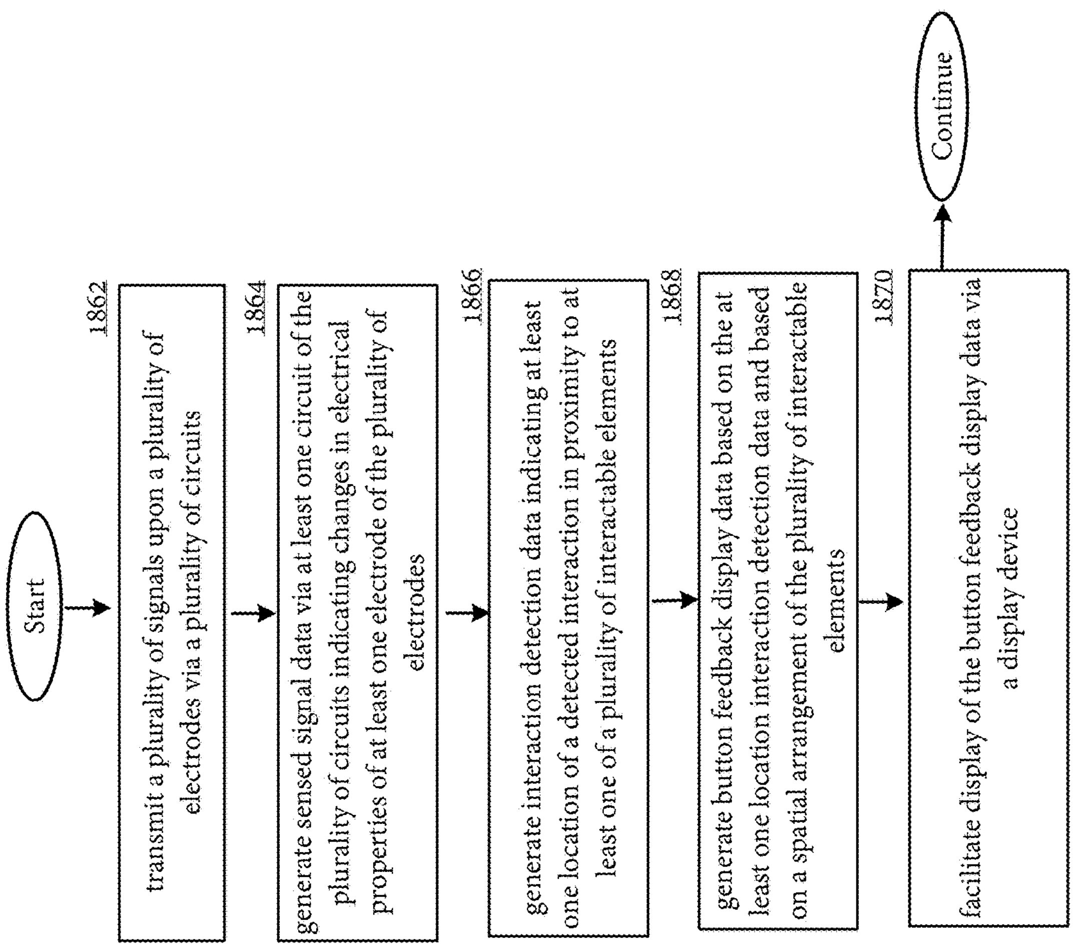
FIG. 93C is a logic diagram of an example of a method for execution in accordance with various embodiments.

FIG. 93C is a logic diagram illustrating a method of generating and displaying button feedback display data based on detected interactions with buttons and/or electrodes, for example, based on implementing some or all functionality discussed in conjunction with FIGS. 93A-93B. Some or all of the method of FIG. 93C can be performed via a vehicle computing entity 150 at least one button circuit 112, and/or at least one DSC 117, for example, based on some or all functionality discussed in conjunction with one or more of FIGS. 1-48B. Some or all of the method of FIG. 93C can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 93C can be performed based on performing the method of FIGS. 13B, 19B, 43B, 44D, 48B, and/or 84D. Some or all of the method of FIG. 93B can be performed based on performing one or more steps of the method of FIG. 92B, and/or of any other method described herein.

Step 1862 includes transmitting a plurality of signals upon a plurality of electrodes via a plurality of circuits. In various embodiments, the at least one circuit can include at least one button circuit 112, The plurality of circuits can include at least one button circuit 112, at least one sensor circuit 116, at least one RX circuit 119, at least one DSC 117, and/or at least one other circuit. The plurality of electrodes can be utilized to implement a plurality of interactable elements and/or can be in proximity to a plurality of interactable elements.

Step 1864 includes generate sensed signal data via at least one circuit of the plurality of circuits indicating changes in electrical properties of at least one electrode of the plurality of electrodes. The changes in electrical properties can indicate changes in impedance, self-capacitance, and/or mutual-capacitance.

Step 1866 includes generating interaction detection data indicating at least one location of a detected interaction in proximity to at least one of a plurality of interactable elements. For example, the at least one location denotes an identified one of the plurality of interactable elements, such as an interactable elements being touched by, engaged by, and/or hovered over by a hand or finger of the user.

The identified one of the plurality of interactable elements can be based on an electrode location or cross point location indicated in the sensed signal data with change in capacitance that exceeds a touchless threshold and/or touch-based threshold. The identified one of the plurality of interactable elements can be based on an electrode location or cross point location indicated in the sensed signal data with change in capacitance that exceeds measured change in capacitance of electrode locations or cross point locations of all other ones of the plurality of electrodes. The at least one location can alternatively or additionally indicate a location of one or more fingers or other anatomical elements of one or more hands indicated in anatomical feature mapping data generated in conjunction with the interaction detection data.

The plurality of interactable elements can be implemented as virtual or physical buttons in close physical proximity. The plurality of interactable elements can be implemented as buttons in a same vehicle location, such as a same door panel, a dashboard, a front center console, or a steering wheel.

Step 1868 includes generating button feedback display data based on the at least one location identified in the interaction detection data and/or based on a spatial arrangement of the plurality of interactable elements. In various embodiments, the button feedback display data can visually indicate the spatial arrangement of the plurality of interactable elements based on displaying a spatially arranged set of visual depictions of the plurality of interactable elements. In various embodiments, spatial arrangement of the plurality of interactable elements can be rotated and/or undergo a coordinate transformation based on a plane that includes the plurality of interactable elements being different from a plane that includes a corresponding display device, and/or based on a viewing perspective of the driver with respect to the plurality of interactable elements and the corresponding display device. In various embodiments, the button feedback display data can visually indicate the at least one location, for example, by visually indicating and/or differentiating the identified one of the plurality of interactable elements from a spatially arranged set of visual depictions of the plurality of interactable elements, and/or can visually indicate one or more detected fingers or other body parts of the anatomical feature mapping data in relation to the spatially arranged set of visual depictions of the plurality of interactable elements.

Step 1870 includes facilitating display of the button feedback display data via a display device. the display device can be implemented via a heads-up display, a front center console display, or other display. The display device is optionally in a different vehicle location that the plurality of interactable elements. The display device is optionally in an optimal view point of a corresponding user, for example, where the user is a driver and can see the display device without turning away from the road. The plurality of interactable elements are optionally in a non-optimal view point of a corresponding user, for example, where the user is a driver and cannot see the plurality of interactable elements unless they turn away from the road.

Figure 94A:
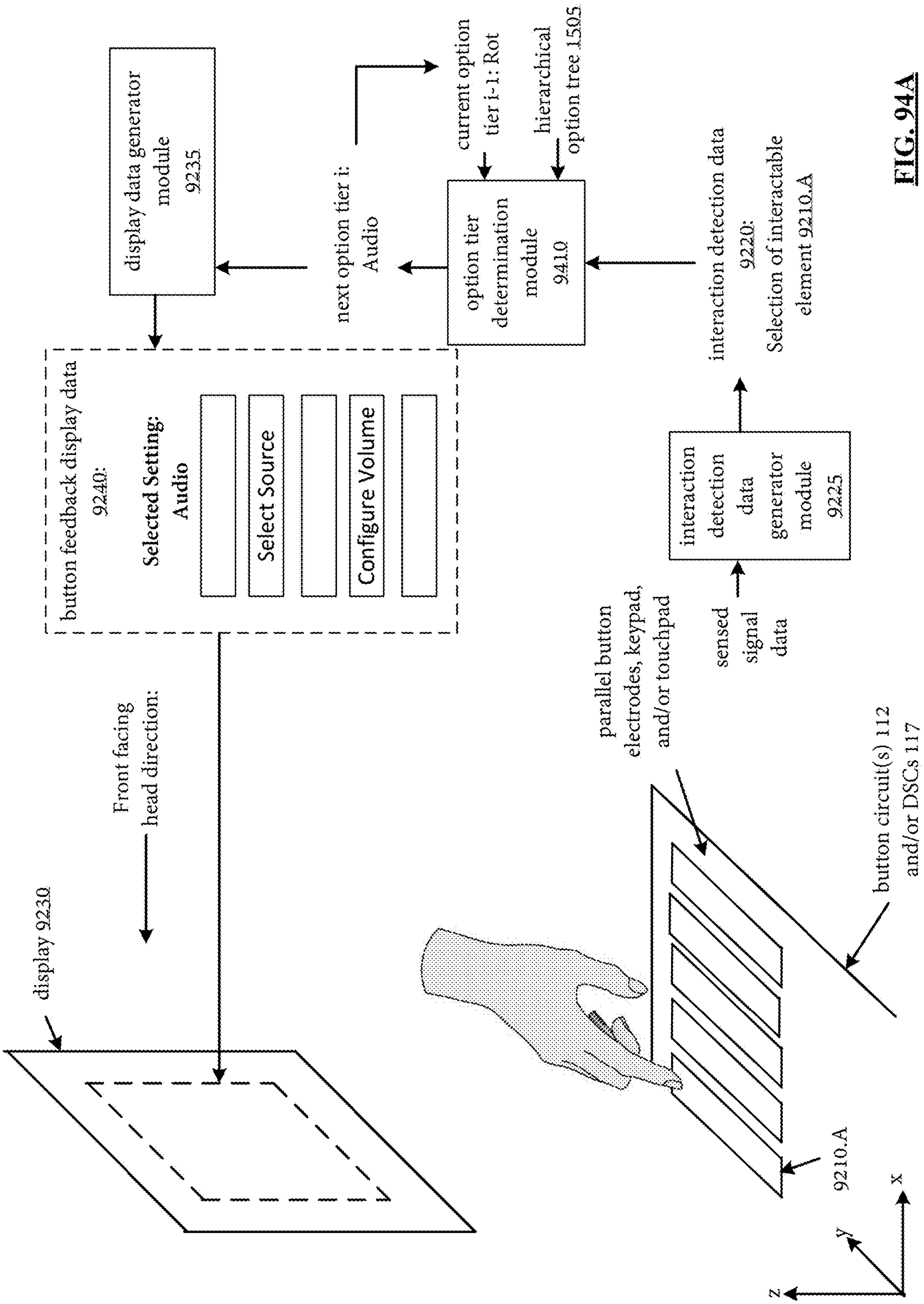
FIG. 94A is an illustration of generation of example button feedback display data based on detected interaction with interactable elements in accordance with various embodiments.
Figure 94B:
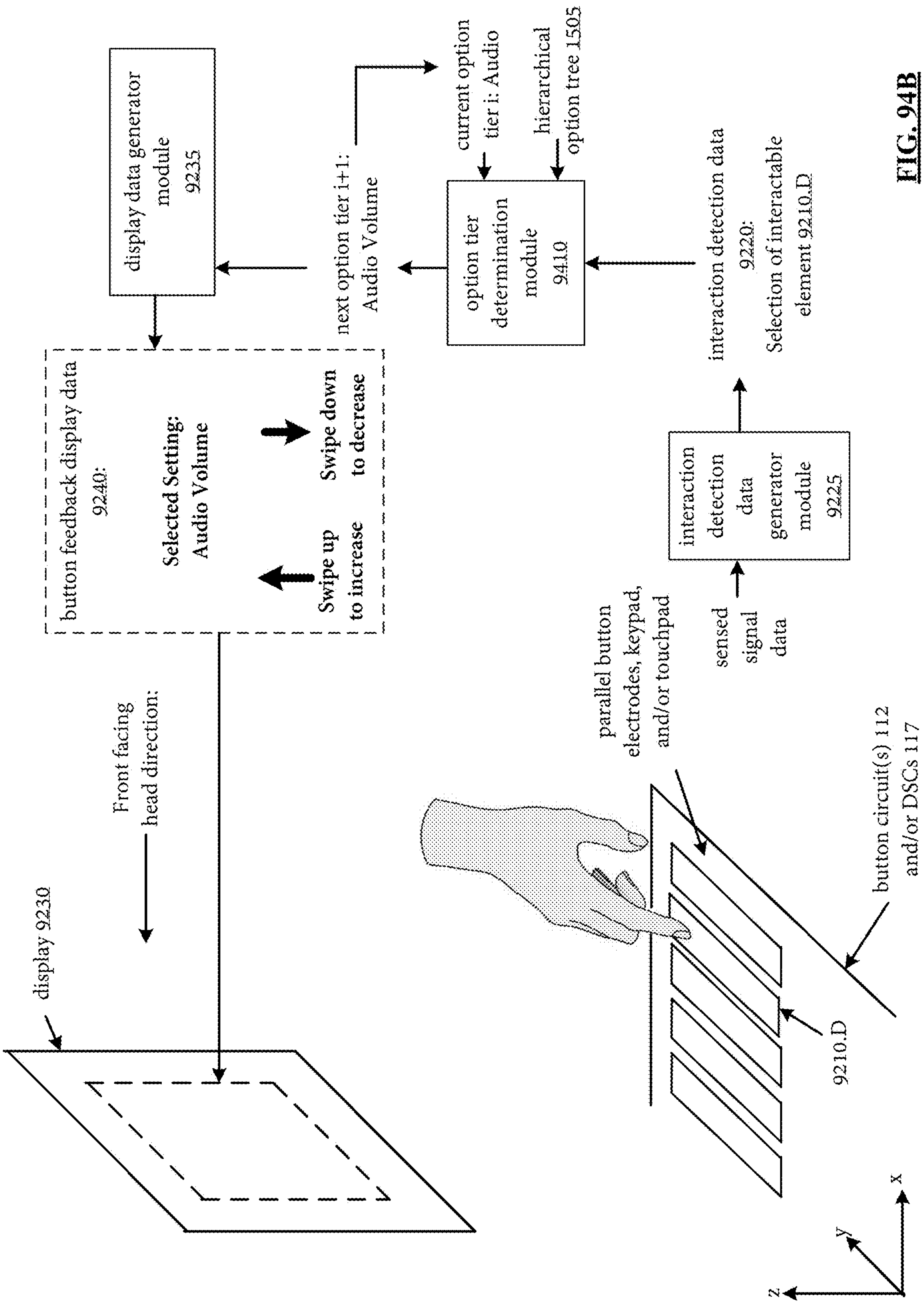
FIG. 94B is an illustration of generation of example button feedback display data based on detected interaction with interactable elements in accordance with various embodiments.

FIGS. 94A-94B illustrate an embodiment of generating and displaying button feedback display data 9240 that indicates information for a current option tier 1510 of a hierarchical option tree 1505. Some or all features and/or functionality of the button feedback display data 9240 of FIGS. 94A and/or 94B can be utilized to implement the button feedback display data 9240 of FIG. 92A.

In particular, for a given current option tier 1510, the set of functions and/or corresponding set of indication types can be indicated. In cases where indication types for the given option tier include interactions with a particular interactable element, this can include indicating the interactable elements, for example, spatially as illustrated in FIGS. 93A and/or 93B. In cases where indication types include gestures, this can include indicating the gestures, for example, via text and/or via a picture or animation of a hand and/or finger performing the gesture.

As the user performs indication types to traverse through a corresponding hierarchical option tree 1505 as discussed in conjunction with FIGS. 48A and/or 48B, the button feedback display data 9240 can be updated to denote progression to the next tier, and to indicate the new set of options accordingly. The current tier and/or updates to the current tier can be determined via an option tier determination module 9410, which can be implemented via the vehicle computing entity 150 and/or any processing module. The option tier determination module 9410 can process the interaction detection data 9220 to determine the next option tier based on knowledge of the hierarchical option tree 1505 and/or the current option tier, for example stored in memory and/or temporarily saved. As each new option tier is reached via detection of a corresponding indication type in the interaction detection data, the current option tier is updated accordingly as this next option tier. The option tier determination module 9410 can be implemented to perform some or all features and/or functionality discussed in conjunction with FIGS. 48A and/or 48B.

In the example of FIG. 94A, the button feedback display data 9240 denotes the current option tier 1510 as the audio option tier of the example hierarchical option tree 1505 of FIG. 48A, and thus indicates that the user can select whether to select an audio source or to configure the volume. For example, this current option tier is displayed based on being determined by the option tier determination module 9410, for example, based on having detected selection of the audio option in the root option tier 1510 of the example hierarchical option tree 1505 based on detecting the user selection of interactable element 9210.A in the interaction detection data and based on the selection of interactable element 9210.A being the indication type for selecting to configure audio in the root option tier. In some embodiments, the button feedback display data 9240 optionally displayed the respective options for the root option tier previously to aid the user in performing the appropriate indication type to select to configure audio.

The respective buttons in a set of parallel electrodes to be selected for each respective option is displayed in accordance with the spatial arrangements of these buttons. Note that in other embodiments, any other set of buttons and/or electrodes is implemented alternatively to a set of parallel electrodes. In other embodiments, the audio option tier can optionally have more options and/or can have indication types corresponding to gestures rather than button selections. The button feedback display data 9240 can optionally further indicate the detected location of the user's hand and/or finger as discussed in conjunction with FIGS. 93A-93C.

In the example of FIG. 94B, the button feedback display data 9240 denotes the current option tier 1510 as the audio volume option tier of the example hierarchical option tree 1505 of FIG. 48A. For example, the button feedback display data 9240 of FIG. 94B is displayed after the button feedback display data 9240 of FIG. 94A based on having detected selection of the audio volume option in the audio option tier 1510 based on detecting the user selection of interactable element 9210.D in the interaction detection data and based on the selection of interactable element 9210.D being the indication type for selecting to configure audio in the root option tier. For example, the user selected interactable element 9210.D based on viewing and interpreting the button feedback display data 9240 of FIG. 94A, and thus determining to tap on the fourth parallel button electrode due to their desire to configure audio volume. The audio volume option tier involves either swiping up or down to increase or decrease volume. While not depicted, the user can view interpret these instructions for volume configuration to subsequently perform a swipe up or down over the set of electrodes that is detected in subsequent interaction detection data 9220 to cause the vehicle computing entity to turn the volume up or down accordingly.

Figure 94C:
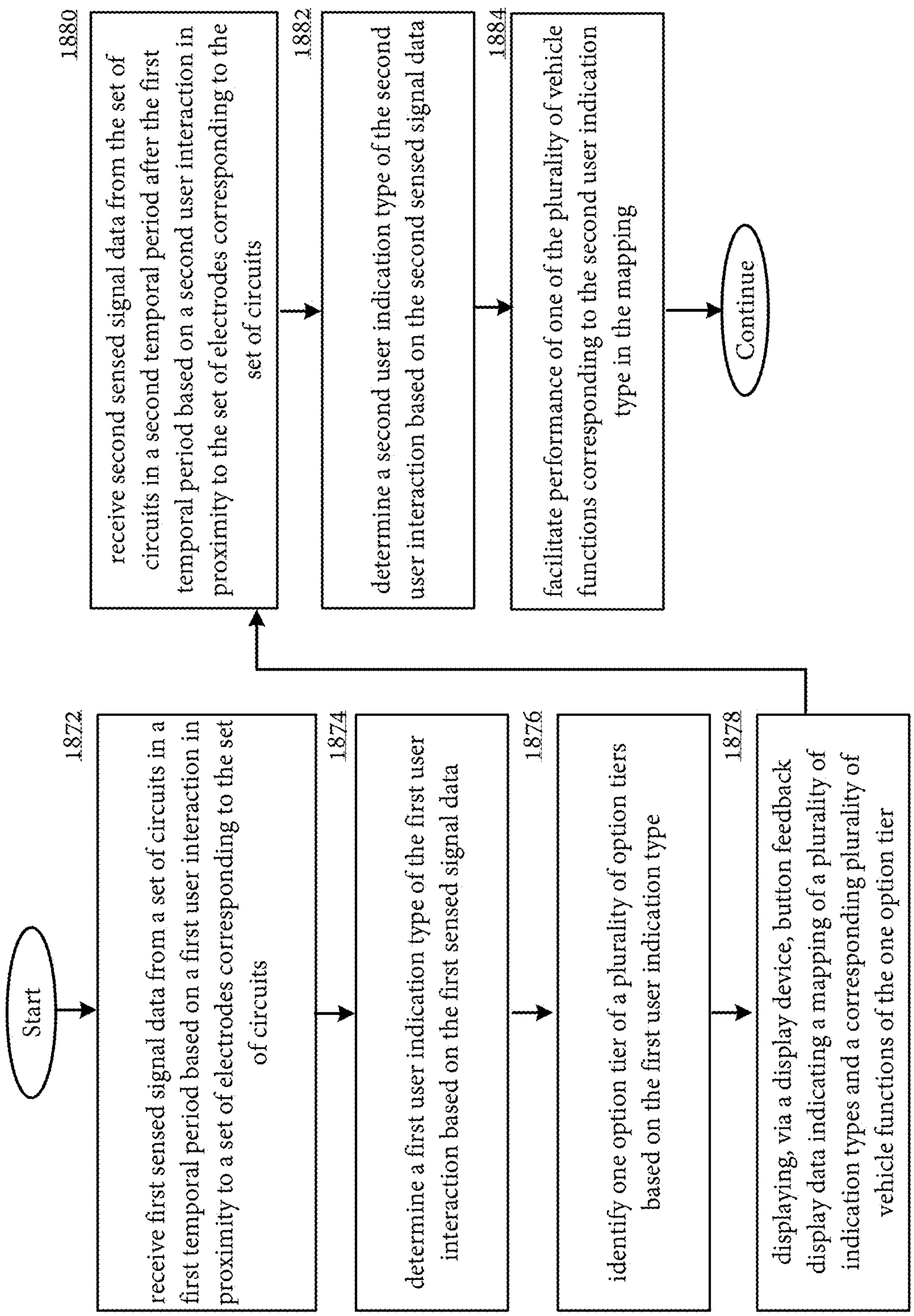
FIG. 94C is a logic diagram of an example of a method for execution in accordance with various embodiments.

FIG. 94C is a logic diagram illustrating a method of generating and displaying button feedback display data based on detected interactions with buttons and/or electrodes, for example, based on implementing some or all functionality discussed in conjunction with FIGS. 94A-94B. Some or all of the method of FIG. 94C can be performed via a vehicle computing entity 150 at least one button circuit 112, and/or at least one DSC 117, for example, based on some or all functionality discussed in conjunction with one or more of FIGS. 1-48B. Some or all of the method of FIG. 94C can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 94C can be performed based on performing the method of FIGS. 13B, 19B, 43B, 44D, and/or 48B Some or all of the method of FIG. 94C can be performed based on performing one or more steps of the method of FIG. 92B, FIG. 93C, and/or of any other method described herein.

Step 1872 includes receiving first sensed signal data from at least one of a set of circuits in a first temporal period based on a first user interaction in proximity to a set of electrodes corresponding to the set of circuits. In various embodiments, the at least one circuit can include at least one button circuit 112, at least one sensor circuit 116, at least one RX circuit 119, at least one DSC 117, and/or another circuit. The method can further include transmitting at least one signal via the at least one circuit upon the at least one electrode. The changes in electrical properties can indicate changes in impedance, self-capacitance, and/or mutual-capacitance.

Step 1874 includes determining a first user indication type of the first user interaction based on the first sensed signal data. For example, the first user indication type is identified as one of a set of different indication types of a current option tier of a hierarchical option tree. The indication type can be a touch-based and/or touchless gesture by a user interacting with at least one interactable element implemented by at least one of the set of circuits.

Step 1876 includes identifying one option tier of a plurality of option tiers based on the first user indication type. For example, step 1876 is performed based on a current option tier and the hierarchical option tree indicating the one option tier as extending from the first user indication type in the current option tier.

Step 1878 includes displaying, via a display device, button feedback display data indicating a mapping of a plurality of indication types and a corresponding plurality of vehicle functions of the one option tier. In various embodiments, the display device can be a front center console, heads-up display, or other display device in view of a user performing the first indication type. The plurality of indication types and a corresponding plurality of vehicle functions can be indicated in hierarchical option tree data. The plurality of indication types and a corresponding plurality of vehicle functions can be different from other mappings corresponding to other option tier of the plurality of option tiers, where different button feedback display data indicating a different mapping is displayed if the user indication type of the first user interaction is a different one of a corresponding plurality of indication types corresponding to the plurality of option tiers.

Step 1880 includes receiving second sensed signal data from the set of circuits in a second temporal period after the first temporal period based on a second user interaction in proximity to the set of electrodes corresponding to the set of circuits. Step 1882 includes determining a second user indication type of the second user interaction based on the second sensed signal data. Step 1884 includes facilitating performance of one of the plurality of vehicle functions corresponding to the second user indication type in the mapping. For example, the user performs the second user interaction type in the second temporal period based on selecting and performing one of the plurality of indication types displayed in the button feedback display data based on the user viewing the button feedback display data and based on selecting one of the set of vehicle functions they intend to be performed.

In various embodiments, the display device previously displayed prior button feedback display data indicating a prior mapping of a plurality of indication types and a corresponding plurality of vehicle functions of the prior option tier. For example, the user performs the first user interaction type in the first temporal period based on selecting and performing one of the plurality of indication types displayed in the prior button feedback display data based on the user viewing the prior button feedback display data and based on selecting the one of the plurality of option tiers that corresponds to the vehicle functionality they intend to be performed.

Figure 95A:
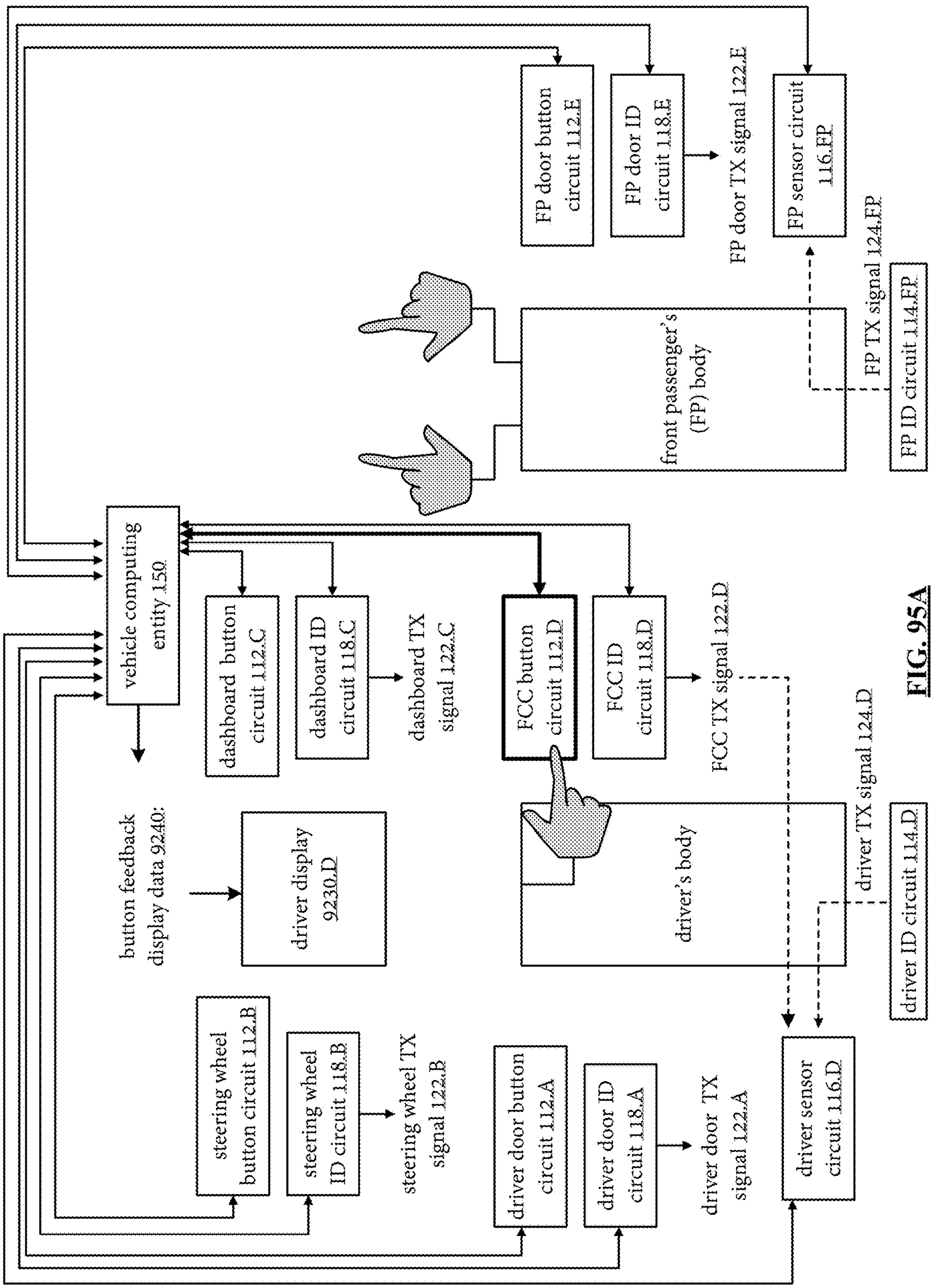
FIG. 95A is a schematic block diagram illustrating display of button feedback display data via a driver display in accordance with various embodiments.
Figure 95B:
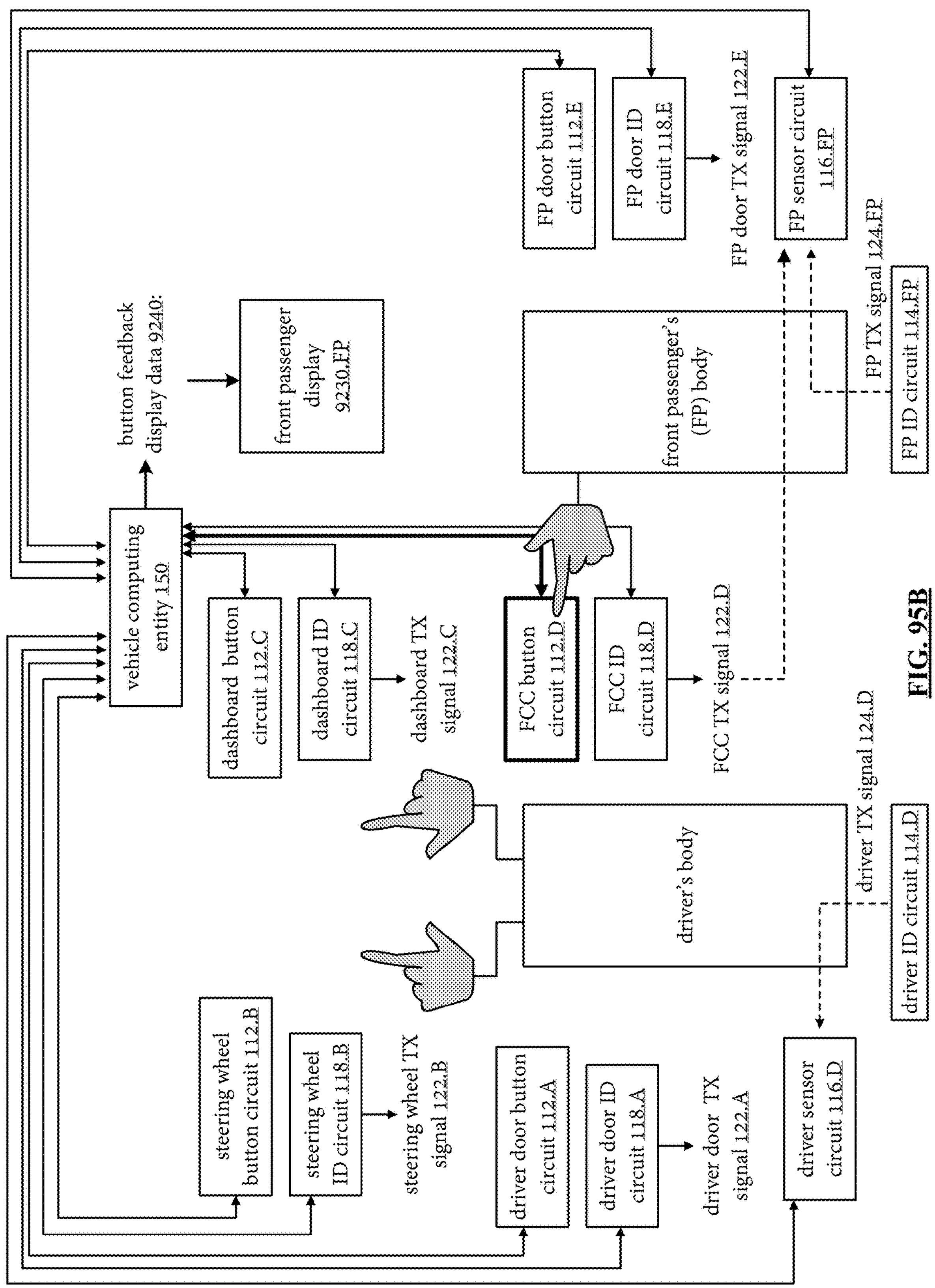
FIG. 95B is a schematic block diagram illustrating display of button feedback display data via a front passenger display in accordance with various embodiments.

FIGS. 95A and 95B illustrate an example embodiment of displaying button feedback display data 9240 on a selected one of a set of displays based on further detecting which user of a plurality of users performed the interaction. For example, as discussed in conjunction with FIGS. 1-33, a vehicle sensor system can be implemented to enable detection of which occupancy area 102 contains the user detected to interact with buttons or other interactable elements. The vehicle sensor system can further be operable to utilize this detection to intelligently select one of a set of different displays to display corresponding button feedback display data 9240, such as any embodiment of button feedback display data 9240 of FIGS. 92A-94C. Some or all features and/or functionality of displaying the button feedback display data 9240 of FIGS. 95A-95B can be utilized to implement the display of the button feedback display data 9240 of FIG. 92A.

In the example of FIG. 95A, the driver interacts with a front center console button. This button interaction is detected based on a corresponding button circuit 112.D, and the driver is detected to be the occupant that interacted with his button based on the driver sensor circuit 116.D receiving the driver sensor circuit 116.D receiving the front center console TX signal 122.D based on being propagated through the user's body due the user's interaction with the button circuit 112.D that is in proximity to an electrode of the front center console ID circuit 118, for example, in a same or similar fashion as discussed in conjunction with FIGS. 20A and 20B. Alternatively or in addition, the driver is detected to be the occupant that interacted with his button based on an RX circuit 119 in proximity to the button and/or the button circuit 112 itself detecting the driver TX signal as discussed previously. Other detected interactions such as hovering over and/or touching buttons or interactable elements in different locations within the car; performing touchless and/or touch-based gestures; and/or other gestures and/or indication types discussed herein can similarly be detected to be performed by a user in a particular occupant area, and/or by particular person based on a user ID signal 126.U.

As illustrated in FIG. 95A, based on detecting the detected interaction is performed by the driver, the vehicle computing device can display the button feedback display data 9240 upon a driver display 9230.D associated with driver. For example, the driver display 9230.D is a heads-up display projected upon the windshield for view by the driver, and optionally not other passengers. As another example, the driver display 9230.D is a display on the dashboard, display on the front center console, or other display that can be viewed by an occupant in the driver occupant area, and that is optionally not-viewable and/or more difficult to view by some or all occupants of other occupant areas.

As illustrated in FIG. 95B, based on detecting the detected interaction, for example, with the same or different buttons and/or via a same or different gesture, is performed by the front passenger, the vehicle computing device can display the button feedback display data 9240 upon a front passenger display 9230.FP associated with front passenger. For example, the front passenger display 9230.FP is a heads-up display displayed for view by the front passenger, and optionally not other passengers. As another example, the front passenger display 9230.FP is a display on the front center console, or other display that can be viewed by an occupant in the front passenger occupant area, and that is optionally not-viewable and/or more difficult to view by some or all occupants of other occupant areas. The front passenger display 9230.FP can be distinct from the driver display 9230.D.

While not illustrated in FIG. 95A or 95B, rear passengers can optionally have their own display areas, such as display areas on seat backs of the driver seat and front passenger seat, or other display areas for their view via their occupancy areas. Their detected interactions can similarly render button feedback display data 9240 being displayed via their own display devices.

While not illustrated in FIG. 95A or 95B, multiple occupants may optionally be interacting with buttons and/or be performing gestures simultaneously (e.g. the driver sets cruise control while the front passenger enters a navigation destination and while a rear passenger lowers their window). Some or all occupant's interactions can be detected as being performed by the respective occupant, where their respective displays only display button feedback display data 9240 with respect to their own interactions (e.g. a driver display device such as a driver heads-up display indicates detection of a gesture for setting cruise control while a different, front passenger display device such as a front center console display indicates detection of button interaction with a touch screen of the front center console display while a different, rear passenger display device such as a seat-back display indicates hovering near a button corresponding to lowering the window).

In some embodiments, a front center console display device, such as a touch screen in the front center console area, can detect and process touch and/or touchless interactions by both the driver and front passenger, based on being in proximity to both occupancy areas. While it can be useful for both the driver and passenger to see this display (e.g. enabling the passenger to help the driver navigate based on displaying navigation instructions), it can be unsafe for the driver to look at and interact with the front center console for prolonged periods of time. However, it may be unfavorable for interactions to be displayed only by the driver heads-up display, as the front passenger is unable to see this information.

In some embodiments, the front passenger display is operable to be mirrored by the driver heads-up display, where some or all portions and/or information conveyed by the graphical display data of the front passenger display at a given time is projected as graphical image data for view in the driver's heads up display. However, rather than the driver tediously being interrupted with such mirroring in their view when a passenger is interacting with the front center console display (e.g. as they search for nearby gas stations or peruse through their music library, which could be distracting to the driver), the front center console optionally operable to only mirror information upon the driver heads-up display when the driver is detected to be interacting with the front center console. Such embodiments are discussed in further detail in conjunction with FIG. 95D.

For example, when a driver interacts with a front center console touchscreen display to enter cruise control, navigate home, etc., corresponding button feedback display data 9220, such as a mirrored layout of the front center console display, can be presented via the driver's heads-up display based on detection of the interaction and further based on detecting the driver as the user performing the interaction. This can assist the driver in being able to navigate menus/view selection confirmations, etc. while not necessitating they look away from the road, where the button feedback display data 9220 assists the driver in making appropriate selections on appropriate portions of the front center console touchscreen while looking at the heads-up display, and not the display of the front center console, based on implementing functionality described in conjunction with some or all of FIGS. 92A-94C. The front center console touchscreen updates its display based on user interaction (e.g. presents next set of menu options, displays a map of the navigation, etc.) in addition to the driver heads-up display displaying some or all of this information to the driver, enabling the front passenger and/or other passengers to also view this information.

When a front passenger or other non-driver passenger interacts with this same touchscreen (or other same interactable element), the non-driver is detected as performing the interaction rather than the driver, and the driver heads-up display does not display button feedback display data 9220 and/or the front center console display is not mirrored on another display. For example, the front center console display is sufficient for front passenger interaction, as the front passenger need not need to focus on the road, where the front center console display displays menus, virtual buttons, information, etc. for interaction by the front passenger that need not be mirrored elsewhere during the front passenger's interaction (e.g. as the front passenger selects a playlist to be played or selects a fast food establishment on route to update the navigation). Furthermore, as the driver is not detected as the person interacting with the front center console touchscreen at this time themselves, they are not burdened by corresponding button feedback display data 9220/other menu data/etc. in their heads-up display to limit unnecessary distraction while driving.

Figure 95C:
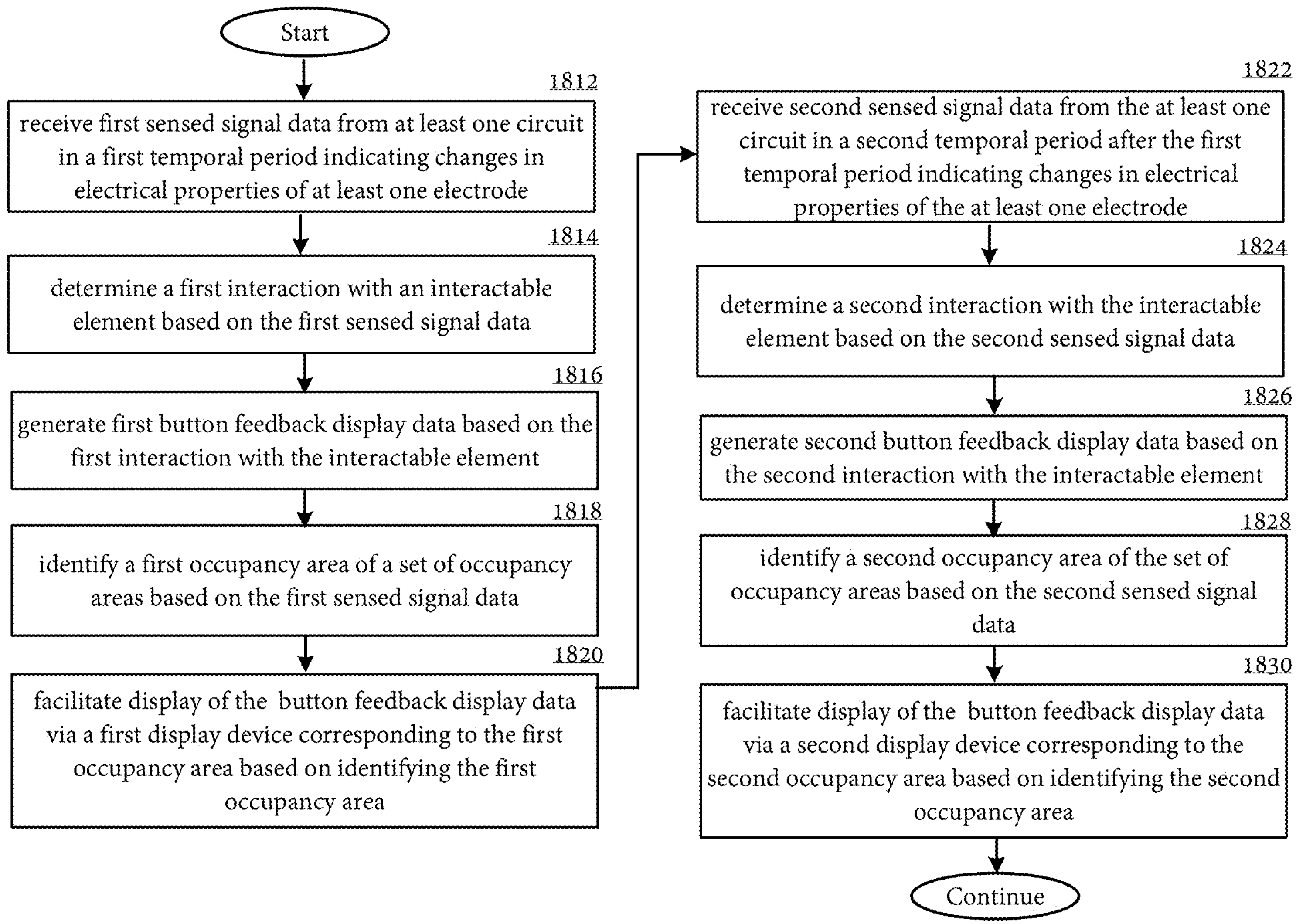
FIG. 95C is a logic diagram of an example of a method for execution in accordance with various embodiments.

FIG. 95C is a logic diagram illustrating a method of generating and displaying button feedback display data based on detected interactions with buttons and/or electrodes, for example, based on implementing some or all functionality discussed in conjunction with FIGS. 95A-95B. Some or all of the method of FIG. 95C can be performed via a vehicle computing entity 150 at least one button circuit 112, and/or at least one DSC 117, for example, based on some or all functionality discussed in conjunction with one or more of FIGS. 1-48B. Some or all of the method of FIG. 95C can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 95C can be performed based on performing the method of FIGS. 13B, 19B, 21A, 43B, 44D, and/or 48B Some or all of the method of FIG. 95C can be performed based on performing one or more steps of the method of FIG. 92B, FIG. 93C, FIG. 94C, and/or of any other method described herein.

Step 1812 includes receiving first sensed signal data from at least one circuit in a first temporal period indicating changes in electrical properties of at least one electrode. In various embodiments, the at least one circuit can include at least one button circuit 112, at least one sensor circuit 116, at least one RX circuit 119, at least one DSC 117, and/or another circuit. The method can further include transmitting at least one signal via the at least one circuit upon the at least one electrode. The changes in electrical properties can indicate changes in impedance, self-capacitance, and/or mutual-capacitance.

Step 1814 includes determining a first interaction with an interactable element based on the first sensed signal data. For example, the changes in electrical properties are based on a user touching and/or hovering over the interactable element. The at least one electrode can optionally be integrated in or in proximity to the interactable element.

Step 1816 includes generating first button feedback display data based on the first interaction with the interactable element. For example, the first button feedback display data indicates the first interaction, indicates a selected one of a set of options, indicates a hover over or selection of an option, indicates a subsequent one of a set of option, displays data in accordance with performing a vehicle functionality based on the first interaction denoting a command to perform the vehicle functionality, or indicates other information relating to the detected first interaction with the interactable element.

Step 1818 includes identifying a first occupancy area of a set of occupancy areas based on the first sensed signal data. For example, the first sensed signal data identifies a frequency corresponding to the occupancy area based on an occupancy area ID signal being propagated through a user within the first occupancy area. As another example, the first sensed signal data identifies a frequency corresponding to the interactable element based on an ID signal being propagated through a user within the first occupancy area.

Step 1820 includes facilitating display of the button feedback display data via a first display device corresponding to the first occupancy area based on identifying the first occupancy area. For example, the first display device is included in the first occupancy area or provides an optimal viewing angle by users sitting in the first occupancy area, and not other occupancy areas. The button feedback display data is optionally only displayed via the first display device, and not other display devices of other occupancy areas. In various embodiments, the first display device is implemented via a heads-up display of the first occupancy area.

Step 1822 includes receiving second sensed signal data from the at least one circuit in a second temporal period after the first temporal period indicating changes in electrical properties of the at least one electrode. Step 1824 includes determine a second interaction with the interactable element based on the first sensed signal data. Step 1826 includes generating second button feedback display data based on the second interaction with the interactable element.

Step 1828 includes identifying a second occupancy area of the set of occupancy areas based on the second sensed signal data. The second occupancy area can be different from the first occupancy area of the set of occupancy areas, for example, based on a first user in the first occupancy area performing the first interaction, and based on a second user in the second occupancy area performing the second interaction.

Figure 95D:
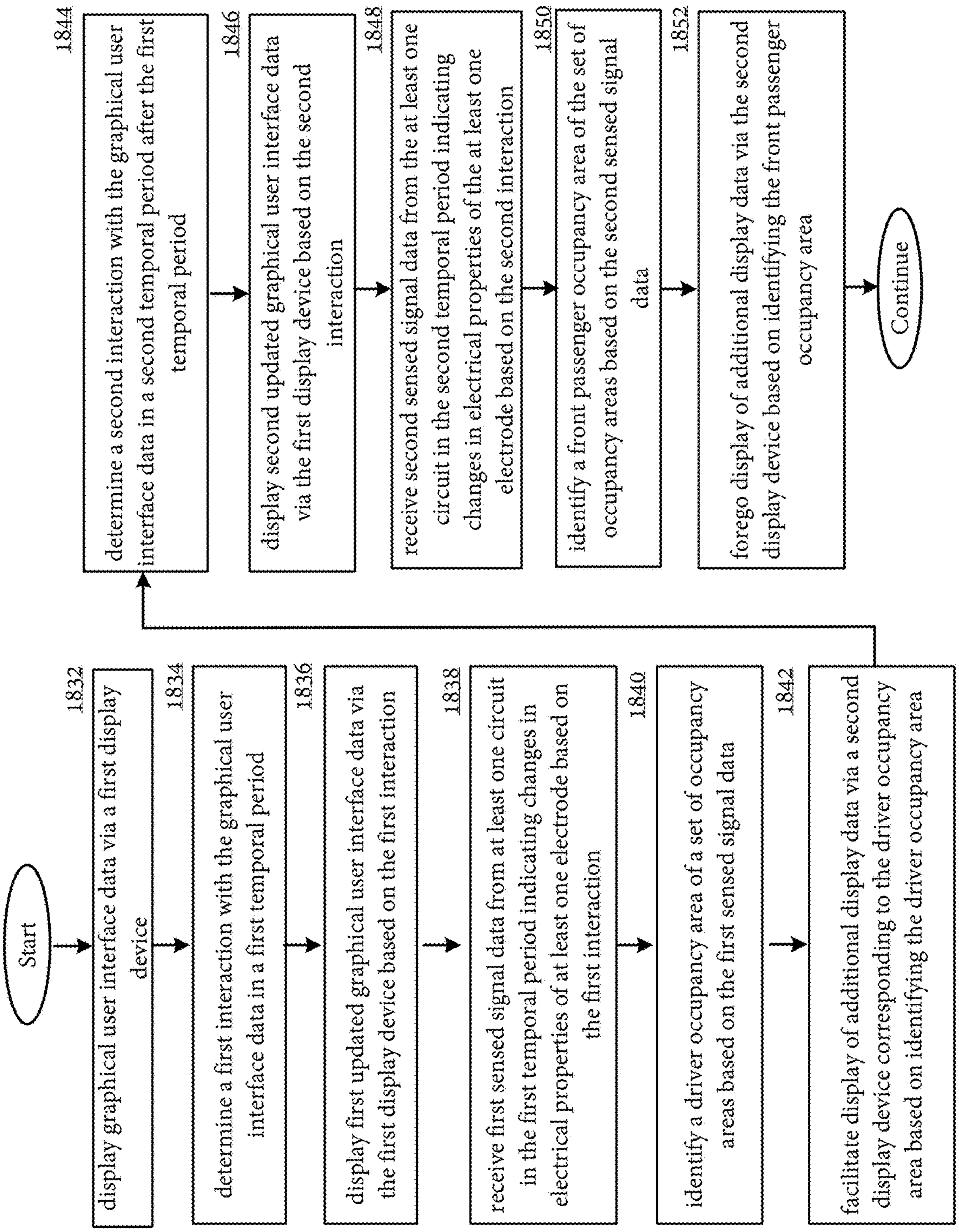
FIG. 95D is a logic diagram of an example of a method for execution in accordance with various embodiments.

Step 1830 includes facilitating display of the button feedback display data via a second display device corresponding to the second occupancy area based on identifying the second occupancy area. The second display device can be different from the first display device. In various embodiments, the second display device is implemented via a heads-up display of the second occupancy area. In various embodiments, the second display device is implemented via front center console display. The front center console display can be between the first occupancy area and the second occupancy area FIG. 95D is a logic diagram illustrating a method of generating and displaying button feedback display data based on detected interactions with buttons and/or electrodes, for example, based on implementing some or all functionality discussed in conjunction with FIGS. 95A-95B. Some or all of the method of FIG. 95D can be performed via a vehicle computing entity 150 at least one button circuit 112, and/or at least one DSC 117, for example, based on some or all functionality discussed in conjunction with one or more of FIGS. 1-48B. Some or all of the method of FIG. 95D can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 95D can be performed based on performing the method of FIGS. 13B, 19B, 21A, 43B, 44D, and/or 48B Some or all of the method of FIG. 95C can be performed based on performing one or more steps of the method of FIG. 92B, FIG. 93C, FIG. 94C, FIG. 95C, and/or of any other method described herein.

Step 1832 includes displaying graphical user interface data via a first display device. For example, the first display device is a front center console display of a vehicle. As another example, the first display device is viewable and/or in proximity to both a first user in a driver occupancy area and a second user in a front passenger occupancy area.

Step 1834 includes determining a first interaction with the graphical user interface data in a first temporal period. For example, the first interaction is via a button in proximity to the first display device, is a touch and/or touchless interaction with the first display device, and/or corresponds to any other indication type described herein. In various embodiments, the first display device implements a touchscreen. In various embodiments, the first display device can implement a plurality of row electrodes and column electrodes having a plurality of DSCs that are operable to detect the first interaction.

Step 1836 includes displaying first updated graphical user interface data via the first display device based on the first interaction. For example, the first updated graphical user interface data is based on performing a vehicle functionality based on a vehicle command associated with the first interaction. The first updated graphical user interface data can include button feedback display data. The first updated graphical user interface data can include navigation data, music playlist data or other entertainment data, an option tier of options based on the first interaction denoting a selection from a parent option tier, menu data, or other display data corresponding to prompts for vehicle configuration or performance of vehicle functionality.

Step 1838 includes receiving first sensed signal data from at least one circuit in the first temporal period indicating changes in electrical properties of at least one electrode based on the first interaction. The at least one circuit can include at least one button circuit 112, at least one sensor circuit 116, at least one RX circuit 119, at least one DSC 117, and/or another circuit. The method can further include transmitting at least one signal via the at least one circuit upon the at least one electrode. The changes in electrical properties can indicate changes in impedance, self-capacitance, and/or mutual-capacitance. The least one circuit can be implemented to further detect the first interaction, and/or the first interaction is detected via at least one other circuit.

Step 1840 includes identifying a driver occupancy area of a set of occupancy areas based on the first sensed signal data. For example, the first sensed signal data identifies a frequency corresponding to the driver occupancy area based on an occupancy area ID signal being propagated through a driver within the driver occupancy area. As another example, the first sensed signal data identifies a frequency corresponding to the first display and/or a corresponding vehicle location based on an ID signal being propagated through a driver within the driver occupancy area. The signal can propagate through the driver's body based on the driver having performed the first interaction.

Step 1842 includes facilitating display of additional display data via a second display device corresponding to the driver occupancy area based on identifying the driver occupancy area. The second display device can be included in the driver occupancy area and/or can provide optimal viewing by the driver sitting in the driver occupancy area. The second display device can be different from the first display device. The second display device can be implemented as a driver heads-up display in the driver occupancy area for view by the driver of the driver occupancy area.

The additional display data can include and/or be based on some of all of the first updated graphical user interface data. For example, the second display device displays the additional display data to facilitate mirroring of some or all of the updated graphical user interface data displayed by the first display device. The additional display data can alternatively or additionally include any type of button feedback display data described herein corresponding to the first interaction by the driver. In various embodiments, the driver views the additional interface data to facilitate continued interaction with the graphical user interface of the first display device.

Step 1844 includes determining a second interaction with the graphical user interface data in a second temporal period after the first temporal period. Step 1846 includes displaying second updated graphical user interface data via the first display device based on the second interaction. Step 1848 includes receiving second sensed signal data from the at least one circuit in the second temporal period indicating changes in electrical properties of the at least one electrode based on the second interaction.

Step 1850 includes identifying a front passenger occupancy area of the set of occupancy areas based on the second sensed signal data. for example, the driver occupancy area is determined for the first interaction and the front passenger occupancy area is determined for the second interaction based on a first user in the first occupancy area performing the first interaction, and based on a second user in the second occupancy area performing the second interaction.

Step 1852 includes forego display of additional display data via the second display device based on identifying the front passenger occupancy area. For example, the front passenger views the second updated graphical user interface data to facilitate continued interaction with the graphical user interface of the first display device.

FIGS. 96A-99D present embodiments of a steering wheel 136. For example, steering wheel 136 is implemented as a steering wheel of a vehicle, such as the vehicle implementing a vehicle sensor system described herein. The steering wheel 136 can be held and turned by a driver of the vehicle to enable the driver to operate the vehicle and/or turn the vehicle while the vehicle is in motion. The steering wheel 136 can be included in and/or can be in proximity to the driver occupancy area 102.D.

The steering wheel 136 can include one or more interaction detection regions 9620 that enable detection of user interaction with the steering wheel to enable performance of at least one vehicle functionality. For example, one or more interaction detection regions 9620 of the steering wheel 136 are implemented as one or more electrodes of one or more corresponding vehicle button circuits 112, sensor circuits 215, RX circuits 119, sensor circuits 116.D, and/or DSCs 117. Electrodes of the one or more interaction detection regions 9620 can otherwise have capacitive and/or impedance changes detected as described previously by corresponding circuits, where sensed signal data indicates these changes and is processed via a vehicle computing entity 150 or other processing module to detect corresponding button interaction or other indication types described herein; detect touches and/or hovers; detect touch-based and/or touchless gestures; generate anatomical feature mapping data; and/or otherwise detect user interaction with and/or in proximity to these portions of the steering wheel.

The detected interactions can be distinguished as being driver interactions, rather than interactions by other passengers and/or by intermittent objects such as the driver's shirt sleeve, water droplets, other objects, etc. based on: implementing at least one steering wheel ID circuit 118.B that transmits a signal at a corresponding frequency detected by a driver sensor circuit 116.D in the driver's seat or in the driver occupancy area 102.D as discussed previously; and/or implementing at least one steering wheel RX circuit 119.B that detects a frequency of a driver ID signal transmitted by a driver ID circuit 114.D in the driver's seat or in the driver occupancy area 102.D as discussed previously.

The detected interactions can be processed to cause the vehicle processing system to facilitate performance of a vehicle functionality, such as any vehicle setting configuration or other vehicle functionality described herein. The detection interactions can optionally be detected in interaction detection data 9220 of FIGS. 92A-95D to enable display of corresponding button feedback display data 9240, for example, in the driver's heads-up display, on a dashboard display, and/or on a front center console display.

Figure 96A:
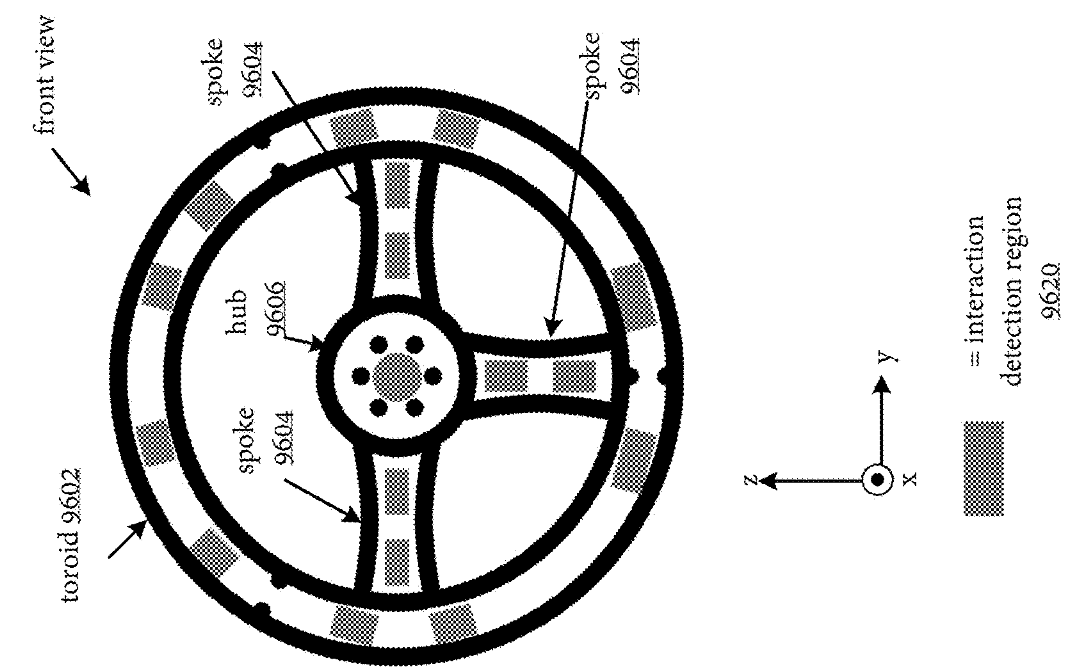
FIGS. 96A-96C illustrate an example embodiment of a steering wheel that includes one or more interaction detection regions in accordance with various embodiments.
Figure 96B:
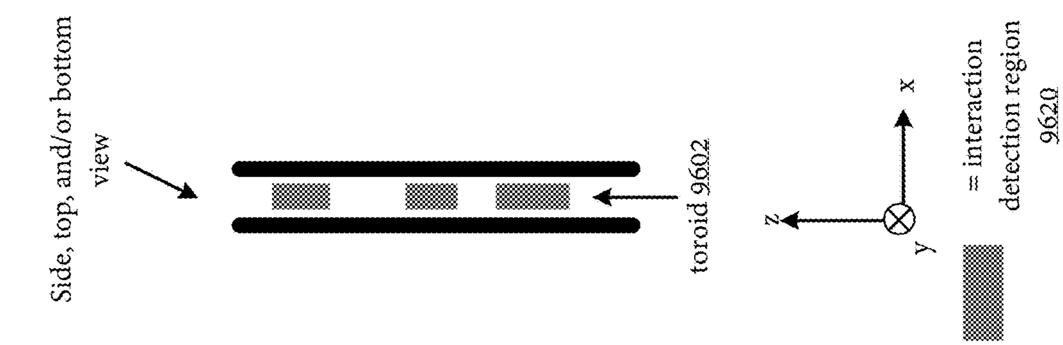
Figure 96C:
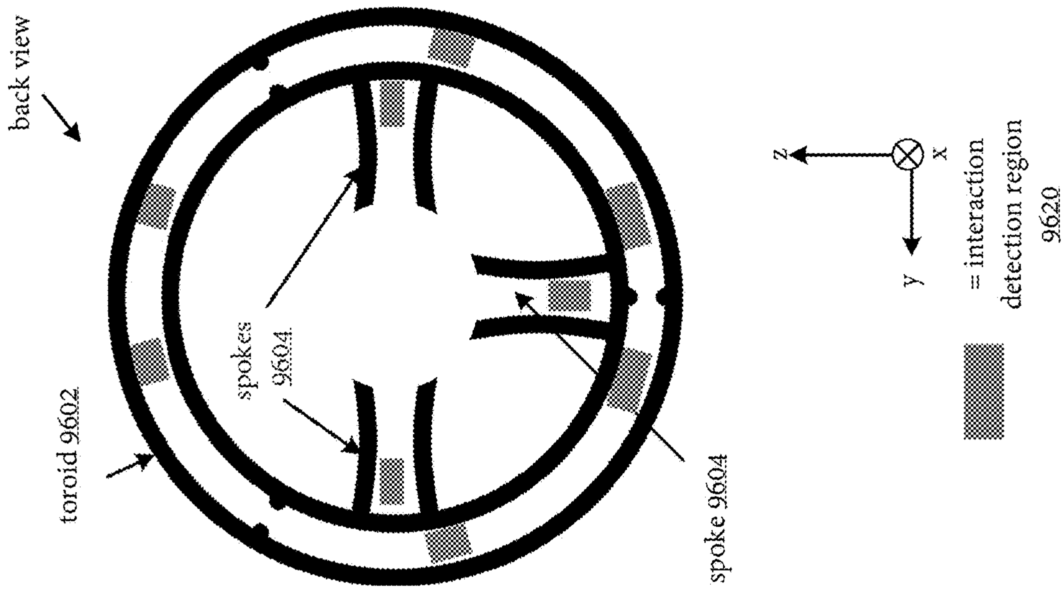

FIGS. 96A-96C present an example embodiment of a steering wheel 136 that includes a plurality of distinct interaction detection regions 9620 integrated within and/or upon different locations of the steering wheel.

FIG. 96A presents a two-dimensional front view of such an embodiment of the steering wheel 136, such as the view from the driver's seat. FIG. 96B presents a two-dimensional side view orthogonal to the front view of such an embodiment of the steering wheel 136, such as the view from the driver's window, the roof, the floor, or any side view of the toroid of the steering wheel 136. FIG. 96C presents a two-dimensional back view opposite the front view of such an embodiment of the steering wheel 136, such as the view from the front windshield.

As illustrated in FIGS. 96A-96C, one or more interaction detection regions 9620 can be positioned on: the front, sides, and/or back of a toroid 9602 of the steering wheel 136; the front, top, bottom, and/or back of one or more spokes 9604 of the steering wheel 136; the front and/or sides of a center hub 9606 of the steering wheel 136; and/or any other portion of the steering wheel and/or on other elements in proximity to the steering wheel that can detect the driver's hands and/or fingers upon the steering wheel; the driver's legs and/or knees under the steering wheel; the driver's chest in front of the steering wheel; other parts of the human body in proximity to any part of the steering wheel surface; or other object's in proximity to any part of the steering wheel surface.

In some embodiments, some or all interaction detection regions 9620 can be implemented as a single button of a single button circuit 112, for example, via one or more electrodes. Alternatively or in addition, each interaction detection region 9620 can be implemented as a set of parallel electrodes and/or grid of row and column electrodes to enable detection of multiple different indication types, such as different gestures. Some or all electrodes of interaction detection regions 9620 can be contoured to the curved surface of the steering wheel as discussed in conjunction with FIG. 96G.

Interaction with different interaction detection regions 9620 can be distinguished and utilized to induce corresponding functionality. For example, touching and/or hovering over different interaction detection regions 9620 can be detected to cause the vehicle computing entity different corresponding functionality. Performing different indication types, such as different gestures, in different interaction detection regions 9620 can be detected to cause the vehicle computing entity different corresponding functionality. Touching and/or hovering over a given interaction detection region 9620 via a same indication type while the vehicle is in different vehicle status and/or states described herein be detected to cause the vehicle computing entity different corresponding functionality dictated based on the current detected vehicle status (e.g. a given interaction detection regions 9620 is used for mirror configuration while in park and is used to set cruise control while in drive).

In some embodiments, a given interaction detection region 9620 can optionally be implemented via its own hierarchical option tree 1505 that is different from hierarchical option trees 1505 of other interaction detection regions 9620 (e.g. one interaction detection region 9620 on the steering wheel has a root option tier 1510 corresponding to audio configuration options for traversal, where all types of interactions are utilized to configure audio settings; and another interaction detection region 9620 in a different location has a root option tier 1510 corresponding to driving controls, where all types of interactions are utilized to configure driving control settings such as cruise control, four wheel drive, smart mode, sport mode, etc.).

In some embodiments, the locations of various distinct interaction detection region 9620 correspond to locations likely to be at and/or near locations where a user rests their hands or fingers while driving, or easily in reach of their hands and/or fingers. In some embodiments, different interaction detection regions 9620 are implemented as different buttons, for example, for different fingers.

Figure 96D:
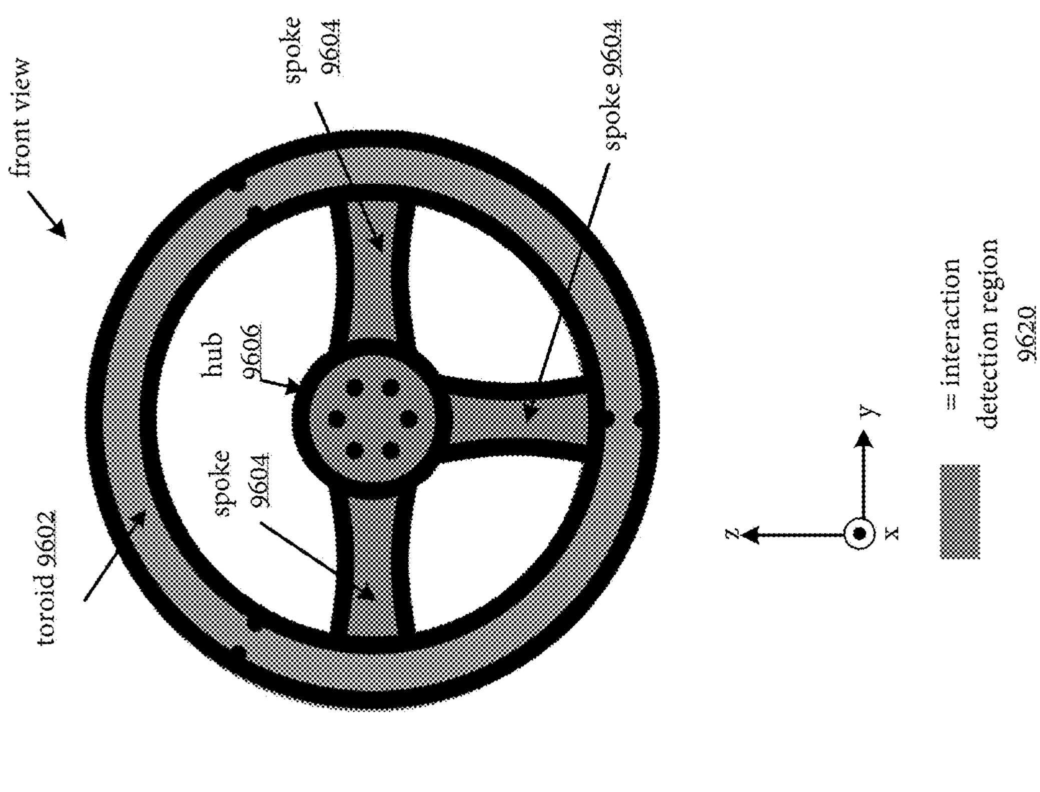
FIGS. 96D-96F illustrate another example embodiment of a steering wheel that includes one or more interaction detection regions in accordance with various embodiments.
Figure 96E:
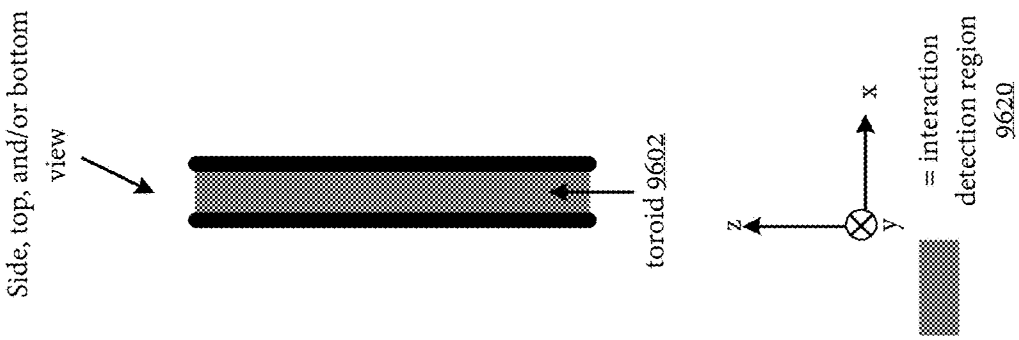
Figure 96F:
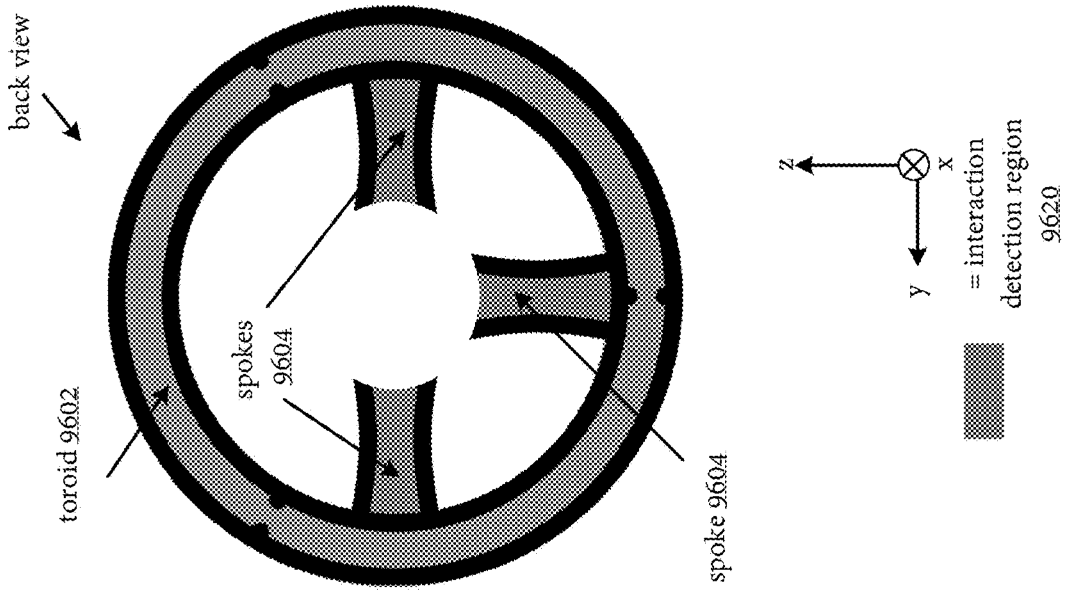

FIGS. 96D-96F present another example embodiment of a steering wheel 136 that includes one or more continuous interaction detection regions 9620 integrated within and/or upon some or all different locations of the steering wheel, rather than the discrete, separated detection regions 9620 of FIGS. 96A-96C.

FIG. 96D presents a two-dimensional front view of such an embodiment of the steering wheel 136, such as the view from the driver's seat. FIG. 96E presents a two-dimensional side view orthogonal to the front view of such an embodiment of the steering wheel 136, such as the view from the driver's window, the roof, the floor, or any side view of the toroid of the steering wheel 136. FIG. 96F presents a two-dimensional back view opposite the front view of such an embodiment of the steering wheel 136, such as the view from the front windshield.

Such an embodiment can be ideal in embodiments where some or all of the interaction detection regions 9620 on the toroid 9602, on one or more spokes 9604, and/or on the center hub 9606 are implemented as multiple proximal electrodes with corresponding button circuits and/or DSCs where, such as multiple parallel electrodes and/or a grid of electrodes, where changes in mutual-capacitance and/or self-capacitance can be detected to identify individual electrodes and/or cross-points of electrodes that are touched by or hovered over by a part of the body, enabling: detection of which locations upon the steering wheel are interacted with; generation of capacitance image data 233 for the steering wheel surface; generation of gesture identification data 825 for touch-based and/or touchless gestures proximal to the steering wheel surface; generation of anatomical feature mapping data 730 denoting whether the left or right hand is detected, identifying and denoting location of one or more particular fingers of the hand or other parts of the hand, identifying and denoting location of one parts of a particular finger, and/or identifying and denoting hand and/or finger orientation and movements; and/or other data based on sensed signal data as discussed herein.

Figure 96G:
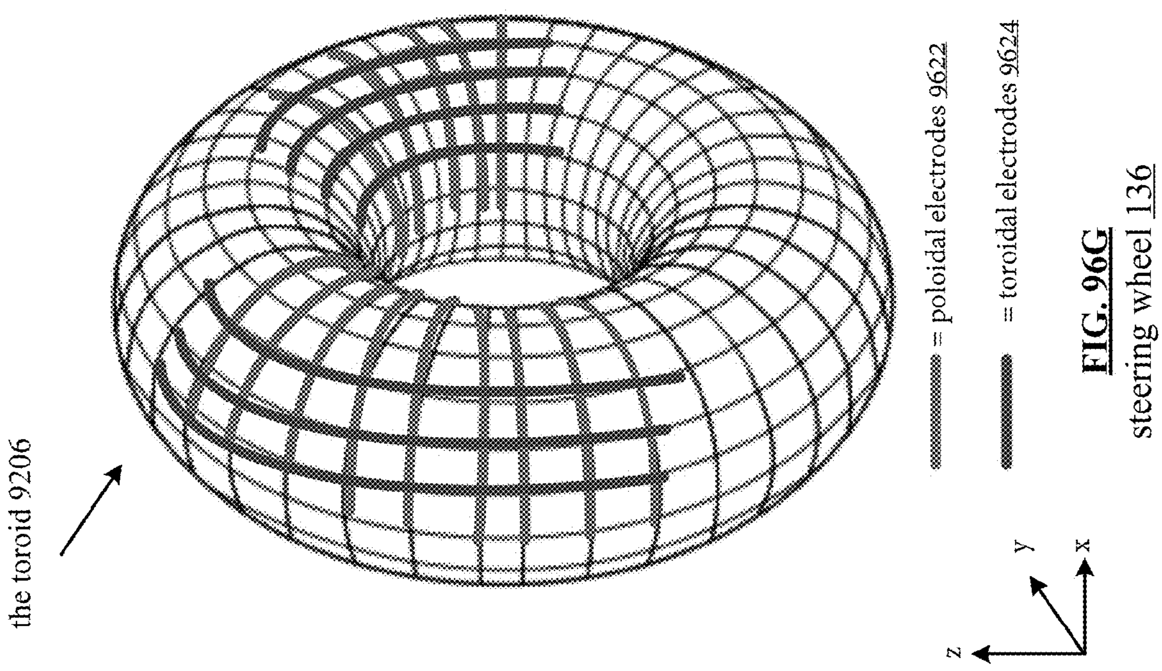
FIG. 96G illustrates an example of a steering wheel with one or more interaction detection regions implemented via a poloidal electrodes and/or toroidal electrodes in accordance with various embodiments.

FIG. 96G illustrates a three-dimensional depiction of a toroid 9602 of a steering wheel 136 that implements one or more interaction detection regions 9620 as contoured electrodes. Some or all features and/or functionality of the steering wheel toroid 9602 of FIG. 96G can implement the steering wheel toroid 9602 of the steering wheel 136 of FIGS. 96A-96C, and/or of the steering wheel 136 of FIGS. 96D-96F.

A given interaction detection region 9620, such as one of a plurality of discrete interaction detection region 9620 of the toroid 9602 and/or of a continuous interaction detection region 9620 across some or all of the toroid surface of the toroid 9206, can be implemented via a one or more poloidal electrodes 9622. Each poloidal electrodes 9622 can be contoured to lie upon and/or be integrated within the toroid 9206 in accordance with a poloidal direction of the toroid.

A given poloidal electrode can partially or fully encircle the toroid along a corresponding poloidal circle, for example, where the electrode encompasses any amount of the corresponding poloidal circle such as: less than 90 degrees of the poloidal circle, greater than or equal to 90 degrees of the poloidal circle, less than or equal to 180 degrees of the poloidal circle, greater than or equal to 180 degrees of the poloidal circle, less than to 270 degrees of the poloidal circle, greater than or equal to 270 degrees of the poloidal circle, less than 360 degrees of the poloidal circle, and/or 360 of the poloidal circle.

A set of adjacent poloidal electrodes 9622 following adjacent poloidal circles can be implemented via some or all functionality as the set of parallel electrodes of FIGS. 42-43B, despite being contoured. For example a set of adjacent poloidal electrodes 9622 can have mutual capacitances whose changes are detectable via corresponding button circuits 122 to determine which poloidal electrodes 9622 are being touched and/or hovered over at a given time in a same or similar fashion as discussed in conjunction with FIGS. 42-43B. This can be utilized to enable detection of interaction with different portions of the surface of the steering wheel with respect to some or all of 360 degrees, centered at the hub of the steering wheel that a user is interacting with, such as whether the interaction is with the top, bottom, left, or right portions of the toroid.

In some embodiments, a given poloidal circle of the toroid has multiple different electrodes upon different portions of the poloidal circle. This can further enable distinguishing whether a detected interaction is upon the front, back, or side of the steering wheel toroid.

Alternatively or in addition to implementing poloidal electrodes 9622, a given interaction detection region 9620, such as one of a plurality of discrete interaction detection region 9620 of the toroid 9602 and/or of a continuous interaction detection region 9620 across some or all of the toroid surface of the toroid 9206, can be implemented via a plurality of toroidal electrodes 9624. Each toroidal electrode 9624 can be contoured to lie upon and/or be integrated within the toroid 9206 in accordance with a toroidal direction of the toroid.

A given toroidal electrode can partially or fully encircle the toroid along a corresponding toroidal circle, for example, where the electrode encompasses any amount of the corresponding toroidal circle such as: less than 90 degrees of the toroidal circle, greater than or equal to 90 degrees of the toroidal circle, less than or equal to 180 degrees of the toroidal circle, greater than or equal to 180 degrees of the toroidal circle, less than to 270 degrees of the toroidal circle, greater than or equal to 270 degrees of the poloidal circle, less than 360 degrees of the toroidal circle, and/or 360 of the toroidal circle.

A set of adjacent toroidal electrodes 9624 following adjacent toroidal circles can be implemented via some or all functionality as the set of parallel electrodes of FIGS. 42-43B, despite being contoured. For example a set of adjacent toroidal electrodes 9624 can have mutual capacitances whose changes are detectable to determine which toroidal electrodes 9624 are being touched and/or hovered over at a given time in a same or similar fashion as discussed in conjunction with FIGS. 42-43B. This can be utilized to enable detection of interaction with different portions of the surface of the steering wheel with respect to some or all of 360 degrees centered at points in a ring within the center of the toroid in the toroidal direction, which can thus be utilized to determine whether a user is interacting with front, sides, or back of the steering wheel surface.

In some embodiments, a given toroidal circle of the toroid has multiple different electrodes upon different portions of the toroidal circle. This can further enable distinguishing where the detected interaction is with respect to different directions in 360 degrees from the center hub, such as whether the interaction is in the top, bottom, left, or right portion of the steering wheel.

In some embodiments, such as the example illustrated in FIG. 96G, a given interaction detection region 9620, such as one of a plurality of discrete interaction detection region 9620 of the toroid 9602 and/or of a continuous interaction detection region 9620 across some or all of the toroid surface of the toroid 9206, can be implemented via both a plurality of poloidal electrodes 9622 and a plurality of toroidal electrodes 9624. For example, the poloidal electrodes 9622 are offset from the toroidal electrodes 9624 such that a spacing between a given poloidal electrode and toroidal electrode at a corresponding cross-point induces a mutual capacitance, where changes at these cross-points are detectable via corresponding DSCs to enable detection of which cross-points are touched and/or hovered over by objects, such as hands or fingers of the driver. This can enable detection of touch and/or touchless indications with the steering wheel at particular corresponding parts of the steering wheel in the corresponding interaction detection region 9620, and can enable detection of movement and/or gesture.

Figure 96H:
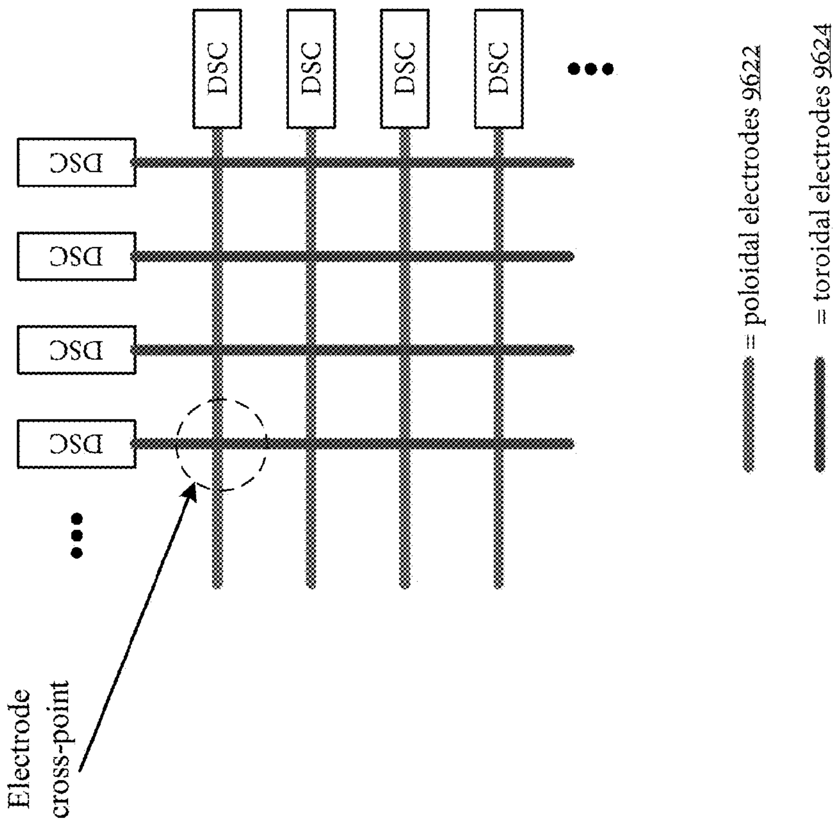
FIG. 96H illustrates a flat depiction of an interaction detection region of a steering wheel implemented via a poloidal electrodes and/or toroidal electrodes in accordance with various embodiments.

FIG. 96H illustrates a flat depiction of the plurality of poloidal electrodes 9622 and a plurality of toroidal electrodes 9624 of a given interaction detection region 9620. Each poloidal electrodes 9622 and each toroidal electrode can have a corresponding DSC 117 that transmits a signal upon the electrode and detects changes in mutual capacitance or other changes of the electrode as discussed previously. Such functionality can be implemented via some or all features and/or functionality discussed in conjunction with keypads 4415 of FIGS. 44A-44F, touchpads of FIGS. 46A-46C, and/or touch sensor devices of FIGS. 47A-47G.

Implementing dozens, hundreds, and/or thousands of such poloidal electrodes 9622 and/or toroidal electrodes 9624 electrodes within and/or upon a steering wheel 136 can enable granular detection of mutual capacitance across different locations to generate more enhanced capacitance image data 233, such as a heat map of some or all of the surface of the steering wheel to indicate which portions of the steering wheel are touched and/or hovered over, and/or to differentiate which particular hand, fingers, parts of the finger, etc. are detected, for example to generate corresponding anatomical feature mapping data 730 to indicate where user's hand and fingers are with respect to the steering wheel surface.

Note that other embodiments of steering wheel 136 may not be implemented as a perfect toroid shape, but can have toroidal features and/or can be substantially toroidal. Other steering wheels can be implemented to include non-toroidal shapes, but can be optionally implemented via contoured electrodes for their respective shapes.

Figure 96I:
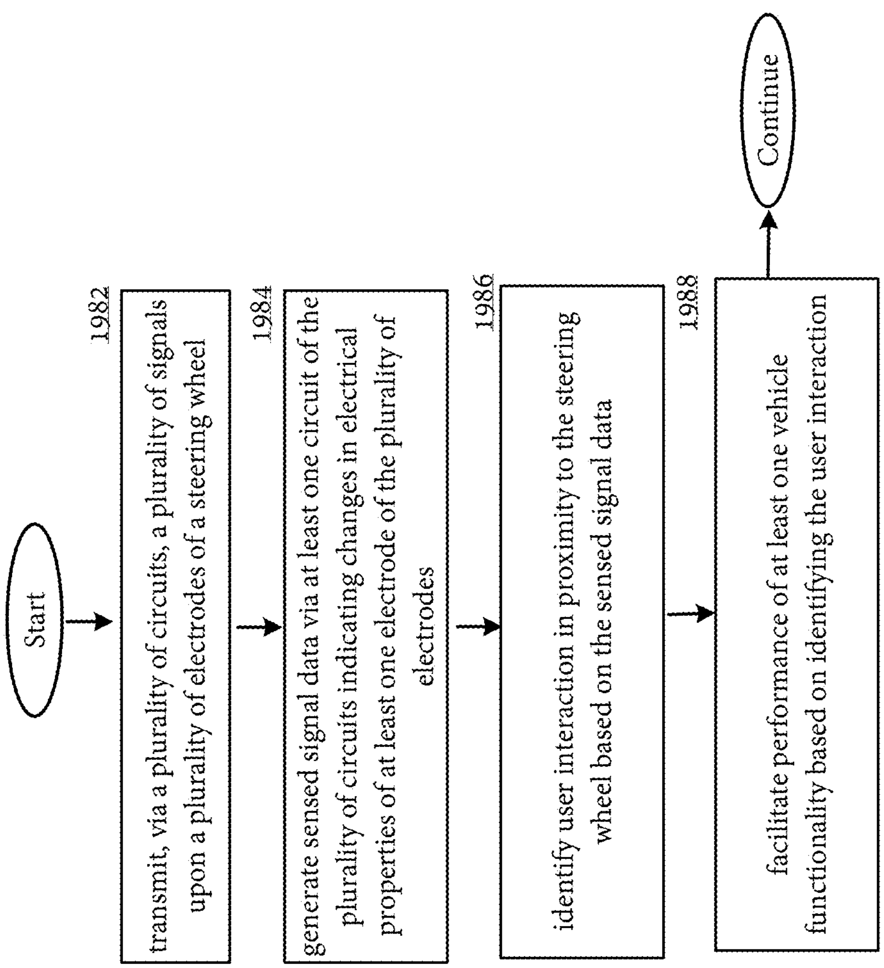
FIG. 96I is a logic diagram of an example of a method for execution in accordance with various embodiments.

FIG. 96I is a logic diagram illustrating a method of detecting interaction in proximity to a steering wheel to facilitate performance of vehicle functionality, for example, based on implementing some or all functionality of steering wheel 136 discussed in conjunction with FIGS. 96A-96H. Some or all of the method of FIG. 96I can be performed via a vehicle computing entity 150 at least one button circuit 112, and/or at least one DSC 117, for example, based on some or all functionality discussed in conjunction with one or more of FIGS. 1-48B. Some or all of the method of FIG. 96I can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 96I can be performed based on performing the method of FIGS. 13B, 19B, 21A, 43B, 44D, and/or 48B.

Step 1982 includes transmitting, via a plurality of circuits, a plurality of signals upon a plurality of electrodes of a steering wheel. In various embodiments, the at least one circuit can include at least one button circuit 112, at least one sensor circuit 116, at least one RX circuit 119, at least one DSC 117, and/or another circuit. In various embodiments, the plurality of electrodes can include a plurality of poloidal electrodes and/or a plurality of toroidal electrodes upon the surface of the steering wheel. In various embodiments, the plurality of electrodes can implement one or more interaction detection regions on the surface of the steering wheel.

Step 1984 includes generating sensed signal data via at least one circuit of the plurality of circuits indicating changes in electrical properties of at least one electrode of the plurality of electrodes. The changes in electrical properties can indicate changes in impedance, self-capacitance, and/or mutual-capacitance.

Step 1986 includes identifying user interaction in proximity to the steering wheel based on the sensed signal data. The user interaction can correspond to a touch-based and/or touchless indication and/or gesture, and/or can include interaction with one or more electrodes and/or electrode cross points implementing some or all of a corresponding interaction detection regions of the surface of the steering wheel. The user interaction can be identified from a set of different indication types based on a type of gesture and/or a location of the interaction upon the surface of the steering wheel.

Step 1988 includes facilitating performance of at least one vehicle functionality based on identifying the user interaction. The at least one vehicle functionality can include any vehicle functionality and/or vehicle configuration described herein. In various embodiments, the vehicle functionality can be determined from a plurality of possible vehicle functionalities based on: identifying a gesture type of a plurality of gesture types, an identified finger performing the interaction, and/or a location of the interaction upon the surface of the steering wheel.

Figure 96J:
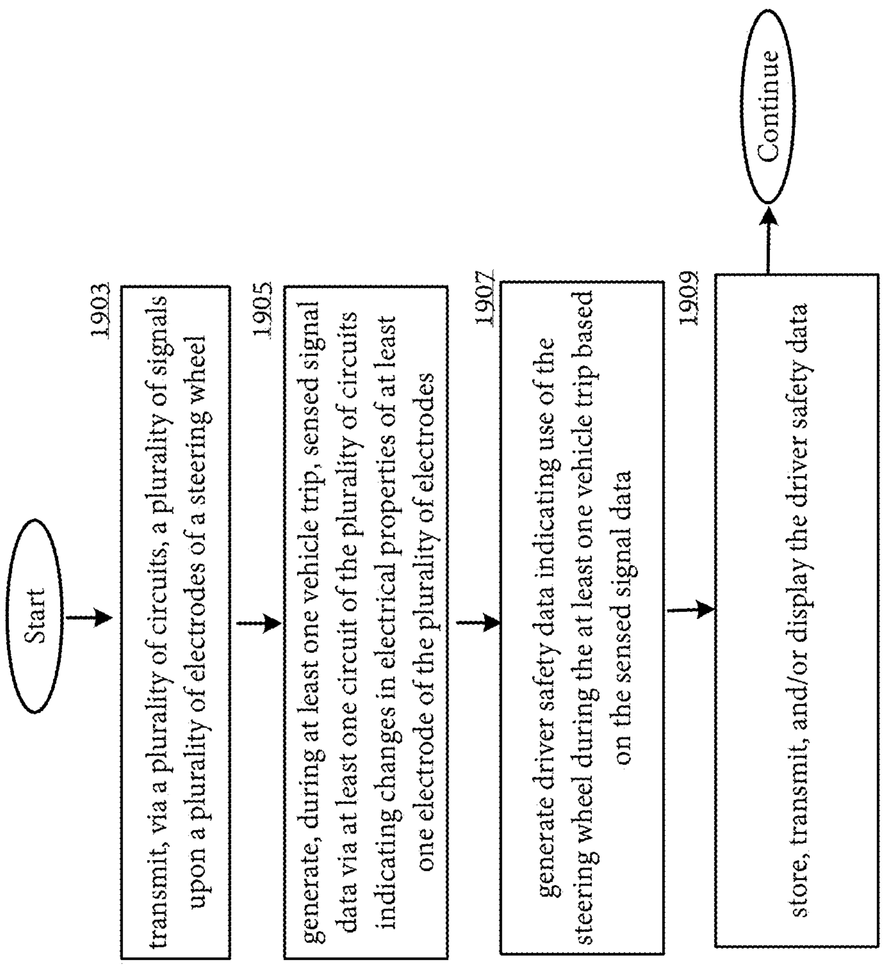
FIG. 96J is a logic diagram of an example of a method for execution in accordance with various embodiments.

FIG. 96J is a logic diagram illustrating a method of detecting interaction in proximity to a steering wheel to facilitate performance of vehicle functionality, for example, based on implementing some or all functionality of steering wheel 136 discussed in conjunction with FIGS. 96A-96H. Some or all of the method of FIG. 96J can be performed via a vehicle computing entity 150 at least one button circuit 112, and/or at least one DSC 117, for example, based on some or all functionality discussed in conjunction with one or more of FIGS. 1-48B. Some or all of the method of FIG. 96J can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 96J can be performed based on performing the method of FIGS. 13B, 19B, 21A, 43B, 44D, and/or 48B. Some or all of the method of FIG. 96J can be performed based on performing some or all steps of the method of FIG. 96I, and/or any other method described herein.

Step 1903 includes transmitting, via a plurality of circuits, a plurality of signals upon a plurality of electrodes of a steering wheel. In various embodiments, the at least one circuit can include at least one button circuit 112, at least one sensor circuit 116, at least one RX circuit 119, at least one DSC 117, and/or another circuit. In various embodiments, the plurality of electrodes can include a plurality of poloidal electrodes and/or a plurality of toroidal electrodes upon the surface of the steering wheel. In various embodiments, the plurality of electrodes can implement one or more interaction detection regions on the surface of the steering wheel.

Step 1905 includes generating sensed signal data via at least one circuit of the plurality of circuits indicating changes in electrical properties of at least one electrode of the plurality of electrodes. Step 1905 can be performed across multiple temporal periods within a given vehicle trip, or across multiple vehicle trips. The changes in electrical properties can indicate changes in impedance, self-capacitance, and/or mutual-capacitance.

Step 1907 includes generate driver safety data indicating use of the steering wheel during the at least one vehicle trip based on the sensed signal data. Performing step 1907 can include generating anatomical feature mapping data. Performing step 1907 can include: detecting whether the user is holding the steering wheel with no hands, with one hand, or with both hands; determining how often user is holding the steering wheel during the vehicle trip; determining which locations upon the surface of the steering wheel are being held; determining a configuration and/or orientation of one or more fingers and/or palms of one or more hands upon the steering wheel, such as whether a user's hands are gripping the steering wheel around the toroid or gently touching a portion of the toroid surface via fingertips; determining whether the user is maneuvering the vehicle via interaction with the steering wheel via a single hand or both hands; determining whether the user is maneuvering the vehicle via interaction with the steering wheel via legs or knees instead of one or both hands; or other information.

In various embodiments, generating the driver safety data further include comparing detected position and/or use of the hands during the vehicle trip with safety requirement thresholds, such as a requirements that: both hands hold the steering wheel; one or both hands hold the steering wheel in 10 o'clock and 2 o'clock positions; one or both hands hold the steering wheel based on cupping around the toroid in a poloidal direction instead of simply resting fingertips upon the steering wheel surface; turns and/or lane changes be completed via use of one or both hands and/or not via one or both legs; threshold proportions of time during the vehicle trip that safe driving positions be assumed by the user; and/or other requirements. One or more safety requirement thresholds can be based on the current vehicle state, such as: whether the vehicle is in motion, is exceeding a certain speed, is in a school zone, is at a school crossing, pedestrian crossing, or intersection, is performing a turn and/or lane change, whether the turning signal is on, whether adaptive cruise control or lane keeping is on, whether it is day or night, which particular user is driving based on their user ID of a user ID signal, the age of identified user and/or whether the identified user has a driver's license or a learner's permit, the number of other passengers detected to be in the vehicle that may be distracting the driver, or any other vehicle status and/or state described herein.

Step 1909 includes storing, transmitting, and/or displaying the driver safety data. Step 1909 can optionally include audibly indicating the driver safety data, for example, via an audible alert conveyed via vehicle speakers. Step 1909 can be performed one or more times during the vehicle trip or after the vehicle trip. Step 1909 can be performed based on determining the driver safety data compares unfavorably to, and/or otherwise does not meet one or more of the safety requirement thresholds. Transmitting the driver safety data can include transmitting the driver safety data to: a cell phone as a text message; a computing device associated with an owner and/or person leasing the vehicle; a computing device associated with a parent of the driver of the vehicle; a computing device associated with an insurance company; or another computing device. The driver safety data can be transmitted via a wired and/or wireless communication network. Displaying the driver safety data can include displaying a notification or other graphical display data indicating the driver safety data via a display device of the vehicle.

Figure 97:
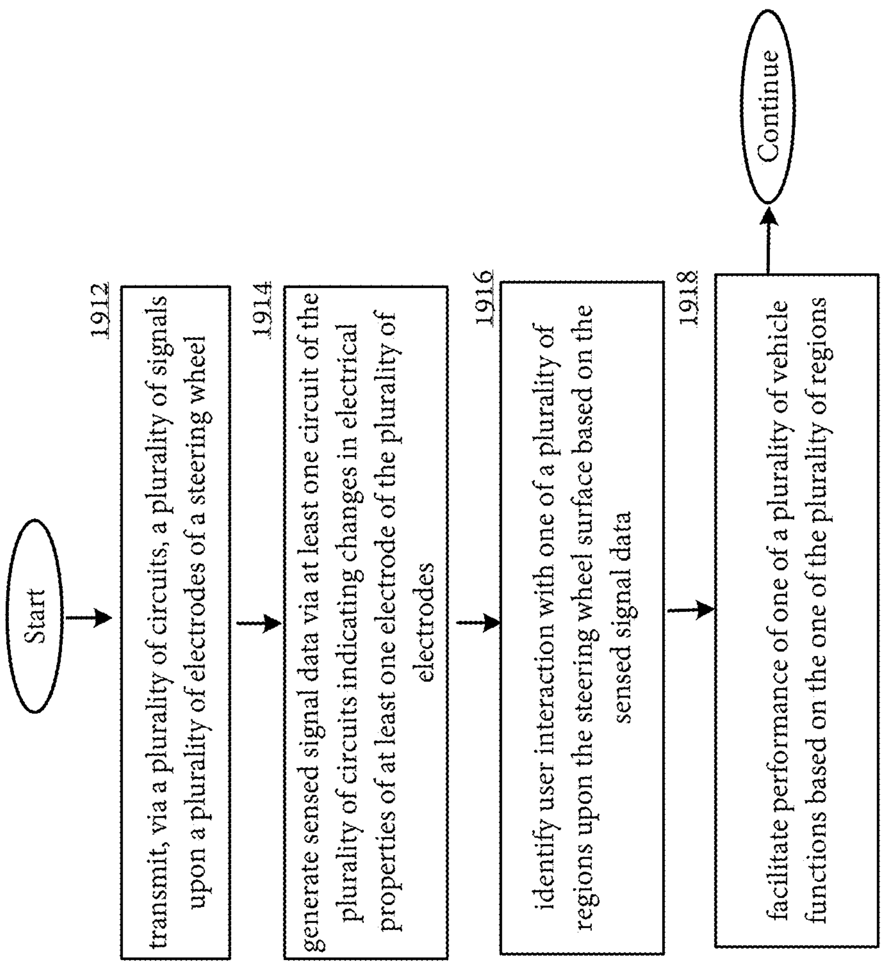
FIG. 97 is a logic diagram of an example of a method for execution in accordance with various embodiments.

FIG. 97 is a logic diagram illustrating a method of performing vehicle functionality based on detected steering wheel interaction, for example, based on implementing some or all functionality of steering wheel 136 discussed in conjunction with FIGS. 96A-96H. Some or all of the method of FIG. 97 can be performed via a vehicle computing entity 150 at least one button circuit 112, and/or at least one DSC 117, for example, based on some or all functionality discussed in conjunction with one or more of FIGS. 1-48B. Some or all of the method of FIG. 97 can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 97 can be performed based on performing the method of FIGS. 13B, 19B, 21A, 43B, 44D, and/or 48B. Some or all of the method of FIG. 97 can be performed based on performing some or all steps of the method of FIG. 96I, and/or any other method described herein.

Step 1912 includes transmitting, via a plurality of circuits, a plurality of signals upon a plurality of electrodes of a steering wheel. In various embodiments, the at least one circuit can include at least one button circuit 112, at least one sensor circuit 116, at least one RX circuit 119, at least one DSC 117, and/or another circuit. In various embodiments, the plurality of electrodes can include a plurality of poloidal electrodes and/or a plurality of toroidal electrodes upon the surface of the steering wheel. In various embodiments, the plurality of electrodes can implement one or more interaction detection regions on the surface of the steering wheel.

Step 1914 includes generating sensed signal data via at least one circuit of the plurality of circuit indicating changes in electrical properties of at least one electrode of the plurality of electrodes. The changes in electrical properties can indicate changes in impedance, self-capacitance, and/or mutual-capacitance.

Step 1916 includes identifying user interaction with one of a plurality of regions upon the steering wheel surface based on the sensed signal data. The user interaction can correspond to a touch-based and/or touchless indication and/or gesture, and/or can include interaction with one or more electrodes and/or electrode cross points implementing some or all of a corresponding interaction detection regions of the surface of the steering wheel. The plurality of regions upon the steering wheel surface can correspond to different interaction detection regions, different electrodes, and/or different cross-points, such as cross-points formed by a plurality of toroidal electrodes and a plurality of poloidal electrodes.

Step 1918 includes facilitating performance of one of a plurality of vehicle functions based on the one of the plurality of regions. For example, different ones of the plurality of regions are mapped to different ones of the plurality of vehicle functions. The different ones of the plurality of regions can optionally be mapped to different ones of the plurality of vehicle function in an option tier of a hierarchical option tree. For example, a sequence of user interactions are performed in the same or different region to facilitate selection of the vehicle function based on traversing through option tiers of the hierarchical option tree. The sequence of user interactions can include one or more different indication types detected in a same one of the plurality of regions.

Figure 98A:
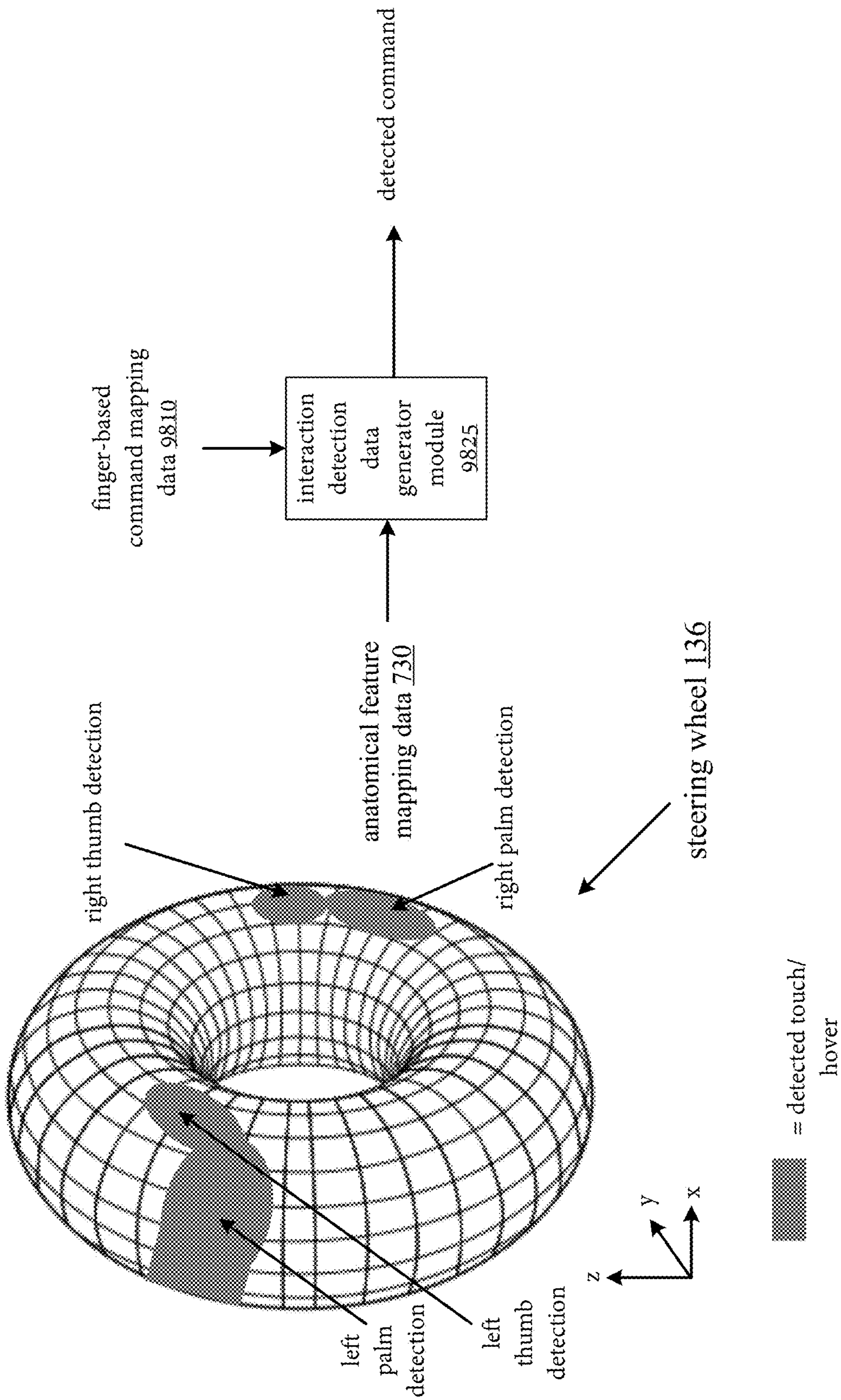
FIG. 98A illustrates an example of processing anatomical feature mapping data generated via one or more interaction detection regions of a steering wheel in accordance with various embodiments.

FIG. 98A illustrates an embodiment of identifying user commands based on finger-based command mapping data 9810. The position and/or movement of particular fingers upon the steering wheel 136 can be detected, and can enable a set of distinct, per-finger commands performed by a user to each facilitate performance of different ones of a set of distinct vehicle functionality. For example, a tap by the user's right index finger can be distinguished from and induce a different command from a tap by the user's right index finger. As another example, a tap by the user's right index finger can be distinguished from and induce a different command from a tap by the user's right middle finger.

In some embodiments, such interactions can be location-independent, enabling the user to perform commands regardless of the position of their hand upon the steering wheel. For example, the user taps their right index finger in a particular location on the steering wheels surface at a first time to induce a first vehicle functionality, and later taps their right ring finger in the particular location on the steering wheels surface (e.g. based on having shifted their hand position) at a second time to induce a second vehicle functionality. The ring finger is distinguished from the index finger, and thus the two different commands are performed despite the tap being detected upon the same location on the steering wheel surface. This can be ideal as the user moves their hand (e.g. after turning, to readjust their position on a long drive), and enable the user to perform commands without necessitating they keep their hand in a particular location.

Enabling this functionality can include generating anatomical feature mapping data 730 based on detected interaction with one or more interaction detection regions 9620 of the steering wheel 136 via performance of some or all functionality of FIGS. 83A-83D. This can include generating capacitance image data corresponding to the surface of the steering wheel as illustrated in FIG. 98A, and applying known characteristics and/or parameters of hand anatomy to identify particular fingers, the palm, etc. of one or more hands. This can further include known characteristics of hand positioning on the steering wheel (e.g. a person typically holds a steering wheel by wrapping their hand around the steering wheel, with their palm facing inwards towards the steering wheel surface)

For example, the sensed signal data generated by various button circuits 112, DSCs 117, and/or other circuits having electrodes implementing one or more interaction detection regions 9620 is processed to determine touches and/or hovers at corresponding locations on the steering wheel, where a full corresponding capacitance image data 233 rendering of corresponding portions of the steering wheel surface having interaction detection regions 9620 can be generated, for example, as a stream of capacitance image data 233 over time. The shapes and characteristics of detected hovers and touches about various portions of the three-dimensional steering wheel surface, as indicated in the capacitance image data 233, in conjunction with known hand anatomy and typical characteristics of holding a steering wheel, can be utilized to automatically map the locations and/or orientations of distinct fingers on each hand.

An interaction detection data generator module 9825 can be implemented via vehicle computing entity 150 and/or any processing module to generate command data, indicating a particular vehicle functionality for performance by the vehicle computing entity 150, based on processing the anatomical feature mapping data 730 in conjunction with finger-based command mapping data 9810.

The finger-based command mapping data 9810 can be stored in and/or accessed in memory by the vehicle computing entity 150. The finger-based command mapping data 9810 can be predetermined, configured via user input, received via a network, and/or automatically generated, for example, based on tracking user behavior over time and/or applying at least one machine learning and/or artificial intelligence functionality. An example of finger-based command mapping data 9810 is illustrated in FIG. 98D.

Figure 98C:
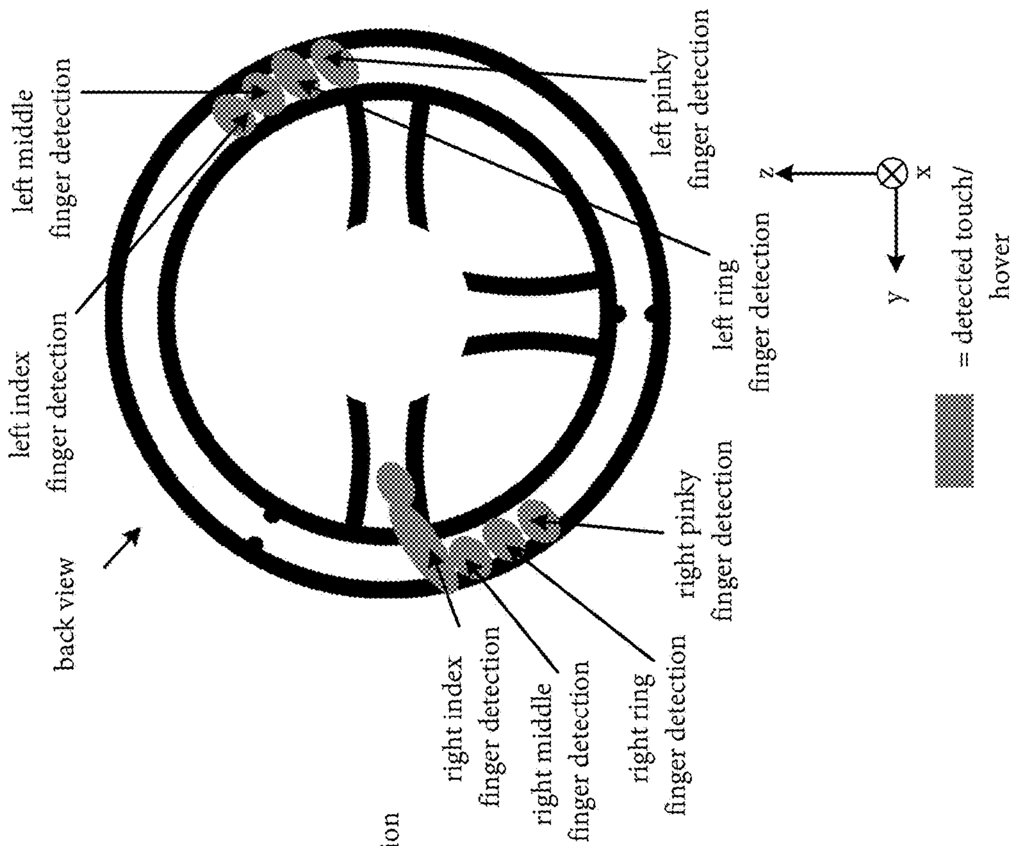
FIGS. 98B and 98C illustrate an example embodiment of anatomical feature mapping data generated via one or more interaction detection regions of a steering wheel in accordance with various embodiments.
Figure 98B:
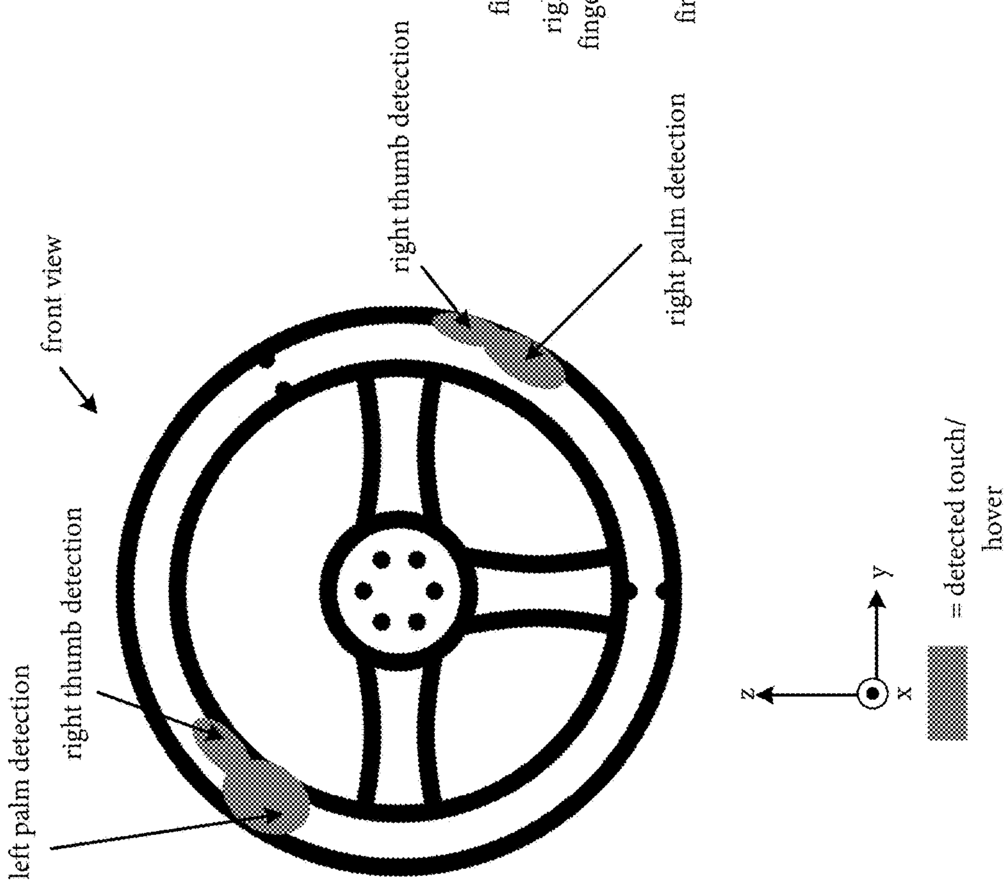

FIGS. 98B and 98C illustrate two-dimensional depictions of example anatomical feature mapping data 730. FIG. 98B illustrates the example anatomical feature mapping data 730 with respect to a front view of the steering wheel 136, where the right and left thumbs and palms are detected based on corresponding positions of the user's hand while driving. FIG. 98C illustrates the example anatomical feature mapping data 730 with respect to a back view of the steering wheel 136, where the remaining fingers on the right and left hand detected based on corresponding positions of the user's hand while driving. For example, the right index finger is extended and/or is touching the back side of a steering wheel spoke as depicted in 98C based on performing a corresponding finger-based command.

Figure 98D:
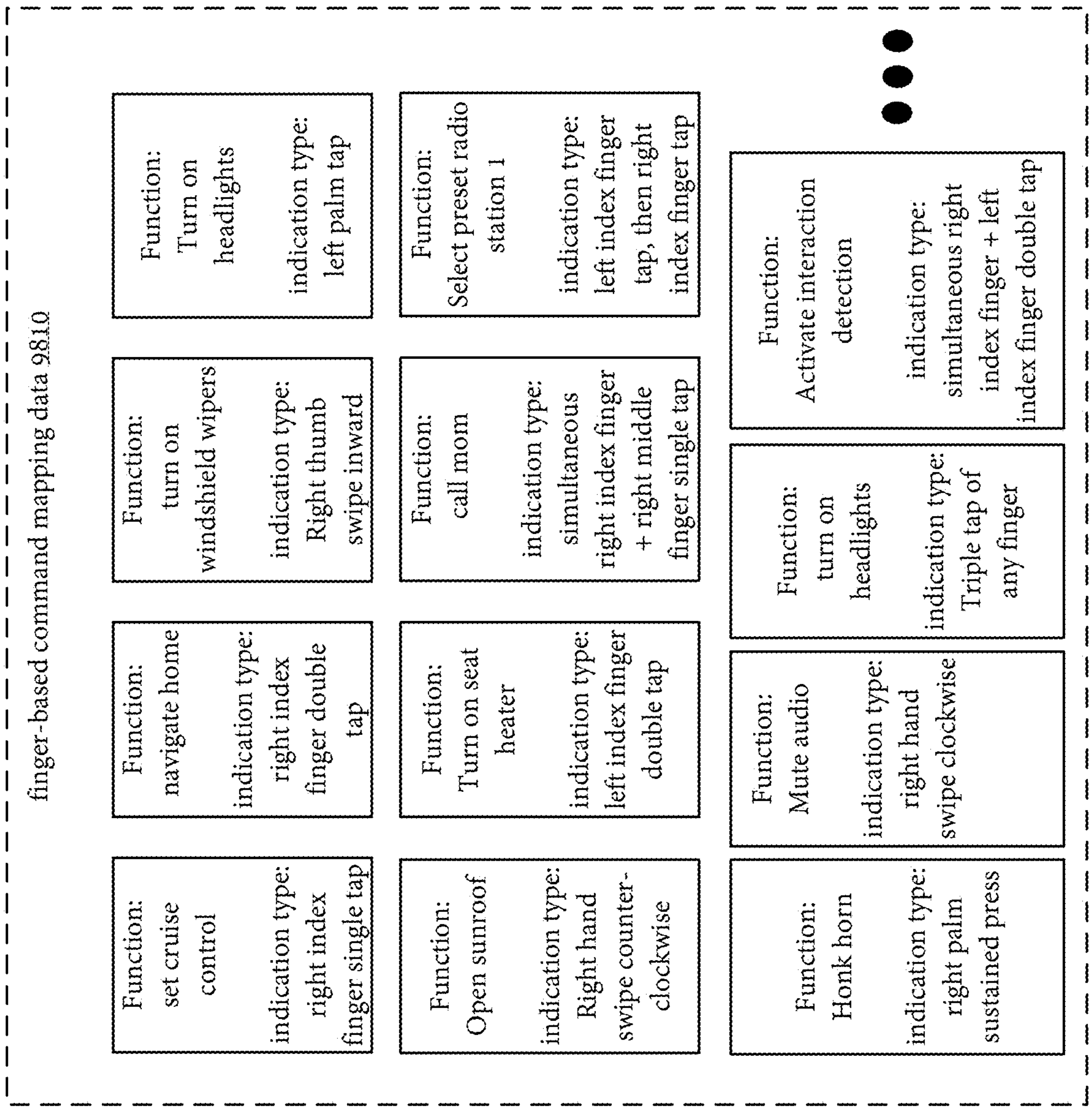
FIG. 98D illustrates an example embodiment of finger-based command mapping data in accordance with various embodiments.

FIG. 98D illustrates an example of finger-based command mapping data 9810. The finger-based command mapping data 9810 can optionally be implemented as a gesture set 812, where the interaction detection data generator module 9825 optionally performs the gesture detection function 820 of FIG. 84A. The finger-based command mapping data 9810 can optionally be implemented as an option tier 1510 of a hierarchical option tree 1505, where the interaction detection data generator module 9825 optionally implements the option tier determination module 9410 of FIG. 94B. Note that some of the finger-based command mapping data 9810 can involve interactions by other parts of the hand (e.g. the palm) and/or involve interactions via multiple fingers either simultaneously or in sequence, as illustrated in the example of FIG. 98D.

The various commands and indication types of the finger-based command mapping data 9810 of FIG. 98D serve as examples, and different embodiments can induce different vehicle functionality and/or can utilize different indication types. The various commands and indication types of the finger-based command mapping data 9810 can be configured via user input, can be predetermined, and/or can be received via a network.

In some embodiments, some or all indication types can be location-independent with respect to the steering wheel surface, where a given gesture by a given finger always induces the same action regardless of the detected location upon the steering wheel. Alternatively or in addition, some or all indication types can be location-dependent with respect to the steering wheel surface, where a given gesture by a given finger in a first location on the steering wheel surface induces the different vehicle functionality than the given gesture by the given finger in a second location on the steering wheel surface. For example, a right index finger tap on the front of the steering wheel induces a different vehicle functionality than a right index finger tap on the back of the steering wheel; a right index finger tap on the top of the steering wheel induces a different vehicle functionality than a right index finger tap on the bottom of the steering wheel; a right index finger tap on the right of the steering wheel induces a different vehicle functionality than a right index finger tap on the left of the steering wheel; etc.

As illustrated in FIG. 98D, functionality for one indication type can be to activate interaction detection. For example, gestures on the steering wheel are only processed when the user first performs this unique indication type indicating they wish to perform other gestures. This can be ideal in cases where certain gestures can be misconstrued with normal driving habits and/or normal user interaction with the steering wheel (e.g. the user tapping their finger on the steering wheel to music or while impatiently waiting for traffic to clear rather than intentionally performing a gesture, or the user moving their hand along the steering wheel as they perform a turn, rather than performing a gesture). The activate interaction detection indication type can be any indication type that is optionally different from the example of FIG. 98D. The activate interaction detection indication type for steering wheel interaction can be implemented in a same or similar fashion as the confirmation button of FIG. 91. However, the activate interaction detection indication type can optionally be location independent, similar to other gestures performed upon the steering wheel.

Alternatively or in addition, gestures are only detected and/or processed based on determining the steering wheel is not actively being turned by the user to complete a turn and/or lane change. In some cases, if a turn signal is detected to be turned on via a gesture in proximity to the steering wheel or other interaction with other buttons, gestures are only detected and/or processed based on detecting when a corresponding turn and/or lane change is complete, and/or once the turn signal is again off. This can be ideal, as actively engaging the steering wheel to complete turns can inadvertently cause the driver to perform unintended gestures that they do not wish to induce corresponding vehicle functionality while performing turns and/or lane changes.

FIGS. 98E-98H illustrate example gestures that leverage the toroid of the steering wheel, and natural hand-based interactions with the shape of the toroid surface. Same or similar gestures as those depicted in FIGS. 98E-98H can be implemented as indication types of finger-based command mapping data 9810 and/or as gesture types 813 of gesture set 812.

Figure 98E:
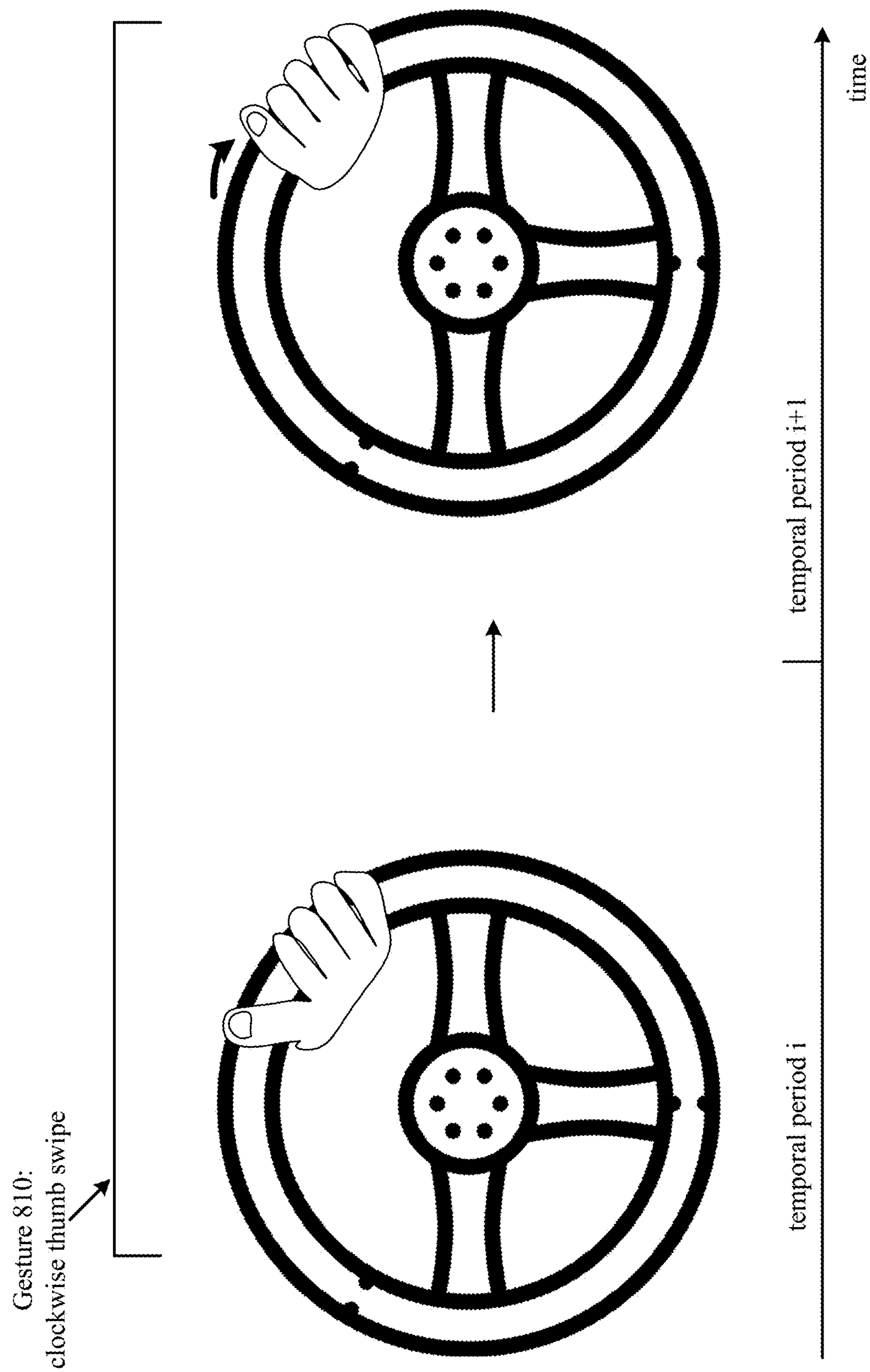
FIG. 98E illustrates performance of an example gesture in relation to a steering wheel in accordance with various embodiments.

FIG. 98E illustrates an example clockwise thumb swipe gesture. A user can perform such a gesture based on sliding their thumb along the surface of the toroid towards their other fingers along a toroidal direction. This gesture can be mapped to a given functionality in finger-based command mapping data 9810 and/or gesture set 812. The same or different functionality can be mapped to performance of this gesture via the left hand. The same or different functionality can be mapped to performance of this gesture in reverse, where the thumb slides along the toroid surface away from the other fingers. This gesture can be location independent with respect to the toroid surface, or can induce different functionality based on the starting and/or ending location upon the toroid surface.

Figure 98F:
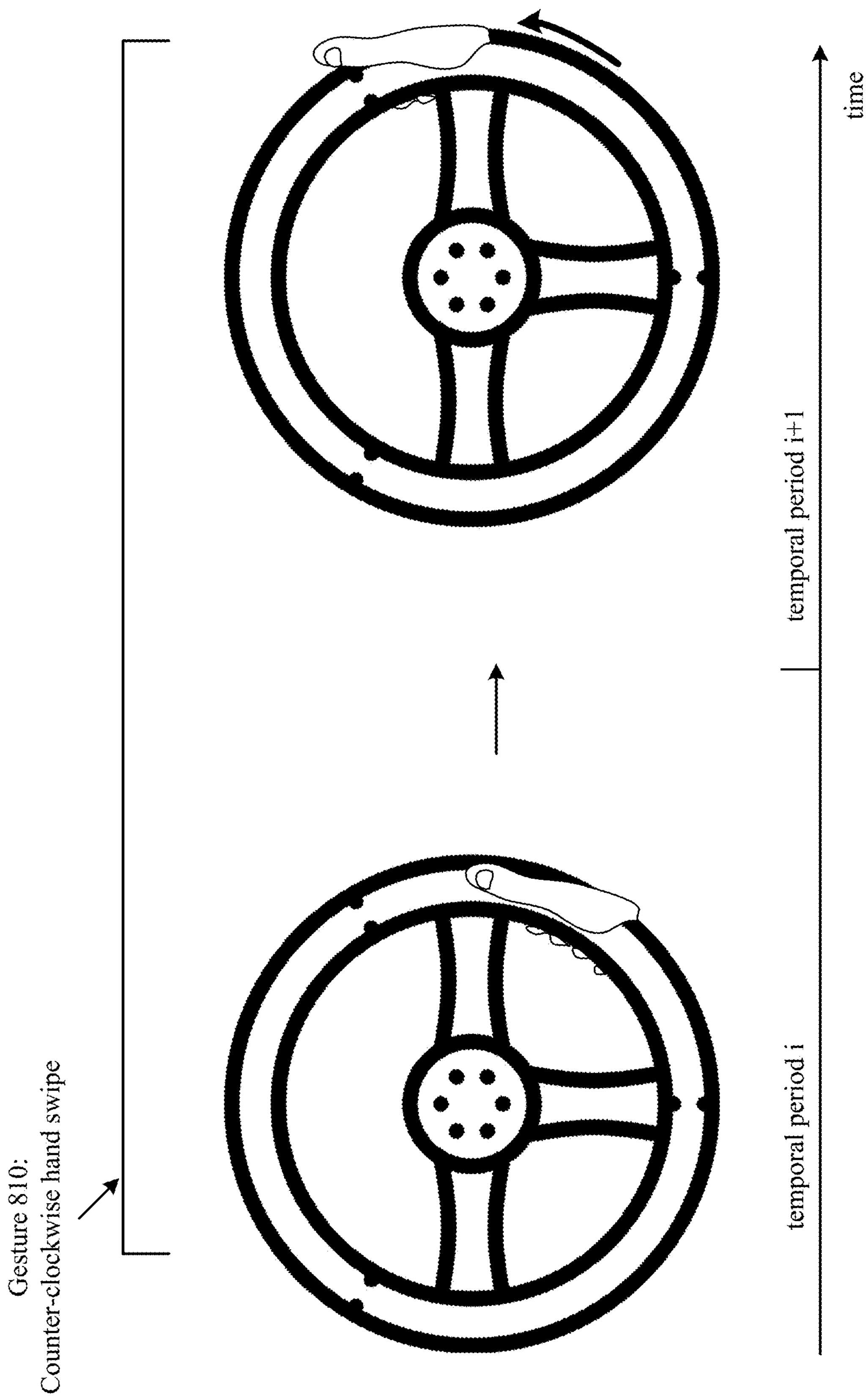
FIG. 98F illustrates performance of another example gesture in relation to a steering wheel in accordance with various embodiments.

FIG. 98F illustrates an example counter-clockwise hand swipe gesture. A user can perform such a gesture based on sliding their hand, while cupped around the surface of the toroid in a poloidal direction, along the surface of the toroid in a toroidal direction in a counter-clockwise direction. This gesture can be mapped to a given functionality in finger-based command mapping data 9810 and/or gesture set 812. The same or different functionality can be mapped to performance of this gesture via the right hand in reverse, where the right hand slides in the clockwise direction. The same or different functionality can be mapped to performance of this gesture in the clockwise direction via the left hand. The same or different functionality can be mapped to performance of this gesture in the counter-clockwise direction via the left hand. This gesture can be location independent with respect to the toroid surface, or can induce different functionality based on the starting and/or ending location upon the toroid surface.

Figure 98G:
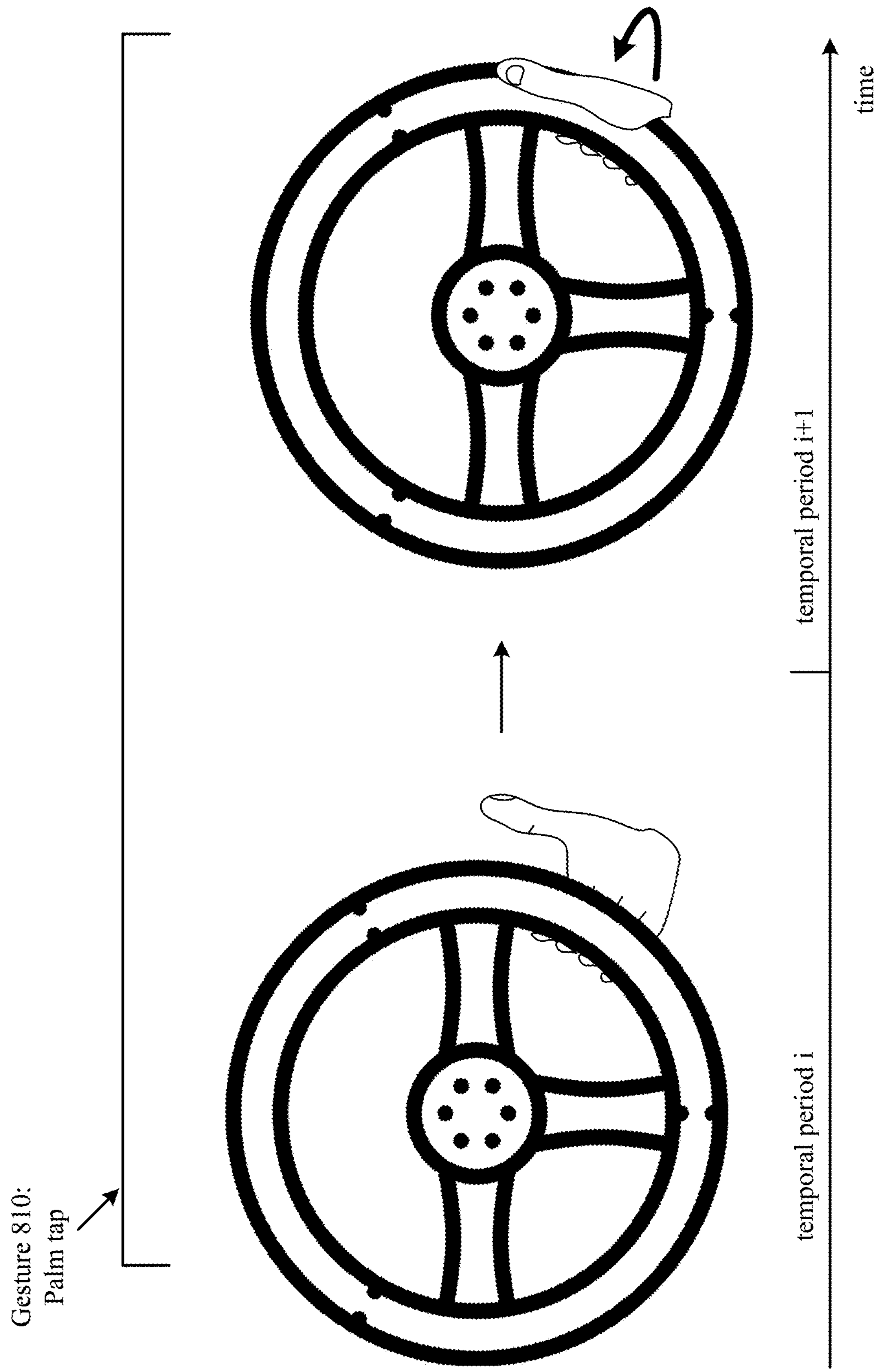
FIG. 98G illustrates performance of another example gesture in relation to a steering wheel in accordance with various embodiments.

FIG. 98G illustrates an example palm tap gesture. A user can perform such a gesture based on cupping their extended hand inwards towards the steering wheel surface in a poloidal direction, while touching and/or grabbing the steering wheel with their other fingers from the back side of the steering wheel. This gesture can be mapped to a given functionality in finger-based command mapping data 9810 and/or gesture set 812. The same or different functionality can be mapped to performance of this gesture via the left hand. The same or different functionality can be mapped to performance of this gesture in reverse, where the right moves from the cupped position around the steering wheel to the extended position. his gesture can be location independent with respect to the toroid surface, or can induce different functionality based on the starting and/or ending location upon the toroid surface.

Figure 98H:
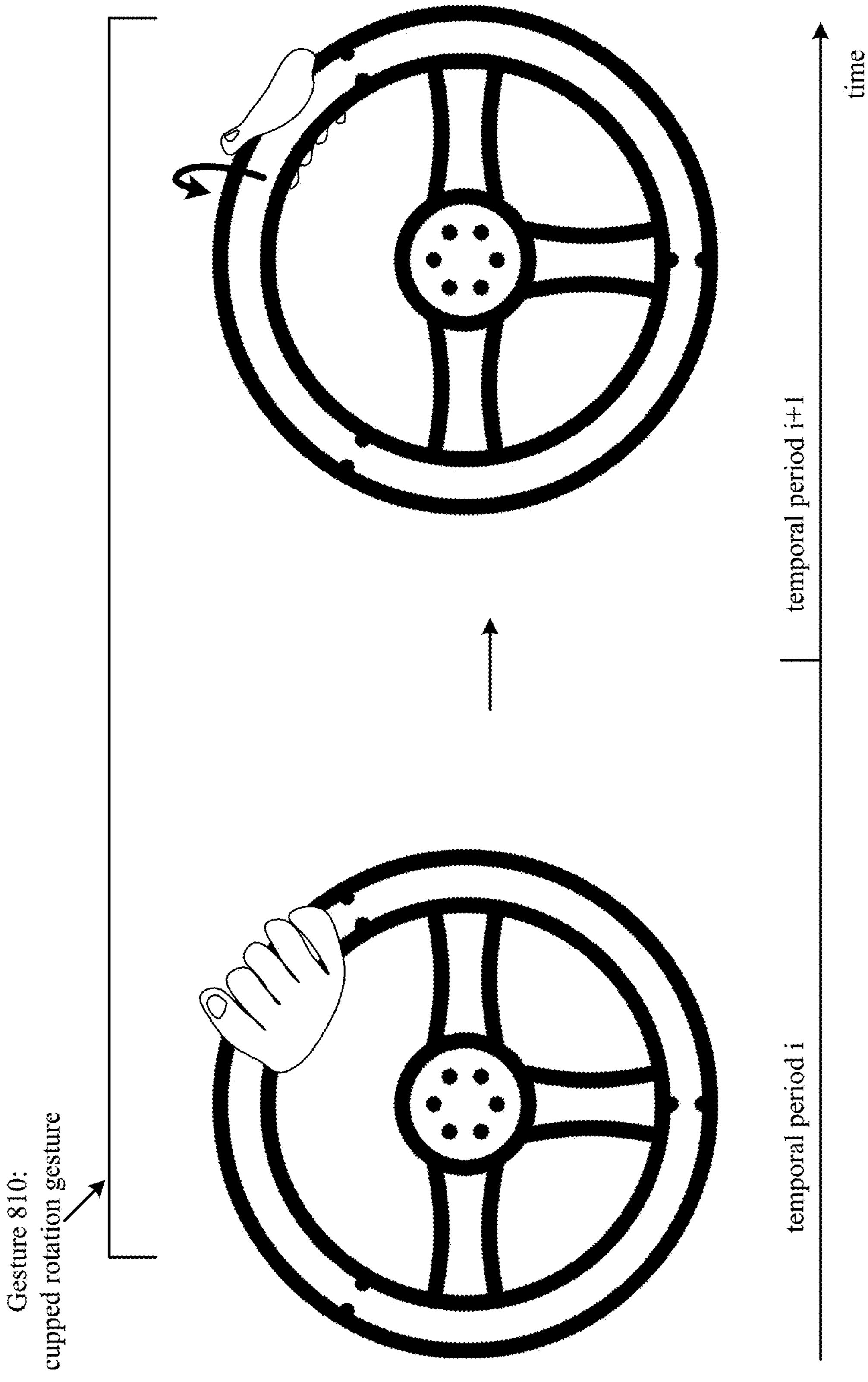
FIG. 98H illustrates performance of another example gesture in relation to a steering wheel in accordance with various embodiments.

FIG. 98H illustrates an example cupped rotation gesture. A user can perform such a gesture based on rotating their cupped hand around the toroid surface in a poloidal direction to induce their index, middle. ring, pinky, fingers rotating towards them from the back side of the steering wheel. This gesture can be mapped to a given functionality in finger-based command mapping data 9810 and/or gesture set 812. The same or different functionality can be mapped to performance of this gesture via the left hand. The same or different functionality can be mapped to performance of this gesture in reverse, where the hand rotates around the steering wheel in the opposite poloidal direction. This gesture can be location independent with respect to the toroid surface, or can induce different functionality based on the starting and/or ending location upon the toroid surface.

As the user is detected to perform various commands over time via various indications upon the steering wheel surface, the vehicle computing entity can additionally be operable to track the hand positioning upon and/or in proximity to the steering wheel surface over time to also generate driver safety data based on how the user uses their hands to drive the vehicle, and whether such use is safe or unsafe. This can include performing some or all functionality of the method of FIG. 96J.

Figure 98I:
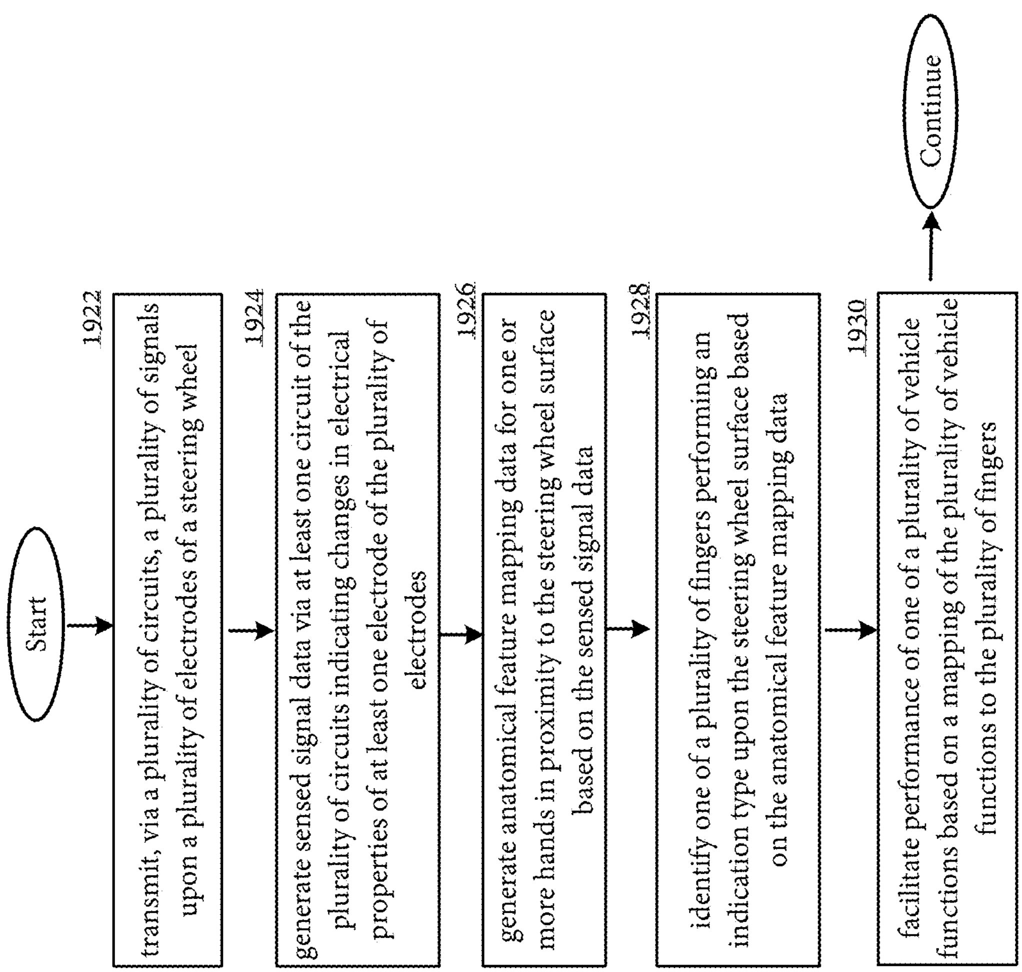
FIG. 98I is a logic diagram of an example of a method for execution in accordance with various embodiments.

FIG. 98I is a logic diagram illustrating a method of performing vehicle functionality based on detected steering wheel interaction, for example, based on implementing some or all functionality of steering wheel 136 discussed in conjunction with FIGS. 98A-98H. Some or all of the method of FIG. 98I can be performed via a vehicle computing entity 150 at least one button circuit 112, and/or at least one DSC 117, for example, based on some or all functionality discussed in conjunction with one or more of FIGS. 1-48B. Some or all of the method of FIG. 98I can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 98I can be performed based on performing the method of FIGS. 13B, 19B, 21A, 43B, 44D, 48B, 84E, and/or 85D. Some or all of the method of FIG. 98I can be performed based on performing some or all steps of the method of FIG. 96I, FIG. 96J, FIG. 97, and/or any other method described herein.

Step 1922 includes transmitting, via a plurality of circuits, a plurality of signals upon a plurality of electrodes of a steering wheel. In various embodiments, the at least one circuit can include at least one button circuit 112, at least one sensor circuit 116, at least one RX circuit 119, at least one DSC 117, and/or another circuit. In various embodiments, the plurality of electrodes can include a plurality of poloidal electrodes and/or a plurality of toroidal electrodes upon the surface of the steering wheel. In various embodiments, the plurality of electrodes can implement one or more interaction detection regions on the surface of the steering wheel.

Step 1924 includes generating sensed signal data via at least one circuit of the plurality of circuits indicating changes in electrical properties of at least one electrode of the plurality of electrodes. The changes in electrical properties can indicate changes in impedance, self-capacitance, and/or mutual-capacitance.

Step 1926 includes generating anatomical feature mapping data for one or more hands in proximity to the steering wheel surface based on the sensed signal data. Performing step 1926 can include performing some or all steps of FIG. 85D.

Step 1928 includes identifying a one of a plurality of fingers performing an indication type upon the steering wheel surface based on the anatomical feature mapping data. The indication type can include a tap, movement, or other gesture by the one of the plurality of fingers. In some embodiments, the indication type can be based on a location of the one of the plurality of fingers upon the steering wheel surface. In other embodiments, the indication type is independent of a location of the one of the plurality of fingers upon the steering wheel surface.

Step 1930 includes facilitating performance of one of a plurality of vehicle functions based on a mapping of the plurality of vehicle functions to the plurality of fingers. Performing step 1930 can include accessing finger-based command mapping data 9810 indicating the mapping of the plurality of vehicle functions to the plurality of fingers to identify the one of the plurality of vehicle functions as mapping to the identified finger. In some embodiments, each finger maps to a single one of the plurality of vehicle functions. In other embodiments, one or more fingers map to a multiple ones of the plurality of vehicle functions, for example, based on different indication types for a given finger mapping to different ones of the plurality of vehicle functions.

Figure 98J:
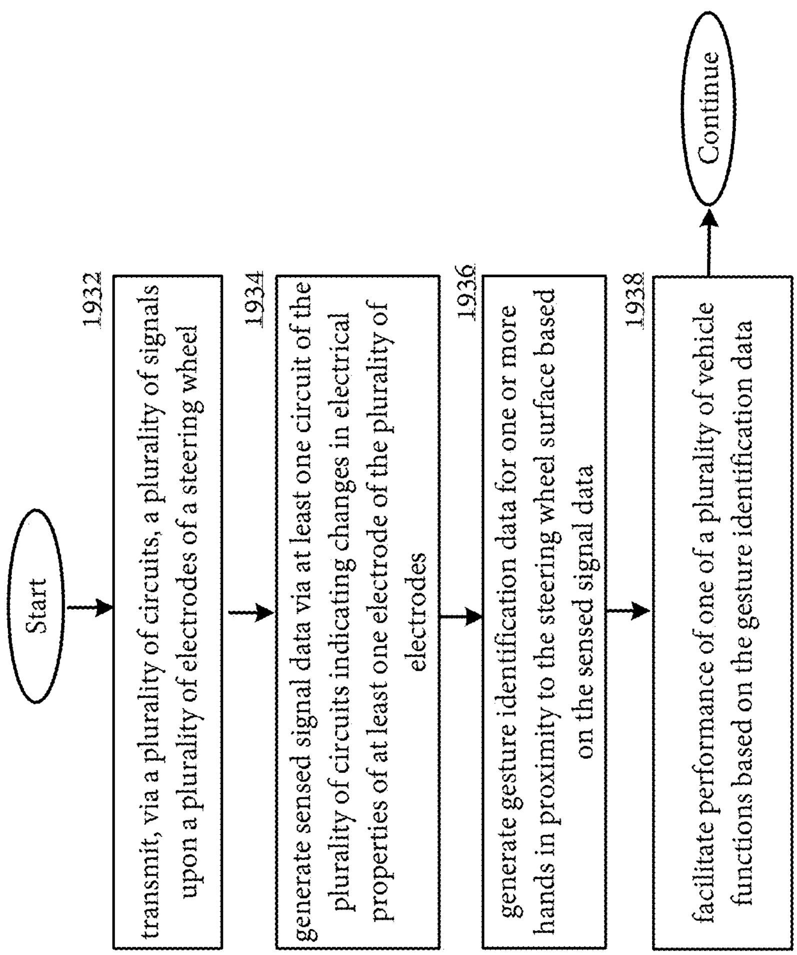
FIG. 98J is a logic diagram of an example of a method for execution in accordance with various embodiments.

FIG. 98J is a logic diagram illustrating a method of performing vehicle functionality based on detected steering wheel interaction, for example, based on implementing some or all functionality of steering wheel 136 discussed in conjunction with FIGS. 98A-98H. Some or all of the method of FIG. 98J can be performed via a vehicle computing entity 150 at least one button circuit 112, and/or at least one DSC 117, for example, based on some or all functionality discussed in conjunction with one or more of FIGS. 1-48B. Some or all of the method of FIG. 98J can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 98J can be performed based on performing the method of FIGS. 13B, 19B, 21A, 43B, 44D, and/or 48B. Some or all of the method of FIG. 98I can be performed based on performing some or all steps of the method of FIG. 96I, FIG. 96J, FIG. 97, FIG. 98I, and/or any other method described herein.

Step 1932 includes transmitting, via a plurality of circuits, a plurality of signals upon a plurality of electrodes of a steering wheel. In various embodiments, the at least one circuit can include at least one button circuit 112, at least one sensor circuit 116, at least one RX circuit 119, at least one DSC 117, and/or another circuit. In various embodiments, the plurality of electrodes can include a plurality of poloidal electrodes and/or a plurality of toroidal electrodes upon the surface of the steering wheel. In various embodiments, the plurality of electrodes can implement one or more interaction detection regions on the surface of the steering wheel.

Step 1934 includes generating sensed signal data via at least one circuit of the plurality of circuits indicating changes in electrical properties of at least one electrode of the plurality of electrodes. The changes in electrical properties can indicate changes in impedance, self-capacitance, and/or mutual-capacitance.

Step 1936 includes generating gesture identification data for one or more hands in proximity to the steering wheel surface based on the sensed signal data. Performing step 1936 can include performing some or all steps of FIG. 84E. Performing step 1936 can optionally include performing step 1926 and/or 1928 of FIG. 98I.

Step 1938 includes facilitating performance of one of a plurality of vehicle functions based on the gesture identification data. Performing step 1938 can include accessing finger-based command mapping data 9810 indicating the mapping of the plurality of vehicle functions to a plurality of gesture types the one of the plurality of vehicle functions as mapping to the identified type of gesture in the gesture identification data.

In some embodiments, some or all types of gestures involve use of a single finger or one or more fingers. In some embodiments, one or more gestures is independent of which finger on the hand performs the gesture, and can be performed by any finger to induce a given vehicle functions (e.g. triple tap by any finger to turn on headlights). In some embodiments, one or more gesture types is performed based on motion of a hand and/or individual fingers in a toroidal direction and/or poloidal direction of the steering wheel surface. For example, the gesture identification data identifies one of the example gestures of FIGS. 98E-98H. Some or all gesture types can be location independent with respect to the steering wheel surface. In some embodiments, at least one gesture type is location-dependent, where performance of the gesture in one location of the steering wheel surface induces a different vehicle function than performance of the gesture in a different location of the steering wheel surface.

Figure 98K:
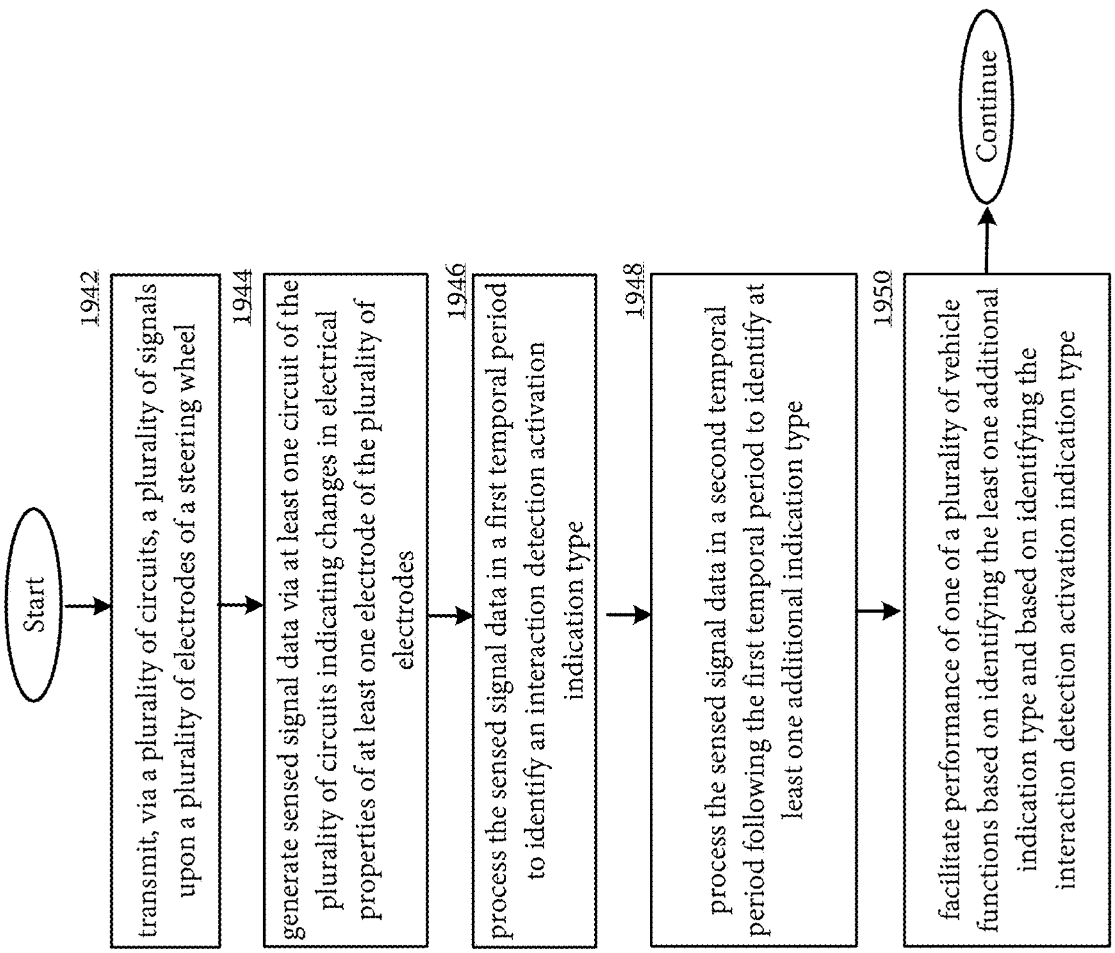
FIG. 98K is a logic diagram of an example of a method for execution in accordance with various embodiments.

FIG. 98K is a logic diagram illustrating a method of performing vehicle functionality based on detected steering wheel interaction, for example, based on implementing some or all functionality of steering wheel 136 discussed in conjunction with FIGS. 98A-98H. Some or all of the method of FIG. 98K can be performed via a vehicle computing entity 150 at least one button circuit 112, and/or at least one DSC 117, for example, based on some or all functionality discussed in conjunction with one or more of FIGS. 1-48B. Some or all of the method of FIG. 98K can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 98K can be performed based on performing the method of FIGS. 13B, 19B, 21A, 43B, 44D, 48B, and/or 91. Some or all of the method of FIG. 98I can be performed based on performing some or all steps of the method of FIG. 96I, FIG. 96J, FIG. 97, FIG. 98I, FIG. 98J, and/or any other method described herein.

Step 1942 includes transmitting, via a plurality of circuits, a plurality of signals upon a plurality of electrodes of a steering wheel. In various embodiments, the at least one circuit can include at least one button circuit 112, at least one sensor circuit 116, at least one RX circuit 119, at least one DSC 117, and/or another circuit. In various embodiments, the plurality of electrodes can include a plurality of poloidal electrodes and/or a plurality of toroidal electrodes upon the surface of the steering wheel. In various embodiments, the plurality of electrodes can implement one or more interaction detection regions on the surface of the steering wheel.

Step 1944 includes generating sensed signal data via at least one circuit of the plurality of circuits indicating changes in electrical properties of at least one electrode of the plurality of electrodes. The changes in electrical properties can indicate changes in impedance, self-capacitance, and/or mutual-capacitance.

Step 1946 includes processing the sensed signal data in a first temporal period to identify an interaction detection activation indication type. This can include generating gesture identification data indicating the interaction detection activation indication type. Performing step 1946 can include performing step 1936 of FIG. 98J. In some embodiments, other types of interactions are ignored in the first temporal period prior to detection of the interaction detection activation indication type, where vehicle functionality is not performed.

Step 1948 includes processing the sensed signal data in a second temporal period following the first temporal period to identify at least one additional indication type. Performing step 1948 can include performing step 1936 of FIG. 98J. Performing step 1948 can be based on having identified the interaction detection activation indication type in step 1946 and/or based on a corresponding timeout period that starts with the detection of the interaction detection activation indication type not having yet elapsed.

Step 1950 includes facilitating performance of one of a plurality of vehicle functions based on identifying the least one additional indication type and based on identifying the interaction detection activation indication type. For example, if the interaction detection activation indication type was not detected prior to the second temporal period, the one of a plurality of vehicle functions is not performed, even if the at least one additional indication type is identified. In some embodiments, vehicle functions are only performed if the steering wheel is not actively being turned by the user and/or if a turning signal is not currently on.

Figure 99A:
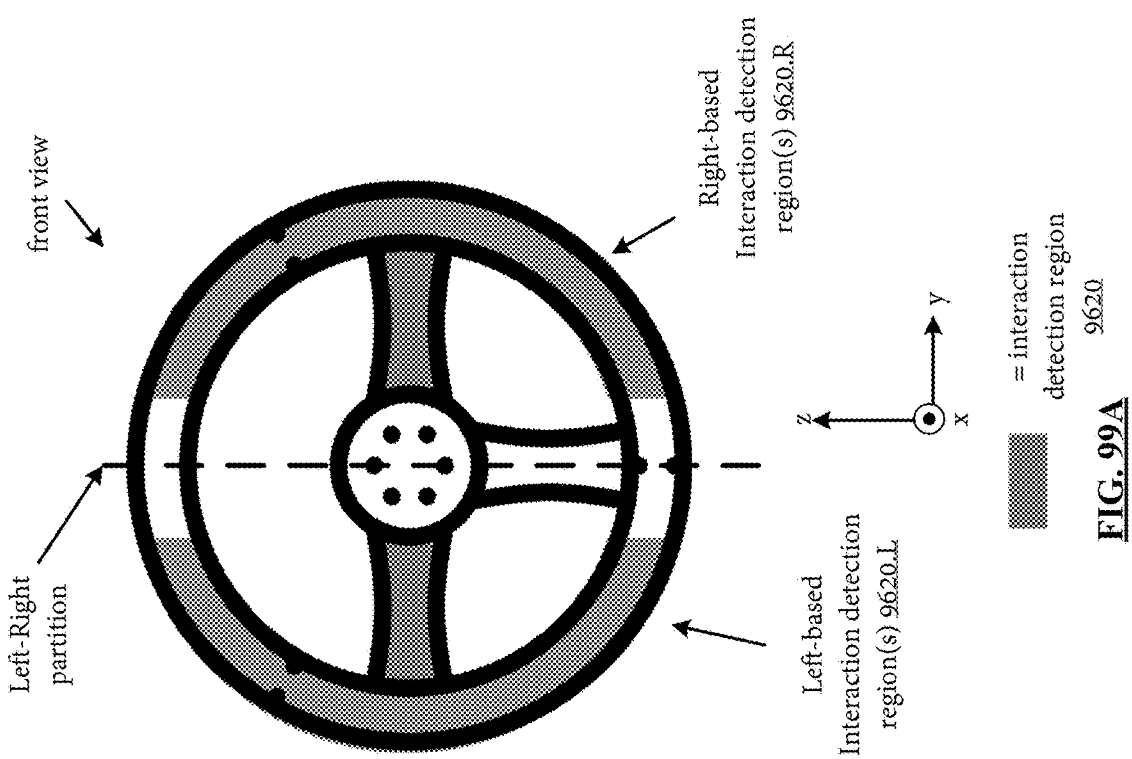
FIGS. 99A and 99B illustrate an example embodiment of a steering wheel that includes at least one left-based interaction detection region and at least one right-based interaction detection region in accordance with various embodiments.
Figure 99B:
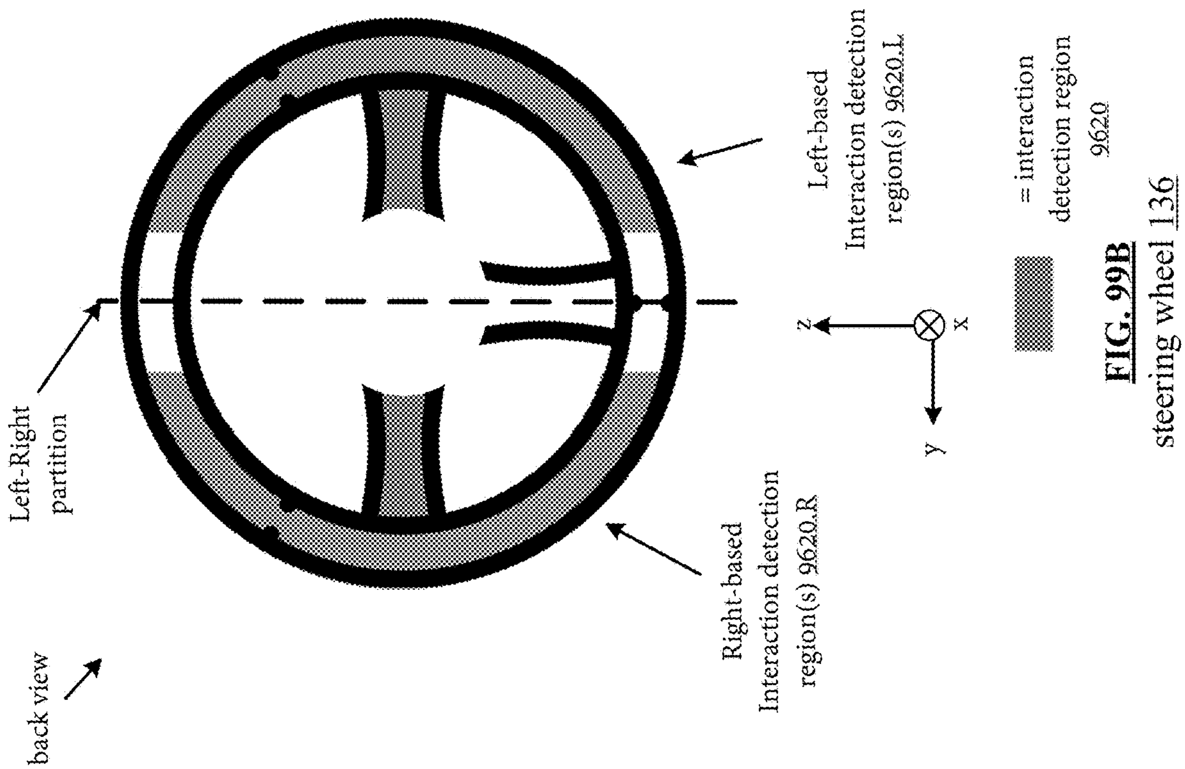

FIGS. 99A-99B illustrate example left-right partition of a steering wheel 136. In some embodiments, different functionality is induced based on whether the user is detected to interact with a given right-based interaction detection region 9620.R on the right half of the steering wheel, or with a given left-based interaction detection region 9620.L on the left half of the steering wheel.

In some embodiments, the vehicle interactions detection on the left or right half in the right-based interaction detection region 9620.R or the left-based interaction detection region 9620.L can optionally corresponding to distinguishing between a left or right type of vehicle command. This can enable intuitive interaction with the steering wheel to induce functionality on with respect to the driver's left or right. The partition differentiating between left-based and right-based interaction detection regions 9620 can correspond to a partitioning plane parallel to the x-z plane intersecting the toroid to differentiate between the right and left, as illustrated in FIGS. 99A and 99B.

For example, a given indication type detected via a left-based interaction detection region 9620.L can correspond to lowering and/or raising of the driver window based on the driver window being on the user's left side, while the same given indication type detected via a right-based interaction detection region 9620.R can correspond to lowering and/or raising of the front passenger window based on the front window being on the user's right side.

As another example, a given indication type detected via a left-based interaction detection region 9620.L can correspond to adjusting of the left side mirror based on the left side mirror window being on the user's left side, while the same given indication type detected via a right-based interaction detection region 9620.R can correspond to adjusting of the right side mirror based on the right side mirror being on the user's right side.

As another example, a given indication type detected via a left-based interaction detection region 9620.L can correspond to activating the left turn signal based on the user intending to turn left, while the same given indication type detected via a right-based interaction detection region 9620.R can correspond to activating the right turn signal based on the user intending to turn right. Alternatively, as it can be more intuitive to perform a gesture/motion in the direction of the turn, a given indication type detected via a left-based interaction detection region 9620.L can correspond to activating the right turn signal based on movement from the left to the right (e.g. a clockwise hand swipe by the left hand along the left side of the toroid, a tap by one or fingers on the right side of the steering wheel inwards towards the right in the y direction, etc.), and the given indication type detected via a right-based interaction detection region 9620.R can correspond to activating the left turn signal based on movement from the right to the left (e.g. a counter-clockwise hand swipe by the right hand along the right side of the toroid, a tap by one or fingers on the left side of the steering wheel inwards towards the right opposite the y direction, etc.)

While not depicted, the steering wheel can alternatively or additionally be partitioned via other partition in conjunction with detection of commands intuitive in other direction. For example, this can include partitioning interaction detection regions between the front and back of the steering wheel to differentiate between forward-based and backward-based commands (e.g. being in drive vs. reverse; shifting the mirrors or seats forwards or backwards; adjusting adaptive cruise control distance to be longer or shorter, shifting steering wheel position forward or backwards etc.) The partition can correspond to a partitioning plane parallel to the y-z plane intersecting the toroid to differentiate between the front and back.

Alternatively or in addition, interaction detection regions can be partitioned between the top and bottom of the steering wheel to differentiate between up-based and down-based commands (e.g. lowering or raising audio volume, seeking up and down, shifting seat position up or down, shifting steering wheel position up or down, etc.). The partition can correspond to a partitioning plane parallel to the z-y plane intersecting the toroid through the center hub to differentiate between the top and bottom.

Figure 99C:
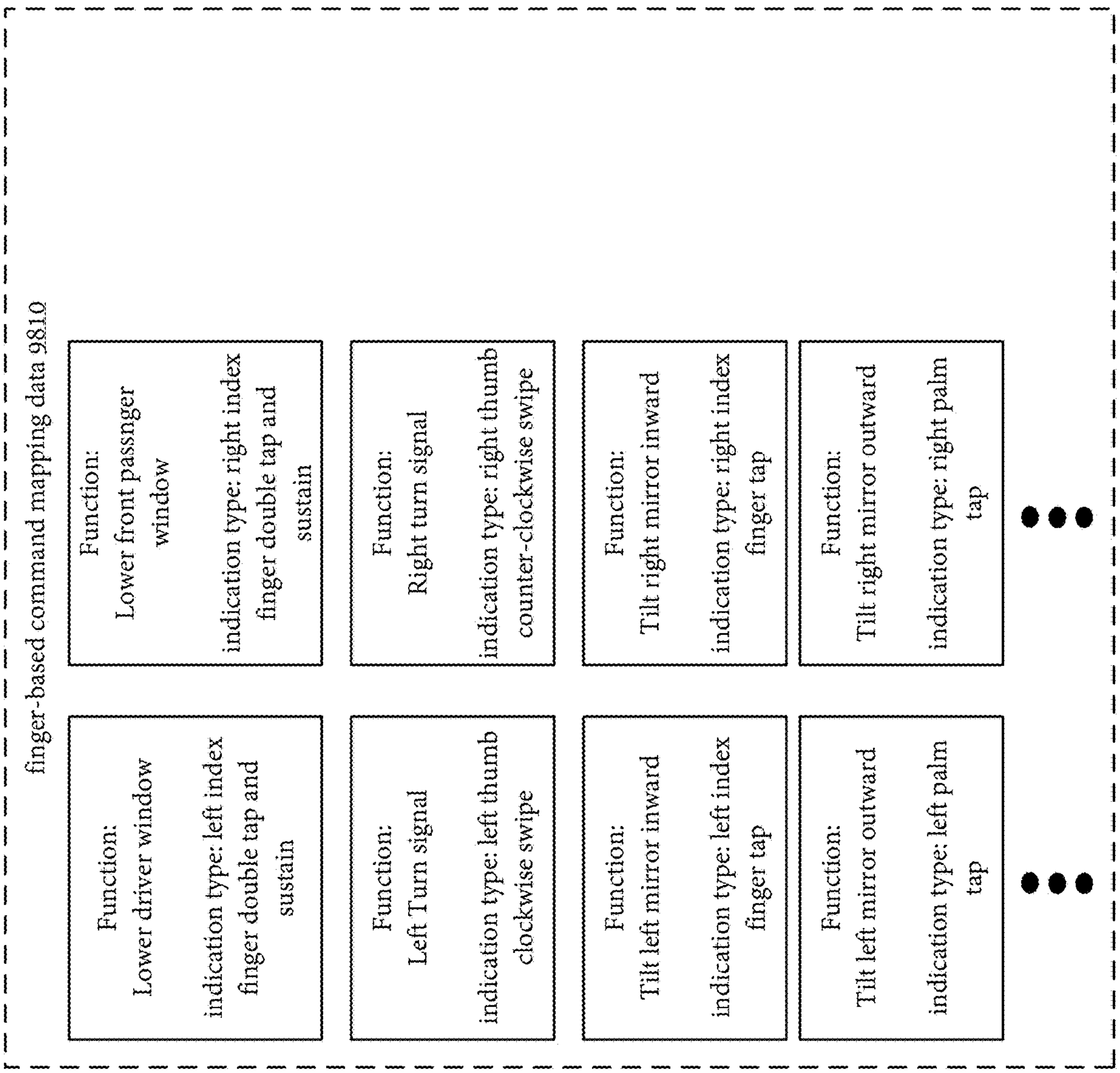
FIG. 99C illustrates an example embodiment of finger-based command mapping data in accordance with various embodiments.

FIG. 99C illustrates example finger-based command mapping data 9810 indicating left-based vehicle functionality and right-based functionality mapped to indication types by the left and right hand, respectively. In particular, different functionality can be induced based on whether the user is detected to interact with a given right-based interaction detection region 9620.R on the right half of the steering wheel, or with a given left-based interaction detection region 9620.L on the left half of the steering wheel.

Some or all functions and/or indications of finger-based command mapping data 9810 of FIG. 99C can implement the finger-based command mapping data 9810 of FIG. 98D. The various commands and indication types of the finger-based command mapping data 9810 of FIG. 99C serve as examples, and different embodiments can induce different right-left vehicle functionality and/or can utilize different indication types.

Note that as discussed previously, as it can be more intuitive to indicate right and left turn signals via opposite hands. In some embodiments, a given indication type to activate the left turn signal can instead correspond to a gesture performed by the right hand, and/or a given indication type to activate the right turn signal can instead correspond to a gesture performed by the left hand.

Differentiating between the right and left hand can be based on anatomical feature mapping data 730 as discussed in conjunction with FIGS. 98A-98C. Alternatively or in addition, differentiating between the right and left hand can be based on whether the interaction was detected in the left-based interaction detection region or the right-based interaction detection region as discussed in conjunction with FIGS. 99A-99B.

In some embodiments, this differentiation between right and left hand can be implemented in addition to partitioning the portion of the steering wheel into left-based and right-based interaction detection regions 9620.L and 9620.R as illustrated in FIGS. 99A and 99B, where right-based functionality is performed based on detecting a given indication by the right hand in a right-based interaction detection region 9620.R, and where left-based functionality is performed based on detecting a given indication by the left hand in a left-based interaction detection region 9620.L. In such embodiments, anatomical feature mapping data 730 is generated to detect which hand is performing the indication, in addition to detecting the location of the interaction as being in the left-based or right-based detection region. For example, when the right hand performs a given indication in the left-based interaction detection region 9620, the right-based functionality is not performed, where different functionality is performed or the indication is ignored.

In other embodiments, this differentiation between right and left hand can be implemented instead of to partitioning the portion of the steering wheel into left-based and right-based interaction detection regions 9620.L and 9620.R. For example, a given indication by the right hand also induces a corresponding right-based functionality, regardless of whether the indication was detected to have been performed on the right or left half of the steering wheel.

Figure 99D:
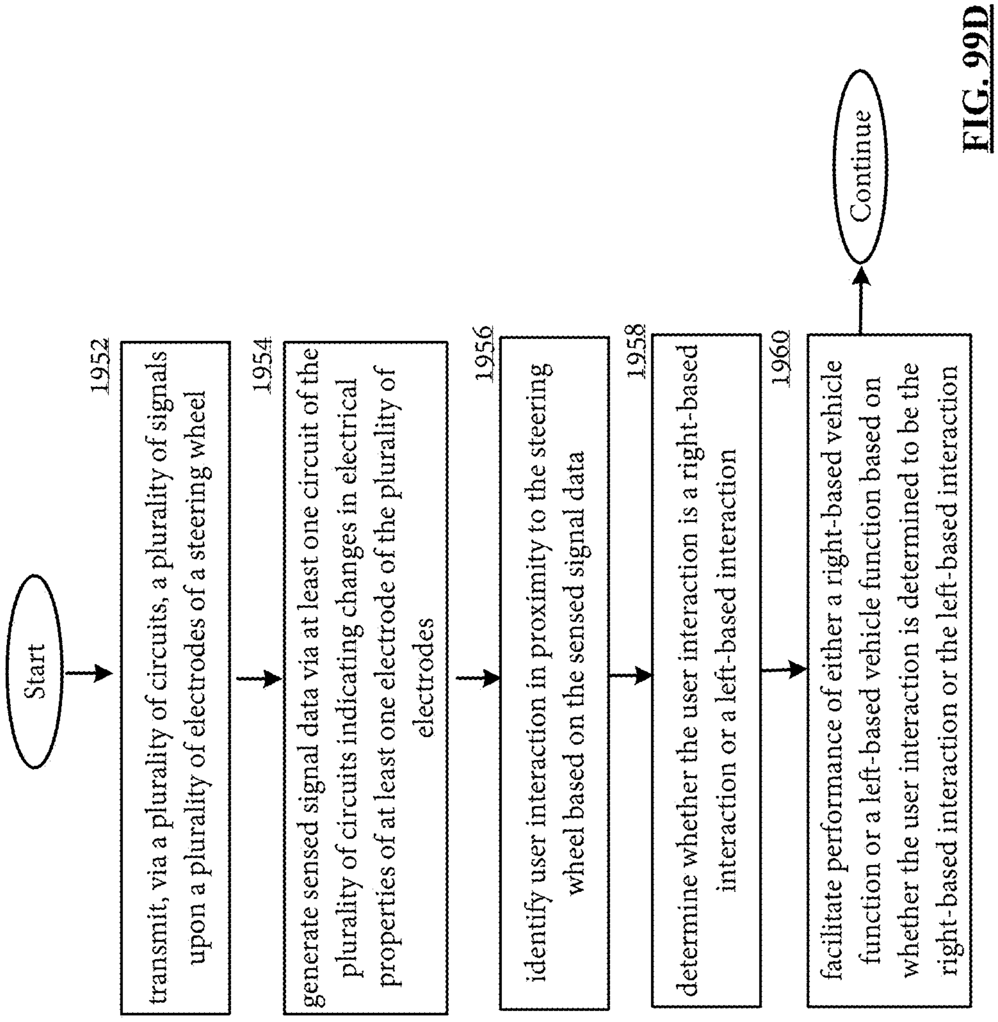
FIG. 99D is a logic diagram of an example of a method for execution in accordance with various embodiments.

FIG. 99D is a logic diagram illustrating a method of performing vehicle functionality based on detected steering wheel interaction, for example, based on implementing some or all functionality of steering wheel 136 discussed in conjunction with FIGS. 99A-99C. Some or all of the method of FIG. 99D can be performed via a vehicle computing entity 150 at least one button circuit 112, and/or at least one DSC 117, for example, based on some or all functionality discussed in conjunction with one or more of FIGS. 1-48B. Some or all of the method of FIG. 99D can be performed via any computing entity of FIGS. 2A-2D and/or any processing module, which can be associated with a corresponding vehicle, or any other system, for example, that includes one or more buttons implemented via one or more corresponding electrodes. Some or all of the method of FIG. 99D can be performed based on performing the method of FIGS. 13B, 19B, 21A, 43B, 44D, and/or 48B. Some or all of the method of FIG. 99D can be performed based on performing some or all steps of the method of FIG. 96I, FIG. 96J, of FIG. 97, FIG. 98I, FIG. 98J, FIG. 98K, and/or any other method described herein.

Step 1952 includes transmitting, via a plurality of circuits, a plurality of signals upon a plurality of electrodes of a steering wheel. In various embodiments, the at least one circuit can include at least one button circuit 112, at least one sensor circuit 116, at least one RX circuit 119, at least one DSC 117, and/or another circuit. In various embodiments, the plurality of electrodes can include a plurality of poloidal electrodes and/or a plurality of toroidal electrodes upon the surface of the steering wheel. In various embodiments, the plurality of electrodes can implement one or more interaction detection regions on the surface of the steering wheel.

Step 1954 includes generating sensed signal data via at least one circuit of the plurality of circuits indicating changes in electrical properties of at least one electrode of the plurality of electrodes. The changes in electrical properties can indicate changes in impedance, self-capacitance, and/or mutual-capacitance.

Step 1956 includes identifying user interaction in proximity to the steering wheel based on the sensed signal data. Step 1958 includes determining whether the user interaction is a right-based interaction or a left-based interaction. For example, performing step 1958 includes determining whether the location of the user interaction on the surface of the steering wheel is on a right half or left half of the steering wheel as discussed in conjunction with FIGS. 99A and 99B. As another example, performing step 1958 includes determining whether the user interaction is performed by the right or left hand as discussed in conjunction with FIG. 99C.

Step 1960 includes facilitating performance of either a right-based vehicle function or a left-based vehicle function based on whether the user interaction is determined to be the right-based interaction or the left-based interaction. For example, if the user interaction is determined to be a right-based interaction, the right-based vehicle function is performed, while if the user interaction is determined to be a left-based interaction, the left-based vehicle function is performed. Alternatively, in some embodiments such as for vehicle functionality corresponding to turn signal activation, if the user interaction is determined to be a right-based interaction, the left-based vehicle function is performed, while if the user interaction is determined to be a left-based interaction, the right-based vehicle function is performed.

In some embodiments, the user indication can further indicate which type of vehicle function is performed. For example, the type of vehicle function can correspond to a turn signal, lowering or raising the window, configuring mirrors, configuring seat position, or other vehicle functionality described herein. Determining the type of vehicle function can be based on an indication type of the user indication, such as a gesture and/or finger performing the user indication. Whether this type of vehicle function is performed as a right-based or left-based vehicle function can be further determined based on whether the detected indication type of the user indication is right-based or left-based (e.g. based on whether it was performed by the right or left hand, or based on whether it was performed on the right or left half of the steering wheel).

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, the term "automatically" refers to an action caused directly by a processing module in response to a triggering event and particularly without human interaction.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or can further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method, comprising:

receiving sensed signal data from at least one circuit based on a user in proximity to at least one electrode corresponding to the at least one circuit;

generating, based on the sensed signal data, hover detection data indicating a detected hover in proximity to an interactable element in a first location within a vehicle, wherein the interactable element includes at least one of: a physical button or a physical switch;

generating, based on the hover detection data, button feedback display data visually depicting a vehicle function of the vehicle that is induced by touch-based interactions with the interactable element, wherein the touch-based interactions with the interactable element inducing performance of the vehicle function by the vehicle include at least one of: presses of the physical button or toggling of the physical switch;

facilitating display of the button feedback display data via a display device in a second location within the vehicle different from the first location;

detecting a touch-based interaction with the interactable element after facilitating display of the button feedback display data, wherein the touch-based interaction is detected based on at least one of: the user pressing the physical button or the user toggling the physical switch; and facilitating performance of the vehicle function by the vehicle based on detecting the touch-based interaction with the interactable element.

2. The method of claim 1, wherein generating the hover detection data includes comparing a change in capacitance indicated in the sensed signal data to at least one of: a touchless threshold, or a touch-based threshold.

3. The method of claim 1, wherein generating the hover detection data includes measuring a plurality of changes in capacitance for a plurality of locations corresponding to a plurality of interactable elements, and further includes identifying the interactable element from the plurality of interactable elements based on having a greatest change in capacitance of the plurality of changes in capacitance.

4. The method of claim 1, further comprising generating capacitance image data based on the sensed signal data, wherein the hover detection data indicates the detected hover in proximity to the interactable element based on a location of a detected hover region of the capacitance image data overlapping with a location of the interactable element.

5. The method of claim 1, wherein the at least one circuit includes an RX circuit in proximity to the interactable element, and wherein generating the hover detection data includes identifying a frequency of an occupancy area ID signal in the sensed signal data based on the occupancy area ID signal being propagated through a human body of the user.

6. The method of claim 1, wherein the at least one circuit includes a sensor circuit in an occupancy location that includes the user, and wherein generating the hover detection data includes identifying a frequency of a vehicle location ID signal in the sensed signal data based on the vehicle location ID signal being propagated through a human body of the user.

7. The method of claim 1, wherein the at least one circuit includes a plurality of drive sense circuits of a plurality of row electrodes and a plurality of column electrodes, and wherein each of the plurality of drive sense circuits transmits a signal upon one of a corresponding plurality of electrodes.

8. The method of claim 7, wherein the interactable element includes a button touch area of a plurality of button touch areas formed at intersections of the plurality of row electrodes and the plurality of column electrodes.

9. The method of claim 1, wherein the at least one circuit includes a button circuit for the interactable element, and wherein the button circuit transmits a signal upon a corresponding electrode.

10. The method of claim 1, wherein the at least one circuit includes a plurality of button circuits for a plurality of parallel electrodes, and wherein the hover detection data indicates the interactable element based on detecting a hover over a corresponding one of the plurality of parallel electrodes.

11. The method of claim 1, wherein the button feedback display data graphically displays at least one of: a name of the vehicle function associated with the interactable element; or an icon denoting the vehicle function associated with the interactable element.

12. The method of claim 1, wherein the interactable element is one of a plurality of interactable elements, further comprising:

generating subsequent hover detection data indicating a detected hover in proximity to a second interactable element of the vehicle based on subsequently received sensed signal data;

generating subsequent button feedback display data indicating the second interactable element based on the hover detection data; and facilitating display of the subsequent button feedback display data.

13. The method of claim 1, wherein the method further includes:

prior to receiving the sensed signal data, receiving other sensed signal data;

prior to generating the hover detection data, generating, based on the other sensed signal data, other hover detection data indicating another detected hover in proximity to a second interactable element in a third location within the vehicle that is different from the first location;

prior to generating the button feedback display data, generating other button feedback display data indicating the second interactable element based on the other hover detection data; and prior to facilitating display of the button feedback display data, facilitating display of a different vehicle function of the vehicle that is induced by touch-based interactions with the second interactable element;

wherein the hover detection data is generated based on movement by the user from proximity to the second interactable element to proximity to the interactable element, and wherein the different vehicle function is not performed by the vehicle based on no touch-based interaction with the second interactable element being detected due to the movement by the user.

14. The method of claim 13, wherein detecting the touch-based interaction includes:

receiving subsequent sensed signal data from the at least one circuit; and generating indication detection data identifying the touch-based interaction based on the subsequent sensed signal data.

15. The method of claim 1, wherein the display device is one of: a heads-up display, a front center console display, or a dashboard display, and wherein the interactable element is located on one of: a driver door of the vehicle, a front center console of the vehicle, a steering wheel of the vehicle, or a dashboard of the vehicle.

16. The method of claim 1, wherein the display device is in view of the user when facing forward to view a road through a front windshield of the vehicle while driving the vehicle based on being in the second location, and wherein the interactable element is not in view of the user when facing forward to view the road through the front windshield of the vehicle while driving the vehicle based on being in the first location.

17. The method of claim 1, wherein facilitating display of the button feedback display data via the display device includes at least one of: sending the button feedback display data to the display device for display, or rendering the button feedback display data as graphical image data displayed via the display device.

18. A sensor system, comprising:

a display device located in a first vehicle location of a vehicle;

a plurality of circuits corresponding to a plurality of interactable elements located in a second vehicle location of the vehicle; and a computing entity operable to:

receive sensed signal data from at least one circuit of the plurality of circuits based on a user in proximity to at least one electrode corresponding to the at least one circuit;

generate, based on the sensed signal data, hover detection data indicating a detected hover in proximity to an interactable element of the plurality of interactable elements, wherein the one of the interactable element includes at least one of: a physical button or a physical switch;

generate, based on the hover detection data, button feedback display data visually depicting a vehicle function of the vehicle that is induced by touch-based interactions with the interactable element, wherein the touch-based interactions with the interactable element inducing performance of the vehicle function by the vehicle include at least one of: presses of the physical button or toggling of the physical switch;

facilitate display of the button feedback display data via the display device;

detect a touch-based interaction with the interactable element after facilitating display of the button feedback display data, wherein the touch-based interaction is detected based on at least one of: the user pressing the physical button or the user toggling the physical switch; and facilitating performance of the vehicle function by the vehicle based on detecting the touch-based interaction with the interactable element.

19. A sensor system, comprising:

a display device located in a first vehicle location of a vehicle;

a plurality of circuits corresponding to a plurality of interactable elements located in a second vehicle location of the vehicle; and a computing entity operable to:

receive sensed signal data from at least one circuit of the plurality of circuits based on a user in proximity to at least one electrode corresponding to the at least one circuit;

generate, based on the sensed signal data, interaction detection data indicating a detected interaction in proximity to an interactable element of the plurality of interactable elements, wherein the one of the interactable element includes at least one of: a physical button or a physical switch;

generate, based on interaction detection data, button feedback display data visually depicting a vehicle function of the vehicle that is induced by touch-based interactions with the interactable element, wherein the touch-based interactions with the interactable element inducing performance of the vehicle function by the vehicle include at least one of: presses of the physical button or toggling of the physical switch;

facilitate display of the button feedback display data via the display device;

detect a touch-based interaction with the interactable element after facilitating display of the button feedback display data, wherein the touch-based interaction is detected based on at least one of: the user pressing the physical button or the user toggling the physical switch; and facilitating performance of the vehicle function by the vehicle based on detecting the touch-based interaction with the interactable element.

* * * * *